US007110444B1

(12) United States Patent
Sorrells et al.

(10) Patent No.: US 7,110,444 B1
(45) Date of Patent: Sep. 19, 2006

(54) WIRELESS LOCAL AREA NETWORK (WLAN) USING UNIVERSAL FREQUENCY TRANSLATION TECHNOLOGY INCLUDING MULTI-PHASE EMBODIMENTS AND CIRCUIT IMPLEMENTATIONS

(75) Inventors: David F. Sorrells, Middleburg, FL (US); Michael J. Bultman, Jacksonville, FL (US); Robert W. Cook, Switzerland, FL (US); Richard C. Looke, Jacksonville, FL (US); Charley D. Moses, Jr., Jacksonville, FL (US); Gregory S. Rawlins, Lake Mary, FL (US); Michael W. Rawlins, Lake Mary, FL (US)

(73) Assignee: ParkerVision, Inc., Jacksonville, FL (US)

( * ) Notice: Subject to any disclaimer, the term of this patent is extended or adjusted under 35 U.S.C. 154(b) by 1111 days.

(21) Appl. No.: 09/632,856

(22) Filed: Aug. 4, 2000

Related U.S. Application Data

(63) Continuation-in-part of application No. 09/525,615, filed on Mar. 14, 2000, and a continuation-in-part of application No. 09/526,041, filed on Mar. 14, 2000.

(60) Provisional application No. 60/147,129, filed on Aug. 4, 1999.

(51) Int. Cl.
*H04L 5/16* (2006.01)

(52) U.S. Cl. ........................ 375/222; 375/328; 455/137

(58) Field of Classification Search ................. 375/222, 375/328, 324, 349; 455/131, 137, 150.1, 455/189.1, 190.1, 313, 323, 326
See application file for complete search history.

(56) References Cited

U.S. PATENT DOCUMENTS

| | | | |
|---|---|---|---|
| 2,057,613 A | 10/1936 | Gardner | 250/8 |
| 2,241,078 A | 5/1941 | Vreeland | 179/15 |

(Continued)

FOREIGN PATENT DOCUMENTS

| | | |
|---|---|---|
| DE | 35 41 031 A1 | 5/1986 |
| DE | 42 37 692 C1 | 3/1994 |

(Continued)

OTHER PUBLICATIONS

English Translation of German Patent Publication No. DE 196 48 915 A1, 10 pp.

(Continued)

*Primary Examiner*—Chieh M. Fan
*Assistant Examiner*—Kevin Kim
(74) *Attorney, Agent, or Firm*—Sterne, Kessler, Goldstein & Fox P.L.L.C.

(57) ABSTRACT

Frequency translation and applications of the same are described herein, including RF modem and wireless local area network (WLAN) applications. In embodiments, the WLAN invention includes an antenna, an LNA/PA module, a receiver, a transmitter, a control signal generator, a demodulation/modulation facilitation module, and a MAC interface. The WLAN receiver includes at least one universal frequency translation module that frequency down-converts a received EM signal. In embodiments, the UFT based receiver is configured in a multi-phase embodiment to reduce or eliminate re-radiation that is caused by DC offset. The WLAN transmitter includes at least one universal frequency translation module that frequency up-converts a baseband signal in preparation for transmission over the wireless LAN. In embodiments, the UFT based transmitter is configured in a differential and multi-phase embodiment to reduce carrier insertion and spectral growth.

32 Claims, 349 Drawing Sheets

U.S. PATENT DOCUMENTS

| | | | | |
|---|---|---|---|---|
| 2,270,385 | A | 1/1942 | Skillman | 179/15 |
| 2,283,575 | A | 5/1942 | Roberts | 250/6 |
| 2,358,152 | A | 9/1944 | Earp | 179/171.5 |
| 2,410,350 | A | 10/1946 | Labin et al. | 179/15 |
| 2,451,430 | A | 10/1948 | Barone | 250/8 |
| 2,462,069 | A | 2/1949 | Chatterjea et al. | 250/17 |
| 2,462,181 | A | 2/1949 | Grosslfinger | 250/17 |
| 2,472,798 | A | 6/1949 | Fredenall | 178/44 |
| 2,497,859 | A | 2/1950 | Boughtwood et al. | 250/8 |
| 2,499,279 | A | 2/1950 | Peterson | 332/41 |
| 2,802,208 | A | 8/1957 | Hobbs | 343/176 |
| 2,985,875 | A | 5/1961 | Grisdale et al. | 343/100 |
| 3,023,309 | A | 2/1962 | Foulkes | 250/17 |
| 3,069,679 | A | 12/1962 | Sweeney et al. | 343/200 |
| 3,104,393 | A | 9/1963 | Vogelman | 343/200 |
| 3,114,106 | A | 12/1963 | Mcmaus | 325/56 |
| 3,118,117 | A | 1/1964 | King et al. | 332/22 |
| 3,226,643 | A | 12/1965 | McNair | 325/40 |
| 3,246,084 | A | 4/1966 | Kryter | |
| 3,258,694 | A | 6/1966 | Shepard | 325/145 |
| 3,383,598 | A | 5/1968 | Sanders | 325/163 |
| 3,384,822 | A | 5/1968 | Miyagi | 325/30 |
| 3,454,718 | A | 7/1969 | Perreault | 178/66 |
| 3,523,291 | A | 8/1970 | Pierret | 340/347 |
| 3,548,342 | A | 12/1970 | Maxey | 332/9 |
| 3,555,428 | A | 1/1971 | Perreault | 325/320 |
| 3,614,627 | A | 10/1971 | Runyan et al. | |
| 3,617,892 | A | 11/1971 | Hawley et al. | 325/145 |
| 3,621,402 | A | 11/1971 | Gardner | 328/37 |
| 3,622,885 | A | 11/1971 | Oberdorf et al. | 325/40 |
| 3,623,160 | A | 11/1971 | Giles et al. | 340/347 DA |
| 3,626,417 | A | 12/1971 | Gilbert | 343/203 |
| 3,629,696 | A | 12/1971 | Bartelink | 324/57 R |
| 3,662,268 | A | 5/1972 | Gans et al. | 325/56 |
| 3,689,841 | A | 9/1972 | Bello et al. | 325/39 |
| 3,702,440 | A | 11/1972 | Moore | |
| 3,714,577 | A | 1/1973 | Hayes | 325/145 |
| 3,716,730 | A | 2/1973 | Cemy, Jr. | 307/295 |
| 3,717,844 | A | 2/1973 | Barret et al. | 340/5 R |
| 3,735,048 | A | 5/1973 | Tomsa et al. | 179/15 BM |
| 3,736,513 | A | 5/1973 | Wilson | |
| 3,767,984 | A | 10/1973 | Shinoda et al. | |
| 3,806,811 | A | 4/1974 | Thompson | 325/146 |
| 3,852,530 | A | 12/1974 | Shen | |
| 3,868,601 | A | 2/1975 | MacAfee | 332/45 |
| 3,940,697 | A | 2/1976 | Morgan | |
| 3,949,300 | A | 4/1976 | Sadler | 325/31 |
| 3,967,202 | A | 6/1976 | Batz | 325/31 |
| 3,980,945 | A | 9/1976 | Bickford et al. | 325/30 |
| 3,987,280 | A | 10/1976 | Bauer | 235/150.53 |
| 3,991,277 | A | 11/1976 | Hirata | 179/15 FD |
| 4,003,002 | A | 1/1977 | Snijders et al. | 332/10 |
| 4,013,966 | A | 3/1977 | Campbell | 325/363 |
| 4,016,366 | A | 4/1977 | Kurata | |
| 4,017,798 | A | 4/1977 | Gordy et al. | 325/42 |
| 4,019,140 | A | 4/1977 | Swerdlow | 322/65 |
| 4,032,847 | A | 6/1977 | Unkauf | 325/323 |
| 4,035,732 | A | 7/1977 | Lohrmann | 325/446 |
| 4,045,740 | A | 8/1977 | Baker | |
| 4,047,121 | A | 9/1977 | Campbell | 331/76 |
| 4,051,475 | A | 9/1977 | Campbell | 343/180 |
| 4,066,841 | A | 1/1978 | Young | 178/66 R |
| 4,066,919 | A | 1/1978 | Huntington | 307/353 |
| 4,080,573 | A | 3/1978 | Howell | 325/439 |
| 4,081,748 | A | 3/1978 | Batz | 325/56 |
| 4,115,737 | A | 9/1978 | Hongu et al. | |
| 4,130,765 | A | 12/1978 | Arakelian et al. | 307/220 R |
| 4,130,806 | A | 12/1978 | Van Gerwen et al. | 325/487 |
| 4,132,952 | A | 1/1979 | Hongu et al. | |
| 4,142,155 | A | 2/1979 | Adachi | 325/47 |
| 4,170,764 | A | 10/1979 | Salz et al. | 332/17 |
| 4,204,171 | A | 5/1980 | Sutphin, Jr. | 328/167 |
| 4,210,872 | A | 7/1980 | Gregorian | 330/9 |
| 4,220,977 | A | 9/1980 | Yamanaka | |
| 4,245,355 | A | 1/1981 | Pascoe et al. | 455/326 |
| 4,250,458 | A | 2/1981 | Richmond et al. | |
| 4,253,066 | A | 2/1981 | Fisher et al. | 329/50 |
| 4,253,067 | A | 2/1981 | Caples et al. | 329/110 |
| 4,253,069 | A | 2/1981 | Nossek | 330/107 |
| 4,308,614 | A | 12/1981 | Fisher et al. | 370/119 |
| 4,320,361 | A | 3/1982 | Kikkert | 332/16 R |
| 4,320,536 | A | 3/1982 | Dietrich | 455/325 |
| 4,334,324 | A | 6/1982 | Hoover | 455/333 |
| 4,346,477 | A | 8/1982 | Gordy | 455/257 |
| 4,355,401 | A | 10/1982 | Ikoma et al. | 375/5 |
| 4,356,558 | A | 10/1982 | Owen et al. | 364/724 |
| 4,360,867 | A | 11/1982 | Gonda | 363/158 |
| 4,363,132 | A | 12/1982 | Collin | 455/52 |
| 4,365,217 | A | 12/1982 | Berger et al. | 333/165 |
| 4,369,522 | A | 1/1983 | Cerny, Jr. et al. | 455/333 |
| 4,370,572 | A | 1/1983 | Cosand et al. | 307/353 |
| 4,384,357 | A | 5/1983 | deBuda et al. | |
| 4,389,579 | A | 6/1983 | Stein | 307/353 |
| 4,392,255 | A | 7/1983 | Del Giudice | 455/328 |
| 4,393,395 | A | 7/1983 | Hacke et al. | 358/23 |
| 4,430,629 | A | 2/1984 | Betzl et al. | 333/165 |
| 4,441,080 | A | 4/1984 | Saari | |
| 4,446,438 | A | 5/1984 | Chang et al. | 328/127 |
| 4,456,990 | A | 6/1984 | Fisher et al. | 370/119 |
| 4,470,145 | A | 9/1984 | Williams | |
| 4,472,785 | A | 9/1984 | Kasuga | 364/718 |
| 4,479,226 | A | 10/1984 | Prabhu et al. | 375/1 |
| 4,481,490 | A | 11/1984 | Huntley | 332/41 |
| 4,481,642 | A | 11/1984 | Hanson | 375/9 |
| 4,483,017 | A | 11/1984 | Hampel et al. | 382/17 |
| 4,484,143 | A | 11/1984 | French et al. | 329/50 |
| 4,485,488 | A | 11/1984 | Houdart | 455/327 |
| 4,488,119 | A | 12/1984 | Marshall | |
| 4,504,803 | A | 3/1985 | Lee et al. | 332/31 R |
| 4,510,467 | A | 4/1985 | Chang et al. | |
| 4,517,519 | A | 5/1985 | Mukaiyama | 329/126 |
| 4,517,520 | A | 5/1985 | Ogawa | 329/145 |
| 4,518,935 | A | 5/1985 | van Roermund | 333/173 |
| 4,521,892 | A | 6/1985 | Vance et al. | 375/88 |
| 4,563,773 | A | 1/1986 | Dixon, Jr. et al. | 455/327 |
| 4,577,157 | A | 3/1986 | Reed | 329/50 |
| 4,583,239 | A | 4/1986 | Vance | 375/94 |
| 4,591,736 | A | 5/1986 | Hirao et al. | 307/267 |
| 4,602,220 | A | 7/1986 | Kurihara | 331/19 |
| 4,603,300 | A | 7/1986 | Welles, II et al. | 329/50 |
| 4,612,464 | A | 9/1986 | Ishikawa et al. | 307/496 |
| 4,612,518 | A | 9/1986 | Gans et al. | 332/21 |
| 4,616,191 | A | 10/1986 | Galani et al. | 331/4 |
| 4,621,217 | A | 11/1986 | Saxe et al. | 315/1 |
| 4,628,517 | A | 12/1986 | Schwarz et al. | 375/40 |
| 4,633,510 | A | 12/1986 | Suzuki et al. | |
| 4,634,998 | A | 1/1987 | Crawford | 331/1 A |
| 4,648,021 | A | 3/1987 | Alberkrack | 363/157 |
| 4,651,034 | A | 3/1987 | Sato | 307/556 |
| 4,653,117 | A | 3/1987 | Heck | 455/209 |
| 4,660,164 | A | 4/1987 | Leibowitz | |
| 4,675,882 | A | 6/1987 | Lillie et al. | 375/80 |
| 4,688,253 | A | 8/1987 | Gumm | 381/7 |
| 4,716,376 | A | 12/1987 | Daudelin | 329/107 |
| 4,716,388 | A | 12/1987 | Jacobs | 333/173 |
| 4,718,113 | A | 1/1988 | Rother et al. | 455/209 |
| 4,726,041 | A | 2/1988 | Prohaska et al. | 375/91 |
| 4,733,403 | A | 3/1988 | Simone | 375/103 |
| 4,734,591 | A | 3/1988 | Ichitsubo | 307/219.1 |
| 4,737,969 | A | 4/1988 | Steel et al. | 375/67 |
| 4,740,675 | A | 4/1988 | Brosnan et al. | |

4,743,858 A 5/1988 Everard ........................ 330/10
4,745,463 A 5/1988 Lu .............................. 358/23
4,751,468 A 6/1988 Agoston ..................... 328/133
4,757,538 A 7/1988 Zink ............................ 381/7
4,761,798 A 8/1988 Griswold, Jr. et al.
4,768,187 A 8/1988 Marshall .................... 370/69.1
4,769,612 A 9/1988 Tamakoshi et al. ......... 328/167
4,772,853 A 9/1988 Hart
4,785,463 A 11/1988 Janc et al. ..................... 375/1
4,791,584 A 12/1988 Greivenkamp, Jr. ........ 364/525
4,801,823 A 1/1989 Yokoyama .................. 307/353
4,806,790 A 2/1989 Sone .......................... 307/353
4,810,904 A 3/1989 Crawford .................... 307/353
4,810,976 A 3/1989 Cowley et al. ......... 331/117 R
4,811,362 A 3/1989 Yester, Jr. et al. ............ 375/75
4,816,704 A 3/1989 Fiori, Jr. ..................... 307/519
4,819,252 A 4/1989 Christopher ................ 375/122
4,833,445 A 5/1989 Buchele ...................... 341/118
4,841,265 A 6/1989 Watanabe et al. ........... 333/194
4,855,894 A 8/1989 Asahi et al. ................ 363/157
4,857,928 A 8/1989 Gailus et al.
4,862,121 A 8/1989 Hochschild et al. ........ 333/173
4,868,654 A 9/1989 Juri et al. ................... 358/133
4,873,492 A 10/1989 Myer
4,943,974 A 7/1990 Motamedi ...................... 375/1
4,972,436 A 11/1990 Halim et al.
5,012,245 A 4/1991 Scott et al.
5,016,242 A 5/1991 Tang
5,058,107 A 10/1991 Stone et al.
5,083,050 A 1/1992 Vasile ........................ 307/529
5,091,921 A 2/1992 Minami ....................... 375/88
5,095,533 A 3/1992 Loper et al. ................ 455/245
5,095,536 A 3/1992 Loper ......................... 455/324
5,111,152 A 5/1992 Makino ...................... 329/300
5,113,094 A 5/1992 Horiguchi et al. .......... 307/529
5,113,129 A 5/1992 Hughes ...................... 323/316
5,115,409 A 5/1992 Stepp ......................... 364/841
5,122,765 A 6/1992 Pataut ........................ 332/105
5,124,592 A 6/1992 Hagino ....................... 307/520
5,126,682 A 6/1992 Weinberg et al. ........... 329/304
5,136,267 A 8/1992 Cabot ......................... 333/174
5,140,705 A 8/1992 Kosuga ...................... 455/318
5,150,124 A 9/1992 Moore et al. ................. 342/68
5,151,661 A 9/1992 Caldwell et al. .............. 328/14
5,157,687 A 10/1992 Tymes ........................... 375/1
5,159,710 A 10/1992 Cusdin ....................... 455/304
5,170,414 A 12/1992 Silvian ........................ 375/59
5,172,070 A 12/1992 Hiraiwa et al. ............. 329/304
5,179,731 A * 1/1993 Trankle et al.
5,191,459 A 3/1993 Thompson et al. ......... 359/133
5,204,642 A 4/1993 Asghar et al. .............. 331/135
5,212,827 A 5/1993 Meszko et al. ............. 455/219
5,214,787 A 5/1993 Karkota, Jr. ................. 455/3.2
5,218,562 A 6/1993 Basehore et al.
5,220,583 A 6/1993 Solomon ..................... 375/82
5,220,680 A 6/1993 Lee ............................ 455/102
5,222,144 A 6/1993 Whikehart ................... 381/15
5,230,097 A 7/1993 Currie et al. ............ 455/226.1
5,239,496 A 8/1993 Vancraeynest
5,239,686 A 8/1993 Downey ...................... 455/78
5,241,561 A 8/1993 Barnard ......................... 375/1
5,249,203 A 9/1993 Loper .......................... 375/97
5,251,218 A 10/1993 Fujisawa et al. ............ 370/120
5,251,232 A 10/1993 Nonami ......................... 375/5
5,260,970 A 11/1993 Henry et al. .................. 375/10
5,260,973 A 11/1993 Watanabe
5,263,194 A 11/1993 Ragan ........................ 455/316
5,263,196 A 11/1993 Jasper ........................ 455/324
5,267,023 A 11/1993 Kawasaki .................... 358/23
5,278,826 A 1/1994 Murphy et al. ............... 370/76
5,282,023 A 1/1994 Scarpa ........................ 358/36
5,282,222 A 1/1994 Fattouche et al.
5,287,516 A 2/1994 Schaub ........................ 375/88
5,293,398 A 3/1994 Hamao et al. ................. 375/1
5,303,417 A 4/1994 Laws ......................... 455/314
5,307,517 A 4/1994 Rich .......................... 455/306
5,315,583 A 5/1994 Murphy et al. ............... 370/18
5,319,799 A 6/1994 Morita ........................ 455/78
5,321,852 A 6/1994 Seong ..................... 455/182.1
5,325,204 A 6/1994 Scarpa ....................... 348/607
5,337,014 A 8/1994 Regunathan et al. ....... 324/613
5,339,054 A 8/1994 Taguchi ...................... 332/100
5,339,459 A 8/1994 Schiltz et al. ............... 455/333
5,345,239 A 9/1994 Madni et al.
5,353,306 A 10/1994 Yamamoto ................... 375/14
5,355,114 A 10/1994 Sutterlin et al. ........ 340/310 A
5,361,408 A 11/1994 Watanabe et al. ........... 455/324
5,369,404 A 11/1994 Galton ....................... 341/143
5,369,789 A 11/1994 Kosugi et al.
5,369,800 A 11/1994 Takagi et al. ................. 455/59
5,375,146 A 12/1994 Chalmers .................... 375/103
5,379,040 A 1/1995 Mizomoto et al. .......... 341/143
5,379,141 A 1/1995 Thompson et al. ......... 359/125
5,388,063 A 2/1995 Takatori et al. ........ 364/724.17
5,389,839 A 2/1995 Heck
5,390,364 A 2/1995 Webster et al. ............ 455/52.3
5,400,084 A 3/1995 Scarpa ....................... 348/624
5,404,127 A 4/1995 Lee et al. ............. 340/310.02
5,410,541 A 4/1995 Hotto .......................... 370/76
5,410,743 A 4/1995 Seely et al. ................. 455/326
5,412,352 A 5/1995 Graham ...................... 332/103
5,416,449 A 5/1995 Joshi
5,416,803 A 5/1995 Janer .......................... 375/324
5,422,909 A 6/1995 Love et al.
5,422,913 A 6/1995 Wilkinson .................. 375/347
5,423,082 A 6/1995 Cygan et al. ............... 375/126
5,428,638 A 6/1995 Cioffi et al. ................ 375/224
5,428,640 A 6/1995 Townley ..................... 375/257
5,434,546 A 7/1995 Palmer ....................... 332/151
5,438,329 A 8/1995 Gastouniotis et al.
5,438,692 A 8/1995 Mohindra ................... 455/324
5,440,311 A 8/1995 Gallagher et al.
5,444,415 A 8/1995 Dent et al. .................. 329/302
5,444,416 A 8/1995 Ishikawa et al. ............ 329/341
5,444,865 A 8/1995 Heck et al. ................... 455/86
5,446,421 A 8/1995 Kechkaylo .................. 332/100
5,446,422 A 8/1995 Mattila et al. .............. 332/103
5,448,602 A 9/1995 Ohmori et al. ............. 375/347
5,451,899 A 9/1995 Lawton ...................... 329/302
5,454,007 A 9/1995 Dutta ......................... 375/322
5,454,009 A 9/1995 Fruit et al. .................. 372/202
5,463,356 A 10/1995 Palmer ....................... 332/117
5,463,357 A 10/1995 Hobden ...................... 332/151
5,465,071 A 11/1995 Kobayashi et al. ......... 329/315
5,465,410 A 11/1995 Hiben et al. ................ 455/266
5,465,415 A 11/1995 Bien .......................... 455/326
5,465,418 A 11/1995 Zhou et al. ................. 455/332
5,471,162 A 11/1995 McEwan ..................... 327/92
5,471,665 A 11/1995 Pace et al.
5,479,120 A 12/1995 McEwan ..................... 327/91
5,479,447 A 12/1995 Chow et al. ................ 375/260
5,481,570 A 1/1996 Winters
5,483,193 A 1/1996 Kennedy et al. ............ 329/300
5,483,549 A 1/1996 Weinberg et al. ........... 375/200
5,483,600 A 1/1996 Werrbach
5,483,691 A 1/1996 Heck et al. .............. 455/234.2
5,483,695 A 1/1996 Pardoen
5,490,173 A 2/1996 Whikehart et al. ......... 375/316
5,490,176 A * 2/1996 Peltier
5,493,581 A 2/1996 Young et al. ............... 375/350
5,493,721 A 2/1996 Reis ........................... 455/339
5,495,200 A 2/1996 Kwan et al. ................ 327/554

5,495,202 A 2/1996 Hsu .......................... 327/113
5,495,500 A 2/1996 Jovanovich et al. ........ 375/206
5,499,267 A 3/1996 Ohe et al. .................. 375/206
5,500,758 A 3/1996 Thompson et al. ......... 359/189
5,513,389 A 4/1996 Reeser et al. .............. 455/311
5,515,014 A 5/1996 Troutman .................. 332/178
5,517,688 A 5/1996 Fajen et al. ................ 455/333
5,519,890 A 5/1996 Pinckley .................... 455/307
5,523,719 A 6/1996 Longo et al. ............... 327/557
5,523,726 A 6/1996 Kroeger et al. ............ 332/103
5,523,760 A 6/1996 McEwan .................... 342/89
5,539,770 A 7/1996 Ishigaki ..................... 375/206
5,555,453 A 9/1996 Kajimoto et al. .......... 455/266
5,557,641 A 9/1996 Weinberg .................. 375/295
5,557,642 A 9/1996 Williams ................... 375/316
5,563,550 A 10/1996 Toth .......................... 329/347
5,564,097 A 10/1996 Swanke
5,574,755 A 11/1996 Persico ...................... 375/295
5,579,341 A 11/1996 Smith et al. ............... 375/267
5,579,347 A 11/1996 Lindquist et al. .......... 375/346
5,584,068 A 12/1996 Mohindra .................. 455/324
5,589,793 A 12/1996 Kassapian
5,592,131 A 1/1997 Labreche et al. .......... 332/103
5,600,680 A 2/1997 Mishima et al.
5,602,847 A 2/1997 Pagano et al. ............. 370/484
5,602,868 A 2/1997 Wilson ...................... 375/219
5,604,592 A 2/1997 Kotidis et al. ............. 356/357
5,604,732 A 2/1997 Kim et al. ................. 370/342
5,606,731 A 2/1997 Pace et al.
5,608,531 A 3/1997 Honda et al. ................. 386/1
5,610,946 A 3/1997 Tanaka et al. ............. 375/269
RE35,494 E 4/1997 Nicollini .................... 327/554
5,617,451 A 4/1997 Mimura et al. ............ 375/340
5,619,538 A 4/1997 Sempel et al. ............. 375/328
5,621,455 A 4/1997 Rogers et al. ............... 348/6
5,628,055 A 5/1997 Stein .......................... 455/89
5,630,227 A 5/1997 Bella et al. ................ 455/324
5,633,815 A 5/1997 Young
5,636,140 A 6/1997 Lee et al.
5,638,396 A 6/1997 Klimek ....................... 372/92
5,640,415 A 6/1997 Pandula ..................... 375/202
5,640,424 A 6/1997 Banavong et al. .......... 375/319
5,640,428 A 6/1997 Abe et al. .................. 375/334
5,640,698 A 6/1997 Shen et al. ................ 455/323
5,648,985 A 7/1997 Bjerede et al. ............ 375/219
5,650,785 A 7/1997 Rodal ........................ 342/357
5,661,424 A 8/1997 Tang ......................... 327/105
5,663,878 A 9/1997 Walker ...................... 363/159
5,663,986 A 9/1997 Striffler ..................... 375/260
5,668,836 A 9/1997 Smith et al. ............... 375/316
5,675,392 A 10/1997 Nayebi et al. ............. 348/584
5,678,220 A 10/1997 Fournier .................... 455/302
5,678,226 A 10/1997 Li et al.
5,680,078 A 10/1997 Ariie ......................... 332/178
5,680,418 A 10/1997 Croft et al. ................ 375/346
5,682,099 A 10/1997 Thompson et al.
5,689,413 A 11/1997 Jaramillo et al. .......... 363/146
5,694,096 A 12/1997 Ushiroku et al. .......... 333/195
5,697,074 A 12/1997 Makikallio et al.
5,699,006 A 12/1997 Zele et al. ................. 327/341
5,705,949 A 1/1998 Alelyunas et al. .......... 329/304
5,705,955 A 1/1998 Freeburg et al. ............. 331/14
5,710,992 A 1/1998 Sawada et al.
5,710,998 A 1/1998 Opas ......................... 455/324
5,714,910 A 2/1998 Skoczen et al. .............. 331/3
5,715,281 A 2/1998 Bly, deceased et al. ..... 375/344
5,721,514 A 2/1998 Crockett et al. .............. 331/3
5,724,002 A 3/1998 Hulick ...................... 329/361
5,724,653 A 3/1998 Baker et al. ............... 455/296
5,729,577 A 3/1998 Chen ......................... 375/334
5,729,829 A 3/1998 Talwar et al. ................ 455/63
5,732,333 A 3/1998 Cox et al. .................. 455/126
5,736,895 A 4/1998 Yu et al. ................... 327/554
5,737,035 A 4/1998 Rotzoll ...................... 348/725
5,742,189 A 4/1998 Yoshida et al. ............ 327/113
5,745,846 A 4/1998 Myer et al.
5,748,683 A 5/1998 Smith et al. ............... 375/347
5,751,154 A 5/1998 Tsugai
5,757,858 A 5/1998 Black et al.
5,757,870 A 5/1998 Miya et al. ................ 375/367
RE35,829 E 6/1998 Sanderford, Jr. ........... 375/200
5,760,629 A 6/1998 Urabe et al.
5,760,632 A 6/1998 Kawakami et al.
5,760,645 A 6/1998 Comte et al. .............. 329/304
5,764,087 A 6/1998 Clark ........................ 327/105
5,767,726 A 6/1998 Wang ........................ 327/356
5,768,118 A 6/1998 Faulk et al. ................. 363/72
5,768,323 A 6/1998 Kroeger et al. ............ 375/355
5,770,985 A 6/1998 Ushiroku et al. .......... 333/193
5,771,442 A 6/1998 Wang et al. ................. 455/93
5,777,692 A 7/1998 Ghosh ....................... 348/725
5,777,771 A 7/1998 Smith ........................ 359/180
5,778,022 A 7/1998 Walley ...................... 375/206
5,784,689 A 7/1998 Kobaysahi
5,786,844 A 7/1998 Rogers et al. ................ 348/6
5,790,587 A 8/1998 Smith et al.
5,793,801 A 8/1998 Fertner ...................... 375/219
5,793,817 A 8/1998 Wilson
5,793,818 A 8/1998 Claydon et al. ............ 375/326
5,801,654 A 9/1998 Traylor ...................... 341/144
5,802,463 A 9/1998 Zuckerman ................ 455/208
5,809,060 A 9/1998 Cafarella et al. ........... 375/206
5,812,546 A 9/1998 Zhou et al. ................ 370/342
5,818,582 A 10/1998 Fernandez et al. .......... 356/318
5,818,869 A 10/1998 Miya et al. ................ 375/206
5,825,254 A 10/1998 Lee ............................ 331/25
5,834,979 A 11/1998 Yatsuka
5,834,985 A 11/1998 Sundeg.ang.rd ............ 332/100
5,841,324 A 11/1998 Williams .................... 331/17
5,841,811 A 11/1998 Song ......................... 375/235
5,844,449 A 12/1998 Abeno et al. .............. 332/105
5,859,878 A 1/1999 Phillips et al. ............. 375/316
5,864,754 A 1/1999 Hotto ........................ 455/280
5,870,670 A 2/1999 Ripley et al.
5,872,446 A 2/1999 Cranford, Jr. et al. ...... 323/315
5,881,375 A 3/1999 Bonds ....................... 455/118
5,883,548 A 3/1999 Assard et al. .............. 329/306
5,892,380 A 4/1999 Quist ........................ 327/172
5,894,239 A 4/1999 Bonaccio et al. .......... 327/176
5,894,496 A 4/1999 Jones ........................ 455/126
5,896,304 A 4/1999 Tiemann et al.
5,896,562 A 4/1999 Heinonen .................... 455/76
5,898,912 A 4/1999 Heck et al.
5,900,747 A 5/1999 Brauns ......................... 327/9
5,901,054 A 5/1999 Leu et al. ..................... 363/41
5,901,187 A 5/1999 Iinuma ...................... 375/347
5,901,344 A 5/1999 Opas ........................... 455/76
5,901,347 A 5/1999 Chambers et al. ....... 455/234.1
5,901,348 A 5/1999 Bang et al. ................ 455/254
5,901,349 A 5/1999 Guegnaud et al. .......... 455/302
5,903,178 A 5/1999 Miyatsuji et al. .......... 327/308
5,903,187 A 5/1999 Claverie et al. ........... 329/342
5,903,196 A 5/1999 Salvi et al. ................... 331/16
5,903,421 A 5/1999 Furutani et al. .............. 361/58
5,903,553 A 5/1999 Sakamoto et al. .......... 370/338
5,903,595 A 5/1999 Suzuki ...................... 375/207
5,903,609 A 5/1999 Kool et al. ................ 375/261
5,903,827 A 5/1999 Kennan et al. ............ 455/326
5,903,854 A 5/1999 Abe et al. .................. 455/575
5,905,449 A 5/1999 Tsubouchi et al. ..... 340/925.69
5,907,149 A 5/1999 Marckini ................... 235/487
5,907,197 A 5/1999 Faulk ........................ 307/119

| | | | | | |
|---|---|---|---|---|---|
| 5,909,447 | A | | 6/1999 | Cox et al. | 370/508 |
| 5,911,116 | A | | 6/1999 | Nosswitz | 455/83 |
| 5,911,123 | A | | 6/1999 | Shaffer et al. | 455/554 |
| 5,914,622 | A | | 6/1999 | Inoue | 327/172 |
| 5,915,278 | A | | 6/1999 | Mallick | 73/658 |
| 5,920,199 | A | | 7/1999 | Sauer | 324/678 |
| 5,926,065 | A | | 7/1999 | Wakai et al. | 329/304 |
| 5,926,513 | A | | 7/1999 | Suominen et al. | |
| 5,933,467 | A | | 8/1999 | Sehier et al. | 375/350 |
| 5,937,013 | A | | 8/1999 | Lam et al. | |
| 5,943,370 | A | | 8/1999 | Smith | 375/334 |
| 5,945,660 | A | | 8/1999 | Nakasuji et al. | 235/462.46 |
| 5,949,827 | A | | 9/1999 | DeLuca et al. | |
| 5,952,895 | A | | 9/1999 | McCune, Jr. et al. | 332/128 |
| 5,953,642 | A | | 9/1999 | Feldtkeller et al. | 455/195.1 |
| 5,955,992 | A | | 9/1999 | Shattil | |
| 5,959,850 | A | | 9/1999 | Lim | 363/17 |
| 5,960,033 | A | | 9/1999 | Shibano et al. | 375/207 |
| 5,970,053 | A | * | 10/1999 | Schick et al. | |
| 5,982,315 | A | | 11/1999 | Bazarjani et al. | |
| 5,995,030 | A | | 11/1999 | Cabler | |
| 5,999,561 | A | * | 12/1999 | Naden et al. | |
| 6,005,903 | A | | 12/1999 | Mendelovicz | |
| 6,011,435 | A | | 1/2000 | Takeyabu et al. | |
| 6,014,176 | A | | 1/2000 | Nayebi et al. | |
| 6,014,551 | A | | 1/2000 | Pesola et al. | |
| 6,018,262 | A | | 1/2000 | Noro et al. | |
| 6,018,553 | A | * | 1/2000 | Sanielevici et al. | 375/334 |
| 6,026,286 | A | | 2/2000 | Long | |
| 6,028,887 | A | | 2/2000 | Harrison et al. | 375/206 |
| 6,031,217 | A | | 2/2000 | Aswell et al. | |
| 6,041,073 | A | | 3/2000 | Davidovici et al. | 375/148 |
| 6,047,026 | A | | 4/2000 | Chao et al. | |
| 6,049,573 | A | | 4/2000 | Song | |
| 6,049,706 | A | | 4/2000 | Cook et al. | 455/313 |
| 6,054,889 | A | | 4/2000 | Kobayashi | 327/357 |
| 6,061,551 | A | | 5/2000 | Sorrells et al. | 455/118 |
| 6,061,555 | A | | 5/2000 | Bultman et al. | 455/313 |
| 6,064,054 | A | | 5/2000 | Waczynski et al. | |
| 6,067,329 | A | | 5/2000 | Kato et al. | |
| 6,073,001 | A | | 6/2000 | Sokoler | |
| 6,076,015 | A | | 6/2000 | Hartley et al. | |
| 6,078,630 | A | * | 6/2000 | Prasanna | |
| 6,081,691 | A | | 6/2000 | Renard et al. | 455/12.1 |
| 6,084,465 | A | | 7/2000 | Dasgupta | |
| 6,084,922 | A | | 7/2000 | Zhou et al. | 375/316 |
| 6,085,073 | A | | 7/2000 | Palermo et al. | |
| 6,091,939 | A | | 7/2000 | Banh | 455/102 |
| 6,091,940 | A | | 7/2000 | Sorrells et al. | 455/118 |
| 6,091,941 | A | | 7/2000 | Moriyama et al. | 455/126 |
| 6,094,084 | A | | 7/2000 | Abou-Allam et al. | |
| 6,098,046 | A | | 8/2000 | Cooper et al. | |
| 6,098,886 | A | | 8/2000 | Swift et al. | 235/472.1 |
| 6,121,819 | A | | 9/2000 | Traylor | 327/326 |
| 6,125,271 | A | | 9/2000 | Rowland, Jr. | 455/313 |
| 6,144,236 | A | | 11/2000 | Vice et al. | 327/113 |
| 6,144,331 | A | | 11/2000 | Jiang | |
| 6,144,846 | A | | 11/2000 | Durec | 455/323 |
| 6,147,340 | A | | 11/2000 | Levy | 250/214 R |
| 6,147,763 | A | | 11/2000 | Steinlechner | 356/484 |
| 6,150,890 | A | | 11/2000 | Damgaard et al. | 331/14 |
| 6,151,354 | A | | 11/2000 | Abbey | |
| 6,160,280 | A | | 12/2000 | Bonn et al. | |
| 6,169,733 | B1 | | 1/2001 | Lee | |
| 6,175,728 | B1 | | 1/2001 | Mitama | 455/323 |
| 6,178,319 | B1 | | 1/2001 | Kashima | |
| 6,204,789 | B1 | | 3/2001 | Nagata | |
| 6,215,475 | B1 | | 4/2001 | Meyerson et al. | 345/173 |
| 6,225,848 | B1 | | 5/2001 | Tilley et al. | |
| 6,230,000 | B1 | | 5/2001 | Tayloe | |
| 6,266,518 | B1 | | 7/2001 | Sorrells et al. | 455/118 |
| 6,307,894 | B1 | | 10/2001 | Eidson et al. | |
| 6,313,685 | B1 | | 11/2001 | Rabii | |
| 6,314,279 | B1 | | 11/2001 | Mohindra | |
| 6,317,589 | B1 | * | 11/2001 | Nash | 455/245.2 |
| 6,321,073 | B1 | | 11/2001 | Luz et al. | |
| 6,327,313 | B1 | | 12/2001 | Traylor et al. | |
| 6,330,244 | B1 | | 12/2001 | Swartz et al. | |
| 6,335,656 | B1 | | 1/2002 | Goldfarb et al. | |
| 6,353,735 | B1 | | 3/2002 | Sorrells et al. | 455/118 |
| 6,363,262 | B1 | | 3/2002 | McNicol | |
| 6,366,622 | B1 | | 4/2002 | Brown et al. | |
| 6,370,371 | B1 | | 4/2002 | Sorrells et al. | 455/323 |
| 6,400,963 | B1 | | 6/2002 | Glockler et al. | |
| 6,421,534 | B1 | | 7/2002 | Cook et al. | |
| 6,459,721 | B1 | | 10/2002 | Mochizuki et al. | |
| 6,516,185 | B1 | | 2/2003 | MacNally | |
| 6,531,979 | B1 | | 3/2003 | Hynes | |
| 6,542,722 | B1 | | 4/2003 | Sorrells et al. | |
| 6,560,301 | B1 | | 5/2003 | Cook et al. | |
| 6,580,902 | B1 | | 6/2003 | Sorrells et al. | |
| 6,600,795 | B1 | | 7/2003 | Ohta et al. | |
| 6,600,911 | B1 | * | 7/2003 | Morishige et al. | |
| 6,608,647 | B1 | | 8/2003 | King | |
| 6,611,569 | B1 | | 8/2003 | Schier et al. | |
| 6,634,555 | B1 | | 10/2003 | Sorrells et al. | |
| 6,647,250 | B1 | | 11/2003 | Bultman et al. | |
| 6,686,879 | B1 | * | 2/2004 | Shattil | |
| 6,687,493 | B1 | | 2/2004 | Sorrells et al. | |
| 6,690,232 | B1 | | 2/2004 | Ueno et al. | |
| 6,694,128 | B1 | | 2/2004 | Sorrells et al. | |
| 6,697,603 | B1 | | 2/2004 | Lovinggood et al. | |
| 6,704,549 | B1 | * | 3/2004 | Sorrells et al. | |
| 6,704,558 | B1 | * | 3/2004 | Sorrells et al. | |

FOREIGN PATENT DOCUMENTS

| | | | |
|---|---|---|---|
| DE | 196 27 640 | A1 | 1/1997 |
| DE | 196 48 915 | A1 | 6/1998 |
| DE | 197 35 798 | C1 | 7/1998 |
| EP | 0 035 166 | A1 | 9/1981 |
| EP | 0 099 265 | A1 | 1/1984 |
| EP | 0 087 336 | B1 | 7/1986 |
| EP | 0 254 844 | A2 | 2/1988 |
| EP | 0 193 899 | B1 | 6/1990 |
| EP | 0 380 351 | A2 | 8/1990 |
| EP | 0 380 351 | A3 | 2/1991 |
| EP | 0 411 840 | A2 | 2/1991 |
| EP | 0 423 718 | A2 | 4/1991 |
| EP | 0 411 840 | A3 | 7/1991 |
| EP | 0 485 095 | A1 | 5/1992 |
| EP | 0 423 718 | A3 | 8/1992 |
| EP | 0 512 748 | A2 | 11/1992 |
| EP | 0 529 836 | A1 | 3/1993 |
| EP | 0 548 542 | A1 | 6/1993 |
| EP | 0 512 748 | A3 | 7/1993 |
| EP | 0 087 336 | A1 | 8/1993 |
| EP | 0 560 228 | A1 | 9/1993 |
| EP | 0 632 288 | A2 | 1/1995 |
| EP | 0 632 577 | A1 | 1/1995 |
| EP | 0 643 477 | A2 | 3/1995 |
| EP | 0 643 477 | A3 | 3/1995 |
| EP | 0 411 840 | B1 | 10/1995 |
| EP | 0 696 854 | A1 | 2/1996 |
| EP | 0 632 288 | A3 | 7/1996 |
| EP | 0 732 803 | A1 | 9/1996 |
| EP | 0 486 095 | B1 | 2/1997 |
| EP | 0 782 275 | A2 | 7/1997 |
| EP | 0 785 635 | A1 | 7/1997 |
| EP | 0 789 449 | A2 | 8/1997 |
| EP | 0 795 955 | A3 | 9/1997 |
| EP | 0 795 955 | A2 | 9/1997 |
| EP | 0 795 978 | A2 | 9/1997 |

| | | | |
|---|---|---|---|
| EP | 0 817 369 | A2 | 1/1998 |
| EP | 0 817 369 | A3 | 1/1998 |
| EP | 0 837 565 | A1 | 4/1998 |
| EP | 0 862 274 | A1 | 9/1998 |
| EP | 0 874 499 | A2 | 10/1998 |
| EP | 0 512 748 | B1 | 11/1998 |
| EP | 0 877 476 | A1 | 11/1998 |
| EP | 0 977 341 | A | 2/2000 |
| FR | 2 245 130 | | 4/1975 |
| FR | 2 669 787 | A1 | 5/1992 |
| FR | 2 743 231 | A1 | 7/1997 |
| GB | 2 161 344 | A | 1/1986 |
| GB | 2 215 945 | A | 9/1989 |
| GB | 2 324 919 | A | 11/1998 |
| JP | 56-114451 | | 9/1981 |
| JP | 59-144249 | | 8/1984 |
| JP | 60-130203 | | 7/1985 |
| JP | 61-30821 | | 2/1986 |
| JP | 63-54002 | | 3/1988 |
| JP | 2-39632 | | 2/1990 |
| JP | 2-131629 | | 5/1990 |
| JP | 2-276351 | | 11/1990 |
| JP | 5-327356 | | 12/1993 |
| JP | 8-32556 | | 2/1996 |
| JP | 8-139524 | | 5/1996 |
| JP | 9-36664 | | 2/1997 |
| WO | WO 80/01633 | A1 | 8/1980 |
| WO | WO 91/18445 | A1 | 11/1991 |
| WO | WO 94/05087 | A1 | 3/1994 |
| WO | WO 95/01006 | A1 | 1/1995 |
| WO | WO 96/02977 | A1 | 2/1996 |
| WO | WO 96/08078 | A1 | 3/1996 |
| WO | WO 96/39750 | A1 | 12/1996 |
| WO | WO 97/08839 | A3 | 3/1997 |
| WO | WO 97/08839 | A2 | 3/1997 |
| WO | WO 97/38490 | A1 | 10/1997 |
| WO | WO 98/00953 | A1 | 1/1998 |
| WO | WO 98/21201 | A1 | 6/1998 |
| WO | WO 98/40968 | A3 | 9/1998 |
| WO | WO 98/40968 | A2 | 9/1998 |
| WO | WO 99/23755 | A1 | 5/1999 |
| WO | WO 00/31659 | A1 | 6/2000 |

OTHER PUBLICATIONS

Aghvami, H. et al., "Land Mobile Satellites Using the Highly Elliptic Orbits–The UK T–SAT Mobile Payload," *Fourth International Conference on Satellite Systems for Mobile Communications and Navigation,* , IEE, pp. 147–153 (Oct. 17–19, 1988).

Akers, N. P. et al., "RF Sampling Gates: a Brief Review," *IEE Proceedings,* IEE, vol. 133, Part A, No. 1, pp. 45–49 (Jan. 1986).

Al–Ahmad, H.A.M. et al., "Doppler Frequency Correction for a Non–Geostationary Communications Satellite. Techniques for CERS and T–SAT, " *Electronics Division Colloquium on Low Noise Oscillators and Synthesizers,* IEE, pp. 4/1–4/5 (Jan. 23, 1986).

Ali, I. et al., "Doppler Characterization for LEO Satellites," *IEEE Transactions on Communications,* IEEE, vol. 46, No. 3, pp. 309–313 (Mar. 1998).

Allan, D.W., "Statistics of Atomic Frequency Standards," *Proceedings Of The IEEE Special Issue on Frequency Stability,* IEEE, pp. 221–230 (Feb. 1966).

Allstot, D.J. et al., "MOS Switched Capacitor Ladder Filters," *IEEE Journal of Solid–State Circuits, IEEE,* vol. SC–13, No. 6, pp. 806–814 (Dec. 1978).

Allstot, D.J. and Black Jr. W.C., "Technological Design Considerations for Monolithic MOS Switched–Capacitor Filtering Systems," *Proceedings of the IEEE,* IEEE, vol. 71, No. 8, pp. 967–986 (Aug. 1983).

Alouini, M. et al., "Channel Characterization and Modeling for Ka–Band Very Small Aperture Terminals," *Proceedings Of the IEEE,*IEEE, vol. 85, No. 6, pp. 981–997 (Jun. 1997).

Andreyev, G.A. and Ogarev, S.A., "Phase Distortions of Keyed Millimeter–Wave Signals In the Case of Propagation in a Turbulent Atomsphere," *Telecommunications and Radio Engineering,* Scripta Technica, vol. 43, No. 12, pp. 87–90 (Dec. 1988).

Antonetti, A. et al., "Optoelectronic Sampling in the Picosecond Range," *Optics Communications,* North–Holland Publishing Company, vol. 21, No. 2, pp. 211–214 (May 1977).

Austin, J. et al., "Doppler Correction of the Telecommunication Payload Oscillators in the UK T–SAT," *$18^{th}$ European Microwave Conference,* Microwave Exhibitions and Publishers Ltd., pp. 851–857 (Sep. 12–15, 1988).

Auston, D.H., "Picosecond optoelectronic switching and gating in silicon," *Applied Physics Letters,* American Institute of Physics, vol. 26, No. 3, pp. 101–103 (Feb. 1, 1975).

Baher, H., "Transfer Functions for Switched–Capacitor and Wave Digital Filters," *IEEE Transactions on Circuits and Systems,* IEEE Circuits and Systems, Society, vol. CAS–33, No. 11, pp. 1138–1142 (Nov. 1986).

Baines, R., "The DSP Bottleneck," *IEEE Communications Magazine,* IEEE Communications Society, pp. 46–54 (May 1995).

Banjo, O.P. and Vilar, E., "Binary Error Probabilites on Earth–Space Links Subject to Scintillation Fading," *Electronics Letters,* IEE, vol. 21, No. 7, pp. 296–297 (Mar. 28, 1985).

Banjo, O.P. and Vilar, E., "The Dependence of Saint Path Amplitude Scintillations on Various Meterorological Parameters," *Fifth International Conference on Antennas and Propagation* (ICAP 87) Part 2: *Propagation,* IEE, pp. 277–280 (Mar. 30 –Apr. 2, 1987).

Banjo. O.P. and Vilar, E. "Measurement and Modeling of Scintillations on Low–Elevations Earth–Space Paths and Impact on Communication Systems," *IEEE Transactions on Communications,* IEEE Communications Society, vol. COM–34, No. 8, pp. 774–780 (Aug. 1986).

Banjo, O.P. et al., "Troposheric Amplitude Spectra Due to Absorption and Scattering in Earth–Space Paths," *Fourth International Conference on Antennas and Propagation* (ICAP 85), IEE, pp. 77–82 (Apr. 16–19, 1985).

Baslli, P. et al., "Case Study of Intense Scintillation Events on the OTS Path," *IEEE Transactions on Antennas and Propagation,* IEEE, vol. 38, No. 1, pp. 107–113 (Jan. 1990).

Basilli, P. et al., "Observation of High $C^2$ and Turbulent Path Length on OTS Space–Earth Link," *Electronics Letters,* IEE, vol. 24, No. 17, pp. 1114–1116 (Aug. 18, 1988).

Blakey, J.R. et al., "Measurement of Atmospheric Millimetre–Wave Phase Scintillations in an Absorption Region," *Electronics Letters,* vol. 21, No. 11, pp. 486–487 (May 23, 1985).

Burgueño, A. et al., "Influence of rain gauage integration time on the rain rate statistics used in microwave communications," *annales des tèlècommunications,* International Union of Radio Science, pp. 522–527 (Sep./Oct. 1988).

Burgueño, "Long–Term Joint Statistical Analysis of Duration and intensity of Rainfall Rate Return Periods in the Context of Microwave Communications," *Sixth International Conference on Antennas and Propagation* (ICAP 89) Part 2: Propagation, IEE, pp. 297–301 (Apr. 4–7, 1989).

Burguño, et al., "Long Term Statistics of Precipitation Rate Return Periods in the Context of Microwave Communications," *Sixth International Conference on Antennas and Propagation (ICAP 89) Part 2: Propagation,* IEE, pp. 297–301 (Apr. 4–7, 1989).

Burgueño, A. et al., "Spectral Analysis of 49 Years of Rainfall Rate and Relation to Fade Dynamics," *IEEE Transactions on Communications,* IEEE Communications Society, vol. 38, No. 9, pp. 1359–1366 (Sep. 1990).

Catalan, C. and Vitar, E., "Approach for satellite slant path remote sensing," *Electronics Letters,* IEE, vol. 34, No. 12, pp. 1238–1240 (Jun. 11, 1998).

Chan, P. et al., "Highly Linear 1–GHz CMOS Downconversion Mixer," *European Solid State Circuits Conference,* IEEE Communication Society, pp. 210–213 (Sep. 22–24, 1993).

Copy of Declaration of Michael J. Bultman filed in patent application Ser. No. 09/176,022, which is directed to related subject matter, 2 pages.

Copy of Declaration of Robert W. Cook filed in patent application Ser. No. 09/176,022, which is directed to related subject matter, 2 pages.

Copy of Declaration of Alex Holtz filed in patent application Ser. No. 09/176,022, which is directed to related subject matter, 3 pages.

Copy of Declaration of Richard C. Looke filed in patent application Ser. No. 09/176,022, which is directed to related subject matter, 2 pages.

Copy of Declaration of Charley D. Moses, Jr. filed in patent application Ser. No. 09/176,022, which is directed to related subject matter, 2 pages.

Copy of Declaration of Jeffrey L. Parker and David F. Sorrells, with attachment Exhibit 1, filed in patent application Ser. No. 09/176,022, which is directed to related subject matter, 130 pages.

Dewey, R.J. and Collier, C.J., "Multi–Mode Radio Receiver," *Electronics Division Colloqium on Digitally Implemented Radios,* IEE, pp. 3/1–3/5 (Oct. 18, 1985).

Dialog File 347 (Japio) English Language Patent Abstract for JP 2–276351, 1 page (Nov. 13, 1990–Date of publication of application).

Dialog File 347 (JAPIO) English Language Patent Abstract for JP 2–131629, 1 page (May 21, 1990 –Date of publication of application).

Dialog File 347 (JAPIO) English Language Patent Abstract for JP 2–39632, 1 page (Feb. 8, 1990 –Date of publication of application).

Dialog File 348 (European Patents) English Language Patent Abstract for EP 0 785 635 A1, 3 pages (Dec. 26, 1996 –Date of publication of application).

Dialog File 348 (European Patents) English Language Patent Abstract for EP 35166 A1, 2 pages (Feb. 18, 1981 –Date of publication of application).

"DSO takes sampling rate to 1 Ghz," *Electronic Engineering,* Morgan Grampian Publishers, vol. 59, No. 723, pp. 77 and 79 (Mar. 1987).

Erdi, G. and Henneuse, P.R., "A Precision FET–Less Sample–and–Hold with High Charge–to–Droop Current Ratio," *IEEE Journal of Solid–State Circuits,* IEEE, vol. SC–13, No. 6, pp. 864–873 (Dec. 1978).

Faulkner, N.D. and Vitar, E., "Subharmonic Sampling for the Measurement of Short Term Stability of Microwave Oscillators," *IEEE Transactions on Instrumentation and Measurement,* IEEE, vol. IM–32, No. 1, pp. 208–213 (Mar. 1983).

Faulkner, N.D. et al., "Sub–Harmonic Sampling for the Accurate Measurement of Frequency Stability of Microwave Oscillators," *CPEM 82 Digest: Conference on Precision Electromagnetic Measurements,* IEEE, pp. M–10 and M–11 (1982).

Faulkner, N.D. and Vilar, E., "Time Domain Analysis of Frequency Stability Using Non–Zero Dead–Time Counter Techniques," *CPEM 84 Digest Conference on Precision Electromagnetic Measurements,* IEEE, pp. 81–82 (1984).

Filip, M. and Vilar, E., "Optimum Utilization of the Channel Capacity of a Satellite Link in the Presence of Amplitude Scintillations and Rain Attenuation," *IEEE Transactions on Communications,* IEEE Communications Society, vol. 38, No. 11, pp. 1958–1965 (Nov. 1990).

Fukahori, K., "CMOS Narrow–Band Signaling Filter with Q Reduction," *IEEE Journal of Solid–State Circuits,* IEEE, vol. SC–19, No. 6, pp. 926–932 (Dec. 1984).

Fukuchi, H. and Otsu, y., "Available time statistics of rain attenuation on earth–space path," *IEE Proceedings–H: Microwaves, Antennas and Propagation,* IEE, vol. 135, Pt. H, No. 6, 387–390 (Dec. 1988).

Gibbons, C.J. and Chadha, R., "Millimetre–wave propagation through hydrocarbon flame," *IEE Proceedings,* IEE, vol. 134, Pt. H, No. 2, pp. 169–173 (Apr. 1987).

Gilchrist, B. et al., "Sampling hikes performance of frequency syntheizers," *Microwaves & RF,* Hayden Publishing, vol. 23, No. 1, pp. 93–94 and 110 (Jan. 1984).

Gossard, E.E., "Clear weather meteorological on propagation at frequencies above 1 Ghz," *Radio Science,* American Geophysical Union, vol. 16, No. 5, pp. 589–608 (Sep.–Oct. 1981).

Gregorian, R. et al., "Switched–Capacitor Circuits Design," *Proceedings of the IEEE, IEEE,* vol. 71, No. 8, pp. 941–966 (Aug. 1983).

Groshong et al., "Undersampling Techniques Simplify Digital Radio," *Electronic Design,* Penton Publishing, pp. 67–68, 70, 73–75 and 78 (May 23, 1991).

Grove, W.M., "Sampling for Oscilloscope and Other RF Systems: Dc through X–Band," *IEEE Transactions on Microwave Theory and Techniques,* IEEE, pp. 629–635 (Dec. 1966).

Haddon, J. et al., "Measurement of Microwave Scintillations on a Satellite Down–Link at X–Band," *Antennas and Propagation,* IEE, pp. 113–117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation,* IEEE, vol. AP–34, No. 5, pp. 646–657 (May 1986).

Hafdallah, H. et al., "2–4 Ghz MESFET Sampler," *Electronics Letters,* IEE, vol. 24, No. 3, pp. 151–153 (Feb. 4, 1988).

Herban, M.H.A.J., "Amplitude and Phase Scintillation Measurements on 8–2 km Line–Of–Sight Path at 30 Ghz," *Electronics Letters,* IEE, vol. 18, No. 7, pp. 287–289 (Apr. 1, 1982).

Hewitt, A. et al., "An 18 Ghz Wideband LOS Multipath Experiment," *International Conference on Measurements for Telecommunication Transmission Systems* –MTTS 85, IEE, pp. 112–116 (Nov. 27–28, 1985).

Hewitt, A. et al., "An Autoregressive Approach to the Identification of Multipath Ray Parameters from Field Measurements," *IEEE Transactions on Communications,* IEEE Communications Society, vol. 37, No. 11, pp. 1136–1143 (Nov. 1989).

Hewitt, A. and Vilar, E., "Selective fading on LOS Microwave Links: Classical and Spread–Spectrum Measurement Techniques," *IEEE Transactions on Communications,* IEEE Communications Society, vol. 36, No. 7, pp. 789–796 (Jul. 1988).

Hospitalier, E., "Instruments for Recording and Observing Rapidly Varying Phenomena," *Science Abstracts,* IEE, vol. VII, pp. 22–23 (1904).

Howard, I.M. and Swansson, N.S., "Demodulating High Frequency Resonance Signals for Bearing Fault Detection," *The Institution of Engineers Australia Vibration and Noise Conference,* Institution of Engineers, Australia, pp. 115–121 (Sep. 18–20, 1990).

Hu, X., *A Switched–Current Sample–and–Hold Amplifier for FM Demodulation,* Thesis for Master of Applied Science, Dept. of Electrical and Computer Engineering, University of Toronto, UMI Dissertation Services, pp. 1–64 (1995).

Hung, H–L, A. et al., "Characterization of Microwave Integrated Circuits Using An Optical Phase–Locking and Sampling System," *IEEE MTT–S Digest,* IEEE, pp. 507–510 (1991).

Hurst, P.J., "Shifting the Frequency Response of Switched––Capacitor Filters by Nonuniform Sampling," *IEEE Transactions on Circuits and Systems,* IEEE Circuits and Systems Society, vol. 38, No. 1, pp. 12–19 (Jan. 1991).

Itakura, T., "Effects of the sampling pulse width on the frequency characteristics of a sample–and–hold circuits," *IEE Proceedings Circuits, Devices and Systems,* IEE, vol. 141, No. 4, pp. 328–336 (Aug. 1994).

Janssen, J.M.L., "An Experimental 'Stroboscopic' Oscilloscope for Frequencies up to about 50 Mc/s: I. Fundamentals," *Phillips Technical Review,* Philips Research Laboratories, vol. 12, No. 2, pp. 52–59 (Aug. 1950).

Janssen, J.M.L. and Michels, A.J., "An Experimental 'Stroboscopic' Oscilloscope for Frequencies up to about 50 Mc/s: II. Electrical Build–up," *Philips Technical Review,* Philips Research Laboratories, vol. 12, No. 3, pp. 73–82 (Sep. 1950).

Jondral, V.F. et al., "Doppler Profiles for Communications Satellites," *Frequenz,* Herausberger, pp. 111–116 (May–Jun. 1996).

Kaleh, G.K., "A Frequency Diversity Spread Spectrum System for Communication in the Presence of In–band Interference," *1995 IEEE Globecom,* IEEE Communication Society, pp. 66–70 (1995).

Merkelo, J. and Hall, R.D., "Broad–Band–Thin–Film Signal Sampler," *IEEE Journal of Solid–State Cicuits,* IEEE, vol. SC–7, No. 1, pp. 50–54 (Feb. 1972).

Merlo, U. et al., "Amplitude Scintillation Cycles in a Sirlo Satellite–Earth Link," *Electronics Letters,* IEE, vol. 21, No. 23, pp. 1094–1096 (Nov. 7, 1985).

Morris, D., "Radio–holographic reflector measurement of the 30–m millimeter radio telescope at 22 Ghz with a cosmic signal source," *Astronomy and Astrophysics,* Springer–Vertag, vol. 203, No. 2, pp. 399–406 (Sep. (II) 1988).

Moulsley, T.J. et al., "The efficient acquisition and processing of propagation statistics," *Journal of the Institution of Electronic and Radio Engineers,* IERE, vol. 55, No. 3, pp. 97–103 (Mar. 1985).

Ndzi, D. et al., "Wide–Band Statistical Characterization of an Over–the–Sea Experimental Transhorizon Link," *IEE Colloquium on Radio Communications at Microwave and Millimetre Wave Frequencies,* IEE, pp. 1/1–1/6 (Dec. 16, 1996).

Ndzi, D. et al., "Wideband Statistics of Signal Levels and Doppler Spread on am Over–The–Sea Transhorizon Link," *IEE Colloquium on Propagation Characteristics and Related System Techniques for Beyond Line–of–Sight Radio,* IEE, pp. 9/1–9/6 (Nov. 24, 1997).

"New zero IF chipset from Philips," *Electronic Engineering,* United News & Media, vol. 67, No. 825, p. 10 (Sep. 1995).

Ohara, H. et al., "First monolithic PCM filter cuts of telecomm systems," *Electronic Design,* Hayden Publishing Company, vol. 27, No. 8, pp. 130–135 (Apr. 12, 1979).

Oppenheim, A.V. et al., *Signals and Systems,* Prentice–Hall, pp. 527–562 and 561–562 (1983).

Ortgies, G., "Experimental Parameters Affecting Amplitude Scintillation Measurements on Satellite Links," *Electronics Letters,* IEE, vol. 21, No. 17, pp. 771–772 (Aug. 15, 1985).

Pärssinen et al., "A 2–GHz Subharmonic Sampler for Signal Downconversion," *IEEE Transactions on Microwave Theory and Techniques,* IEEE, vol. 45, No. 12, 7 pages (Dec. 1997).

Peeters, G. et al., "Evaluation of Statistical Models for Clear–Air Scintillation Prediction Using Olympus Satellite Measurements," *International Journal of Satellite Communications,*John Wiley and Sons, vol. 15, No. 2, pp. 73–88 (Mar.–Apr. 1997).

Perrey, A.G. and Schoenwetter, H.K., *NBS Technical Note 1121: A Schottky Diode Bridge Sampling Gate,* U.S. Dept. of Commerce, pp. 1–14 (May 1980).

Poulton, K. et al., "A 1–Ghz 6–bit ADC System,"*IEEE Journal of Solid–State Circuits,* IEEE, vol. SC–22, No. 6, pp. 962–969 (Dec. 1987).

Press Release, "Parkervision, Inc. Announces Fiscal 1993 Results," Lippert/Hellshorn and Associates, 2 Pages (Apr. 6, 1994).

Press Release, "Parkervision, Inc. Announces the Appointment of Michael Baker to the New Position of National Sales Manager," Lippert/Heilshorn and Associates, 1 Page (Apr. 7, 1994).

Press Release, "Parkervision's Cameraman Well–Received By Learning Market," Lippert/Hellshorn and Associates, 2 Pages (Apr. 8, 1994).

Press Release, "Parkervision, Inc. Announces First Quarter Financial," Lippert/Hellshorn and Associates, 2 Pages (Apr. 26, 1994).

Press Release, "Parkvision, Inc. Announces The Retirement of William H. Fletcher, Chief Financial Officer," Lippert/Heilshorn and Associates, 1 Page (May 11, 1994).

Press Release, "Parkervision, Inc. Announces New Cameraman System II ™ At Infocomm Trade Show," Lippert/Hellshorn and Associates, 3 Pages (Jun. 9, 1994).
Press Release, "Parkvision, Inc. Announces Appointments to its National Sales Force," Lippert/Hellishorn and Associates, 2 Pages (Jun. 17, 1994).
Press Release, "Parkvision, Inc. Announces Second Quarter and Six Months Financial Results," Lippert/Heilshorn and Associates, 3 Pages (Aug. 9, 1994).
Press Release, "Parkervision, Inc. Announces Third Quarter and Nine Months Financial Results," Lippert/Heilshorn and Associates, 3 Pages (Oct. 28, 1994).
Press Release, "Parkervision, Inc. Announces First Significent Dealer Sale of its *Cameraman*® System II," Lippert/Heilshorn and Associates, 2 Pages (Nov. 7, 1994).
Press Release, "Parkvision, Inc. Announces Fourth Quarter and Year End Results," Lippert/Heilshorn and Associates, 2 Pages (Mar. 1, 1995).
Press Release, "Parkervision, Inc. Announces Joint Products Developments With VTEL," Lippert/Heilshorn and Associates, 2 Pages (Mar. 21, 1995).
Press Release, "Parkervision, Inc., Announces First Quarters Financial Results," Lippert/Heilshorn and Associates, 3 Pages (Apr. 28, 1995).
Press Release, "Parkvision Wins Top 100 Product Districts'Choice Award," Parkervision Marketing and Manufacturing Headquarters, 1 Page (Jun. 29, 1995).
Press Release, "Parkervision National Sales Manager Next President of USDLA," Parkervision Marketing and Manufacturing Headquarters, 1 Page (Jul. 6, 1995).
Press Release, "Parkervision Granted New Patent," Parkervision Marketing and Manufacturing Headquarters, 1 Page (Jul. 21, 1995).
Press Release, "Parkervision, Inc. Announces Second Quarter and Six Months Financial Results," Parkervision Marketing and Manufacturing Headquarters, 2 Page (Jul. 31, 1995).
Press Release, "Parkervision, Inc. Expands Its Cameraman System II Product Line," Pakervision Marketing and Manufacturing Headquarters, 2 Pages (Sep. 22, 1995).
Press Release, "Parkervision Announces New Camera Control Camera Technology," Parkervision Marketing and Manufacturing Headquarters, 2 pages (Oct. 25, 1995).
Press Release, "Parkervision, Inc. Announces Completion of VTEL/PArkervision Joint Product Line" Parkervision Marketing and Manufacturing Headquarters, 2 Pages (Oct. 30 , 1995).
Press Release "Parkervision, Inc. Announces Third Quarter and Nine Months Financial Results," Parkervision Marketing and Manfacturing Headquarters, 2 Pages (Oct. 30, 1995).
Press Release, "Parkervision's Cameraman Personal Locator Camera System Wins Telecon XV Award," Parkvision Marketing and Manufacturing Headquarters, 2 pages (Nov. 1, 1995).
Press Release, "Parkervision, Inc. Announces Purchase Commitment From VTEL Corporation," Parkervision Marketing and Manufacturing Headquarters, 1 page (Feb. 26, 1996).
Press Release, "ParkVision, Inc. Announces Fourth Quarter and Year End Results," Parkervision Marketing and Manufacturing Headquarters, 2 page (Feb. 27, 1996).
Press Release, "Parkervision, Inc. Expands its Product Line," Parkervision Marketing and Manufacturing Headquarters, 2 pages (Mar. 7, 1996).
Press Release, "ParkerVision Files Patents for its Research of Wireless Technology," Parkervision Marketing and Manufacturing Headquarters, 1 page (Mar. 28, 1996).
Press Release, "Parkervision, Inc. Announces First Significant Sale of its Cameraman® Three–Chip System," Parkervision Marketing and Manufacturing Headquarters, 2 pages (Apr. 12, 1996).
Press Release, "Parkervision, Inc. Introduces New Product Line For Studio Production Market," Parkervision Marketing and Manufacturing Headquarters, 2 pages (Apr. 15, 1996).
Press Release, "Parkervision, Inc. Announces Private Placement of 800,000 Shares," Parkervision Marketing and Manufacturing Headquarters, 1 page (Apr. 15, 1996).
Press Release, "Parkervision, Inc. Announces First Quarters Financial Results," Parkervision Marketing and Manufacturing Headquarters, 3 pages (Apr. 30, 1996).
Press Release, "ParkerVision's New Studio Product Wins Award," Parkvision Marketing and Manufacturing Headquarters, 2 pages (Jun. 5, 1996).
Press Release, "Parkvision, Inc. Announces Second Quarter and Six Months Financial Results," Parkervision Marketing and Manfacturing Headquarters, 3 pages (Aug. 1, 1996).
Press Release, "Parkvision, Inc. Announces Third Quarters and Nine Months Financial Results," Parkervision Marketing and Manufacturing Headquarters, 2 pages (Oct. 29, 1996).
Press Release, "PictureTel and ParkVision Sign Reseller Agreement," Parkervision Marketing and Manufacturing Headquarters, 2 pages (Oct. 30, 1996).
Press Release, "CLI and Parkervision Bring Enhanced Ease–of–Use to Videoconferencing," CLI/Parkervision, 2 pp. (Jan. 20, 1997).
Press Release, "Parkervision, Inc. Announces Fourth Quarter and Year End Results," Parkervision Marketing and Manufacturing Hedquarters, 3 pages (Feb. 27, 1997).
Press Release, "Parkervision, Inc. Announces First Quarter Financial results," Parkervision Marketing and Manufacturing Headquarters, 3 pages (Apr. 29, 1997).
Press Release, "NEC and Parkervision Make Distance Learning Closer," NEC America, 2 pages (Jun. 18, 1997).
Press Release, "Parkervision Supplies JPL with Robotic Cameras, Cameraman Shoot Director for Mars Mission," Parkervision Marketing and Manufacturing Headquarters, 2 pages (Jul. 8, 1997).
Press Release, "Parkervision and IBM Join Forces to Create Wireless Computer Peripherals," Parkervision Marketing and Manufacturing Headquarters, 2 pages (Jul. 23, 1997).
Press Release, "Parkervision, Inc. Announces Second Quarters and Six Months Financial Results," Parkervision Marketing and Manufacturing Headquarters, 3 pages (Jul. 13, 1997).
Press Release, "Parkervision, Inc. Announces Private Placement of 990,000 Shares," Parkervision Marketing and Manufacturing Headquarters, 2 pages (Sep. 8, 1997).
Press Release, "Wal–Mart Chooses Parkervision for Broadcast Production," Parkervision Marketing and Manufacturing Headquarters, 2 pages (Oct. 24, 1997).
Press Release, "Parkervision, Inc. Announces Third Quarter Financial Results," Parkervision Marketing and Manufacturing Headquarters, 3 pages (Oct. 30, 1997).

Press Release, "Parkervision Announces Breakthrough in Wireless Radio Frequency Technology," Parkervision Marketing Headquarters, 3 pages (Dec. 10, 1997).
Press Release, "Parkervision, Inc. Announces the Appointment of Joseph F. Skovron to the Position of Vice President, Licensing –Wireless Technologies," Parkervision Marketing and Manufacturing Headquarters, 2 pages (Jan. 9, 1998).
Press Release, "Parkervision Announces Existing Agreement with IBM Terminates– Company Continues with Strategic Focus Announced in Dec." Parkervision Marketing and Manufacturing Headquarters, 2 pages (Jan. 27, 1998).
Press Release, "Laboratory Tests Verify Pakervision Wireless Technology," Parkervision Marketing and Manufacturing Headquarters, 2 pages (Mar. 3, 1998).
Press Release, "Parkervision, Inc. Announces Fourth Quarter and Year End Finanical Results," Parkervision Marketing and Manufacturing Headquarters, 3 pages (Mar. 5, 1998).
Press Release, "Pakervision Awarded Editors'Pick of Show for NAB 98," Parkervision Marketing and Manufacturing Headquarters, 2 pages (Apr. 15, 1998).
Press Release, "Parkervision Announces First Quarter Financial Results," Parkervision Marketing and Manufacturing Headquarters, 3 pages (May 4, 1998).
Press Release, "Parkervision 'DIRECT2DATA'Introduced in Response to Market Demand," Parkervision Marketing and Manufacturing Headquarters, 3 pages (Jul. 9, 1998).
Press Release, "Parkervision Expands Senior Management Team," Parkervision Marketing and Manufacturing Headquarters, 2 pages (Jul. 29, 1998).
Press Release, "Parkervision Announces Second Quarter and Six Month Financial Results," Parkervision Marketing and Manufacturing Headquarters, 4 pages (Jul 30, 1998).
Press Release, "Parkervision Announces Third Quarter and Nine Month Financial Results," Parkervision Marketing and Manufacturing Headquarters, 3 pages (Oct. 30, 1998).
Press Release, "Questar Infocomm, Inc. Invests $ Million in Parkervision Common Stock," Parkervision Marketing and Manufacturing Headquarters, 3 pages (Dec. 2, 1998).
Press Release, "Parkervision Adds Two New Directors," Parkervision Marketing and Marketing Headquarters, 2 pages (Mar. 5, 1999).
Press Release, "Parkervision Announces Fourth Quarter and Year End Financial Results," Parkervision Marketing and Manufacturing Headquarters, 3 pages (Mar. 5, 1999).
Press Release, "Joint Marketing Agreement Offers New Automated Production Solution," Parkervision Marketing and Manufacturing Headquarters, 2 pages (Apr. 13, 1999).
"Project COST 205: Scintillations in Earth–satellite links," *Alta Frequenza: Scientific Review in Electronics,* AEI, vol. LIV, No. 3, pp. 209–211 (May–Jun. 1985).
Razavi, B., *RF Microelectronics,* Prentice–Hall, pp. 147–149 (1998).
Reeves, R.J.D., "The Recording and Collocation of Waveforms (Part 1), " *Electronic Engineering,* Morgan Brothers Limited, vol. 31, No. 373, pp. 130–137 (Mar. 1959).
Reeves, R.J.D., "The Recording and Collocation of Waveforms (Part 2)," *Electronic Engineering,* Morgan Brothers Limited, vol. 31, No. 374, pp. 204–212 (Apr. 1959).
Rein, H.M. and Zahn, M. "Subnanosecond–Pulse Generator with Variable Pulsewidth Using Avalanche Transistors," *Electronics Letters,* IEE, vol. 11, No. 1, pp. 21–23 (Jan. 9, 1975).
Riad, S.M. and Nahman, N.S., "Modeling of the Feed–through Wideband (DC to 12.4 Ghz) Sampling–Head," *IEEE MTT–S International Microwave Symposium Digest,* IEEE, pp. 267–269 (Jun. 27–29, 1978).
RIzzoli, V. et al., "Computer–Aided Noise Analysis of MESFET and HEMT Mixers," *IEEE Transactions on Microwave Theory and Techniques,* IEEE, vol. 37, No. 9, pp. 1401–1410 (Sep. 1989).
Rowe, H.E., *Signal and Noise in Communication Systems,* D. Van Nostrand Company, Inc., Princeton, New Jersey, including, for example, Chapter V, Pulse Modulation Systems (1965).
Rucker, F. and Dintelmann, F., "Effect of Antenna Size on OTS Signal Scintillations and Their Seasonal Dependence," *Electronics Letters,* IEE, vol. 19, No. 24, pp. 1032–1034 (Nov. 24, 1983).
Russell, R. and Hoare, L. "Millimeter Wave Phase Locked Oscillators," *Military Microwave '78 Conference Proceedings,* Microwave Exhibitions and Publishers, pp. 238–242 (Oct. 25–27, 1978).
Sabel, L.P., "A DSP Implementation of a Robust Flexible Receiver/Demultiplexer for Broadcast Data Satellite Communications," *The Institution of Engineers Australia Communications Conference,* Institution of Engineers, Australia, pp. 218–223 (Oct. 16–18, 1990).
Salous, S., "IF digital generation of FMCW waveforms for wideband channel characterization," *IEE Proceedings–I,* IEE, vol. 139, No. 3, pp. 281–288 (Jun. 1992).
"Sampling Loops Lock Sources to 23 Ghz, " *Microwaves & RF,* Penton Publishing, p. 212 (Sep. 1990).
Sassikumer, M. et al., "Active Compensation in the Switched–Capacitor Biquad," *Proceedings of the IEEE,* IEEE, vol. 71, No. 8, pp. 1008–1009 (Aug. 1983).
Saul, P.H., "A GaAs MESFET Sample and Hold Switch," *Fifth European Solid State Circuits Conference–ESSCIRC 79,* IEE, pp. 5–7 (1979).
Shen, D.H. et al., "A 900–MHZ RF Front–End Integrated Discrete–Time Filtering," *IEEE Journal of Solid–State Circuits,* IEEE Solid–State Circuits Council, vol. 31, No. 12, pp. 1945–1954 (Dec. 1996).
Shen, X.D. and Vitar, E., "Anomalous transhorizon propagation and meterological processes of a multlink path," *Radio Science, American Geophysical Union,* vol. 30, No. 5, pp. 1467–1479 (Sep.–Oct. 1995).
Shen, X. and Tawfik, A.N., "Dynamic Behavior of Radio Channels Due to Trans–Horizon Propagation Mechanisms," *Electronics Letters,* IEE, vol. 29, No. 17, pp. 1582–1583 (Aug. 19, 1993).
Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation,* IEE, pp. 4/1–4/7 (Mar. 8, 1996).
Shen, X. and Vilar, E., "Path loss statistics and mechanisms of transhorizon propagation over a sea path," *Electronics Letters,* IEE, vol. 32, No. 3, pp. 259–261 (Feb. 1, 1996).
Shen, D. et al., "A 900 MHZ Integrated Discrete–Time Filtering RF Front–End," *IEEE International Solid State Circuits Conference,* IEEE, vol. 39, pp. 54–55 and 417 (Feb. 1996).
Spillard, C. et al., "X–Band Troposheric Transhorizon Propagation Under Differing Meteorological Conditions," *Sixth International Conference on Antennas and Propagation (ICAP 89) Part 2: Propagation,* IEE, pp. 451–455 (Apr. 4–7, 1989).
Strafford, K.R. et al., "A Complete Monolithic Sample/Hold Amplifier," *IEEE Journal of Solid–State Cicuits,* IEEE, vol. SC–9, No. 6, pp. 381–387 (Dec. 1974).

Staruk, W. Jr. et al., "Pushing HF Data Rates," *Defense Electronics,* EW Communications, vol. 17, No. 5, pp. 211, 213, 215, 217, 220 and 222 (May 1985).

Stephenson, A.G., "Digitizing multiple RF signals requires an optimum sampling rate," *Electronics,* McGraw–Hill, pp. 106–110 (Mar. 27, 1972).

Sugarman, R., "Sampling Oscilloscope for Statistically Varying Pulses," *The Review of Scientific Instruments,* American Institute of Physics, vol. 28, No. 11, pp. 933–938 (Nov. 1957).

Sylvain, M., "Experimental probing of multipath microwave channels," *Radio Science,* American Geophysical Union, vol. No. 2, pp. 160–178 (Mar.–Arp. 1989).

Takano, T., "Novel GaAs Pet Phase Dectector Operable To Ka Band," *IEEE MT–S Digest,* IEEE, pp. 381–383 (1984).

Tan, M.A., "Biquadratic Transconductance Switched–Capacitor Filters," *IEEE Transactions on Circuits and Systems–I: Fundamental Theory and Applications,* IEEE Circuits and Systems Society, vol. 40, pp. 272–275 (Apr. 1993).

Tanaka, K. et al., "Single Chip Multisystem AM Stereo Decoder IC," *IEEE Transactions on Consumer Electronics,* IEEE Consumer Electronics Society, vol. CE–32, No. 3, pp. 482–496 (Aug. 1986).

Tawfik, A.N., "Amplitude, Duration and Predictability of Long Hop Trans–Horizon X–band Signals Over the Sea," *Electronics Letters,* IEE, vol. 28, No. 6, pp. 571–572 (Mar. 12, 1992).

Tawfik, A.N. and Vilar, E., "Correlation of Transhorizon Signal Level Strength with Localized Surface Meteorological Parameters," *Eighth International Conference on Antennas and Propagation,* Electronics Division of the IEE, pp. 335–339 (Mar. 30–Apr. 2, 1993).

Tawfik, A.N. and Vilar, E., "Dynamic Structure of a Transhorizon Signal at X–band Over a Sea Path,"*Sixth International Conference on Antennas and Propagation (ICAP 89) Part 2: Propagation,* IEE, pp. 446–450 (Apr. 4–7, 1989).

Tawfik, A.N. and Vilar, E., "Statistics of Duration and Intensity of Path Loss in a Microwave Transhorizon Sea––Path," *Electronics Letters,* IEE, vol. 26, No. 7, pp. 474–476 (Mar. 29, 1990).

Tawfik, A. N. and Vilar, E., "X–Band Transhorizon Measurements of CW Transmissions Over the Sea–Part 1: Path Loss, Duration of Events, and Their Modelings," *IEEE Transactions on Antennas and Propagation,* IEEE Antennas and Propagation Society, vol. 41, No. 11, pp. 1491–1500 (Nov. 1993).

Temes, G.C. and Tsividis, T., "The Special Section on Switched–Capacitor Circuits," *Proceedings of the IEEE,* IEEE, vol. 71, No. 8, pp. 915–916 (Aug. 1983).

Thomas, G.B., *Calculus and Analytic Geometry,* Third Edition, Addison–Wesley Publishing, pp. 119–133 (1960).

Tomassetti, Q., "An Unusual Microwave Mixer," *16th European Microwave Conference,* Microwave Exhibitions and Publishers, pp. 754–759 (Sep. 8–12, 1986).

Tortoli, P. et al., "Bidirectional Doppler Signal Analysis is Based on a Single RF Sampling Channel," *IEEE Transactions on Ultrasonics, Ferroelectrics, and Frequency Control,* IEEE Ultrasonics, Ferroelectrics, and Frequency Control Society, vol. 41, No. 1, pp. 1–3 (Jan. 1984).

Tsividis, Y. and Antognetti, P. (Ed.), *Design of MOS VLSI Circuits for Telecommunications,* Prentice–Hall, p. 304 (1985).

Tsividis, Y., "Principles of Operation and Analysis of Switched–Capacitor Circuits," *Proceedings of the IEEE,* IEEE, vol. 71, No. 8, pp. 926–940 (Aug. 1983).

Tsurumi, H. and Maeda, T., "Design Study on a Direct Conversion Receiver Front–End for 280 MHZ, 900 MHZ, and 2.6 Ghz Band Radio Communication Systems," *41st IEEE Vehicular Technology Conference,* IEEE Vehicular Technology Society, pp. 457–462 (May 19–22, 1991).

Valdmanis, J. A. et al., "Picosecond and Subpicosend Optoelectronics for Measurements of Future High Speed Electronic Devices," *IEDM Technical Digest,* IEEE, pp. 597–600 (Dec. 5–7, 1983).

van de Kamp, M.M.J.L., "Asymmetric signal level distribution due to tropospheric scintillation," *Electronics Letters,* IEE, vol. 34, No. 11, pp. 1145–1146 (May 28, 1998).

Vasseur, H. and Vanoenacker, D., "Charaterization of tropospheric turbulent layers from radiosonde data," *Electronics Letters,* IEE, vol. 34, No. 4, pp. 318–319 (Feb. 19, 1998).

Verdone, R., "Outage Probability Analysis for Short–Range Communication Systems at 60 Ghz in ATT Urban Environments," *IEEE Transactions on Vehicular Technology,* IEEE Vehicular Technology Society, vol. 46, No. 4, pp. 1027–1039 (Nov. 1997).

Vierira–Ribeiro, S. A. *Single–IF DECT Receiver Architecture using a Quadrature Sub–Sampling Band–Pass Sigma–Delta Modulator,* Thesis for Degree of Master's of Engineering, Carleton University, UMI Dissertation Services, pp. 1–180 (Apr. 1995).

Vilar, E. et al., "A Comprehensive/Selective MM–Wave Satellite Downlink Experiment on Fade Dynamics," *Tenth International Conference on Antennas and Propagation,* Electronics Division of the IEE, pp. 2.98–2. 101 (Apr. 14–17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation,* AGARD, pp. 8–1 –8–16 (Oct. 4–7, 1983).

Vilar, E. and Smith, H., "A Theoretical and Experimental Study of Angular Scintillations in Earth Space Paths,"*IEEE Transactions on Antennas and Propagation,* IEEE, vol. AP–34, No. 1, pp. 2–10 (Jan. 1986).

Vilar, E. et al., "A Wide Band Transhorizon Experiment at 11.6 Ghz," *Eigth International Conference on Antennas and Propagation,* Electronics Division of the IEE, pp. 441–445 (Mar. 30–Apr. 2, 1993).

Vilar, E. and Matthews, P. A., "Amplitude Dependence of Frequency in Oscillators," *Electronics Letters,* IEE, Vol. 8, No. 20, pp. 509–511 (Oct. 5, 1972).

Vilar, E. et al., "An experimental mm–wave receiver system for measuring phase noise due to atmospheric turbulence," *Proceedings of the 25th European Microwave Conference,* Nexus House, pp. 114–119 (1995).

Vilar, E. and Burgueño, A., "Analysis and Modeling of Time Intervals Between Rain Rate Exceedances in the Context of Fade Dynamics," *IEEE Transactions on Communications,* IEEE Communications Society, vol. 39, No. 9, pp. 1306–1312 (Sep. 1991).

Vilar, E. et al., "Angle of Arrival Fluctuations in High and Low Elevation Earth Space Paths," *Fourth International Conference on Antennas and Propagation* (ICAP 85), Electronics Division of the IEE, pp. 83–88 (Apr. 16–19, 1985).

Vilar, E., "Antennas and Propagation: A Telecommunications Systems Subject," *Electronics Division Colloquim on Teaching Antennas and Propagation to Undergraduates,* IEE, pp. 7/1–7/6 (Mar. 8, 1988).

Vilar, E. et al., "CERS★. Millimetere–Wave Beacon Package and Related Payload Doppler Correction Strategies," *Electronics Division Colloquim on CERS–Communication Engineering Research Satellite,* IEE, pp. 10/1–10/10 (Apr. 10, 1984).
Vilar, E. and Moulsley, T.J., "Comment and Reply: Probability Density Function and Amplitude Scintillations," *Electronics Letters,* IEE, vol. 21, No. 14, pp. 620–622 (Jul. 4, 1985).
Vilar, E. et al., "Comparsion of Rainfall Rate Duration Distributions for ILE–IFE and Barcelona," *Electronics Letters,* vol. 28, No. 20, pp. 1922–1924 (Sep. 24, 1992).
Vilar, E., "Depolarization and Field Transmittances in Indoor Communications," *Electronics Letters,* IEE, vol. 27, No. 9, pp. 732–733 (Apr. 25, 1991).
Vilar, E. and Larsen, J. R., "Elevation Dependence of Amplitude Scintillations on Low Elevation Earth Space Paths," *Sixth International Conference on Antennas and Propagation (ICAP 89) Part 2: Propagation,* IEE, pp. 150–154 (Apr. 4–7, 1989).
Vilar, E. et al., "Experimental System and Measurements of Transhorizon Signal Levels at 11 Ghz," *18th* European Microwave Conference, Microwave Exhibitions and Publishers Ltd., pp. 429–435 (Sep. 12–15, 1988).
Vilar, E. and Matthews, P.A., "Importance of Amplitude Scintillations in Millimetric Radio Links," *Proceedings of the 4th European Microwave Conference, Microwave Exhibitions and Publishers,* pp. 202–206 (Sep. 10–13, 1974).
Vilar, E. and Haddon, J., "Measurement and Modeling of Scintillation Intensity to Estimate Turbulance Parameters in an Earth–Space Path," *IEEE Transactions on Antennas and Propagation,* IEEE Antennas and Propagation Society, vol. AP–32, No. 4, pp. 340–346 (Apr. 1984).
Vilar, E. and Matthews, P. A., "Measurement of Phase Fluctuations on Millimetric Radiowave Propagation," *Electronics Letters,* IEE, vol. 7, No. 18, pp. 566–568 (Sep. 9, 1971).
Vilar, E. and Wan, K. W. , "Narrow and Wide Band Estimates of Field Strenght for Indoor Communications in the Millimetre Band," *Electronics Division Colloquim on Radiocommunications in the Range 30–60 Ghz,* IEE, pp. 5/1–5/8 (Jan. 17, 1991).
Vilar, E. and Faulkner, N. D., "Phase Noise and Frequency Stability Measurements. Numerical Techniques and Limitations," *Electronics Division Colloquim on Low Noise Oscillators and Synthesizer,* IEE, 5 pages (Jan. 23, 1986).
Vilar, E. and Senin, S., "Propagation phase noise identified using 40 Ghz satellite downlink," *Electronics Letters,* IEE, vol. 33, No. 22, pp. 1901–1902 (Oct. 23, 1997).
Vilar, E. et al., "Scattering and Extinction; Dependence Upon Raindrop Size Distribution in Temperate (Barcelona) and Tropical (Belem) Regions," *Tenth International Conference on Antennas and Propagation,* Electronics Division of the IEE, pp. 2.230–2.233 (Apr. 14–17, 1997).
Vilar, E. and Haddon, J., "Scintillation Modeling and Measurement –A Tool for Remote–Sensing Slant Paths," *AGARD Conference Proceedings No. 332: Propagation Aspects of Frequency Sharing, Interference And System Diversity,* AGARD, pp. 27–1 –27–13 (Oct. 18–22, 1982).
Vilar, E., "Some Limitations on Digital Transmission Through Turbulent Atmosphere," *International Conference on Satellite Communication Systems Technology,* Electronics Division of the IEE, pp. 169–187 (Apr. 7–10, 1975).
Vilar, E. and Matthews, P. A., "Summary of Scintillation Observations in a 36 Ghz Link Across London," *International Conference on Antennas and Propagation Part 2: Propagation,* IEE, pp. 36–40 (Nov. 28–30, 1978).
Vilar, E. et al., "Wideband Characterization of Scattering Channels," *Tenth International Conference on Antennas and Propagation,* Electronics Division of the IEE, pp. 2.353–2.358 (Apr. 14–17, 1997).
Voltmer, A., "Complete GPS Receiver Fits on Two Chips," *Electronic Design,* Publishing, pp. 50, 52, 54 and 56 (Jul. 6, 1998).
*Voltage and Time Resolution in Digitizing Oscilloscopes: Application Note 348,* Hewlett Packard, pp. 1–11 (Nov. 1986).
Wan, K. W. et al., "A Novel Approach to the Simultaneous Measurement of Phase and Amplitude Nosies in Oscillator," *Proceedings of the 19th European Microwave Conference,* Microwave Exhibitions and Publishers Ltd., pp. 809–813 (Sep. 4–7, 1989).
Wan, K. W. et al., "Extended Variances and Autoregressive/Moving Average Algorithm for the Measurement and Synthesis of Oscillator Phase Noise," *Proceedings Of the 43rd Annual Symposium on Frequency Control,* IEEE, pp. 331–335 (1989).
U.S. Appl. No. 09/525,615, filed Mar. 14, 2000, Sorrells et al.
U.S. Appl. No. 09/632,855, filed Aug. 14, 2000, Sorrells et al.
U.S. Appl. No. 09/632,857, filed Aug. 14, 2000, Sorrells et al.
Wan, K. W. et al., "Wideband Transhorizon Channel Sounder at 11 Ghz," *Electronics Division Colloquim on High Bit Rate UHF/SHF Channel Sounders –Technology and Measurement,* IEE, pp. 3/1–3/5 (Dec. 3, 1993).
Wang, H., "A 1–V Multigahertz RF Mixer Core in 0.5 –µm CMOS," *IEEE Journal of Solid–State Circuits,* IEEE Solid–State Circuits Society, vol. 33, No. 12, pp. 2265–2267 (Dec. 1998).
Watson, A.W.D. et al., "Digital Conversion and Signal Processing for High Performance Communications Receivers," *Digital Processing of Signals in Communications,* Institution of Electronic and Radio Engineers, pp. 367–373 (Apr. 22nd–26th, 1985).
Weast, R. C. et al. (Ed.), *Handbook of Mathematical Tables,* Second Edition, The Chemical Rubber Co., pp. 480–485 (1964).
Wiley, R. G., "Approximate FM Demodulation Using Zero Crossings," *IEEE Transactions on Communications,* IEEE, vol. COM–29, No. 7, pp. 1061–1065 (Jul. 1981).
Worthman, W., "Convergence. . . Again," *RF Design,* Primedia, p. 102 (Mar. 1999).
Young, I. A. and Hodges, D. A., "MOS Switched–Capacitor Analog Sampled–Data Direct–Form Recursive Filters," *IEEE Journal of Solid–State Cicuits,* IEEE, vol. SC–14, No. 6, pp. 1020–1033 (Dec. 1979).
Translation of Specification and Claims of FR Patent No. 2245130, 3 pages.
Fest, Jean–Pierre, "Le Convertissur A/N Revolutions Le Recepteur Radio," *Electronique,* JMJ (Publisher), No. 54, pp. 40–42 (Dec. 1995).
Translation of DE Patent No. 35 41 031 A1, 22 pages.
Translation of EP Patent No. 0 732 803 A1, 9 pages.
Fest, Jean–Pierre, "The A/D Converter Revolutionizes the Radio Receiver,"*Electronique,* JMJ (Publisher), No. 54, 3 pages (Dec. 1995). (Translation of Doc. AQ50).
Translation of German Patent No. DE 197 35 798 C1, 8 pages.
Miki, S. and Nagahama, R., *Modulation System II,* Common Edition 7, Kyoritsu Publishing Co., Ltd., pp. 146–154 (Apr. 30, 1956).

Miki, S. and Nagahama, R., *Modulation System II,* Common Edition 7, Kyoritsu Publishing Co., Ltd., pp. 146–149 (Apr. 30, 1956). (Partial Translation of Doc. AQ51).
Rabiner, L. R. and Gold, B., *Theory And Application Of Digital Signal Processing,* Prentice–Hall, Inc., pp. xiii–xii and 40–46 (1975).
English–language Abstract of Japanese Patent Publcation No. 08–032556, from http://www1.ipdl.jpo.go.jp, 2 Pages (Feb. 2, 1996 –Date of publication of application).
English–language Abstract of Japanese Patent Publication No. 08–139524, from http://www1.ipdl.jpo.go.jp, 2 Pages (May 31, 1996 –Date of publication of application).
English–language Abstract of Japanese Patent Publication No. 59–144249, from http://www1.ipdl.jpo.go.jp, 2 Pages (Aug. 18, 1984 –Date of publication of application).
English–language Abstract of Japanese Patent Publication No. 63–054002, from http://www1.ipdl.jpo.go.jp, 2 Pages (Mar. 8, 1988 –Date of publcation of application).
English–language Abstract of Japanese of Patent Publication No. 06–237276, from http://www.1ipdl.jpo.go.jp, 2 Pages (Aug. 23, 1994 –Date of publication of application).
English–langauge Abstract of Japanese Patent Publication No. 08–023359, from http://www1.ipdl.jpo.go.jp, 2 Pages (Jan. 23, 1996 –Date of publication of application).
Translation of Japanese Patent Publication No. 47–2314, 7 pages.
Partial Translation of Japanese Patent Publication No. 58–79003, 3 pages.
English –language Abstract of Japanese Patent Publication No. 58–133004, from http://www1.ipdl.jpo.go.jp, 2 Pages (Aug. 8, 1993 –Date of publication of application).
English–language Abstract of Japanese Patent Publication No. 60–058705, from http://www1.ipdl.jpo.go.jp, 2 Pages (Apr. 4, 1985 –Date of pubication of application).
English–language Abstract of Japanese Patent Publication No. 04–123614, from http://www1.ipdl.jpo.go.jp, 2 Pages (Apr. 23, 1992 –Date of Publication of application).
English–language Abstract of Japanese Patent Publication No. 04–127601, from http://www1.ipdl.jpo.go.jp, 2 Pages (Apr. 28, 1992 –Date of publication of application).
English–language Abstract of Japanese Patent Publication No. 05–175730, from http://www1.pdl.jpo.go.jp, 2 Pages (Jul. 13, 1993 –Date of publication of application).
English–language Abstract of Japanese Patent Publication No. 05–175734, from http://www1.ipdl.jpo.go.jp, 2 Pages (Jul. 13, 1993 –Date of publication of application).
English–language Abstract of Japannese Patent Publication No. 07–154344, from http://www1.ipdl.jpo.go.jp, 2 Pages (Jun. 16, 1995 –Date of Publication of application).
English–language Abstract of Japanese Patent Publication No. 07–307620, from http://www1.pdl.jpo.go.jp, 2 Pages (Nov. 21, 1995 –Date of publication of application).
Oppenheim, A. V. and Schafer, R. W., *Digital Signal Processing,* Prentice–Hall, pp. vii–x, 6–35, 45–78, 87–121 and 136–165 (1975).
English–language Abstract of Japanese Patent Publication No. 55–066057, from http://www1.ipdl.jpo.go.jp, 1 Page (May 19, 1980 –Date of Publication of application).
English–language Abstract of Japanese Patent Publication No. 63–065587, from http://www1.ipdl.jpo.go.jp, 1 Page (Mar. 24, 1988 –Date of publication of application).
English–language Abstract of Japanese Patent Publication No. 63–153691, from http://www1.ipdl.jpo.go.jp, 1 Page (Jun. 27, 1988 –Date of publication of application).
Translation of Japanese Patent Publication No. 60–130203, 3 pages (Jul. 11, 1985–Date of publication of application).
Razavi, B., "A 900–MHz/1.8–Ghz CMOS Transmitter for Dual–Band Applications," *Symposium on VLSI Circuits Digest of Technical Papers,* Papers, IEEE, pp. 128–131 (1998).
Ritter, G. M., "SDA, A New Solution for Transceivers," *16th European Microwave Conference,* Microwave Exhibitions and Publishers, pp. 729–733 (Sep. 8, 1986).
Dialog File 351 (Derwent WPI) English Language Patent Abstract for FR 2 669 787, 1 page (May 29, 1992–Date of publication of application).
Akos, D. M. et al., "Direct Bandpass Sampling of Multiple Distinct RF Signals," *IEEE Transactions on Communications,* IEEE, vol. 47, No. 7, pp. 983–988 (Jul. 1999).
Patel, M. et al., "Bandpass Sampling for Software Radio Receivers, and the Effect of Oversampling on Aperture Jitter," *VTC 2002,* IEEE, pp. 1901–1905 (2002).
English–language Abstract of Japanese Patent Publication No. 61–030821, 1 Page (Feb. 13, 1986–Date of publication of application).
English–language Abstract of Japanese Patent Publication No. 05–327356, 1 Page (Dec. 10, 1993 –Date of publication of application).
Tayloe, D., "A Low–noise, High–performance Zero IF Quadrature Detector/Preamplifier," *RF Design,* Primedia Business Magazines & Media, Inc., pp. 58, 60, 62 and 69 (Mar. 2003).
Dines, J. A. B., "Smart Pixel Optoelectronic Receiver Based on a Charge Sensitive Amplifier Design," *IEEE Journal of Selected Topics in Quantum Electronics,* IEEE, vol. 2, No. 1, pp. 117–120 (Apr. 1996).
Simioni, A. et al., "A Digital Camera for Machine Vision," *20th International Conference on Industrial Electronics, Control and Instrumentation,* , IEEE, pp. 879–883 (Sep. 1994).
Stewart, R. W. and Pfann, E., "Oversampling and sigma–delta strategies for data conversion," *Electronics & Communication Engineering Journal,* IEEE, pp. 37–47 (Feb. 1998).
Rudell, J. C. et al. "A 1.9Ghz Wide–Band IF Double Conversion CMOS Receiver for Cordless Telephone Applications," *IEEE Journal of Solid–State Circuits,* IEEE, vol. 32, No. 12, pp. 2071–2088 (Dec. 1997).
English–language Abstract of Japanese Patent Publication No. 09–036664, from http://www1.ipdl.jpo.go.jp, 2 Pages (Feb. 7, 1997 –Date of publication of application).
Simoni, A. et al., "A Single–Chip Optical Sensor with Analog Memory for Motion Detection," *IEEE Journal of Solid–State Circuits,* IEEE, vol. 30, No. 7, pp. 800–806 (Jul. 1995).
Deboo, Gordon J., *Intergrated Circuits and Semiconductor Devices,* $2^{nd}$ Edition, McGraw–Hill, Inc., pp. 41–45 (1977).

* cited by examiner

EXPANDED VIEW OF HARMONICALLY RICH SIGNAL 608
610 SEE FIG.6F
612 SEE FIG.6G

HARMONICS OF SIGNAL 610 (SHOWN SEPARATELY)
FUNDAMENTAL FREQUENCY 610A
THIRD HARMONIC 610B
FIFTH HARMONIC 610C

HARMONICS OF SIGNAL 612 (SHOWN SEPARATELY)
FUNDAMENTAL FREQUENCY 612A
THIRD HARMONIC 612B
FIFTH HARMONIC 612C

1802

| TIME / NODE | t−1 (RISING EDGE OF $\phi_1$) | t−1 (RISING EDGE OF $\phi_2$) | t (RISING EDGE OF $\phi_1$) | t (RISING EDGE OF $\phi_2$) | t+1 (RISING EDGE OF $\phi_1$) |
|---|---|---|---|---|---|
| 1902 | $VI_{t-1}$ 1804 | $VI_{t-1}$ 1808 | $VI_t$ 1816 | $VI_t$ 1826 | $VI_{t+1}$ 1838 |
| 1904 | — | $VI_{t-1}$ 1810 | $VI_{t-1}$ 1818 | $VI_t$ 1828 | $VI_t$ 1840 |
| 1906 | $VO_{t-1}$ 1806 | $VO_{t-1}$ 1812 | $VO_t$ 1820 | $VO_t$ 1830 | $VO_{t+1}$ 1842 |
| 1908 | — | $VO_{t-1}$ 1814 | $VO_{t-1}$ 1822 | $VO_t$ 1832 | $VO_t$ 1844 |
| 1910 | — 1807 | — | $VO_{t-1}$ 1824 | $VO_{t-1}$ 1834 | $VO_t$ 1846 |
| 1912 | — | — 1815 | — | $VO_{t-1}$ 1836 | $VO_{t-1}$ 1848 |
| 1918 | — | — | — | — | $VI_t-$ 1850<br>$0.1 * VO_t-$<br>$0.8 * VO_{t-1}$ |

FIG.18

| Item | Quantity | Reference | Part Description | Part Number | Manufacturer |
|---|---|---|---|---|---|
| 1 | 1 | C123 | 10uF CAP 6032, TANTALUM,20% | TAJT106K010R | KEMET |
| 2 | 3 | C263, C273, C275, C282 | 4.7uF CAP 6032, TANTALUM,20% | T491A475M006AS | KEMET |
| 3 | 25 | C120, C125, C126, C127, C128, C136, C137, C138, C139, C140, C141, C142, C143, C144, C145, C147, C148, C149, C264, C272, C274, C279, C280, C281, C283 | 0.1uF CAP 0603,X7R,10% | GRM39X7R104K050AD | MURATA |
| 4 | 3 | C146, C269, C276 | .01uF CAP 0603,X7R,10% | GRM39X7R103K050AD | MURATA |
| 5 | 5 | C124, C132, C133, C271, C278 | 100pF CAP 0603,X7R,10% | GRM39C0G101K050AD | MURATA |
| 6 | 1 | C129 | 47pF CAP 0603,X7R,10% | GRM39C0G470J100AD | MURATA |
| 7 | 2 | C270, C277 | 27pF CAP 0603,X7R,10% | GRM39C0G270K050AD | MURATA |
| 8 | 1 | C130 | 22pF CAP 0603,X7R,10% | GRM39C0G220K050AD | MURATA |
| 9 | 1 | C131 | 10pF CAP 0603,X7R,10% | GMR39C0G100D050AD | MURATA |
| 10 | 1 | DS1 | LED GREEN | 597-3311-420 | DIALIGHT |
| 11 | 1 | DS2 | LED YELLOW | 597-3401-420 | DIALIGHT |
| 12 | 1 | DS3 | LED RED | 597-3111-420 | DIALIGHT |
| 13 | 6 | JP12, JP13, JP14, JP15, JP16, JP17 | CONNECTOR HEADER 2PIN | 2MS-19-33-01 | SPECIALITY ELECTRONICS |
| 14 | 1 | JP11 | CONNECTOR HEADER 4PIN | 100/VH/TM1SQ/W.100/4 | BLKCON |

FIG.46A

| | | | | | |
|---|---|---|---|---|---|
| 15 | 7 | J16, J20, J21, J22, J23, J24, J25 | CONNECTOR 82MMCX | 82MMCX-50-0-1 | HUBER/SHUNER |
| 16 | 1 | J18 | CONNECTOR HEADER 10 | TMS-110-01-G-S | SAMTEC |
| 17 | 1 | J19 | CONNECTOR WITH EJECTOR | EHT-1-10-01-S-D | SAMTEC |
| 18 | 1 | P1 | CONNECTOR 34X2PCMCIA | DICMJ-68S-SPC-M08 | ITT CANON |
| 19 | 7 | L59, L60, L61, L63, L64, L65, L66 | FERRITE BEAD | BLM11A121S | MURATA |
| 20 | | | | | |
| 21 | 1 | R112 | 10M, RESISTOR,0603,5% | | |
| 22 | 1 | R114 | 390K, RESISTOR,0603,5% | ERJ-3GSYJ394V | PANASONIC |
| 23 | 1 | R105 | 100K, RESISTOR,0603,5% | ERJ-3GSYJ104V | PANASONIC |
| 24 | 4 | R106, R107,R108, R111 | 15K, RESISTOR, 0603,5% | ERJ-3GSYJ153V | PANASONIC |
| 25 | 1 | R116 | 9.1K, RESISTOR, 0603,5% | ERJ-3GSYJ912V | PANASONIC |
| 26 | 1 | R115 | 8.2K, RESISTOR, 0603,5% | ERJ-3GSYJ822V | PANASONIC |
| 27 | 1 | R113 | 3.9K, RESISTOR, 0603,5% | ERJ-3GSYJ392V | PANASONIC |
| 28 | 1 | R101 | 750, RESISTOR, 0630,5% | ERJ-3GSYJ751V | PANASONIC |
| 29 | 1 | R110 | 560, RESISTOR, 0603,5% | ERJ-3GSYJ561V | PANASONIC |
| 30 | 2 | R99, R100 | 330, RESISTOR, 0603,5% | ERJ-3GSYJ331V | PANASONIC |
| 31 | 1 | R119 | 50, RESISTOR, 0603,5% | ERJ-3GSYJ500V | PANASONIC |
| 32 | 2 | R128, R129 | 10, RESISTOR, 0603,5% | ERJ-3GSYJ100V | PANASONIC |
| 33 | 8 | R102, R103, R104, R109, R117, R118, R120, R127, | 0, RESISTOR, 0603,5% | RM732Z1J000ZT 3GSYJ000V | ERJ KOA PANASONIC |
| 34 | 6 | R121, R122, R123, R124, R125, R126 | TBD, RESISTOR, 0603,5% | R | PANASONIC |
| 35 | 1 | U10 | SRAM | KM62256DLTG-5L M5M5256CVP-55LL | SAMSUNG MITSUBUSHI |
| 36 | 1 | U12 | MAC | AM79C930 | AMD |

FIG.46B

| | | | | | |
|---|---|---|---|---|---|
| 37 | 1 | U13 | BASEBAND PROCESSOR | HFA3842A1 | HARRIS |
| 38 | 1 | U14 | FLASH RAM | AM29F010-55EC | AMD |
| 39 | 1 | U15 | 32 KHz CRYSTAL | CX-6V-SM2-32.768KHzC/1 | STATEK |
| 40 | 2 | U45 | BUS BUFFER | DS3862 | NATIONAL |
| 41 | 1 | U48 | REGULATOR 3.5 V | TK11235BMC | TOKO |
| 42 | 1 | U49 | 22MHz OSCILLATOR | FOX F3346-22MHz | FOX |
| 43 | 1 | U50 | 2 VOLT REFERENCE | TK11220BMC | TOKO |
| 44 | 1 | U51 | 40MHz OSCILLATOR | CXO-M-10N-40MHz A/1 | STATEK |

FIG.46C

| ITEM | QUANT. | REFERENCE | PART | PART NUMBER | MANUFACTURER |
|---|---|---|---|---|---|
| | | | | | |
| 1 | 4 | C3,C52,C108,C110 | 4.7uF | T491A475K006AS | KEMET |
| 2 | 26 | C51,C54,C57,C58,C60,C61, | 0.1uF | GRM39Y5V104Z016 | MURATA |
| | | C67,C68,C69,C77,C79,C80, | | | |
| | | C81,C83,C89,C90,C91,C111, | | | |
| | | C112,C113,C114,C115,C116, | | | |
| | | C117,C118,C119 | | | |
| 3 | 1 | C55 | DNP | T491A475K006AS | KEMET |
| 4 | 8 | C56,C59,C78,C82,C99,C101, | 0.01uF | GRM39X7R103K050 | MURATA |
| | | C103,C104 | | | |
| 5 | 8 | C62,C63,C66,C73,C84,C85, | 1uF | GRM40Y5V105Z016 | MURATA |
| | | C88,C95 | | | |
| 6 | 4 | C64,C75,C86,C97 | 120pF | GRM39COG121J050 | MURATA |
| 7 | 2 | C65,C87 | 180pF | GRM39COG181J050 | MURATA |
| 8 | 2 | C70,C92 | 390pF | GRM39COG391J050 | MURATA |
| 9 | 2 | C71,C93 | 470pF | GRM39COG471J050 | MURATA |
| 10 | 2 | C72,C94 | DNP | GRM40Y5V105Z016 | MURATA |
| 11 | 2 | C74,C96 | 82pF | GRM39COG820J050 | MURATA |
| 12 | 2 | C100,C106 | DNP | DNP | MURATA |
| 13 | 2 | C105,C102 | 1000pF | GRM39COG102K050 | MURATA |
| 14 | 2 | D3,D1 | BAW56WT1 | BAW56WT1 | MOTOROLA |
| 15 | 2 | D4,D2 | BAV70LT1 | BAV70LT1 | MOTOROLA |
| 16 | 1 | JP1 | HEADER 7X2 | FTSH-107-02-L-D | SAMTEC |
| 17 | 9 | J1,J3,J5,J7,J9,J10,J11, | 82MMCX | 82MMCX-50-0-1 | SUHNER |
| | | J12,J13 | | | |
| 18 | 1 | L1 | BLM11A121S | BLM11A121S | MURATA |
| 19 | 2 | L23,L28 | 2.2uH | LQG21N2R2K10 | MURATA |
| 20 | 2 | L29,L24 | 1uH | LQG21N1R0K10 | MURATA |
| 21 | 2 | L30,L25 | 680nH | LQG21NR68K10 | MURATA |

FIG.49A

| | | | | | |
|---|---|---|---|---|---|
| 22 | 2 | L26,L31 | 1.8uH | LQG21N1R8K10 | MURATA |
| 23 | 2 | L32,L27 | 390nH | LQG21NR39K10 | MURATA |
| 24 | 4 | Q1,Q5,Q10,Q14 | SD404CY | SD404CY | CALOGIC |
| 25 | 4 | Q2,Q4,Q12,Q13 | BFM505 | BFM505 | PHILIPS |
| 26 | 4 | Q3,Q7,Q11,Q16 | SD213 | SD213 | CALOGIC |
| 27 | 2 | Q17,Q8 | BFR520 | BFR520 | PHILIPS |
| 28 | 4 | R19,R20,R21,R83 | 0 | ERJ3GSY0R00 | PANASONIC |
| 29 | 8 | R23,R26,R34,R45,R52,R57, | 33K | ERJ3GSYJ333 | PANASONIC |
| | | R63,R74 | | | |
| 30 | 4 | R24,R27,R53,R58 | 475 | ERJ3EKF4750 | PANASONIC |
| 31 | 6 | R25,R28,R47,R54,R59,R76 | 402 | ERJ3EKF4020 | PANASONIC |
| 32 | 4 | R29,R30,R55,R56 | 221 | ERJ3EKF2210 | PANASONIC |
| 33 | 2 | R32,R61 | 200 | ERJ3GSYJ201 | PANASONIC |
| 34 | 2 | R33,R62 | 33.2K | ERJ3GSYJ333 | PANASONIC |
| 35 | 4 | R35,R46,R64,R75 | 68.1 | ERJ3EKF68R1 | PANASONIC |
| 36 | 2 | R36,R65 | 200 | ERJ3EKF2000 | PANASONIC |
| 37 | 6 | R37,R44,R66,R73,R171, | 49.9 | ERJ3EKF49R9 | PANASONIC |
| | | R173 | | | |
| 38 | 6 | R40,R68,R78,R79,R80,R89 | 1K | ERJ3EKF1001 | PANASONIC |
| 39 | 2 | R42,R71 | 62 | ERJEGSYJ620 | PANASONIC |
| 40 | 2 | R43,R72 | 162 | ERJ3EKF1620 | PANASONIC |
| 41 | 2 | R77,R48 | DNP | ERJ3GSYJ330 | PANASONIC |
| 42 | 4 | R81,R82,R85,R87 | 2K | ERJ3EKF2001 | PANASONIC |
| 43 | 1 | R84 | 909 | ERJ3EKF9090 | PANASONIC |
| 44 | 1 | R88 | 15K | ERJ3EJF1502 | PANASONIC |
| 45 | 1 | R90 | 10K | ERJ3EKF1002 | PANASONIC |
| 46 | 2 | R91,R92 | 100 | ERJ3EKF1000 | PANASONIC |
| 47 | 6 | R164,R165,R166,R167,R168, | TBD | | PANASONIC |
| | | R169 | | | |
| 48 | 2 | R170,R172 | OPEN | | PANASONIC |

FIG.49B

| | | | | | |
|---|---|---|---|---|---|
| 49 | 6 | TP1,TP2,TP3,TP4,TP5,TP6 | TP-105-01-00 | | |
| 50 | 2 | U42,U6 | NC7S04M5 | NC7S04M5 | NATIONAL SEMICONDUCTOR |
| 51 | 1 | U7 | AD8052AR | AD8052AR | ANALOG DEVICES |
| 52 | 1 | U8 | AD1582 | AD1582 | ANALOG DEVICES |
| 53 | 1 | U9 | AD605AR | AD605AR | ANALOG DEVICES |
| 54 | 1 | U43 | TK11235AMTL | TK11235BM | TOKO |
| 55 | 1 | | BOARD | 8500.541.003.V13.01 | |

FIG.49C

| ITEM | QTY | REFERENCE | PART | PART NUMBER | MANUFACTURER |
|---|---|---|---|---|---|
| | | | | | |
| 1 | 3 | C3,C52,C55 | 4.7uF | T491A475K006AS | KEMET |
| 2 | 26 | C51,C54,C57,C58,C60,C61, | 0.1uF | GRM39Y5V104Z016 | MURATA |
| | | C67,C68,C69,C77,C79,C80, | | | |
| | | C81,C83,C89,C90,C91,C111, | | | |
| | | C112,C113,C114,C115,C116, | | | |
| | | C117,C118,C119 | | | |
| 3 | 8 | C56,C59,C78,C82,C99,C101, | 0.01uF | GRM39X7R103K050 | MURATA |
| | | C103,C104 | | | |
| 4 | 10 | C62,C63,C66,C72,C73,C84, | 1uf | GRM40Y5V105Z016 | MURATA |
| | | C85,C88,C94,C95 | | | |
| 5 | 4 | C64,C75,C86,C97 | 120pF | GRM39COG121J050 | MURATA |
| 6 | 2 | C87,C65 | 180pF | GRM39COG181J050 | MURATA |
| 7 | 2 | C70,C92 | 390pF | GRM39COG391J050 | MURATA |
| 8 | 2 | C71,C93 | 470pF | GRM39COG471J050 | MURATA |
| 9 | 2 | C96,C74 | 82pF | GRM39COG820J050 | MURATA |
| 10 | 5 | C100,C102,C105,C106,C107 | 100pF | GRM39COG101K050 | MURATA |
| 11 | 1 | C108 | 1uF | | |
| 12 | 1 | C110 | 4.7uF | | |
| 13 | 2 | D3,D1 | BAW56WT1 | BAW56WT1 | MOTOROLA |
| 14 | 2 | D4,D2 | BAV70LT1 | BAV70LT1 | MOTOROLA |
| 15 | 2 | JP2,JP1 | HEADER 7X2 | | |
| 16 | 6 | J1,J3,J5,J7,J10,J11 | 82MMCX | 142-0701-231 | JOHNSON |
| 17 | 1 | J9 | 82MMCX | 82MMCX-50-0-1 | SUHNER |
| 18 | 1 | L1 | BLM11A121S | BLM11A121S | MURATA |
| 19 | 2 | L28,L23 | 2.2uH | LQG21N2R2K10 | MURATA |
| 20 | 2 | L24,L29 | 1uH | LQG21N1R0K10 | MURATA |
| 21 | 2 | L30,L25 | 680nH | LQG21NR68K10 | MURATA |
| 22 | 2 | L26,L31 | 1.8uH | LQG21N1R8K10 | MURATA |

FIG.52A

| | | | | | |
|---|---|---|---|---|---|
| 23 | 2 | L27,L32 | 390nH | LQG21NR39K10 | MURATA |
| 24 | 4 | Q1,Q5,Q10,Q14 | SD404CY | SD404CY | CALOGIC |
| 25 | 4 | Q2,Q4,Q12,Q13 | BFM505 | BFM505 | PHILIPS |
| 26 | 4 | Q3,Q7,Q11,Q16 | SD213 | SD213 | CALOGIC |
| 27 | 2 | Q17,Q8 | BFR520 | BFR505 | PHILIPS |
| 28 | 5 | R19,R20,R21,R171,R173 | 0 | | |
| 29 | 8 | R23,R26,R34,R45,R52,R57, | 33K | ERJ3GSY333 | PANASONIC |
| | | R63,R74 | | | |
| 30 | 4 | R24,R27,R53,R58 | 475 | ERJ3EKF4750 | PANASONIC |
| 31 | 6 | R25,R28,R47,R54,R59,R76 | 402 | ERJ3EKF4020 | PANASONIC |
| 32 | 4 | R29,R30,R55,R56 | 221 | ERF3EKF2210 | PANASONIC |
| 33 | 2 | R32,R61 | 200 | ERJ3GSYJ201 | PANASONIC |
| 34 | 2 | R33,R62 | 33.2K | ERJ3GSYJ333 | PANASONIC |
| 35 | 4 | R35,R46,R64,R75 | 68.1 | ERJ3EKF68R1 | PANASONIC |
| 36 | 2 | R36,R65 | 200 | ERJ3EKF2000 | PANASONIC |
| 37 | 2 | R66,R37 | 49.9 | ERJ3EKF49R9 | PANASONIC |
| 38 | 6 | R40,R68,R78,R79,R80,R89 | 1K | ERJ3EKF1001 | PANASONIC |
| 39 | 2 | R42,R71 | 62 | ERJ3GSYJ620 | PANASONIC |
| 40 | 2 | R43,R72 | 162 | ERJ3EKF6810 | PANASONIC |
| 41 | 2 | R44,R73 | 49.9 | ERJ3EKF1001 | PANASONIC |
| 42 | 2 | R77,R48 | 33 | ERJ3GSYJ330 | PANASONIC |
| 43 | 4 | R81,R82,R85,R87 | 2K | ERJ3EKF2001 | PANASONIC |
| 44 | 1 | R83 | 0 | ERJGSY0R00 | PANASONIC |
| 45 | 1 | R84 | 1.1K | ERJ3EKF2001 | PANASONIC |
| 46 | 1 | R88 | 15K | ERJ3EKF1502 | PANASONIC |
| 47 | 1 | R90 | 10K | ERJ3EKF1002 | PANASONIC |
| 48 | 2 | R91,R92 | 100 | ERJ3EKF1000 | PANASONIC |
| 49 | 6 | R164,R165,R166,R167,R168, | TBD | | |
| | | R169 | | | |
| 50 | 2 | R170,R172 | OPEN | | |

FIG.52B

| | | | | | |
|---|---|---|---|---|---|
| 51 | 0 | TP1,TP2,TP3,TP4,TP5,TP6 | TP-105-01-00 | | |
| 52 | 2 | U42,U6 | NC7S04M5 | | NATIONAL SEMICONDUCTOR |
| 53 | 1 | U7 | AD8032AR | AD8032AR | ANALOG DEVICES |
| 54 | 1 | U8 | AD1582 | AD1582 | ANALOG DEVICES |
| 55 | 1 | U9 | AD605AR | AD605AR | ANALOG DEVICES |
| 56 | 1 | U43 | TK11235AMTL | TK11235AMTL | TOKO |

FIG.52B-1

| ITEM | QTY | REFERENCE | PART | PART NIMBER | MANUFACTURER |
|---|---|---|---|---|---|
| | | | | | |
| 1 | 10 | C/R7,C/R15,C16,C17,C18 | 0.1uF | GRM39Y5V104Z016 | MURATA |
| | | C19,C21,C22,C23,C24 | | | |
| 2 | 6 | C1,C3,C6,C8,C9,C12 | 22pF | GRM39C0G220J050 | MURATA |
| 3 | 3 | C2,C4,C11 | 0.1uF | GRM39X7R104K016 | MURATA |
| 4 | 2 | C5,C15 | 47pF | GRM39C0G470J050 | MURATA |
| 5 | 2 | C10,C7 | 1000pF | GRM39X7R102K050 | MURATA |
| 6 | 1 | C13 | 100pF | GRM39X7R101J050 | MURATA |
| 7 | 1 | C14 | 3pF | GRM40C0G030B50V | MURATA |
| 8 | 2 | C20,C25 | 1uF | GRM40Y5V105Z016 | MURATA |
| 9 | 1 | JP1 | 69190-403 | 69190-403 | BERG |
| 10 | 1 | JP2 | 69190-402 | 69190-402 | BERG |
| 11 | 4 | J1,J2,J3,J4 | 82MMCX-50-0-1 | 82MMCX-50-0-1 | SUHNER |
| 12 | 2 | L3,L1 | DNP | L | TOKO |
| 13 | 2 | L4,L2 | 4.7nH | LL1608-F4N7K | TOKO |
| 14 | 1 | L5 | 15nH | LL2012FH15NJ | TOKO |
| 15 | 1 | L6 | DNP | DNP | TOKO |
| 16 | 2 | Q1,Q2 | BFR520 | BFR520 | PHILIPS |
| 17 | 2 | R1,R3 | 2K | ERJ3GSYJ202 | PANASONIC |
| 18 | 1 | R2 | 51 | ERJ3GSYJ510 | PANASONIC |
| 19 | 2 | R4,R12 | 221 | ERJ3EKF2210 | PANASONIC |
| 20 | 6 | R5,R6,R8,R13,R14,R16 | 33.2K | ERJ3EKF3322 | PANASONIC |
| 21 | 2 | R9,R17 | DNP | ERJ3EKF1001 | PANASONIC |
| 22 | 2 | R10,R18 | 249 | ERJ3EKF2490 | PANASONIC |
| 23 | 2 | R11,R19 | 10 | ERJ3GSYJ100 | PANASONIC |
| 24 | 1 | U1 | D2D_V4 | D2D_V4 | PARKER VISION |
| 25 | 1 | U2 | 1X603 | 1X603 | ANAREN |
| 26 | 1 | U3 | AD8032AR | AD8032AR | ANALOG DEVICES |
| 27 | 1 | | BOARD | STB500.641.001 V03.00 | |

FIG.54

| ITEM | QTY | REFERENCE | PART | DESCRIPTION | PART NUMBER | MANUFACT. |
|---|---|---|---|---|---|---|
| 1 | 1 | CR1 | BBY51-E6327 | DIODE, VARACTOR | BBY51-E6327 | SIEMENS |
| 2 | 6 | C1,C3,C5,C7,C9,C10 | 100pF | CAPACITOR,CERAMIC,100pF,10%,COG,0603 | GRM39COG101K050 | MURATA |
| 3 | 2 | C29,C2 | 0.1uF | CAPACITOR,CERAMIC,.1uF,10%,X7R,0603 | GRM39X7R104K016AD | MURATA |
| 4 | 3 | C4,C8,C17 | .01uF | CAPACITOR,CERAMIC,.01uF,10%,X7R,0603 | GRM39X7R103K050 | MURATA |
| 5 | 1 | C6 | 220pF | CAPACITOR,CERAMIC,220pF,5%,COG,0603 | GRM39COG221J025 | MURATA |
| 6 | 1 | C11 | 3.3pF | CAPACITOR,CERAMIC,3.3pF,5%,COG,0603 | GRM39COG3R3B100V | MURATA |
| 7 | 1 | C12 | 6.8pF | CAPACITOR,CERAMIC,6.8pF,+/-.25pF,COG,0603 | GRM39COG6R8C100V | MURATA |
| 8 | 4 | C13,C35,C36,C37 | 1000pF | CAPACITOR,CERAMIC,1000pF,10%,X7R,0603 | GRM39X7R102K016 | MURATA |
| 9 | 1 | C14 | 1500pF | CAPACITOR,CERAMIC,1500Pf,10%,X7R,0603 | GRM39X7R152K016 | MURATA |
| 10 | 1 | C15 | 12pF | CAPACITOR,CERAMIC,12pF,5%,COG,0603 | GRM39COG120J050 | MURATA |
| 11 | 1 | C16 | 4700pF | CAPACITOR,CERAMIC,4700pF,10%,0603 | GRM39X7R472K016 | MURATA |
| 12 | 2 | C20,C18 | 22pF | CAPACITOR,CERAMIC,22pF,10%,COG,0603 | GRM36COG220K050 | MURATA |
| 13 | 4 | C22,C32,C33,C34 | DNP | CAPACITOR,CERAMIC,,,,0603 | | MURATA |
| 14 | 3 | C23,C24,C27 | 4.7uF | CAPACITOR,TANTALUM,4.7uF,10%,3216 | T491A475K006AS | KEMET |
| 15 | 3 | R16,C31,R17 | 0 OHM | RESISTOR,ZERO OHM,0603 | ERJ3GSY0R00 | PANASONIC |
| 16 | 1 | JP1 | FTSH-110-02-F-D | HEADER,DUAL ROW 10X2,.050X.050 | FTSH-110-02-F-D | SAMTEC |
| 17 | 1 | JP2 | FTSH-105-02-F-D | HEADER,DUAL ROW 5X2,.050X.050 | FTSH-105-02-F-D | SAMTEC |
| 18 | 1 | JP3 | TSW-104-08-T-S | HEADER, SINGLE ROW 4 PIN, .100" | TSW-104-08-T-S | BERG |
| 19 | 2 | J5,J6 | 82MMCX | RF CONNECTOR | 82MMCX-50-0-1 | SUHNER |
| 20 | 1 | L1 | 18nH | INDUCTOR,18nH,10%, 0805 | 0805CS-180XJBC | COILCRAFT |
| 21 | 1 | L3 | 0 OHM | ZERO OHM JUMPER | RM73ZIJT | KOA |
| 22 | 6 | L4,L6,L9,L10,L11,L12 | BLM11A121S | FERRITE BEAD, 0603 | BLM11A121S | MURATA |
| 23 | 1 | L14 | 82nH | INDUCTOR, 82nH,10%,0805 | LL2012-F82NK | TOKO |
| 24 | 1 | Q1 | BFR520 | TRANSISTOR, NPN | BFR520 | PHILIPS |
| 25 | 5 | R1,R2,R3,R11,R30 | 1K | RESISTOR, 1K,5%,0603 | ERF3GSYJ102 | PANASONIC |
| 26 | 1 | R4 | 10 | RESISTOR, 10 OHM,5%,0603 | ERJ3GSYJ1R0 | PANASONIC |

FIG.56A

| | | | | | | |
|---|---|---|---|---|---|---|
| 27 | 1 | R8 | 2K | RESISTOR, 2K,5%,0603 | ERJ3GSYJ202 | PANASONIC |
| 28 | 1 | R9 | 75 | RESISTOR, 75 OHM,5%,0603 | ERJ3GSYJ750 | PANASONIC |
| 29 | 1 | R10 | 3300 | RESISTOR, 3.3K,5%,0603 | ERJ3GSYJ332 | PANASONIC |
| 30 | 1 | R12 | 13K | RESISTOR, 13K,5%,0603 | ERJ3GSYJ133 | PANASONIC |
| 31 | 1 | R13 | 1.5K | RESISTOR, 1.5K,5%,0603 | ERJ3GSYJ152 | PANASONIC |
| 32 | 1 | R14 | 220 | RESISTOR, 220 OHM,5%,0603 | ERJ3GSYJ221 | PANASONIC |
| 33 | 1 | R15 | DNP | RESISTOR, ZERO OHM,0603 | ERJ3GSY0R00 | PANASONIC |
| 34 | 2 | R18,R19 | DNP | RESISTOR, 91 OHM,5%,0603 | ERJ3GSYJ910 | PANASONIC |
| 35 | 1 | R36 | TBD | RESISTOR, ZERO OHM,0603 | ERJ3GSY0R00 | PANASONIC |
| 36 | 1 | R37 | DNP | RESISTOR,,,0603 | | PANASONIC |
| 37 | 1 | TP1 | TEST POINT | | | |
| 38 | 1 | U1 | PE3282A | IC,SYNTHESIZER | PE3282A | PEREGRINE |
| 39 | 1 | U2 | CXO-3M-10N-40MHz | XTAL OSC,40MHz | CXO-3M-10N-40MHZ A/I | STATEK |
| 40 | 1 | U4 | TK11233AMTL | VOLTAGE REGULATOR,3.5V | TK11235BM | TOKO |
| 41 | 1 | U5 | 74125 | IC,BUFFER | MC74LCX125DT | MOTOROLA |
| 42 | 1 | U6 | UPC1678GV | IC,RF AMPLIFIER | UPC1678GV | NEC |
| 43 | 1 | | STB500.641.008 V03.00 | BOARD | | |

FIG.56B

| ITEM | QTY | REFERENCE | PART | PART NUMBER | MANUFACTURER |
|---|---|---|---|---|---|
| | | | | | |
| 1 | 21 | C3,C6,C8,C10,C14,C38,C44, | 0.1uF | GRM39X7R104K016 | MURATA |
| | | C46,C51,C71,C72,C77,C78, | | | |
| | | C79,C84,C85,C86,C93,C95, | | | |
| | | C96,C98 | | | |
| 2 | 6 | C5,C7,C15,C43,C52,C75 | 22pF | GRM39COG220J050 | MURATA |
| 3 | 5 | C9,C16,C45,C53,C89 | 1uF | GRM40Y5V105Z016 | MURATA |
| 4 | 8 | C11,C23,C25,C47,C61,C63 | 1000pF | GRM39X7R102K050 | MURATA |
| | | C80,C87 | | | |
| 5 | 2 | C58,C21 | 1pF | GRM39COG010B50V | MURATA |
| 6 | 2 | C82,C33 | 4.7uF | T491A475K006AS | KEMET |
| 7 | 2 | C59,C35 | 0 ohm | GRM39COGxxxx50V | MURATA |
| 8 | 1 | C73 | 470pF | GRM39COG471J050 | MURATA |
| 9 | 1 | C83 | 1uF | T491A105M016AS | KEMET |
| 10 | 3 | C90,C91,C92 | 100pF | ECU-V1H101JCV | |
| 11 | 2 | C94,C97 | 0.01uF | GRM39X7R103K016 | MURATA |
| 12 | 1 | FL1 | MDR642E | MDR642E | SOSHIN |
| 13 | 1 | JP1 | Shunt | 69190-402 | BERG |
| 14 | 1 | JP2 | 69190-403 | 69190-403 | BERG |
| 15 | 4 | J7,J8,J9,J10 | 82MMCX-50-0-1 | 82MMCX-50-0-1 | SUHNER |
| 16 | 1 | L10 | 22nH | LL1608-F22NK | COILCRAFT |
| 17 | 1 | L12 | BLM11A121S | BLM11A121S | MURATA |
| 18 | 1 | L13 | 330nH | LL2012-FR33K | |
| 19 | 10 | R5,R6,R12,R13,R32,R33, | 10K | ERJ3EKF1002 | PANASONIC |
| | | R39,R40,R95,R100 | | | |
| 20 | 2 | R34,R7 | 6.04K | ERJ3EKF6041 | PANASONIC |
| 21 | 4 | R8,R10,R35,R37 | 1K | 3224W-1-102 | BOUMS |
| 22 | 4 | R9,R36,R90,R103 | 2K | ERJ3EKF2001 | PANASONIC |
| 23 | 2 | R38,R11 | 1.5K | ERJ3EKF1501 | PANASONIC |
| 24 | 3 | R56,R94,R99 | 0 ohm | ERJ3GSY0R00 | PANASONIC |

FIG.61A

| | | | | | |
|---|---|---|---|---|---|
| 25 | 1 | R59 | 51 | ERJ3GSYJ510 | PANASONIC |
| 26 | 7 | R60,R61,R62,R84,R85,R86, | 0 | ERJ3GSY0R00 | PANASONIC |
| | | R87 | | | |
| 27 | 6 | R63,R64,R66,R69,R70,R72 | 1K | ERJ3EKF1001 | PANASONIC |
| 28 | 2 | R71,R65 | 1.1K | ERJ3EKF1101 | PANASONIC |
| 29 | 2 | R80,R79 | RESISTOR | | |
| 30 | 3 | R81,R82,R83 | R | | |
| 31 | 4 | R88,R91,R96,R101 | 1.33K | ERJ3EKF1331 | PANASONIC |
| 32 | 2 | R102,R89 | 4.02K | ERJ3EKF4021 | PANASONIC |
| 33 | 2 | R92,R97 | 499 | ERJ3EKF4990 | PANASONIC |
| 34 | 19 | TP1,TP2,TP3,TP4,TP5,TP6, | TP-105-01-00 | | |
| | | TP8,TP9,TP11,TP12,TP13, | | | |
| | | TP14,TP15,TP16,TP18,TP19, | | | |
| | | TP20,TP21,TP22 | | | |
| 35 | 3 | U1,U6,U19 | AD8052AR | AD8052AR | ANALOG DEVICES |
| 36 | 2 | U7,U2 | D2D_V11 | D2D_V11 | PARKER VISION |
| 37 | 1 | U11 | MAAM22010 | MAAM22010 | MACOM |
| 38 | 1 | U12 | 1X603 | 1X603 | ANAREN |
| 39 | 1 | U14 | AD1582 | AD1582 | ANALOG DEVICES |
| 40 | 1 | U15 | UPG1678 | UPG1678GV | NEC |
| 41 | 1 | U16 | ADP-2-10-75 | ADP-2-10-75 | MINI-CIRCUITS |
| 42 | 1 | | BOARD | 8500.641.021 | V05.10 |

FIG.61B

| ITEM | QTY | REFERENCE | PART | DESCRIPTION | PART NUMBER | VENDOR |
|---|---|---|---|---|---|---|
| | | | | | | |
| 1 | 4 | C1,C6,C7,C10 | 1uF | Cap, 1uF, +80-20%,0805 | GRM40Y5V105Z016AD | MURATA |
| 2 | 6 | C2,C3,C4,C8,C11,C12 | 100pF | Cap, 100pF, 5%, COG, 0603 | ECU-V1H101JCV | PANASONIC |
| 3 | 2 | C5,C9 | .1uF | Cap, .1uF, +80-20%, Y5V, 0603 | | MURATA |
| 4 | 3 | C13,C14,C19 | 22uF | Cap, Tant, 22uF, 20%, 20V | T491D226M020AS | KEMET |
| 5 | 4 | C15,C16,C17,C18 | 4.7uF | Cap, Tant, 4.7uF, 20%, 20V | T491C475M020AS | KEMET |
| 6 | 2 | JP2,JP6 | HEADER 7X2 | Receptacle, 7x2pin, .050 | SFMC-107-L1-S-D | SAMTEK |
| 7 | 9 | JP4, J4, J5, J6, J7, JP9, J9, | CON3 | Header, 3pin, .100'' | 69190-403 | BERG |
| | | J10, JP11 | | | | |
| 8 | 1 | JP7 | HEADER 10X2 | Receptacle, 10X2pin, .050 | SFMC-110-L1-S-D | SAMTEK |
| 9 | 1 | JP8 | HEADER 5X2 | Receptacle, 5X2pin, .050 | SFMC-105-L1-S-D | SAMTEK |
| 10 | 1 | J2 | EHT-1-10-01-S-D | Header, ribbon, 10X2pin, 2mm | EHT-1-10-01-S-D | SAMTEK |
| 11 | 3 | J8,J11,J12 | 82MMCX-50-0-1 | Connector,RF | 82MMCX-50-0-1 | SUHNER |
| 12 | 2 | L3,L1 | Ferrite Bead | Ferrite Bead, 0805 | BLM21A121S | MURATA |
| 13 | 2 | L4,L2 | 330nH | Ind, 330nH, 10%, 0805 | LL2012-FR33K | TOKO |
| 14 | 1 | R1 | DNP | Res, 0603 | | PANASONIC |
| 15 | 2 | R9,R2 | 91 | Res, 91 Ohn, 5%, 0603 | ERJ-3GSYJ910 | PANASONIC |
| 16 | 2 | R7,R3 | 240 | Res, 240 Ohm, 5%, 0603 | ERJ-3GSYJ241 | PANASONIC |
| 17 | 4 | R4,R5,R10,R11 | 82 | Res, 82 Ohm, 5%, 0603 | ERJ-3GSYJ820 | PANASONIC |
| 18 | 2 | R8,R6 | 5K | Var Res, 5K, 10% | 3296W001502 | BOUMS |
| 19 | 10 | R12, R13, R14, R15, R16, | 180 | Res, 180 Ohm, 5%, 0603 | ERJ-3GSYJ181 | PANASONIC |
| | | R17, R18, R19, R20, R21 | | | | |
| 20 | 10 | R22, R23, R24, R25, R26, | 390 | Res, 390 Ohm, 5%, 0603 | ERJ-3GSYJ391 | PANASONIC |
| | | R27, R28, R29, R30, R31 | | | | |
| 21 | 2 | U5,U1 | UPG1678 | IC, RF Buffer | UPG1678GV | NEC |
| 22 | 2 | U4,U2 | LM317 | IC, Voltage Regulator | LM317T | NATIONAL |
| 23 | 1 | U3 | ADP-2-10-75 | RF Splitter | ADP-2-10-75 | MINICIRCUITS |
| 24 | 1 | U6 | DS3862 | IC, Buffer | DS3862WM | NATIONAL |
| 25 | 1 | | | BOARD | ST8500.641.023V0L01 | |

FIG.63

| ITEM | QTY | REFERENCE | PART | MANUFACT. | PART DESCRIPTION | PART NUMBER |
|---|---|---|---|---|---|---|
| | | | | | | |
| 1 | 24 | C1,C2,C3,C5,C6,C17,C18, | 0.1uF | MURATA | .1uF,0603,X7R,20%,16V | GRM39X7R104M016 |
| | | C19,C20,C28,C35,C36,C37, | | | | |
| | | C38,C40,C41,C44,C48,C55, | | | | |
| | | C56,C57,C59,C60,C62 | | | | |
| 2 | 1 | C4 | 330pF | MURATA | 330pF,0603,COG,10%,50 | GRM39COG331K050 |
| 3 | 2 | C10,C7 | 22pF | MURATA | 22pF,0603,COG,10%,50 | GRM30COG220K050 |
| 4 | 4 | C8,C9,C23,C24 | 470pF | MURATA | 470pF,0603,COG,10%,50 | GRM39COG471K050 |
| 5 | 6 | C11,C13,C25,C26,C27,C46 | 10pF | MURATA | 10pF,0603,COG,10%,50 | GRM39COG100K050 |
| 6 | 1 | C12 | 8pF | MURATA | 8pF,0603,COG,10%,50 | GRM39COG080K050 |
| 7 | 8 | C15,C16,C21,C22,C50,C54 | 100pF | MURATA | 100pF,0603,COG,10%,50 | GRM39COG101K050 |
| | | C58,C61 | | | | |
| 8 | 3 | C39,C43,C47 | 4.7uF | PANASONIC | 4.7uF TANTALUM,16V | ECS-T1CY475R |
| 9 | 1 | C52 | 33pF | MURATA | 330pF,0603,COG,10%,50 | GRM3COG330K050 |
| 10 | 2 | FL1,FL2 | MDR642E | SOSHIN | 2.4-2.5GHz BPF | MDR642E |
| 11 | 1 | JP1 | HEADER 7X2 | SAMTEC | DUAL ROW, 7 PINS PER ROW | FTSH-107-01-F-D |
| 12 | 3 | J1,J2,J3 | 82MMCX-50-0-1 | SUHNER | RF CONNECTOR | 82MMCX-50-0-1 |
| 13 | 6 | J4,J5,J6,J7,J9,J10 | CON3 | BERG | 3 PIN HEADER W RETENTIVE LEG | 69190-403H |
| 14 | 2 | L10,L1 | BLM21A601R | MURATA | 600 OHMS@100MHz,500mA FERRITE BEAD | BLM21A601R |
| 15 | 4 | L2,L3,L5,L6 | 22nH | COILCRAFT | 22nH,0805CS (2012),5% | 0805CS-220X-BC |
| 16 | 9 | L7,L8,L9,L11,L12,L13,L14, | BLM11A121S | MURATA | RF BEAD | BLM11A121S |
| | | L15,L16 | | | | |
| 17 | 4 | Q1,Q2,Q3,Q4 | NDS336P | NATIONAL | P-CHANNEL FET | NDS336P |
| 18 | 12 | R1,R2,R5,R6,R7,R9,R11, | R | PANASONIC | | |
| | | R13,R16,R17,R18,R19 | | | | |
| 19 | 2 | R3,R4 | 100 | PANASONIC | 0603,100,5%,1/16W | ERJ-3GSY-J-101 |
| 20 | 5 | R10,R12,R15,R20,R21 | 4.7K | PANASONIC | 0603,4.7K,5%,1/16W | ERJ-3GSY-J-472 |

FIG.66A

| | | | | | | |
|---|---|---|---|---|---|---|
| 21 | 1 | R14 | 3.6K | PANASONIC | 0603,3.6K,5%,1/16W | ERJ-3GSY-J-362 |
| 22 | 1 | T1 | 80 OHM,L=100 MIL,W=20 MIL | | 80 OHM,L=100 MIL,W=20 MIL | |
| 23 | 1 | T2 | 50 OHM,L=100 MIL,W=54 MIL | | 50 OHM,L=100 MIL,W=54 MIL | |
| 24 | 1 | T3 | 102 OHM,L=220 MIL,W=10 MIL | | 102 OHM,L=220 MIL,W=10 MIL | |
| 25 | 1 | T4 | 67 OHM,L=200 MIL,W=30.7 MIL | | 67 OHM,L=200 MIL,W=30.7 MIL | |
| 26 | 1 | T5 | 100 OHM,L=200 MIL,W=10.7MIL | | 100 OHM,L=200 MIL,W=10.7 MIL | |
| 27 | 4 | U2,U3,U6,U7 | MAAM22010 | MACOM | 2.4-2.5 GHz LNA | MAAM22010 |
| 28 | 1 | U4 | UPG152TA | NEC | RF SWITCH | UPG152TA |
| 29 | 5 | U11,U12,U16,U18,U19 | NC7S04M5 | NATIONAL | INVERTER | NC7S04M5 |
| 30 | 1 | U14 | TKN11230B | TOKO | VOLTAGE REGULATOR | TK11230B |
| 31 | 1 | U17 | RF2128P | RFMD | MEDIUM POWER LINEAR AMPLIFIER | RF2128P |
| 32 | 1 | | | | BOARD | B500.641.024 VOL. |

FIG.66B (A) IQDEMOD PULSE RELATIONSHIPS TO INPUT RF CARRIER

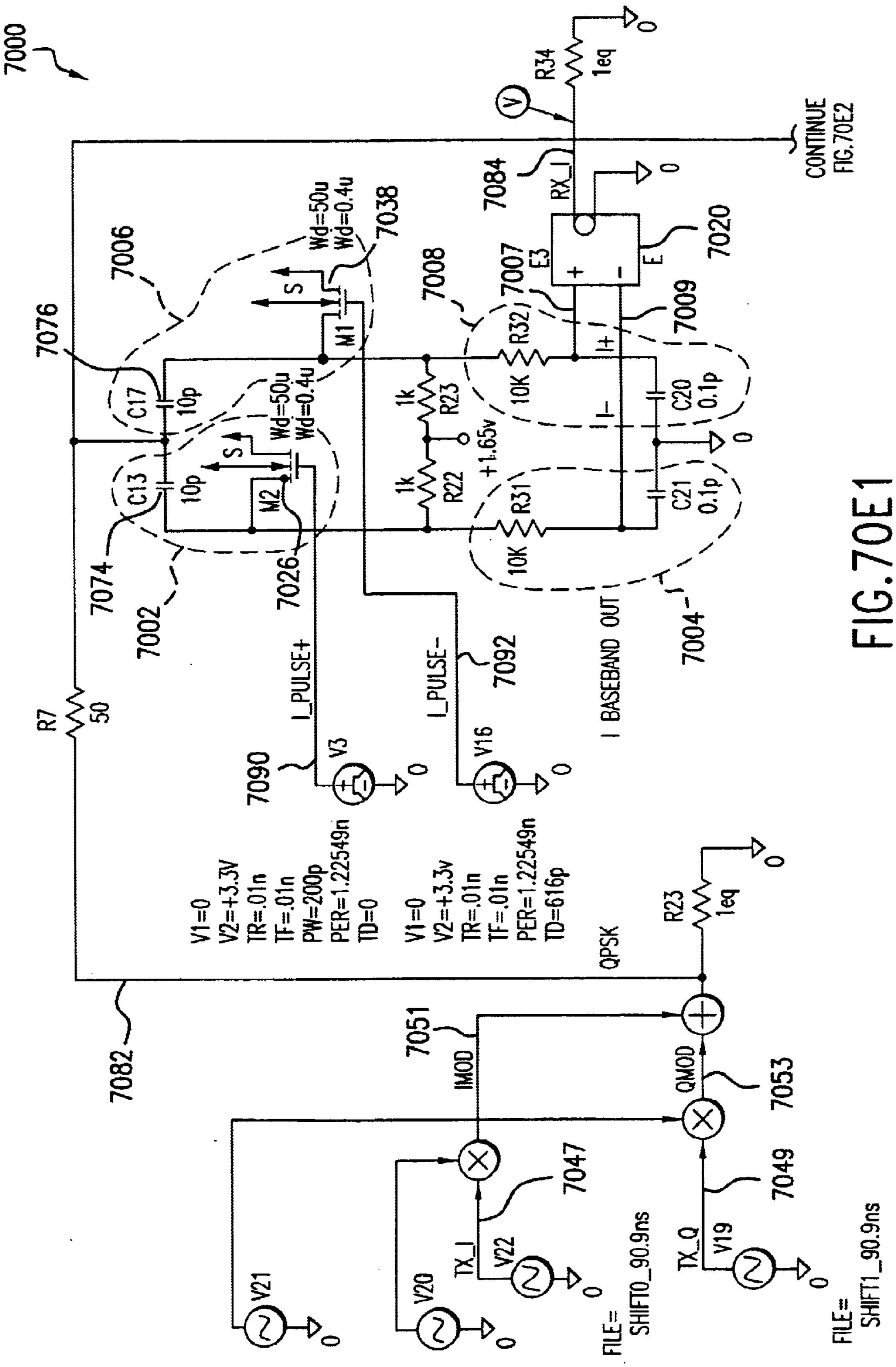
FIG.70E1

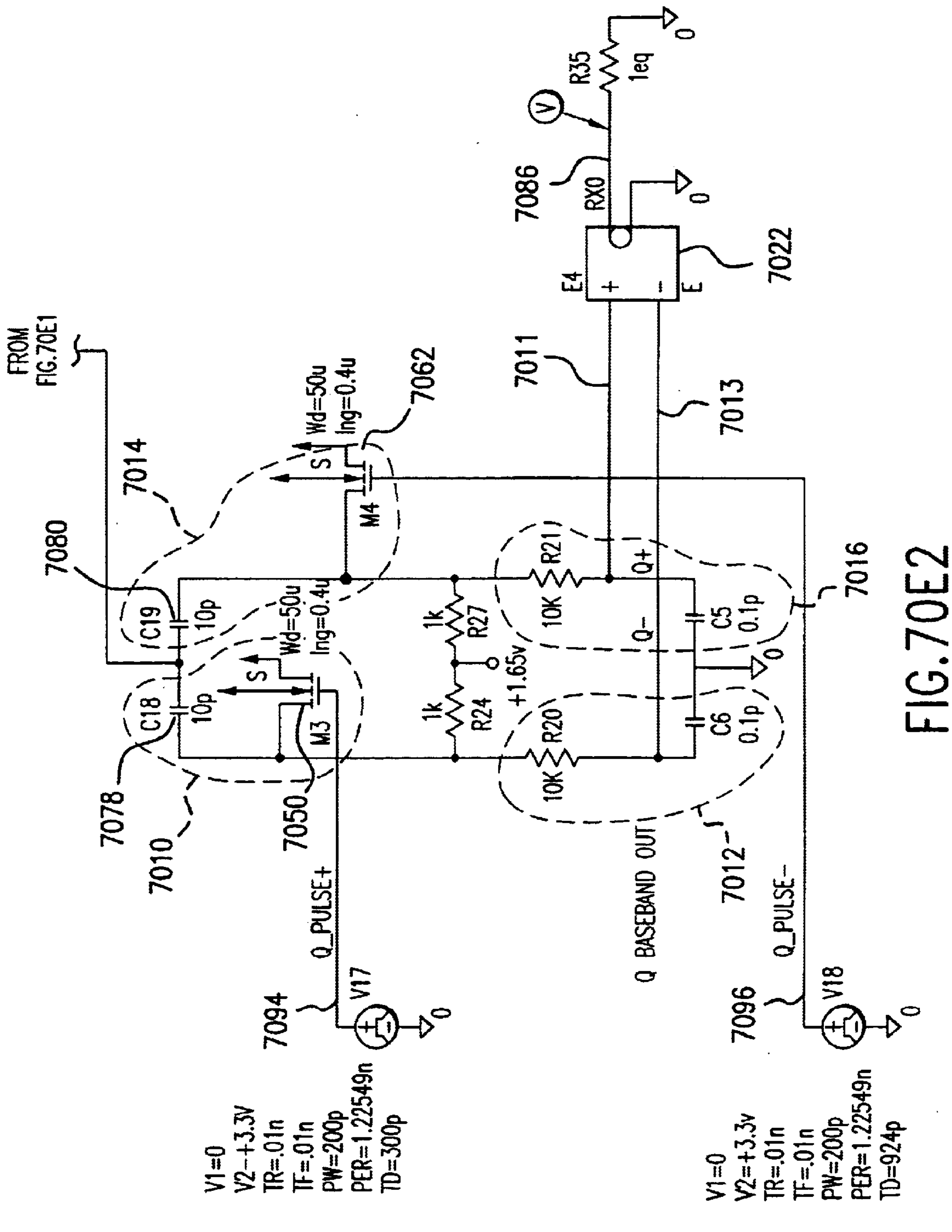
FIG.70E2

RISING EDGE PULSE GENERATOR

FALLING EDGE PULSE GENERATOR

WIRELESS LOCAL AREA NETWORK (WLAN) USING UNIVERSAL FREQUENCY TRANSLATION TECHNOLOGY INCLUDING MULTI-PHASE EMBODIMENTS AND CIRCUIT IMPLEMENTATIONS

CROSS-REFERENCE TO OTHER APPLICATIONS

This application claims the benefit of U.S. Provisional Application No. 60/147,129, filed on Aug. 4, 1999; and this application is a continuation-in-part of U.S. application Ser. No. 09/525,615, filed on Mar. 14, 2000; and this application is a continuation-in-part of U.S. application Ser. No. 09/526,041, filed on Mar. 14, 2000, all of which are incorporated herein by reference in their entireties.

The following applications of common assignee are related to the present application, and are herein incorporated by reference in their entireties:

"Method and System for Down-Converting Electromagnetic Signals," Ser. No. 09/176,022, filed Oct. 21, 1998, issued as U.S. Pat. No. 6,061,551 on May 9, 2000.

"Method and System for Down-Converting Electromagnetic Signals Having Optimized Switch Structures," Ser. No. 09/293,095, filed Apr. 16, 1999.

"Method and System for Down-Converting Electromagnetic Signals Including Resonant Structures for Enhanced Energy Transfer," Ser. No. 09/293,342, filed Apr. 16, 1999.

"Method and System for Frequency Up-Conversion," Ser. No. 09/176,154, filed Oct. 21, 1998, issued as U.S. Pat. No. 6,091,940 on Jul. 18, 2000.

"Method and System for Frequency Up-Conversion Having Optimized Switch Structures," Ser. No. 09/293,097, filed Apr. 16, 1999.

"Method and System for Ensuring Reception of a Communications Signal," Ser. No. 09/176,415, filed Oct. 21, 1998, issued as U.S. Pat. No. 6,061,555 on May 9, 2000.

"Integrated Frequency Translation And Selectivity," Ser. No. 09/175,966, filed Oct. 21, 1998, issued as U.S. Pat. No. 6,049,706 on Apr. 11, 2000.

"Integrated Frequency Translation and Selectivity with a Variety of Filter Embodiments," Ser. No. 09/293,283, filed Apr. 16, 1999.

"Applications of Universal Frequency Translation," Ser. No. 09/261,129, filed Mar. 3, 1999.

"Method and System for Down-Converting an Electromagnetic Signal, Transforms For Same, and Aperture Relationships", Ser. No. 09/550,644, filed on Apr. 14, 2000.

"Wireless Local Area Network (WLAN) Technology and Applications Including Techniques of Universal Frequency Translation", Ser. No. 09/632,857, filed on Aug. 4, 2000.

BACKGROUND OF THE INVENTION

1. Field of the Invention

The present invention is generally related to wireless local area networks (WLANs), and more particularly, to WLANs that utilize universal frequency translation technology for frequency translation, and applications of same.

2. Related Art

Wireless LANs exist for receiving and transmitting information to/from mobile terminals using electromagnetic (EM) signals. Conventional wireless communications circuitry is complex and has a large number of circuit parts. This complexity and high parts count increases overall cost. Additionally, higher part counts result in higher power consumption, which is undesirable, particularly in battery powered wireless units. Additionally, various communication components exist for performing frequency down-conversion, frequency up-conversion, and filtering. Also, schemes exist for signal reception in the face of potential jamming signals.

SUMMARY OF THE INVENTION

The present invention is directed to a wireless local area network (WLAN) that includes one or more WLAN devices (also called stations, terminals, access points, client devices, or infrastructure devices) for effecting wireless communications over the WLAN. The WLAN device includes at least an antenna, a receiver, and a transmitter for effecting wireless communications over the WLAN. Additionally, the WLAN device may also include a LNA/PA module, a control signal generator, a demodulation/modulation facilitation module, and a media access control (MAC) interface. The WLAN receiver includes at least one universal frequency translation module that frequency down-converts a received electromagnetic (EM) signal. In embodiments, the UFT based receiver is configured in a multi-phase embodiment to reduce or eliminate re-radiation that is caused by DC offset. The WLAN transmitter includes at least one universal frequency translation module that frequency up-converts a baseband signal in preparation for transmission over the WLAN. In embodiments, the UFT based transmitter is configured in a differential and/or multi-phase embodiment to reduce carrier insertion and spectral growth in the transmitted signal.

WLANs exhibit multiple advantages by using UFT modules for frequency translation. These advantages include, but are not limited to: lower power consumption, longer battery life, fewer parts, lower cost, less tuning, and more effective signal transmission and reception. These advantages are possible because the UFT module enables direct frequency conversion in an efficient manner with minimal signal distortion. The structure and operation of embodiments of the UFT module, and various applications of the same are described in detail in the following sections.

Further features and advantages of the invention, as well as the structure and operation of various embodiments of the invention, are described in detail below with reference to the accompanying drawings. The drawing in which an element first appears is typically indicated by the leftmost character(s) and/or digit(s) in the corresponding reference number.

BRIEF DESCRIPTION OF THE FIGURES

The present invention will be described with reference to the accompanying drawings, wherein:

FIG. 18 is a table of example values at nodes in the UDF module of FIG. 19;

FIG. 42 includes FIGS. 42A and 42B and should be referred to for all references to FIG. 42 in the specification.

FIG. 43 includes FIGS. 43A and 43B and should be referred to for all references to FIG. 43 in the specification.

FIG. 44 includes FIGS. 44A and 44B and should be referred to for all references to FIG. 44 in the specification.

FIGS. 45, 46A, and 46B and 46C relate to an example MAC interface for an example WLAN interface embodiment;

FIGS. 47, 48, 49A, and 49B and 49C relate to an example demodulator/modulator facilitation module for an example WLAN interface embodiment; FIG. 47 includes FIGS. 47A–D and should be referred to for all references to FIG. 47 in the specification. FIG. 48 includes FIGS. 48A–B and should be referred to for all references to FIG. 47 in the specification.

FIGS. 50, 51, 52A, 52B, and 52C relate to an example alternate demodulator/modulator facilitation module for an example WLAN interface embodiment; FIG. 50 includes FIGS. 50A–D and should be referred to for all references to FIG. 50 in the specification. FIG. 51 includes FIGS 51A–B and should be referred to for all references to FIG. 51 in the specification. FIG. 52B includes FIG. 52B-1 and should be referred to for for all references to FIG. 52B in the specification.

FIGS. 53 and 54 relate to an example receiver for an example WLAN interface embodiment; FIG. 53 includes FIGS. 53A–C and should be referred to for all references to FIG. 53 in the specification.

FIGS. 55, 56A, and 56B relate to an example synthesizer for an example WLAN interface embodiment; FIG. 55 includes FIGS. 55A–C and should be referred to for all references to FIG. 55 in the specification.

FIGS. 57, 58, 59, 60, 61A, and 61B relate to an example transmitter for an example WLAN interface embodiment; FIG. 57 includes FIGS. 57A–D and should be referred to for all references to FIG. 57 in the specification. FIG. 60 includes FIGS. 60A–D and should be referred to for all references to FIG. 60 in the specification.

FIGS. 62 and 63 relate to an example motherboard for an example WLAN interface embodiment; FIG. 62 includes FIGS. 62A–I and should be referred to for all references to FIG. 62 in the specification.

FIGS. 64–66 relate to example LNAs for an example WLAN interface embodiment; FIG. 64 includes FIGS. 64A–C and should be referred to for all references to FIG. 64 in the specification. FIG. 65 includes FIGS 65A–E and should be referred to for all references to FIG. 65 in the specification. FIG. 66 includes FIG. 66A–B and should be referred to for all referrences to FIG. 66 in the specification.

FIG. 70A includes FIGS 70A-1 and should be referred to for all references to FIG. 70A in the specification

FIG. 70E illustrates an example IQ modulation receiver embodiment according to embodiments of the invention; FIG. 70E includes FIG 70E1 and FIG. 70E2 and should be referred to for all references to FIG. 70E in the specification.

FIG. 70S includes FIGS 70S-1 and should be referred to for all references to FIG. 70S in the specification.

FIG. 90B includes FIGS. 90B-1, 90B-2, 90B-3, and 90B-4 and should be referred to for all references to FIG. 90B in the specification. FIG. 90C includes FIGS. 90C-1, 90C-2, 90C-3 and 90C-4 and should be referred to for all referneces to FIG. 90C in the specification.

FIG. 150 includes FIGS. 159A–D and should be referred to for all references to FIG. 159 in the specification.

DETAILED DESCRIPTION OF THE PREFERRED EMBODIMENTS

TABLE OF CONTENTS

1. Universal Frequency Translation
2. Frequency Down-Conversion
3. Frequency Up-Conversion
4. Enhanced Signal Reception
5. Unified Down-Conversion and Filtering
6. Example Application Embodiments of the Invention
   - 6.1 Data Communication
     - 6.1.1 Example Implementations: Interfaces, Wireless Modems, Wireless LANs, etc.
     - 6.1.2 Example Modifications
   - 6.2 Other Example Applications 7.0 Example WLAN Implementation Embodiments -continued

TABLE OF CONTENTS

- 7.1 Architecture
- 7.2 Receiver
  - 7.2.1 IQ Receiver
  - 7.2.2 Multi-Phase IQ Receiver
    - 7.2.2.1 Example I/Q Modulation Control Signal Generator Embodiments
    - 7.2.2.2 Implementation of Multi-phase I/Q Modulation Receiver Embodiment with Exemplary Waveforms
    - 7.2.2.3 Example Single Channel Receiver Embodiment
    - 7.2.2.4 Alternative Example I/Q Modulation Receiver Embodiment
- 7.3 Transmitter
  - 7.3.1 Universal Transmitter with 2 UFT Modules
    - 7.3.1.1 Balanced Modulator Detailed Description
    - 7.3.1.2 Balanced Modulator Example Signal Diagrams and Mathematical Description
    - 7.3.1.3 Balanced Modulator Having a Shunt Configuration
    - 7.3.1.4 Balanced Modulator FET Configuration
    - 7.3.1.5 Universal Transmitter Configured for Carrier Insertion
  - 7.3.2 Universal Transmitter In IQ Configuration
    - 7.3.2.1 IQ Transmitter Using Series-Type Balanced Modulator
    - 7.3.2.2 IQ Transmitter Using Shunt-Type Balanced Modulator
    - 7.3.2.3 IQ Transmitters Configured for Carrier Insertion
- 7.4 Transceiver Embodiments
- 7.5 Demodulator/Modulator Facilitation Module
- 7.6 MAC Interface
- 7.7 Control Signal Generator - Synthesizer
- 7.8 LNA/PA 8.0 802.11 Physical Layer Configurations 9.0 Appendix 10.0 Conclusion

1. Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
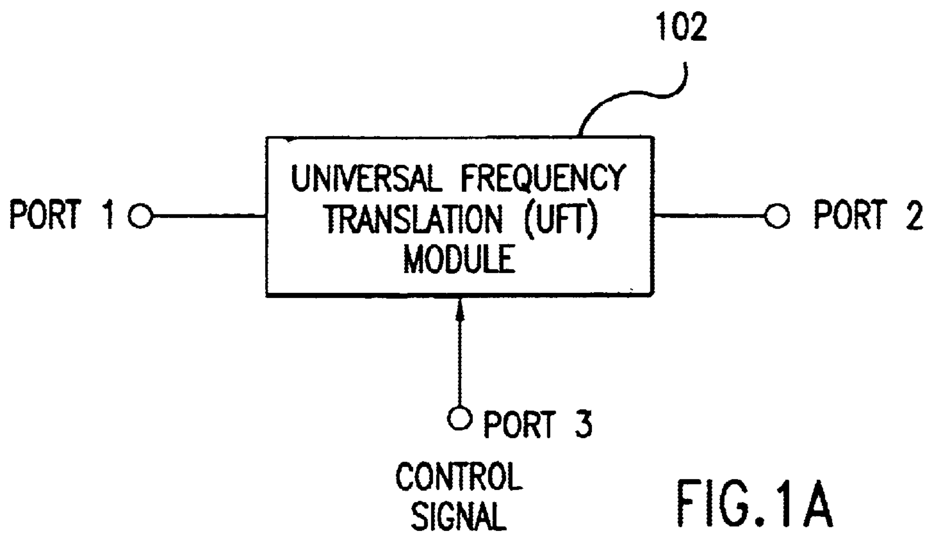
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
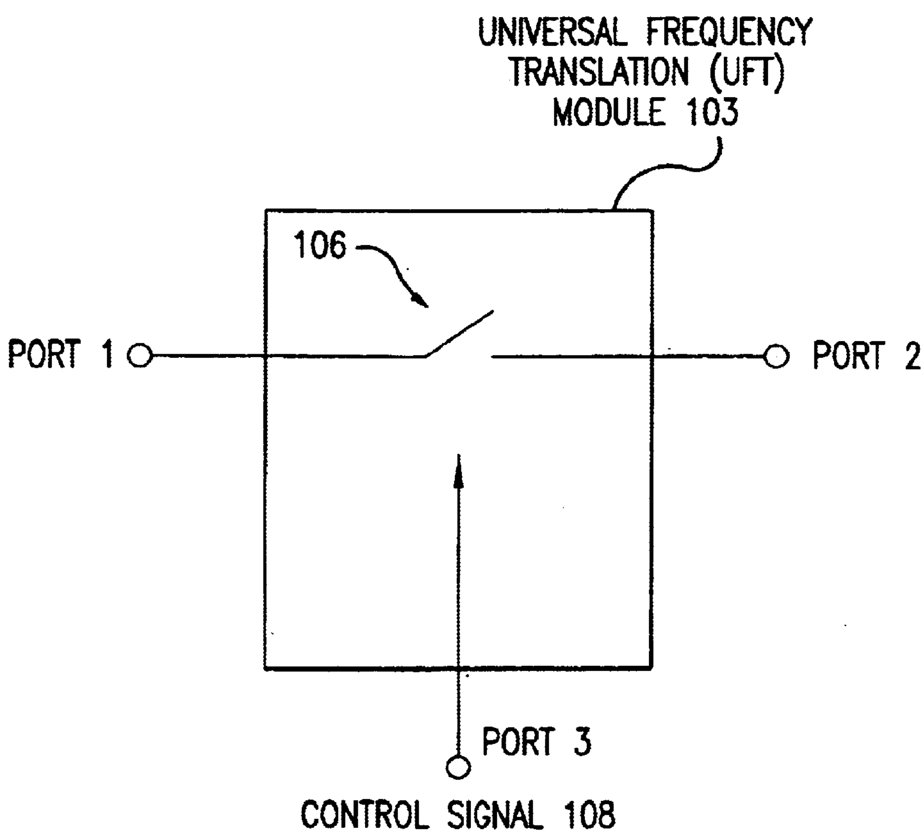
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
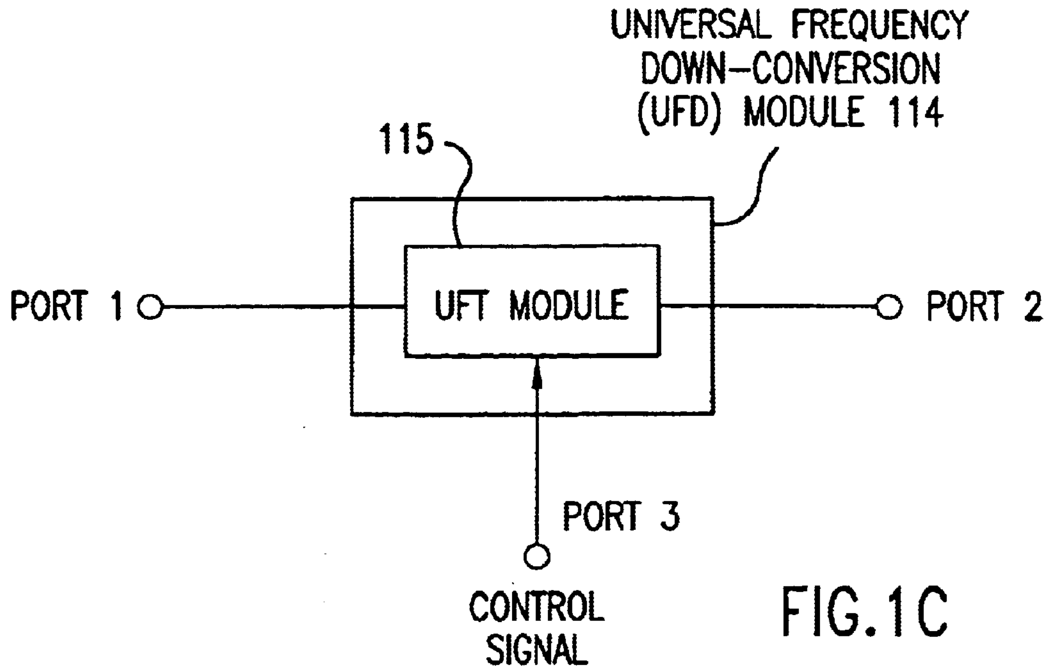
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
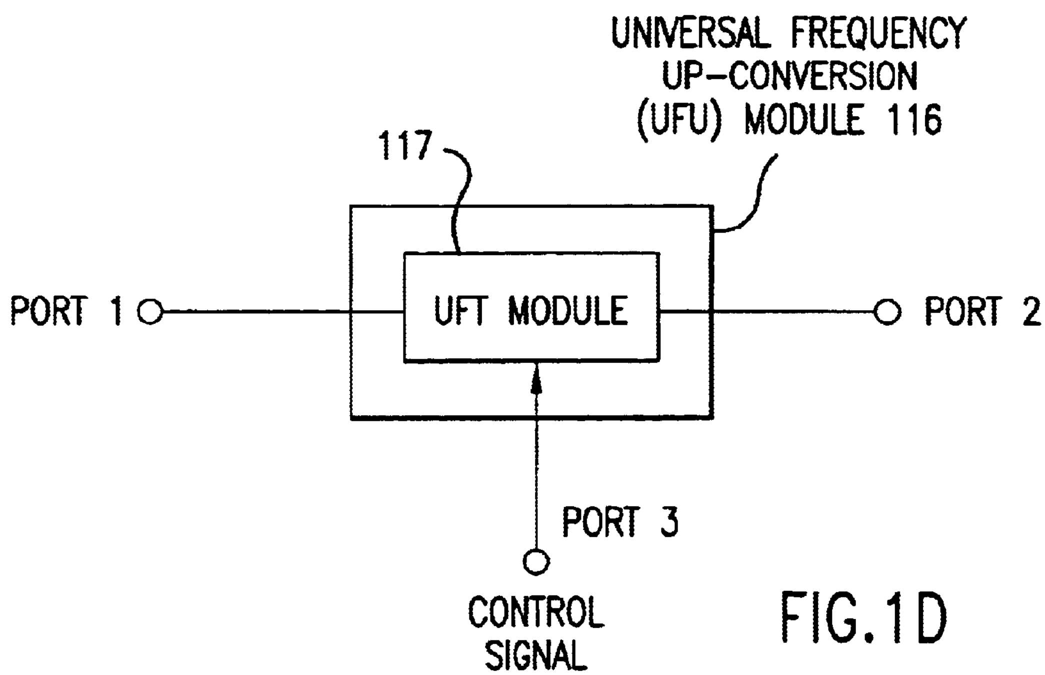
FIG. 1D illustrates a UFT module used in a universal frequency up-conversion (UFU) module according to an embodiment of the invention.
Figure 2A:
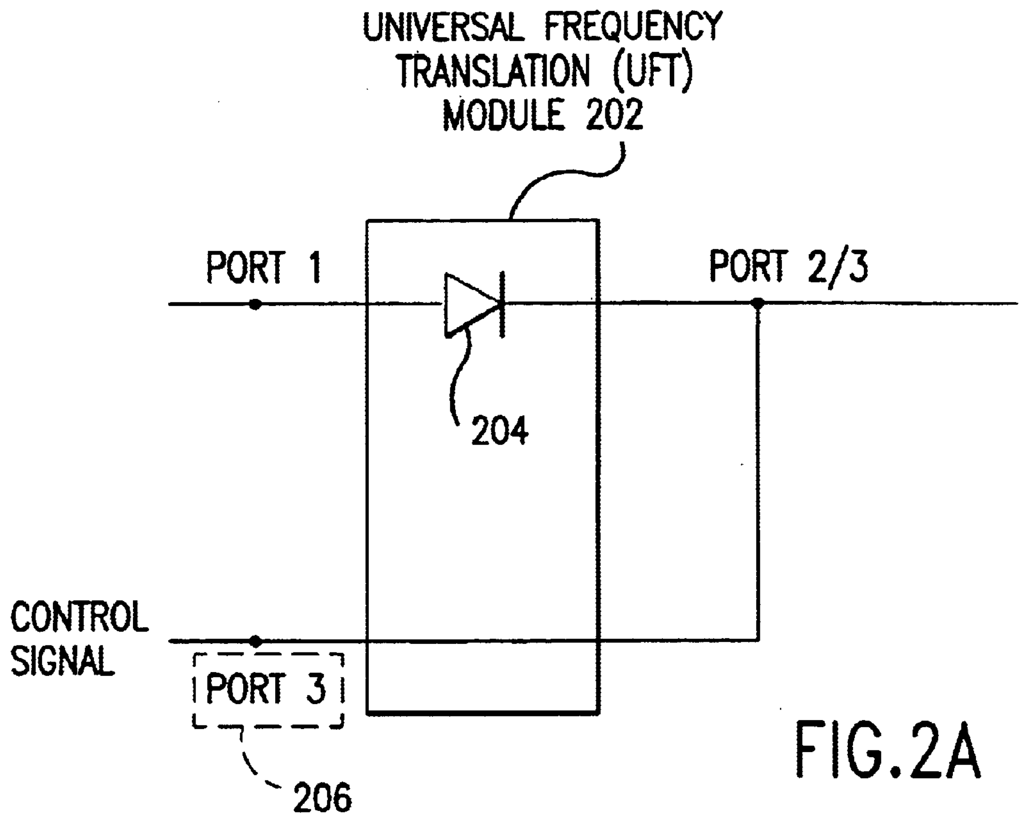
FIGS. 2A–2B illustrate block diagrams of universal frequency translation (UFT) modules according to an embodiment of the invention.
Figure 2B:
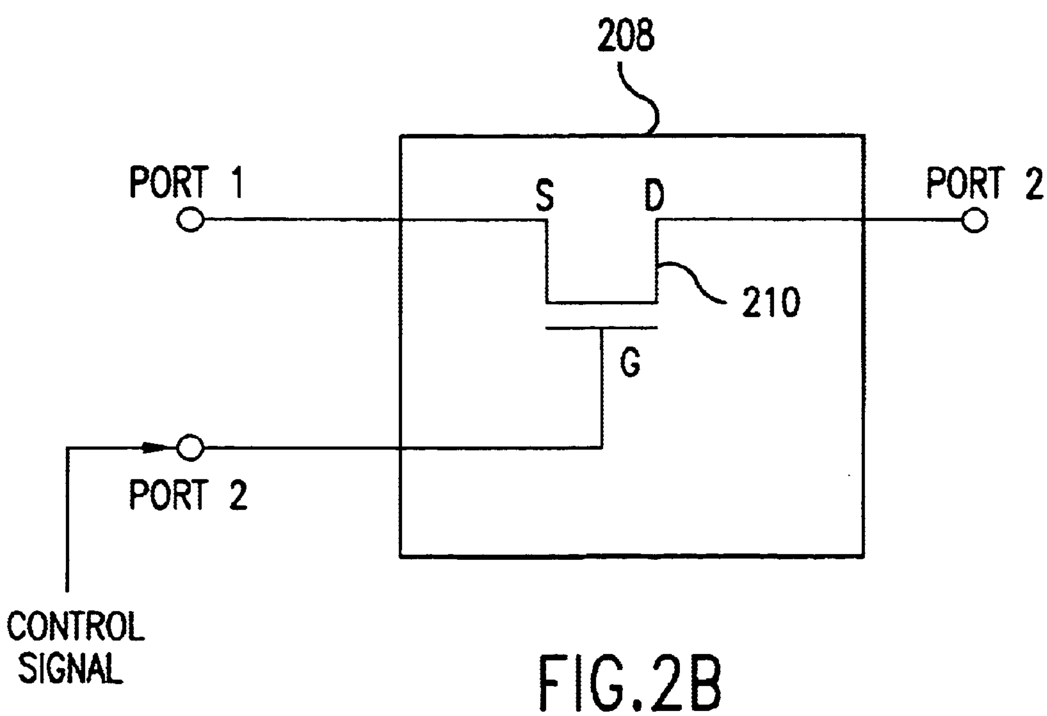

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2. Frequency Down-Conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in co-pending U.S. Patent Application entitled "Method and System for Down-Converting Electromagnetic Signals," Ser. No. 09/176,022, filed Oct. 21, 1998, issued as U.S. Pat. No. 6,061,551 on May 9, 2000, the full disclosure of which is incorporated herein by reference. A relevant portion of the above mentioned patent application is summarized below to describe down-converting an input signal to produce a down-converted signal that exists at a lower frequency or a baseband signal.

Figure 20A:
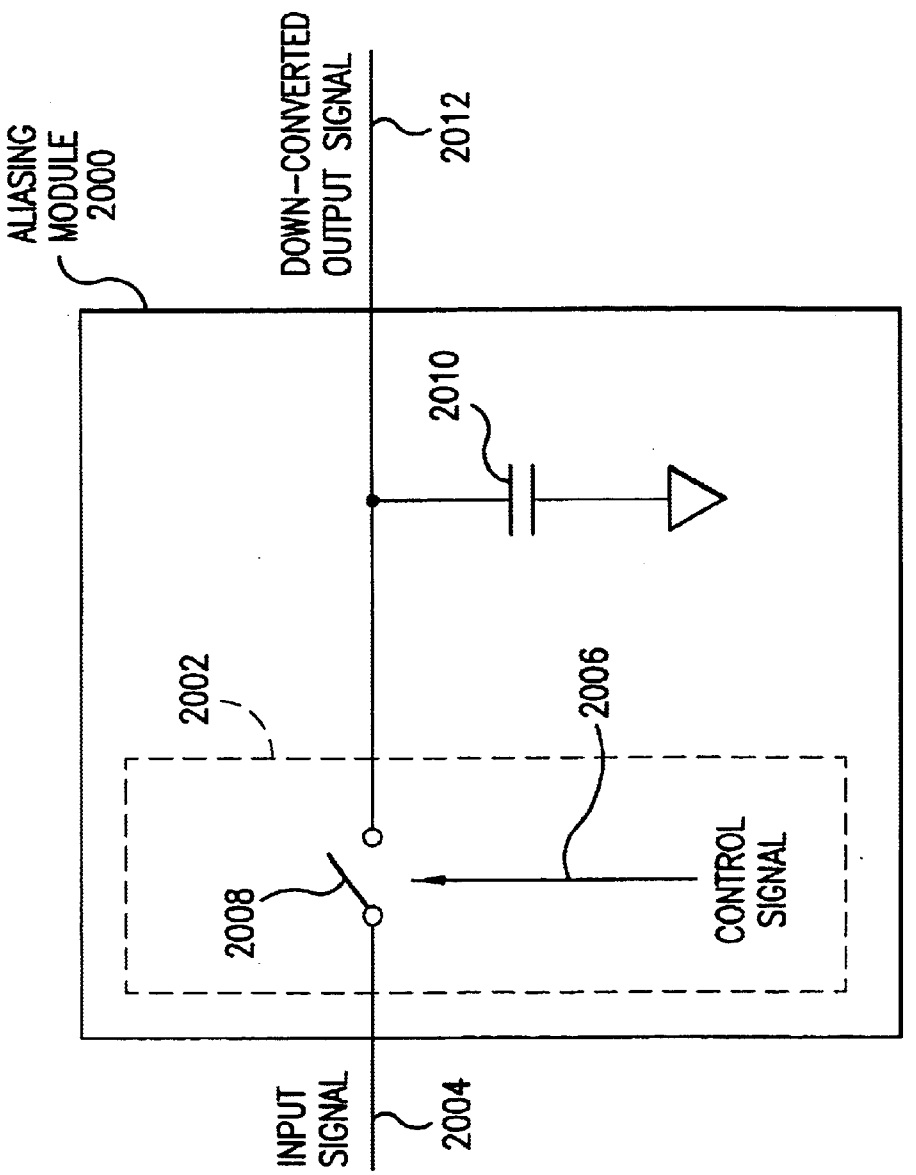
FIGS. 20A and 20A-1 are example aliasing modules according to embodiments of the invention.
Figures 1, 20A:
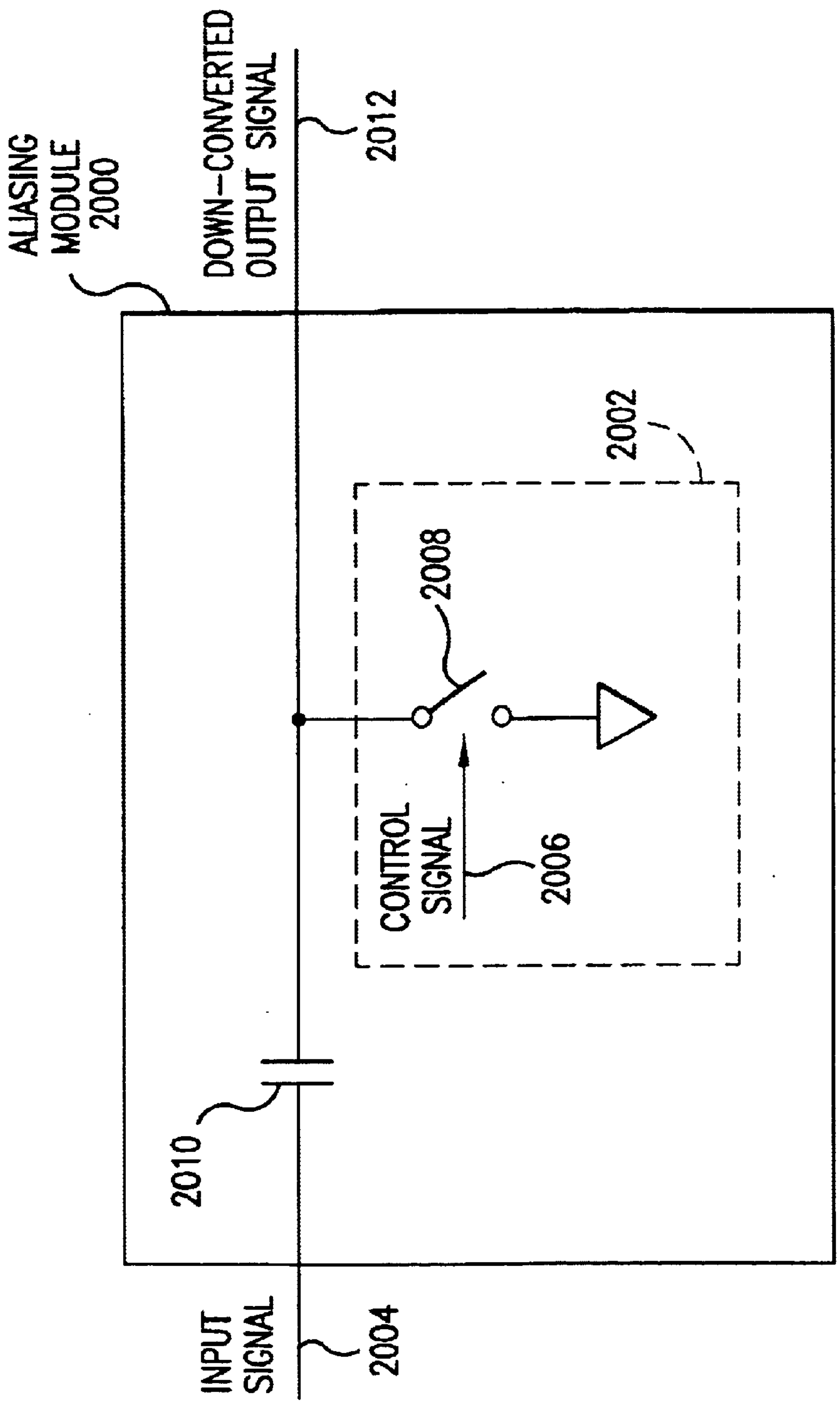

FIG. 20A illustrates an aliasing module 2000 (also called a universal frequency down-conversion module) for down-conversion using a universal frequency translation (UFT) module 2002 which down-converts an EM input signal 2004. In particular embodiments, aliasing module 2000 includes a switch 2008 and a capacitor 2010. The electronic alignment of the circuit components is flexible. That is, in one implementation, the switch 2008 is in series with input signal 2004 and capacitor 2010 is shunted to ground (although it may be other than ground in configurations such as differential mode). In a second implementation (see FIG. 20A-1), the capacitor 2010 is in series with the input signal 2004 and the switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of the EM input signal 2004.

In one implementation, aliasing module 2000 down-converts the input signal 2004 to an intermediate frequency (IF) signal. In another implementation, the aliasing module 2000 down-converts the input signal 2004 to a demodulated baseband signal. In yet another implementation, the input signal 2004 is a frequency modulated (FM) signal, and the aliasing module 2000 down-converts it to a non-FM signal, such as a phase modulated (PM) signal or an amplitude modulated (AM) signal. Each of the above implementations is described below.

In an embodiment, the control signal 2006 includes a train of pulses that repeat at an aliasing rate that is equal to, or less than, twice the frequency of the input signal 2004. In this embodiment, the control signal 2006 is referred to herein as an aliasing signal because it is below the Nyquist rate for the frequency of the input signal 2004. Preferably, the frequency of control signal 2006 is much less than the input signal 2004.

Figure 20B:
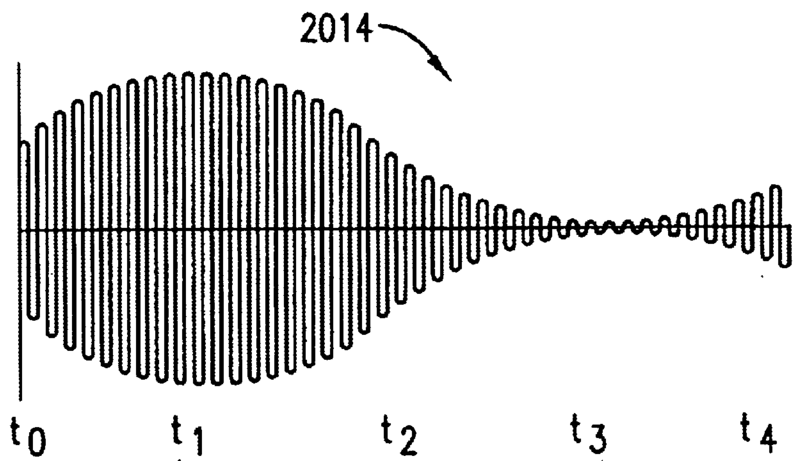
FIGS. 20B–20F are example waveforms used to describe the operation of the aliasing modules of FIGS. 20A and 20A-1.
Figure 20C:
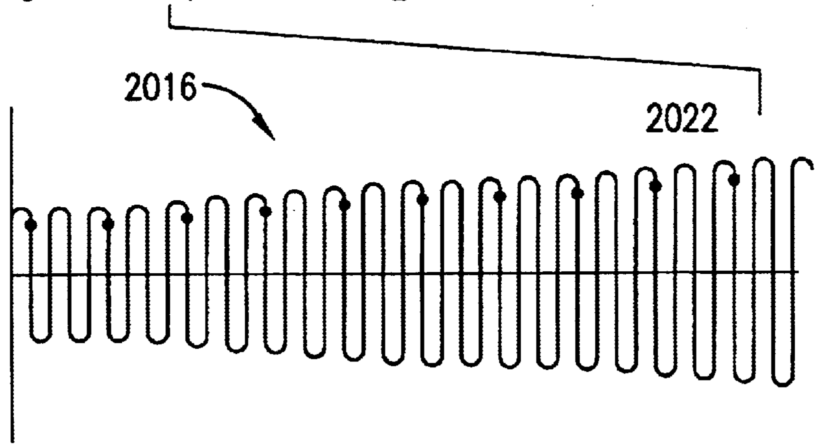
Figure 20D:
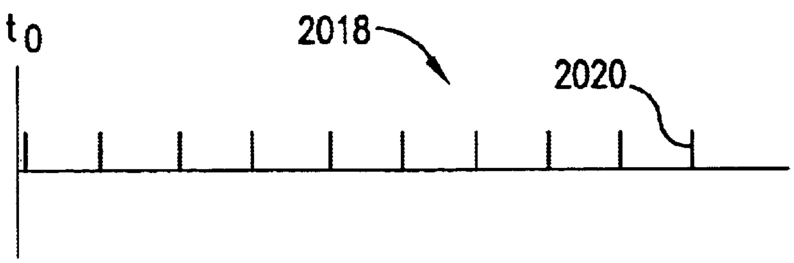
Figure 20E:
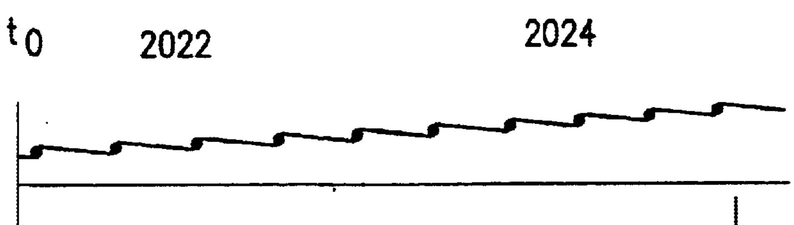

A train of pulses 2018 as shown in FIG. 20D controls the switch 2008 to alias the input signal 2004 with the control signal 2006 to generate a down-converted output signal 2012. More specifically, in an embodiment, switch 2008 closes on a first edge of each pulse 2020 of FIG. 20D and opens on a second edge of each pulse. When the switch 2008 is closed, the input signal 2004 is coupled to the capacitor 2010, and charge is transferred from the input signal to the capacitor 2010. The charge stored during successive pulses forms down-converted output signal 2012.

Exemplary waveforms are shown in FIGS. 20B–20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of the analog AM carrier signal 2014 on an expanded time scale. The analog AM carrier signal portion 2016 illustrates the analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as the analog AM carrier signal portion 2016. In the example shown in FIG. 20D, the aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). The pulses 2020 repeat at an aliasing rate, or pulse repetition rate of aliasing signal 2018. The aliasing rate is determined as described below, and further described in co-pending U.S. Patent Application entitled "Method and System for Down-converting Electromagnetic Signals," application Ser. No. 09/176,022, issued as U.S. Pat. No. 6,061,551 on May 9, 2000.

Figure 20F:
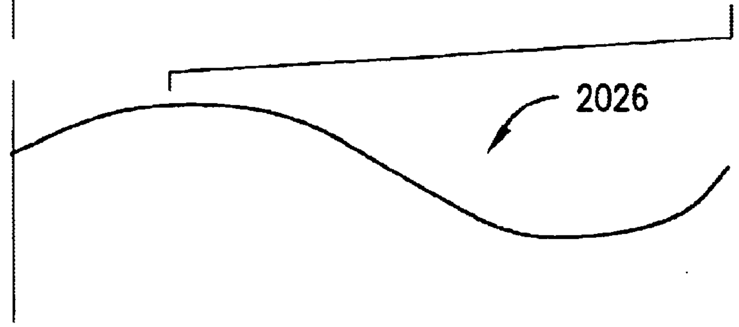

As noted above, the train of pulses 2020 (i.e., control signal 2006) control the switch 2008 to alias the analog AM carrier signal 2016 (i.e., input signal 2004) at the aliasing rate of the aliasing signal 2018. Specifically, in this embodiment, the switch 2008 closes on a first edge of each pulse and opens on a second edge of each pulse. When the switch 2008 is closed, input signal 2004 is coupled to the capacitor 2010, and charge is transferred from the input signal 2004 to the capacitor 2010. The charge transferred during a pulse is referred to herein as an under-sample. Exemplary under-samples 2022 form down-converted signal portion 2024 (FIG. 20E) that corresponds to the analog AM carrier signal portion 2016 (FIG. 20C) and the train of pulses 2020 (FIG. 20D). The charge stored during successive under-samples of AM carrier signal 2014 form the down-converted signal 2024 (FIG. 20E) that is an example of down-converted output signal 2012 (FIG. 20A). In FIG. 20F, a demodulated baseband signal 2026 represents the demodulated baseband signal 2024 after filtering on a compressed time scale. As illustrated, down-converted signal 2026 has substantially the same "amplitude envelope" as AM carrier signal 2014. Therefore, FIGS. 20B–20F illustrate down-conversion of AM carrier signal 2014.

The waveforms shown in FIGS. 20B–20F are discussed herein for illustrative purposes only, and are not limiting. Additional exemplary time domain and frequency domain drawings, and exemplary methods and systems of the invention relating thereto, are disclosed in co-pending U.S. Patent Application entitled "Method and System for Down-converting Electromagnetic Signals," application Ser. No. 09/176,022, issued as U.S. Pat. No. 6,061,551 on May 9, 2000.

The aliasing rate of control signal 2006 determines whether the input signal 2004 is down-converted to an IF signal, down-converted to a demodulated baseband signal, or down-converted from an FM signal to a PM or an AM signal. Generally, relationships between the input signal 2004, the aliasing rate of the control signal 2006, and the down-converted output signal 2012 are illustrated below:

$$\text{(Freq. of input signal } \mathbf{2004}) = n \cdot \text{(Freq. of control signal } \mathbf{2006}) \pm \text{(Freq. of down-converted output signal } \mathbf{2012})$$

For the examples contained herein, only the "+" condition will be discussed. The value of n represents a harmonic or sub-harmonic of input signal 2004 (e.g., n=0.5, 1, 2, 3, . . . ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If the input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 2006 would be calculated as follows:

$$(\text{Freq}_{input} - \text{Freq}_{IF})/n = \text{Freq}_{control}$$

$$(901\text{ MHZ} - 1\text{ MHZ})/n = 900/n$$

For n=0.5, 1, 2, 3, 4, etc., the frequency of the control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in co-pending U.S. Patent Application entitled "Method and System for Down-converting Electromagnetic Signals," application Ser. No. 09/176,022, issued as U.S. Pat. No. 6,061,551 on May 9, 2000.

Alternatively, when the aliasing rate of the control signal 2006 is substantially equal to the frequency of the input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of the input signal 2004. As a result, the under-samples form a constant output baseband signal. If the input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 2006 would be calculated as follows:

$$(\text{Freq}_{input} - \text{Freq}_{IF})/n = \text{Freq}_{control}$$

$$(900\text{ MHZ} - 0\text{ MHZ})/n = 900\text{ MHZ}/n$$

For n=0.5, 1, 2, 3, 4, etc., the frequency of the control signal 2006 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the co-pending U.S. Patent Application entitled "Method and System for Down-converting Electromagnetic Signals," application Ser. No. 09/176,022, issued as U.S. Pat. No. 6,061,551 on May 9, 2000.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 2006 would be calculated as follows:

$$\begin{aligned}\text{Frequency of the input} &= (F_1 + F_2) \div 2 \\ &= (899\text{ MHZ} + 901\text{ MHZ}) \div 2 \\ &= 900\text{ MHZ}\end{aligned}$$

Frequency of the down-converted signal=0 (i.e., baseband)

$$(\text{Freq}_{input} - \text{Freq}_{IF})/n = \text{Freq}_{control}$$

$$(900\text{ MHZ} - 0\text{ MHZ})/n = 900\text{ MHZ}/n$$

For n=0.5, 1, 2, 3, etc., the frequency of the control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 2006 should be substantially equal to:

$$(900\text{ MHZ} - 0\text{ MHZ})/n = 900\text{ MHZ}/n,$$

or $$(901\text{ MHZ} - 0\text{ MHZ})/n = 901\text{ MHZ}/n.$$

For the former case of 900 MHZ/n, and for n=0.5, 1, 2, 3, 4, etc., the frequency of the control signal 2006 should be substantially equal to 1.8 GHz, 900 MHZ, 450 MHZ, 300 MHZ, 225 MHZ, etc. For the latter case of 901 MHZ/n, and for n=0.5, 1, 2, 3, 4, etc., the frequency of the control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in the co-pending U.S. Patent Application entitled "Method and System for Down-converting Electromagnetic Signals," application Ser. No. 09/176,022, issued as U.S. Pat. No. 6,061,551 on May 9, 2000.

In an embodiment, the pulses of the control signal 2006 have negligible apertures that tend towards zero. This makes the UFT module 2002 a high input impedance device. This configuration is useful for situations where minimal disturbance of the input signal may be desired.

In another embodiment, the pulses of the control signal 2006 have non-negligible apertures that tend away from zero. This makes the UFT module 2002 a lower input impedance device. This allows the lower input impedance of the UFT module 2002 to be substantially matched with a source impedance of the input signal 2004. This also improves the energy transfer from the input signal 2004 to the down-converted output signal 2012, and hence the efficiency and signal to noise (s/n) ratio of UFT module 2002.

Exemplary systems and methods for generating and optimizing the control signal 2006 and for otherwise improving energy transfer and s/n ratio, are disclosed in the co-pending U.S. Patent Application entitled "Method and System for Down-converting Electromagnetic Signals," application Ser. No. 09/176,022, issued as U.S. Pat. No. 6,061,551 on May 9, 2000.

3. Frequency Up-Conversion

The present invention is directed to systems and methods of frequency up-conversion, and applications of same.

Figure 3:
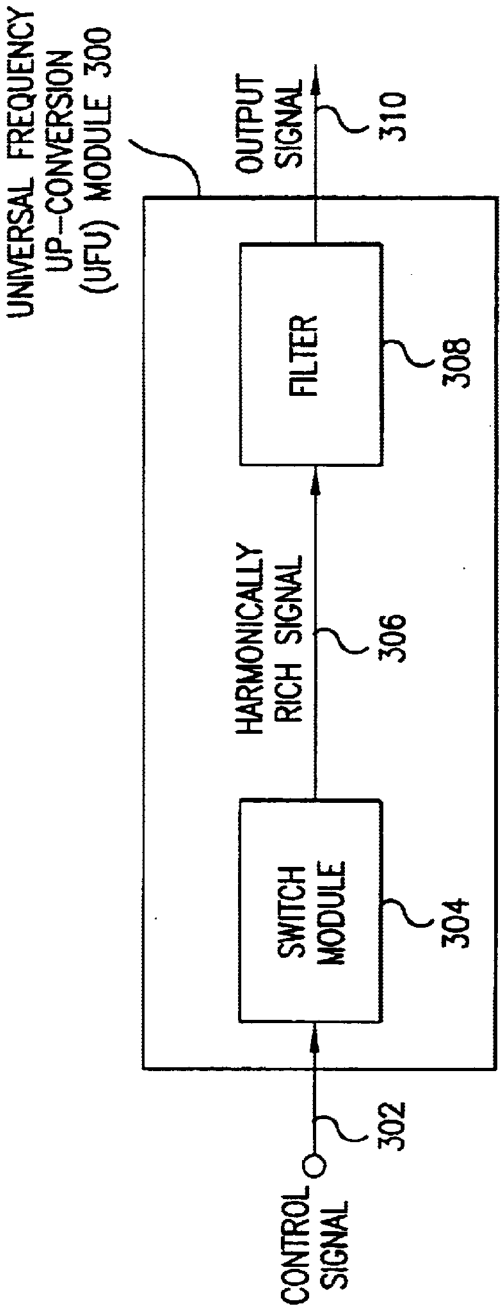
FIG. 3 is a block diagram of a universal frequency up-conversion (UFU) module according to an embodiment of the invention.

An example frequency up-conversion system 300 is illustrated in FIG. 3. The frequency up-conversion system 300 is now described.

Figures 6A, 6B, 6C, 6D:
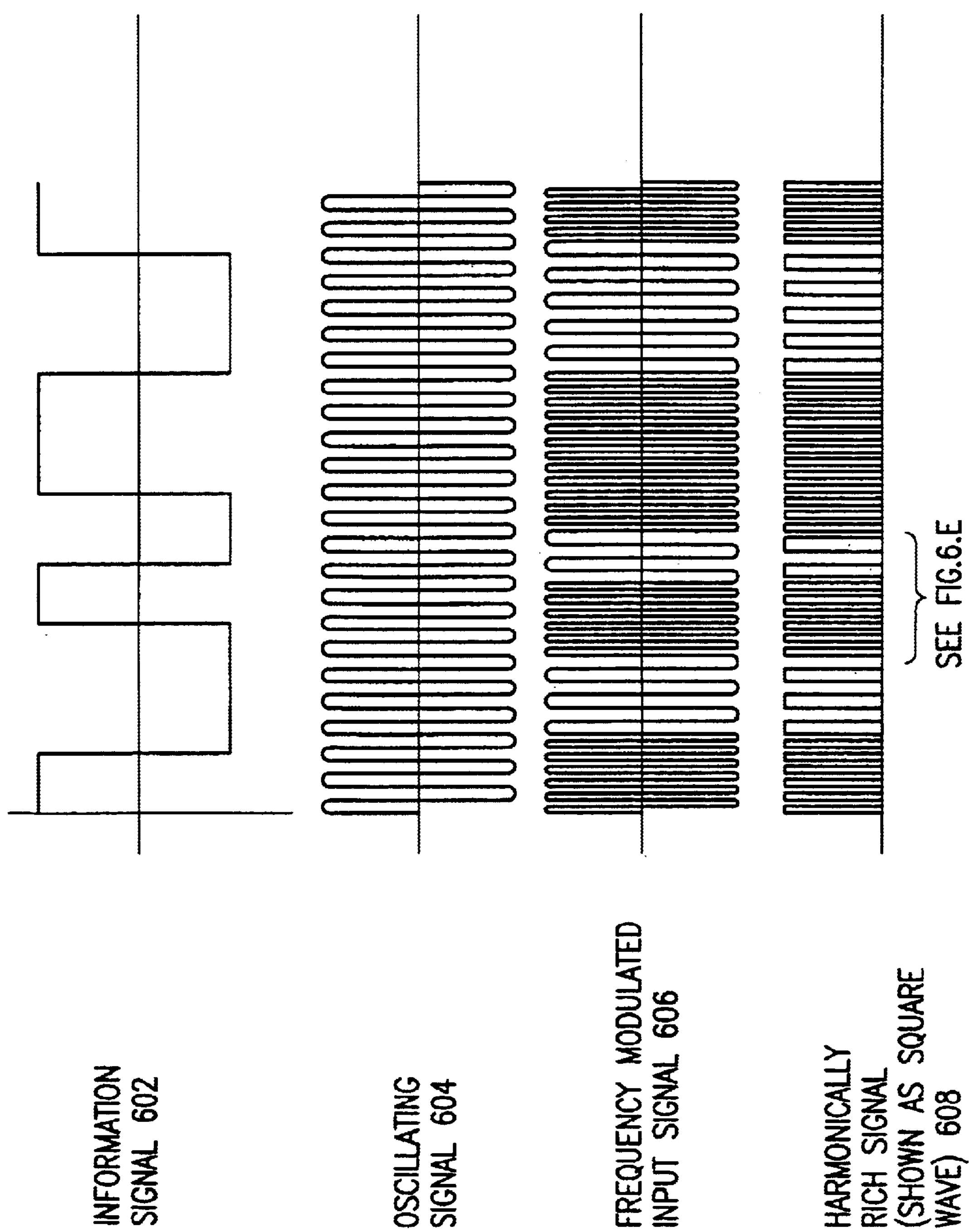
FIGS. 6A–6I illustrate example waveforms used to describe the operation of the UFU module.

An input signal 302 (designated as "Control Signal" in FIG. 3) is accepted by a switch module 304. For purposes of example only, assume that the input signal 302 is a FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. The information signal 602 can be analog, digital, or any combination thereof, and any modulation scheme can be used.

The output of switch module 304 is a harmonically rich signal 306, shown for example in FIG. 6D as a harmonically rich signal 608. The harmonically rich signal 608 has a continuous and periodic waveform.

Figures 6E, 6F, 6G:
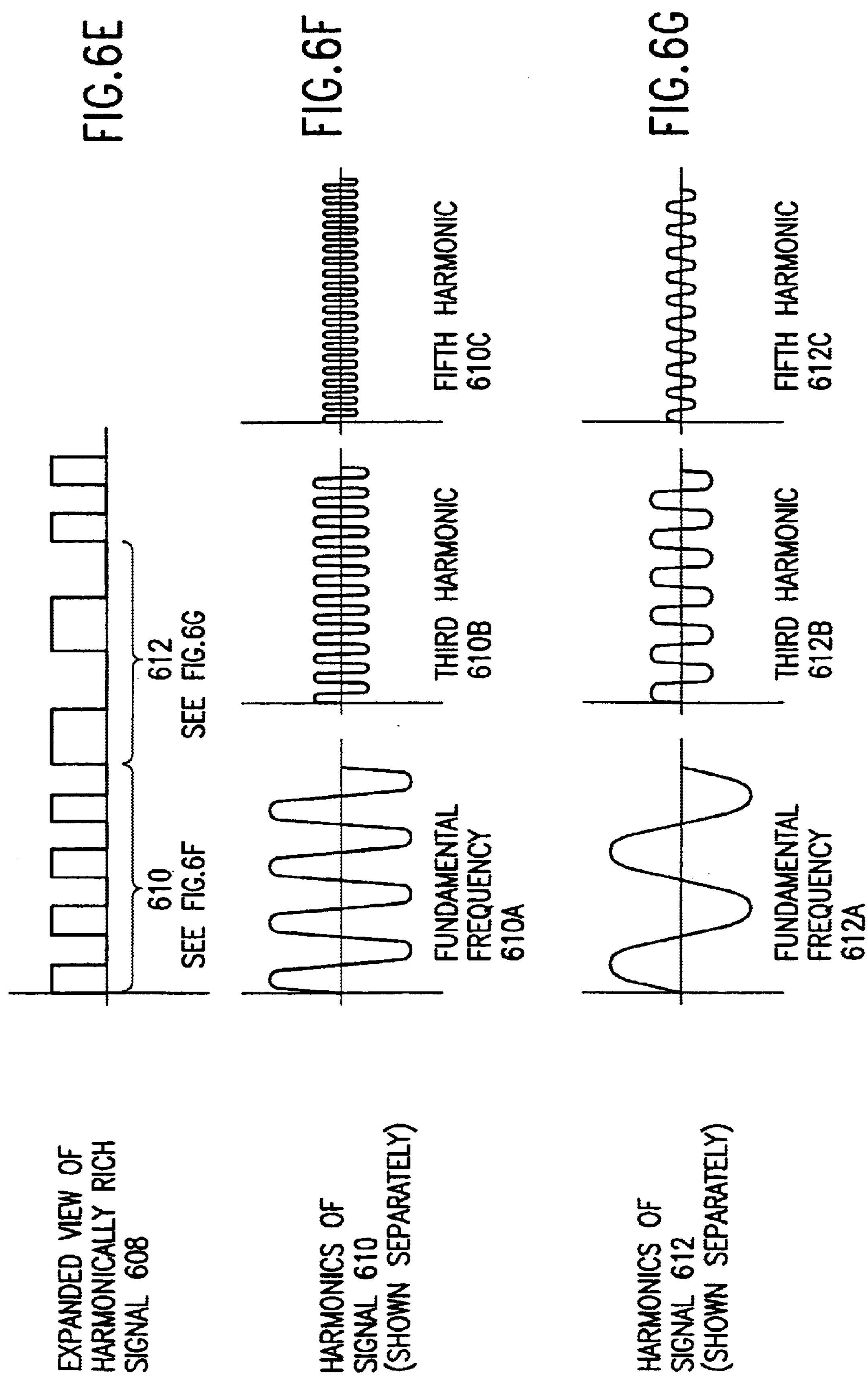

FIG. 6E is an expanded view of two sections of harmonically rich signal 608, section 610 and section 612. The harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 6H:
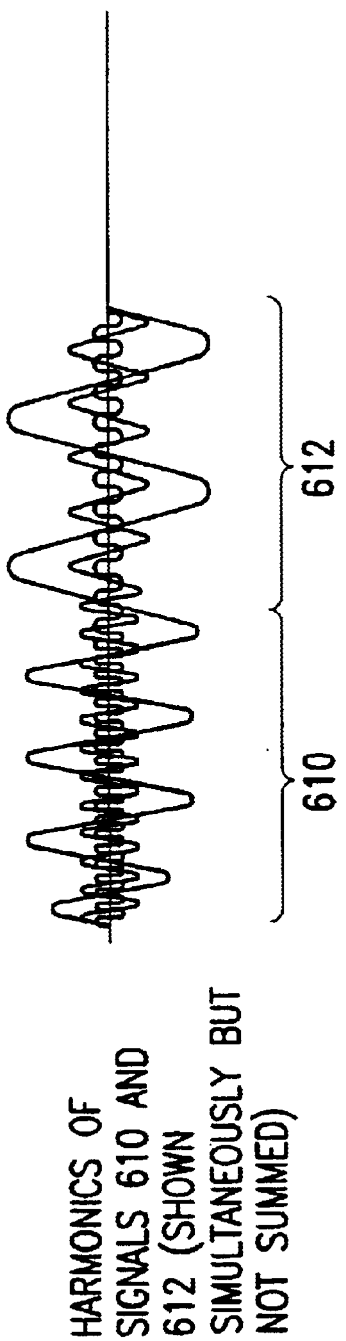

Harmonically rich signal 608 is comprised of a plurality of sinusoidal waves whose frequencies are integer multiples of the fundamental frequency of the waveform of the harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, the input signal 606 may be shaped to ensure that the amplitude of the desired harmonic is sufficient for its intended use (e.g., transmission).

Figure 6I:
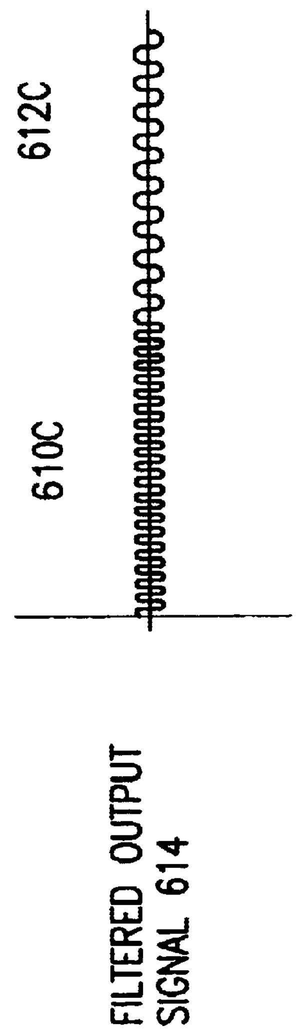

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
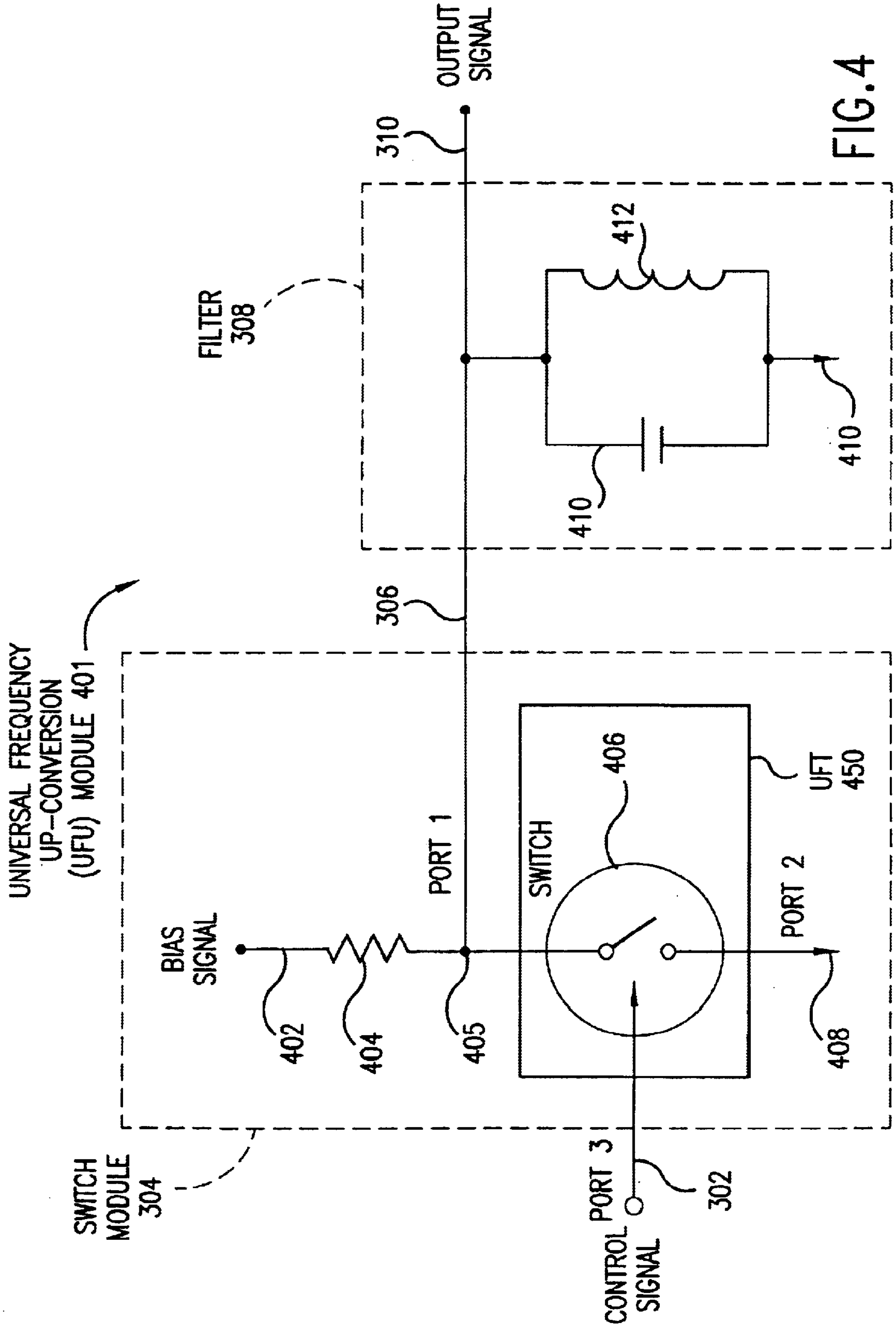
FIG. 4 is a more detailed diagram of a universal frequency up-conversion (UFU) module according to an embodiment of the invention.

FIG. 4 illustrates an example universal frequency up-conversion (UFU) module 401. The UFU module 401 includes an example switch module 304, which comprises a bias signal 402, a resistor or impedance 404, a universal frequency translator (UFT) 450, and a ground 408. The UFT 450 includes a switch 406. The input signal 302 (designated as "Control Signal" in FIG. 4) controls the switch 406 in the UFT 450, and causes it to close and open. Harmonically rich signal 306 is generated at a node 405 located between the resistor or impedance 404 and the switch 406.

Also in FIG. 4, it can be seen that an example filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
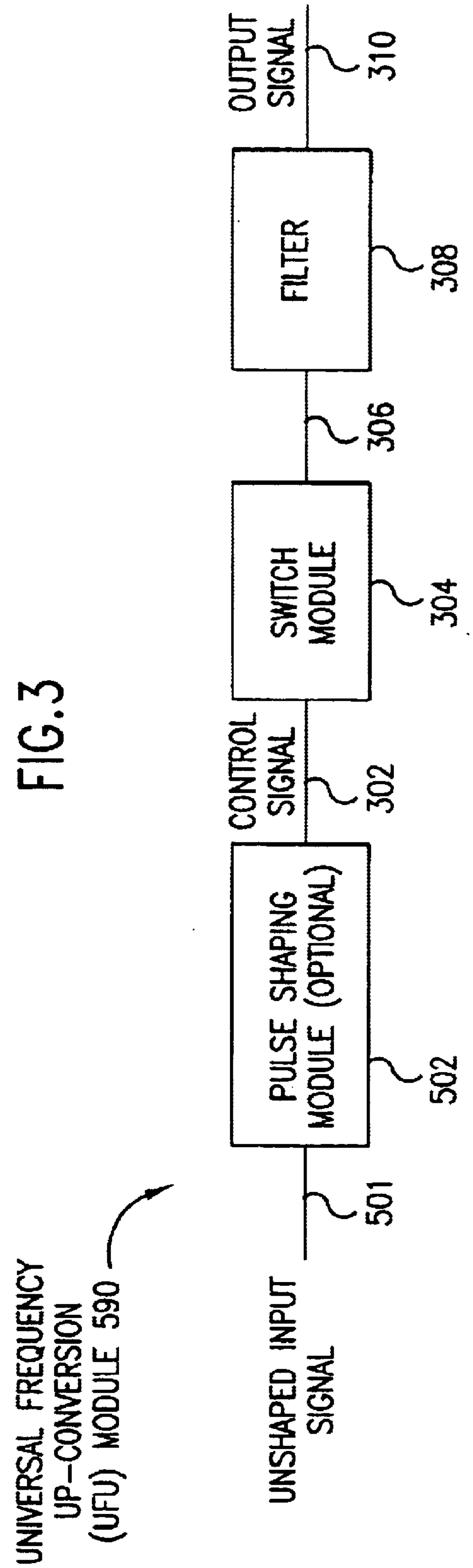
FIG. 5 is a block diagram of a universal frequency up-conversion (UFU) module according to an alternative embodiment of the invention.

For example, in an alternate embodiment shown in FIG. 5, an unshaped input signal 501 is routed to a pulse shaping module 502. The pulse shaping module 502 modifies the unshaped input signal 501 to generate a (modified) input signal 302 (designated as the "Control Signal" in FIG. 5). The input signal 302 is routed to the switch module 304, which operates in the manner described above. Also, the filter 308 of FIG. 5 operates in the manner described above.

The purpose of the pulse shaping module 502 is to define the pulse width of the input signal 302. Recall that the input signal 302 controls the opening and closing of the switch 406 in switch module 304. During such operation, the pulse width of the input signal 302 establishes the pulse width of the harmonically rich signal 306. As stated above, the relative amplitudes of the harmonics of the harmonically rich signal 306 are a function of at least the pulse width of the harmonically rich signal 306. As such, the pulse width of the input signal 302 contributes to setting the relative amplitudes of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

4. Enhanced Signal Reception

The present invention is directed to systems and methods of enhanced signal reception (ESR), and applications of same.

Figure 21:
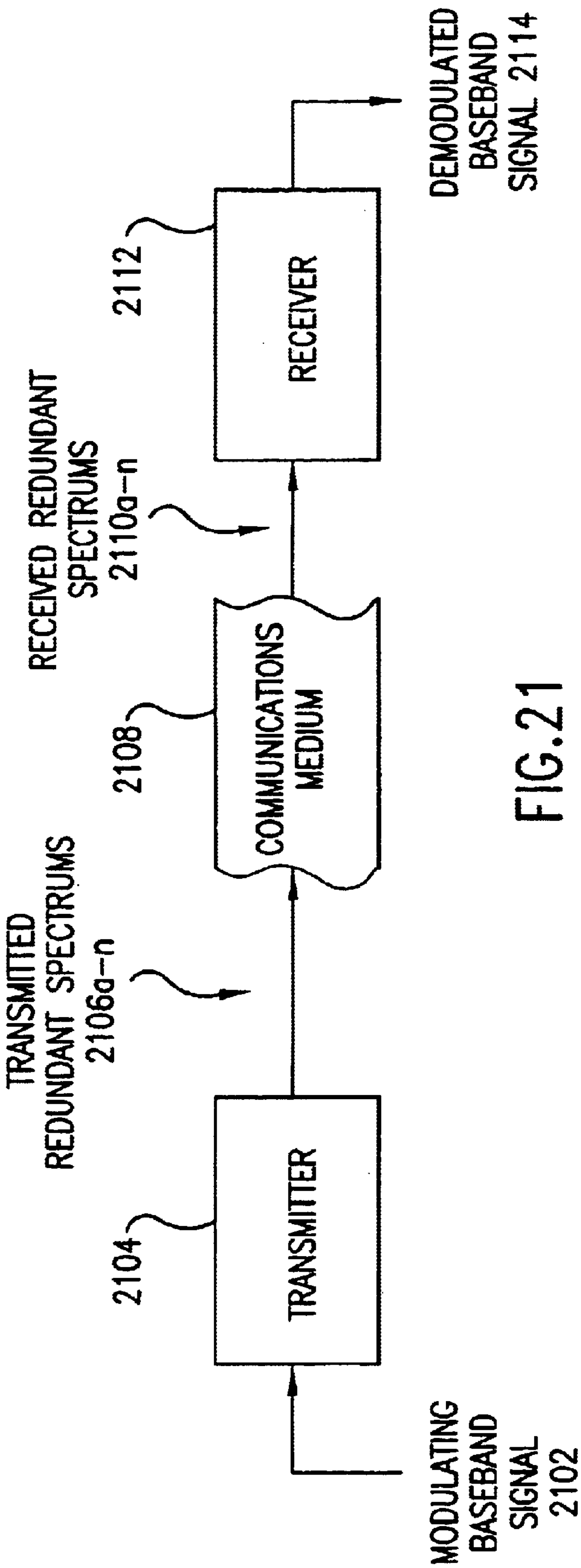
FIG. 21 illustrates an enhanced signal reception system according to an embodiment of the invention.

Referring to FIG. 21, transmitter 2104 accepts a modulating baseband signal 2102 and generates (transmitted)

redundant spectrums 2106_a–n,_ which are sent over communications medium 2108. Receiver 2112 recovers a demodulated baseband signal 2114 from (received) redundant spectrums 2110_a–n_. Demodulated baseband signal 2114 is representative of the modulating baseband signal 2102, where the level of similarity between the modulating baseband signal 2114 and the modulating baseband signal 2102 is application dependent.

Figures 22A, 22B, 22C, 22D:
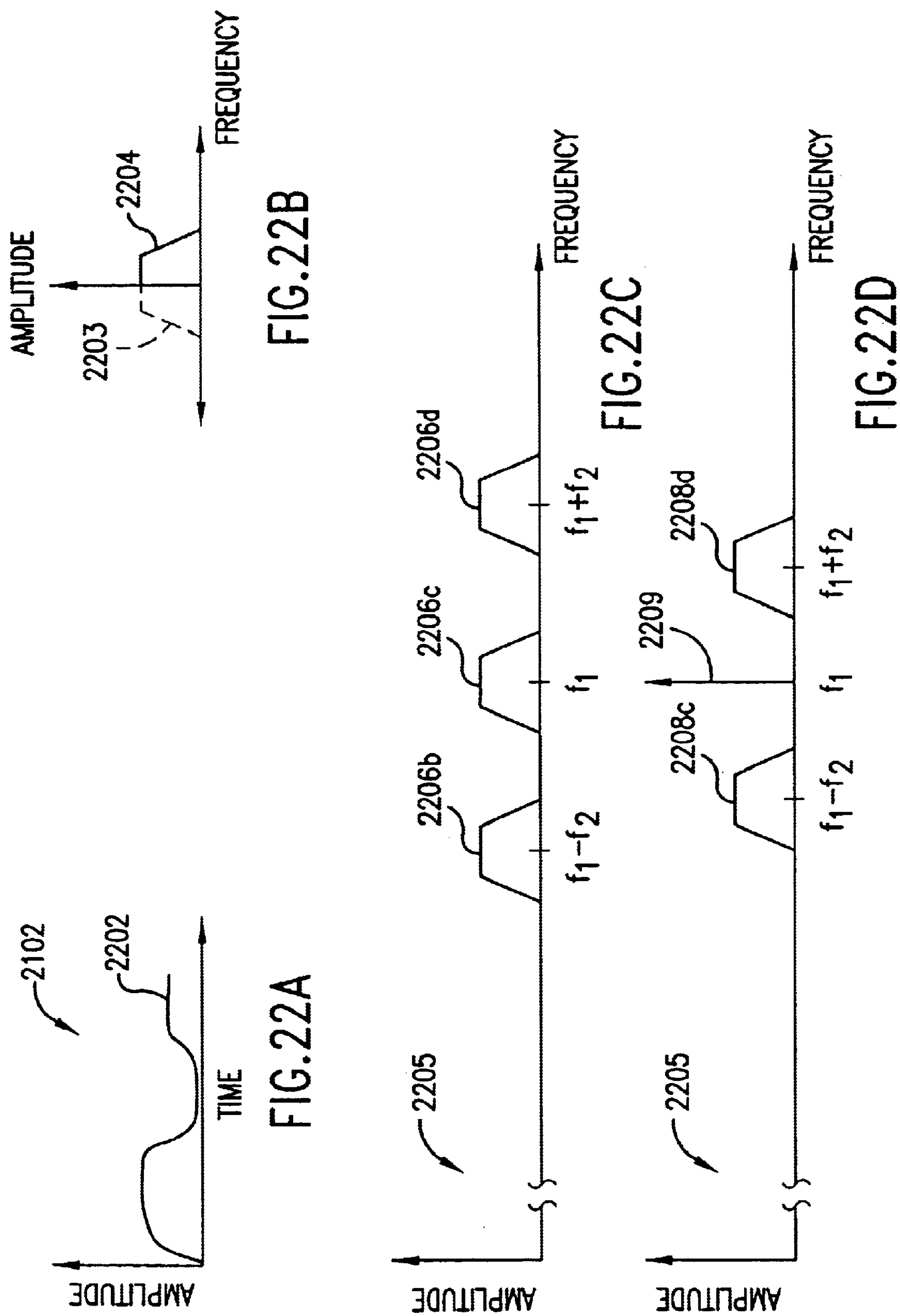
FIGS. 22A–22F are example waveforms used to describe the system of FIG. 21.

Modulating baseband signal 2102 is preferably any information signal desired for transmission and/or reception. An example modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22_a_, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106_a–n_ contains the necessary information to substantially reconstruct the modulating baseband signal 2102. In other words, each redundant spectrum 2106_a–n_ contains the necessary amplitude, phase, and frequency information to reconstruct the modulating baseband signal 2102.

FIG. 22C illustrates example transmitted redundant spectrums 2206_b–d_. Transmitted redundant spectrums 2206_b–d_ are illustrated to contain three redundant spectrums for illustration purposes only. Any number of redundant spectrums could be generated and transmitted as will be explained in following discussions.

Transmitted redundant spectrums 2206_b–d_ are centered at $f_1$, with a frequency spacing $f_2$ between adjacent spectrums. Frequencies $f_1$ and $f_2$ are dynamically adjustable in real-time as will be shown below. FIG. 22D illustrates an alternate embodiment, where redundant spectrums 2208_c,d_ are centered on unmodulated oscillating signal 2209 at $f_1$ (Hz). Oscillating signal 2209 may be suppressed if desired using, for example, phasing techniques or filtering techniques. Transmitted redundant spectrums are preferably above baseband frequencies as is represented by break 2205 in the frequency axis of FIGS. 22C and 22D.

Figure 22E:
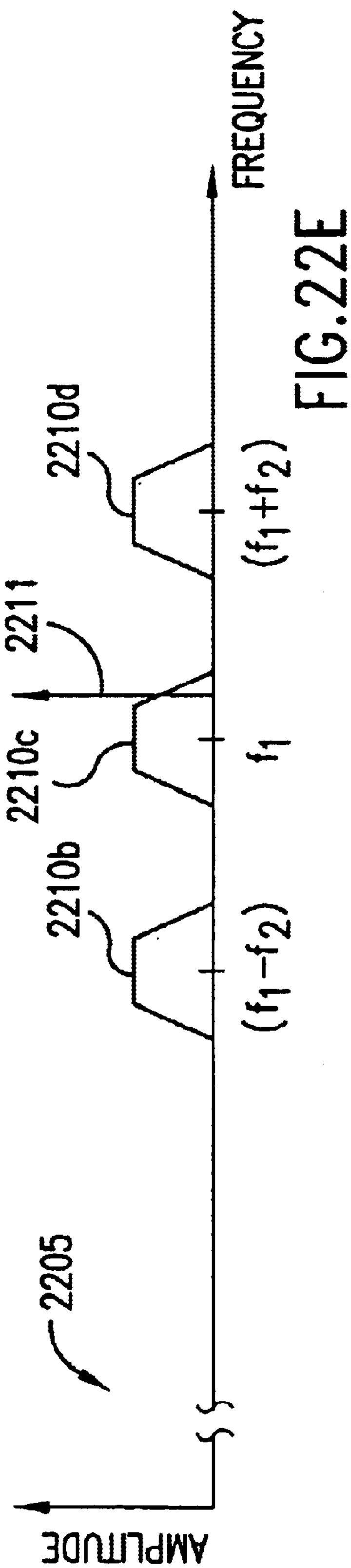

Received redundant spectrums 2110_a–n_ are substantially similar to transmitted redundant spectrums 2106_a–n,_ except for the changes introduced by the communications medium 2108. Such changes can include but are not limited to signal attenuation, and signal interference. FIG. 22E illustrates example received redundant spectrums 2210_b–d_. Received redundant spectrums 2210_b–d_ are substantially similar to transmitted redundant spectrums 2206_b–d,_ except that redundant spectrum 2210_c_ includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

Figure 22F:
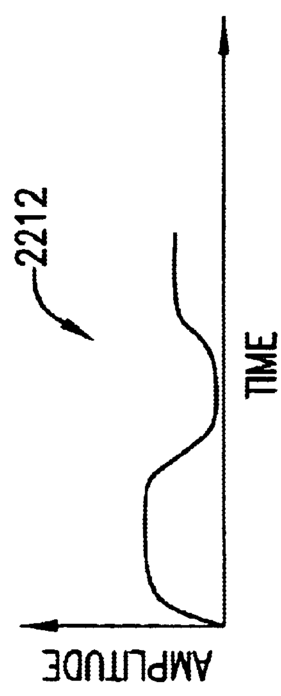

As stated above, demodulated baseband signal 2114 is extracted from one or more of received redundant spectrums 2210_b–d_. FIG. 22F illustrates example demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

Figure 23A:
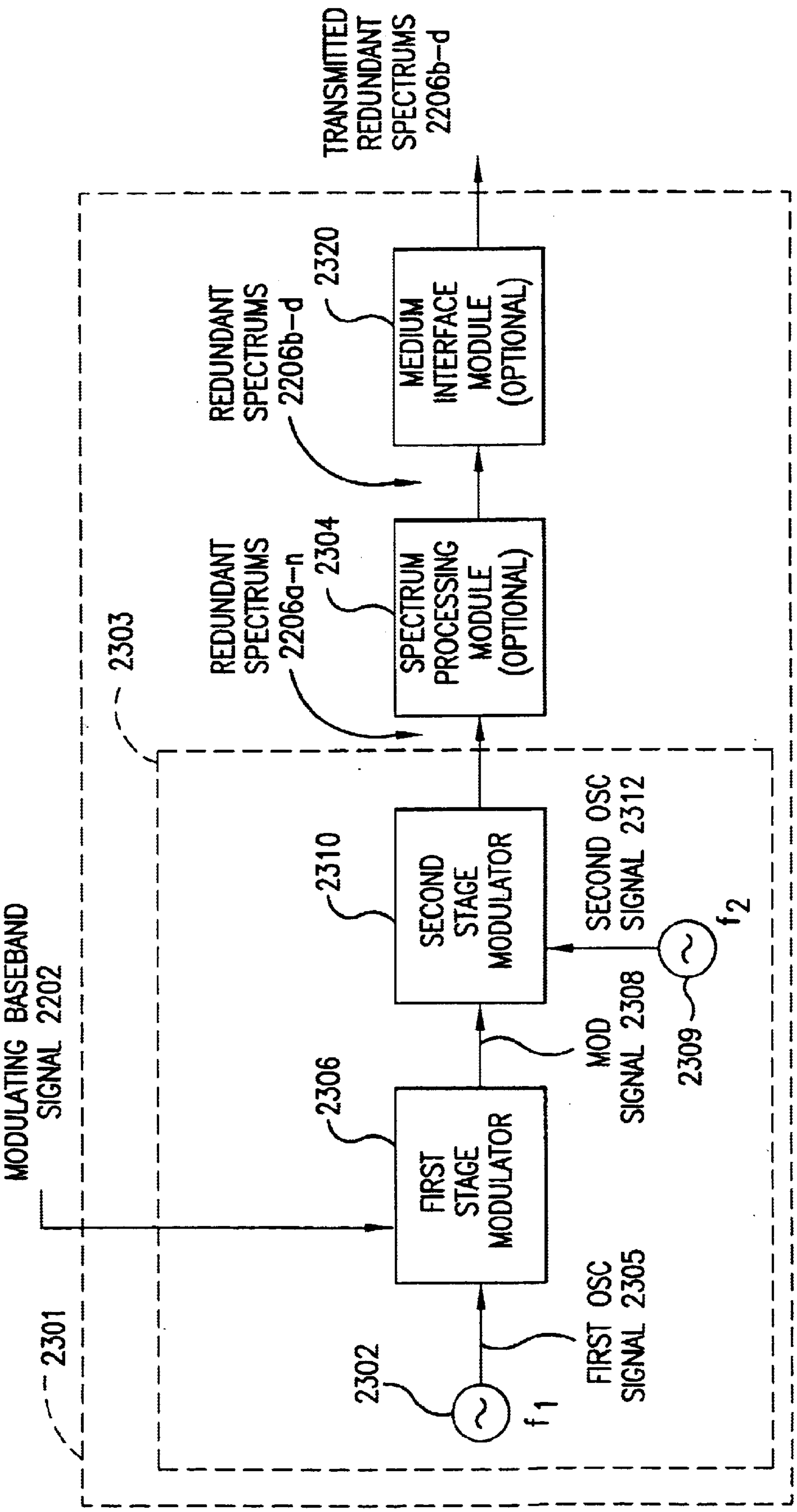
FIG. 23A illustrates an example transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectrums configured similar to redundant spectrums 2206_b–d_. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Figure 23B:
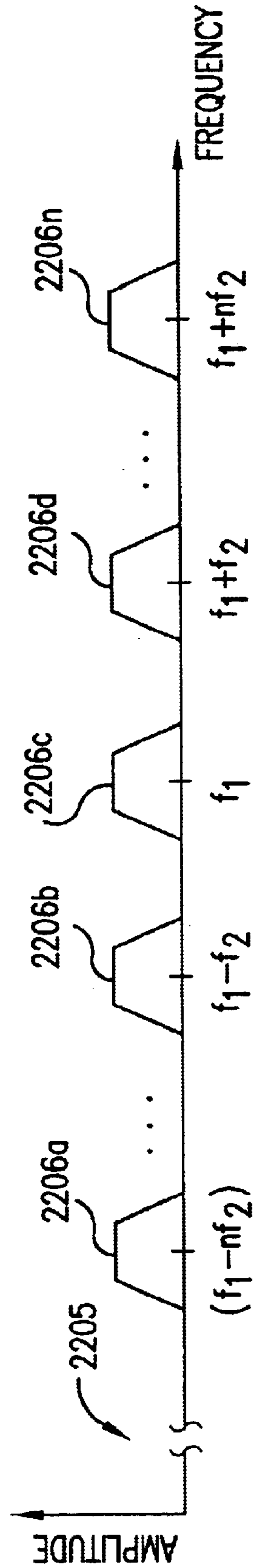
FIGS. 23B and 23C are example waveforms used to further describe the enhanced signal reception system according to an embodiment of the invention.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectrums 2206_a–n_ shown in FIG. 23B. Second stage modulator 2310 is preferably a phase modulator, or a frequency modulator, although other types of modulation may be implemented including but not limited to amplitude modulation. Each redundant spectrum 2206_a–n_ contains the necessary amplitude, phase, and frequency information to substantially reconstruct the modulating baseband signal 2202.

Redundant spectrums 2206_a–n_ are substantially centered around $f_1$, which is the characteristic frequency of first oscillating signal 2305. Also, each redundant spectrum 2206_a–n_ (except for 2206_c_) is offset from $f_1$ by approximately a multiple of $f_2$ (Hz), where $f_2$ is the frequency of the second oscillating signal 2312. Thus, each redundant spectrum 2206_a–n_ is offset from an adjacent redundant spectrum by $f_2$ (Hz). This allows the spacing between adjacent redundant spectrums to be adjusted (or tuned) by changing $f_2$ that is associated with second oscillator 2309. Adjusting the spacing between adjacent redundant spectrums allows for dynamic real-time tuning of the bandwidth occupied by redundant spectrums 2206_a–n_.

In one embodiment, the number of redundant spectrums 2206_a–n_ generated by transmitter 2301 is arbitrary and may be unlimited as indicated by the "a–n" designation for redundant spectrums 2206_a–n_. However, a typical communications medium will have a physical and/or administrative limitations (i.e. FCC regulations) that restrict the number of redundant spectrums that can be practically transmitted over the communications medium. Also, there may be other reasons to limit the number of redundant spectrums transmitted. Therefore, preferably, the transmitter 2301 will include an optional spectrum processing module 2304 to process the redundant spectrums 2206_a–n_ prior to transmission over communications medium 2108.

Figure 23C:
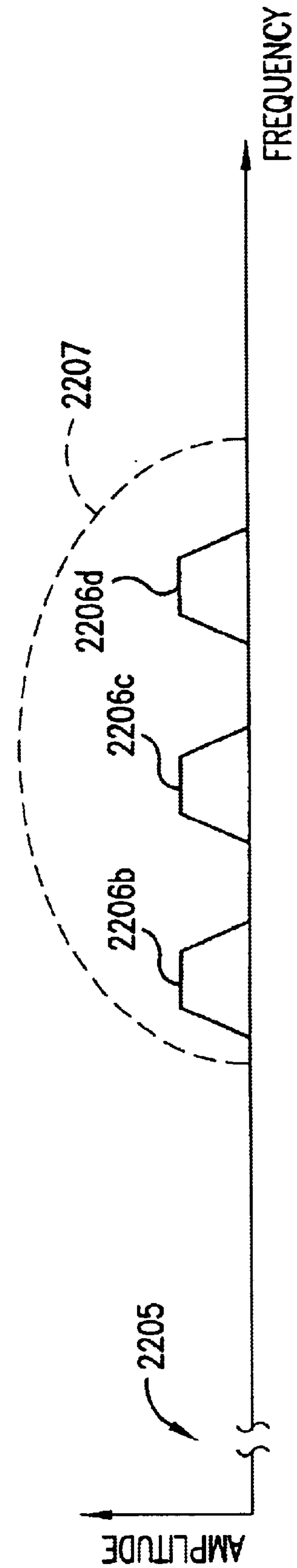

In one embodiment, spectrum processing module 2304 includes a filter with a passband 2207 (FIG. 23C) to select redundant spectrums 2206_b–d_ for transmission. This will substantially limit the frequency bandwidth occupied by the redundant spectrums to the passband 2207. In one embodiment, spectrum processing module 2304 also up converts redundant spectrums and/or amplifies redundant spectrums prior to transmission over the communications medium 2108. Finally, medium interface module 2320 transmits redundant spectrums over the communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
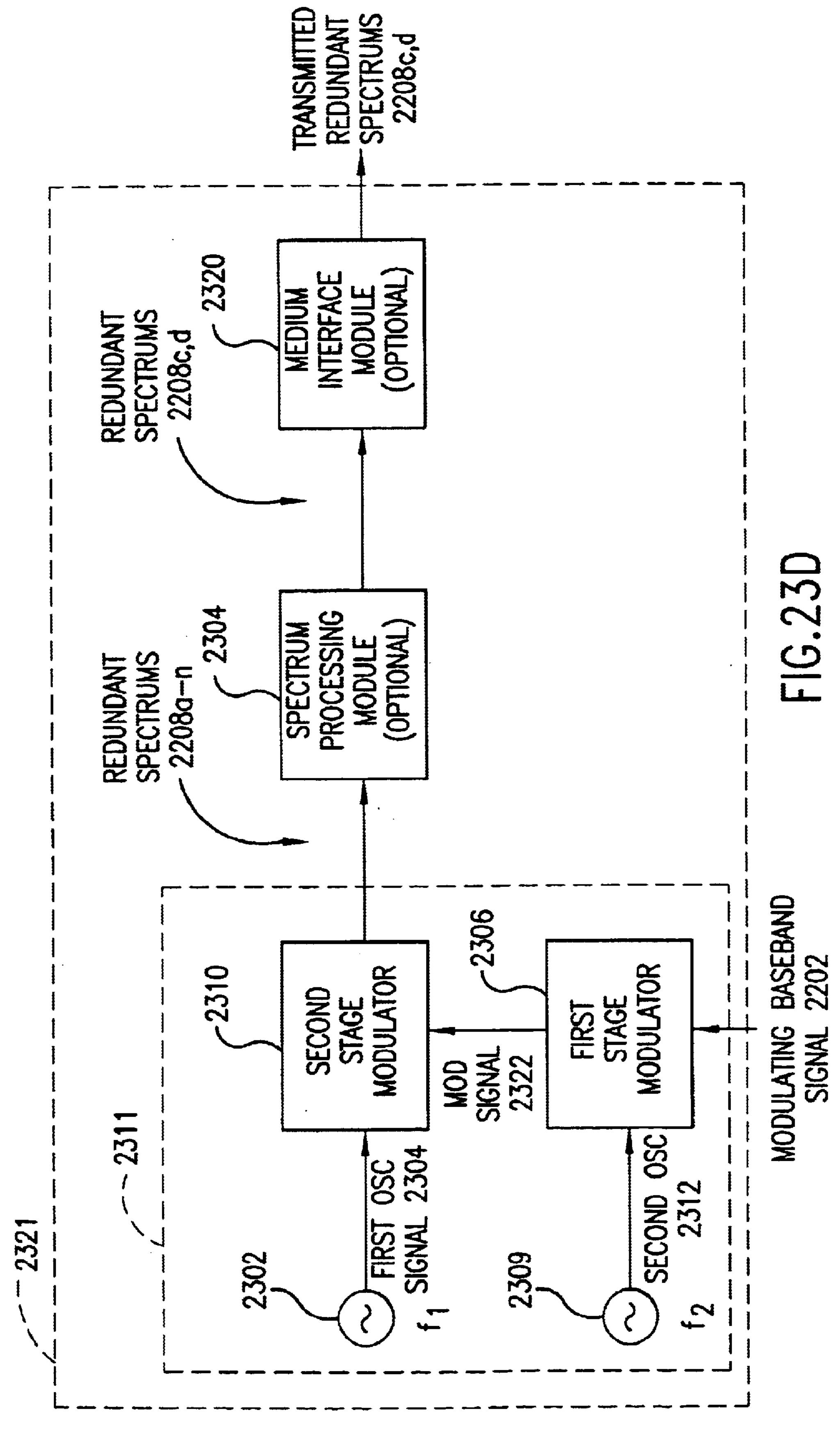
FIG. 23D illustrates another example transmitter in an enhanced signal reception system according to an embodiment of the invention.

FIG. 23D illustrates transmitter 2321, which is one embodiment of transmitter 2104 that generates redundant spectrums configured similar to redundant spectrums 2208_c–d_ and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

Figure 23E:
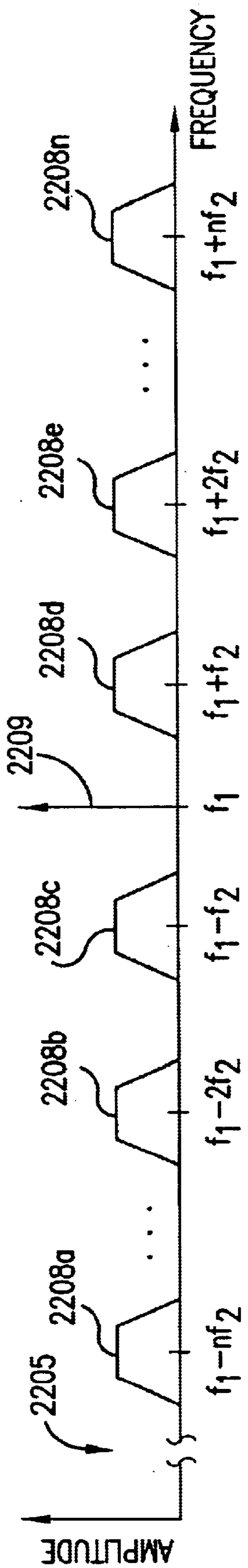
FIGS. 23E and 23F are example waveforms used to further describe the enhanced signal reception system according to an embodiment of the invention.
Figure 23F:
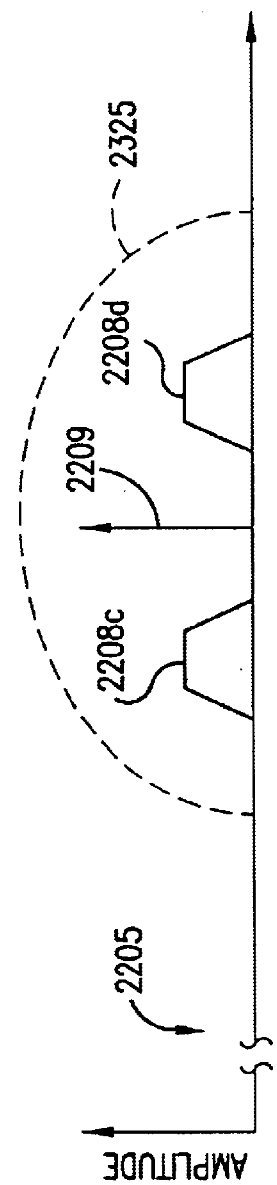

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectrums 2208_a–n,_ as shown in FIG. 23E. Second stage modulator 2310 is preferably a phase or frequency modulator, although other modulators could used including but not limited to an amplitude modulator.

Redundant spectrums 2208_a–n_ are centered on unmodulated spectrum 2209 (at $f_1$ Hz), and adjacent spectrums are separated by $f_2$ Hz. The number of redundant spectrums 2208_a–n_ generated by generator 2311 is arbitrary and unlimited, similar to spectrums 2206_a–n_ discussed above. Therefore, optional spectrum processing module 2304 may also include a filter with passband 2325 to select, for example, spectrums 2208_c,d_ for transmission over communications medium 2108. In addition, optional spectrum processing module 2304 may also include a filter (such as a bandstop filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectrums 2208_c,d_ over communications medium 2108.

Figure 24A:
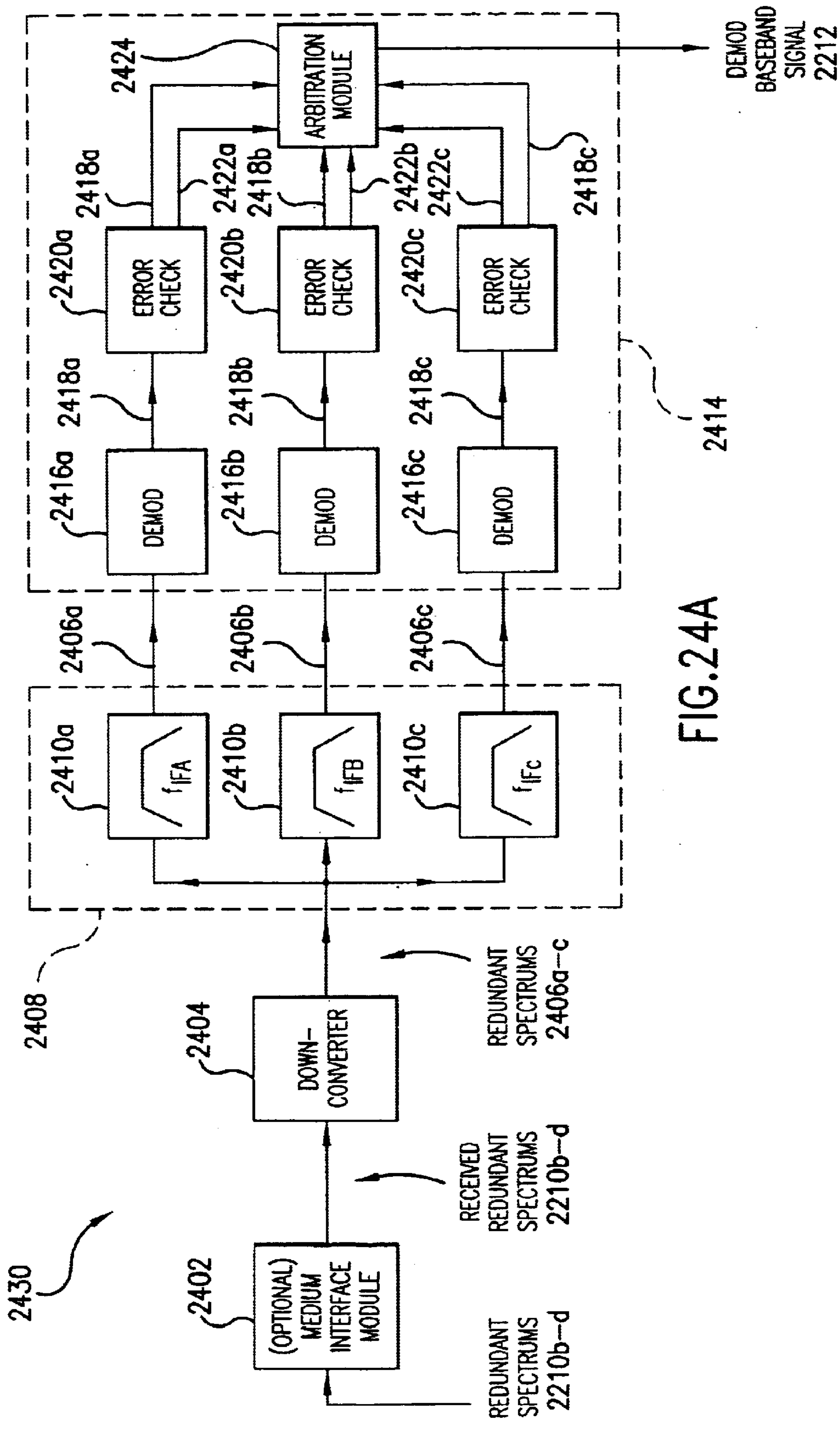
FIG. 24A illustrates an example receiver in an enhanced signal reception system according to an embodiment of the invention.

Receiver 2112 will now be explored in greater detail to illustrate recovery of a demodulated baseband signal from received redundant spectrums. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410_a–c_. Data extraction module 2414 includes demodulators 2416_a–c,_ error check modules 2420_a–c,_ and arbitration module 2424. Receiver 2430 will be discussed in relation to the signal diagrams in FIGS. 24B–24J.

Figure 24B:
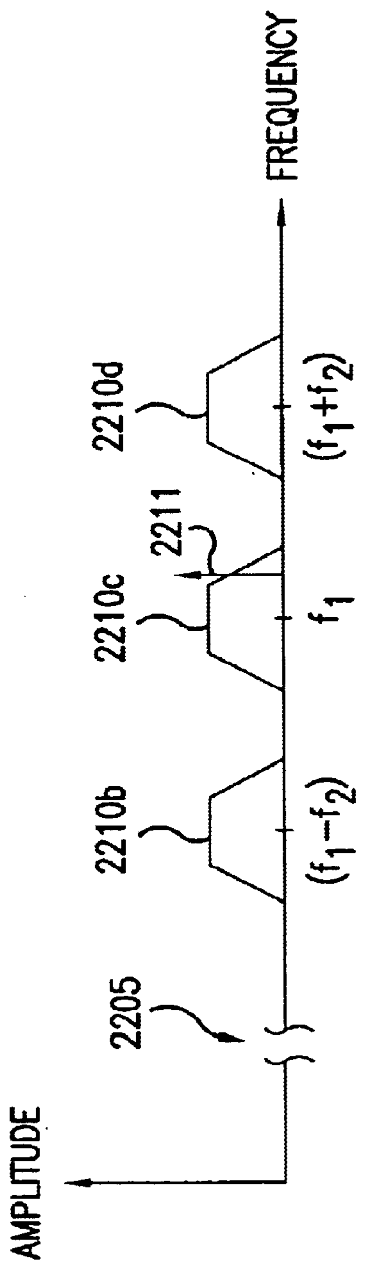
FIGS. 24B–24J are example waveforms used to further describe the enhanced signal reception system according to an embodiment of the invention.
Figure 24C:
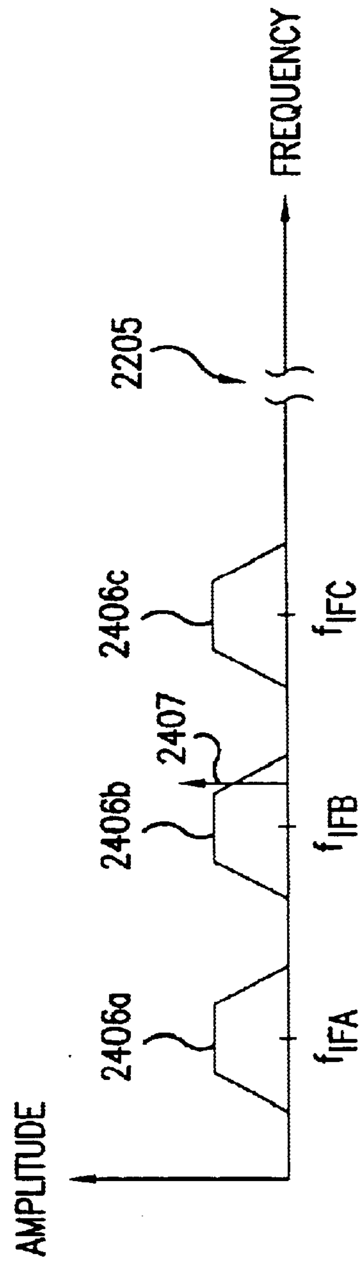
Figure 24D:
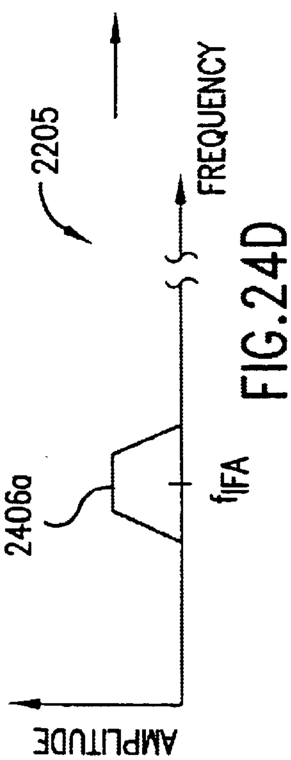
Figure 24E:
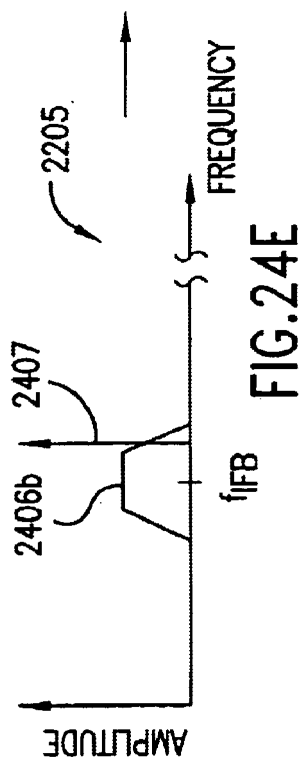
Figure 24F:
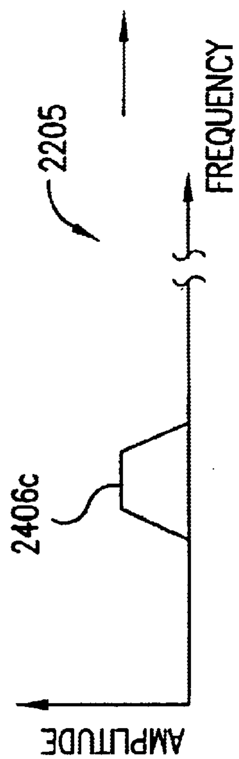
Figure 24G:
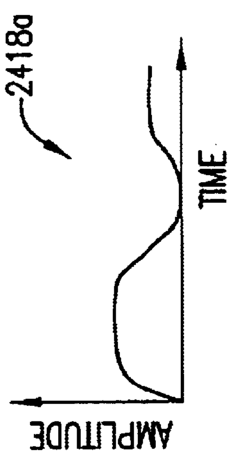

In one embodiment, optional medium interface module 2402 receives redundant spectrums 2210_b–d_ (FIG. 22E, and FIG. 24B). Each redundant spectrum 2210_b–d_ includes the necessary amplitude, phase, and frequency information to substantially reconstruct the modulating baseband signal used to generated the redundant spectrums. However, in the present example, spectrum 2210_c_ also contains jamming signal 2211, which may interfere with the recovery of a baseband signal from spectrum 2210_c_. Down-converter 2404 down-converts received redundant spectrums 2210_b–d_ to lower intermediate frequencies, resulting in redundant spectrums 2406_a–c_ (FIG. 24C). Jamming signal 2211 is also down-converted to jamming signal 2407, as it is contained within redundant spectrum 2406_b_. Spectrum isolation module 2408 includes filters 2410_a–c_ that isolate redundant spectrums 2406_a–c_ from each other (FIGS. 24D–24F, respectively). Demodulators 2416_a–c_ independently demodulate spectrums 2406_a–c,_ resulting in demodulated baseband signals 2418_a–c,_ respectively (FIGS. 24G–241). Error check modules 2420_a–c_ analyze demodulate baseband signal 2418_a–c_ to detect any errors. In one embodiment, each error check module 2420_a–c_ sets an error flag 2422_a–c_ whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectrums, where the degree of similarity is application dependent.

Figure 24H:
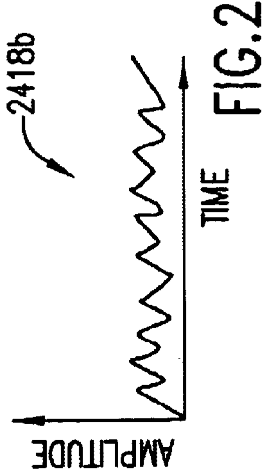
Figure 24I:
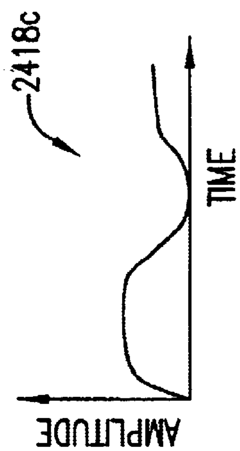
Figure 24J:
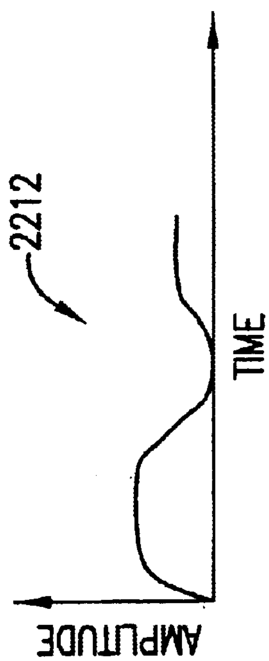

Referring to FIGS. 24G–I, arbitration module 2424 will select either demodulated baseband signal 2418_a_ or 2418_c,_ because error check module 2420_b_ will set the error flag 2422_b_ that is associated with demodulated baseband signal 2418_b_.

The error detection schemes implemented by the error detection modules include but are not limited to: cyclic redundancy check (CRC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, issued as U.S. Pat. No. 6,061,555 on May 9, 2000.

5. Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
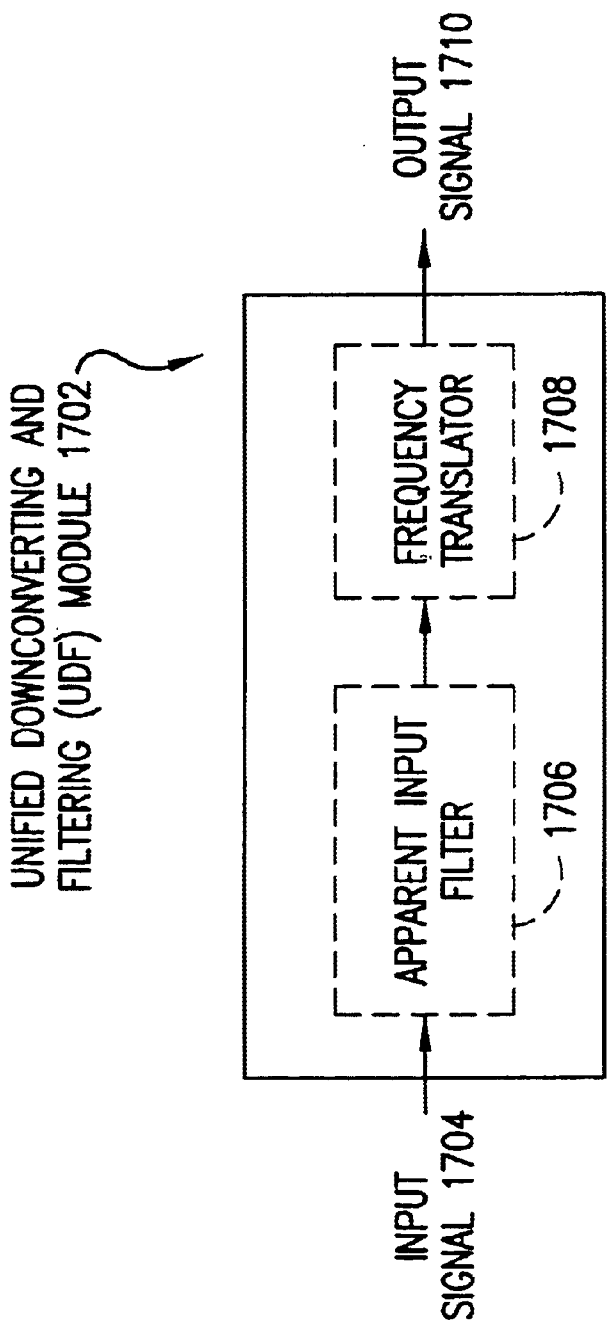
FIG. 17 illustrates a unified down-converting and filtering (UDF) module according to an embodiment of the invention.

FIG. 17 is a conceptual block diagram of a UDF module 1702 according to an embodiment of the present invention. The UDF module 1702 performs at least frequency translation and frequency selectivity.

The effect achieved by the UDF module 1702 is to perform the frequency selectivity operation prior to the performance of the frequency translation operation. Thus, the UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by the UDF module 1702 are at radio frequencies. The UDF module 1702 effectively operates to input filter these RF input signals 1704. Specifically, in these embodiments, the UDF module 1702 effectively performs input, channel select filtering of the RF input signal 1704. Accordingly, the invention achieves high selectivity at high frequencies.

The UDF module 1702 effectively performs various types of filtering, including but not limited to bandpass filtering, low pass filtering, high pass filtering, notch filtering, all pass filtering, band stop filtering, etc., and combinations thereof.

Conceptually, the UDF module 1702 includes a frequency translator 1708. The frequency translator 1708 conceptually represents that portion of the UDF module 1702 that performs frequency translation (down conversion).

The UDF module 1702 also conceptually includes an apparent input filter 1706 (also sometimes called an input filtering emulator). Conceptually, the apparent input filter 1706 represents that portion of the UDF module 1702 that performs input filtering.

In practice, the input filtering operation performed by the UDF module 1702 is integrated with the frequency translation operation. The input filtering operation can be viewed as being performed concurrently with the frequency translation operation. This is a reason why the input filter 1706 is herein referred to as an "apparent" input filter 1706.

The UDF module 1702 of the present invention includes a number of advantages. For example, high selectivity at high frequencies is realizable using the UDF module 1702. This feature of the invention is evident by the high Q factors that are attainable. For example, and without limitation, the UDF module 1702 can be designed with a filter center frequency $f_c$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_c$ of the UDF module 1702 can be electrically adjusted, either statically or dynamically.

Also, the UDF module 1702 can be designed to amplify input signals.

Further, the UDF module 1702 can be implemented without large resistors, capacitors, or inductors. Also, the UDF module 1702 does not require that tight tolerances be maintained on the values of its individual components, i.e., its resistors, capacitors, inductors, etc. As a result, the architecture of the UDF module 1702 is friendly to integrated circuit design techniques and processes.

The features and advantages exhibited by the UDF module 1702 are achieved at least in part by adopting a new technological paradigm with respect to frequency selectivity and translation. Specifically, according to the present invention, the UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
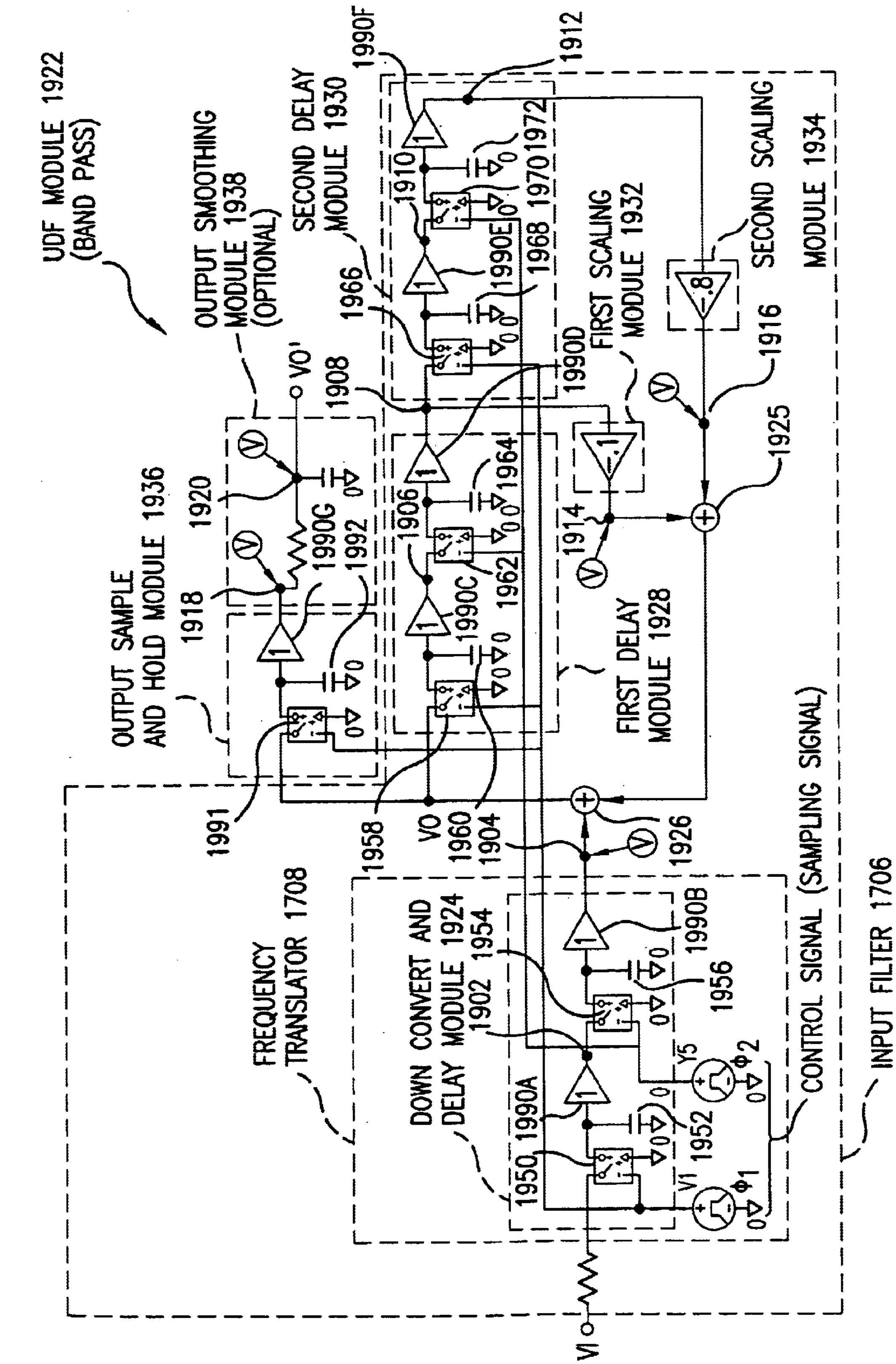
FIG. 19 is a detailed diagram of an example UDF module according to an embodiment of the invention.

FIG. 19 illustrates an example implementation of the unified down-converting and filtering (UDF) module 1922. The UDF module 1922 performs the frequency translation operation and the frequency selectivity operation in an integrated, unified manner as described above, and as further described below.

In the example of FIG. 19, the frequency selectivity operation performed by the UDF module 1922 comprises a band-pass filtering operation according to EQ. 1, below, which is an example representation of a band-pass filtering transfer function.

$$VO=\alpha_1 z^{-1}VI-\beta_1 z^{-1}VO-\beta_0 z^{-2}VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

The UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, the output smoothing module 1938 is optional.

As further described below, in the example of FIG. 19, the down-convert and delay module 1924 and the first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of the down-convert and delay module 1924 is not scaled. As evident from the embodiments described above, however, the invention is not limited to this example.

The example UDF module 1922 has a filter center frequency of 900.2 MHZ and a filter bandwidth of 570 KHz. The pass band of the UDF module 1922 is on the order of 899.915 MHZ to 900.485 MHZ. The Q factor of the UDF module 1922 is approximately 1879 (i.e., 900.2 MHZ divided by 570 KHz).

The operation of the UDF module 1922 shall now be described with reference to a Table 1802 (FIG. 18) that indicates example values at nodes in the UDF module 1922 at a number of consecutive time increments. It is assumed in Table 1802 that the UDF module 1922 begins operating at time t−1. As indicated below, the UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in the down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of the switch 1950 and the capacitor 1952 in the down-convert and delay module 1924 operates to translate the frequency of the input signal VI to a desired lower frequency, such as IF or baseband. Thus, the value stored in the capacitor 1952 represents an instance of a down-converted image of the input signal VI.

The manner in which the down-convert and delay module 1924 performs frequency down-conversion is further described elsewhere in this application, and is additionally described in pending U.S. application "Method and System for Down-Converting Electromagnetic Signals," Ser. No. 09/176,022, filed Oct. 21, 1998, issued as U.S. Pat. No. 6,061,551 on May 9, 2000, which is herein incorporated by reference in its entirety.

Also at the rising edge of $\phi_1$ at time t−1, a switch 1958 in the first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 1966 in the second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_2$ at time t−1, a switch 1954 in the down-convert and delay module 1924 closes, allowing a capacitor 1956 to charge to the level of the capacitor 1952. Accordingly, the capacitor 1956 charges to $VI_{t-1}$, such that node 1904 is at $VI_{t-1}$. This is indicated by cell 1810 in Table 1802.

The UDF module 1922 may optionally include a unity gain module 1990A between capacitors 1952 and 1956. The unity gain module 1990A operates as a current source to enable capacitor 1956 to charge without draining the charge from capacitor 1952. For a similar reason, the UDF module 1922 may include other unity gain modules 1990B–1990G. It should be understood that, for many embodiments and applications of the invention, these unity gain modules 1990A–1990G are optional. The structure and operation of the unity gain modules 1990 will be apparent to persons skilled in the relevant art(s).

Also at the rising edge of $\phi_2$ at time t−1, a switch 1962 in the first delay module 1928 closes, allowing a capacitor 1964 to charge to the level of the capacitor 1960. Accordingly, the capacitor 1964 charges to $VO_{t-1}$, such that node 1908 is at $VO_{t-1}$. This is indicated by cell 1814 in Table 1802.

Also at the rising edge of $\phi_2$ at time t−1, a switch 1970 in the second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, the switch 1950 in the down-convert and delay module 1924 closes. This allows the capacitor 1952 to charge to $VI_t$, such that node 1902 is at $VI_t$. This is indicated in cell 1816 of Table 1802.

Also at the rising edge of $\phi_1$ at time t, the switch 1958 in the first delay module 1928 closes, thereby allowing the capacitor 1960 to charge to $VO_t$. Accordingly, node 1906 is at $VO_t$. This is indicated in cell 1820 in Table 1802.

Further at the rising edge of $\phi_1$ at time t, the switch 1966 in the second delay module 1930 closes, allowing a capacitor 1968 to charge to the level of the capacitor 1964. Therefore, the capacitor 1968 charges to $VO_{t-1}$, such that node 1910 is at $VO_{t-1}$. This is indicated by cell 1824 in Table 1802.

At the rising edge of $\phi_2$ at time t, the switch 1954 in the down-convert and delay module 1924 closes, allowing the capacitor 1956 to charge to the level of the capacitor 1952. Accordingly, the capacitor 1956 charges to $VI_t$, such that node 1904 is at $VI_t$. This is indicated by cell 1828 in Table 1802.

Also at the rising edge of $\phi_2$ at time t, the switch 1962 in the first delay module 1928 closes, allowing the capacitor 1964 to charge to the level in the capacitor 1960. Therefore, the capacitor 1964 charges to $VO_t$, such that node 1908 is at $VO_t$. This is indicated by cell 1832 in Table 1802.

Further at the rising edge of $\phi_2$ at time t, the switch 1970 in the second delay module 1930 closes, allowing the capacitor 1972 in the second delay module 1930 to charge to the level of the capacitor 1968 in the second delay module 1930. Therefore, the capacitor 1972 charges to $VO_{t-1}$, such that node 1912 is at $VO_{t-1}$. This is indicated in cell 1836 of FIG. 18.

At time t+1, at the rising edge of $\phi_1$, the switch 1950 in the down-convert and delay module 1924 closes, allowing the capacitor 1952 to charge to $VI_{t+1}$. Therefore, node 1902 is at $VI_{t+1}$, as indicated by cell 1838 of Table 1802.

Also at the rising edge of $\phi_1$ at time t+1, the switch 1958 in the first delay module 1928 closes, allowing the capacitor 1960 to charge to $VO_{t+1}$. Accordingly, node 1906 is at $VO_{t+1}$, as indicated by cell 1842 in Table 1802.

Further at the rising edge of $\phi_1$ at time t+1, the switch 1966 in the second delay module 1930 closes, allowing the capacitor 1968 to charge to the level of the capacitor 1964. Accordingly, the capacitor 1968 charges to $VO_t$, as indicated by cell 1846 of Table 1802.

In the example of FIG. 19, the first scaling module 1932 scales the value at node 1908 (i.e., the output of the first delay module 1928) by a scaling factor of –0.1. Accordingly, the value present at node 1914 at time t+1 is $-0.1*VO_t$. Similarly, the second scaling module 1934 scales the value present at node 1912 (i.e., the output of the second scaling module 1930) by a scaling factor of –0.8. Accordingly, the value present at node 1916 is $-0.8*VO_{t-1}$ at time t+1.

At time t+1, the values at the inputs of the summer 1926 are: $VI_t$ at node 1904, $-0.1*VO_t$ at node 1914, and $-0.8*VO_{t-1}$ at node 1916 (in the example of FIG. 19, the values at nodes 1914 and 1916 are summed by a second summer 1925, and this sum is presented to the summer 1926). Accordingly, at time t+1, the summer generates a signal equal to $VI_t-0.1*VO_t-0.8*VO_{t-1}$.

At the rising edge of $\phi_1$ at time t+1, a switch 1991 in the output sample and hold module 1936 closes, thereby allowing a capacitor 1992 to charge to $VO_{t+1}$. Accordingly, the capacitor 1992 charges to $VO_{t+1}$, which is equal to the sum generated by the adder 1926. As just noted, this value is equal to: $VI_t-0.1*VO_t-0.8*VO_{t-1}$. This is indicated in cell 1850 of Table 1802. This value is presented to the optional output smoothing module 1938, which smooths the signal to thereby generate the instance of the output signal $VO_{t+1}$. It is apparent from inspection that this value of $VO_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, issued as U.S. Pat. No. 6,049,706 on Apr. 11, 2000, incorporated herein by reference in its entirety.

6. Example Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Example applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these example applications. Additional applications of the UFT module will be apparent to persons skilled in the relevant art(s), based on the teachings contained herein.

Figure 7:
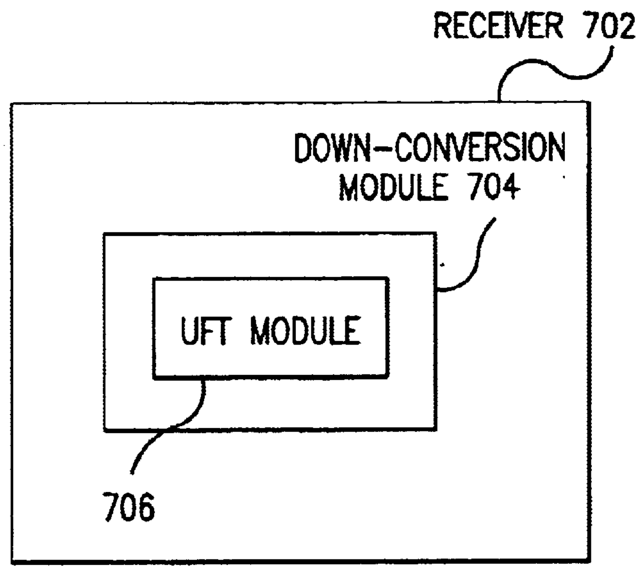
FIG. 7 illustrates a UFT module used in a receiver according to an embodiment of the invention.

For example, the present invention can be used in applications that involve frequency down-conversion. This is shown in FIG. 1C, for example, where an example UFT module 115 is used in a down-conversion module 114. In this capacity, the UFT module 115 frequency down-converts an input signal to an output signal. This is also shown in FIG. 7, for example, where an example UFT module 706 is part of a down-conversion module 704, which is part of a receiver 702.

Figure 8:
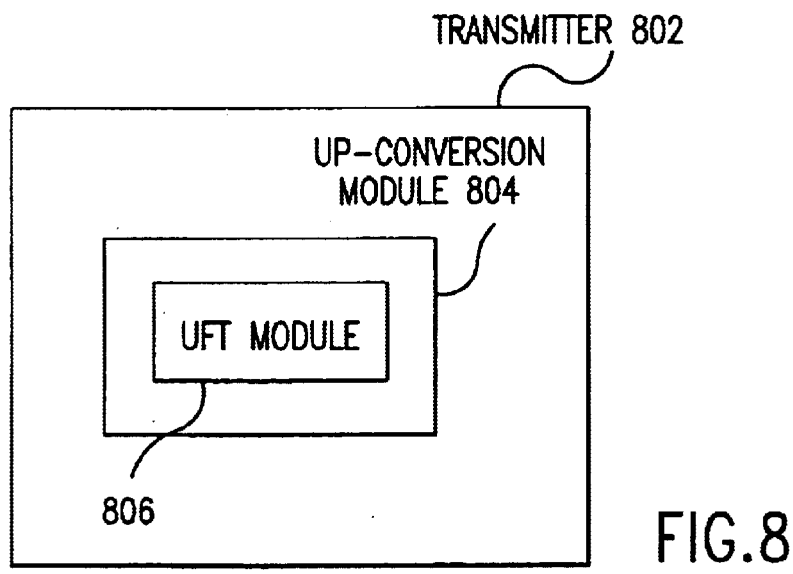
FIG. 8 illustrates a UFT module used in a transmitter according to an embodiment of the invention.

The present invention can be used in applications that involve frequency up-conversion. This is shown in FIG. 1D, for example, where an example UFT module 117 is used in a frequency up-conversion module 116. In this capacity, the UFT module 117 frequency up-converts an input signal to an output signal. This is also shown in FIG. 8, for example, where an example UFT module 806 is part of up-conversion module 804, which is part of a transmitter 802.

Figure 9:
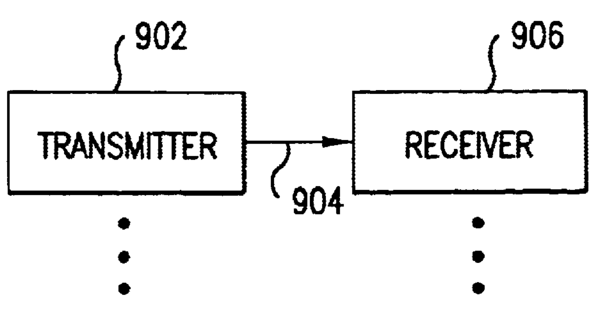
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more of the transmitters 902 may be implemented using a UFT module, as shown for example in FIG. 8. Also, one or more of the receivers 906 may be implemented using a UFT module, as shown for example in FIG. 7.

Figure 10:
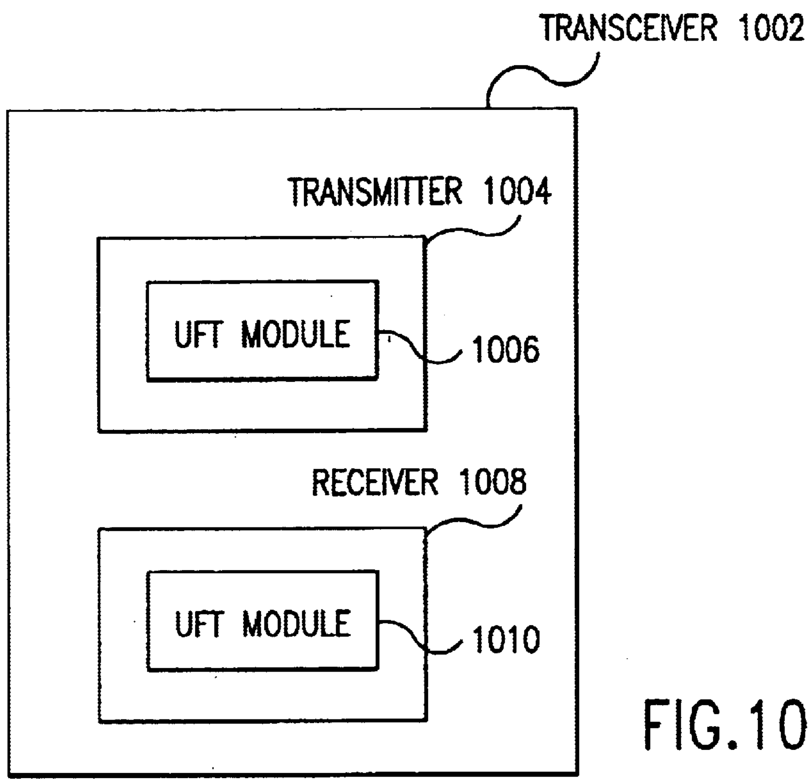
FIG. 10 illustrates a transceiver according to an embodiment of the invention.

The invention can be used to implement a transceiver. An example transceiver 1002 is illustrated in FIG. 10. The transceiver 1002 includes a transmitter 1004 and a receiver 1008. Either the transmitter 1004 or the receiver 1008 can be implemented using a UFT module. Alternatively, the transmitter 1004 can be implemented using a UFT module 1006, and the receiver 1008 can be implemented using a UFT module 1010. This embodiment is shown in FIG. 10.

Figure 11:
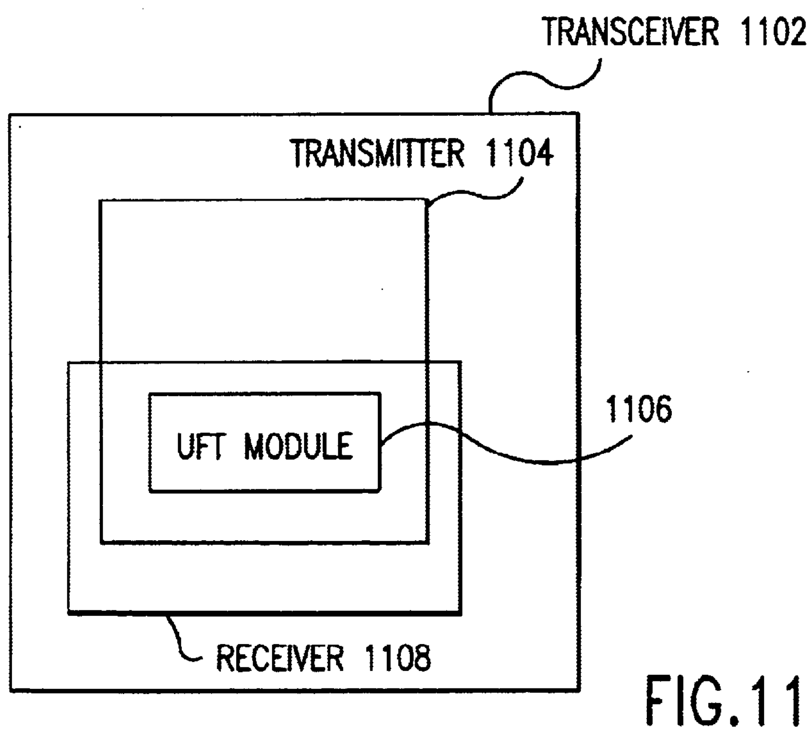
FIG. 11 illustrates a transceiver according to an alternative embodiment of the invention.

Another transceiver embodiment according to the invention is shown in FIG. 11. In this transceiver 1102, the transmitter 1104 and the receiver 1108 are implemented using a single UFT module 1106. In other words, the transmitter 1104 and the receiver 1108 share a UFT module 1106.

Figure 12:
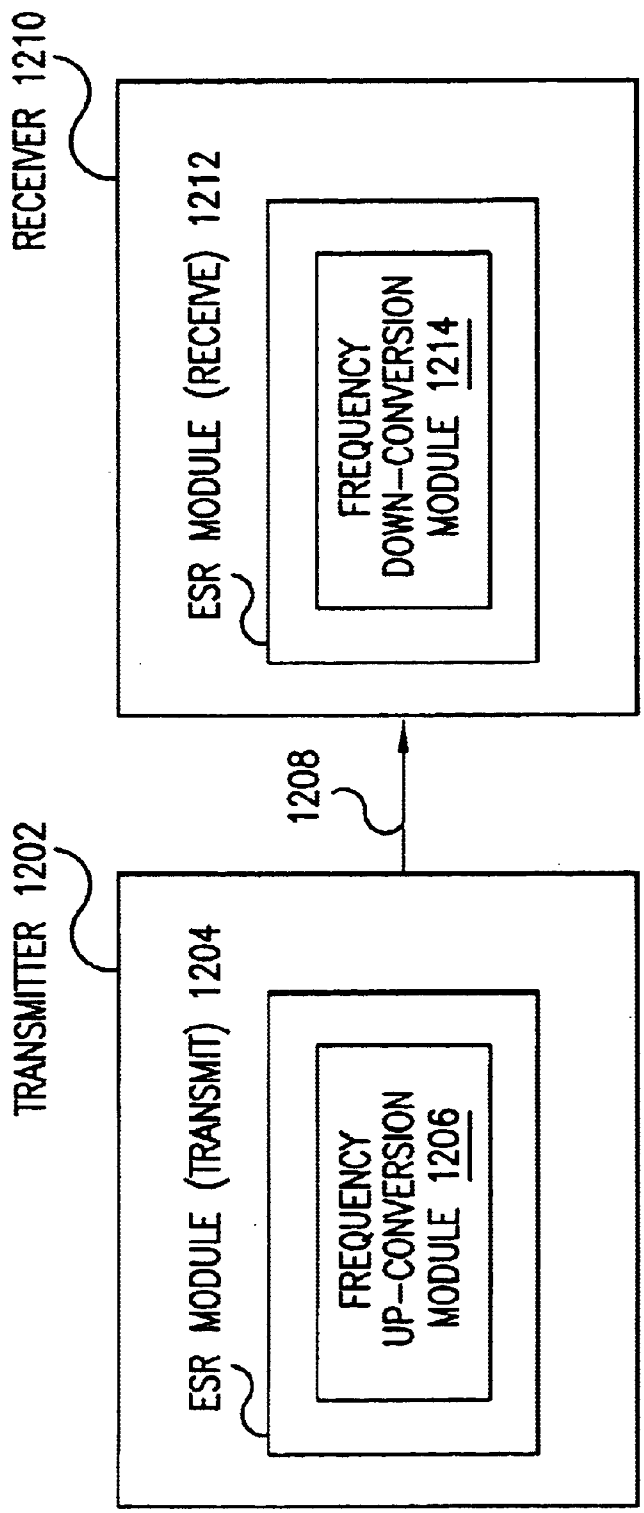
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) in a transmitter 1202, and an ESR module (receive) in a receiver 1210. An example ESR embodiment configured in this manner is illustrated in FIG. 12.

The ESR module (transmit) 1204 includes a frequency up-conversion module 1206. Some embodiments of this frequency up-conversion module 1206 may be implemented using a UFT module, such as that shown in FIG. 1D.

The ESR module (receive) 1212 includes a frequency down-conversion module 1214. Some embodiments of this frequency down-conversion module 1214 may be implemented using a UFT module, such as that shown in FIG. 1C.

Figure 13:
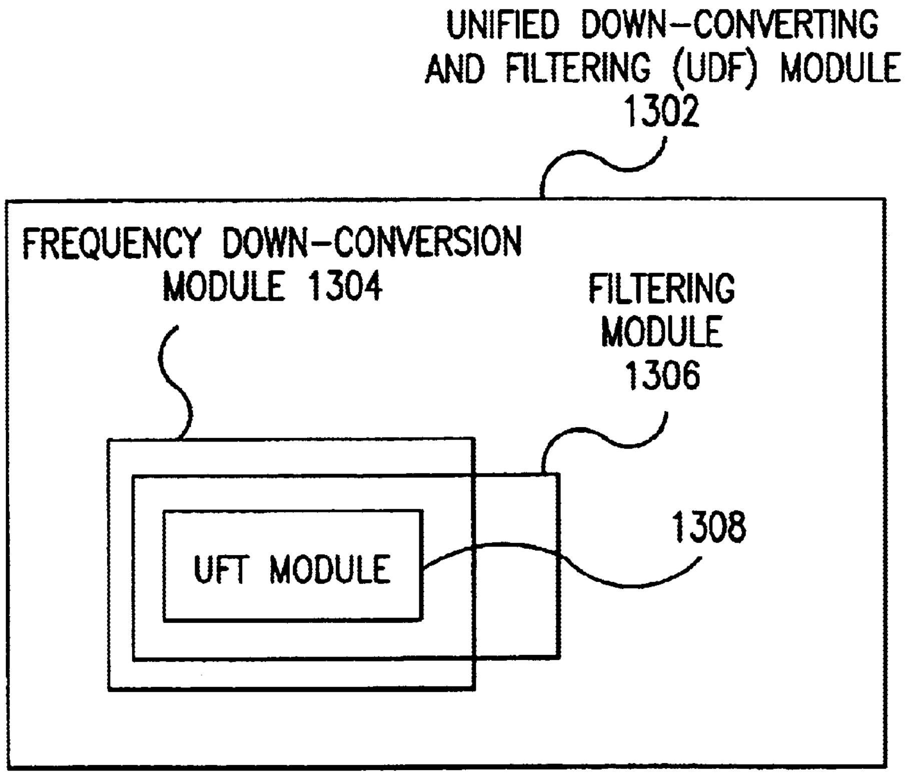
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An example unified down-conversion and filtering module 1302 is illustrated in FIG. 13. The unified down-conversion and filtering module 1302 includes a frequency down-conversion module 1304 and a filtering module 1306. According to the invention, the frequency down-conversion module 1304 and the filtering module 1306 are implemented using a UFT module 1308, as indicated in FIG. 13.

Figure 15A:
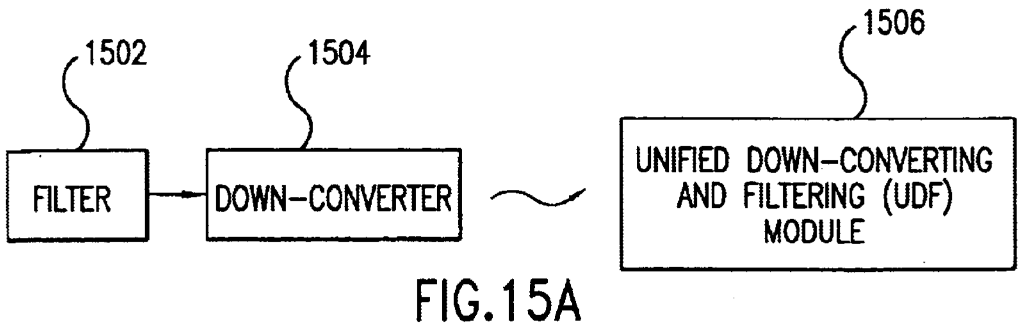
FIGS. 15A–15F illustrate example applications of the UDF module according to embodiments of the invention.
Figure 15B:
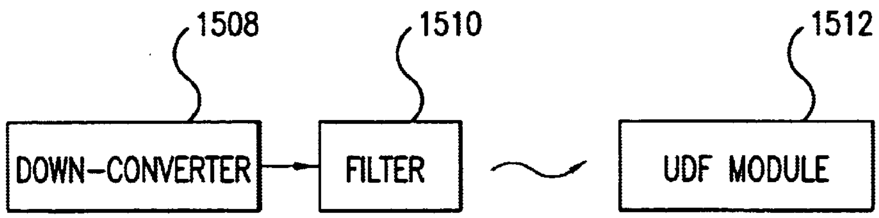
Figure 15C:
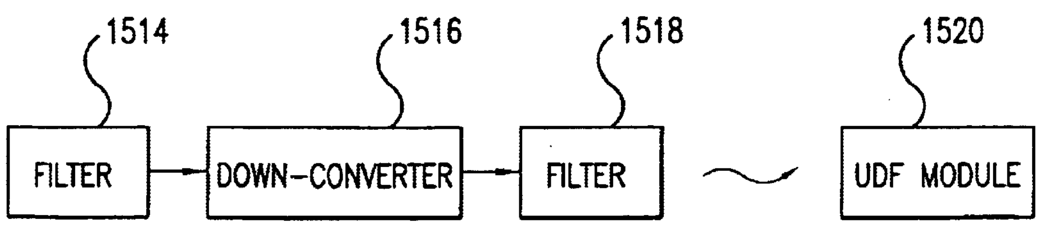
Figure 15D:
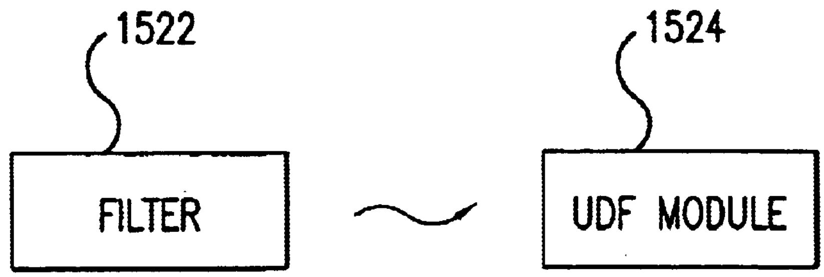

Unified down-conversion and filtering according to the invention is useful in applications involving filtering and/or frequency down-conversion. This is depicted, for example, in FIGS. 15A–15F. FIGS. 15A–15C indicate that unified down-conversion and filtering according to the invention is useful in applications where filtering precedes, follows, or both precedes and follows frequency down-conversion. FIG.

Figure 15E:
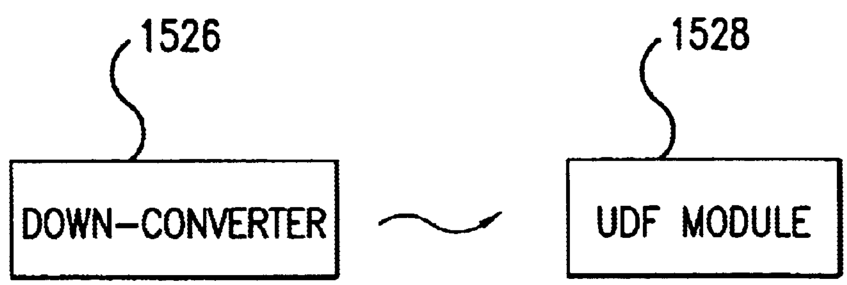
Figure 15F:
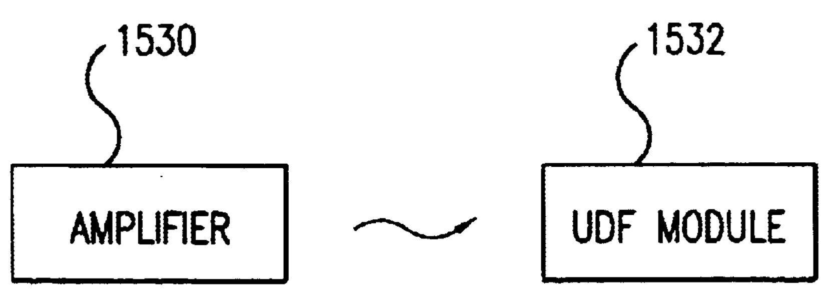

15D indicates that a unified down-conversion and filtering module 1524 according to the invention can be utilized as a filter 1522 (i.e., where the extent of frequency down-conversion by the down-converter in the unified down-conversion and filtering module 1524 is minimized). FIG. 15E indicates that a unified down-conversion and filtering module 1528 according to the invention can be utilized as a down-converter 1526 (i.e., where the filter in the unified down-conversion and filtering module 1528 passes substantially all frequencies). FIG. 15F illustrates that the unified down-conversion and filtering module 1532 can be used as an amplifier. It is noted that one or more UDF modules can be used in applications that involve at least one or more of filtering, frequency translation, and amplification.

Figure 14:
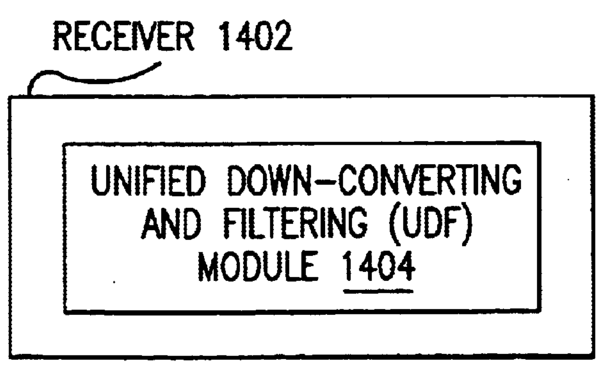
FIG. 14 illustrates an example receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
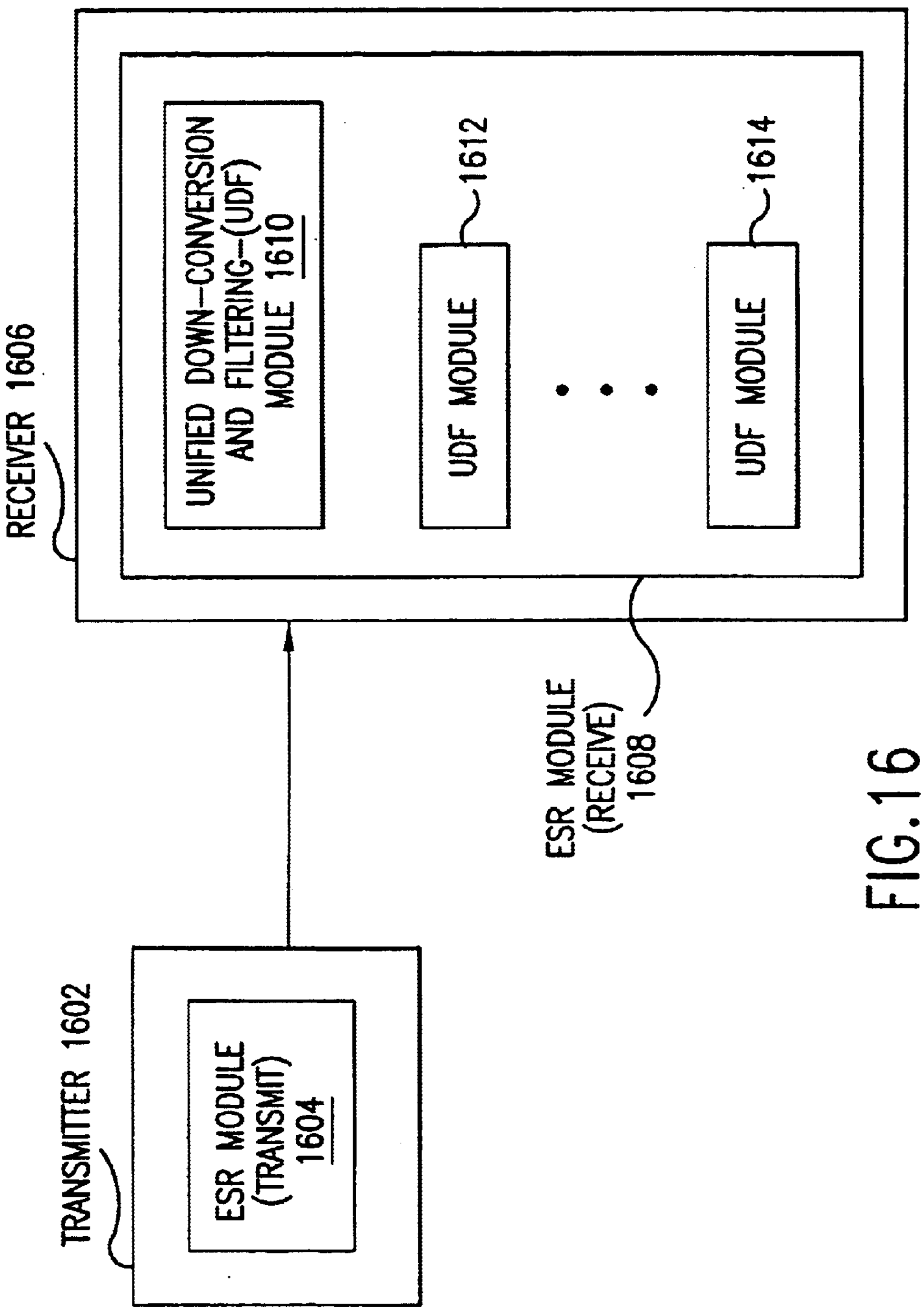
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectrums. The ESR module (receive) also operates to isolate the spectrums in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of the UDF modules 1610, 1612, 1614 operates to down-convert a received signal. The UDF modules 1610, 1612, 1614 also operate to filter the down-converted signal so as to isolate the spectrum(s) contained therein. As noted above, the UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the example applications of the UFT module discussed herein. Also, the invention is not limited to the example combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional example applications are described below.

6.1 Data Communication

The invention is directed to data communication among data processing devices. For example, and without limitation, the invention is directed to computer networks such as, for example, local area networks (LANs), wide area networks (WANs), including wireless LANs (WLANs) and wireless WANs, modulator/demodulators (modems), including wireless modems, etc.

Figure 25:
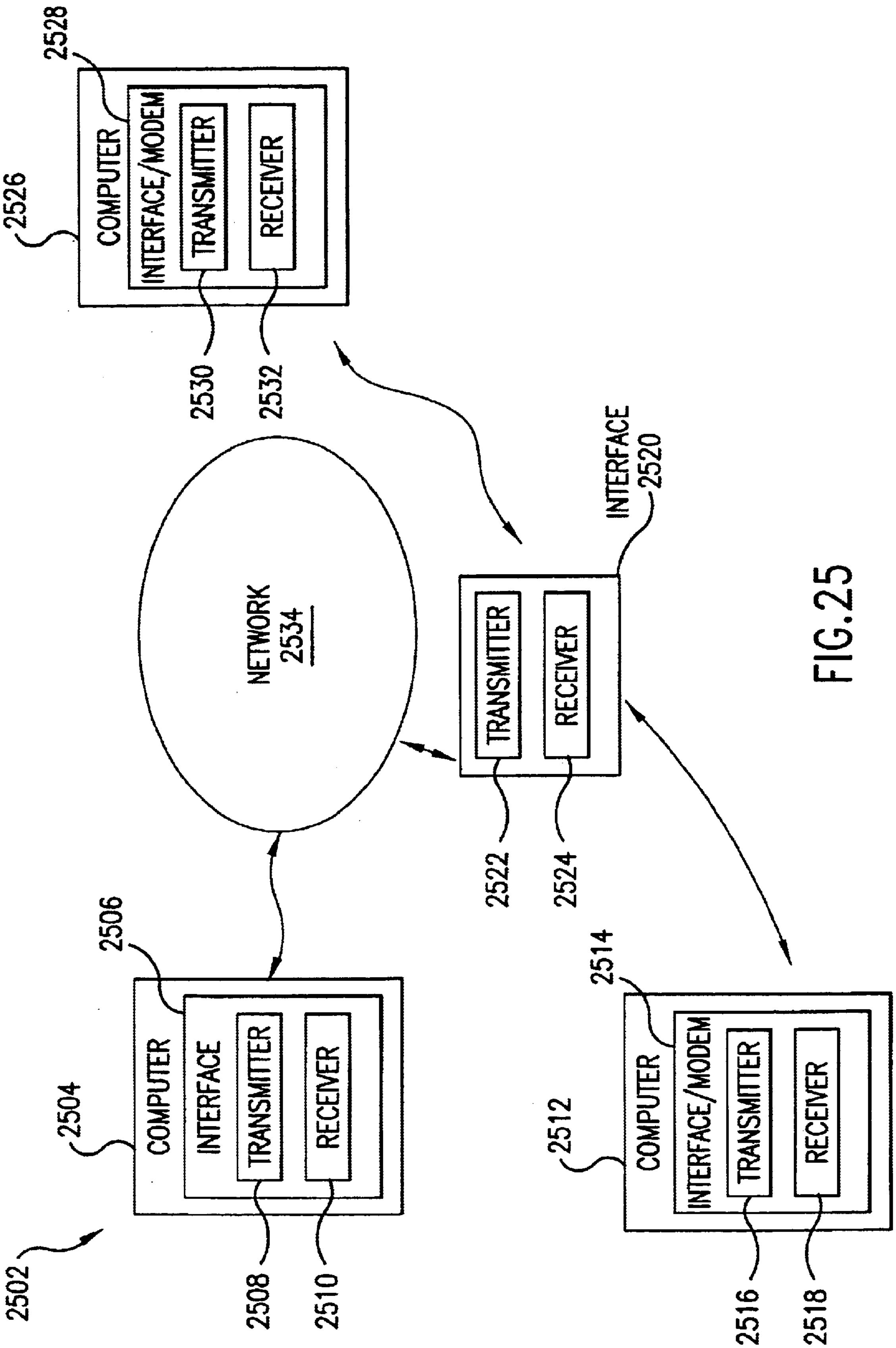
FIG. 25 illustrates a block diagram of an example computer network.

FIG. 25 illustrates an example environment 2502 wherein computers 2504, 2512, and 2526 communicate with one another via a computer network 2534. It is noted that the invention is not limited to computers, but encompasses any data processing and/or communications device or other device where communications with external devices is desired. Also, the invention includes but si not limited to WLAN client (also called mobile terminals, and/or stations) and infrastructure devices (also called access points). In the example of FIG. 25, computer 2504 is communicating with the network 2534 via a wired link, whereas computers 2512 and 2526 are communicating with the network 2534 via wireless links.

In the teachings contained herein, for illustrative purposes, a link may be designated as being a wired link or a wireless link. Such designations are for example purposes only, and are not limiting. A link designated as being wireless may alternatively be wired. Similarly, a link designated as being wired may alternatively be wireless. This is applicable throughout the entire application.

The computers 2504, 2512 and 2526 each include an interface 2506, 2514, and 2528, respectively, for communicating with the network 2534. The interfaces 2506, 2514, and 2528 include transmitters 2508, 2516, and 2530 respectively. Also, the interfaces 2506, 2514 and 2528 include receivers 2510, 2518, and 2532 respectively. In embodiments of the invention, the transmitters 2508, 2516 and 2530 are implemented using UFT modules for performing frequency up-conversion operations (see, for example, FIG. 8). In embodiments, the receivers 2510, 2518 and 2532 are implemented using UFT modules for performing frequency down-conversion operations (see, for example, FIG. 7).

As noted above, the computers 2512 and 2526 interact with the network 2534 via wireless links. In embodiments of the invention, the interfaces 2514, 2528 in computers 2512, 2526 represent modulator/demodulators (modems).

In embodiments, the network 2534 includes an interface or modem 2520 for communicating with the modems 2514, 2528 in the computers 2512, 2526. In embodiments, the interface 2520 includes a transmitter 2522, and a receiver 2524. Either or both of the transmitter 2522, and the receiver 2524 are implemented using UFT modules for performing frequency translation operations (see, for example, FIGS. 7 and 8).

In alternative embodiments, one or more of the interfaces 2506, 2514, 2520, and 2528 are implemented using transceivers that employ one or more UFT modules for performing frequency translation operations (see, for example, FIGS. 10 and 11).

Figure 26:
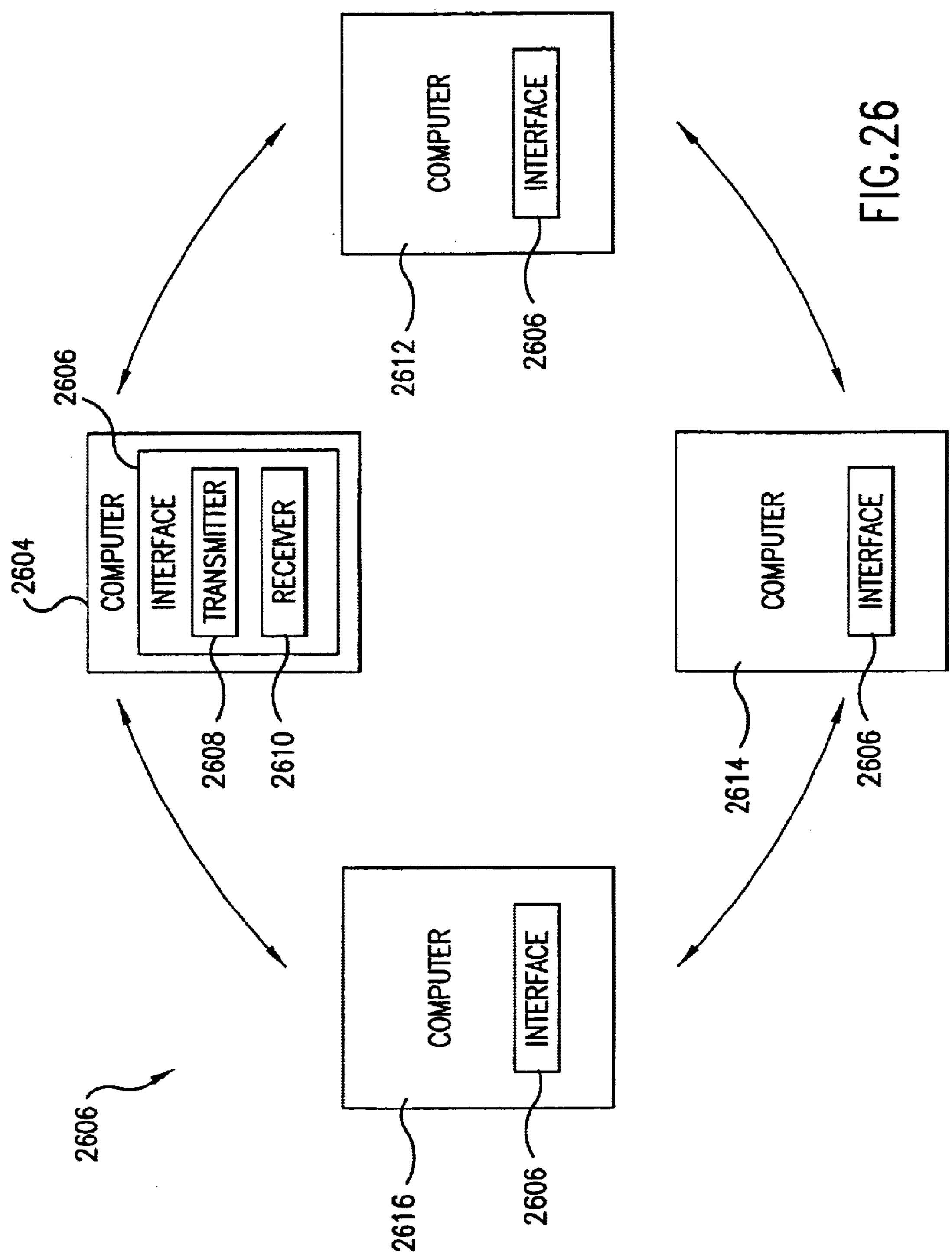
FIG. 26 illustrates a block diagram of an example computer network.

FIG. 26 illustrates another example data communication embodiment 2602. Each of a plurality of computers 2604, 2612, 2614 and 2616 includes an interface, such as an interface 2606 shown in the computer 2604. It should be understood that the other computers 2612, 2614, 2616 also include an interface such as an interface 2606. The computers 2604, 2612, 2614 and 2616 communicate with each other via interfaces 2606 and wireless or wired links, thereby collectively representing a data communication network.

The interfaces 2606 may represent any computer interface or port, such as but not limited to a high speed internal interface, a wireless serial port, a wireless PS2 port, a wireless USB port, PCMCIA port, etc.

The interface 2606 includes a transmitter 2608 and a receiver 2610. In embodiments of the invention, either or both of the transmitter 2608 and the receiver 2610 are implemented using UFT modules for frequency up-conversion and down-conversion (see, for example, FIGS. 7 and 8). Alternatively, the interfaces 2806 can be implemented using a transceiver having one or more UFT modules for performing frequency translation operations (see, for example, FIGS. 10 and 11).

Figure 33:
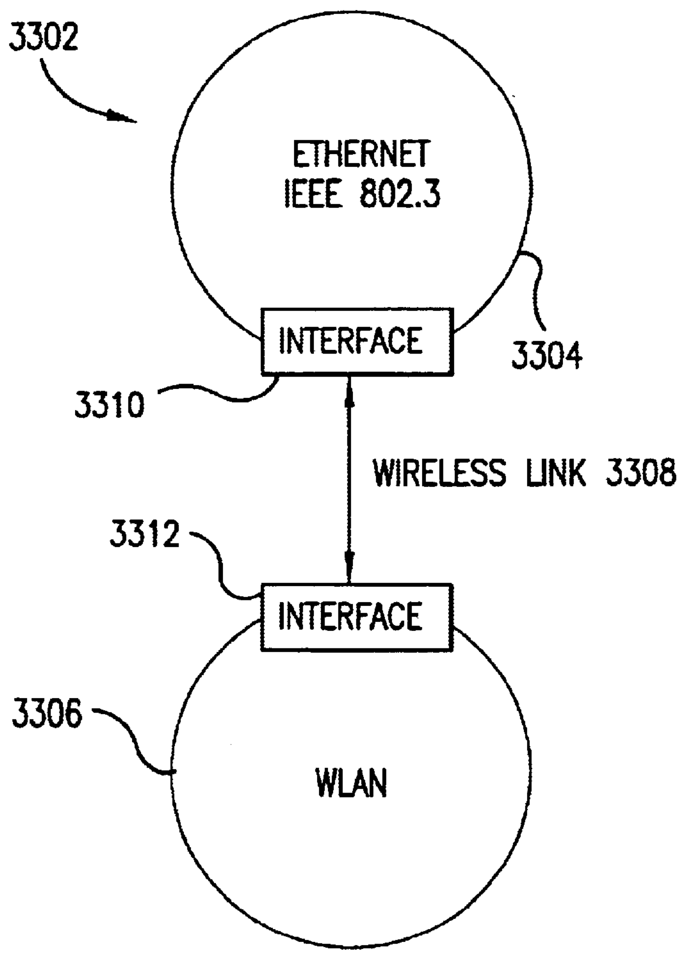
FIGS. 33–38 illustrate example environments encompassed by the invention.

FIGS. 33–38 illustrate other scenarios envisioned and encompassed by the invention. FIG. 33 illustrates a data processing environment 3302 wherein a wired network, such as an Ethernet network 3304, is linked to another network, such as a WLAN 3306, via a wireless link 3308. The wireless link 3308 is established via interfaces 3310, 3312 which are preferably implemented using universal frequency translation modules.

FIGS. 35–38 illustrate that the present invention supports WLANs that are located in one or more buildings or over any defined geographical area, as shown in FIGS. 35–38.

Figure 34:
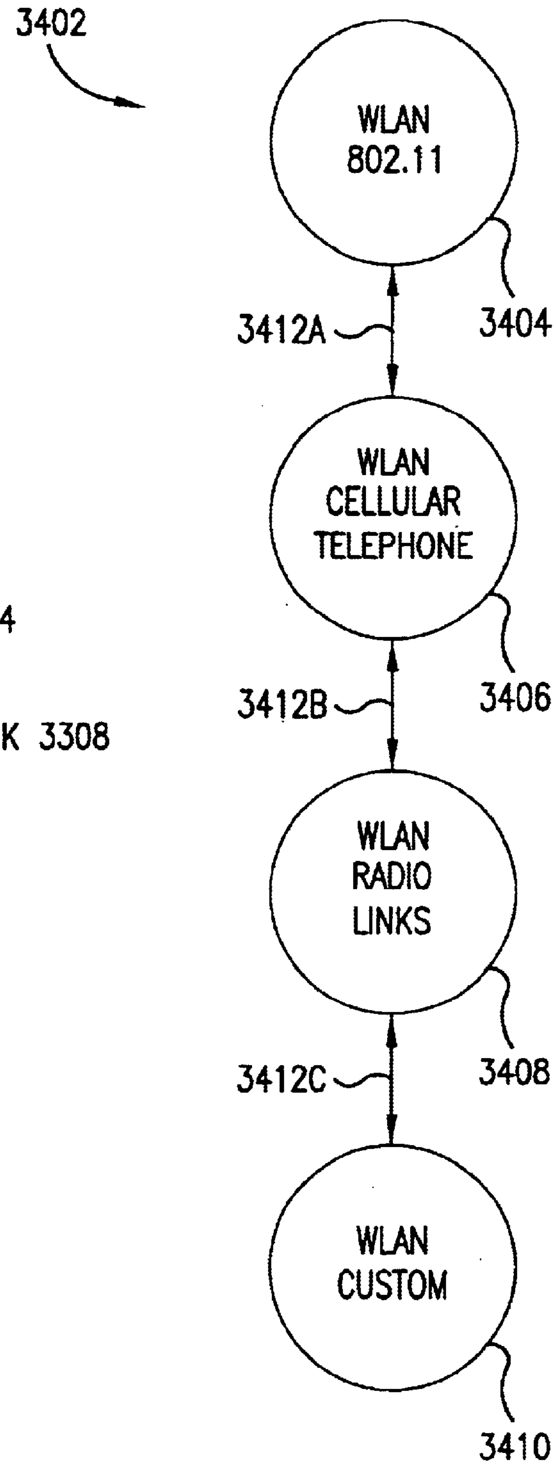

The invention includes multiple networks linked together. The invention also envisions wireless networks conforming to any known or custom standard or specification. This is shown in FIG. 34, for example, where any combination of WLANs conforming to any WLAN standard or configuration, such as IEEE 802.11 and Bluetooth (or other relatively short range communication specification or standard), any WAN cellular or telephone standard or specification, any type of radio links, any custom standard or specification, etc., or combination thereof, can be implemented using the universal frequency translation technology described herein. Also, any combination of these networks may be coupled together, as illustrated in FIG. 34.

Figure 35:
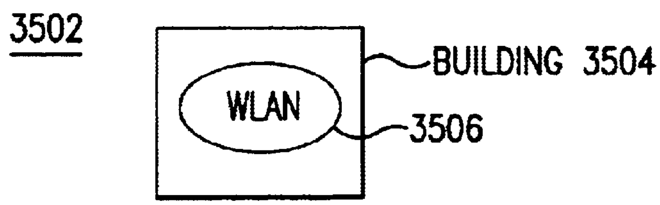
Figure 36:
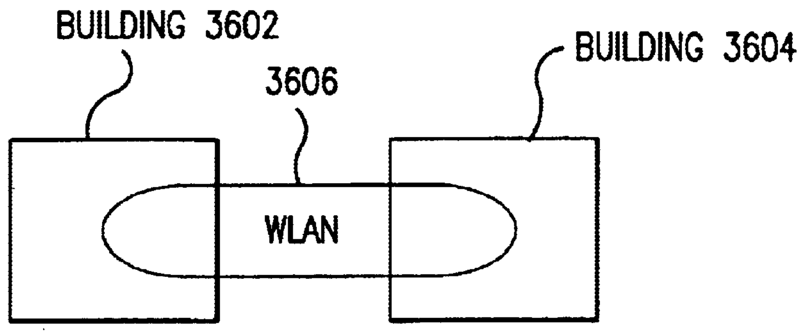
Figure 37:
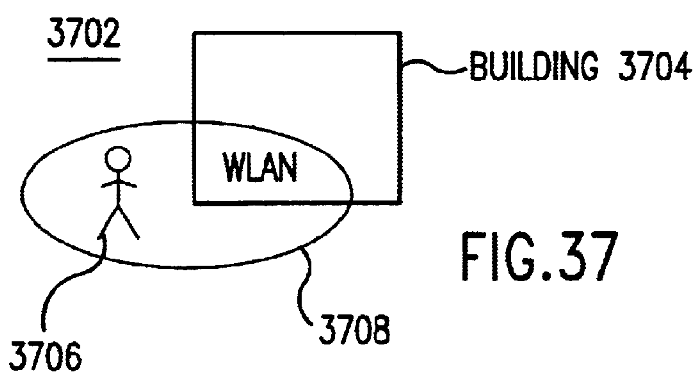
Figure 38:
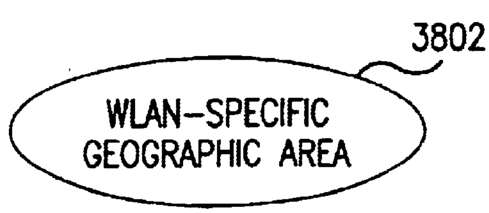

The invention supports WLANs that are located in one or multiple buildings, as shown in FIGS. 35 and 36. The invention also supports WLANs that are located in an area including and external to one or more buildings, as shown in FIG. 37. In fact, the invention is directed to networks that cover any defined geographical area, as shown in FIG. 38. In the embodiments described above, wireless links are preferably established using WLAN interfaces as described herein.

More generally, the invention is directed to WLAN client devices and WLAN infrastructure devices. "WLAN Client Devices" refers to, for example, any data processing and/or communication devices in which wired or wireless communication functionality is desired, such as but not limited to computers, personal data assistants (PDAs), automatic identification data collection devices (such as bar code scanners/readers, electronic article surveillance readers, and radio frequency identification readers), telephones, network devices, etc., and combinations thereof. "WLAN Infrastructure Devices" refers to, for example, Access Points and other devices used to provide the ability for WLAN Client Devices (as well as potentially other devices) to connect to wired and/or wireless networks and/or to provide the network functionality of a WLAN. "WLAN" refers to, for example, a Wireless Local Area Network that is implemented according to and that operates within WLAN standards and/or specifications, such as but not limited to IEEE 802.11, IEEE 802.11a, IEEE 802.11b, HomeRF, Proxim Range LAN, Proxim Range LAN2, Symbol Spectrum 1, Symbol Spectrum 24 as it existed prior to adoption of IEEE 802.11, HiperLAN1, or HiperLAN2. WLAN client devices and/or WLAN infrastructure devices may operate in a multimode capacity. For example, a device may include WLAN and WAN functionality. Another device may include WLAN and short range communication (such as but not limited to Blue Tooth) functionality. Another device may include WLAN and WAN and short range communication functionality. It is noted that the above definitions and examples are provided for illustrative purposes, and are not limiting. Equivalents to that described above will be apparent to persons skilled in the relevant art(s) based on the teachings contained herein.

6.1.1. Example Implementations: Interfaces, Wireless Modems, Wireless LANs, etc.

The present invention is now described as implemented in an interface, such as a wireless modem or other device (such as client or infrastructure device), which can be utilized to implement or interact with a wireless local area network (WLAN) or wireless wide area network (WWAN), for example. In an embodiment, the present invention is implemented in a WLAN to support IEEE WLAN Standard 802.11, but this embodiment is mentioned for illustrative purposes only. The invention is not limited to this standard.

Conventional wireless modems are described in, for example, U.S. Pat. No. 5,764,693, titled, "Wireless Radio Modem with Minimal Inter-Device RF Interference," incorporated herein by reference in its entirety. The present invention replaces a substantial portion of conventional wireless modems with one or more universal frequency translators (UFTs). The resultant improved wireless modem consumes less power that conventional wireless modems and is easier and less expensive to design and build. A wireless modem in accordance with the present invention can be implemented in a PC-MCIA card or within a main housing of a computer, for example.

Figure 27:
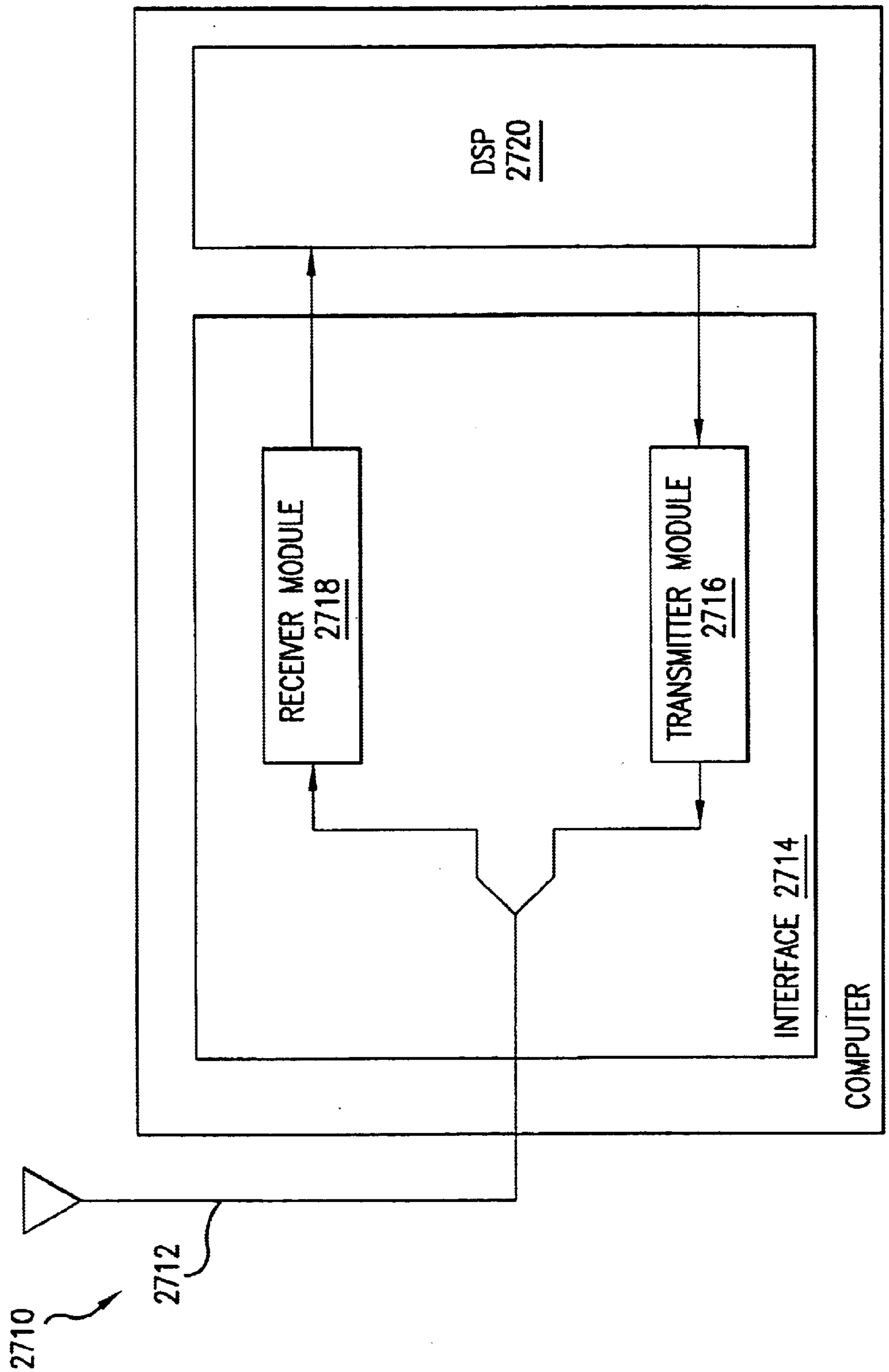
FIG. 27 illustrates a block diagram of an example wireless interface.

FIG. 27 illustrates an example block diagram of a computer system 2710, which can be wirelessly coupled to a LAN, as illustrated in FIGS. 25 and 26. The computer system 2710 includes an interface 2714 and an antenna 2712. The interface 2714 includes a transmitter module 2716 that receives information from a digital signal processor (DSP) 2720, and modulates and up-converts the information for transmission from the antenna 2712. The interface 2714 also includes a receiver module 2718 that receives modulated carrier signals via the antenna 2712. The receiver module 2718 down-converts and demodulates the modulated carrier signals to baseband information, and provides the baseband information to the DSP 2720. The DSP 2720 can include a central processing unit (CPU) and other components of the computer 2712. Conventionally, the interface 2714 is implemented with heterodyne components.

Figure 28:
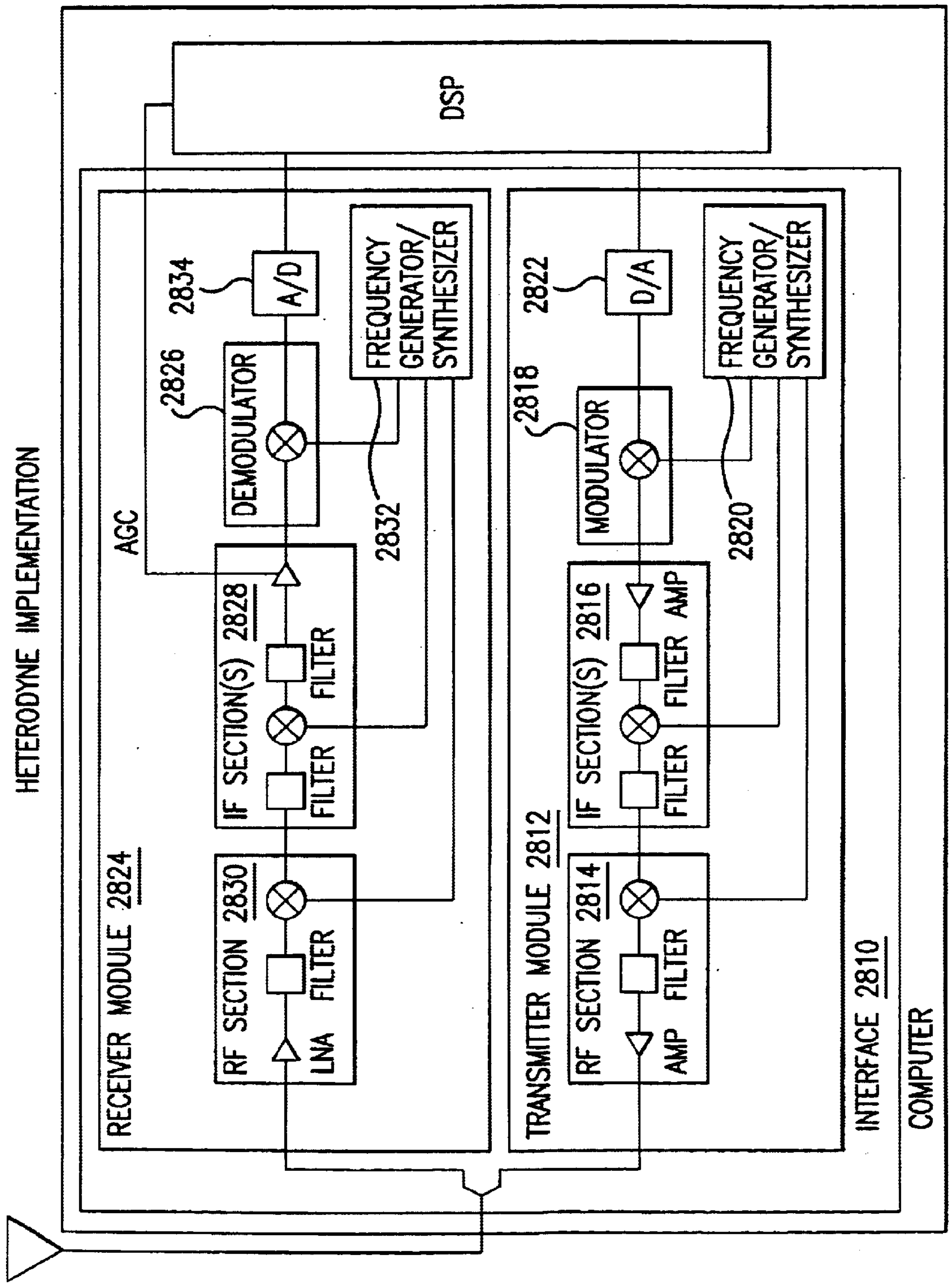
FIG. 28 illustrates an example heterodyne implementation of the wireless interface illustrated in FIG. 27.

FIG. 28 illustrates an example interface 2810 implemented with heterodyne components. The interface 2810 includes a transmitter module 2812 and a receiver module 2824. The receiver module 2824 includes an RF section 2830, one or more IF sections 2828, a demodulator section 2826, an optional analog to digital (A/D) converter 2834, and a frequency generator/synthesizer 2832. The transmitter module 2812 includes an optional digital to analog (D/A) converter 2822, a modulator \section 2818, one or more IF sections 2816, an RF section 2814, and a frequency generator/synthesizer 2820. Operation of the interface 2810 will be apparent to one skilled in the relevant art(s), based on the description herein.

Figure 29:
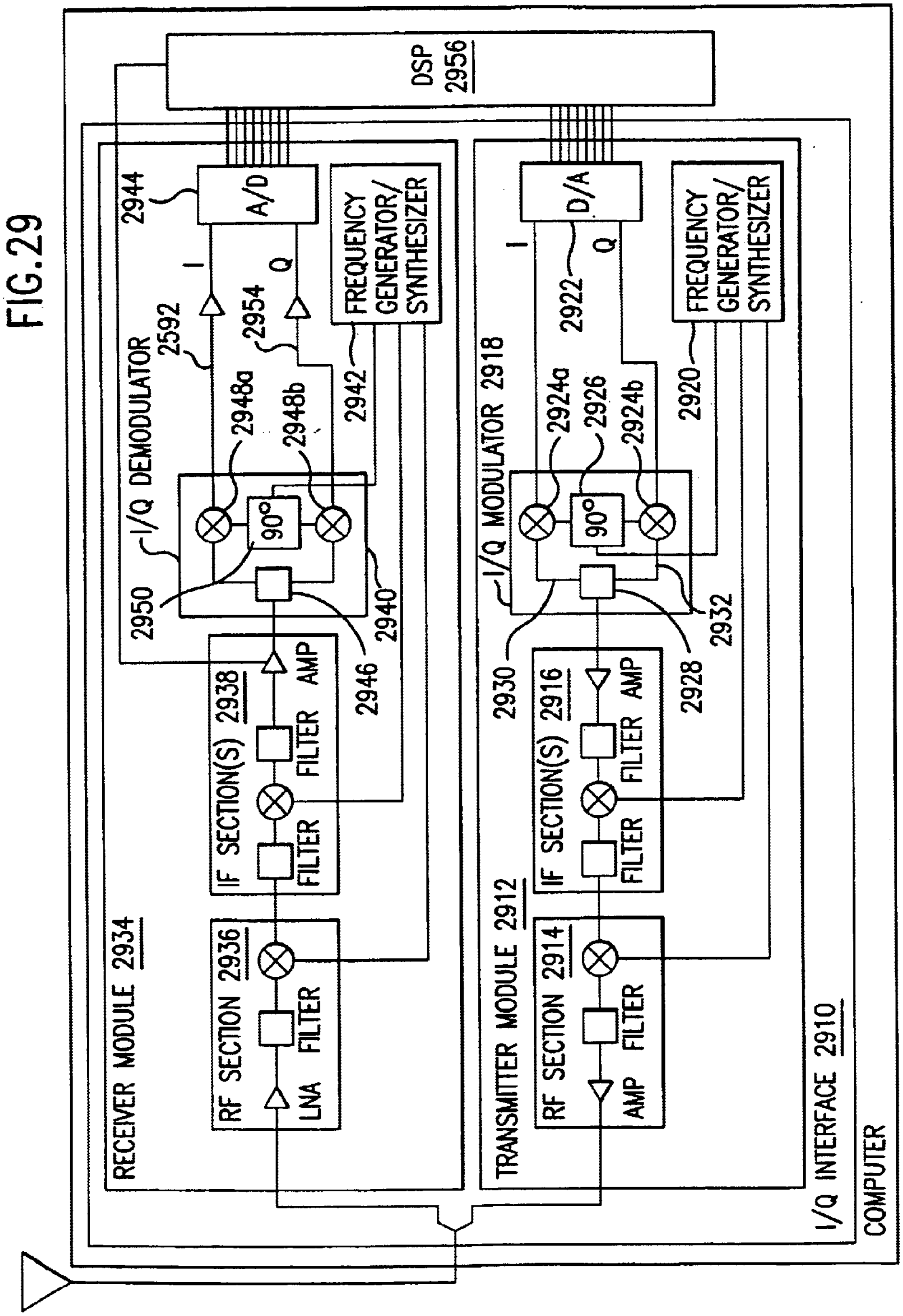
FIG. 29 illustrates an example in-phase/quadrature-phase (I/Q) heterodyne implementation of the interface illustrated in FIG. 27.

FIG. 29 illustrates an example in-phase/quadrature-phase (I/Q) interface 2910 implemented with heterodyne components. I/Q implementations allow two channels of information to be communicated on a carrier signal and thus can be utilized to increase data transmission.

The interface 2910 includes a transmitter module 2912 and a receiver module 2934. The receiver module 2934 includes an RF section 2936, one or more IF sections 2938, an I/Q demodulator section 2940, an optional A/D converter 2944, and a frequency generator/synthesizer 2942. The I/Q demodulator section 2940 includes a signal splitter 2946, mixers 2948, and a phase shifter 2950. The signal splitter 2946 provides a received signal to the mixers 2948. The phase shifter 2950 operates the mixers 2948 ninety degrees out of phase with one another to generate I and Q information channels 2952 and 2954, respectively, which are provided to a DSP 2956 through the optional A/D converter 2944.

The transmitter module 2912 includes an optional D/A converter 2922, an I/Q modulator section 2918, one or more IF sections 2916, an RF section 2914, and a frequency generator/synthesizer 2920. The I/Q modulator section 2918 includes mixers 2924, a phase shifter 2926, and a signal combiner 2928. The phase shifter 2926 operates the mixers 2924 ninety degrees out of phase with one another to generate I and Q modulated information signals 2930 and 2932, respectively, which are combined by the signal combiner 2928. The IF section(s) 2916 and RF section 2914 up-convert the combined I and Q modulated information signals 2930 and 2932 to RF for transmission by the antenna, in a manner well known in the relevant art(s).

Heterodyne implementations, such as those illustrated in FIGS. 28 and 29, are expensive and difficult to design, manufacture and tune. In accordance with the present invention, therefore, the interface 2714 (FIG. 27) is preferably implemented with one or more universal frequency translation (UFT) modules, such as the UFT module 102 (FIG. 1A). Thus previously described benefits of the present invention are obtained in wireless modems, WLANs, etc.

Figure 30:
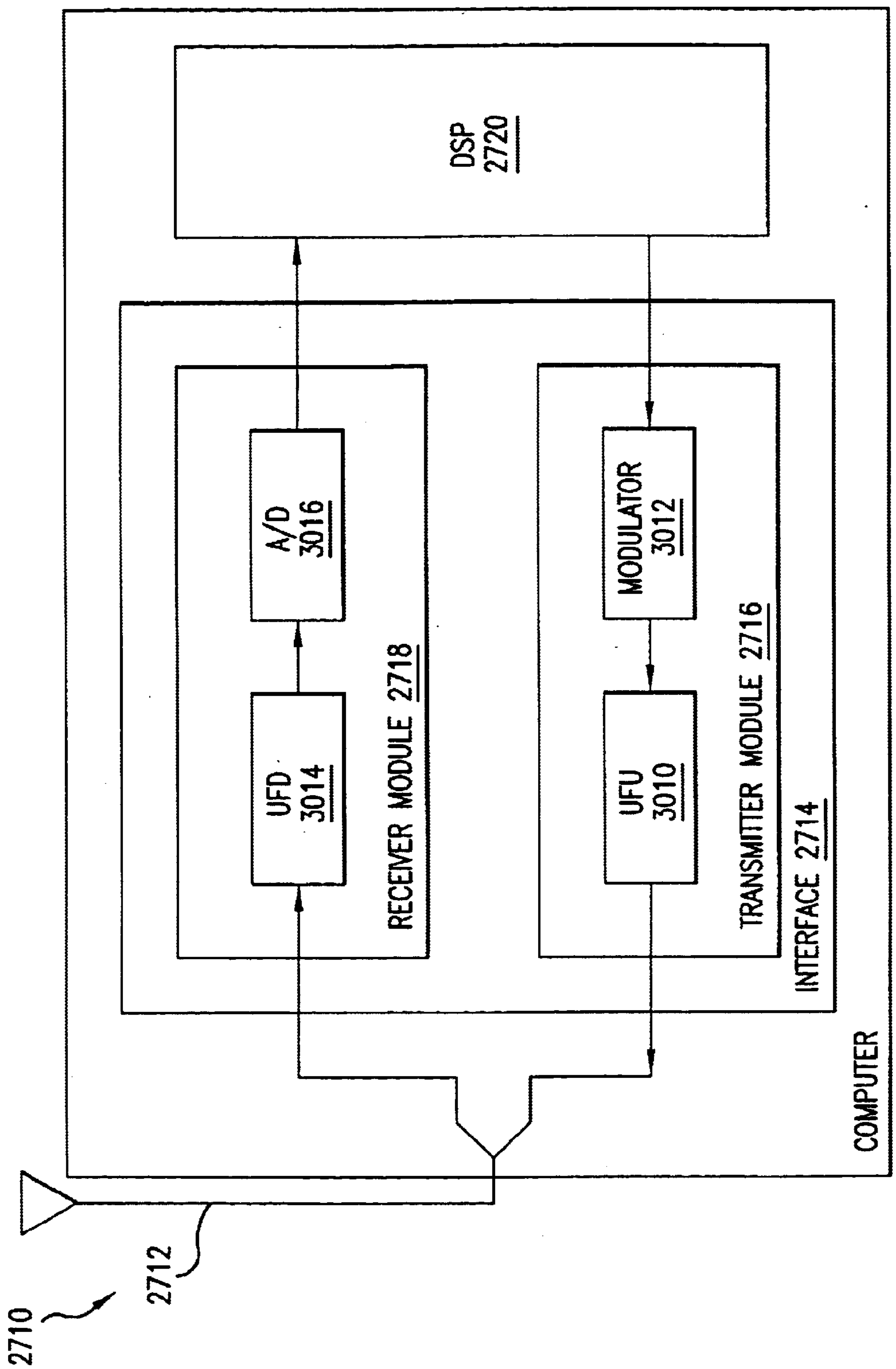
FIG. 30 illustrates an example high level block diagram of the interface illustrated in FIG. 27, in accordance with the present invention.

FIG. 30 illustrates an example block diagram embodiment of the interface 2714 that is associated with a computer or any other data processing and/or communications device. In FIG. 30, the receiver module 2718 includes a universal frequency down-converter (UFD) module 3014 and an optional analog to digital (A/D) converter 3016, which converts an analog output from the UFD 3014 to a digital format for the DSP 2720. The transmitter module 2716 includes an optional modulator 3012 and a universal frequency up-converter (UFU) module 3010. The optional modulator 3012 can be a variety of types of modulators, including conventional modulators. Alternatively, the UFU module 3010 includes modulator functionality. The example implementation of FIG. 30 operates substantially as described above and in co-pending U.S. Patent Applications titled, "Method and System for Down-Converting Electromagnetic Signals," Ser. No. 09/176,022, filed Oct. 21, 1998, issued as U.S. Pat. No. 6,061,551 on May 9, 2000, and "Method and System for Frequency Up-Conversion," Ser. No. 09/176,154, filed Oct. 21, 1998, issued as U.S. Pat. No. 6,091,940 on Jul. 18, 2000, as well as other cited documents.

Figure 31:
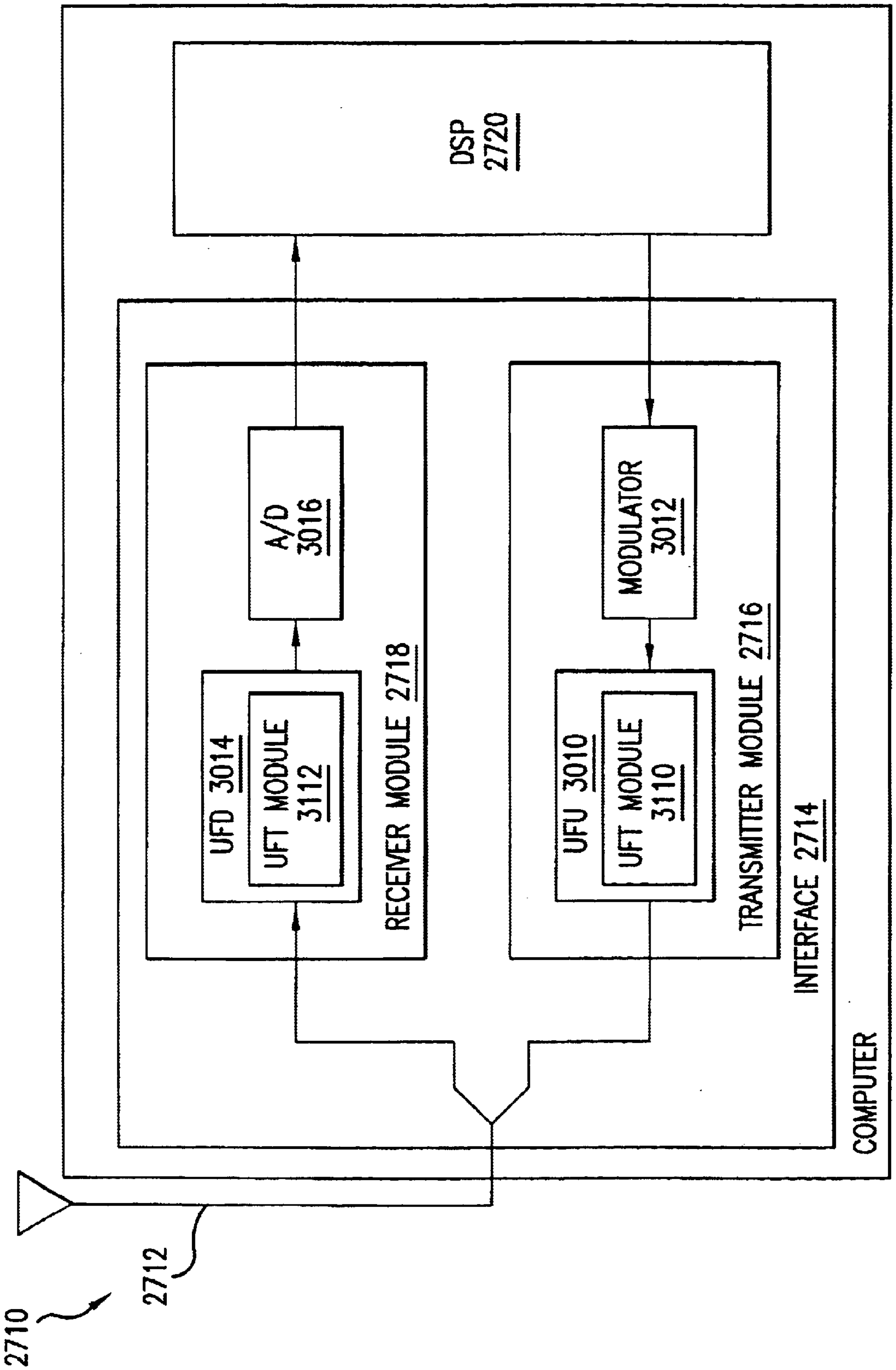
FIG. 31 illustrates a example block diagram of the interface illustrated in FIG. 29, in accordance with the invention.

FIG. 31 illustrates an example implementation of the interface 2714 illustrated in FIG. 30, wherein the receiver UFD 3014 includes a UFT module 3112, and the transmitter UFU 3010 includes a universal frequency translation (UFT) module 3110. This example implementation operates substantially as described above and in co-pending U.S. Patent Applications titled, "Method and System for Down-Converting Electromagnetic Signals," Ser. No. 09/176,022, filed Oct. 21, 1998, issued as U.S. Pat. No. 6,061,551 on May 9, 2000, and "Method and System for Frequency Up-Conversion," Ser. No. 09/176,154, filed Oct. 21, 1998, "Method and System for Frequency Up-Conversion," Ser. No. 09/176,154, filed Oct. 21, 1998, issued as U.S. Pat. No. 6,091,940 on Jul. 18, 2000, as well as other cited documents.

Figure 32:
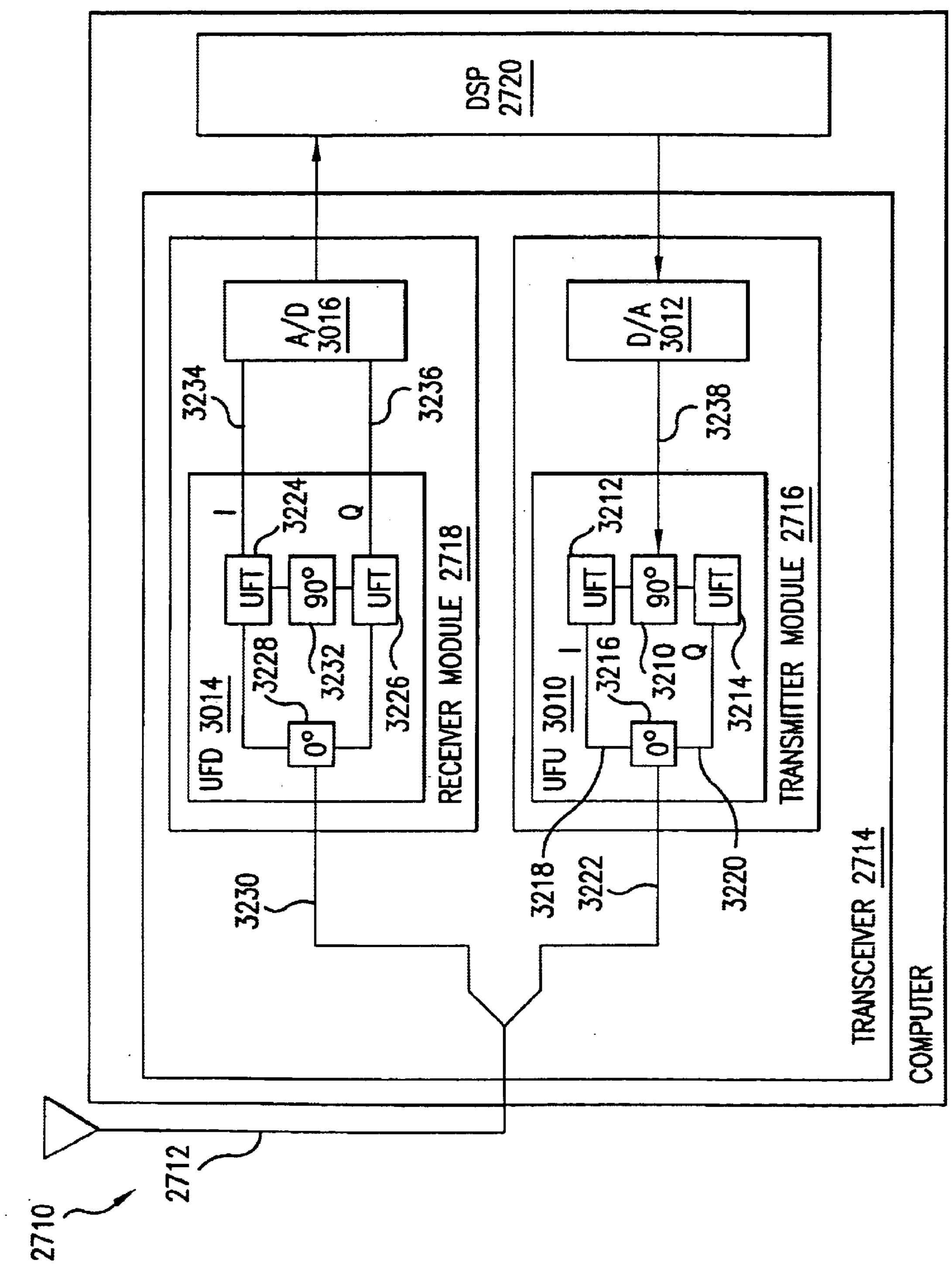
FIG. 32 illustrates an example I/Q implementation of the interface illustrated in FIG. 31.

FIG. 32 illustrates an example I/Q implementation of the interface module 2710. Other I/Q implementations are also contemplated and are within the scope of the present invention.

In the example of FIG. 32, the receiver UFD module 3014 includes a signal divider 3228 that provides a received I/Q modulated carrier signal 3230 between a third UFT module 3224 and a fourth UFT module 3226. A phase shifter 3232, illustrated here as a 90 degree phase shifter, controls the third and fourth UFT modules 3224 and 3226 to operate 90 degrees out of phase with one another. As a result, the third and fourth UFT modules 3224 and 3226 down-convert and demodulate the received I/Q modulated carrier signal 3230, and output I and Q channels 3234 and 3236, respectively, which are provided to the DSP 2720 through the optional A/D converter 3016.

In the example of FIG. 32, the transmitter UFU module 3010 includes first and second UFT modules 3212 and 3214 and a phase shifter 3210, which is illustrated here as a 90 degree phase shifter. The phase shifter 3210 receives a lower frequency modulated carrier signal 3238 from the modulator 3012. The phase shifter 3210 controls the first and second UFT modules 3212 and 3214 to operate 90 degrees out of phase with one another. The first and second UFT modules 3212 and 3214 up-convert the lower frequency modulated carrier signal 3238, which are output as higher frequency modulated I and Q carrier channels 3218 and 3220, respectively. A signal combiner 3216 combines the higher frequency modulated I and Q carrier channels 3218 and 3220 into a single higher frequency modulated I/Q carrier signal 3222 for transmitting by the antenna 2712.

The example implementations of the interfaces described above, and variations thereof, can also be used to implement network interfaces, such as the network interface 2520 illustrated in FIG. 25.

6.1.2. Example Modifications

The RF modem applications, WLAN applications, etc., described herein, can be modified by incorporating one or more of the enhanced signal reception (ESR) techniques described herein. Use of ESR embodiments with the network embodiments described herein will be apparent to persons skilled in the relevant art(s) based on the teachings contained herein.

The RF modem applications, WLAN applications, etc., described herein can be enhanced by incorporating one or more of the unified down-conversion and filtering (UDF) techniques described herein. Use of UDF embodiments with the network embodiments described herein will be apparent to persons skilled in the relevant art(s) based on the teachings contained herein.

6.2. Other Example Applications

The application embodiments described above are provided for purposes of illustration. These applications and embodiments are not intended to limit the invention. Alternate and additional applications and embodiments, differing slightly or substantially from those described herein, will be apparent to persons skilled in the relevant art(s) based on the teachings contained herein. For example, such alternate and additional applications and embodiments include combinations of those described above. Such combinations will be apparent to persons skilled in the relevant art(s) based on the herein teachings.

7.0. Example WLAN Implementation Embodiments 7.1 Architecture

Figure 39:
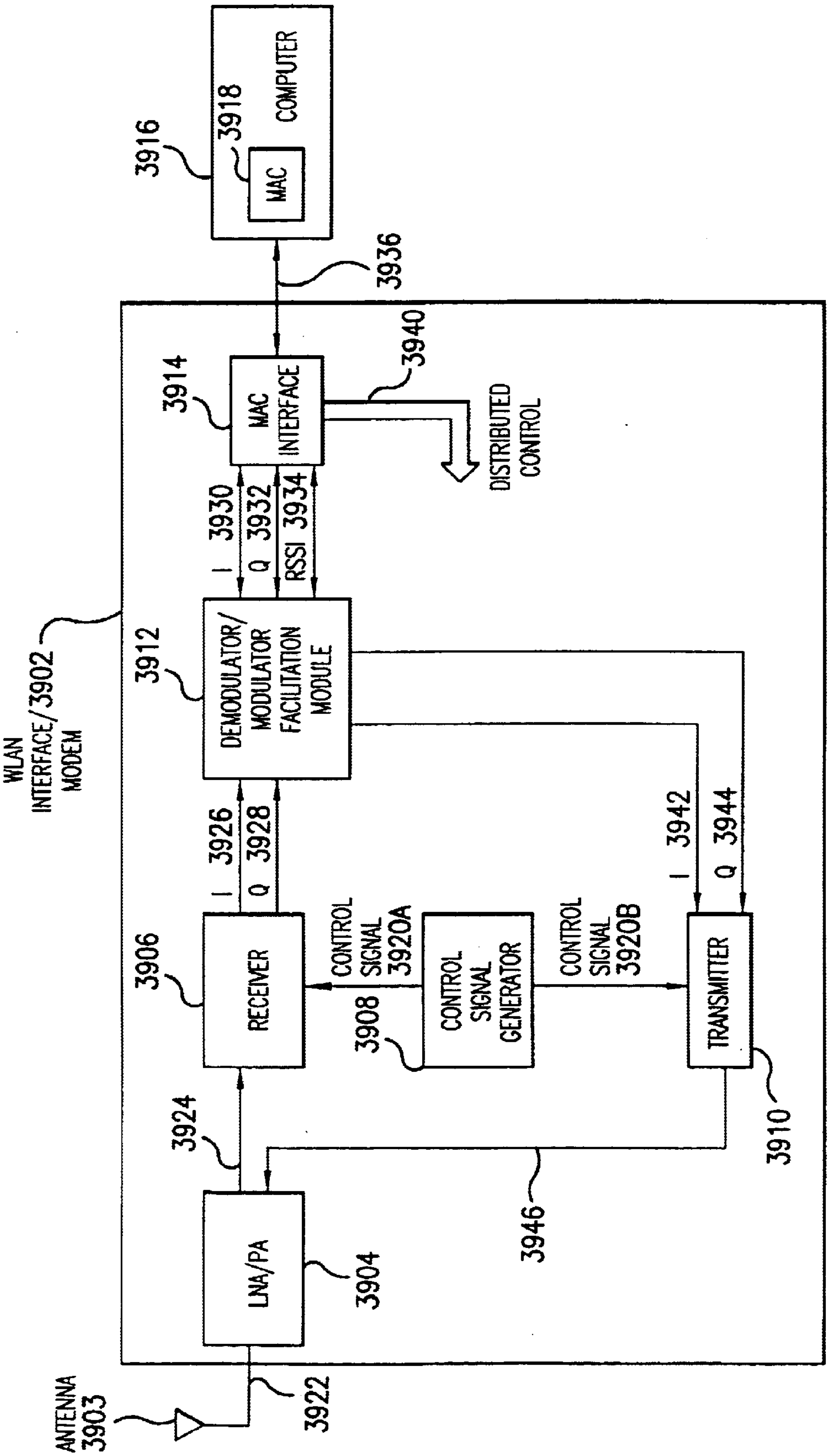
FIG. 39 illustrates a block diagram of a WLAN interface according to an embodiment of the invention.

FIG. 39 is a block diagram of a WLAN interface 3902 (also referred to as a WLAN modem herein) according to an embodiment of the invention. The WLAN interface/modem 3902 includes an antenna 3904, a low noise amplifier or power amplifier (LNA/PA) 3904, a receiver 3906, a transmitter 3910, a control signal generator 3908, a demodulator/modulator facilitation module 3912, and a media access controller (MAC) interface 3914. Other embodiments may include different elements. The MAC interface 3914 couples the WLAN interface/modem 3902 to a computer 3916 or other data processing device. The computer 3916 preferably includes a MAC 3918.

The WLAN interface/modem 3902 represents a transmit and receive application that utilizes the universal frequency translation technology described herein. It also represents a zero IF (or direct-to-data) WLAN architecture.

The WLAN interface/modem 3902 also represents a vector modulator and a vector demodulator using the universal frequency translation (UFT) technology described herein. Use of the UFT technology enhances the flexibility of the WLAN application (i.e., makes it universal).

In the embodiment shown in FIG. 39, the WLAN interface/modem 3902 is compliant with WLAN standard IEEE 802.11. However, the invention is not limited to this standard. The invention is applicable to any communication standard or specification, as will be appreciated by persons skilled in the relevant art(s) based on the teachings contained herein. Any modifications to the invention to operate with other standards or specifications will be apparent to persons skilled in the relevant art(s) based on the teachings contained herein.

In the embodiment shown in FIG. 39, the WLAN interface/modem 3902 provides half duplex communication. However, the invention is not limited to this communication mode. The invention is applicable and directed to other communication modes, as will be appreciated by persons skilled in the relevant art(s) based on the teachings contained herein.

In the embodiment shown in FIG. 39, the modulation/demodulation performed by the WLAN interface/modem 3902 is preferably direct sequence spread spectrum QPSK (quadrature phase shift keying) with differential encoding. However, the invention is not limited to this modulation/demodulation mode. The invention is applicable and directed to other modulation and demodulation modes, such as but not limited to those described herein, as well as frequency hopping according to IEEE 802.11, OFDM (orthogonal frequency division multiplexing), as well as others. These modulation/demodulation modes will be appreciated by persons skilled in the relevant art(s) based on the teachings contained herein.

The operation of the WLAN interface/modem 3902 when receiving shall now be described.

Signals 3922 received by the antenna 3903 are amplified by the LNA/PA 3904. The amplified signals 3924 are down-converted and demodulated by the receiver 3906. The receiver 3906 outputs I signal 3926 and Q signal 3928.

Figure 40:
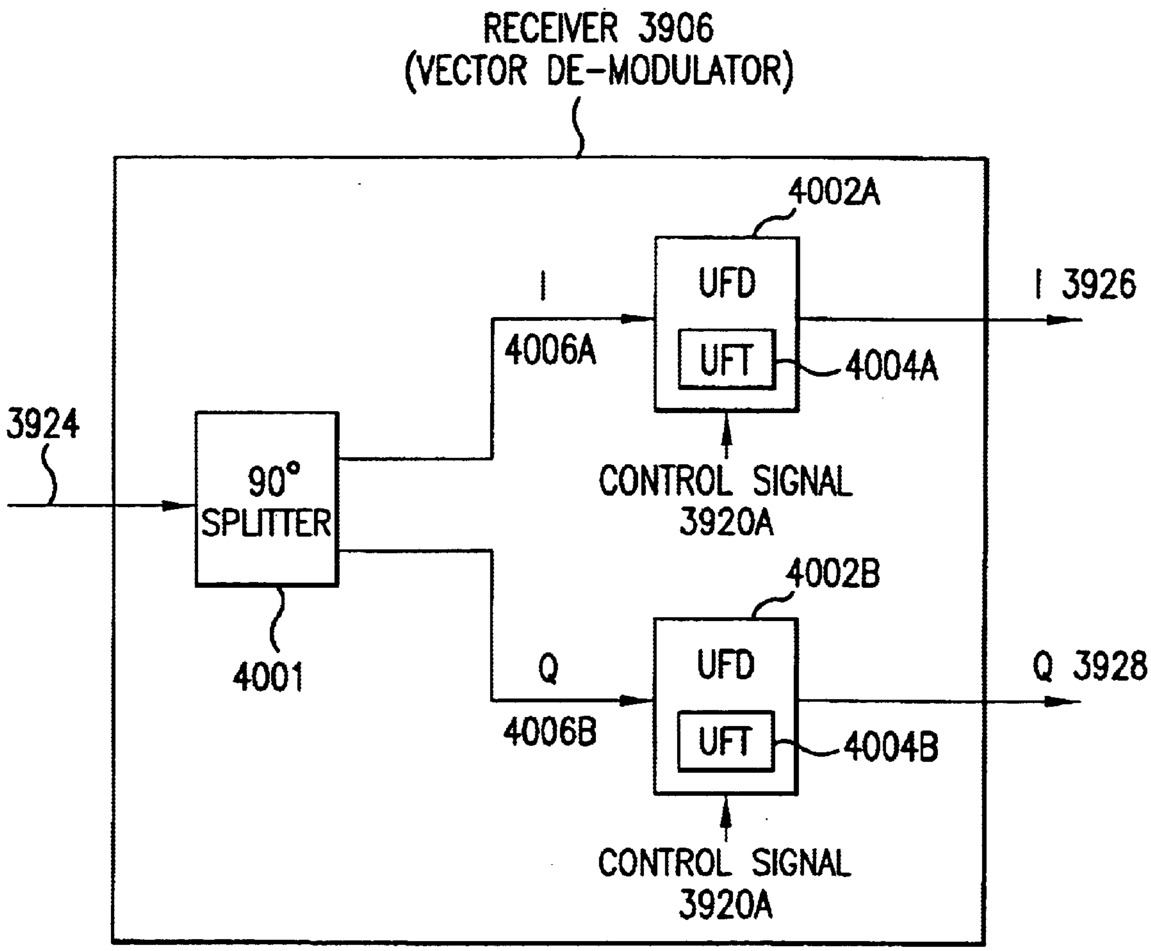
FIG. 40 illustrates a WLAN receiver according to an embodiment of the invention.

FIG. 40 illustrates an example receiver 3906 according to an embodiment of the invention. It is noted that the receiver 3906 shown in FIG. 40 represents a vector modulator. The "receiving" function performed by the WLAN interface/modem 3902 can be considered to be all processing performed by the WLAN interface/modem 3902 from the LNA/PA 3904 to generation of baseband information.

Figure 53A:
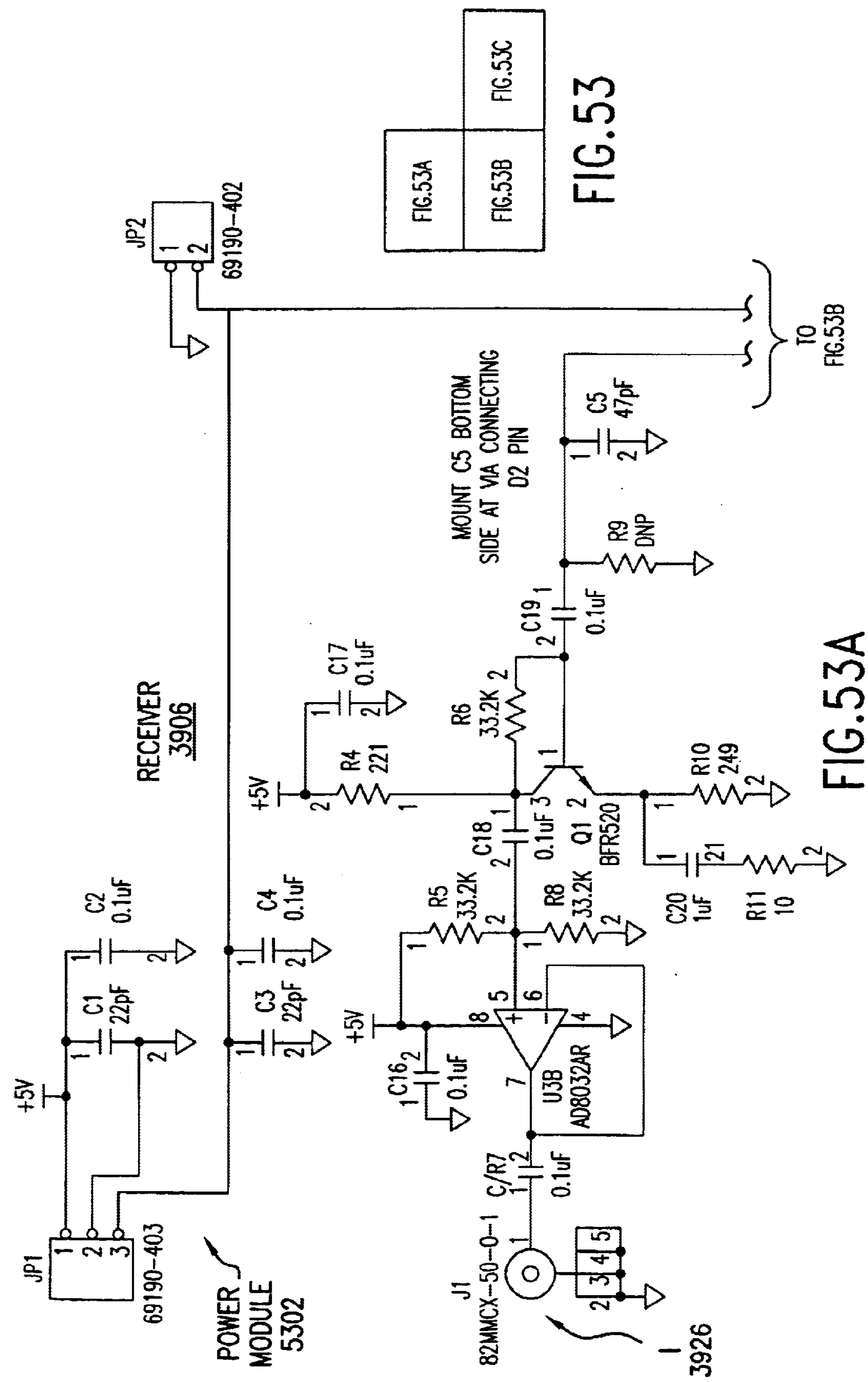
Figure 53B:
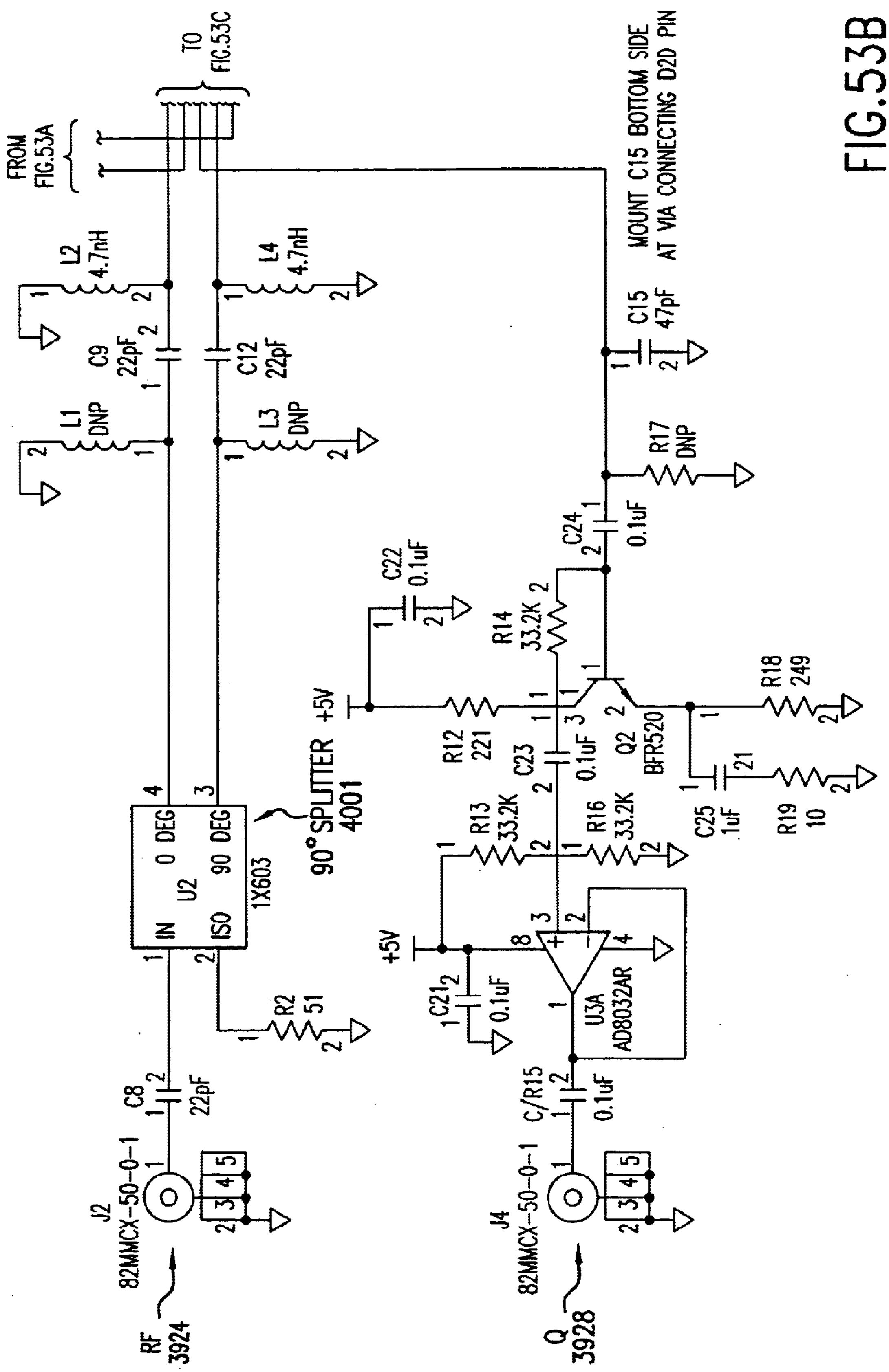
Figure 53C:
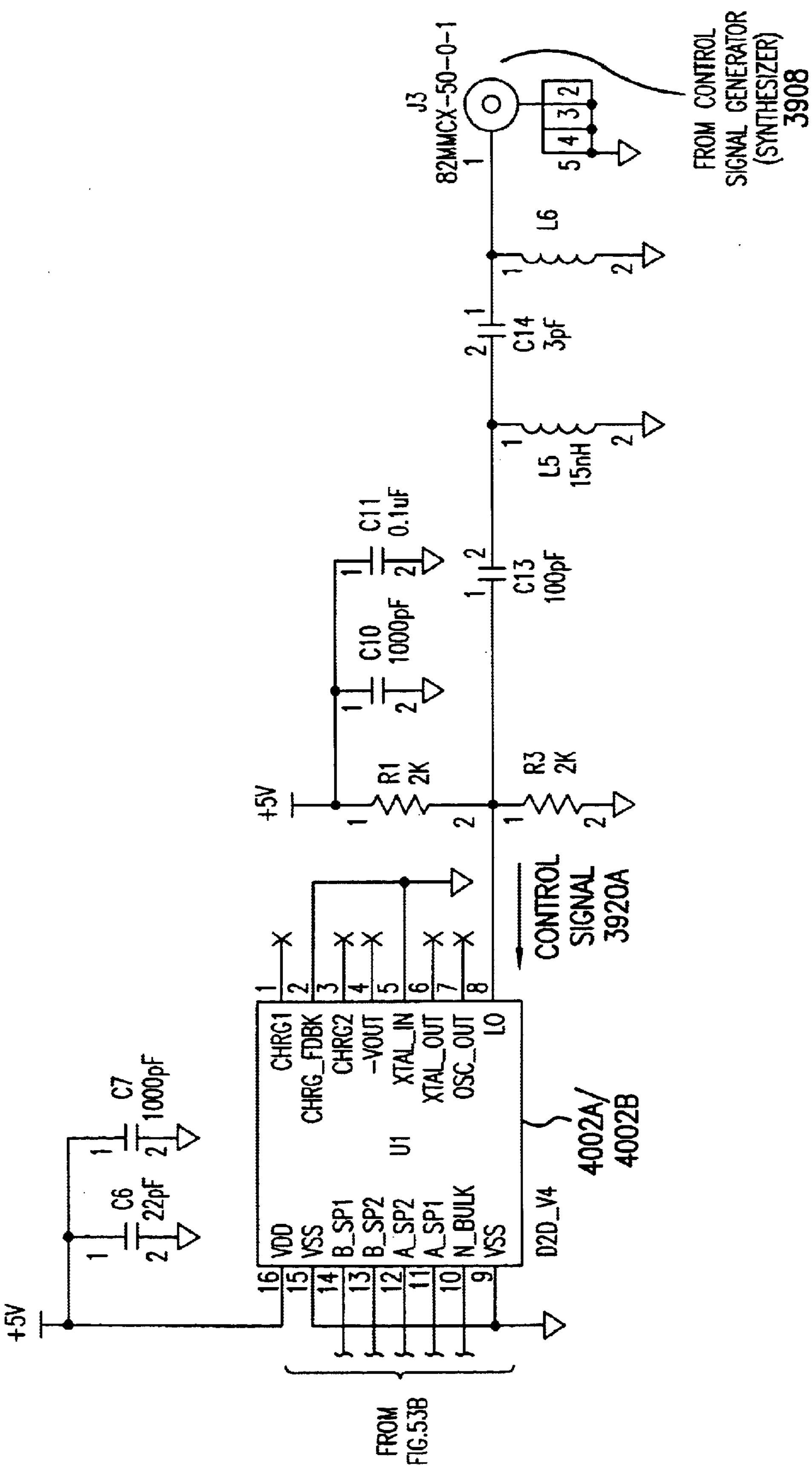

Signal 3924 is split by a 90 degree splitter 4001 to produce an I signal 4006A and Q signal 4006B that are preferably 90 degrees apart in phase. I and Q signals 4006A, 4006B are down-converted by UFD (universal frequency down-conversion) modules 4002A, 4002B. The UDF modules 4002A, 4002B output down-converted I and Q signals 3926, 3928. The UFD modules 4002A, 4002B each includes at least one UFT (universal frequency translation) module 4004A. UFD and UFT modules are described above. An example implementation of the receiver 3906 (vector demodulator) is shown in FIG. 53. An example BOM list for the receiver 3906 of FIG. 53 is shown in FIG. 54.

The demodulator/modulator facilitation module 3912 receives the I and Q signals 3926, 3928. The demodulator/modulator facilitation module 3912 amplifies and filters the land Q signals 3926, 3928. The demodulator/modulator facilitation module 3912 also performs automatic gain control (AGC) functions. The AGC function is coupled with the universal frequency translation technology described herein. The demodulator/modulator facilitation module 3912 outputs processed I and Q signals 3930, 3932.

The MAC interface 3914 receives the processed I and Q signals 3930, 3932. The MAC interface 3914 preferably includes a baseband processor. The MAC interface 3914 preferably performs functions such as combining the I and Q signals 3930, 3932, and arranging the data according to the protocol/file formal being used. Other functions performed by the MAC interface 3914 and the baseband processor contained therein will be apparent to persons skilled in the relevant art(s) based on the teachings contained herein. The MAC interface 3914 outputs the baseband information signal, which is received and processed by the computer 3916 in an implementation and application specific manner.

In the example embodiment of FIG. 39, the demodulation function is distributed among the receiver 3906, the demodulator/modulator facilitation module 3912, and a baseband processor contained in the MAC interface 3914. The functions collectively performed by these components include, but are not limited to, despreading the information, differentially decoding the information, tracking the carrier phase, descrambling, recreating the data clock, and combining the I and Q signals. The invention is not limited to this arrangement. These demodulation-type functions can be centralized in a single component, or distributed in other ways.

The operation of the WLAN interface/modem 3902 when transmitting shall now be described.

A baseband information signal 3936 is received by the MAC interface 3914 from the computer 3916. The MAC interface 3914 preferably performs functions such as splitting the baseband information signal to form I and Q signals 3930, 3932, and arranging the data according to the protocol/file formal being used. Other functions performed by the MAC interface 3914 and the baseband processor contained therein will be apparent to persons skilled in the relevant art(s) based on the teachings contained herein.

The demodulator/modulator facilitation module 3912 filters and amplifies the I and Q signals 3930, 3932. The demodulator/modulator facilitation module 3912 outputs processed I and Q signals 3942, 3944. Preferably, at least some filtering and/or amplifying components in the demodulator/modulator facilitation module 3912 are used for both the transmit and receive paths.

The transmitter 3910 up-converts the processed I and Q signals 3942, 3944, and combines the up-converted I and Q signals. This up-converted/combined signal is amplified by the LNA/PA 3904, and then transmitted via the antenna 3904.

Figure 41:
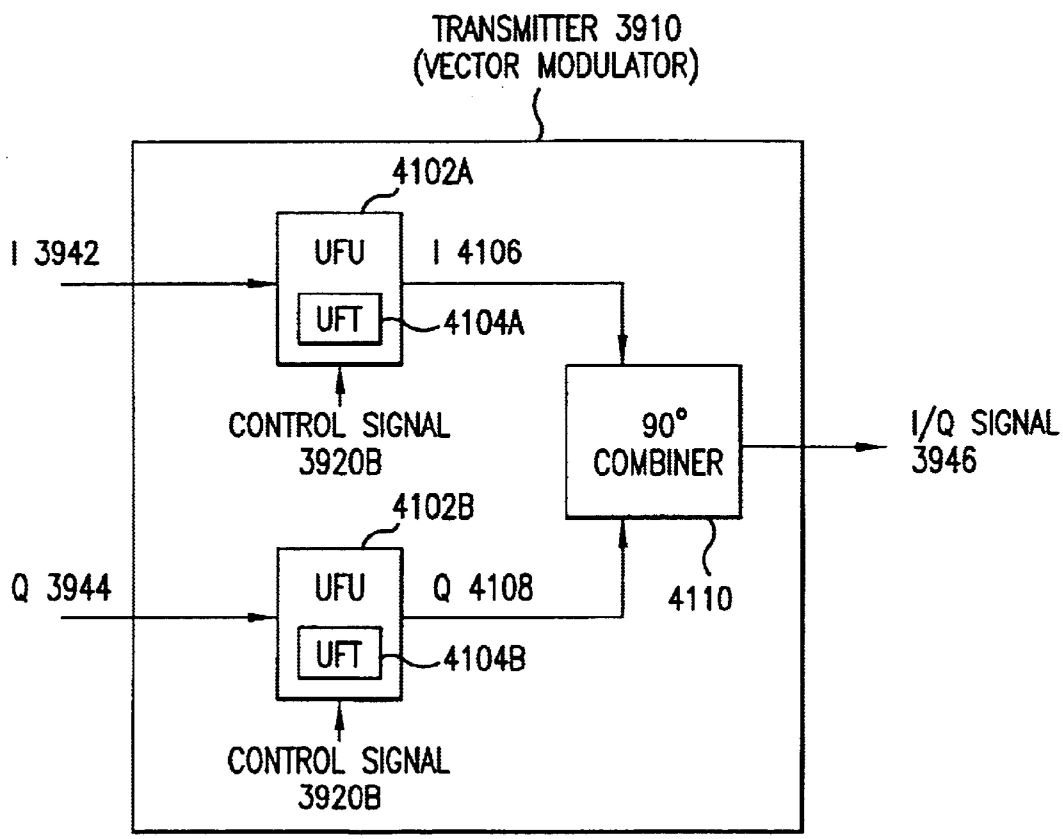
FIG. 41 illustrates a WLAN transmitter according to an embodiment of the invention.

FIG. 41 illustrates an example transmitter 3910 according to an embodiment of the invention. The device in FIG. 41 can also be called a vector modulator. In an embodiment, the "transmit" function performed by the WLAN interface/modem 3902 can be considered to be all processing performed by the WLAN interface/modem 3902 from receipt of baseband information through the LNA/PA 3904. An example implementation of the transmitter 3910 (vector modulator) is shown in FIGS. 57–60. The data conditioning interfaces 5802 in FIG. 58 effectively pre-process the I and Q signals 3942, 3944 before being received by the UFU modules 4102. An example BOM list for the transmitter 3910 of FIGS. 57–60 is shown in FIGS. 61A and 61B.

I and Q signals 3942, 3944 are received by UFU (universal frequency up-conversion) modules 4102A, 4102B. The UFU modules 4102A, 4102B each includes at least one UFT module 4104A, 4104B. The UFU modules 4102A, 4102B up-convert I and Q signals 3942, 3944. The UFU modules 4102A, 4102B output up-converted I and Q signals 4106, 4108. The 90 degree combiner 4110 effectively phase shifts either the I signal 4106 or the Q signal 4108 by 90 degrees, and then combines the phase shifted signal with the unshifted signal to generate a combined, up-converted I/Q signal 3946.

In the example embodiment of FIG. 39, the modulation function is distributed among the transmitter 3910, the demodulator/modulator facilitation module 3912, and a baseband processor contained in the MAC interface 3914. The functions collectively performed by these components include, but are not limited to, differentially encoding data, splitting the baseband information signal into I and Q signals, scrambling data, and data spreading. The invention is not limited to this arrangement. These modulation-type functions can be centralized in a single component, or distributed in other ways.

An example implementation of the transmitter 3910 (vector modulator) is shown in FIGS. 57–60. The data conditioning interfaces 5802 in FIG. 58 effectively pre-process the I and Q signals 3942, 3944 before being received by the UFU modules 4102. An example BOM list for the transmitter 3910 of FIGS. 57–60 is shown in FIGS. 61A and 61B.

The components in the WLAN interface/modem 3902 are preferably controlled by the MAC interface 3914 in operation with the MAC 3918 in the computer 3916. This is represented by the distributed control arrow 3940 in FIG. 39. Such control includes setting the frequency, data rate, whether receiving or transmitting, and other communication characteristics/modes that will be apparent to persons skilled in the relevant art(s) based on the teachings contained herein. In embodiments, control signals are sent over the corresponding wireless medium and received by the antenna 3904, and sent to the MAC 3918.

Figure 42A:
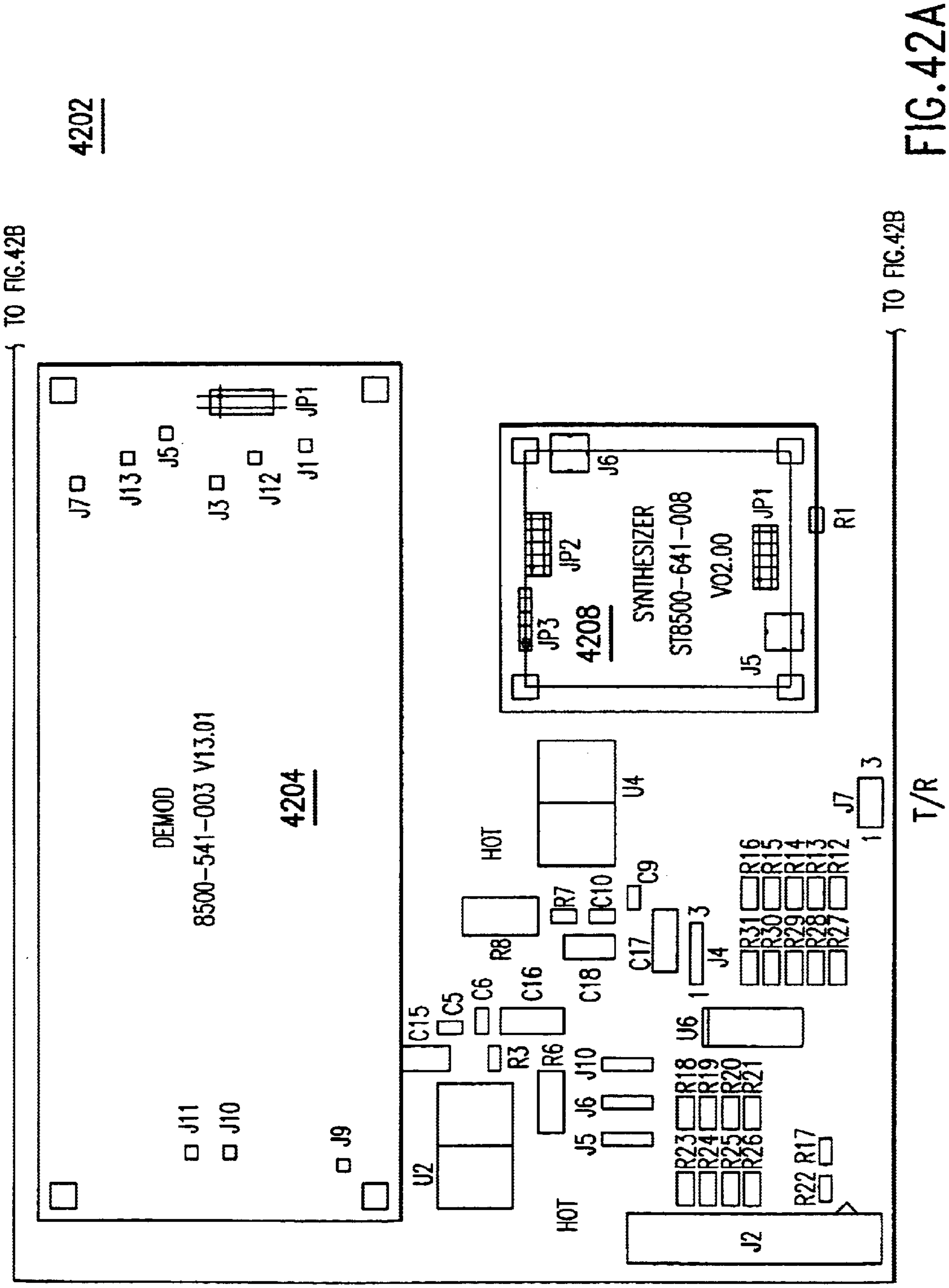
FIGS. 42–44 are example implementations of a WLAN interface.
Figure 42B:
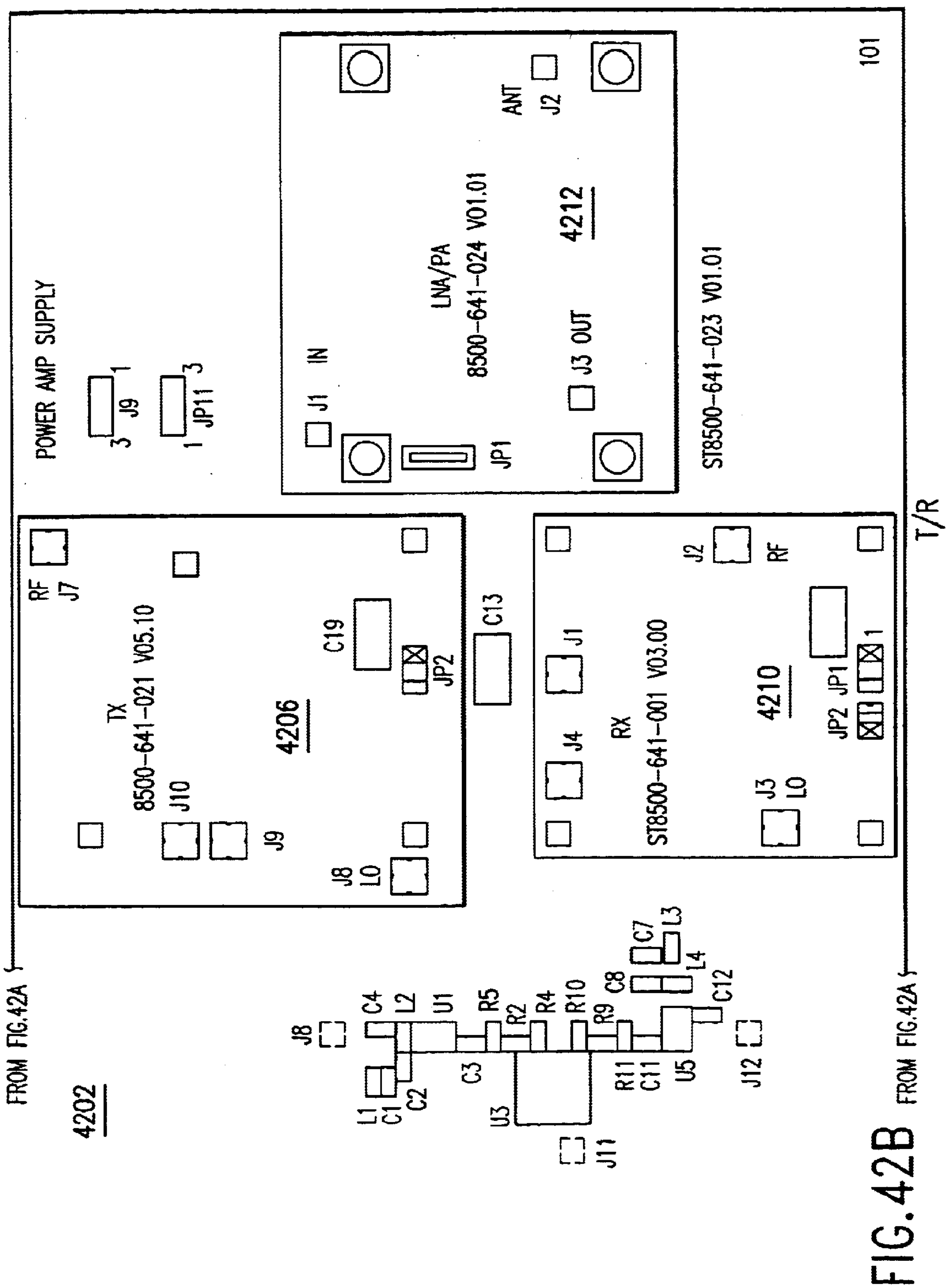
Figure 62:
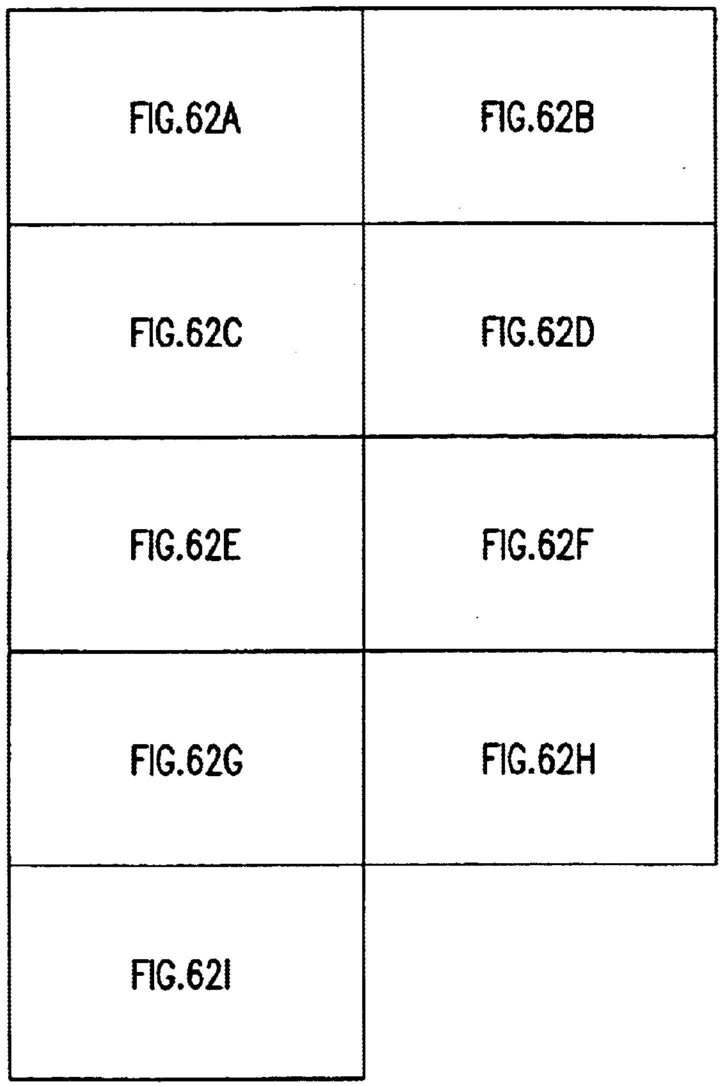
Figure 62A:
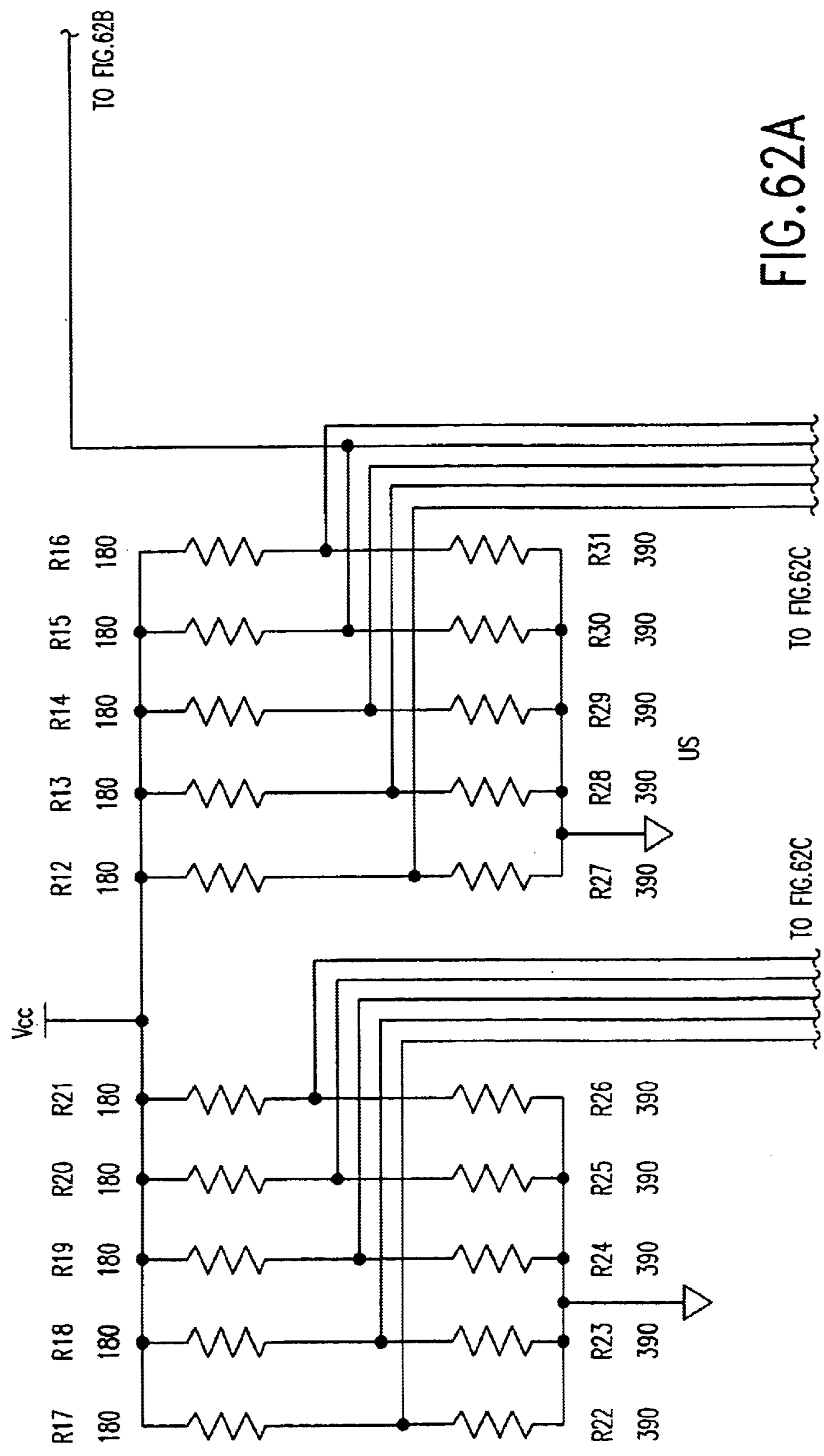
Figure 62B:
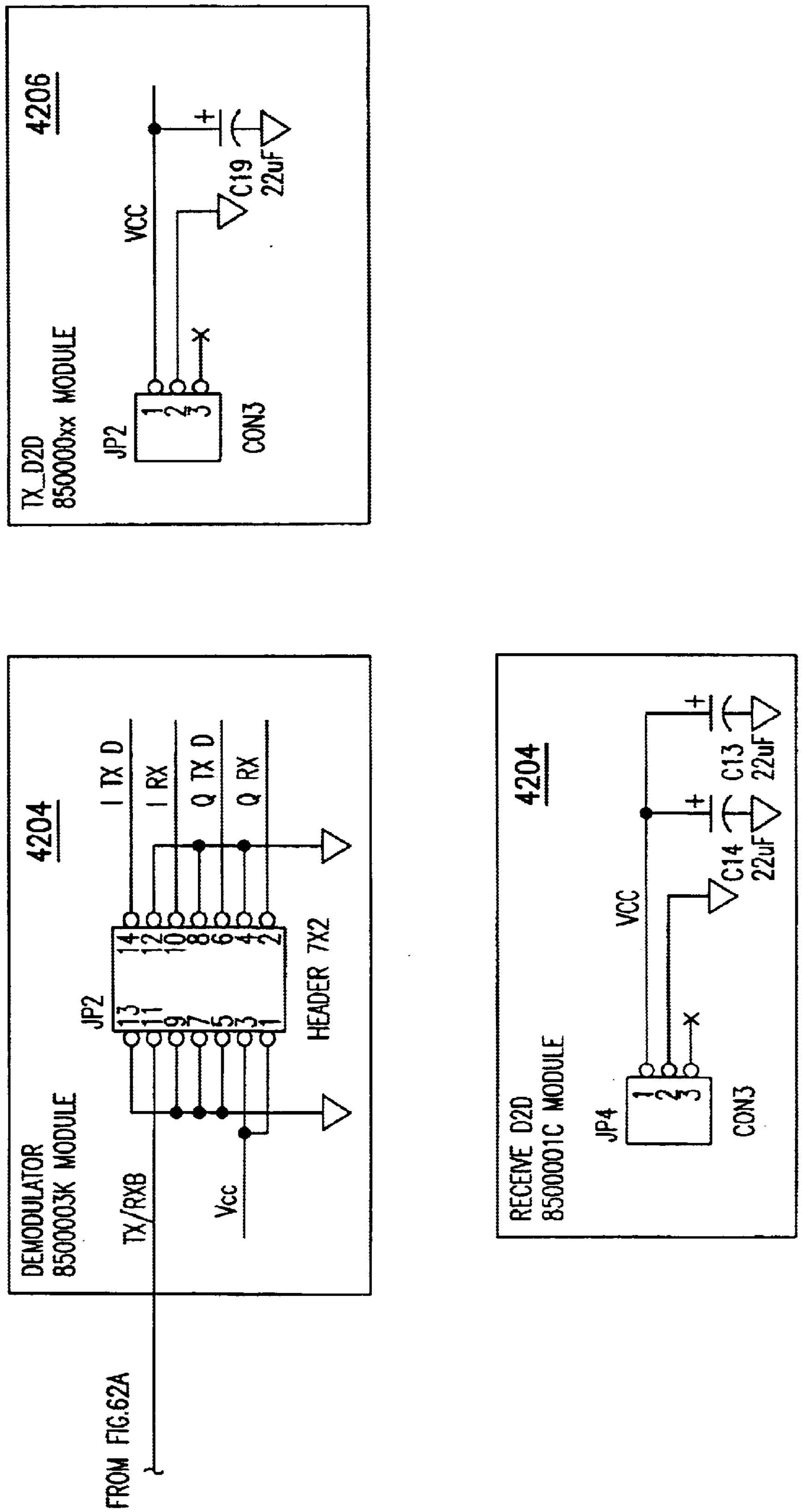
Figure 62C:
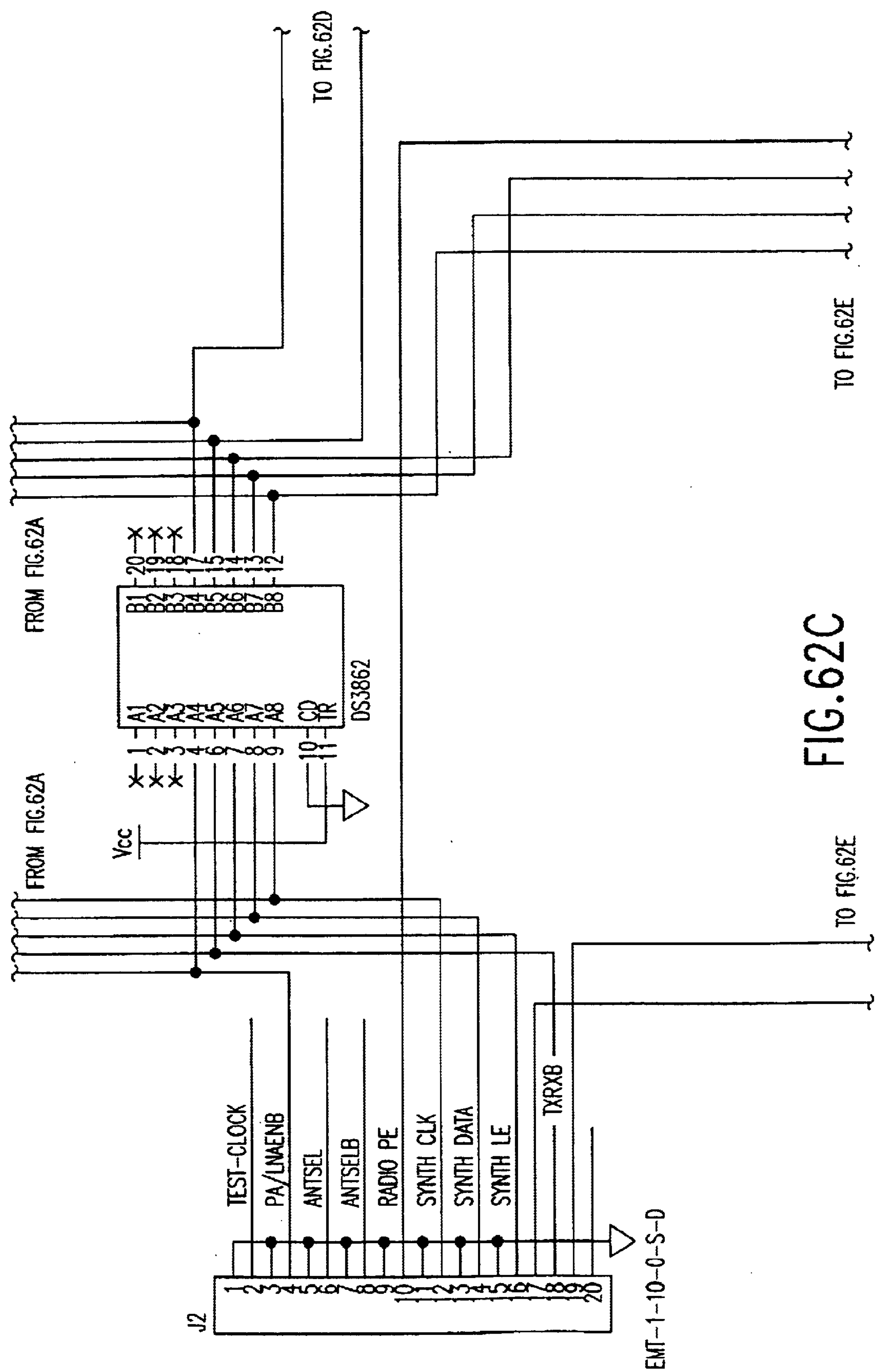
Figure 62D:
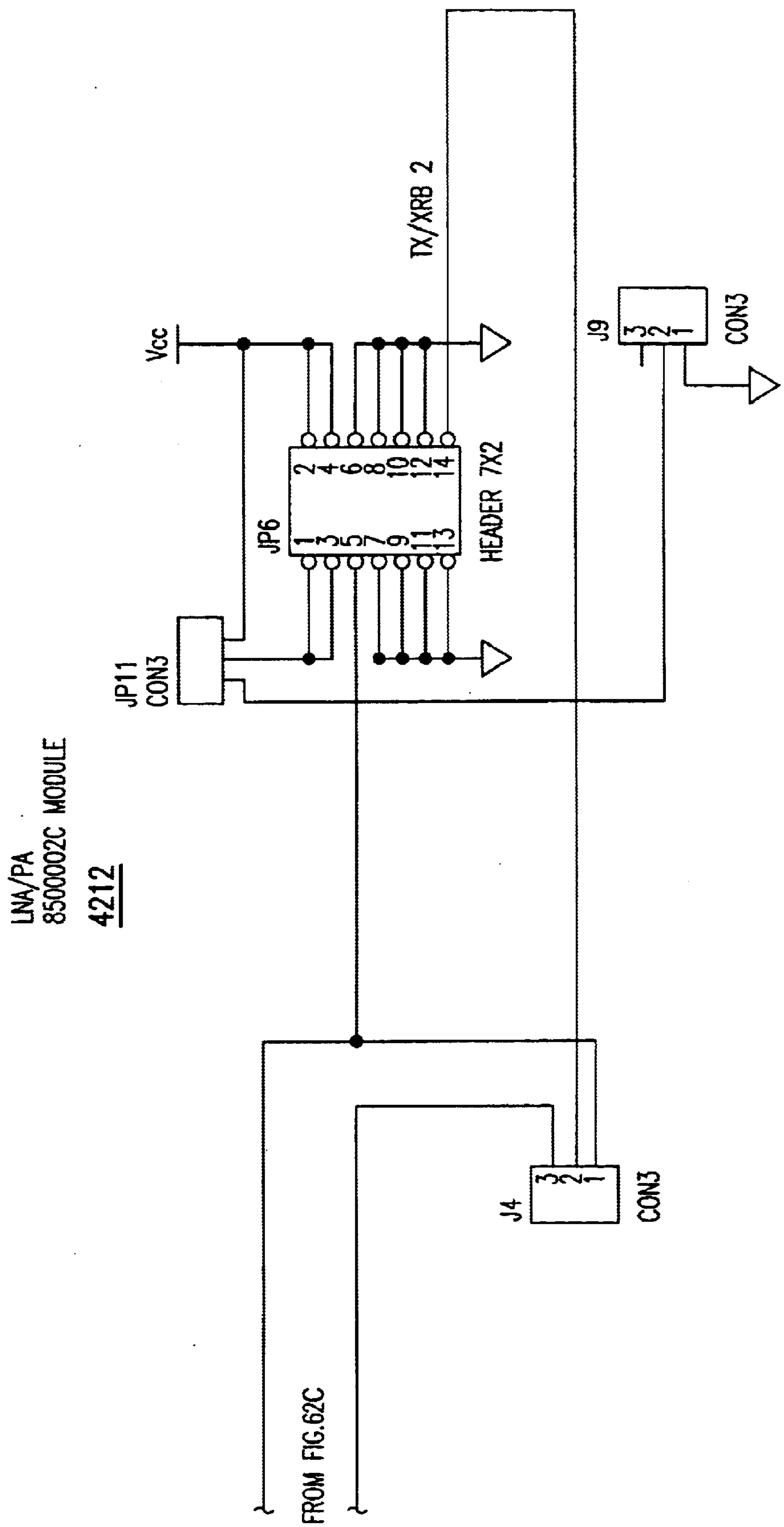
Figure 62E:
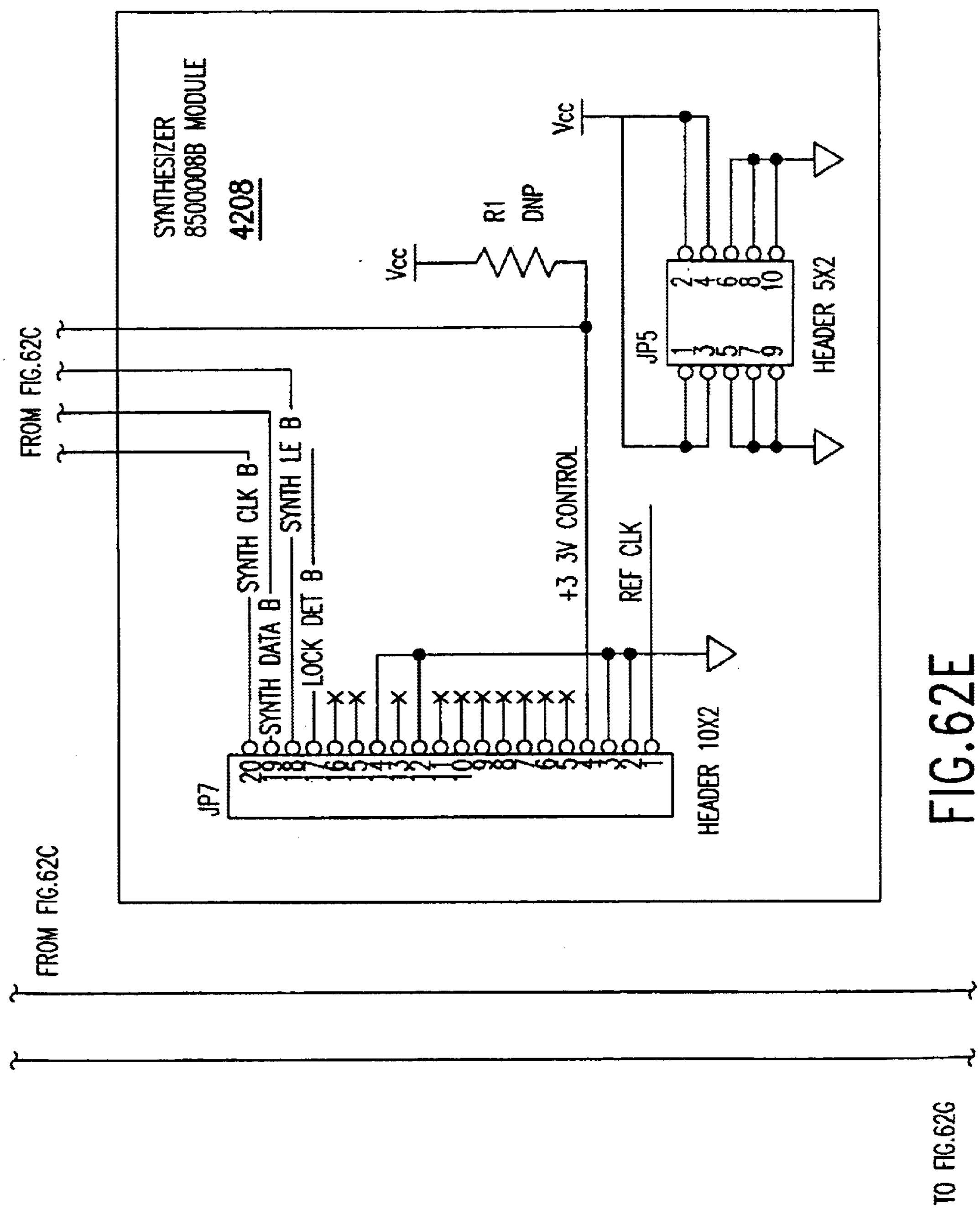
Figure 62F:
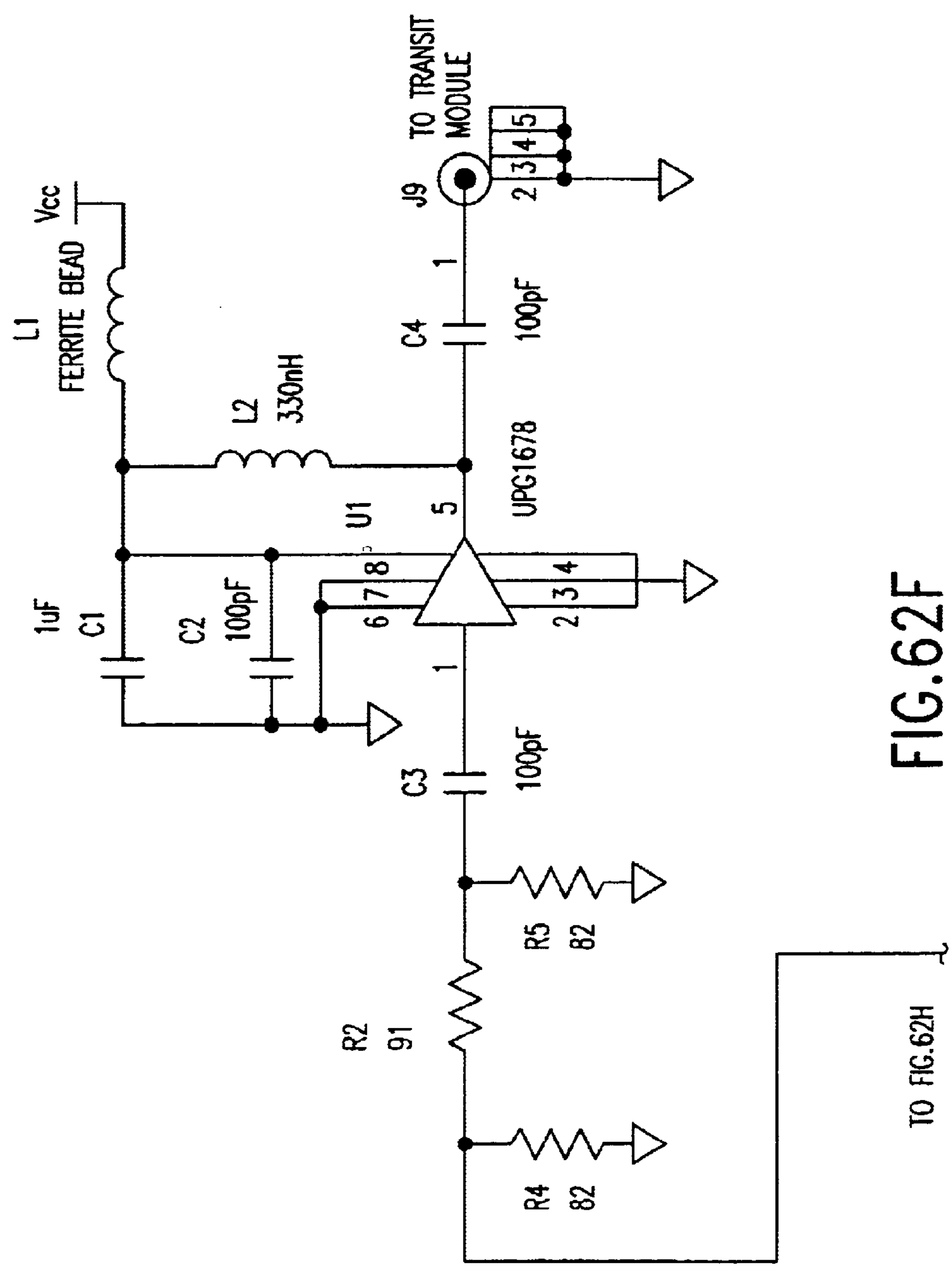
Figure 62G:
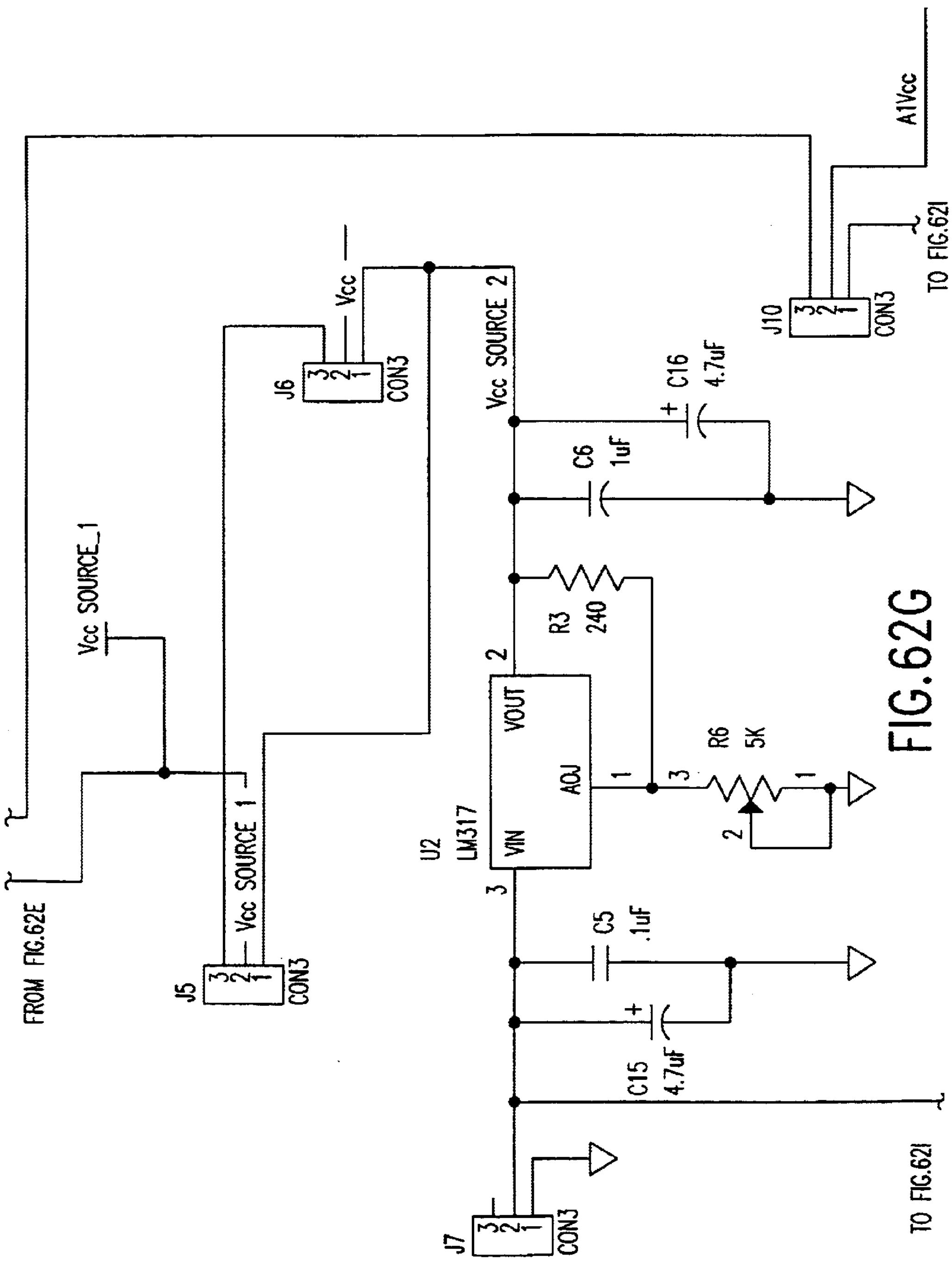
Figure 62H:
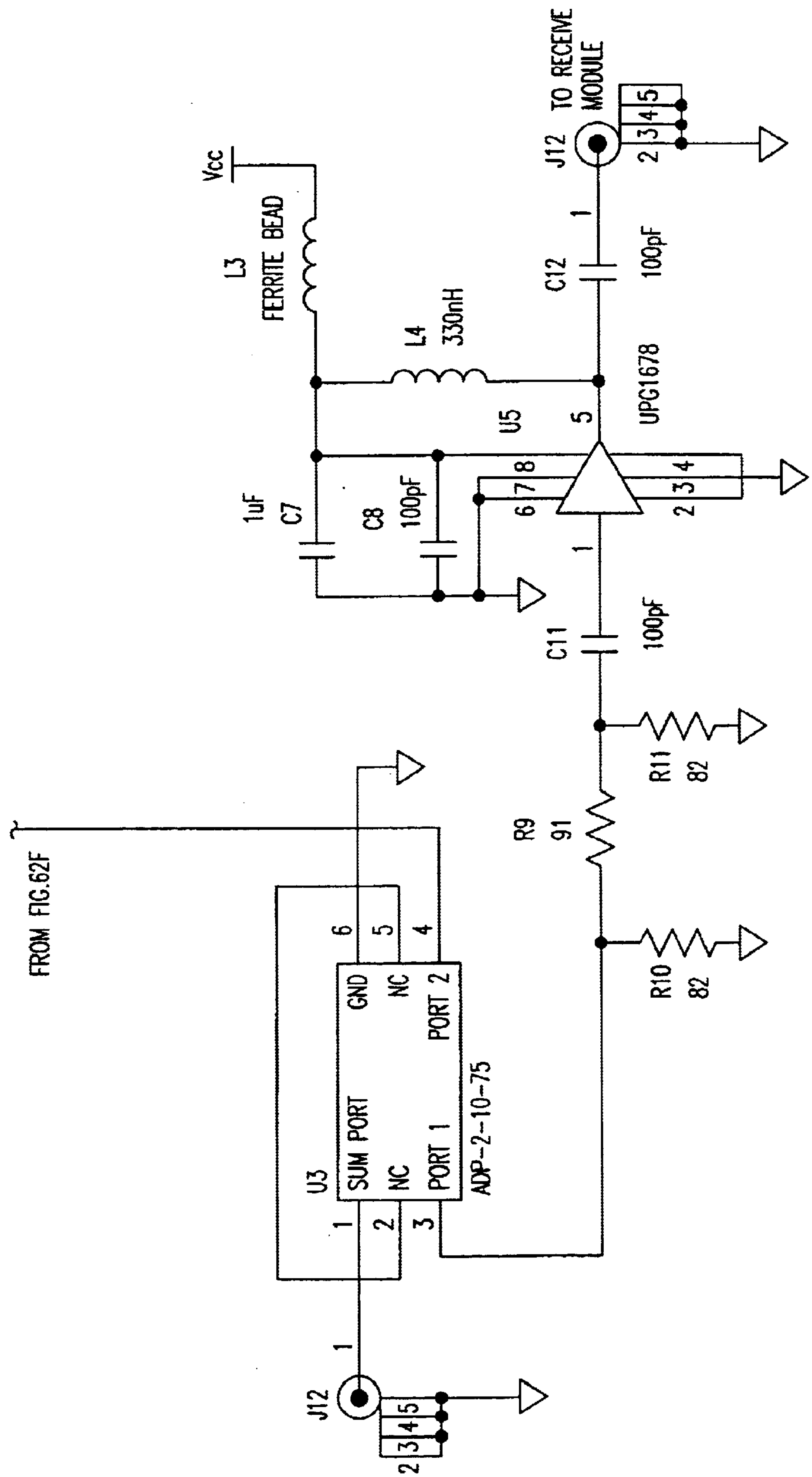
Figure 62I:
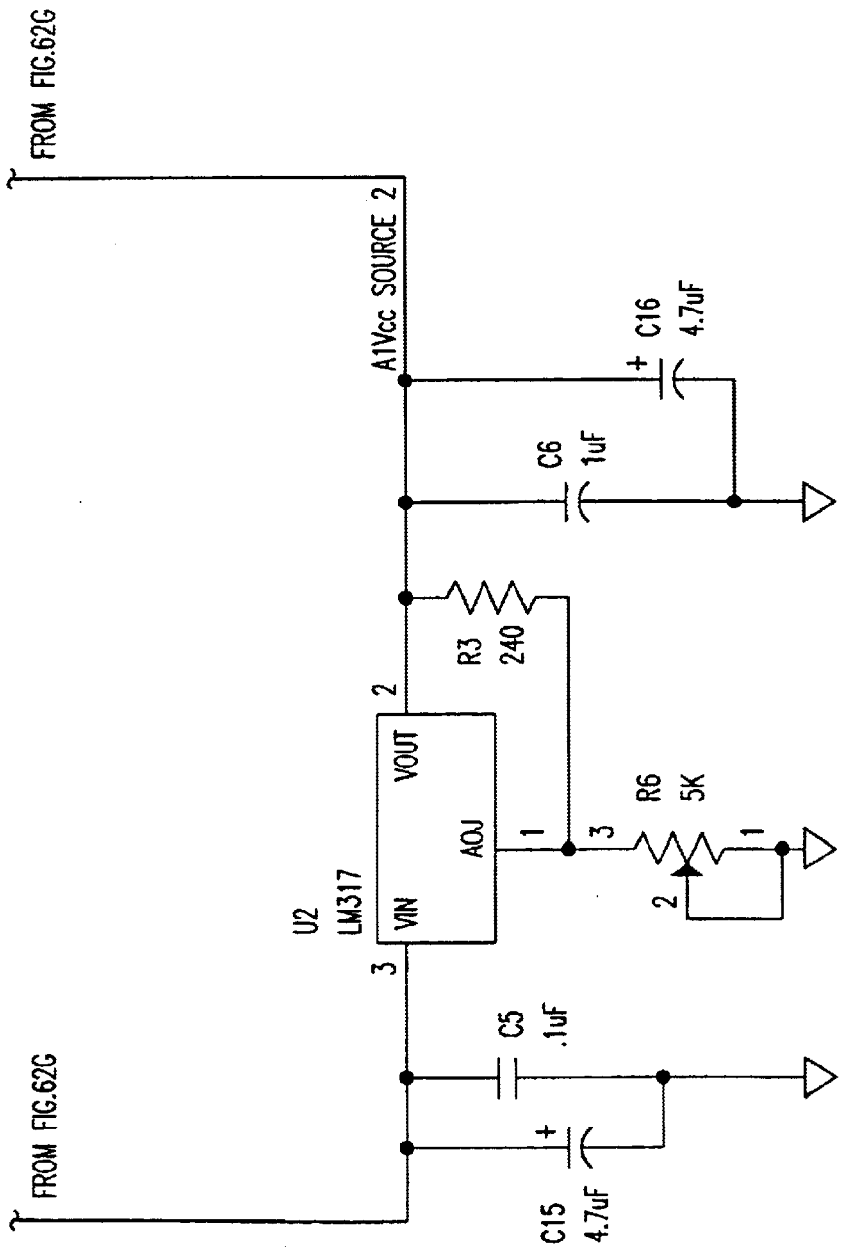

FIG. 42 illustrates an example implementation of the WLAN interface/modem 3902. It is noted that in this implementation example, the MAC interface 3914 is located on a different board. FIG. 62 is an example motherboard corresponding to FIG. 42. FIG. 63 is an example bill-of-materials (BOM) list for the motherboard of FIG. 62. This and other implementations are provided herein for example purposes only. Other implementations will be apparent to persons skilled in the relevant art(s), and the invention is directed to such other implementations.

Figure 102:
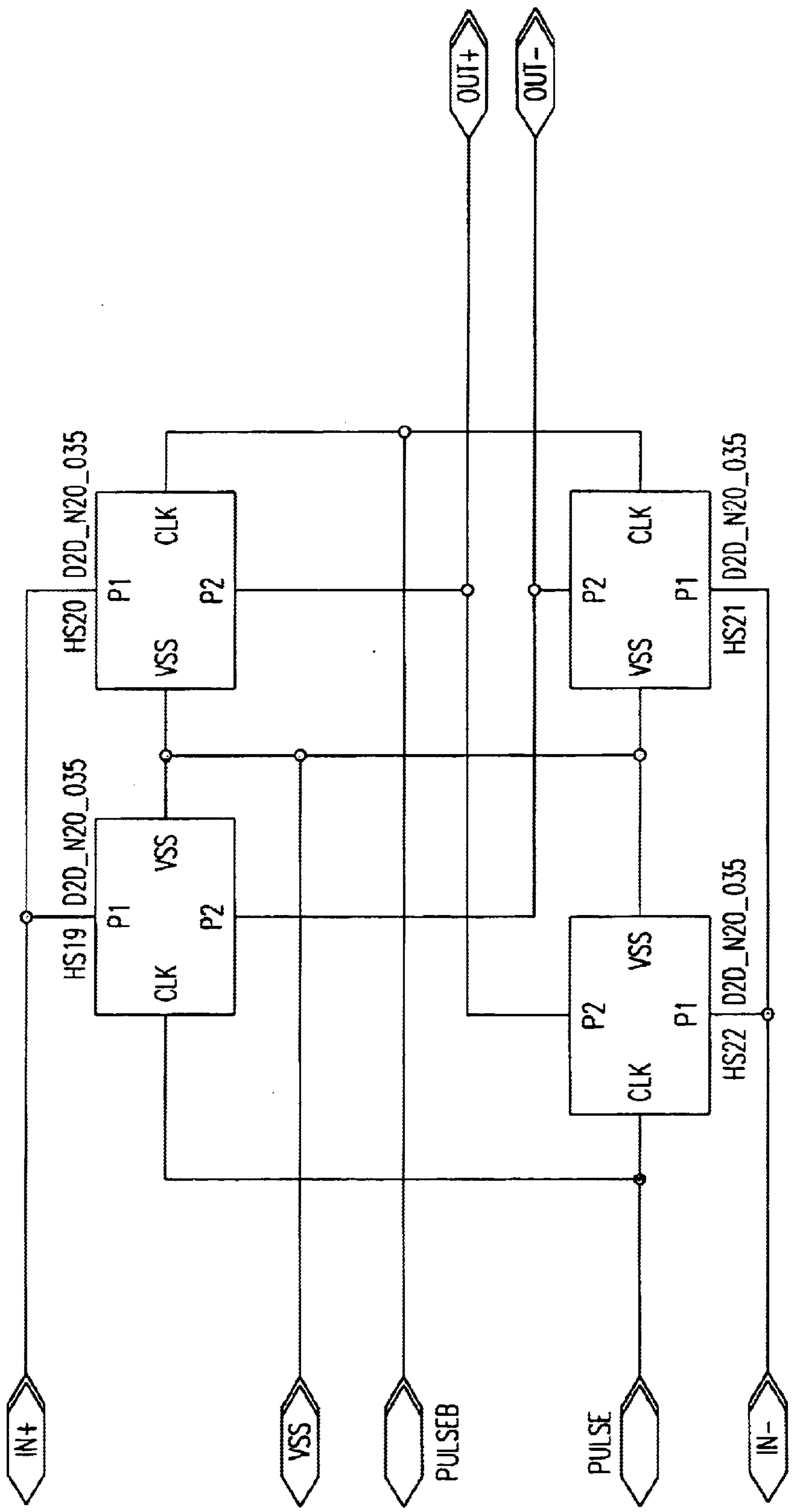
Figure 103:
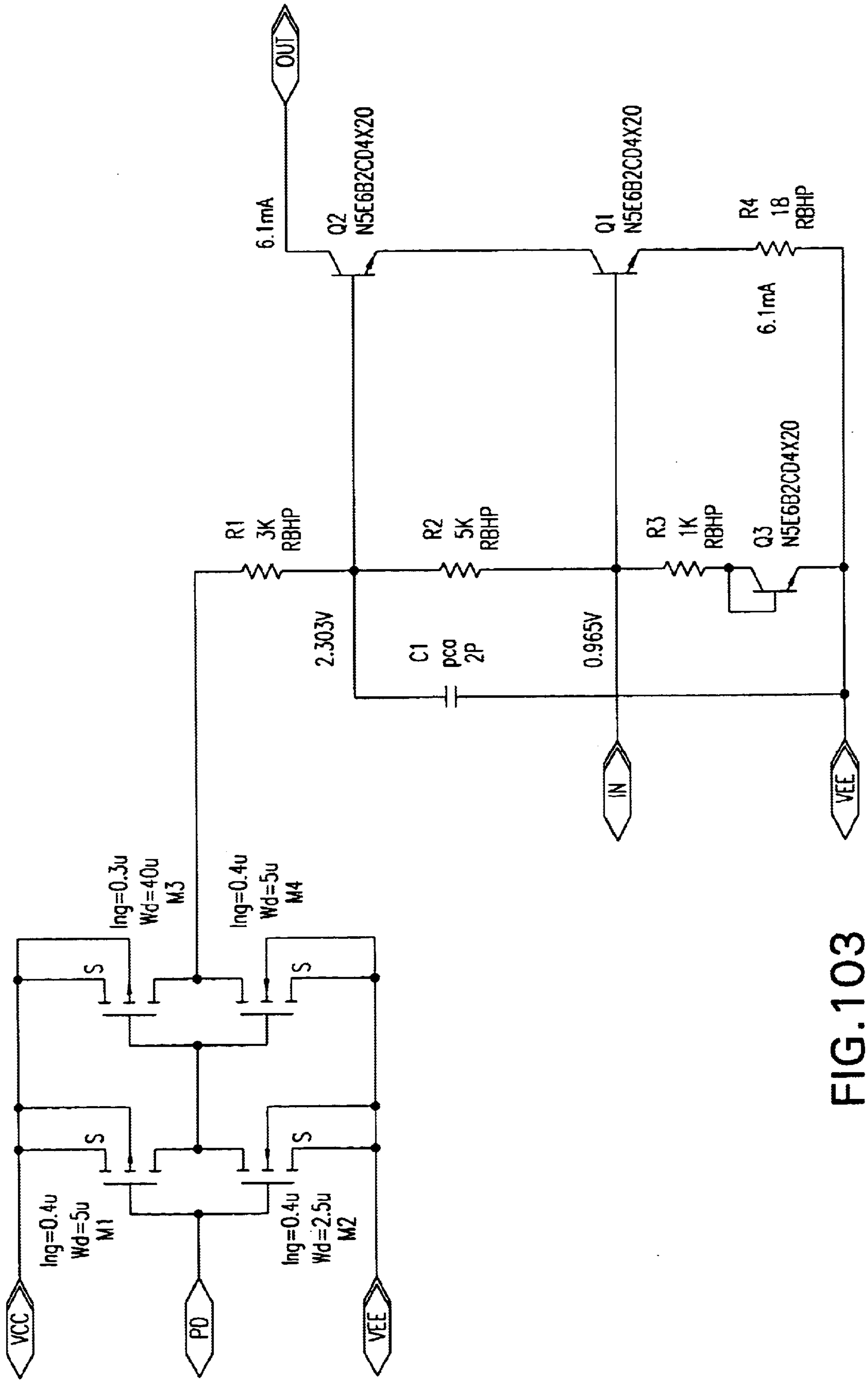
Figure 104:
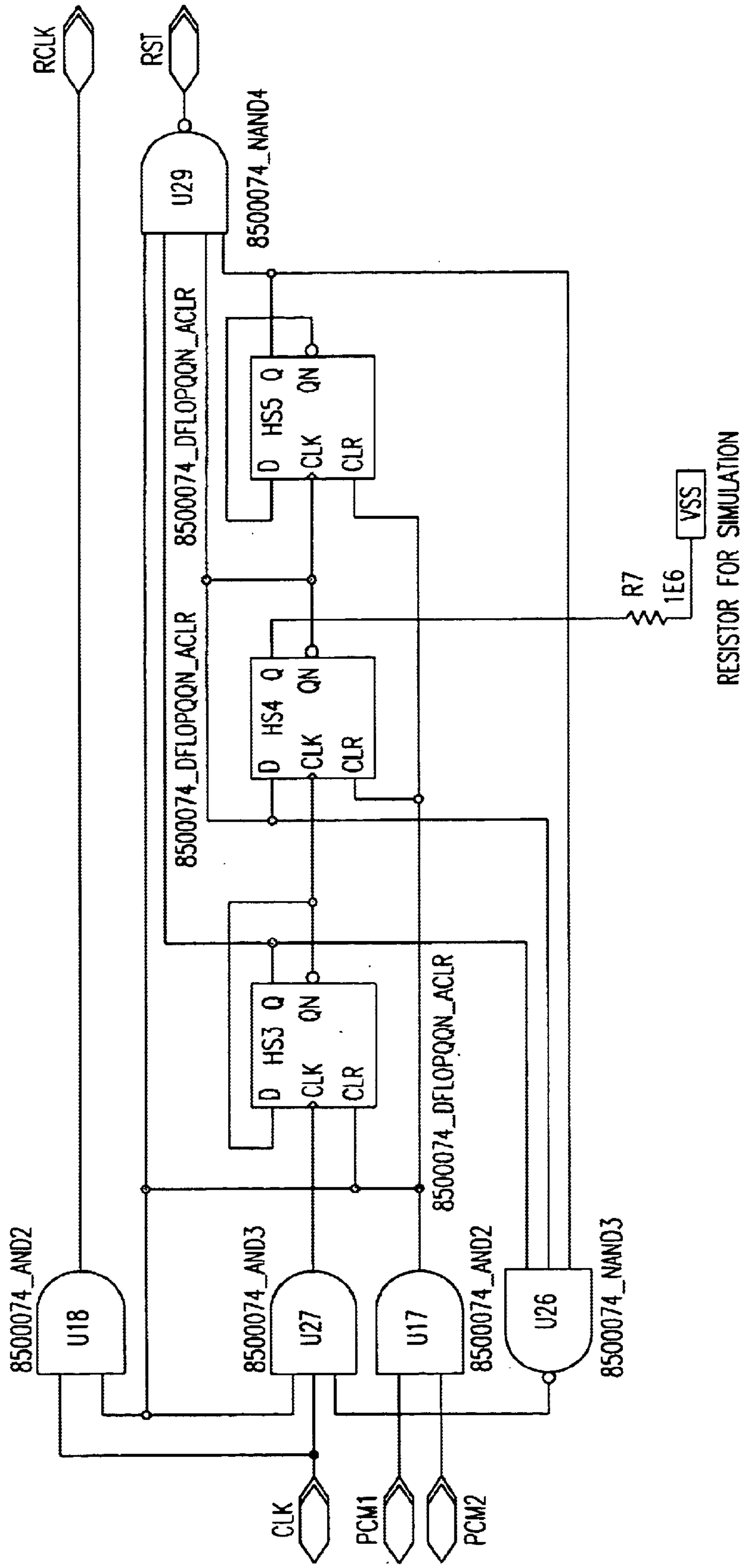
Figure 105:
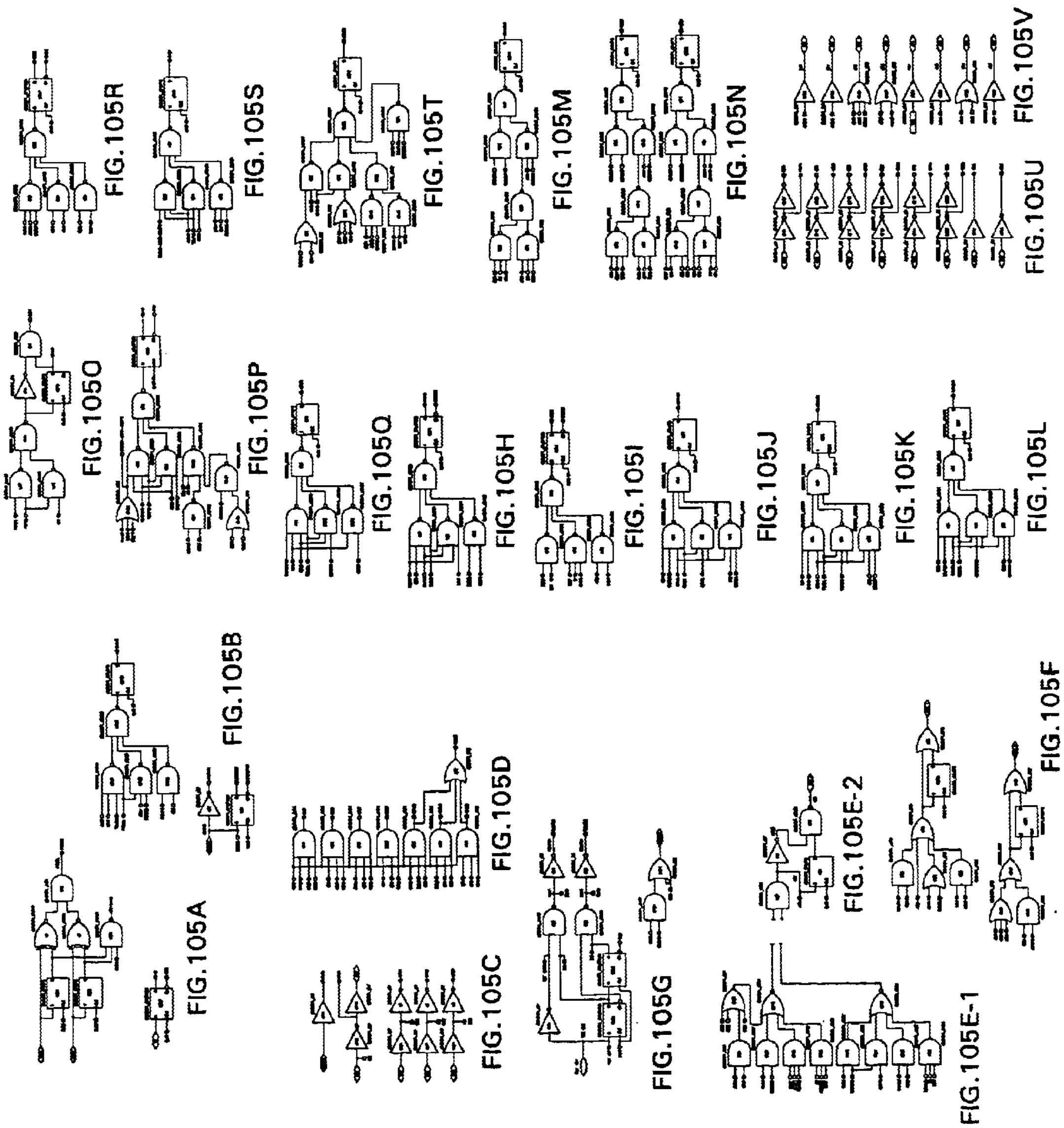
FIG. 105 includes FIGS. 105A–D, 105 E1-E2, and 105F–V, and should be referred to for all references to FIG. 105 in the specification.
Figure 105A:
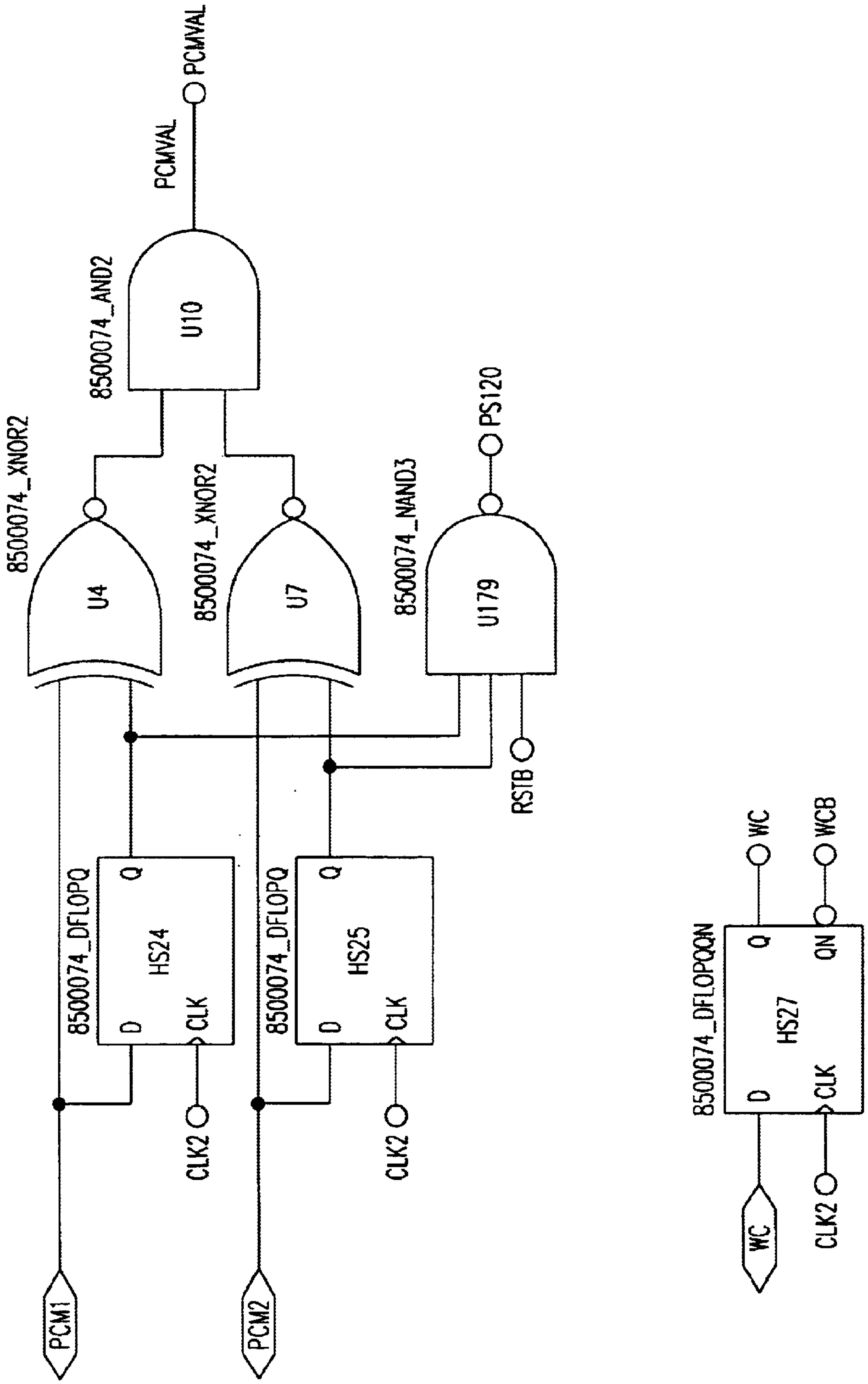
Figure 105B:
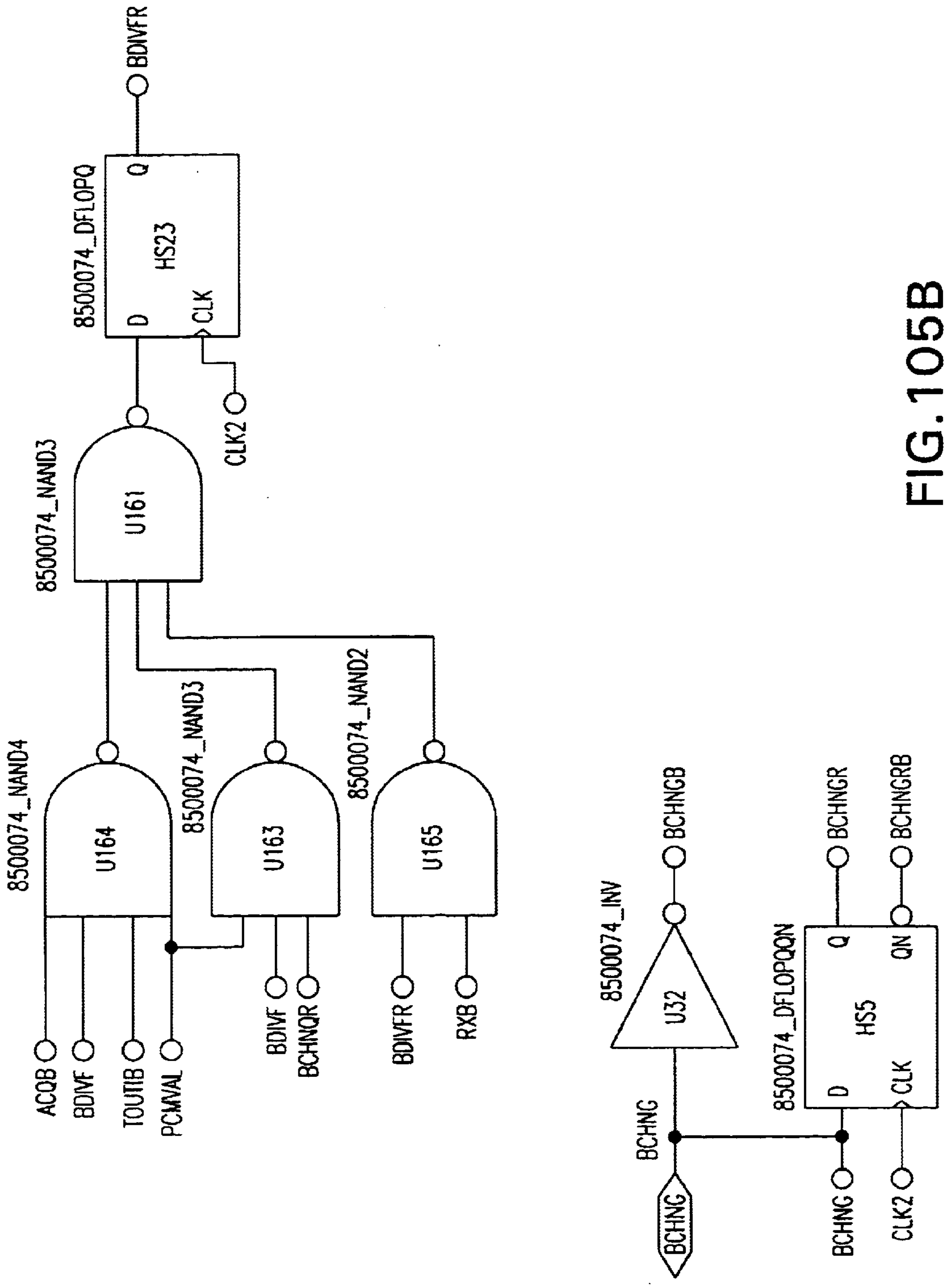
Figure 105C:
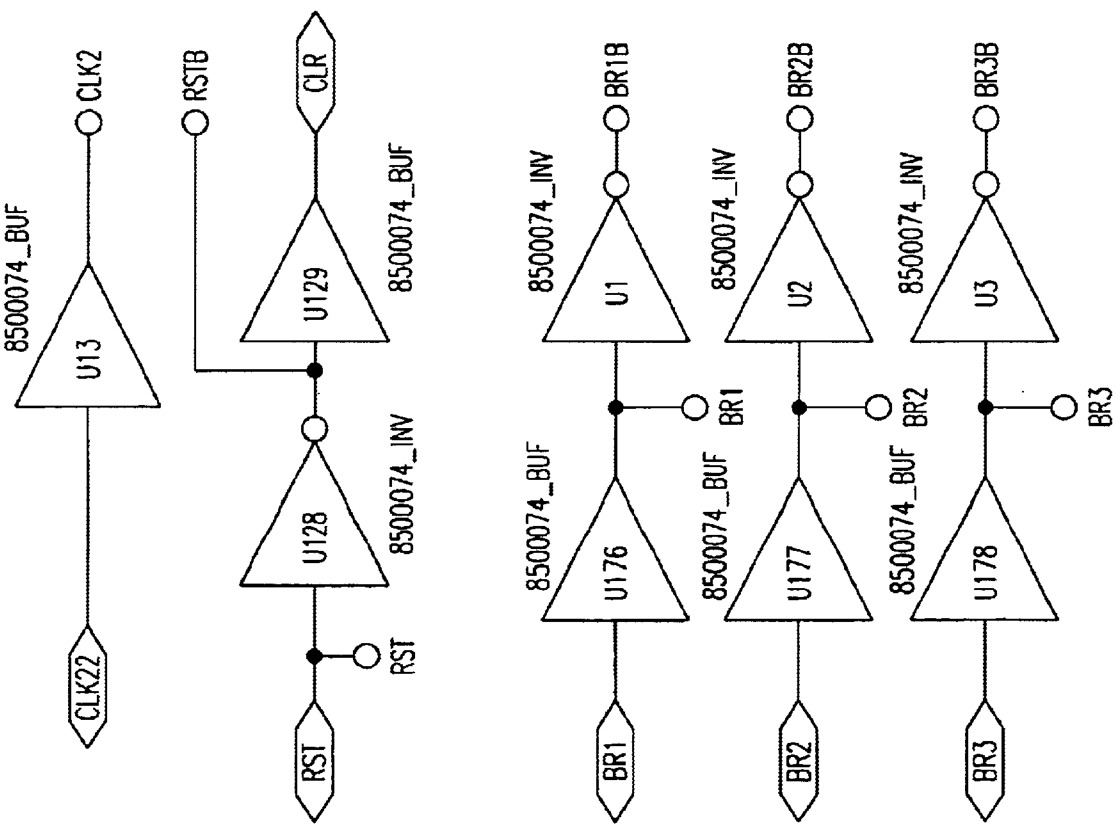
Figure 105D:
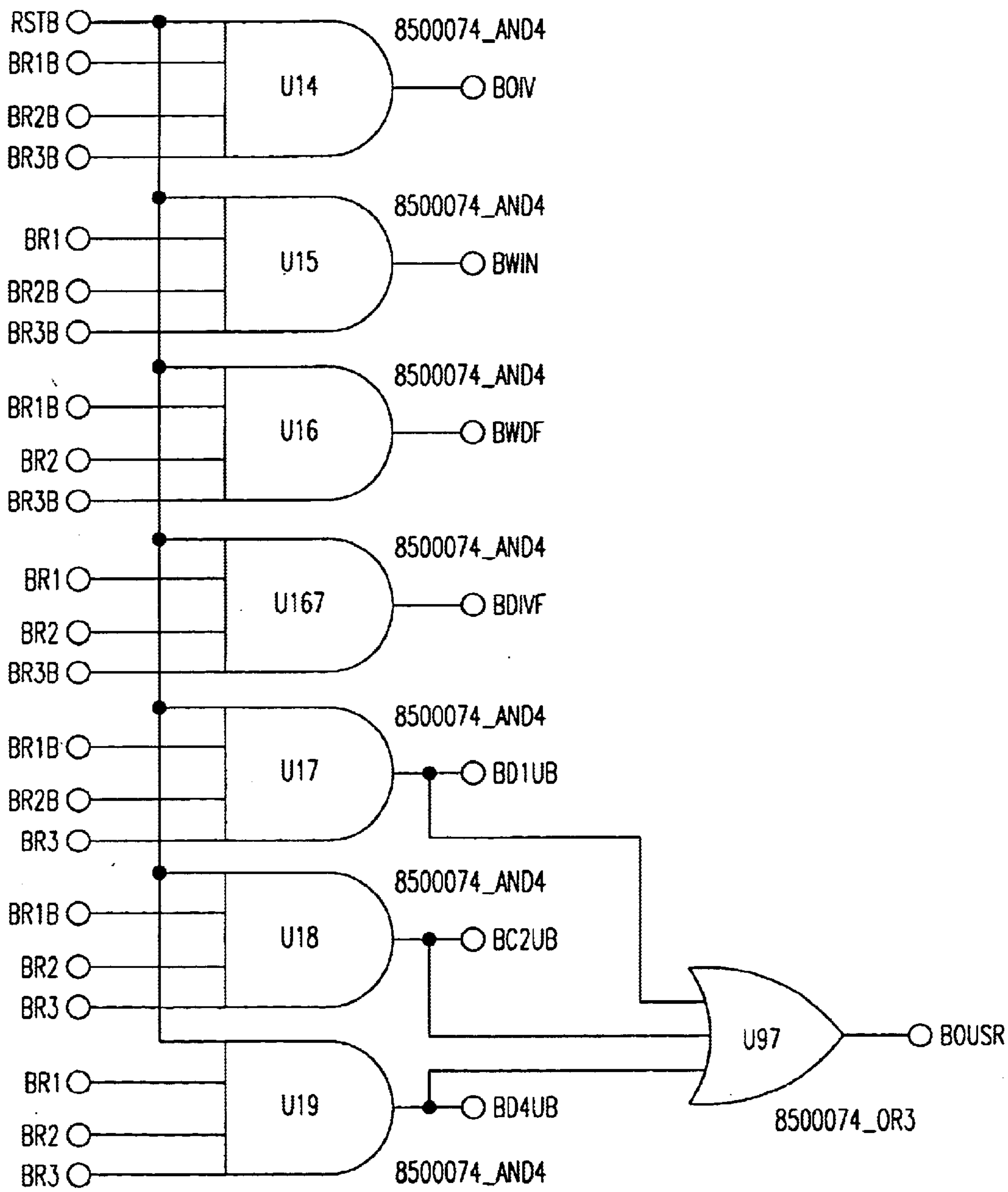
Figures 1, 105E:
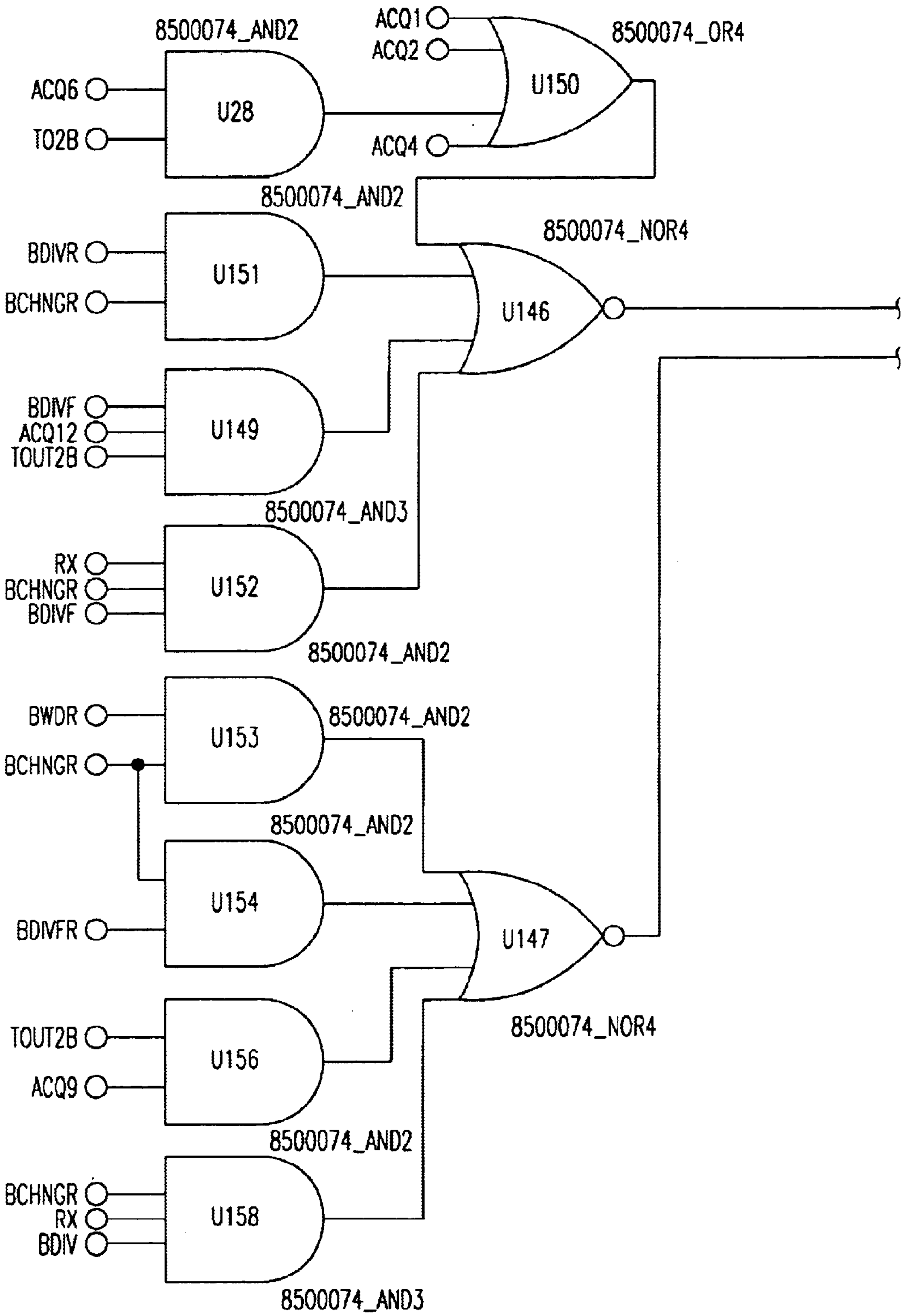
Figures 2, 105E:
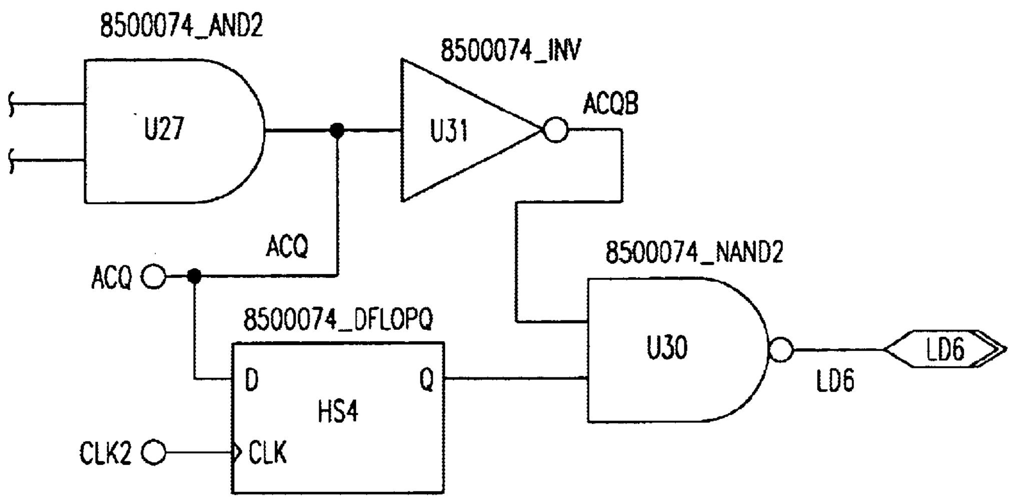
Figure 105F:
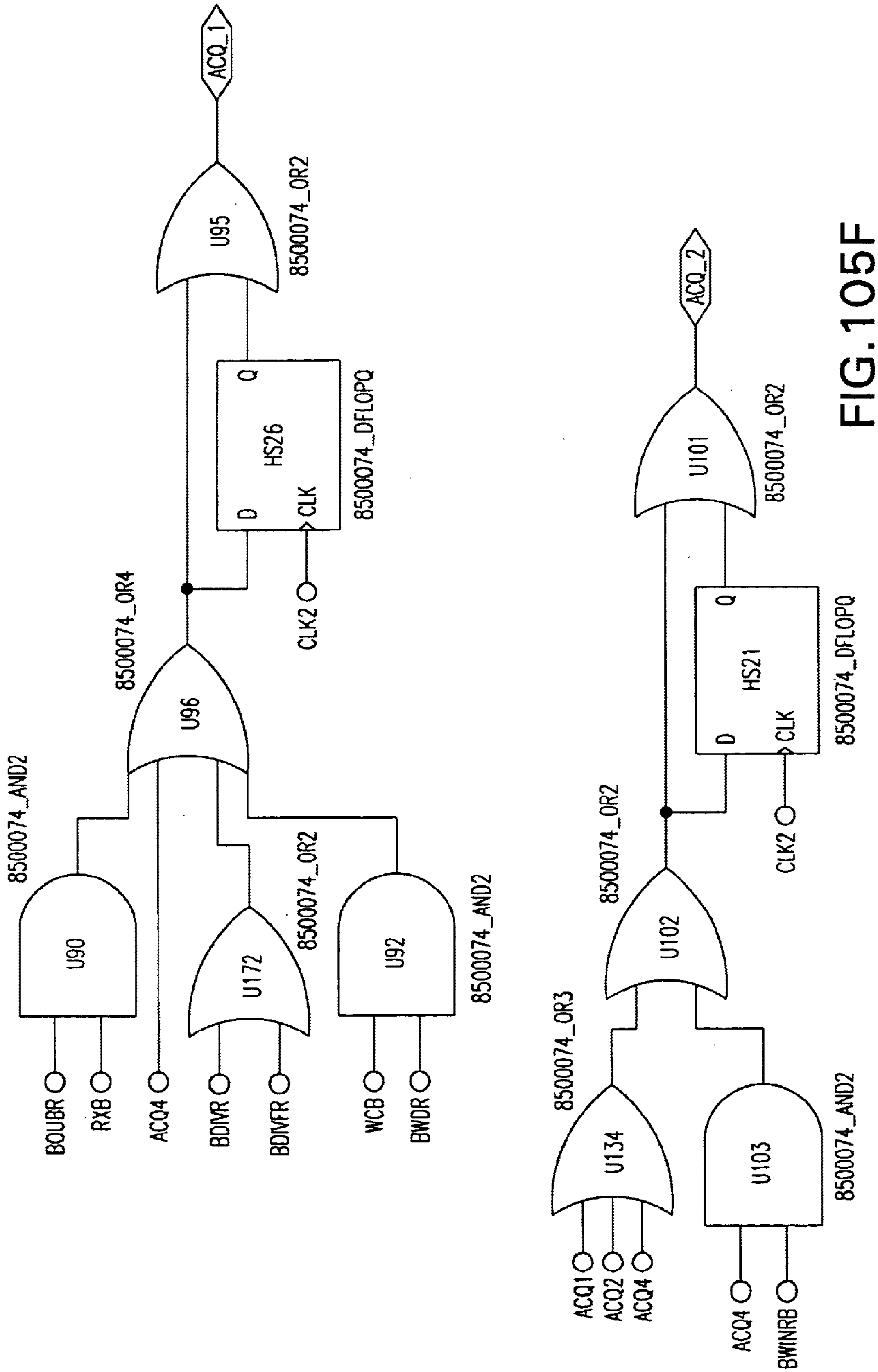
Figure 105G:
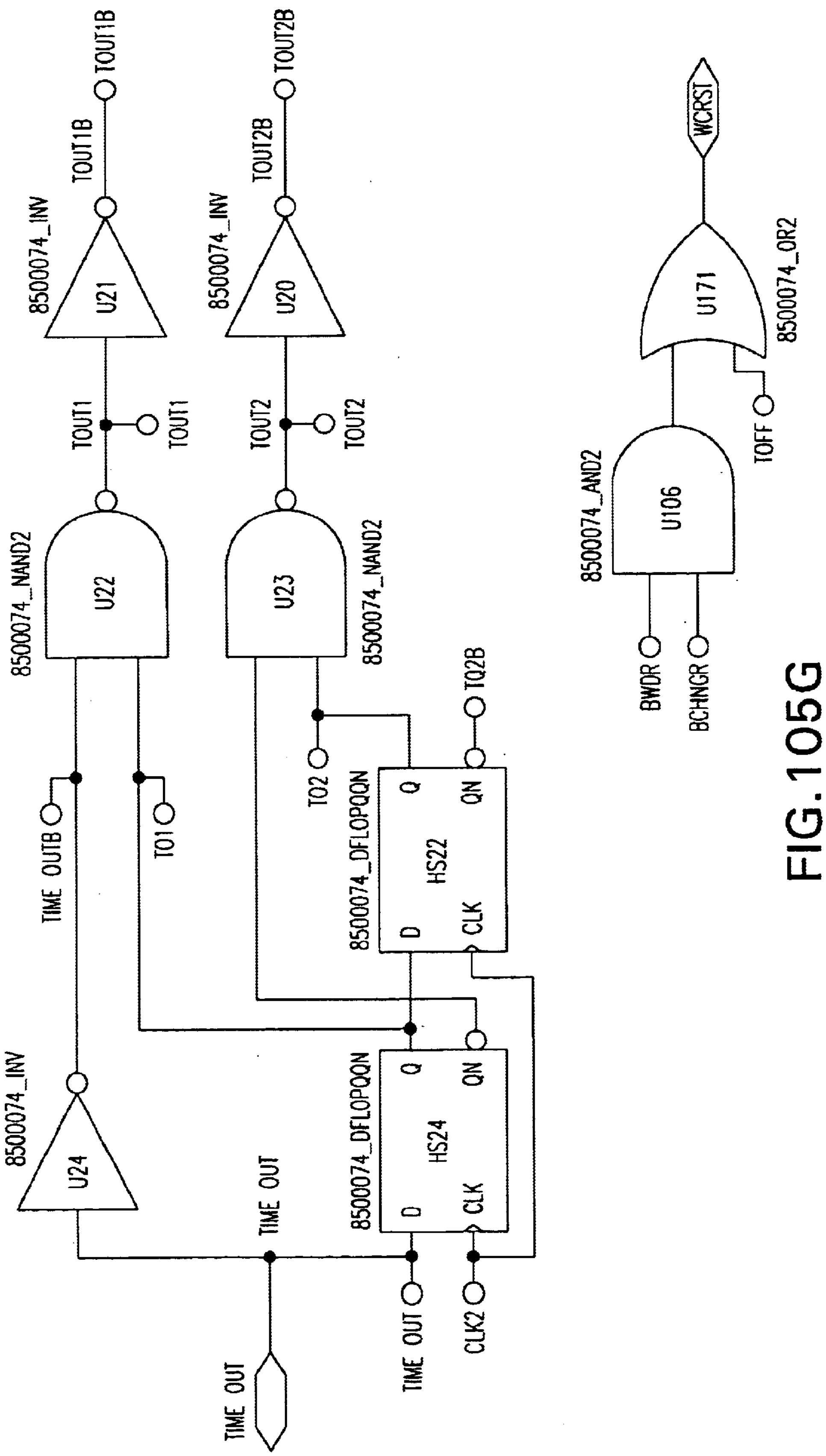
Figure 105H:
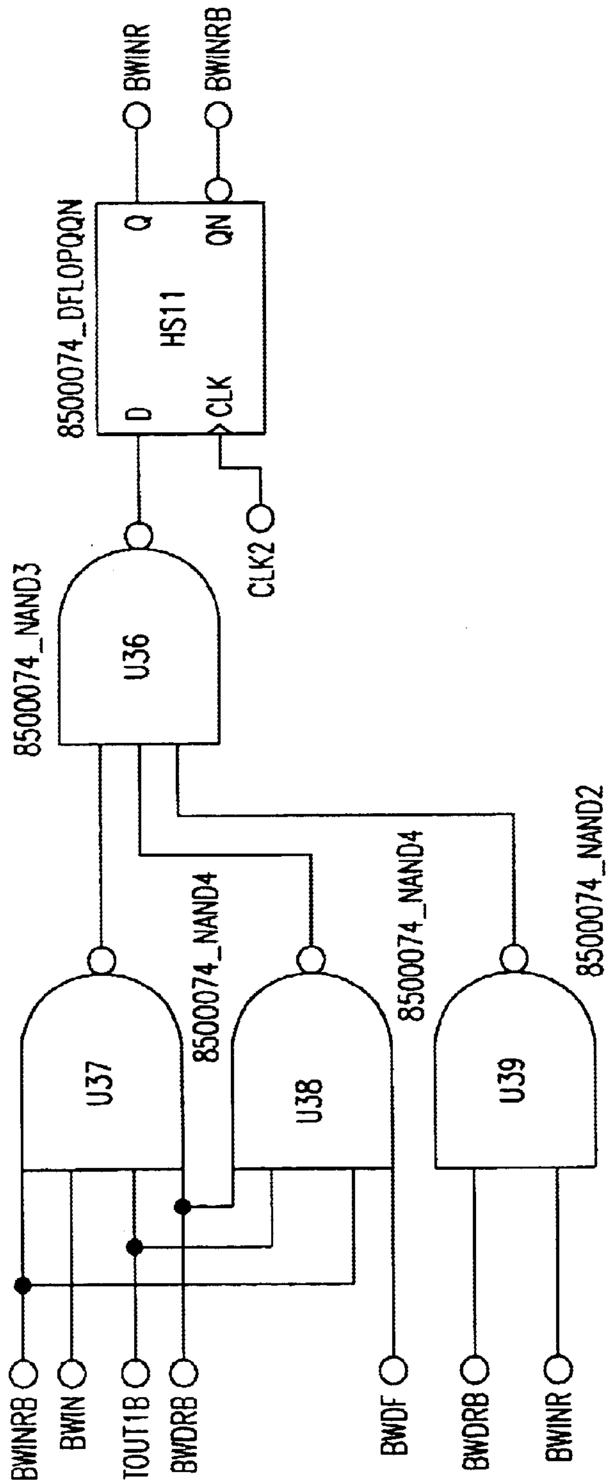
Figure 105I:
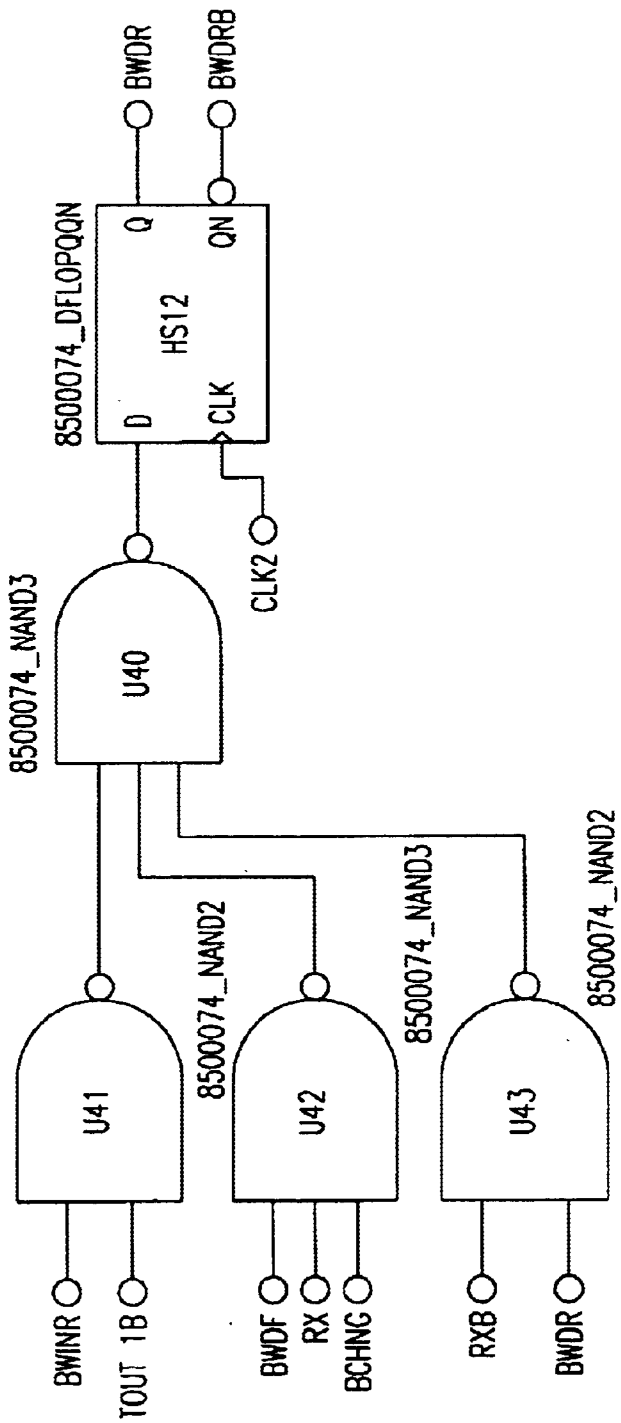
Figure 105J:
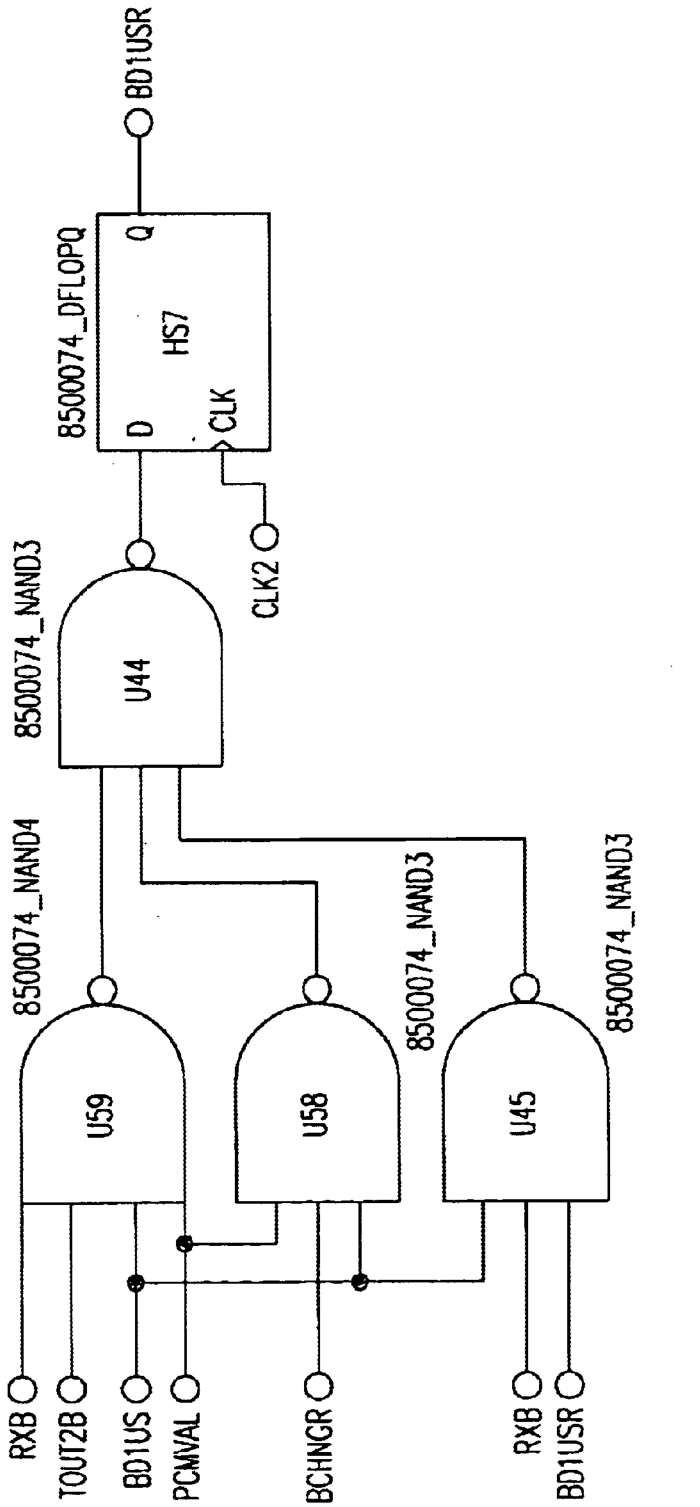
Figure 105K:
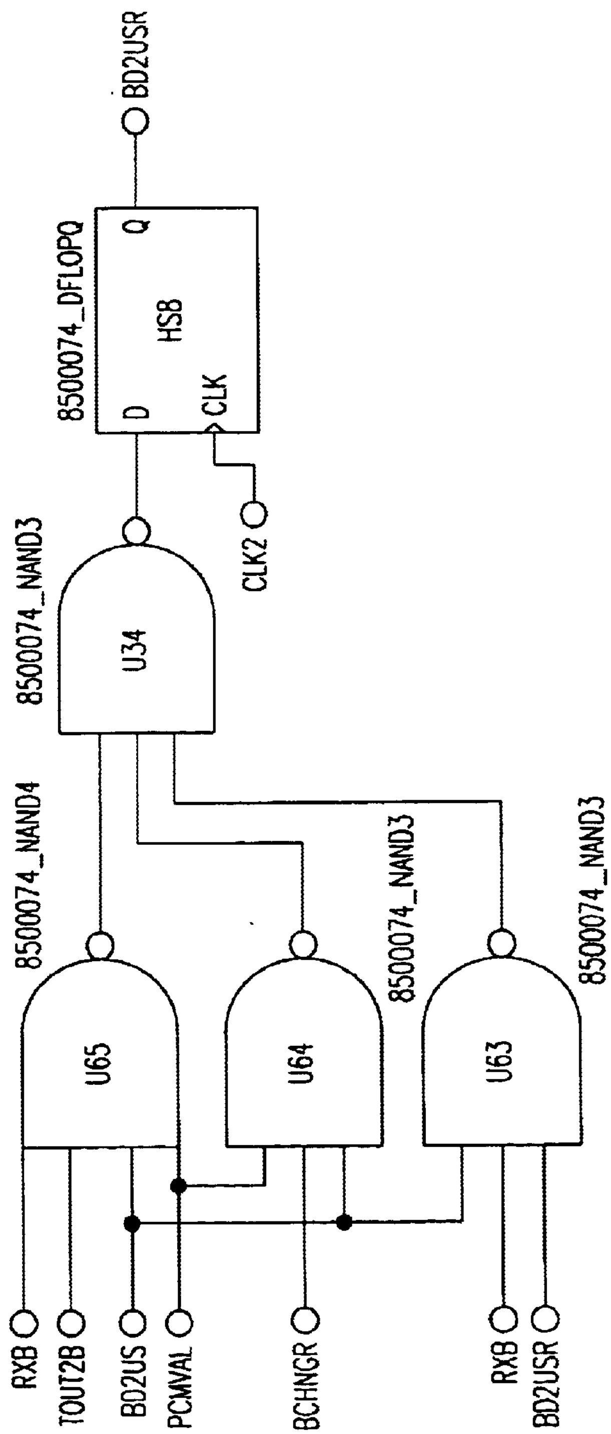
Figure 105L:
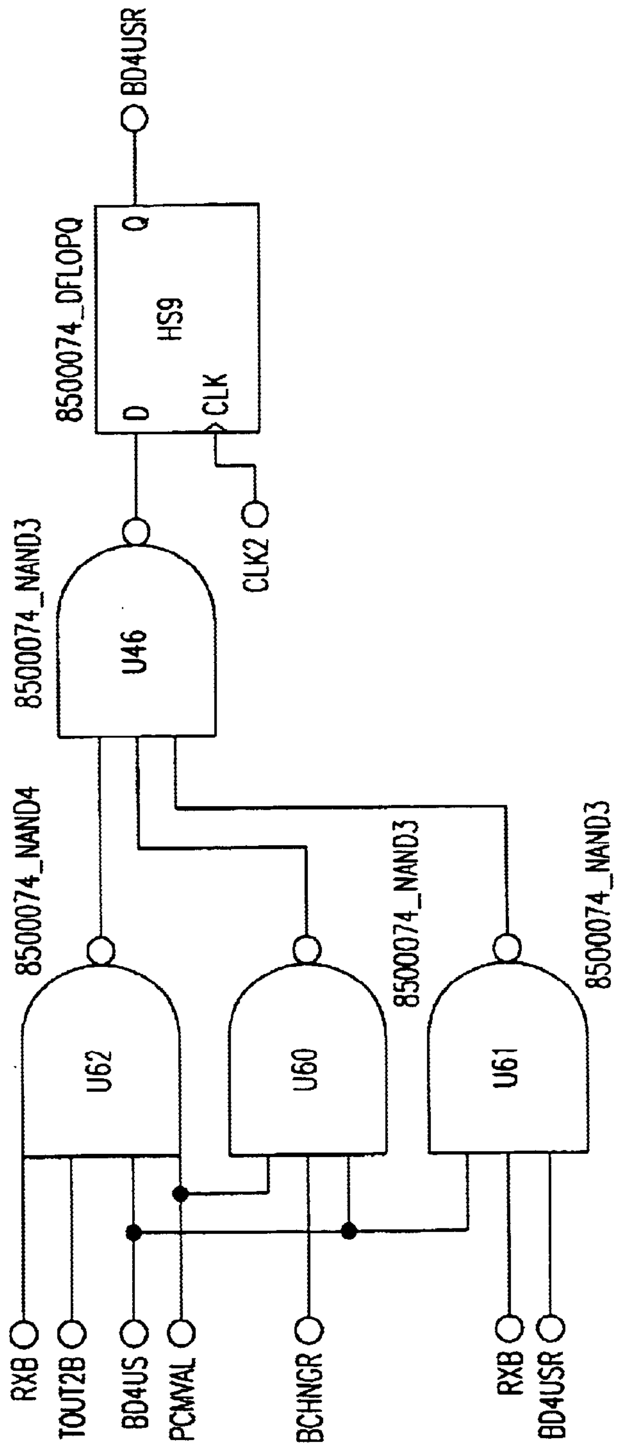
Figure 105M:
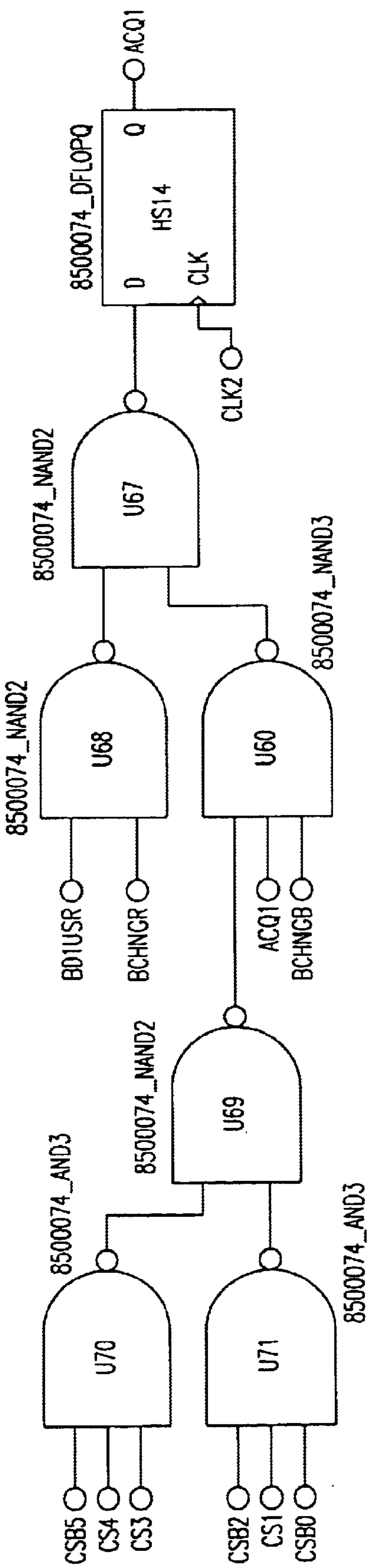
Figure 105N:
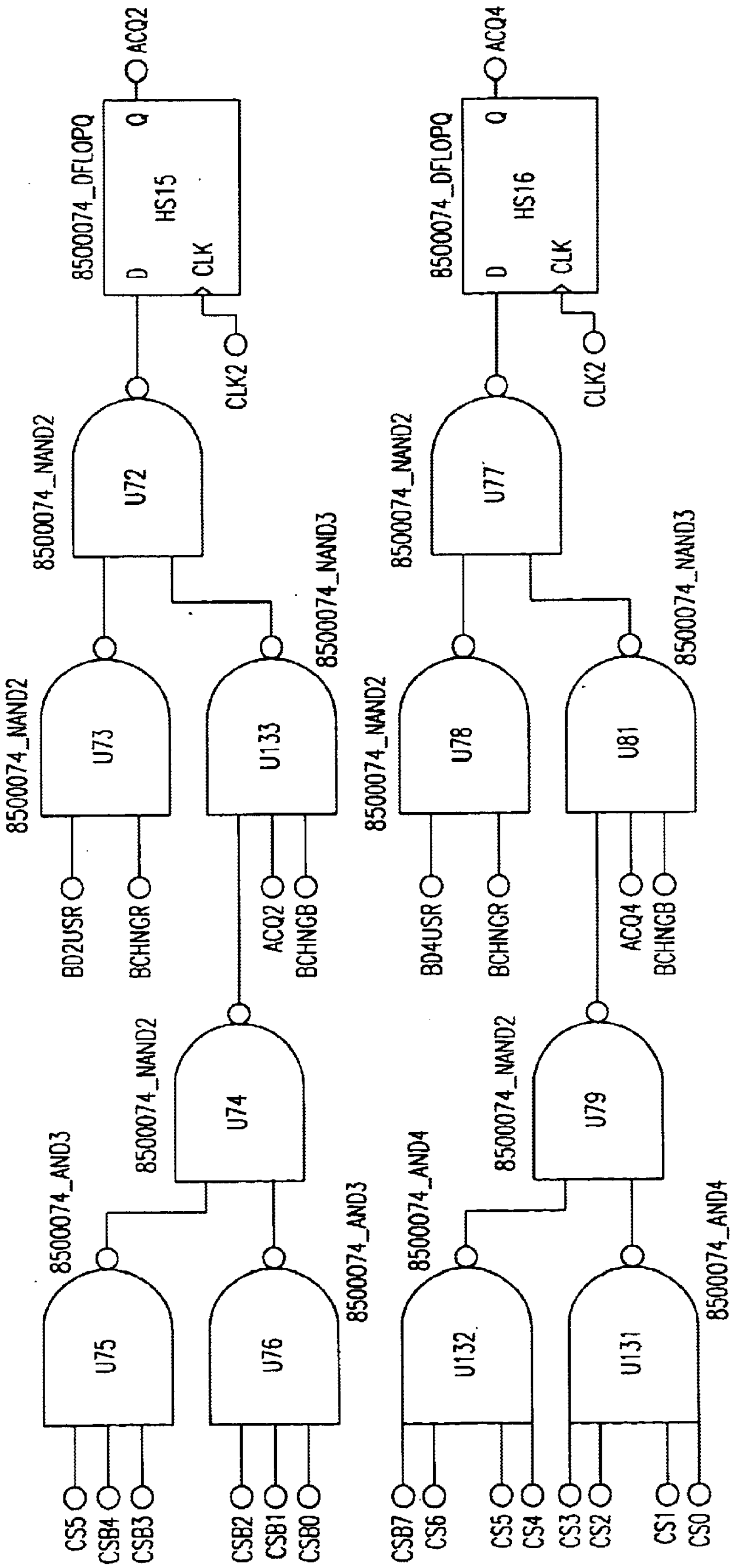
Figure 105O:
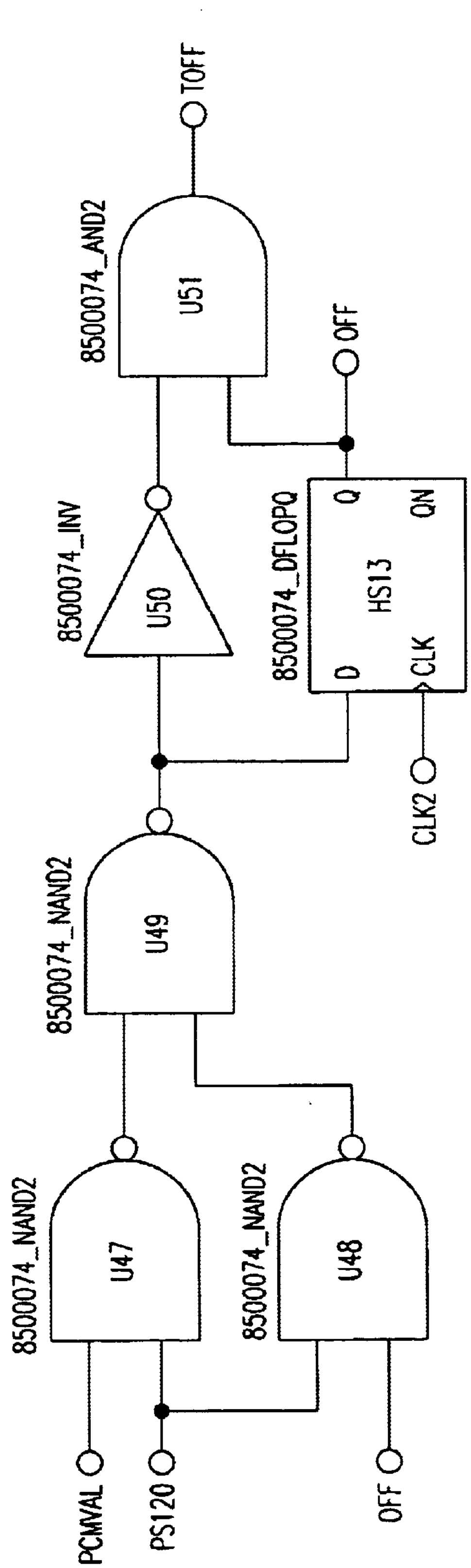
Figure 105P:
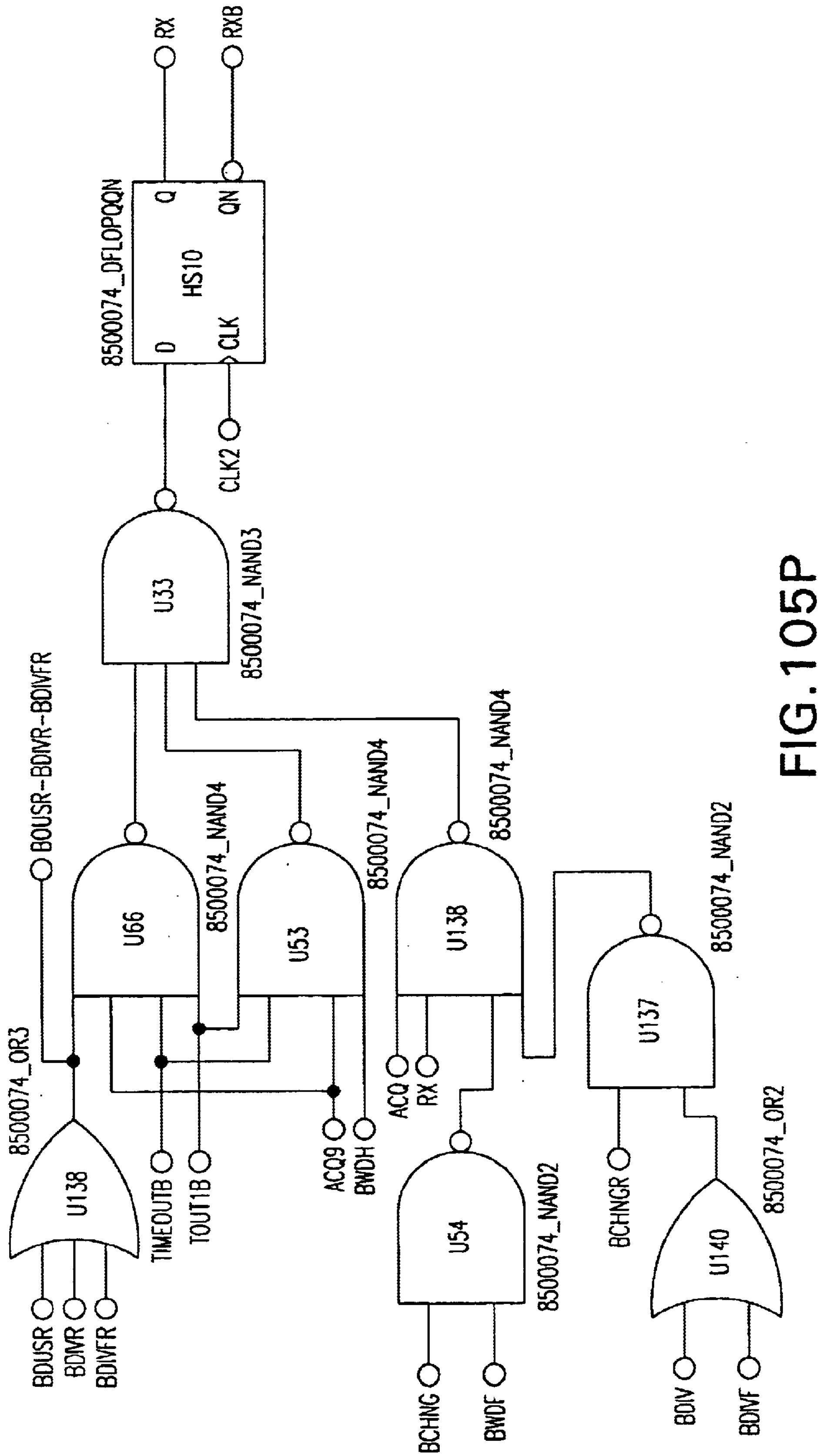
Figure 105Q:
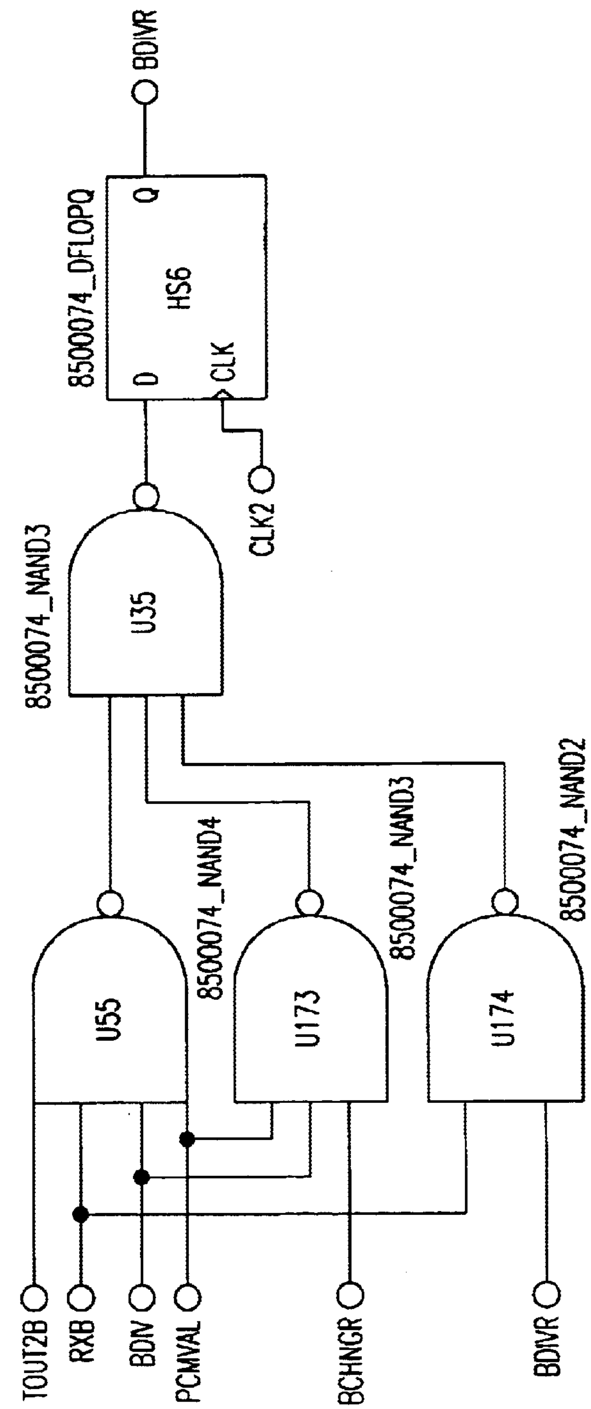
Figure 105R:
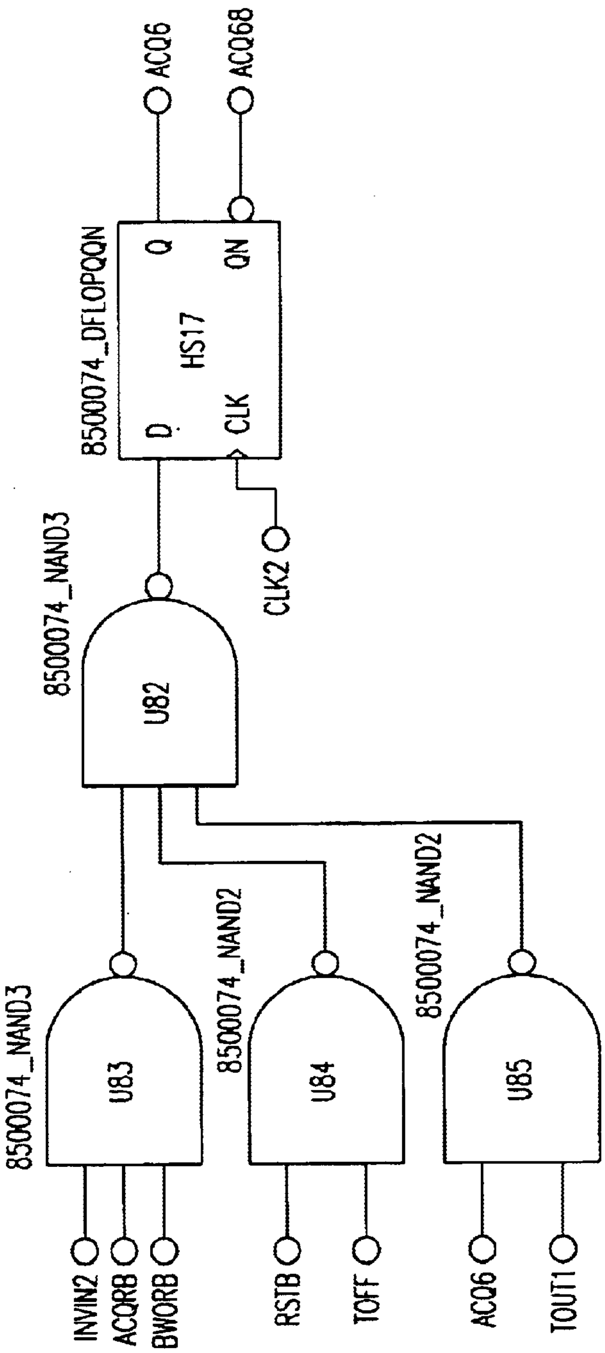
Figure 105S:
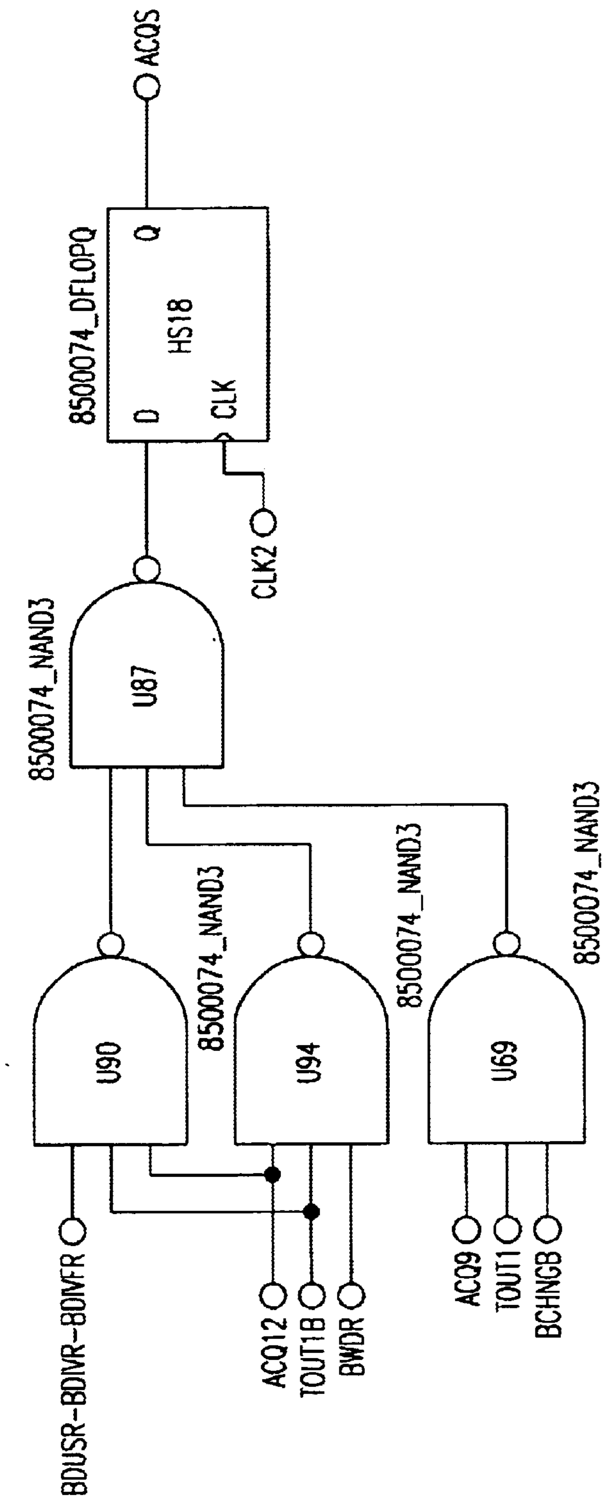
Figure 105T:
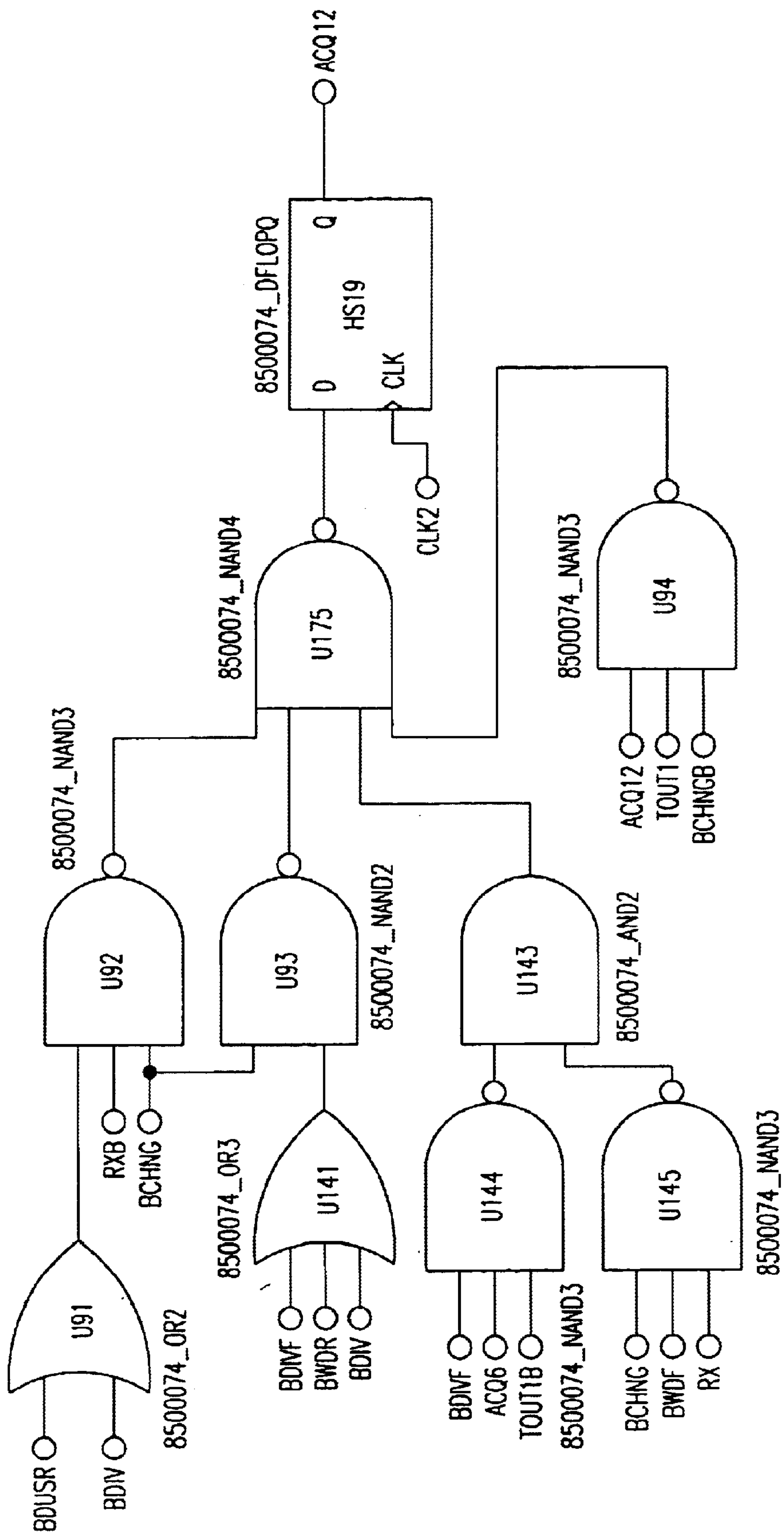
Figure 105U:
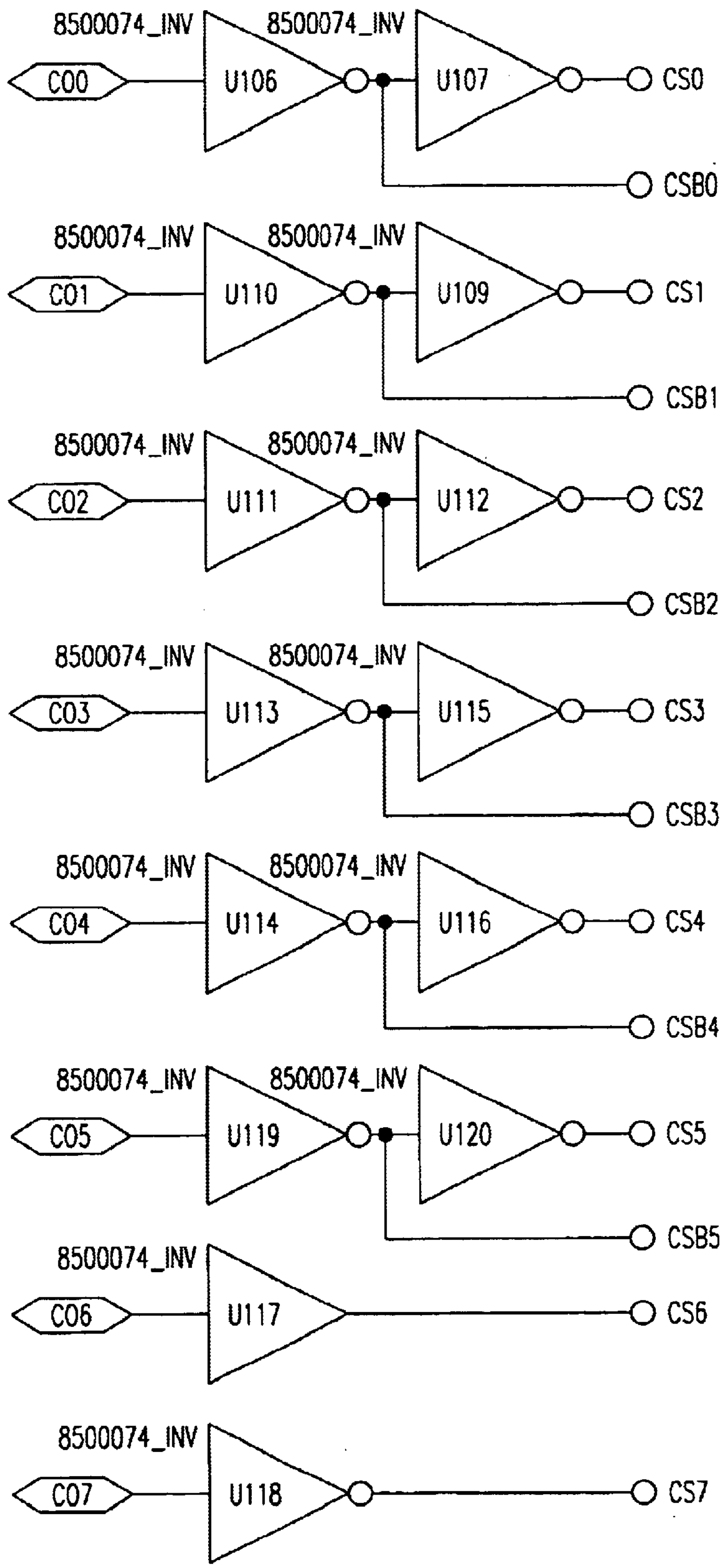
Figure 105V:
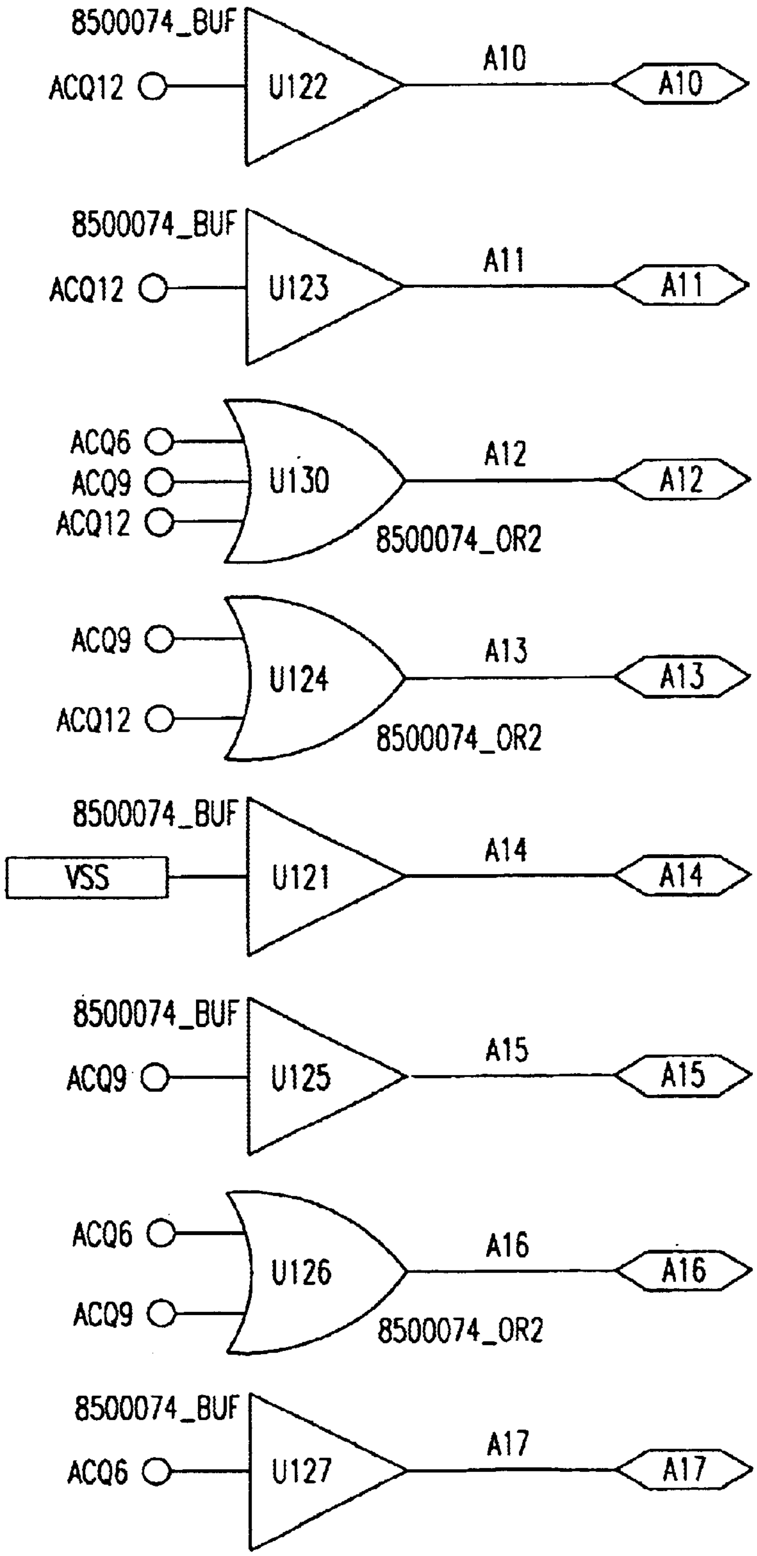
Figure 106A:
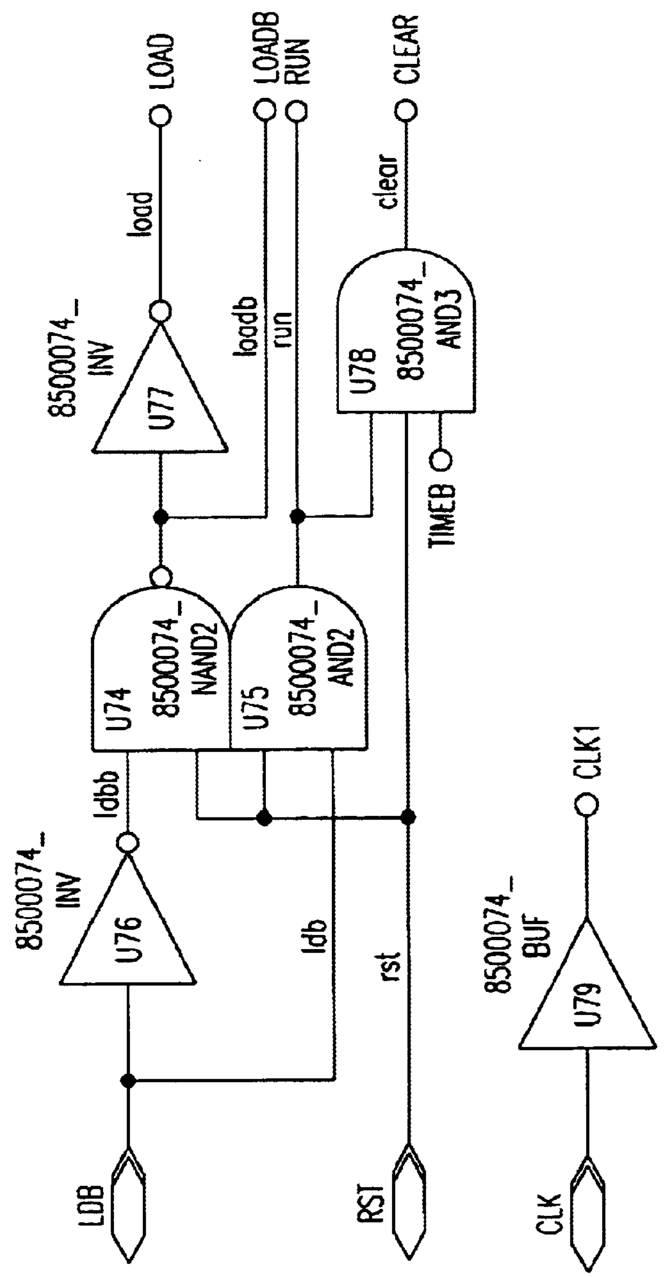
FIG. 106 includes FIGS. 106A–F and should be referred to for all references to FIG. 106 in the specification.
Figure 106B:
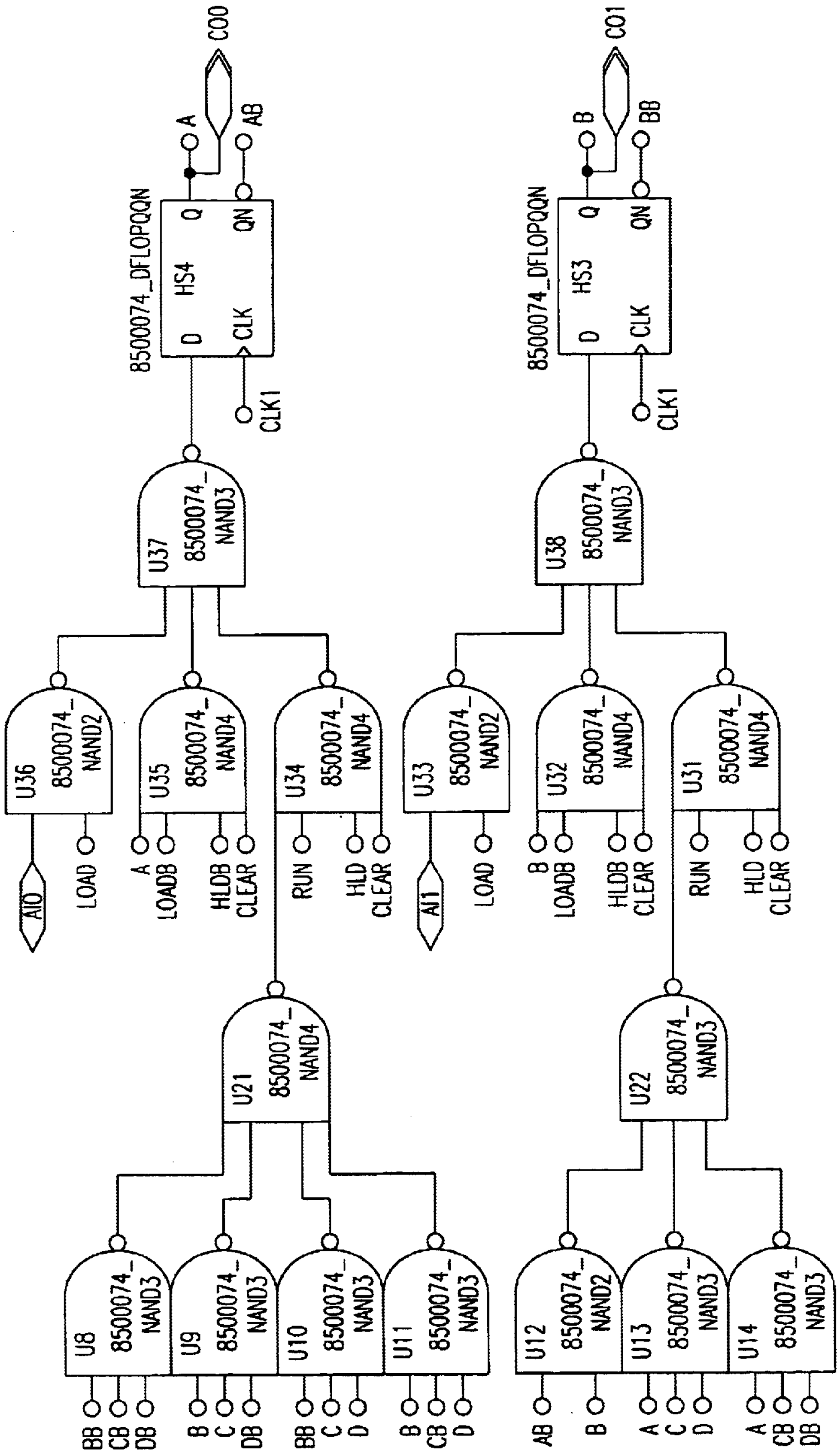
Figure 106C:
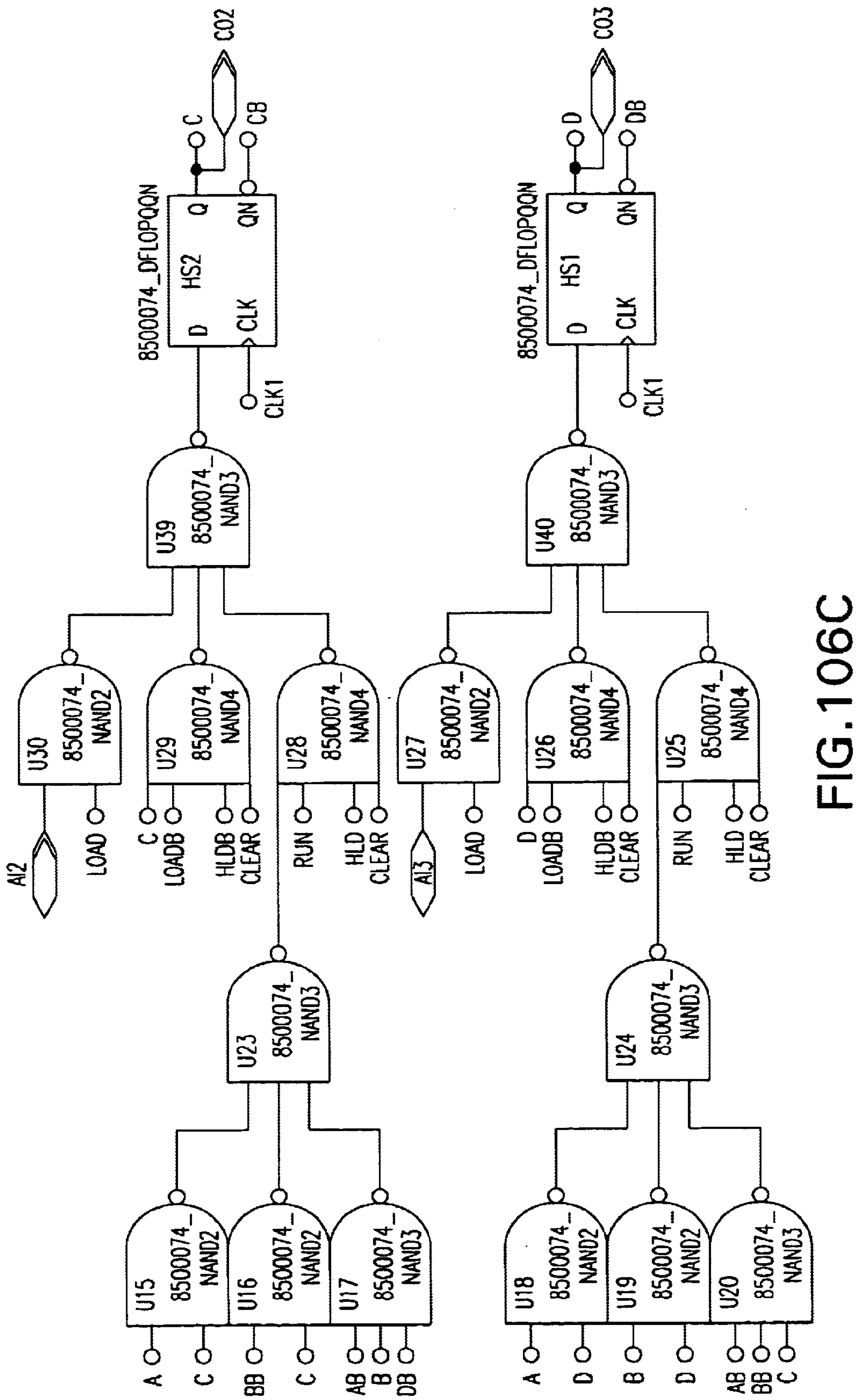
Figure 106D:
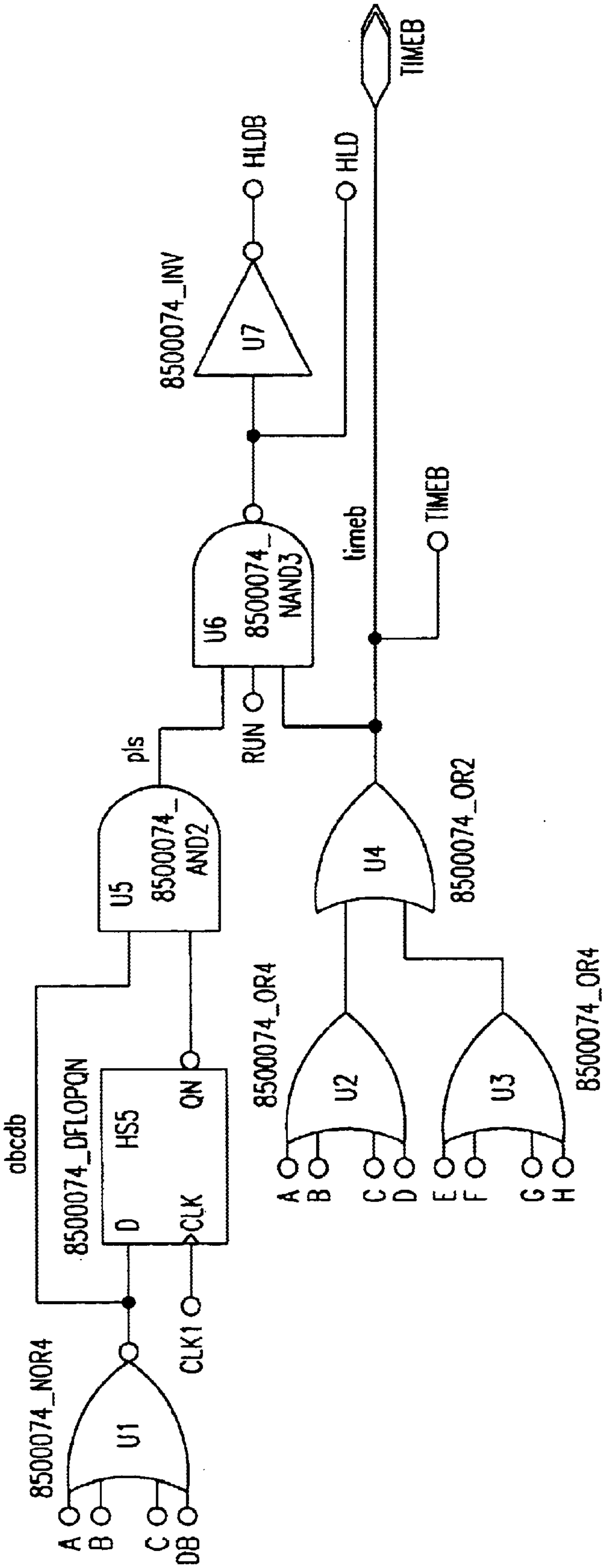
Figure 106E:
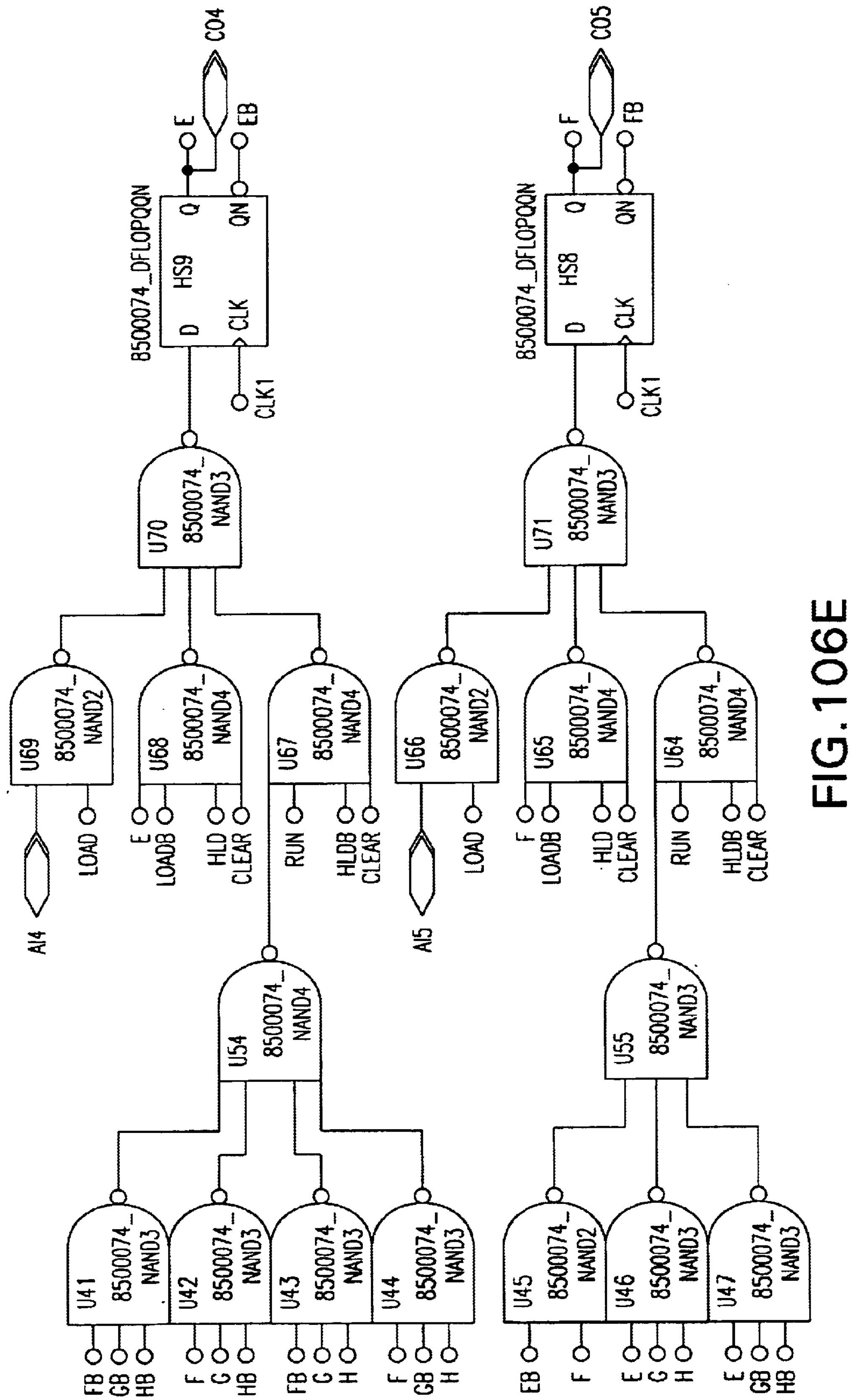
Figure 106F:
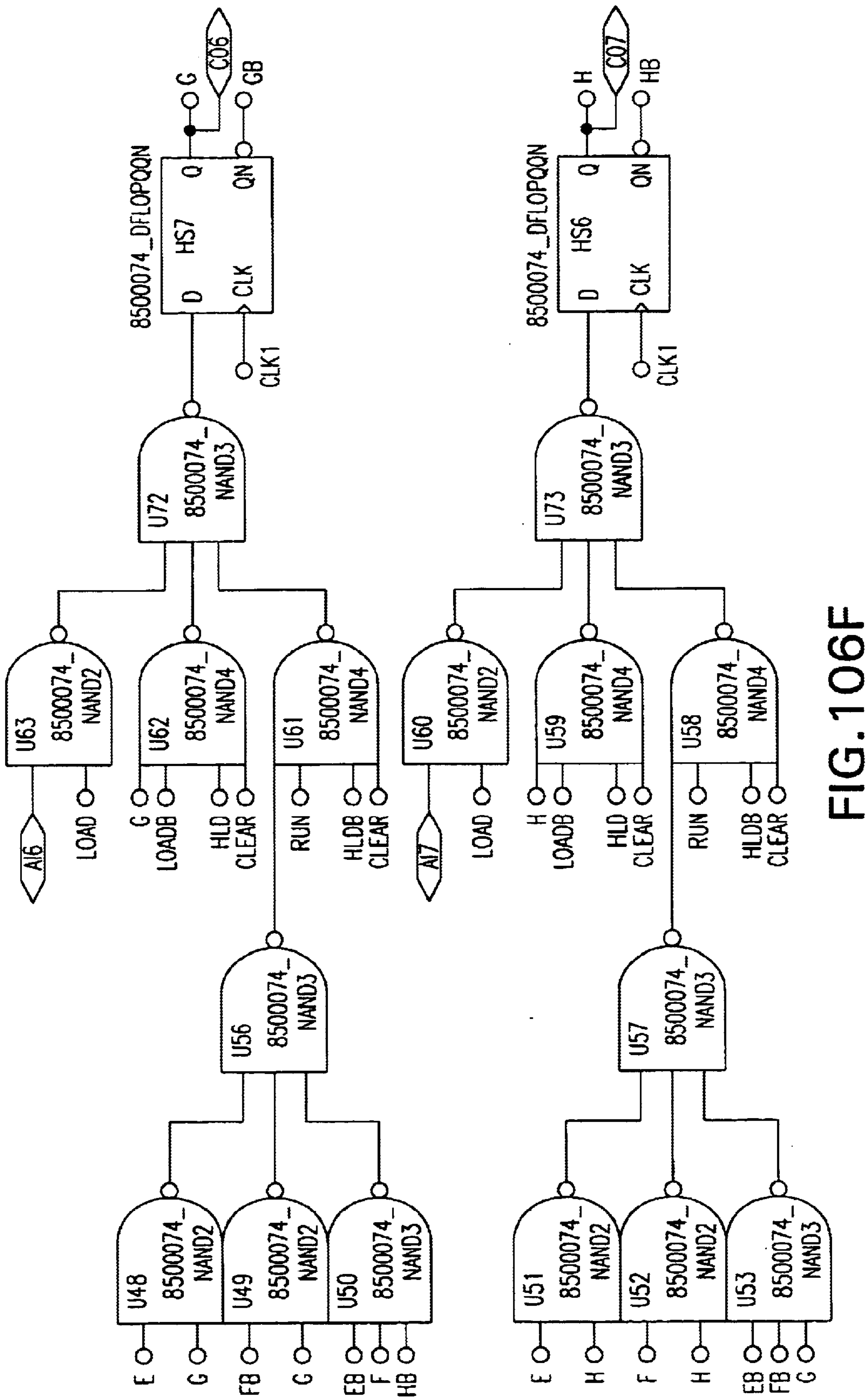
Figure 107A:
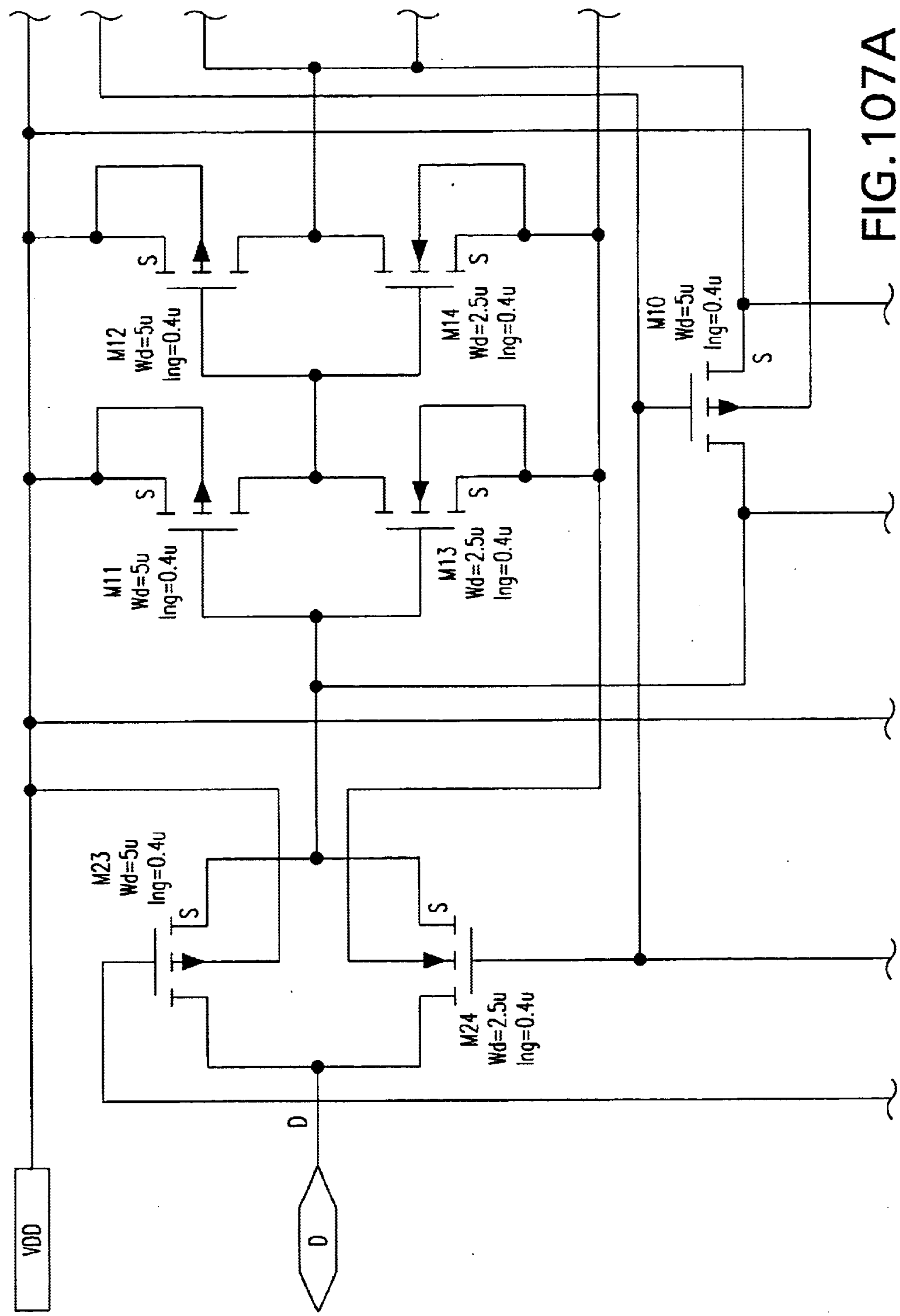
FIG. 107 includes FIGS. 107A–D and should be referred to for all referrences to FIG. 107 in the specification.
Figure 107B:
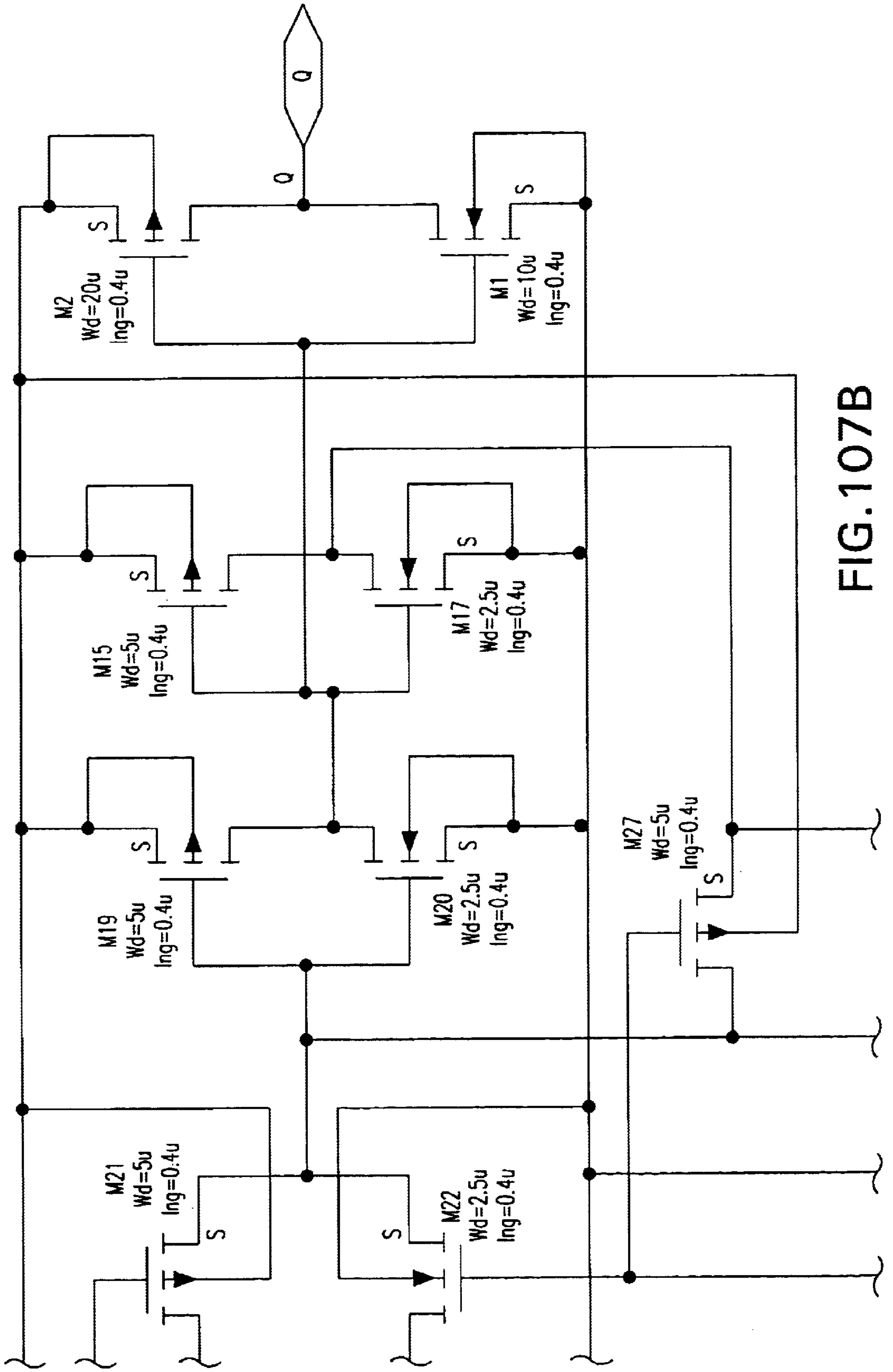
Figure 107C:
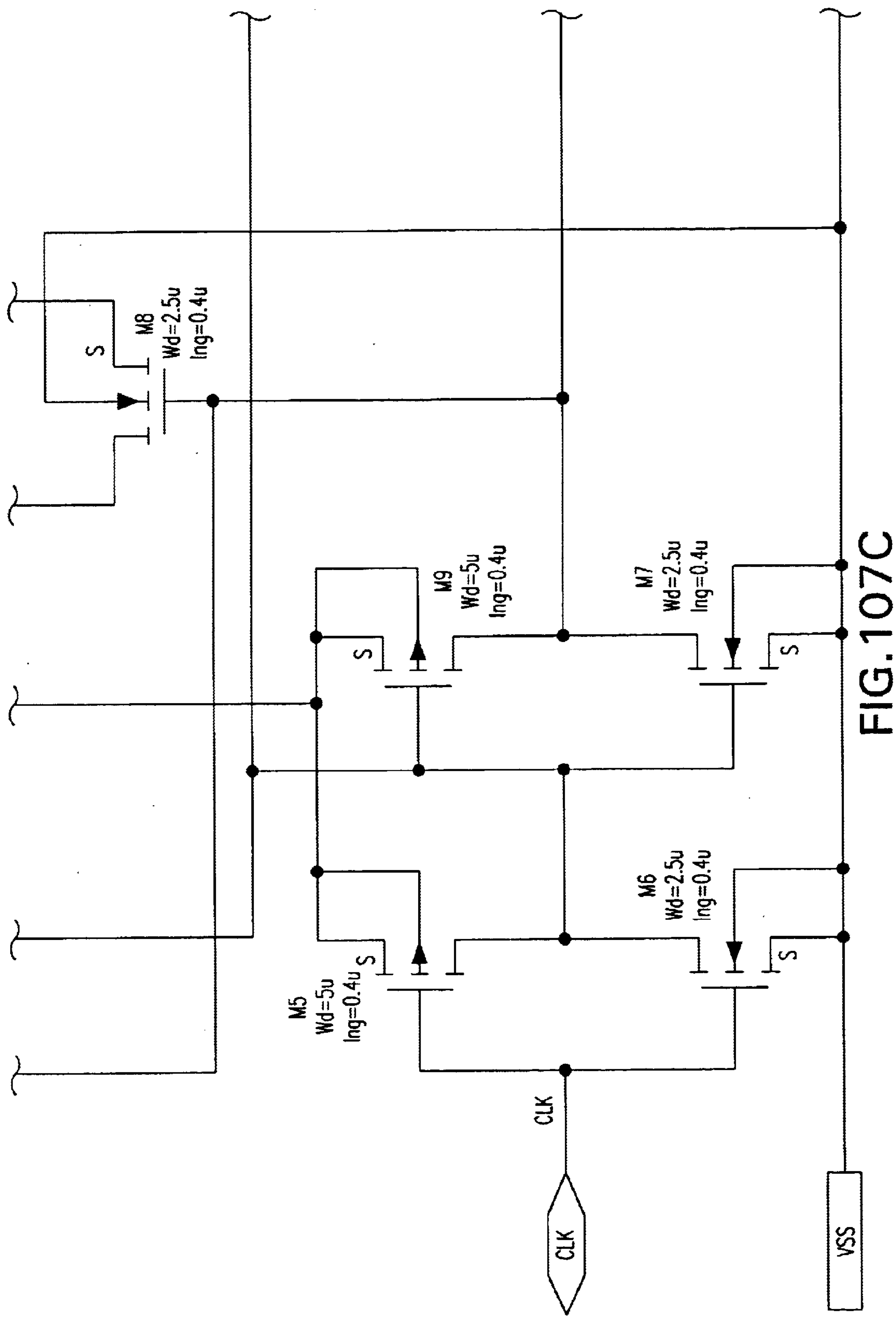
Figure 107D:
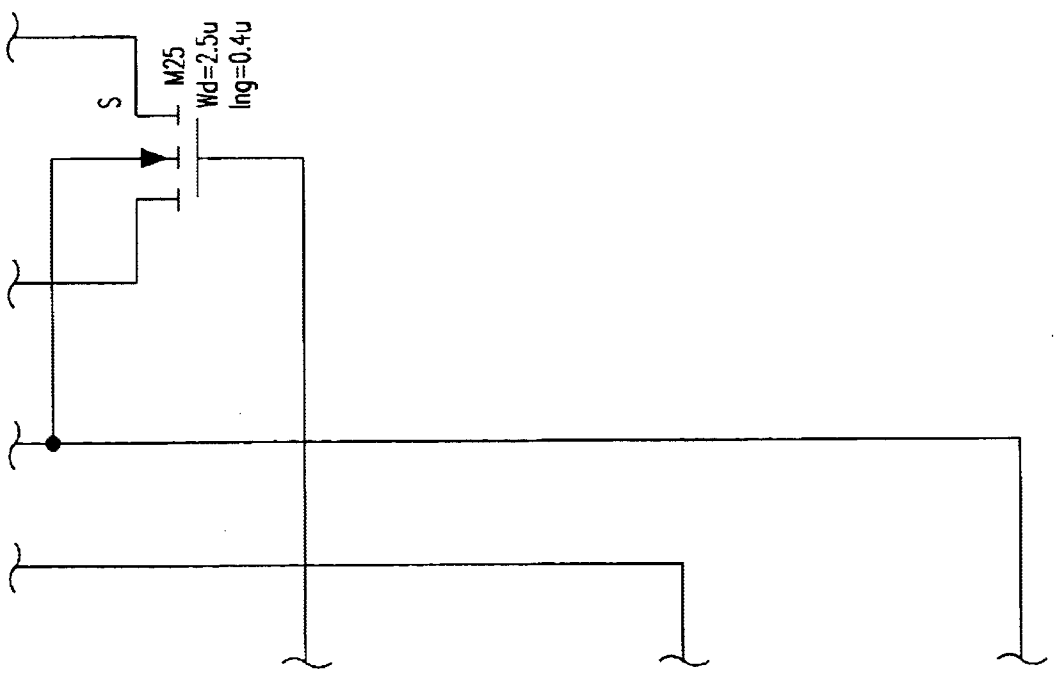
Figure 108:
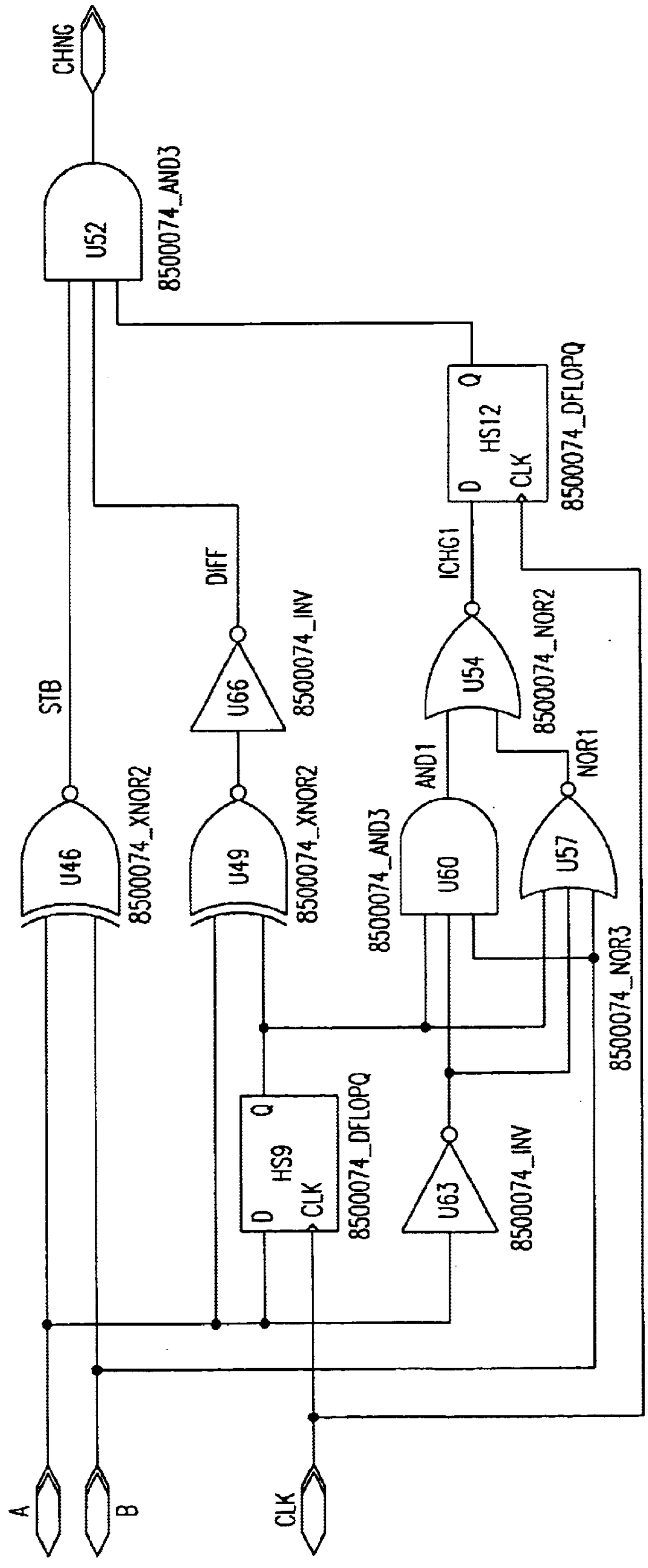
Figure 109A:
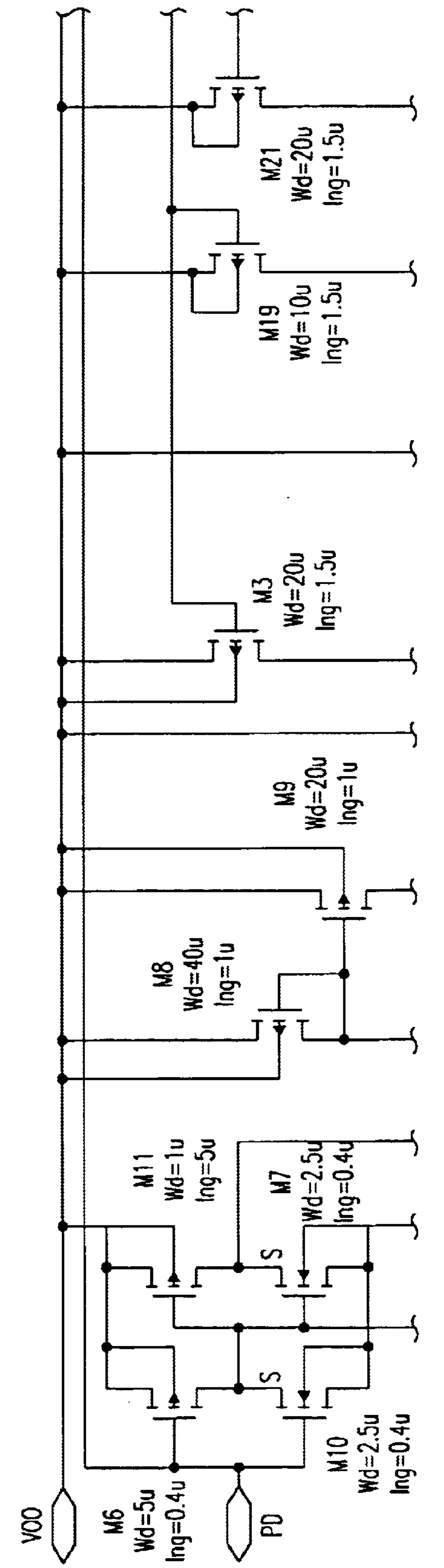
FIG. 109 includes FIGS. 109A–D and should be referred to for all references to FIG. 109 in the specification.
Figure 109B:
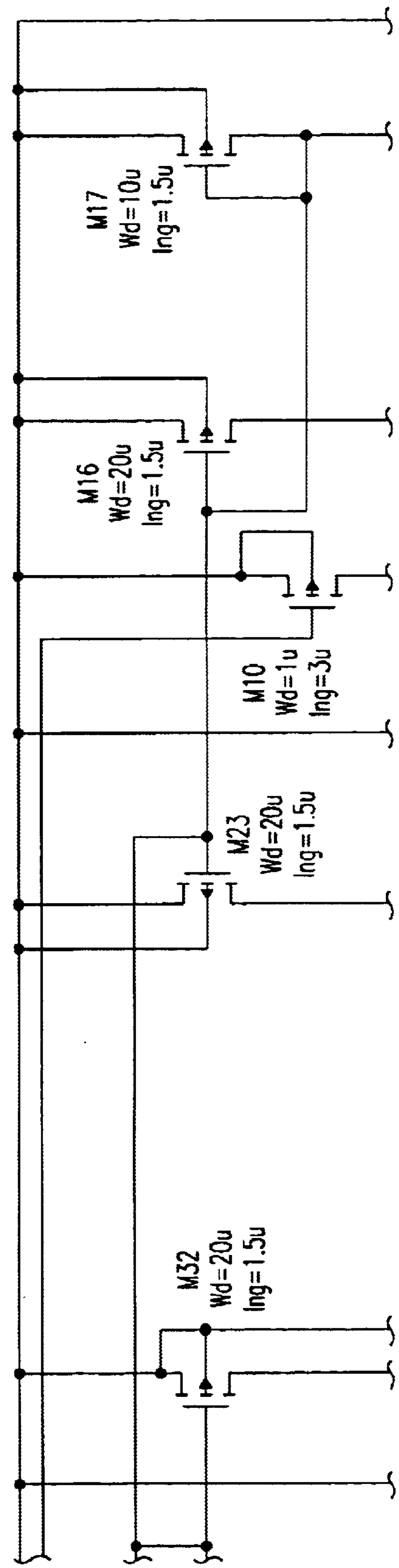
Figure 109C:
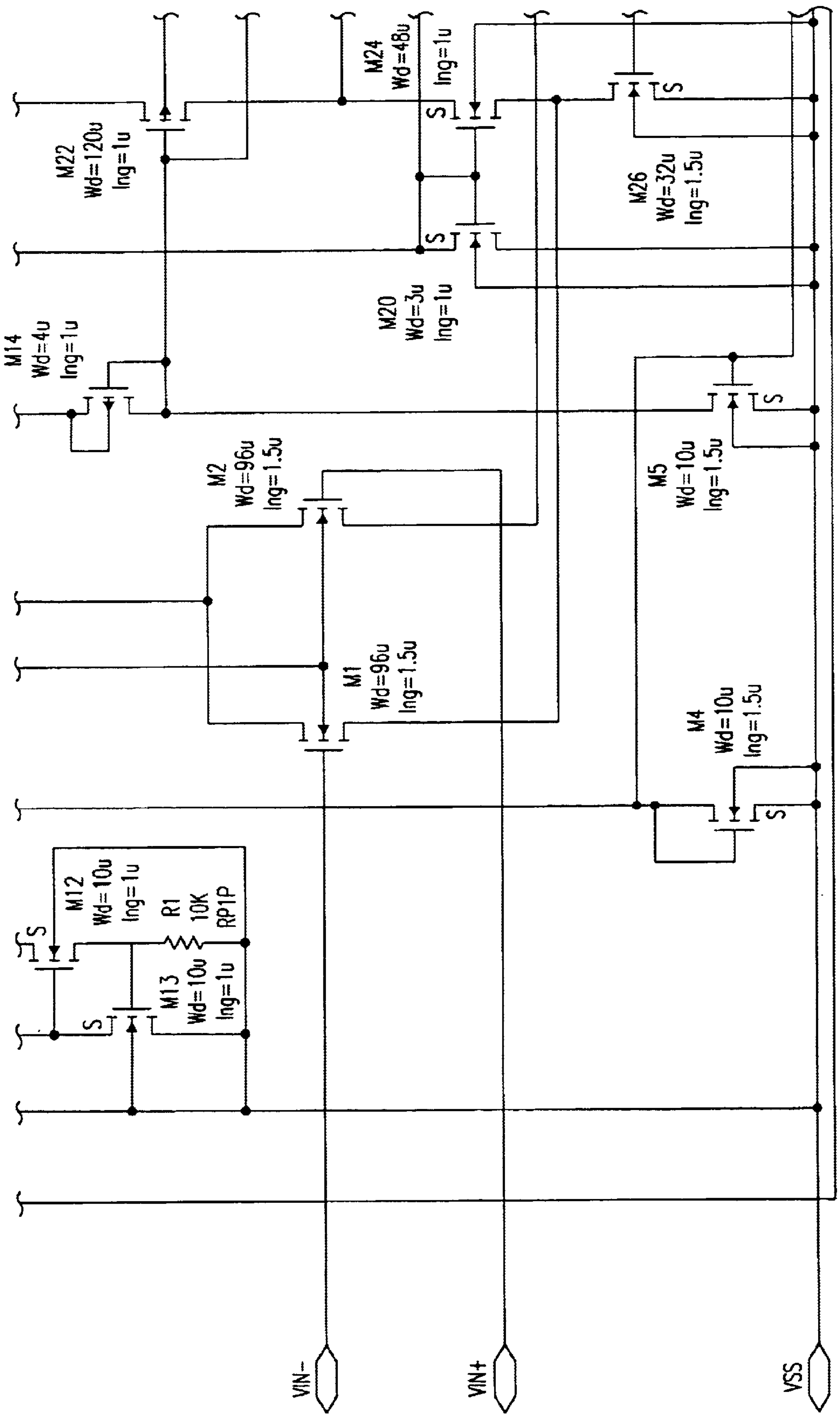
Figure 109D:
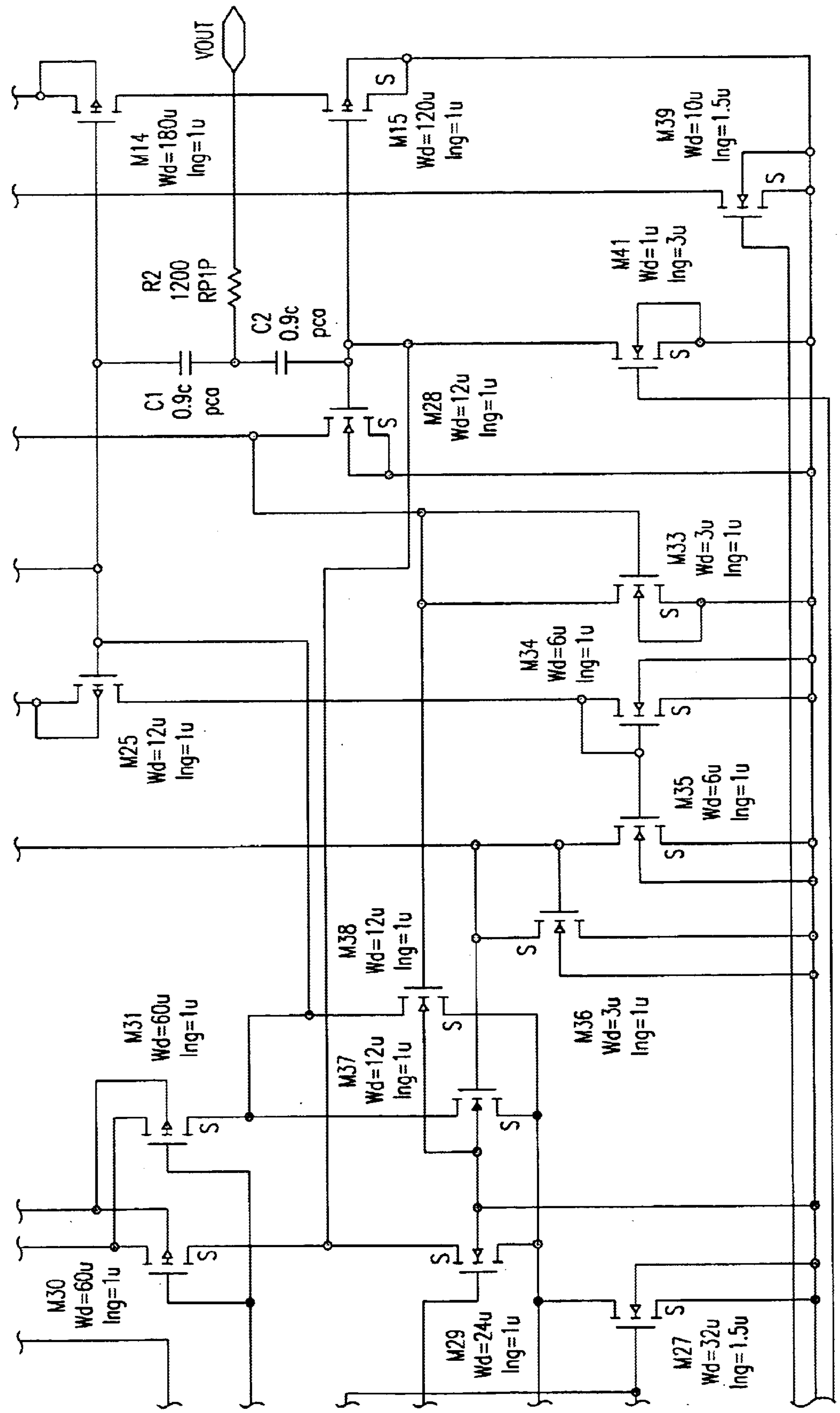
Figure 110A:
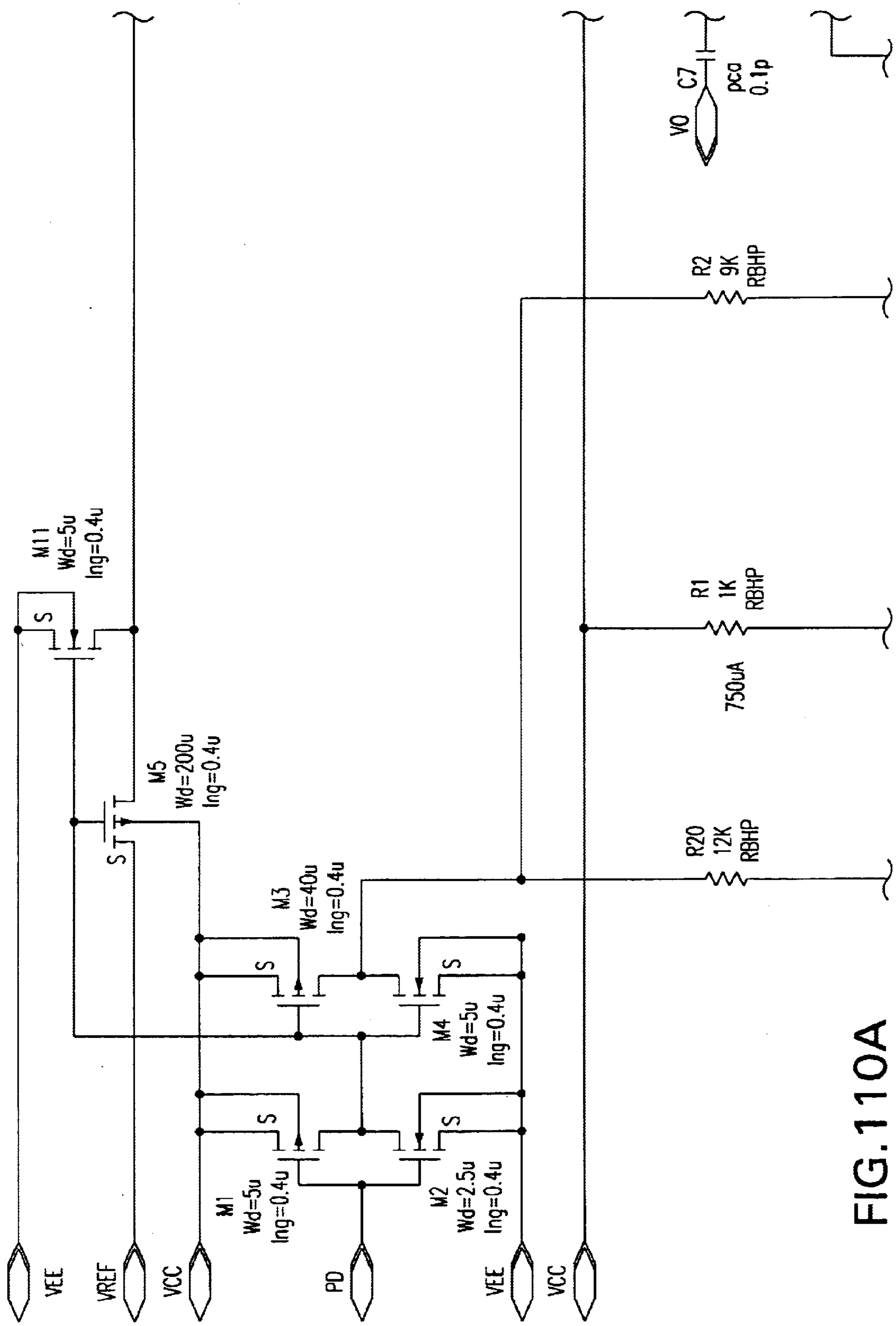
FIG. 110 includes FIGS. 110A–D and should be referred to for all references to FIG. 110 in the specification.
Figure 110B:
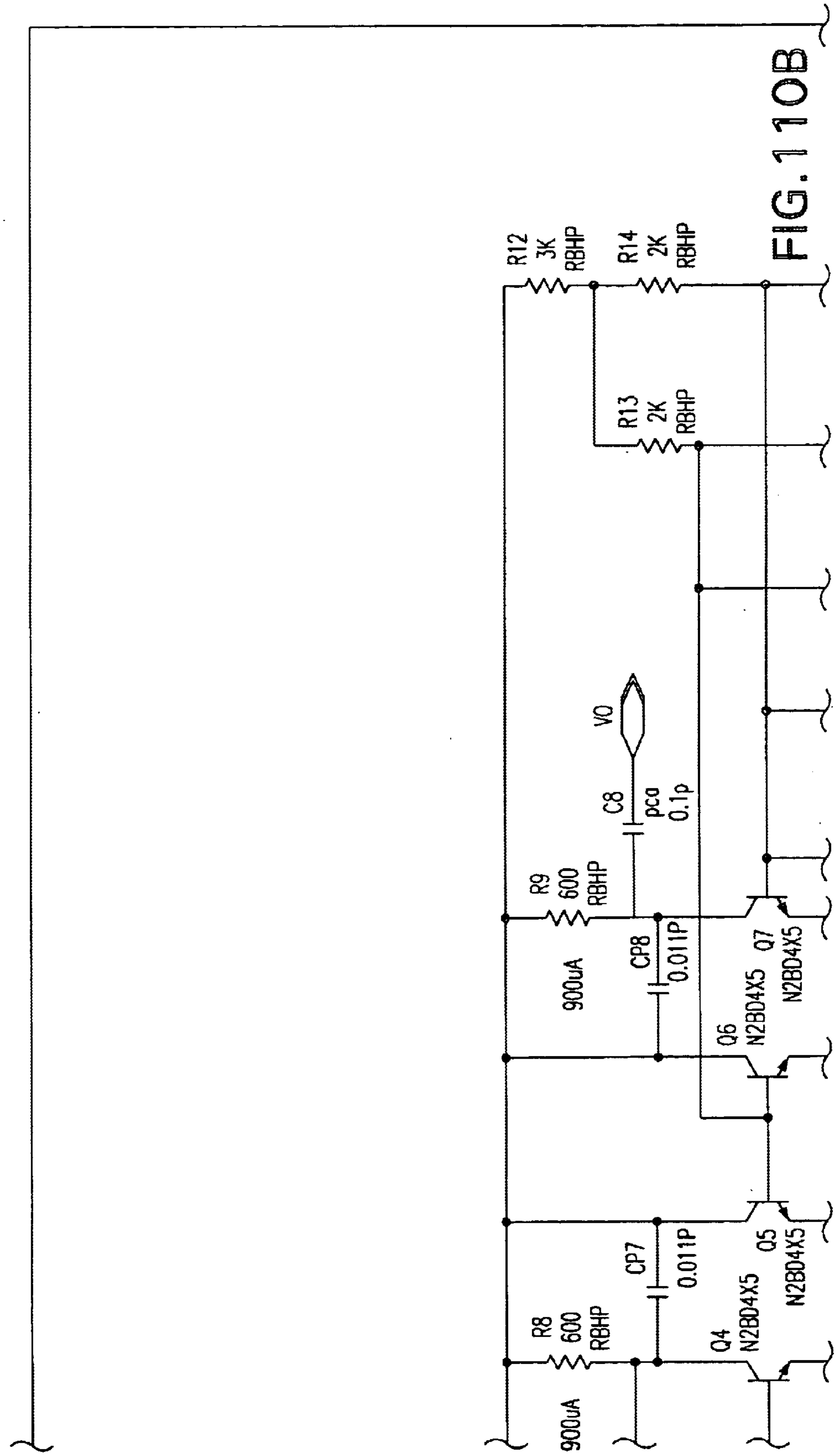
Figure 110C:
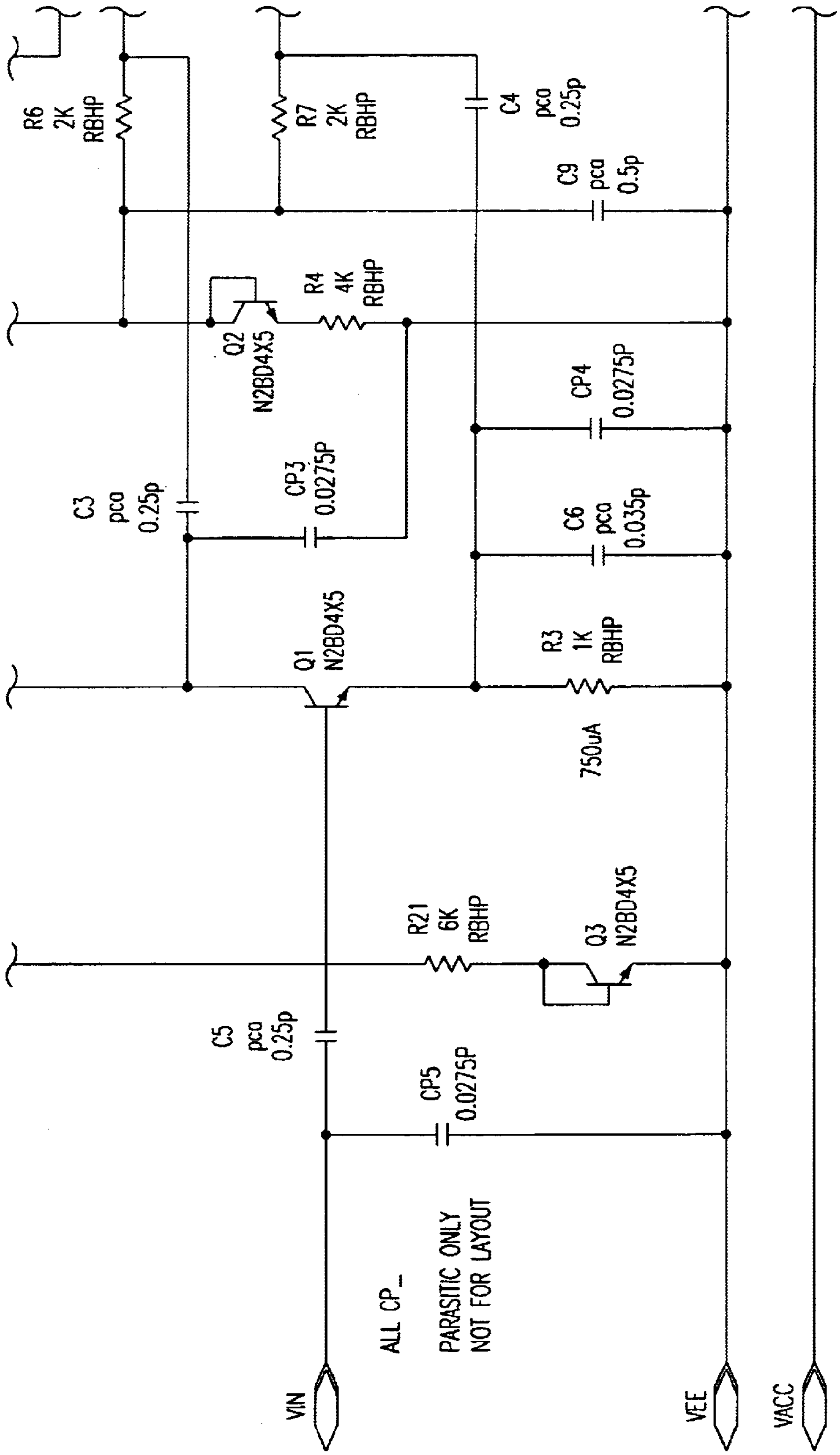
Figure 110D:
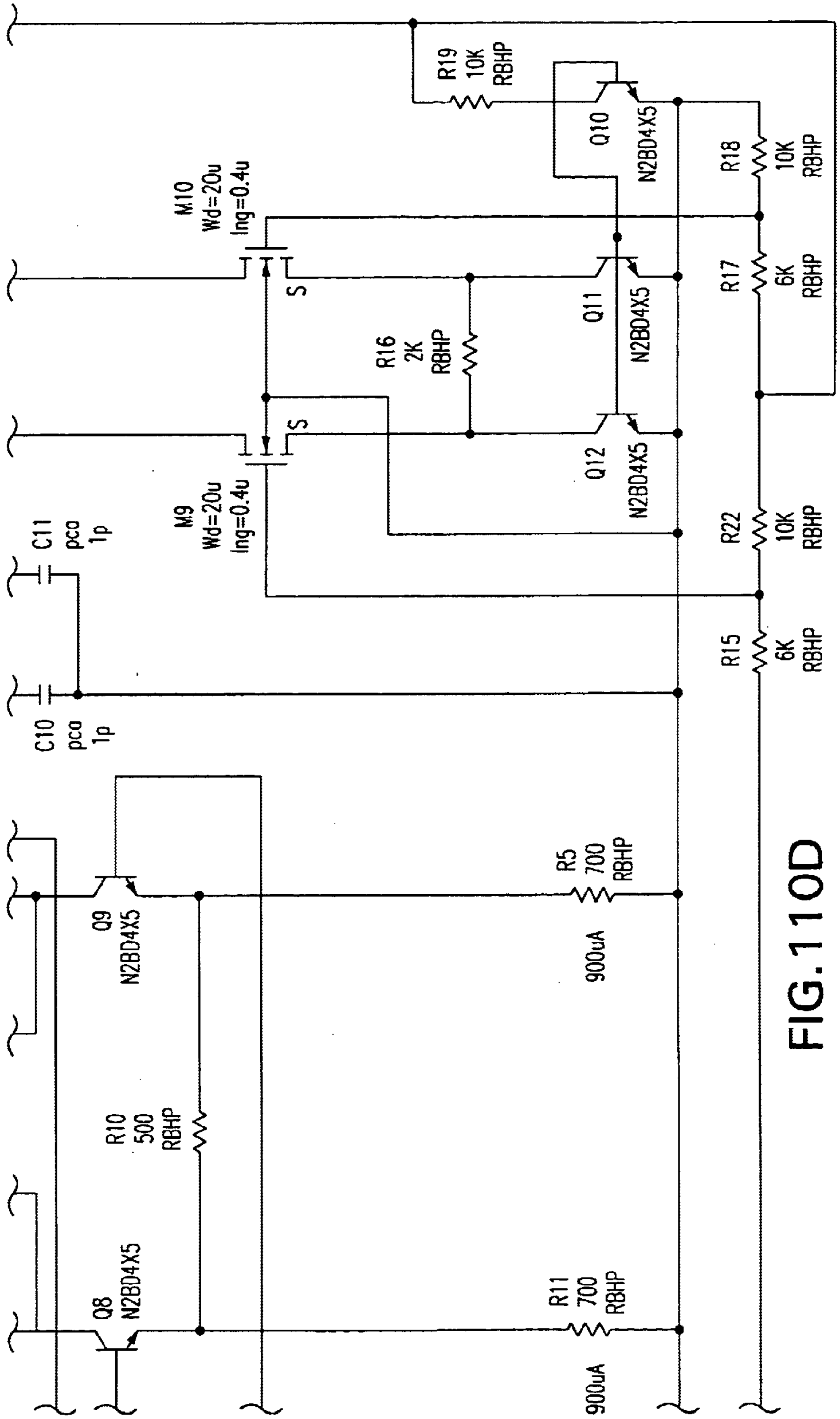
Figure 111:
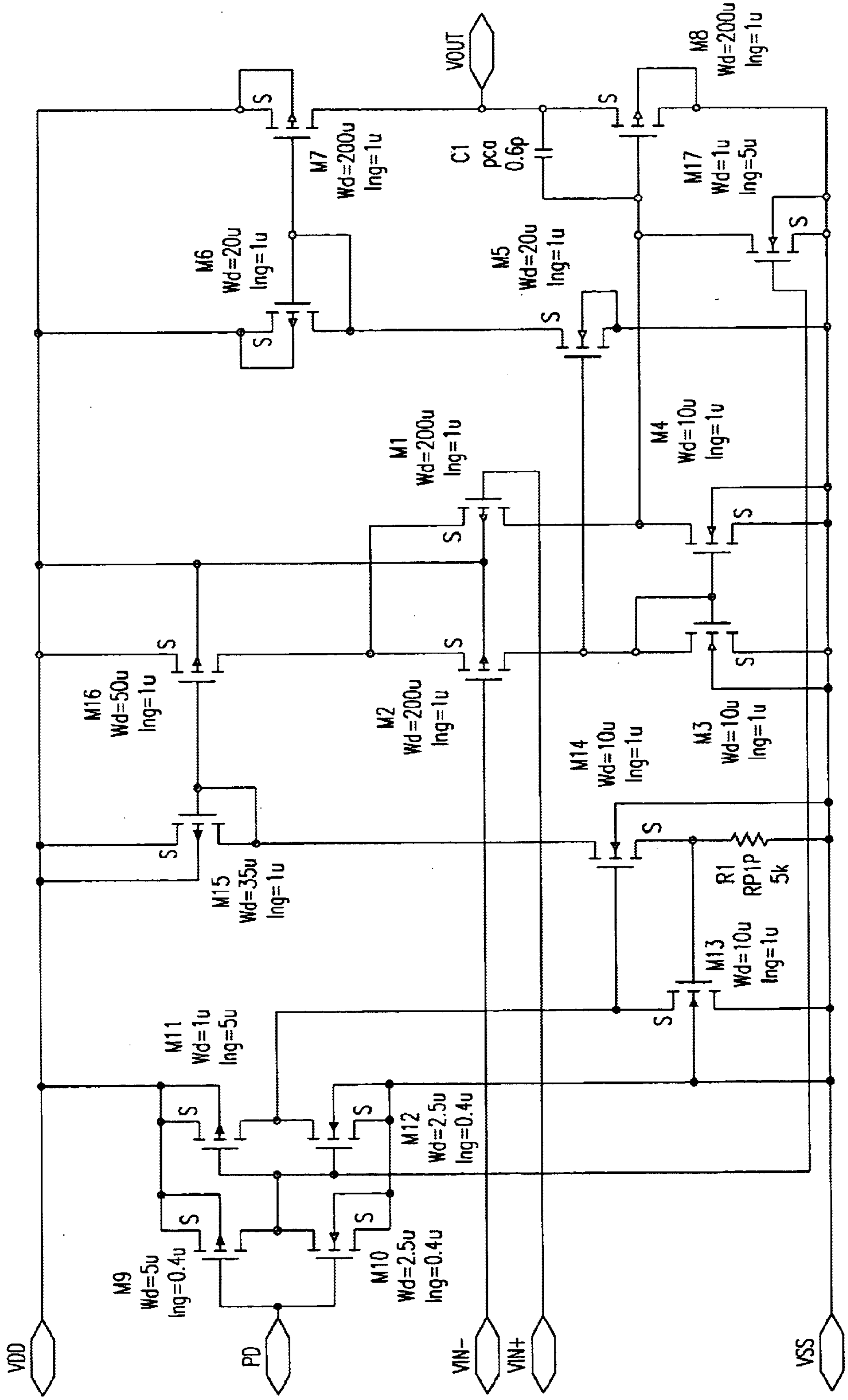
Figure 112A:
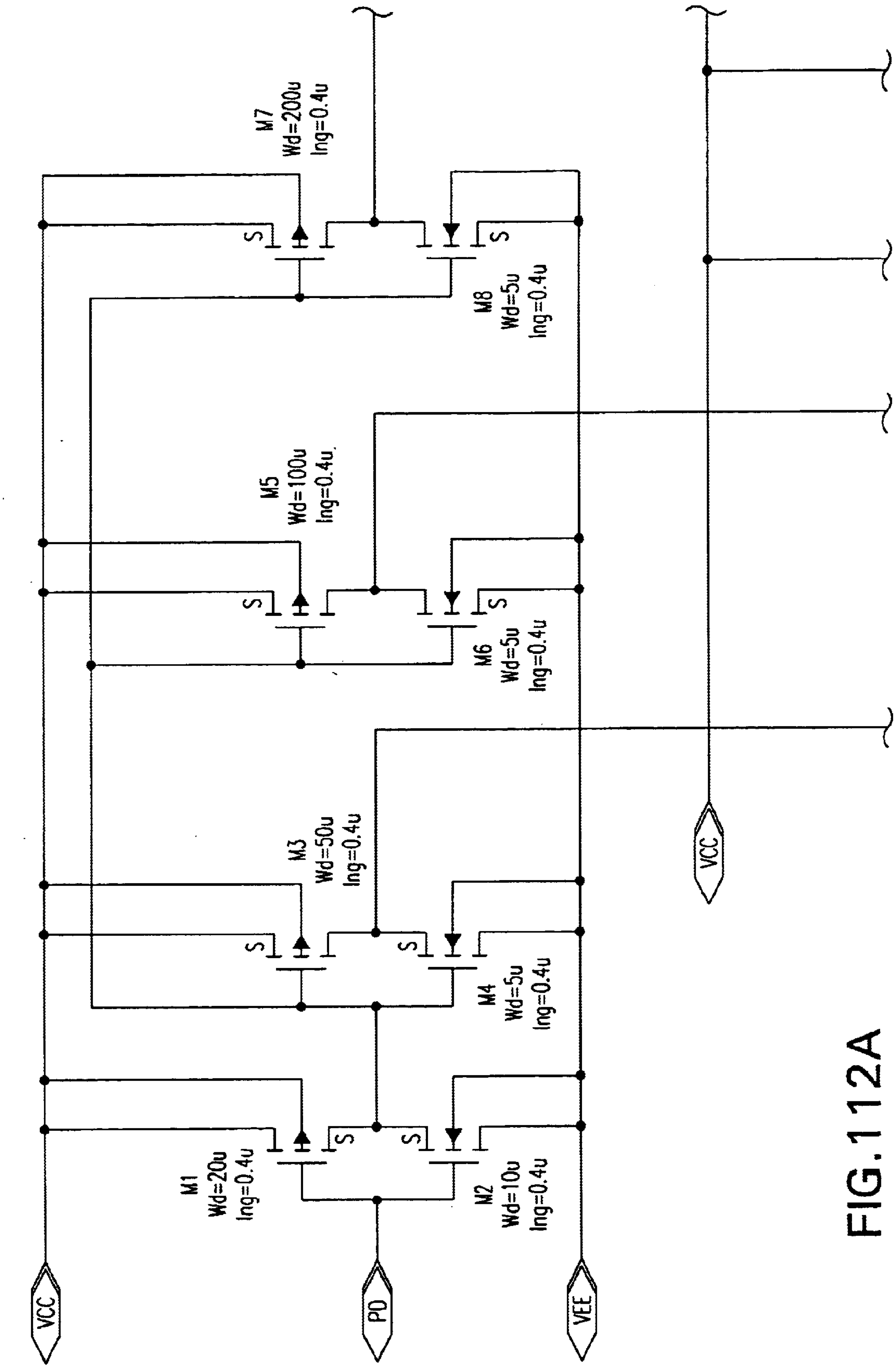
FIG. 112A–D and should be referred to for all references to FIG. 112 in the specification.
Figure 112B:
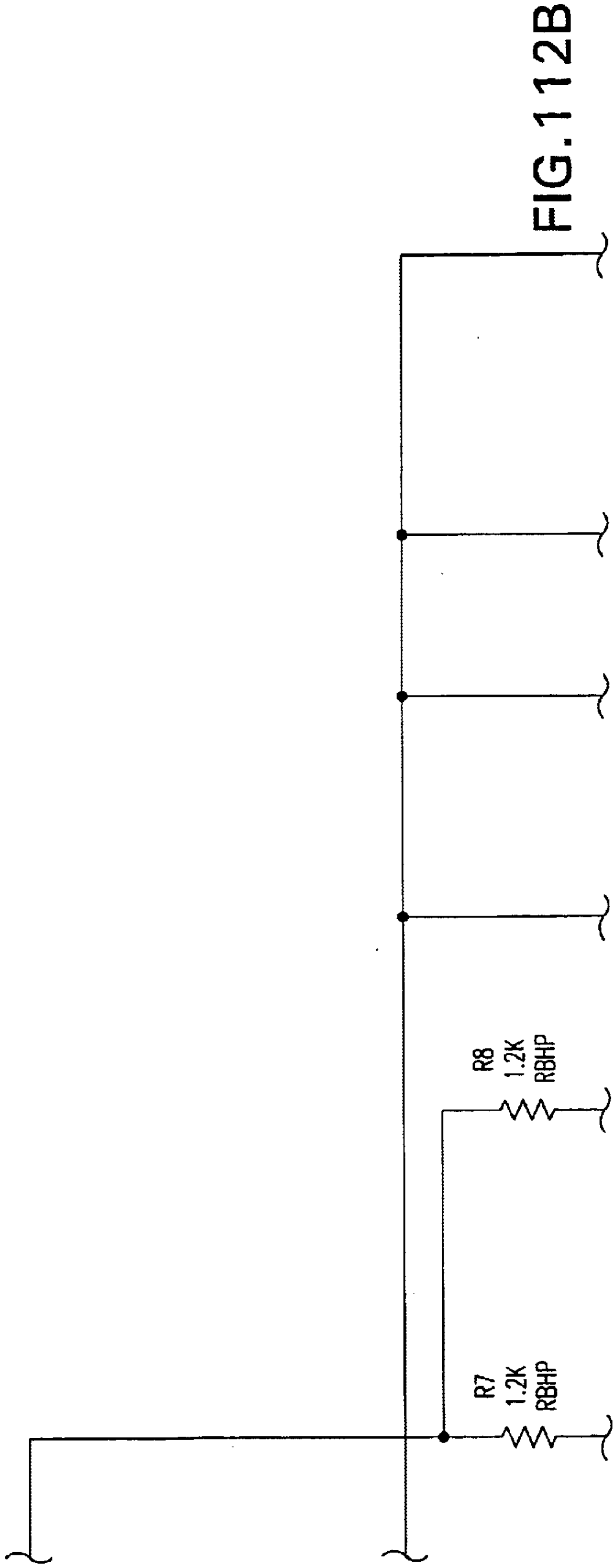
Figure 112C:
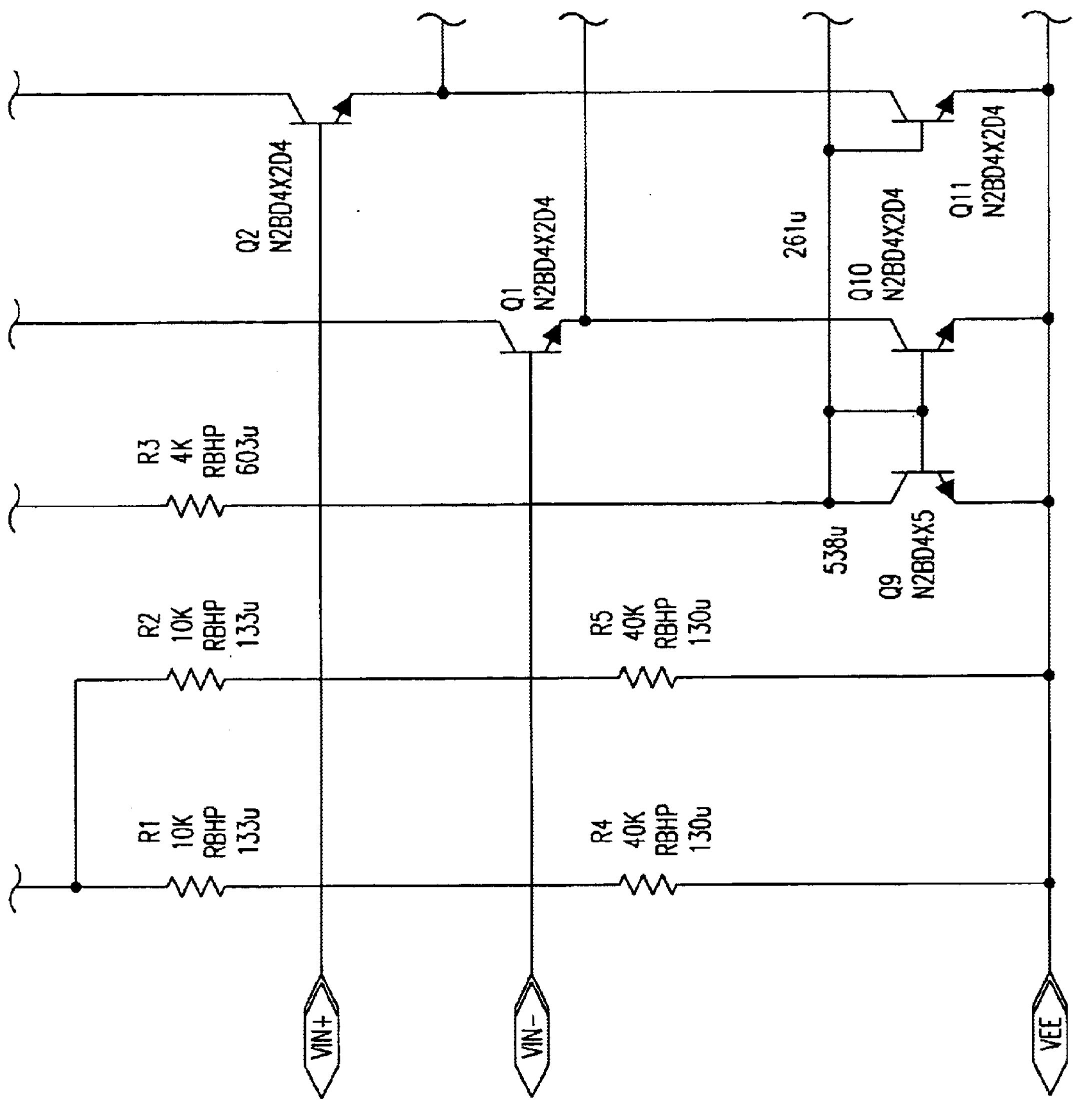
Figure 112D:
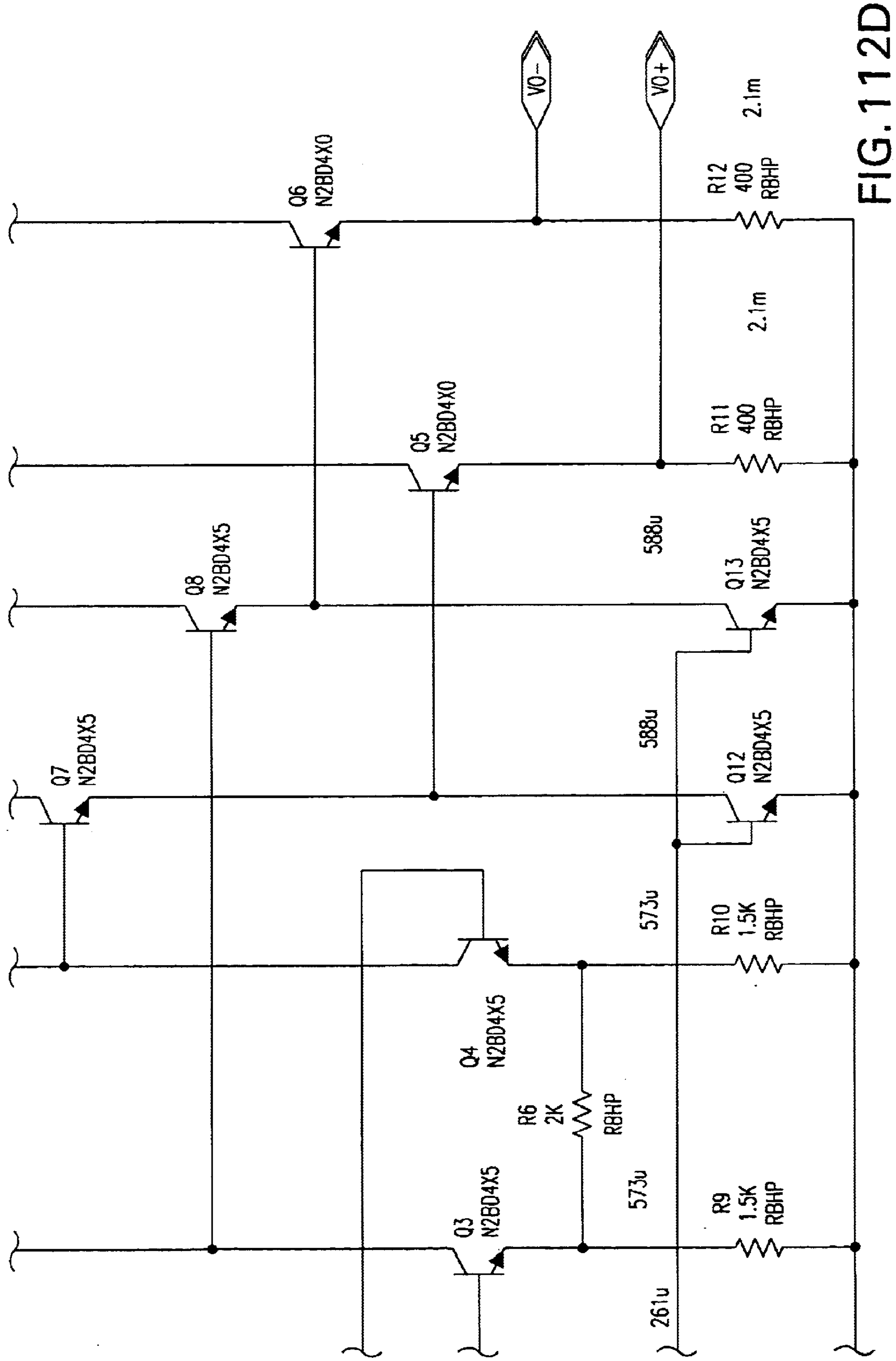
Figure 113A:
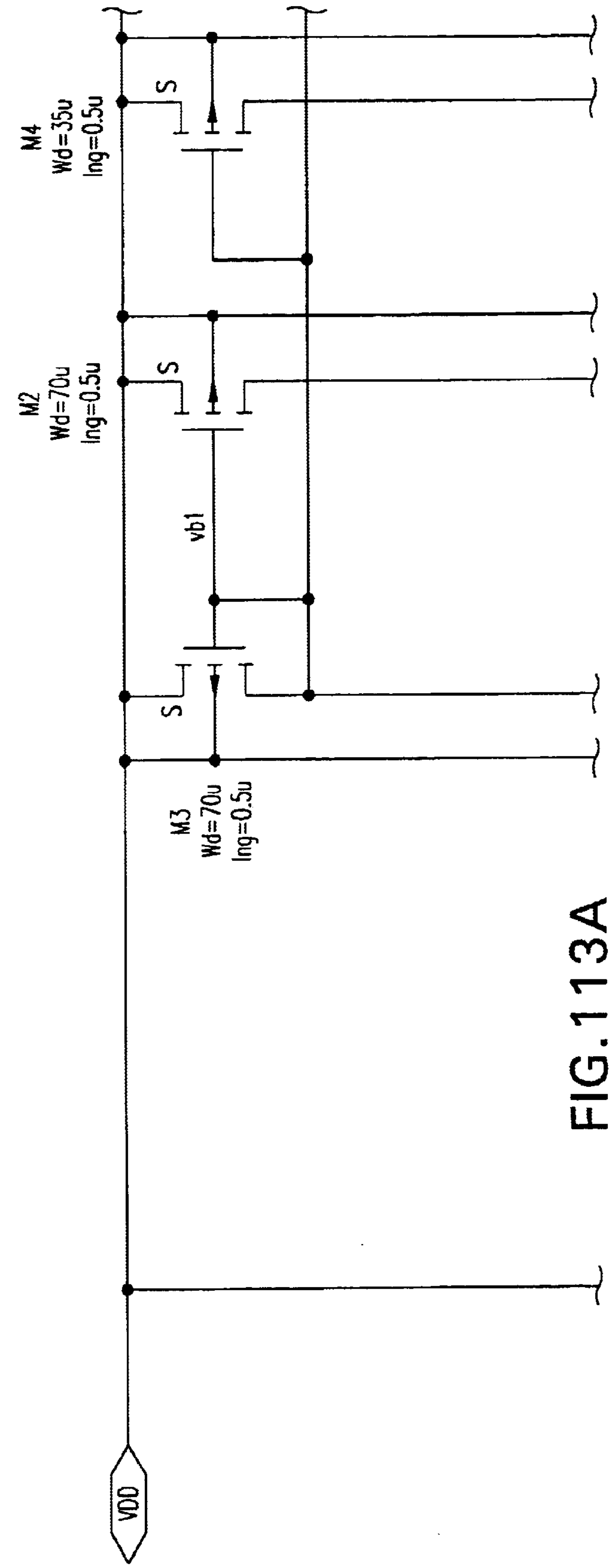
FIG. 113 includes FIGS. 113A–F and should be referred to for all references to FIG. 113 in the specification.
Figure 113B:
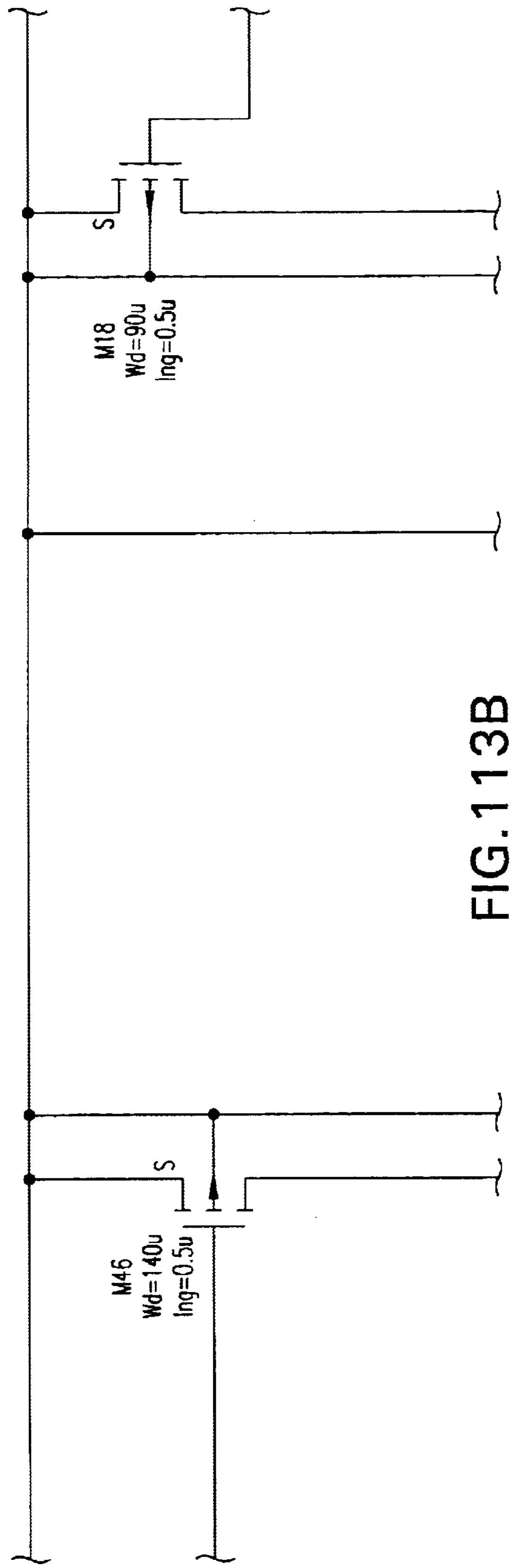
Figure 113C:
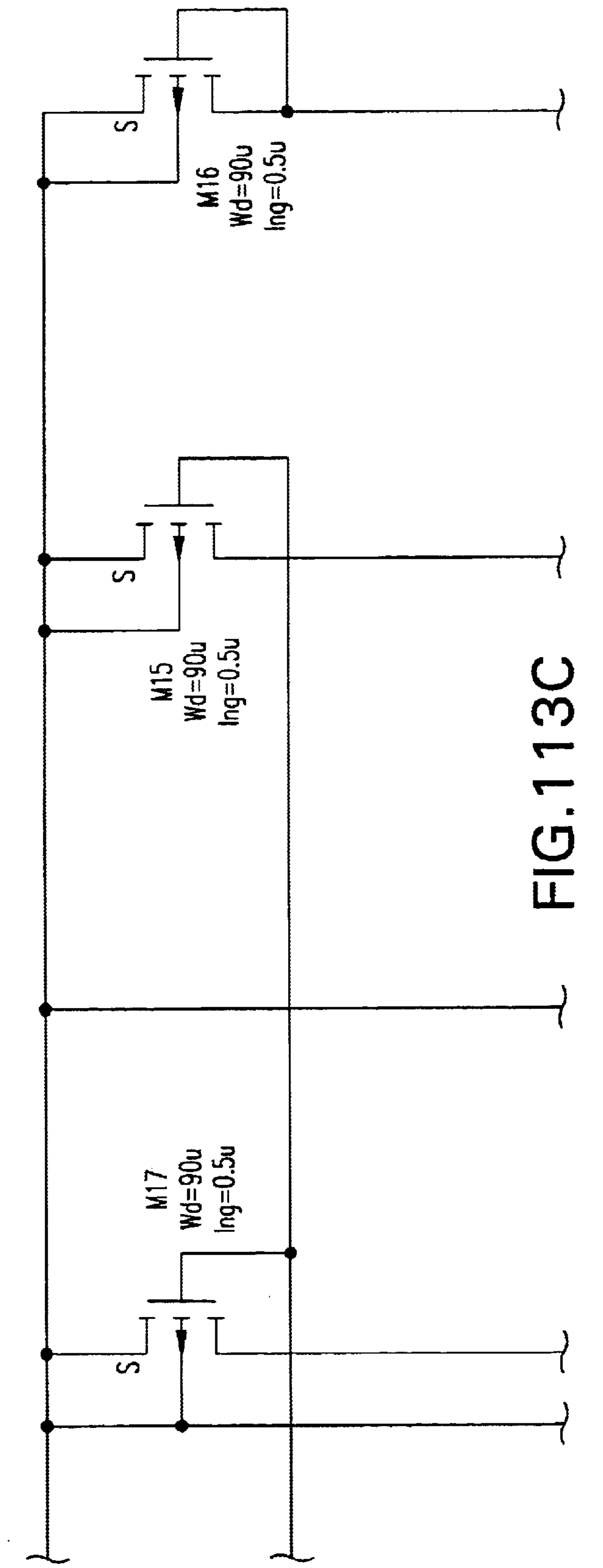
Figure 113D:
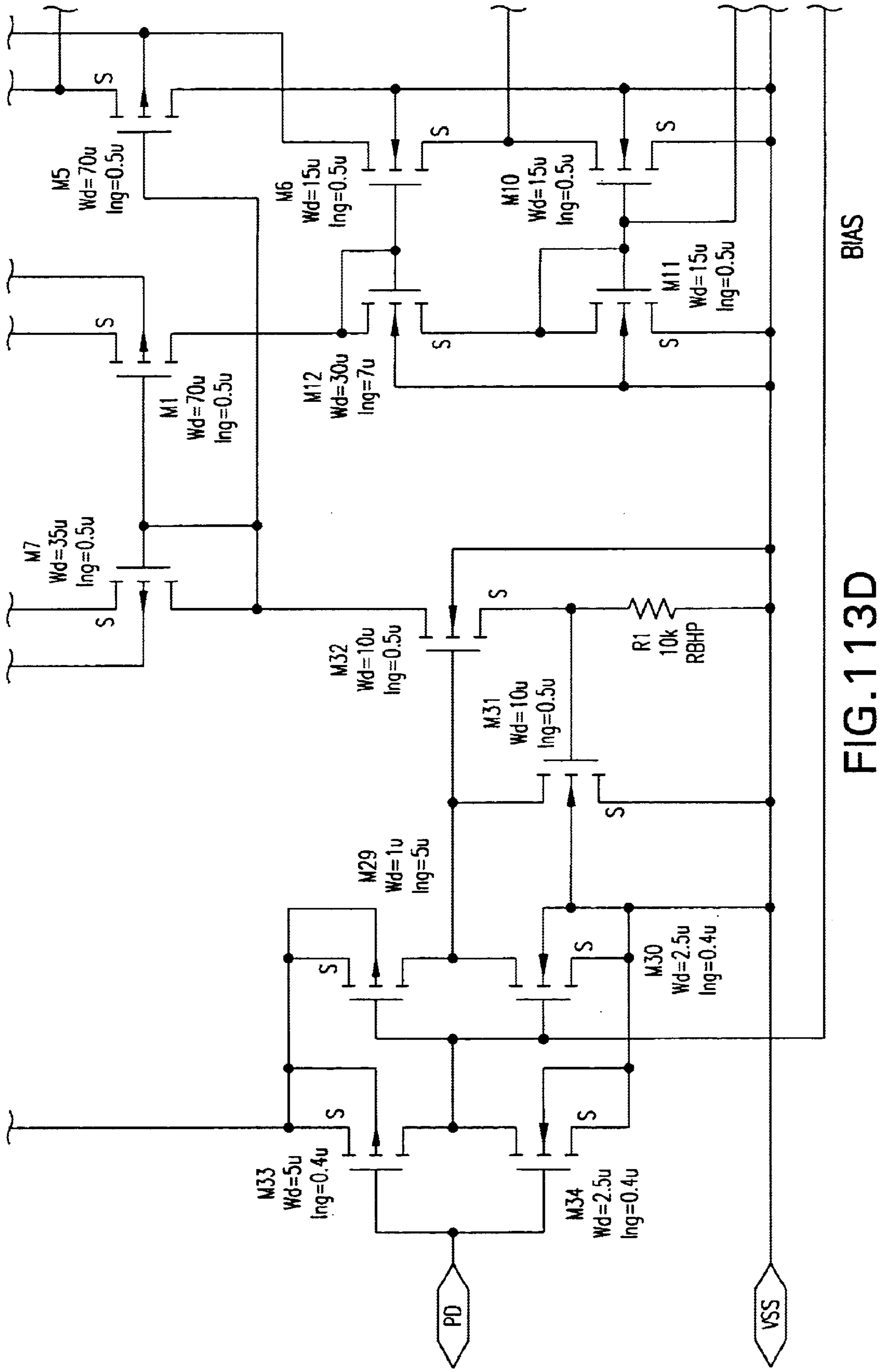
Figure 113E:
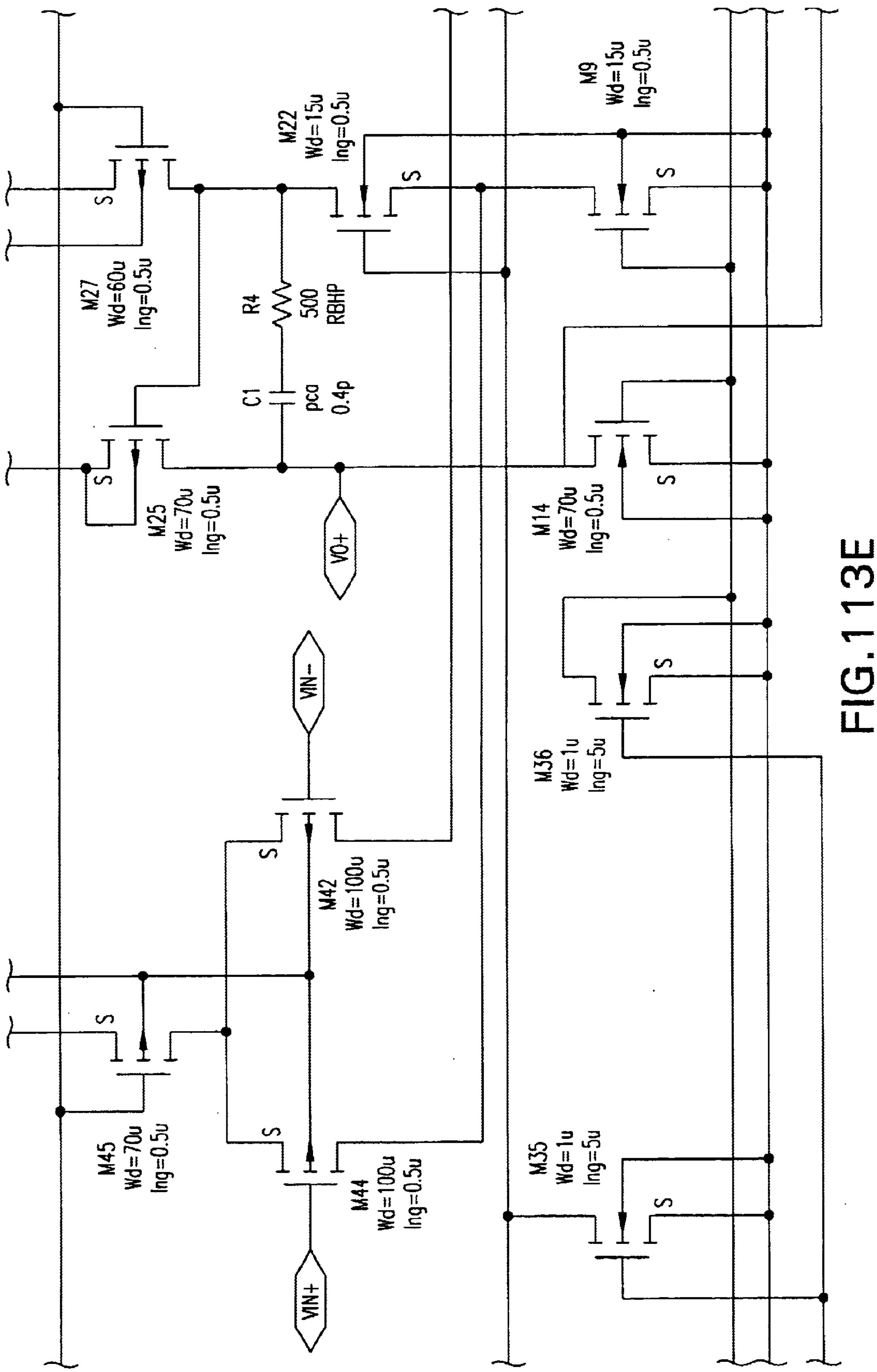
Figure 113F:
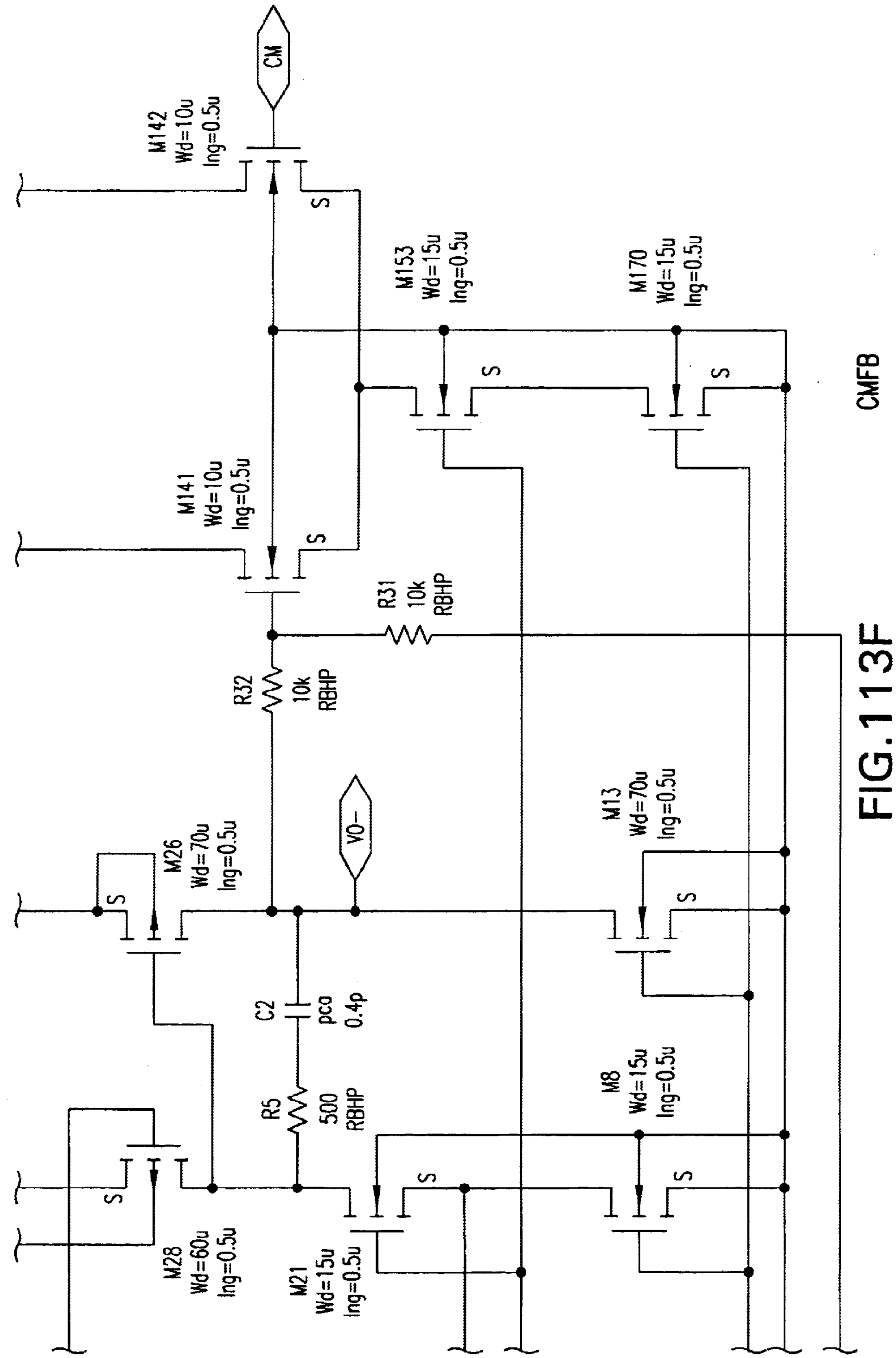
Figure 114:
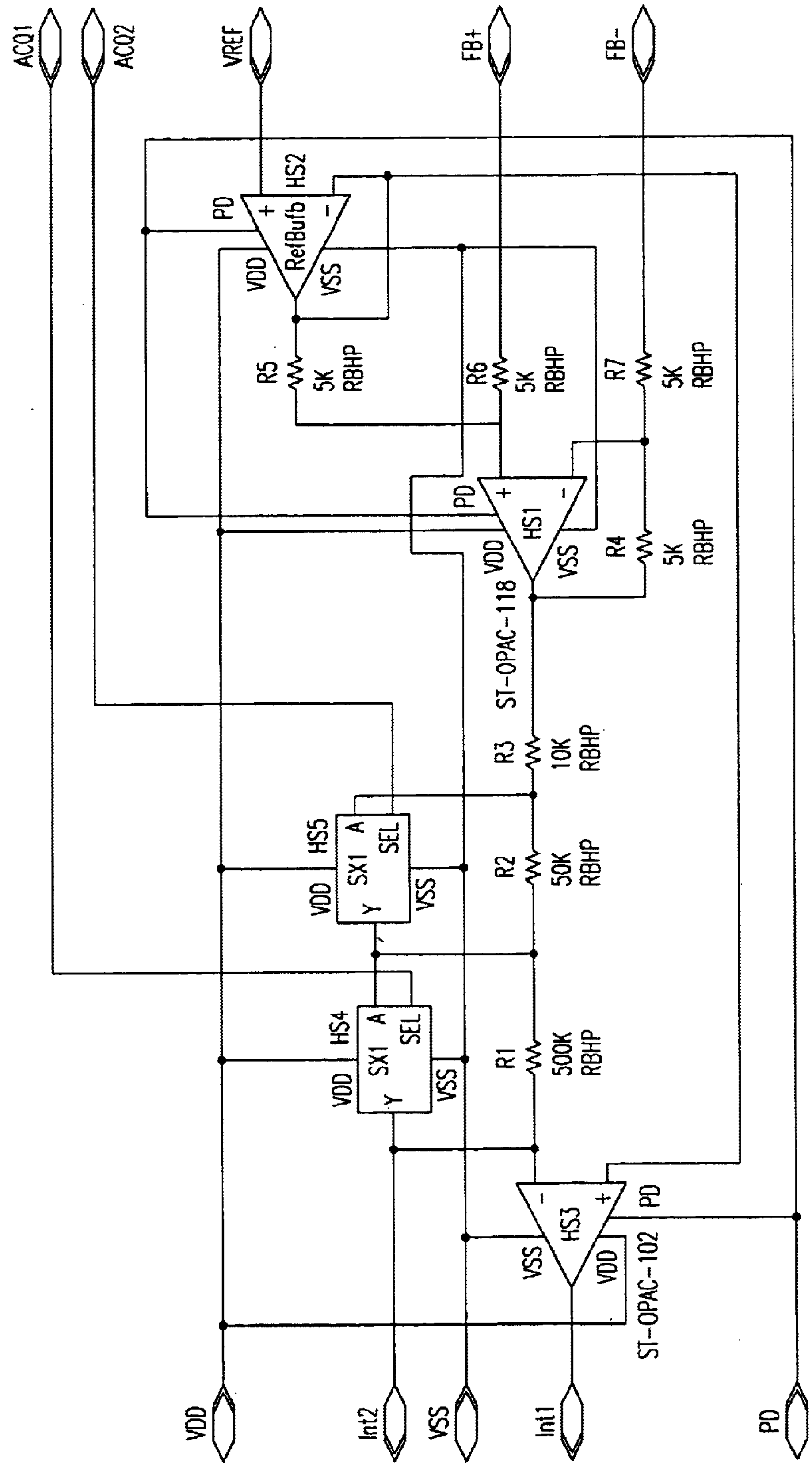
Figure 115A:
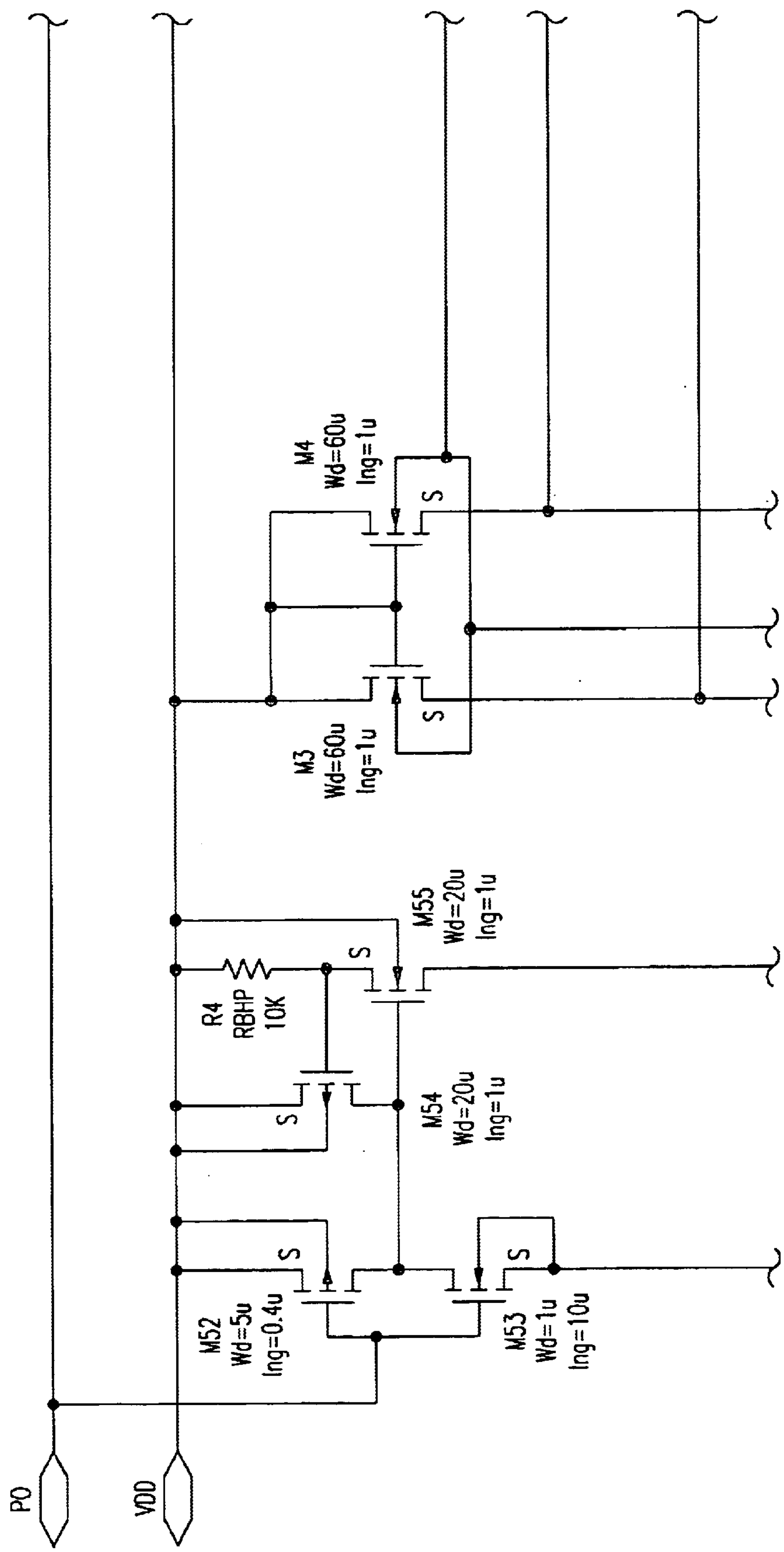
FIG. 115 includes FIGS. 115A–F and should be referred to for all references to FIG. 115 in the specification.
Figure 115B:
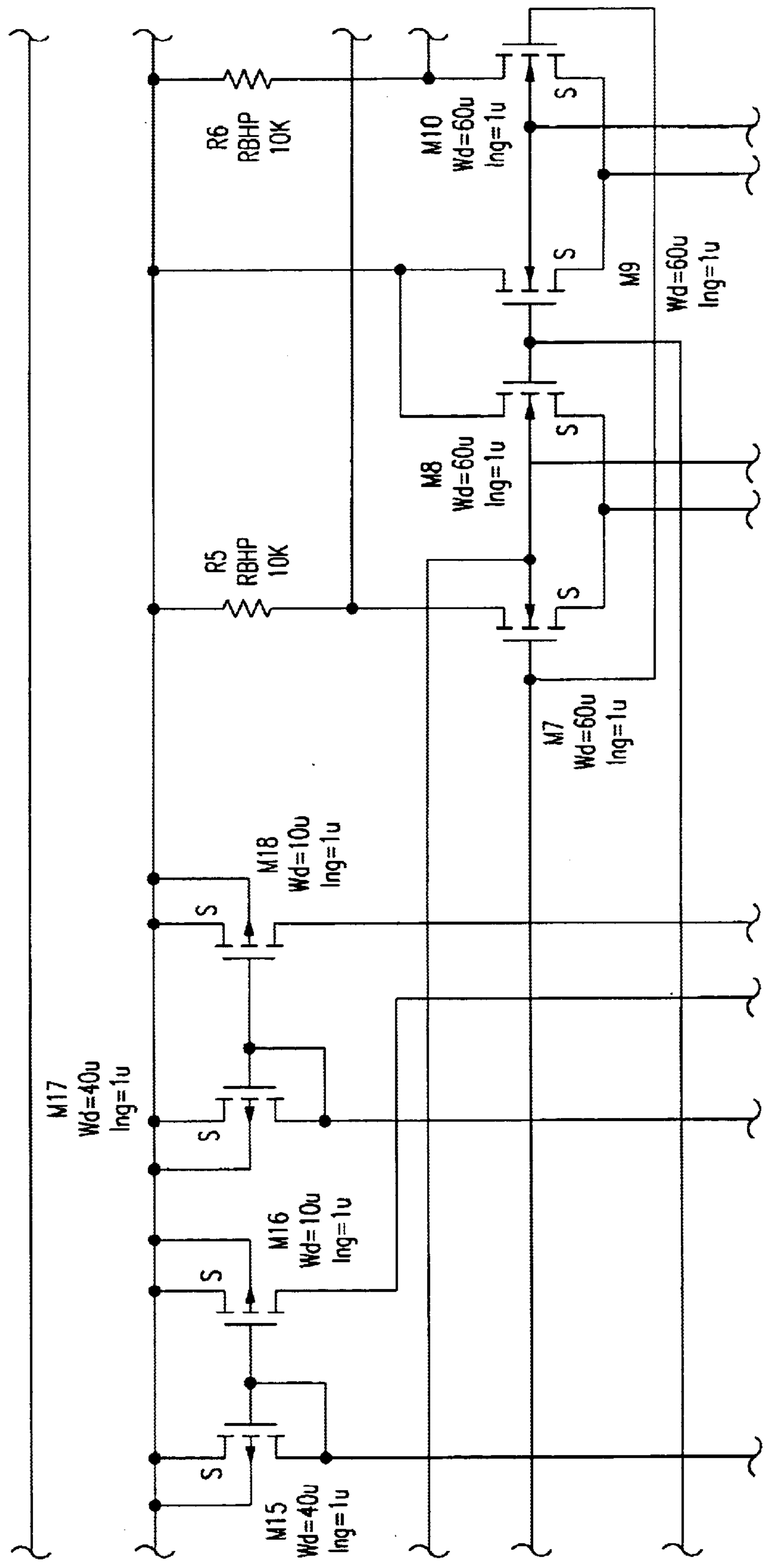
Figure 115C:
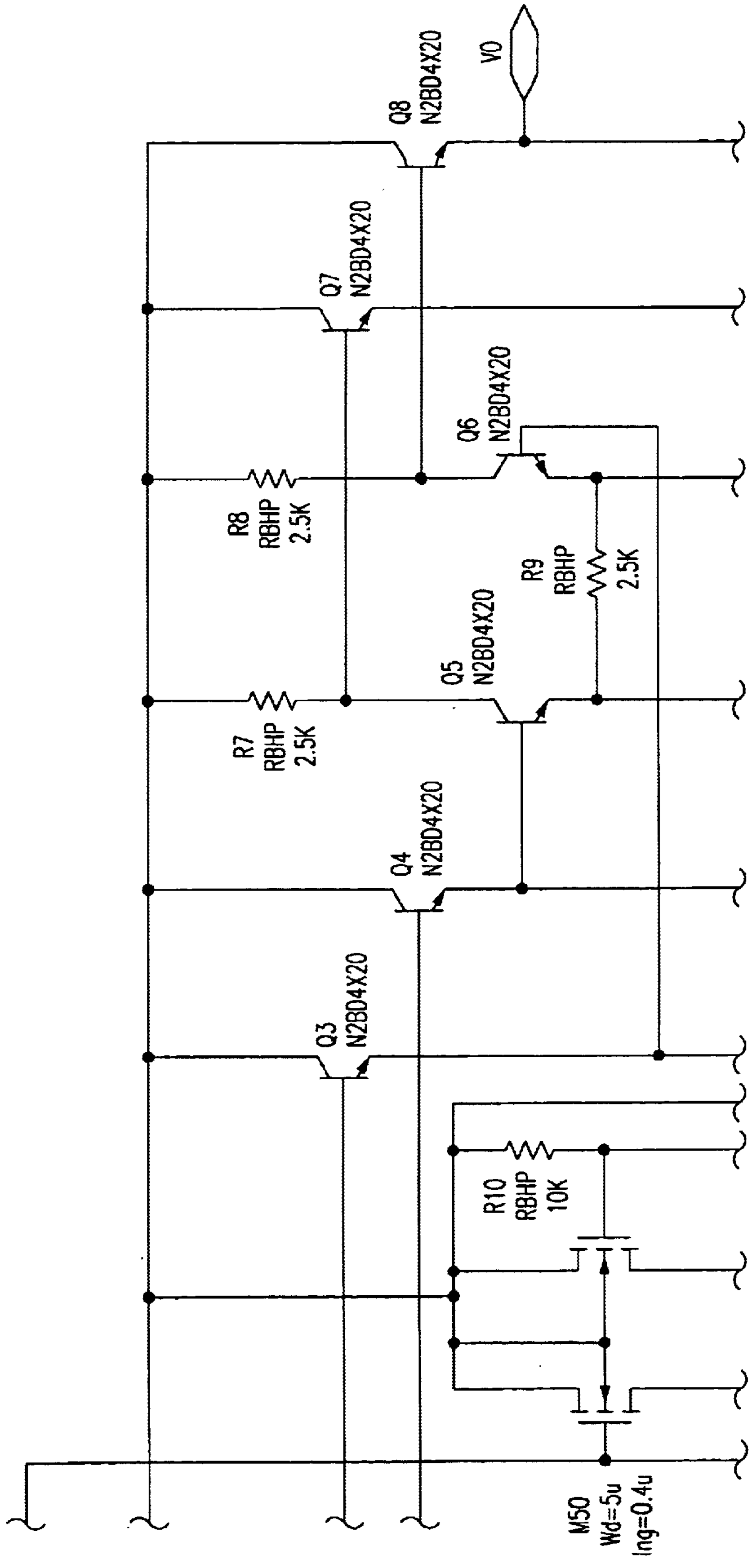
Figure 115D:
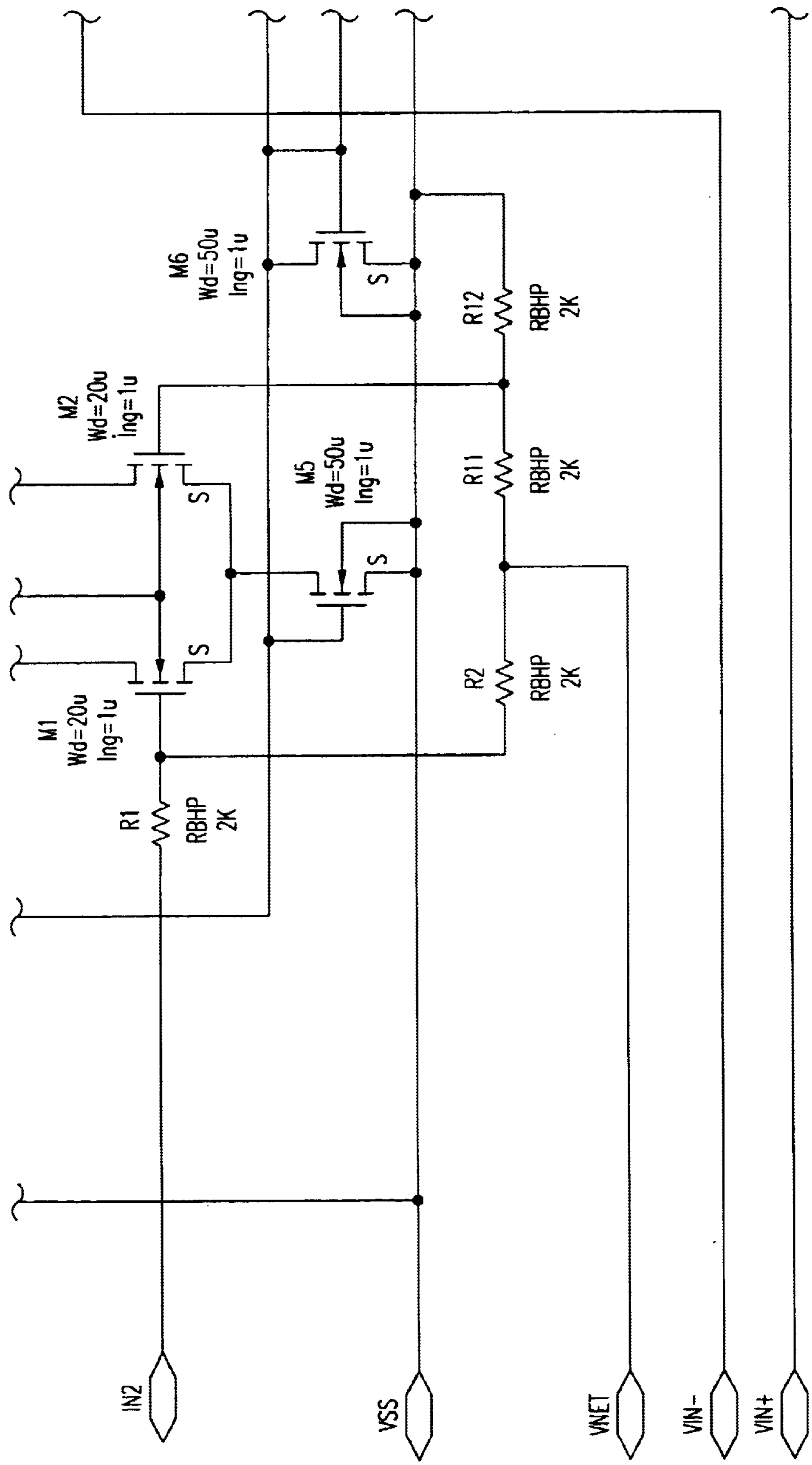
Figure 115E:
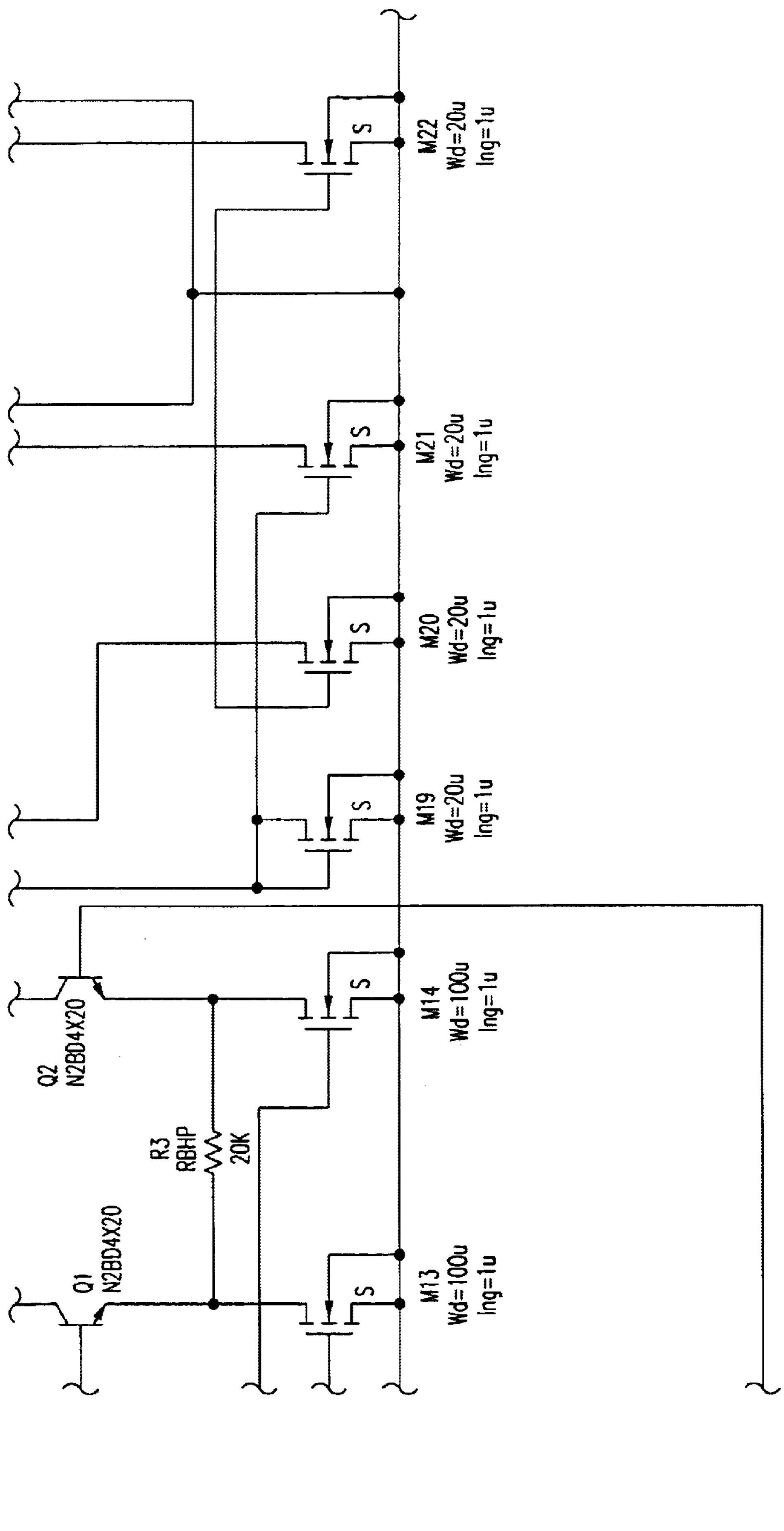
Figure 115F:
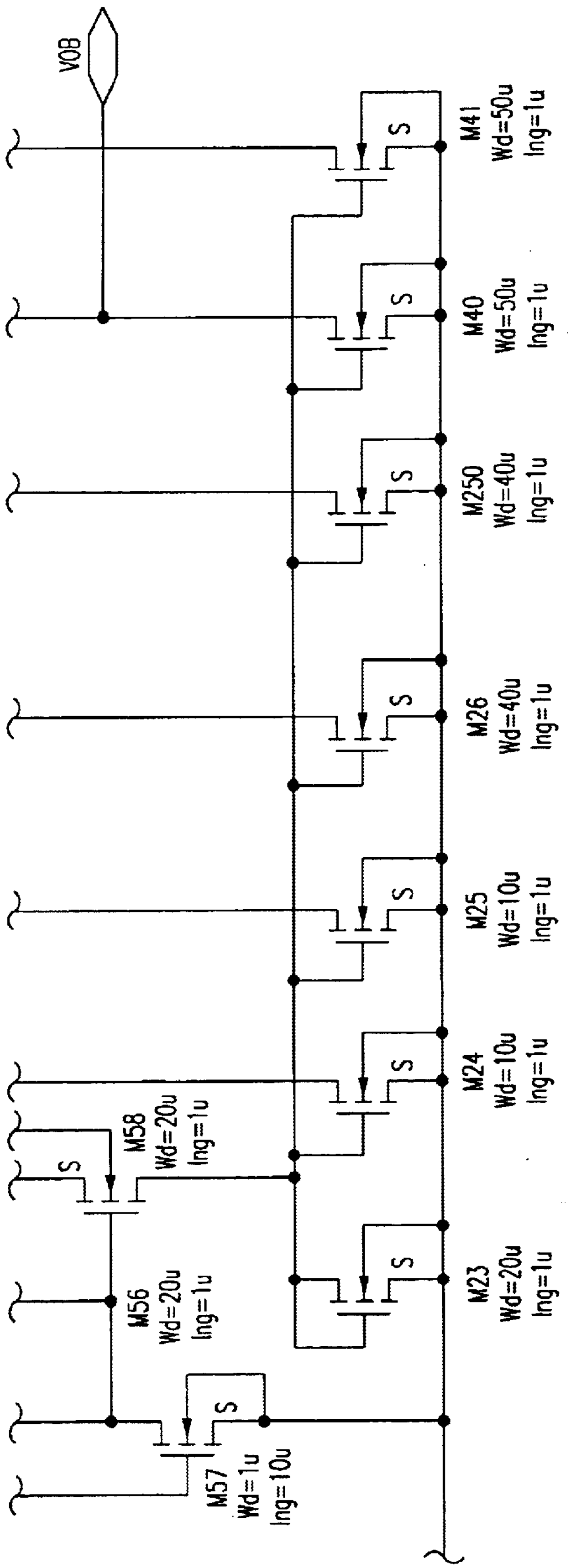
Figure 116:
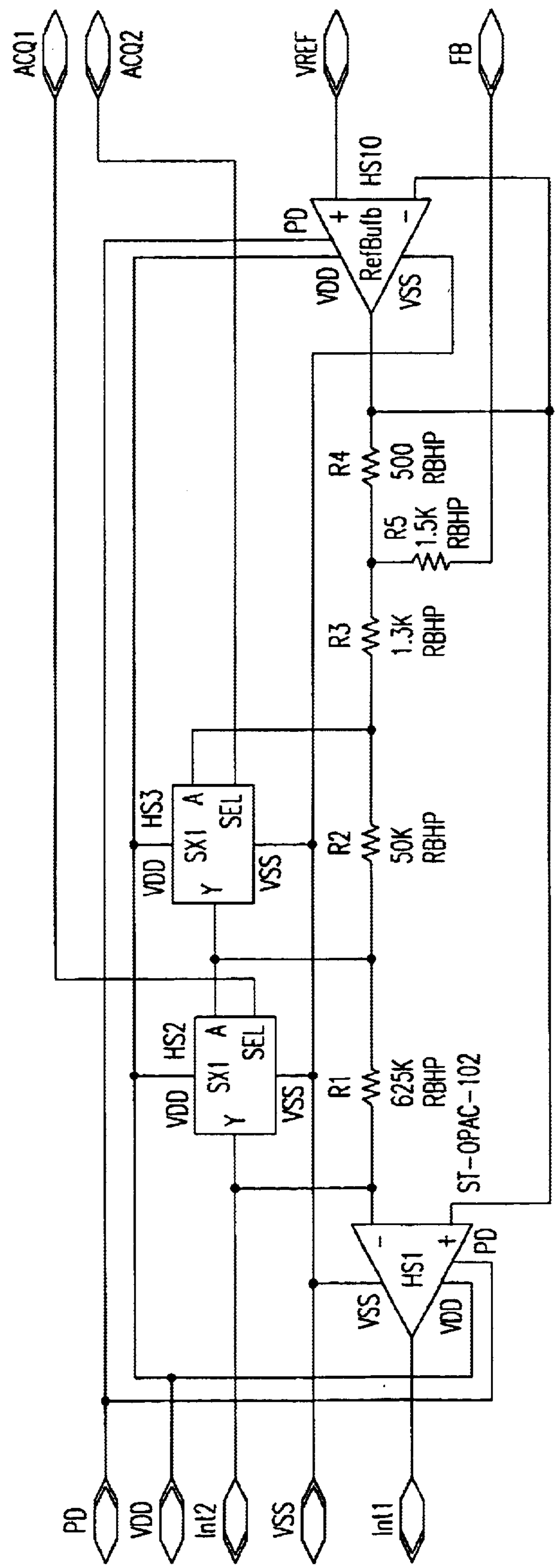
Figure 117:
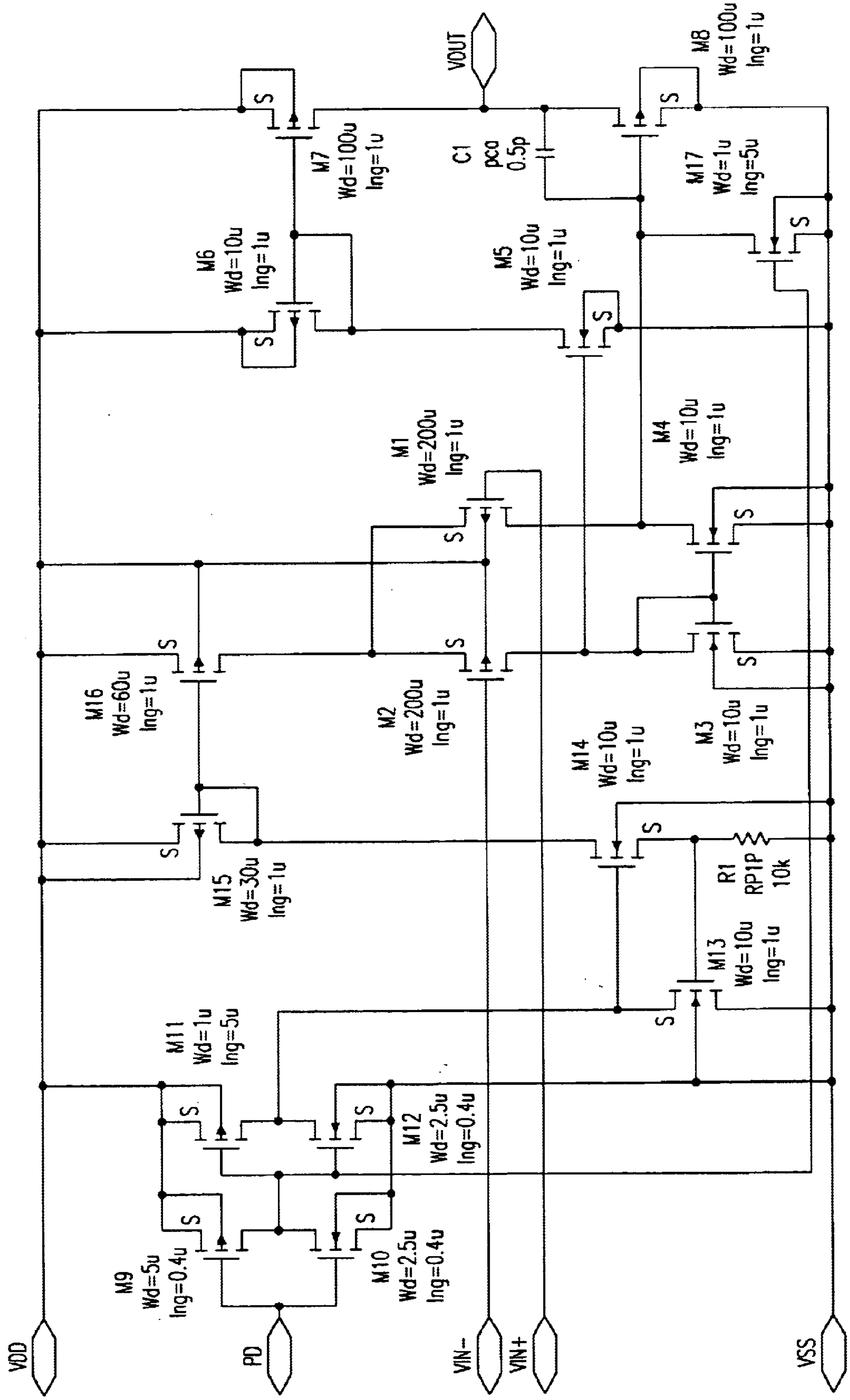
Figure 118A:
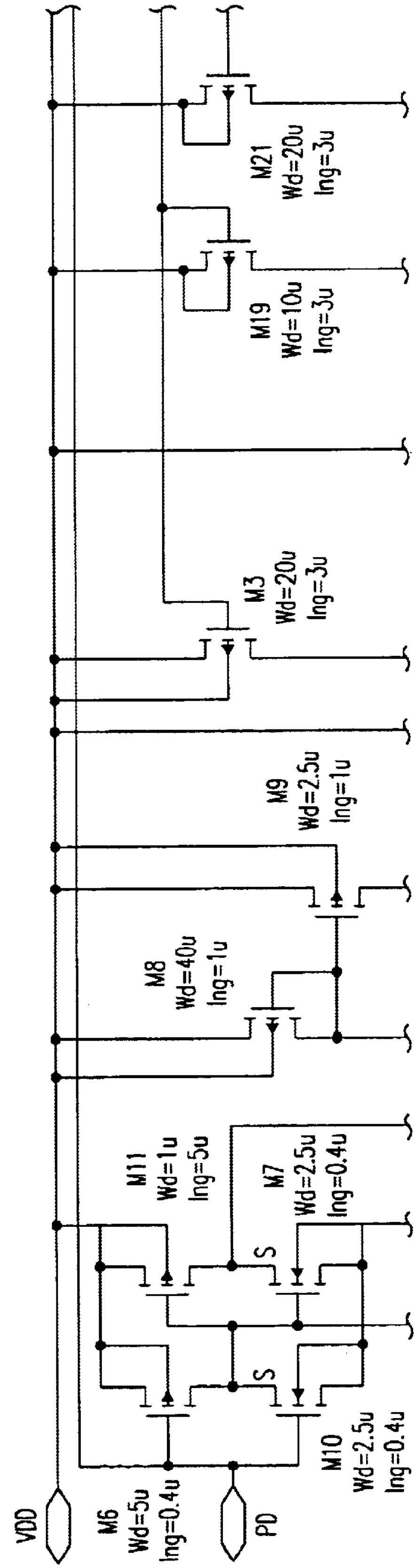
FIG. 118 includes FIG. 118A–D and should be referred to for all references to FIG 118 in the specification.
Figure 118B:
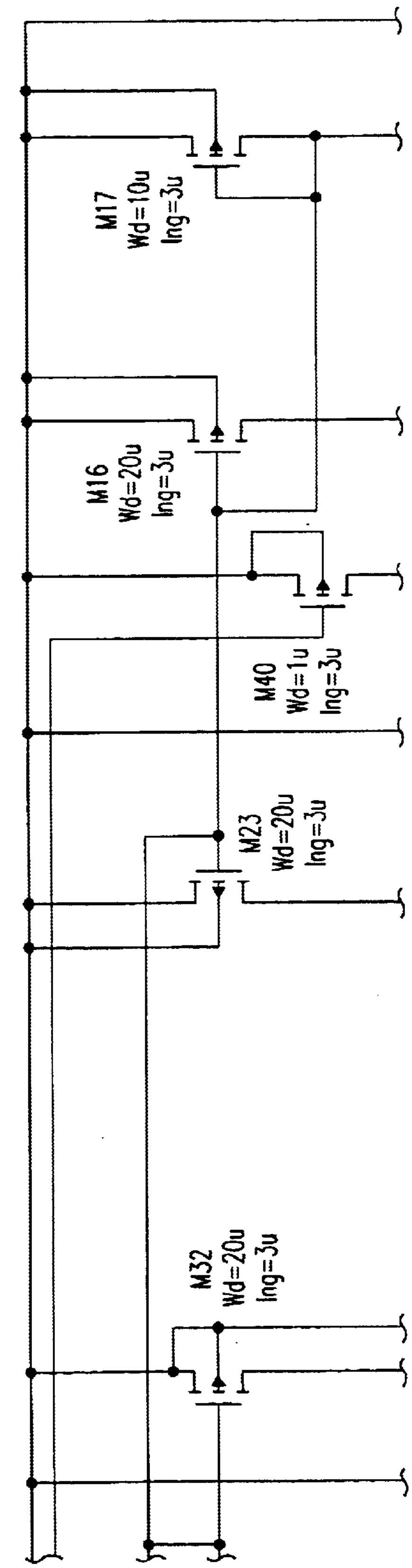
Figure 118C:
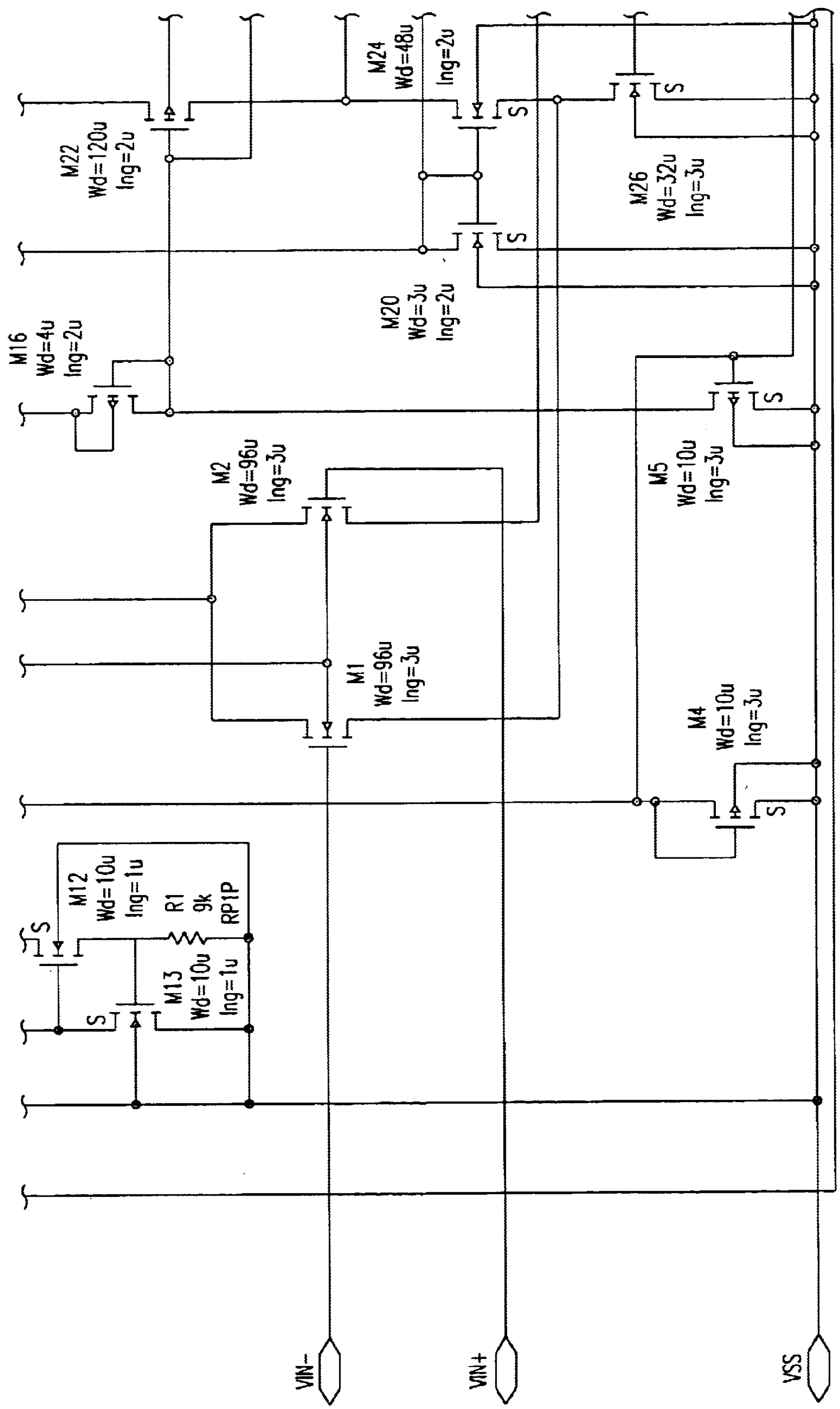
Figure 118D:
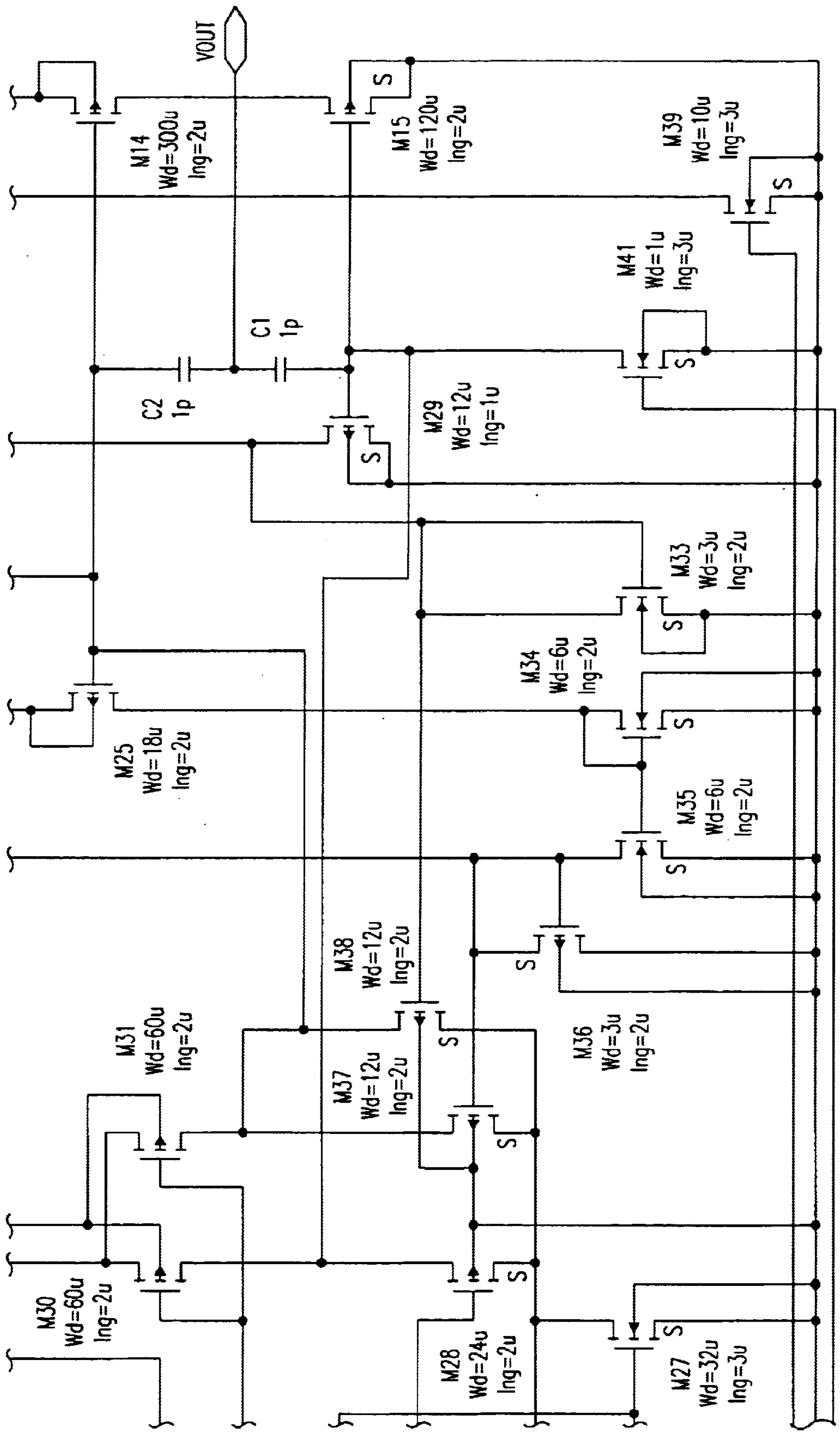
Figure 119:
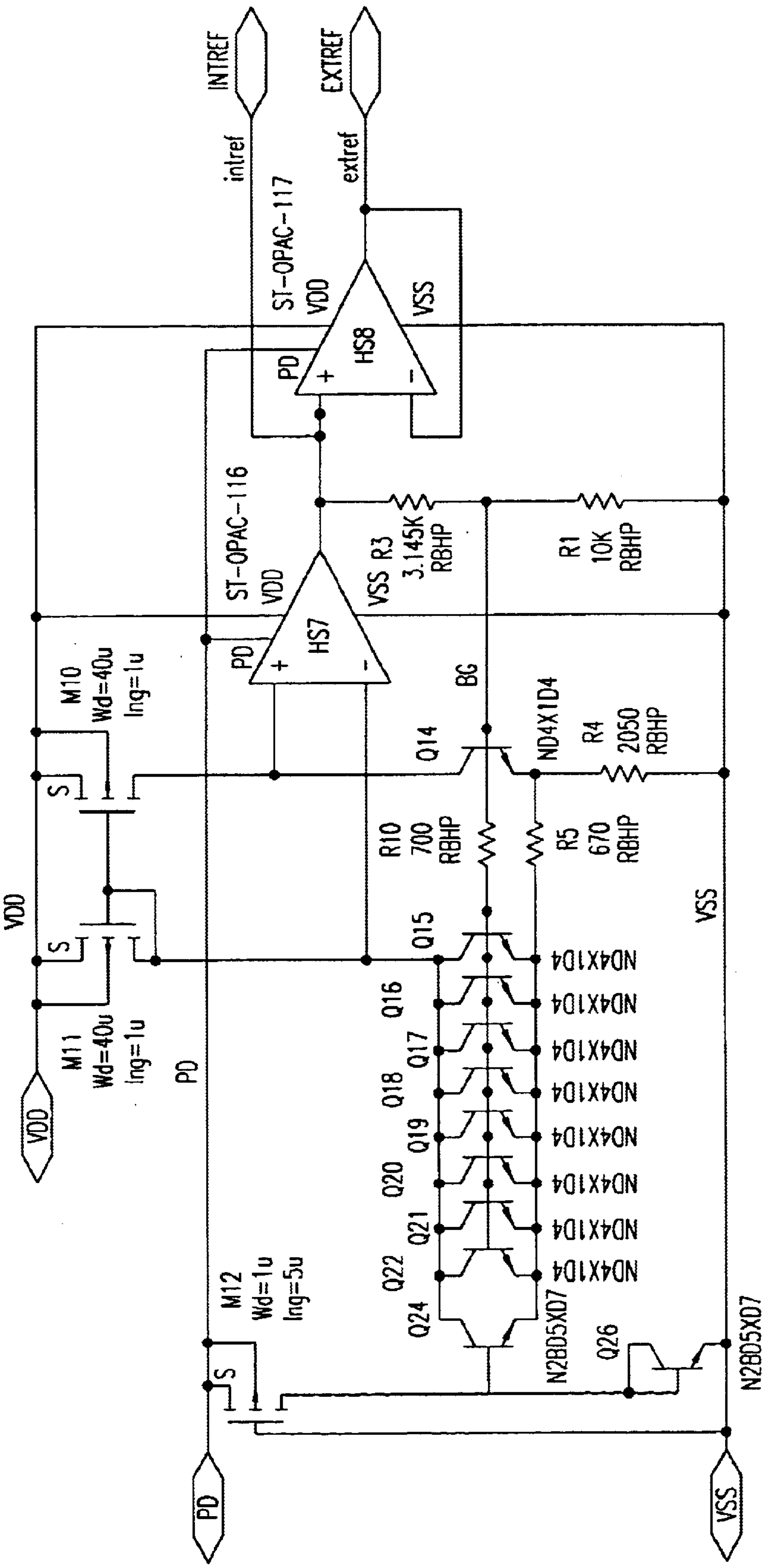
Figure 120:
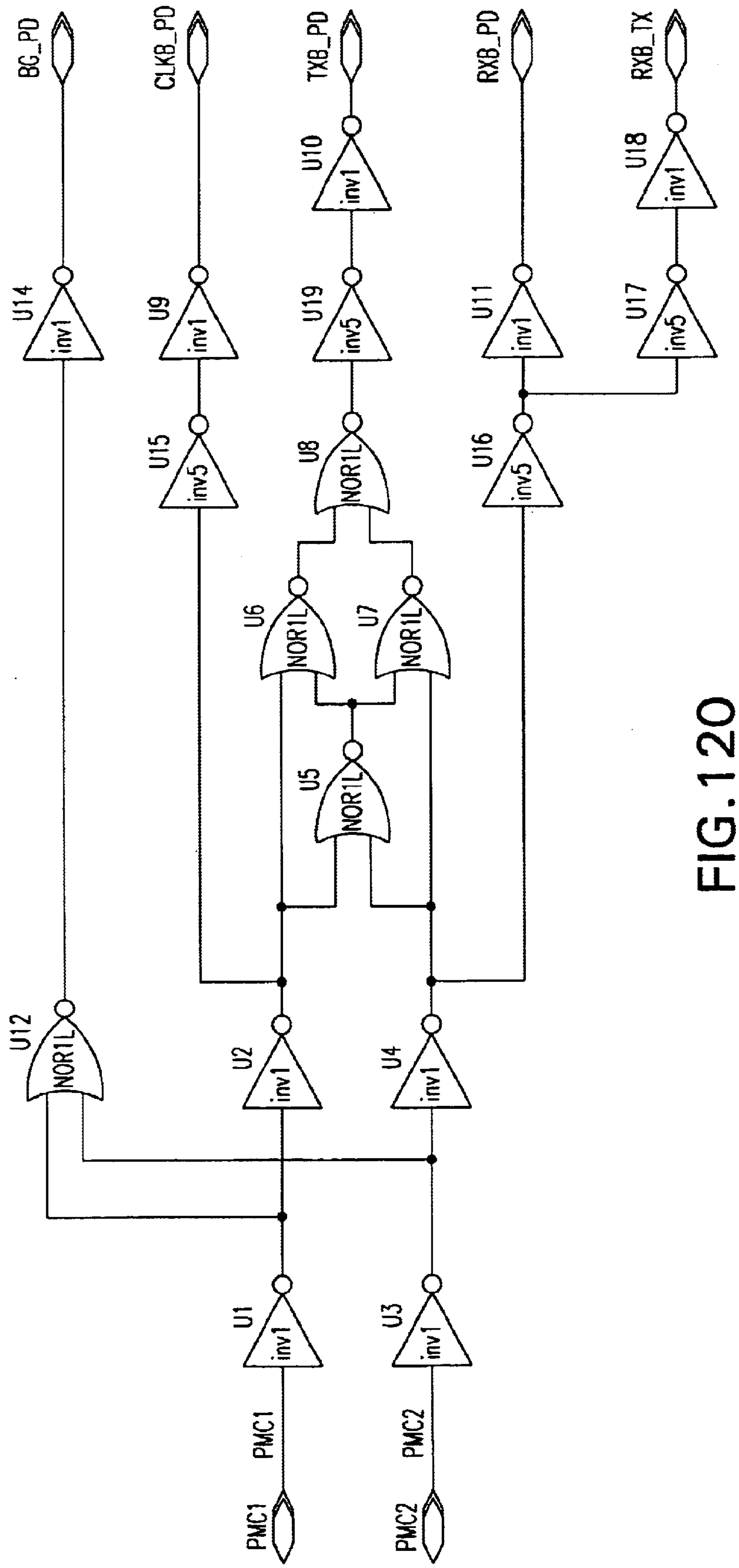
Figure 121:
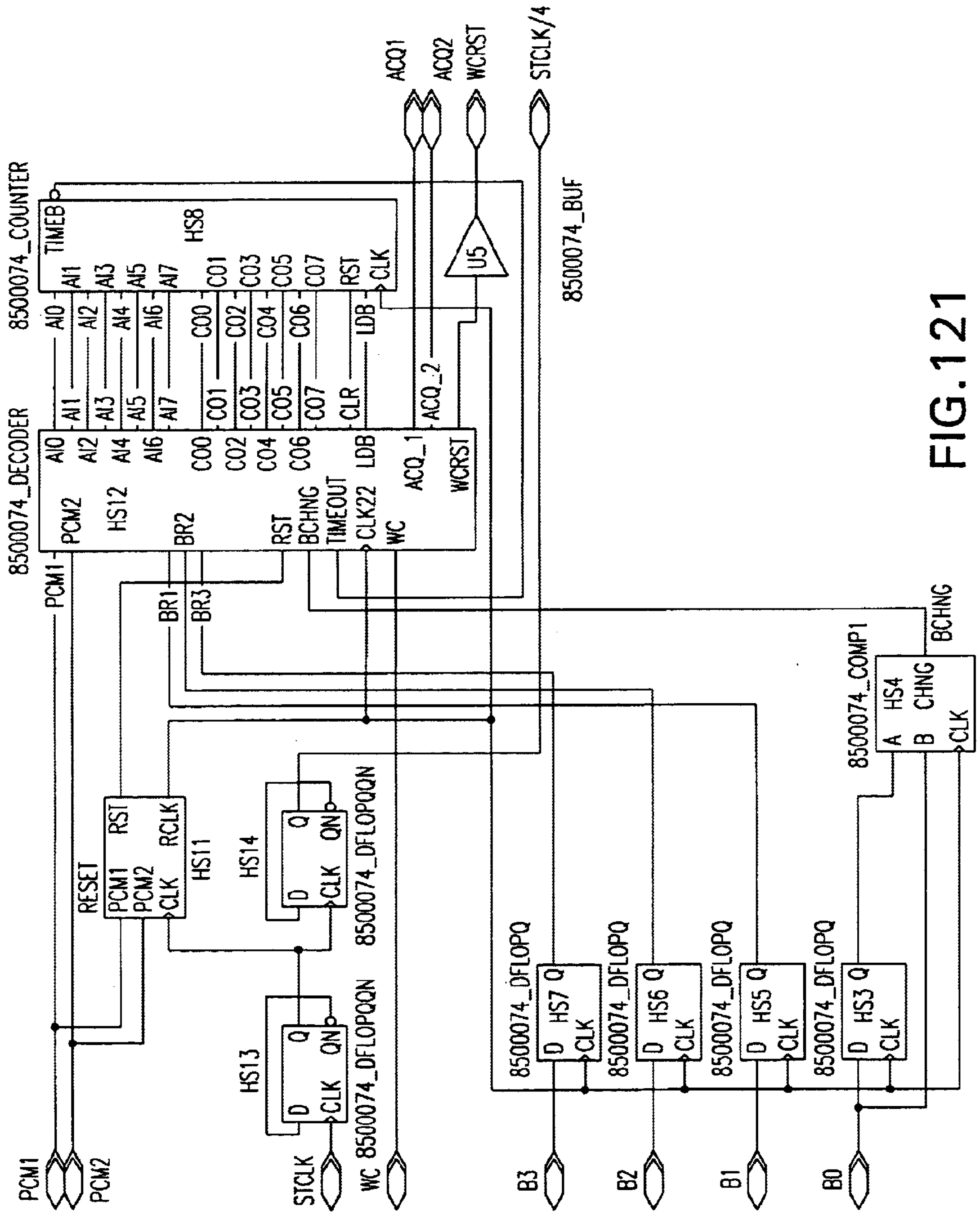
Figure 122:
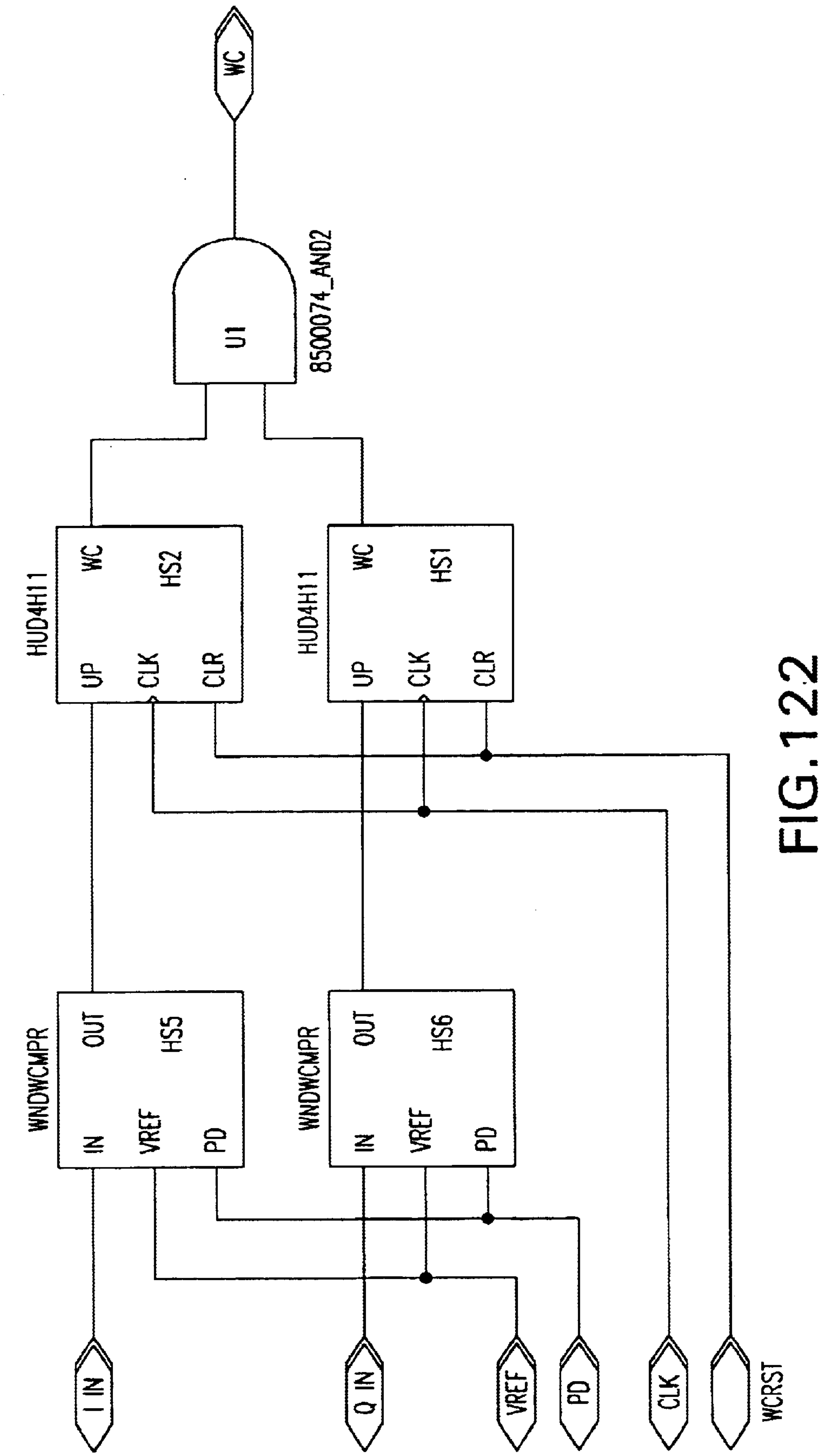
Figure 123A:
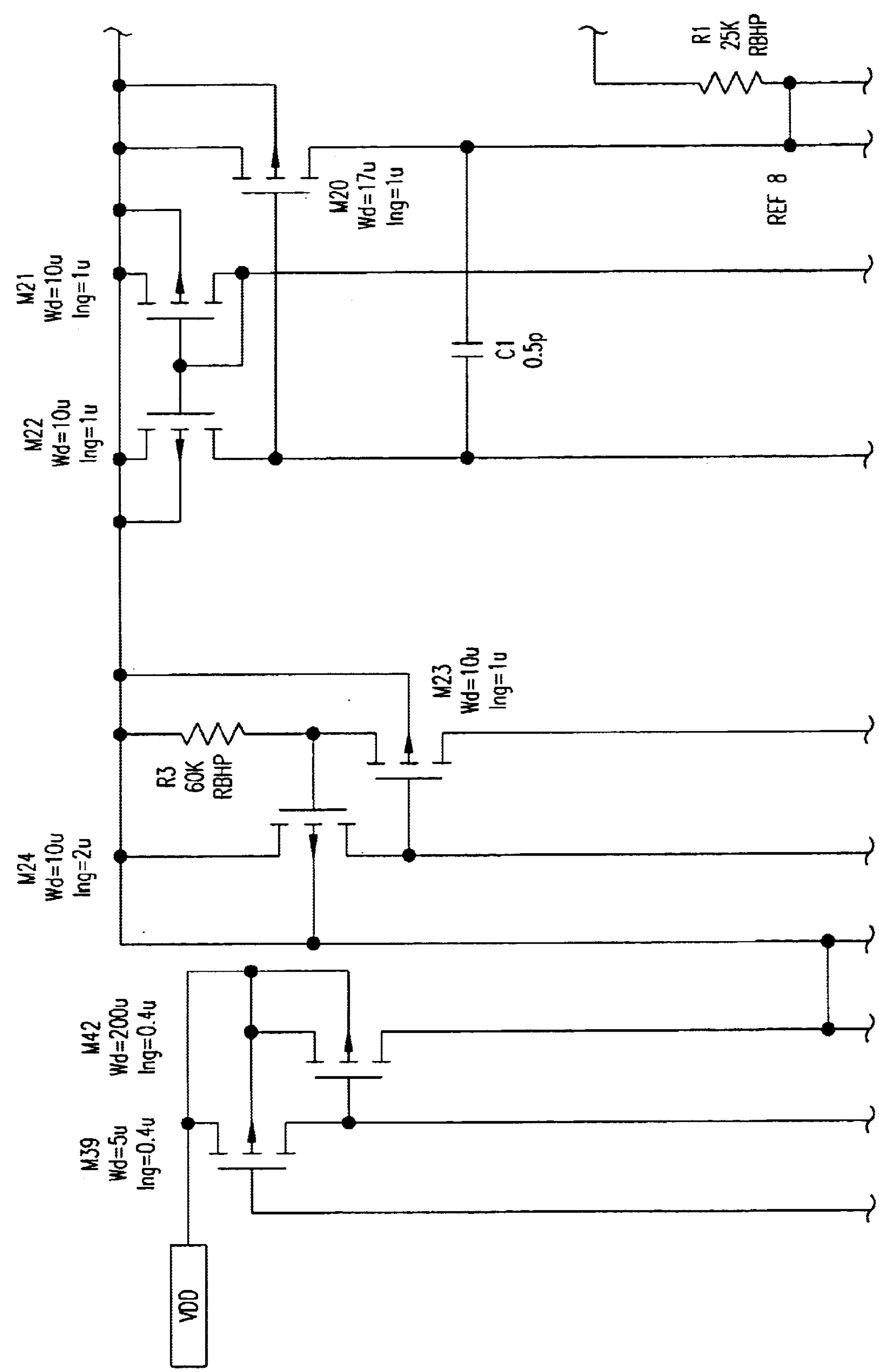
FIG. 123 includes FIGS. 123A–H and should be referred to for all references to FIG. 123 in the specification.
Figure 123B:
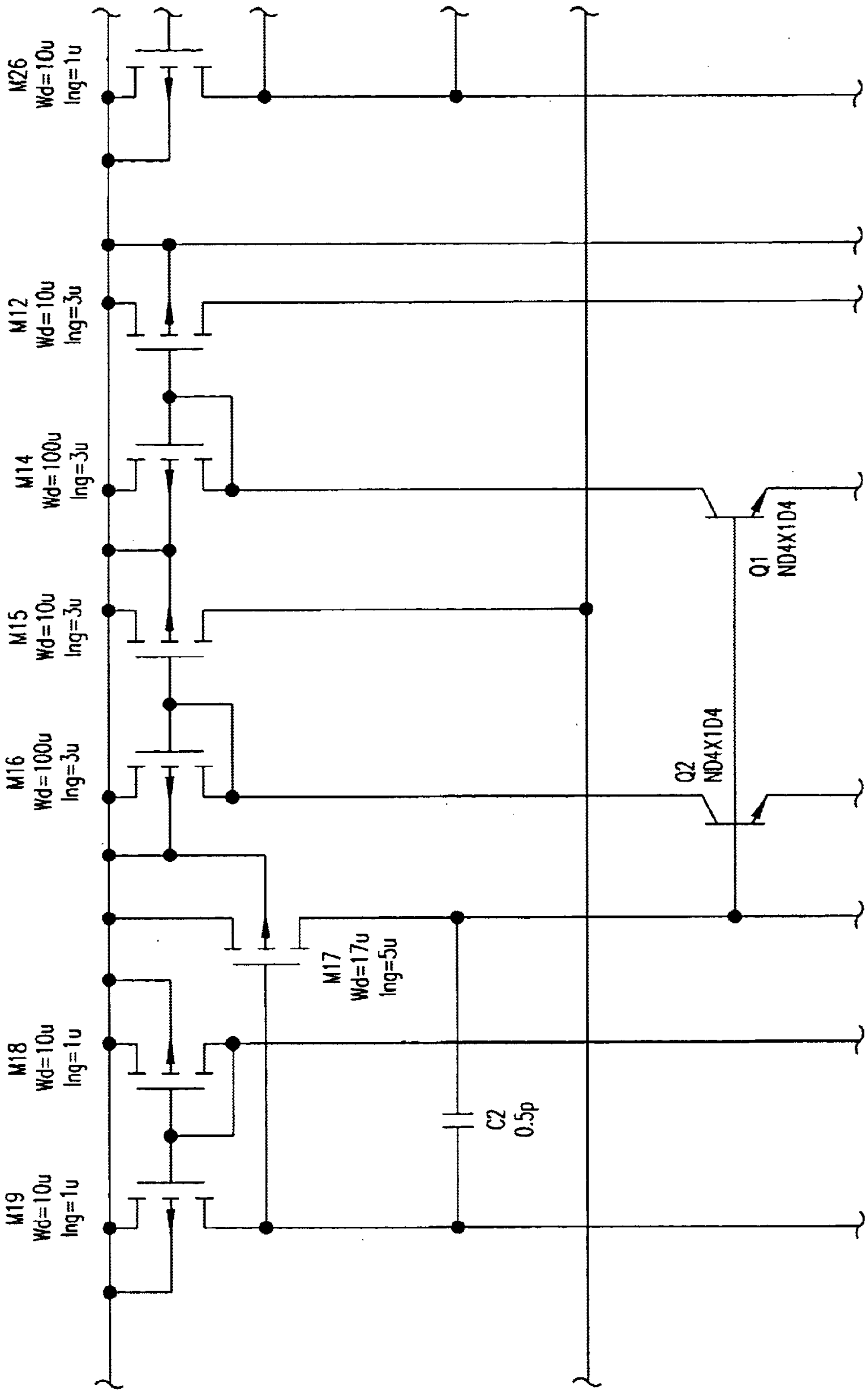
Figure 123C:
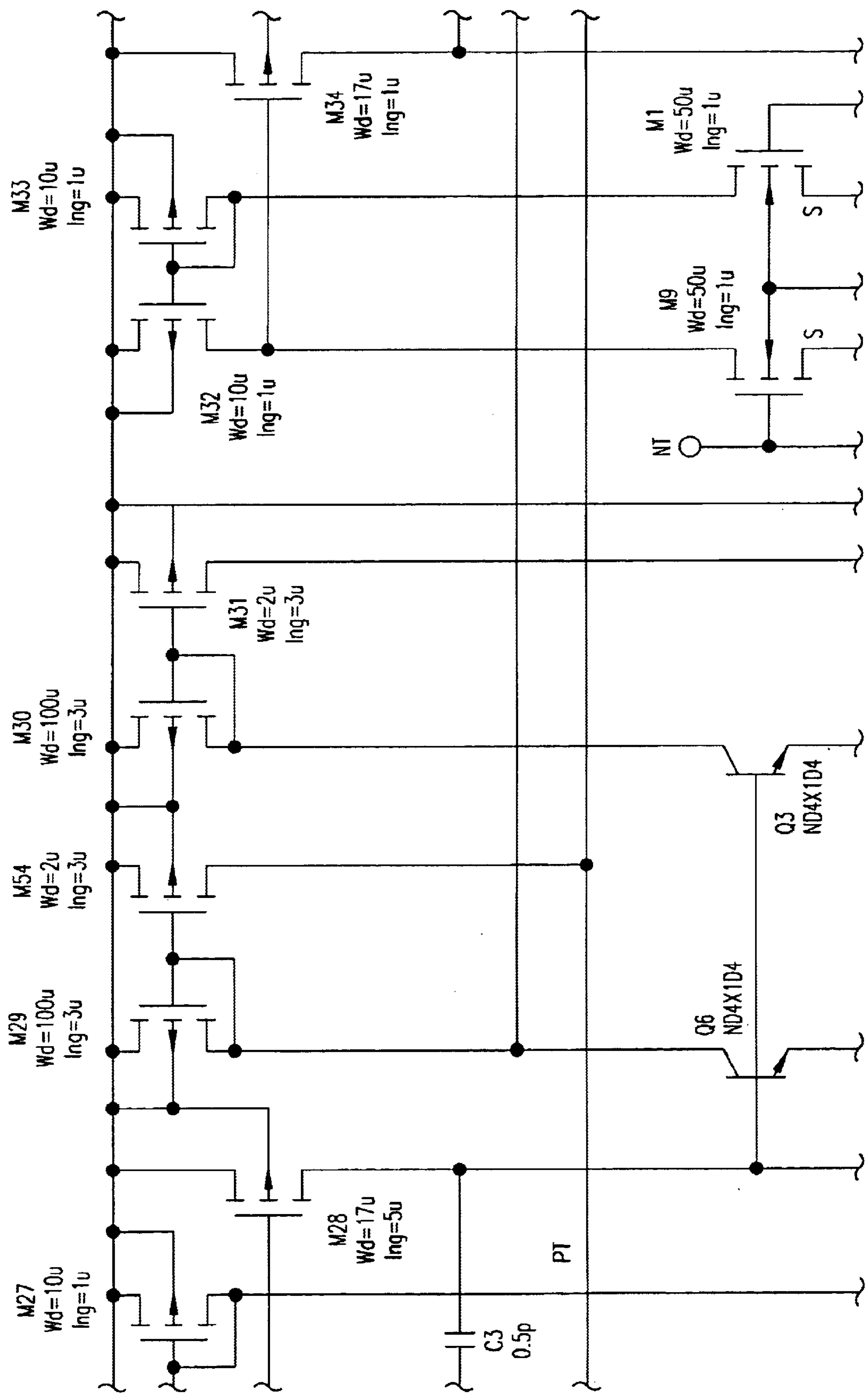
Figure 123D:
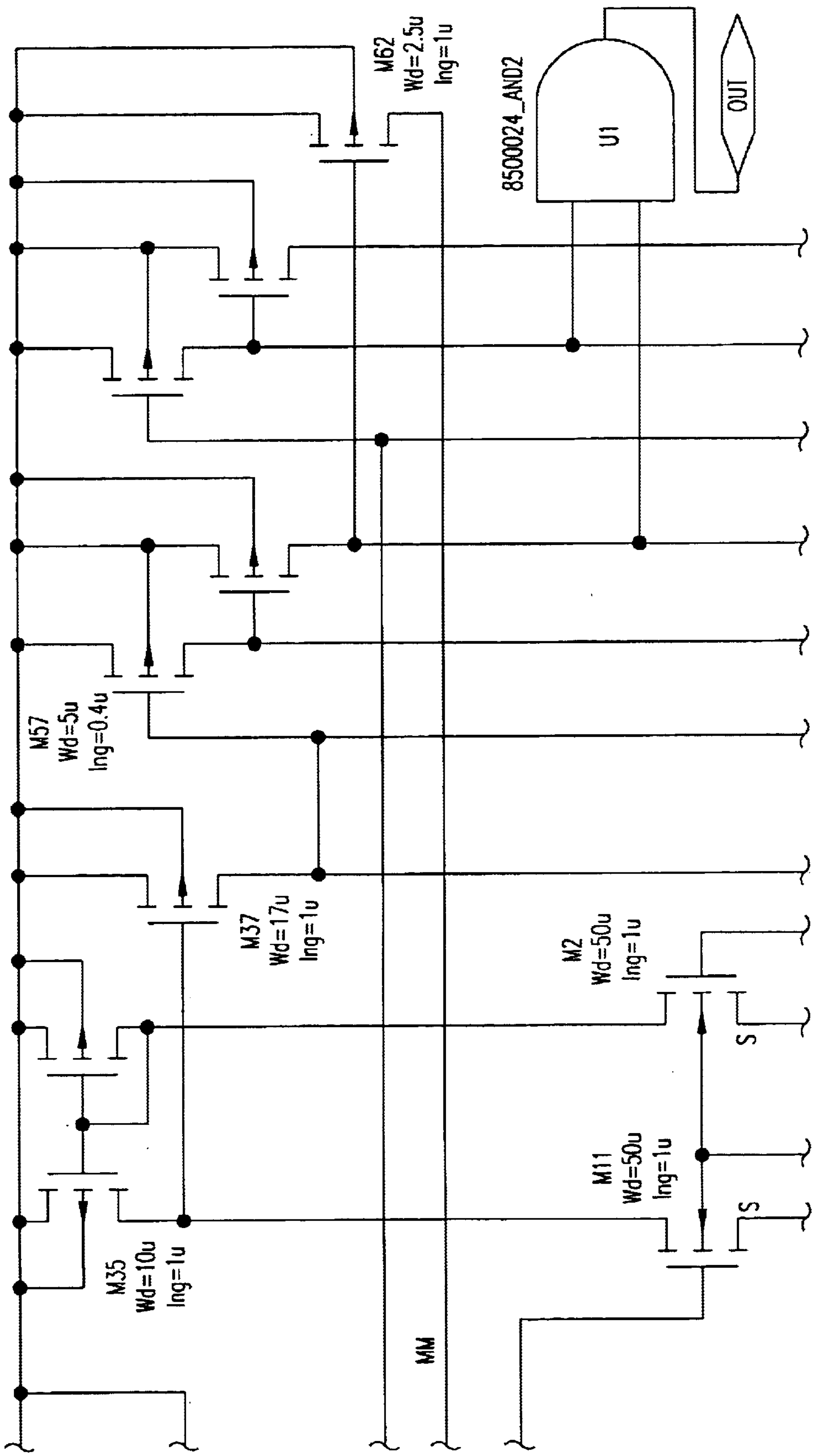
Figure 123E:
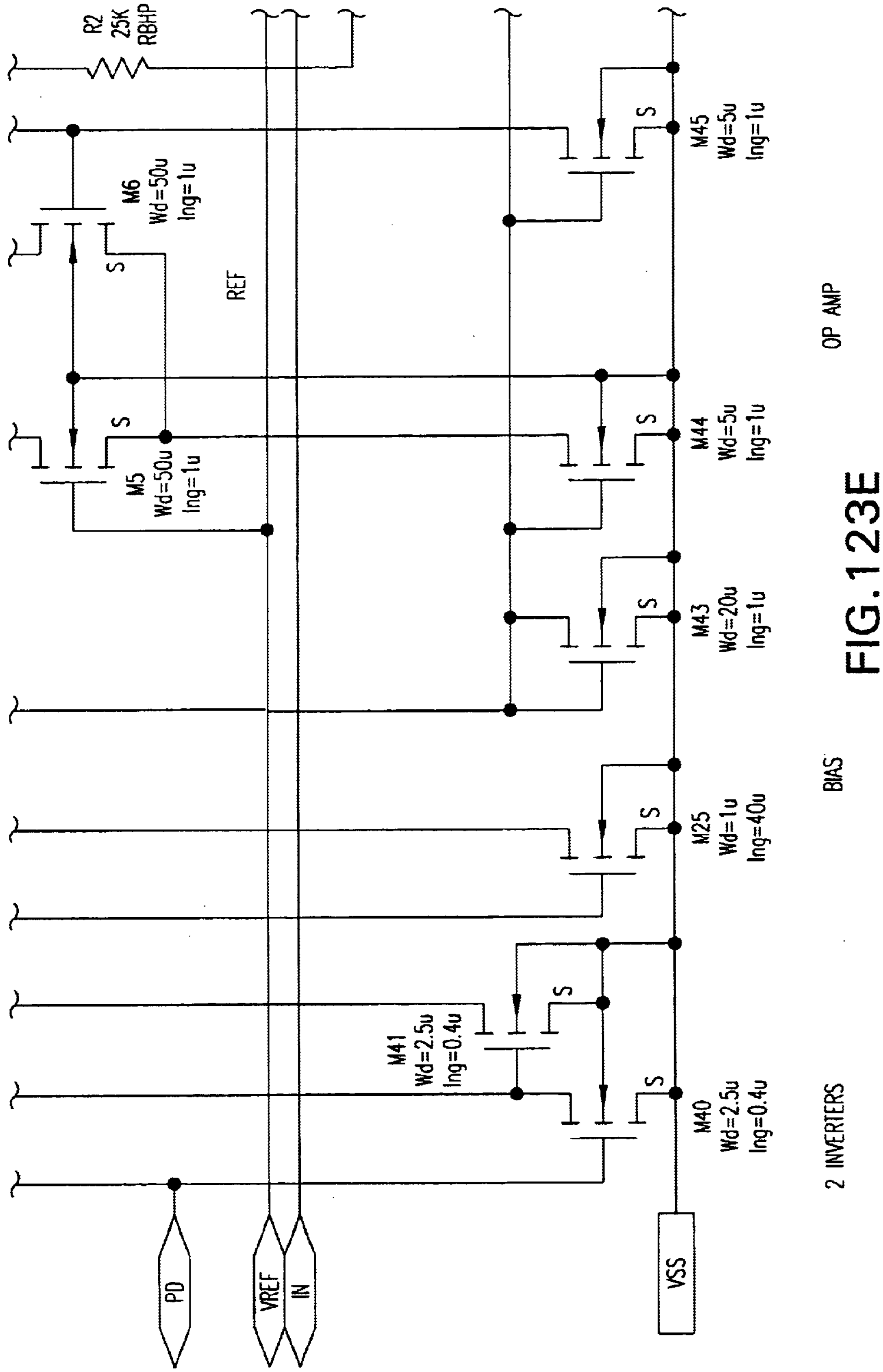
Figure 123F:
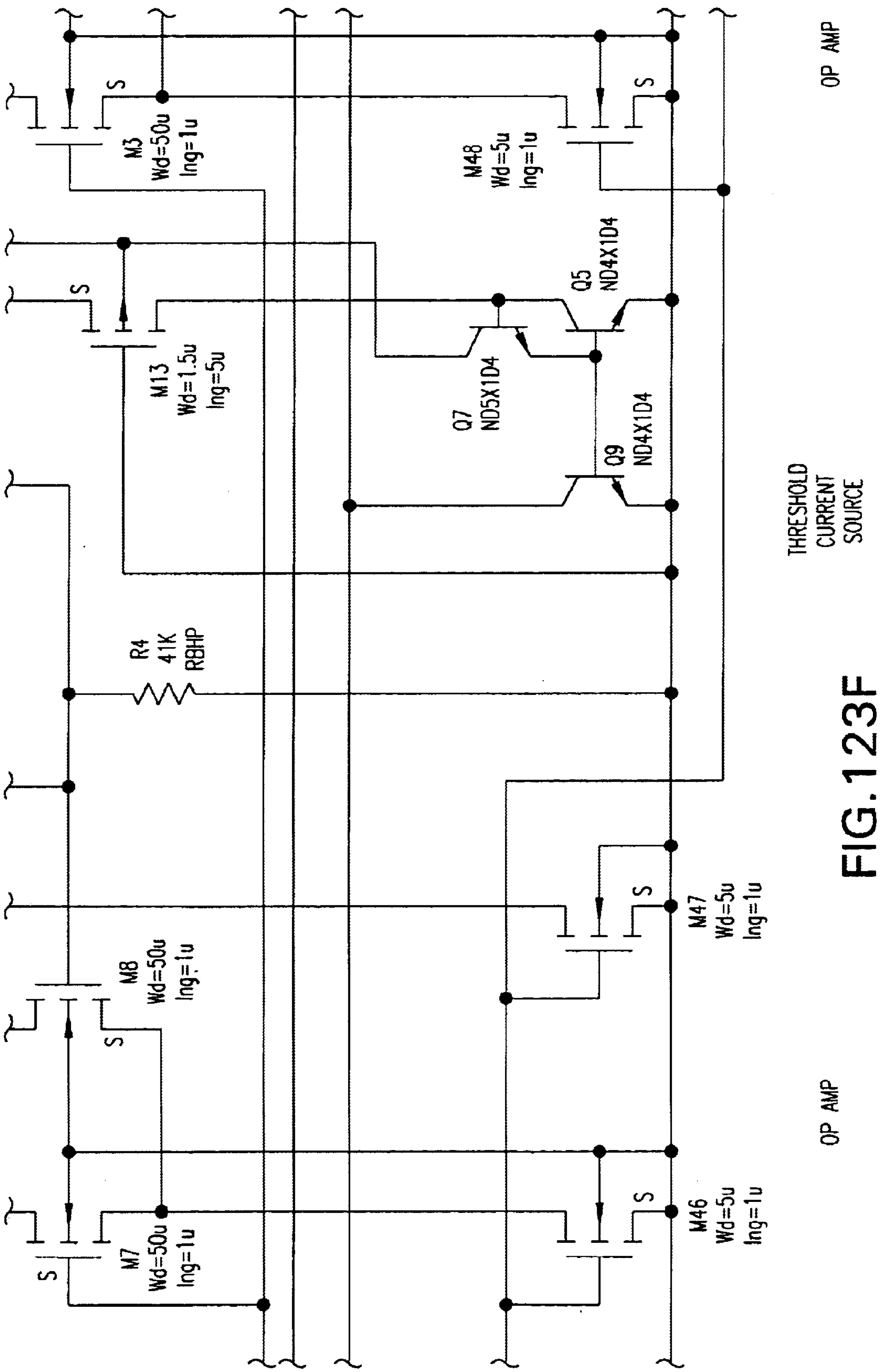
Figure 123G:
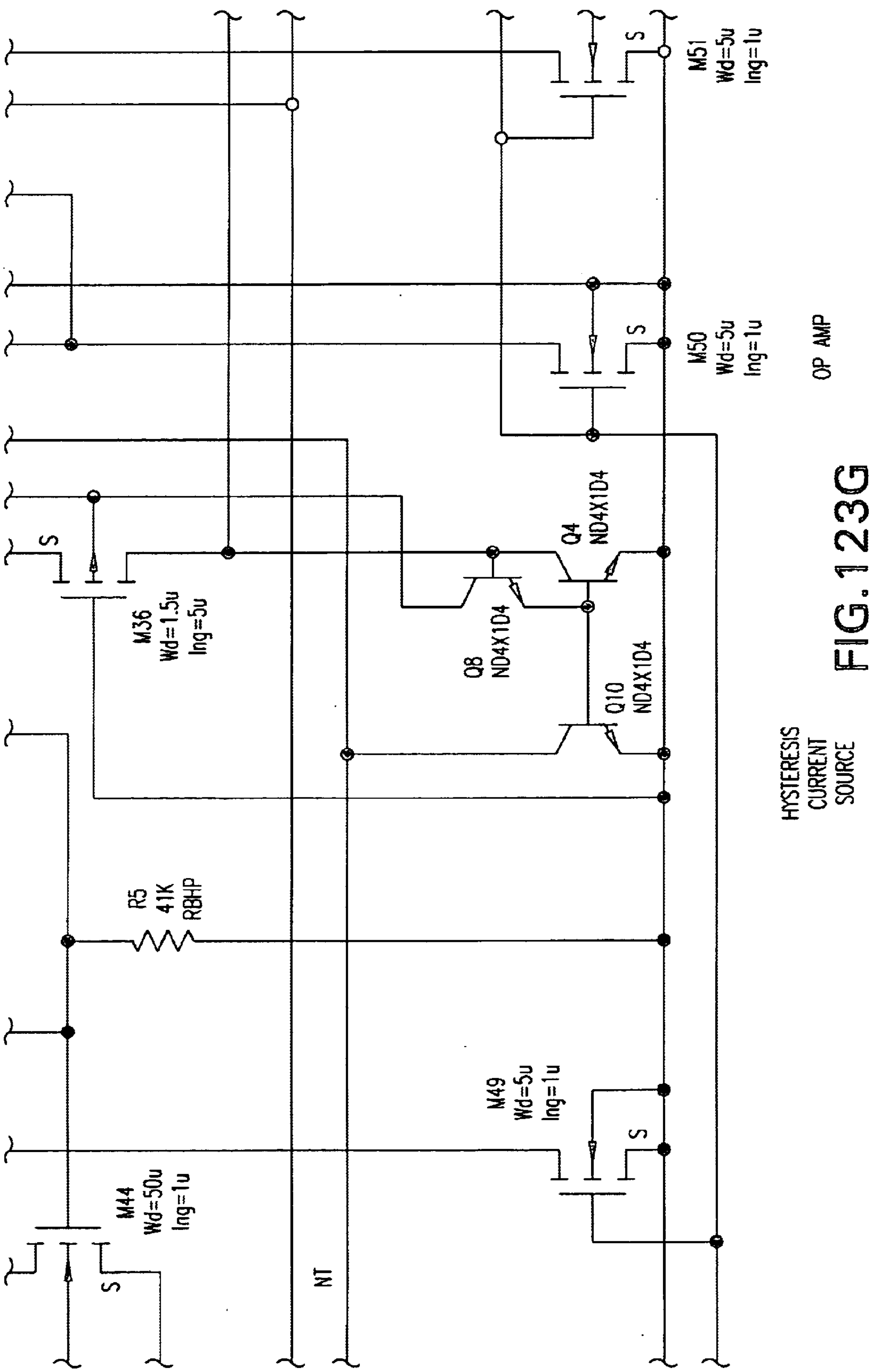
Figure 123H:
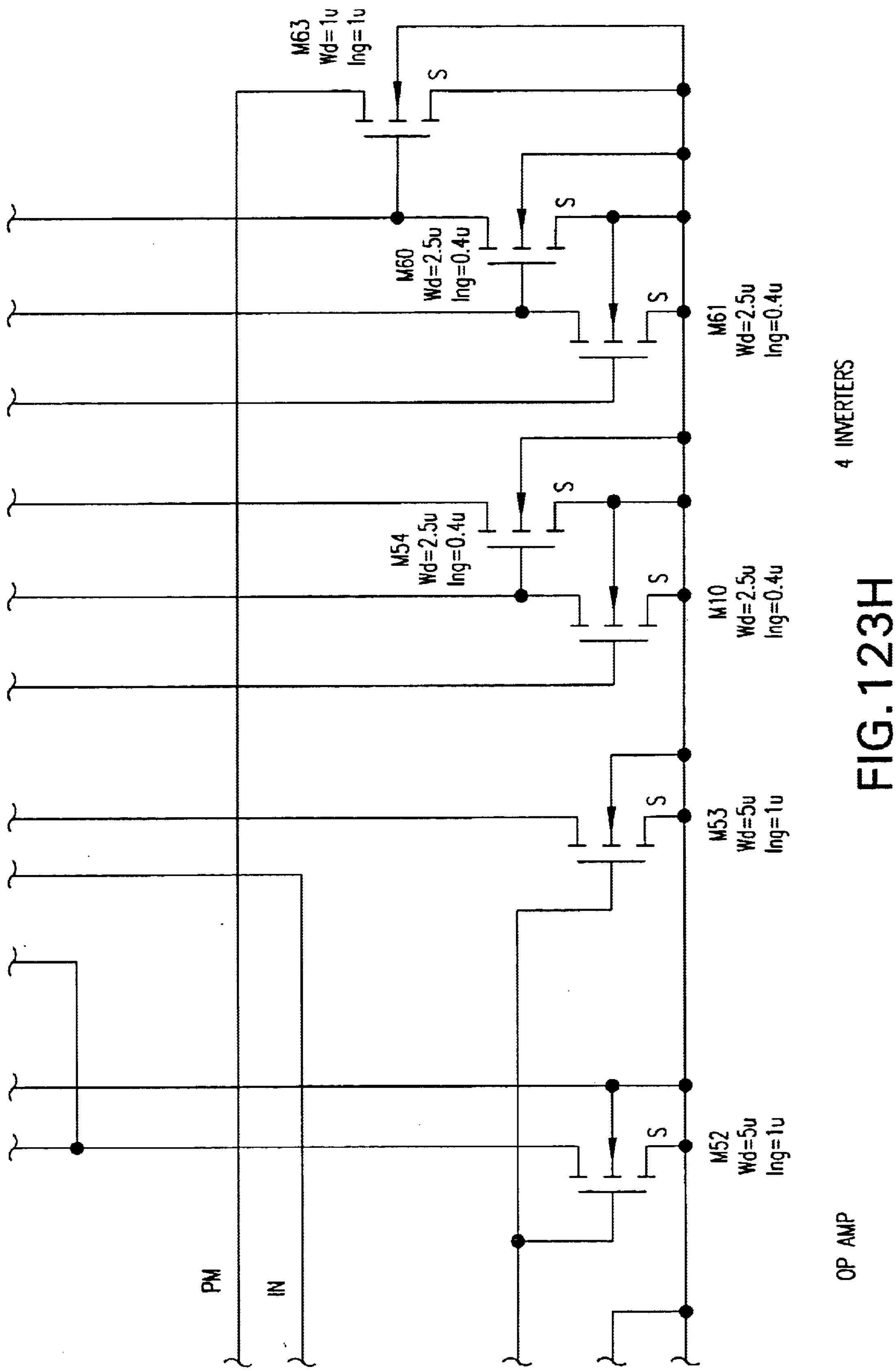
Figure 124:
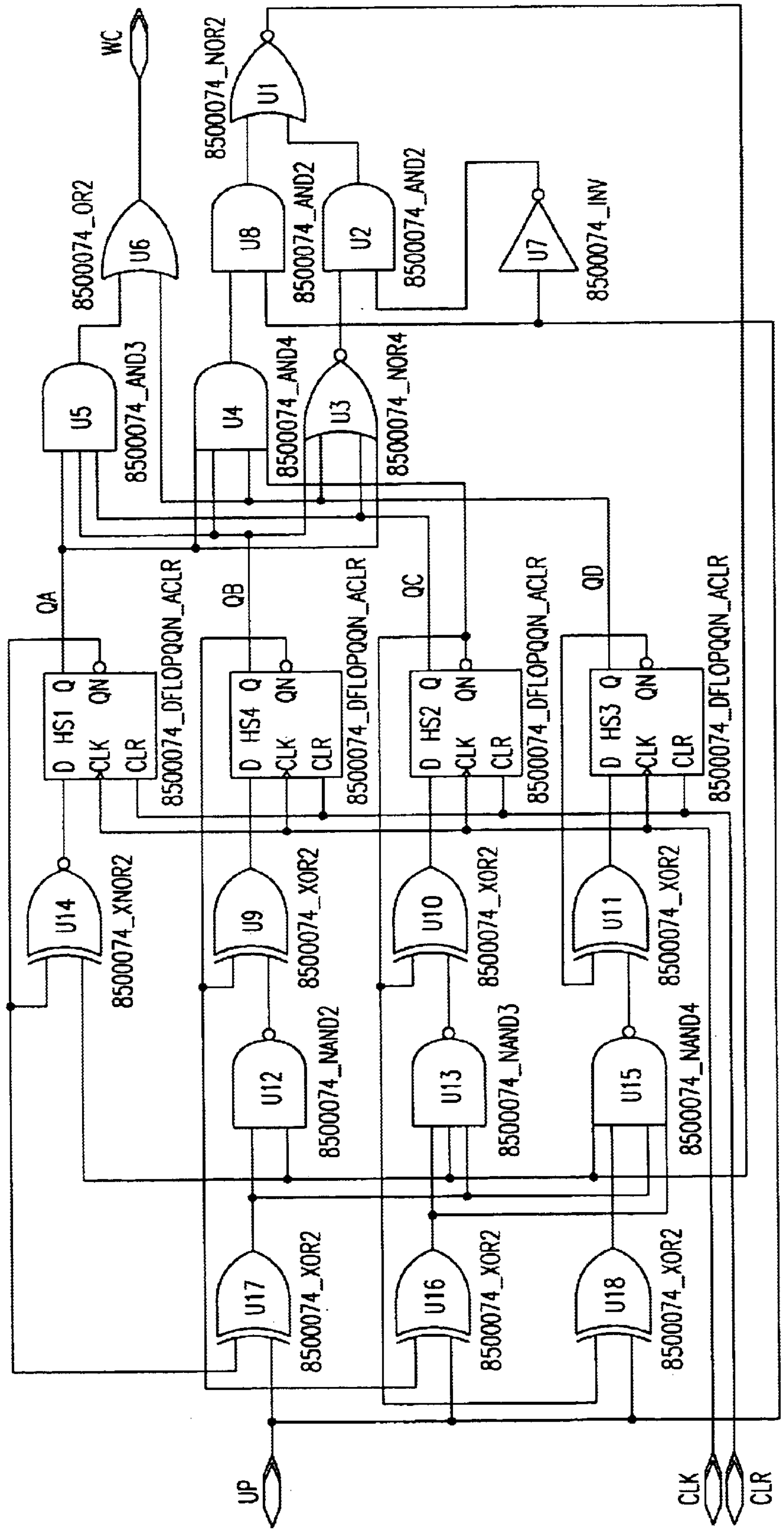
Figure 125A:
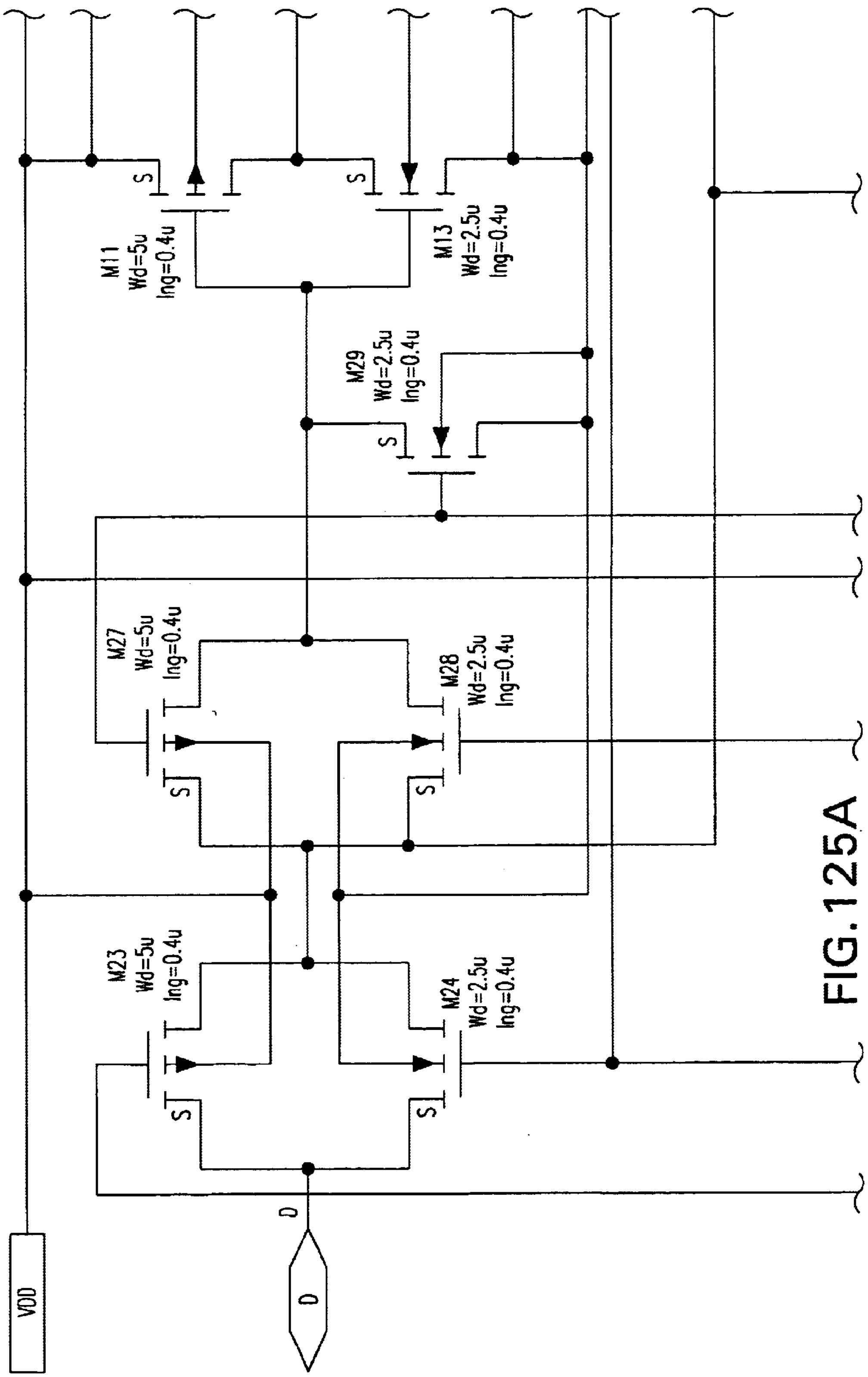
FIG. 125 includes FIGS. 125A–H and should be referred to for all references to FIGS 125 in the specification.
Figure 125B:
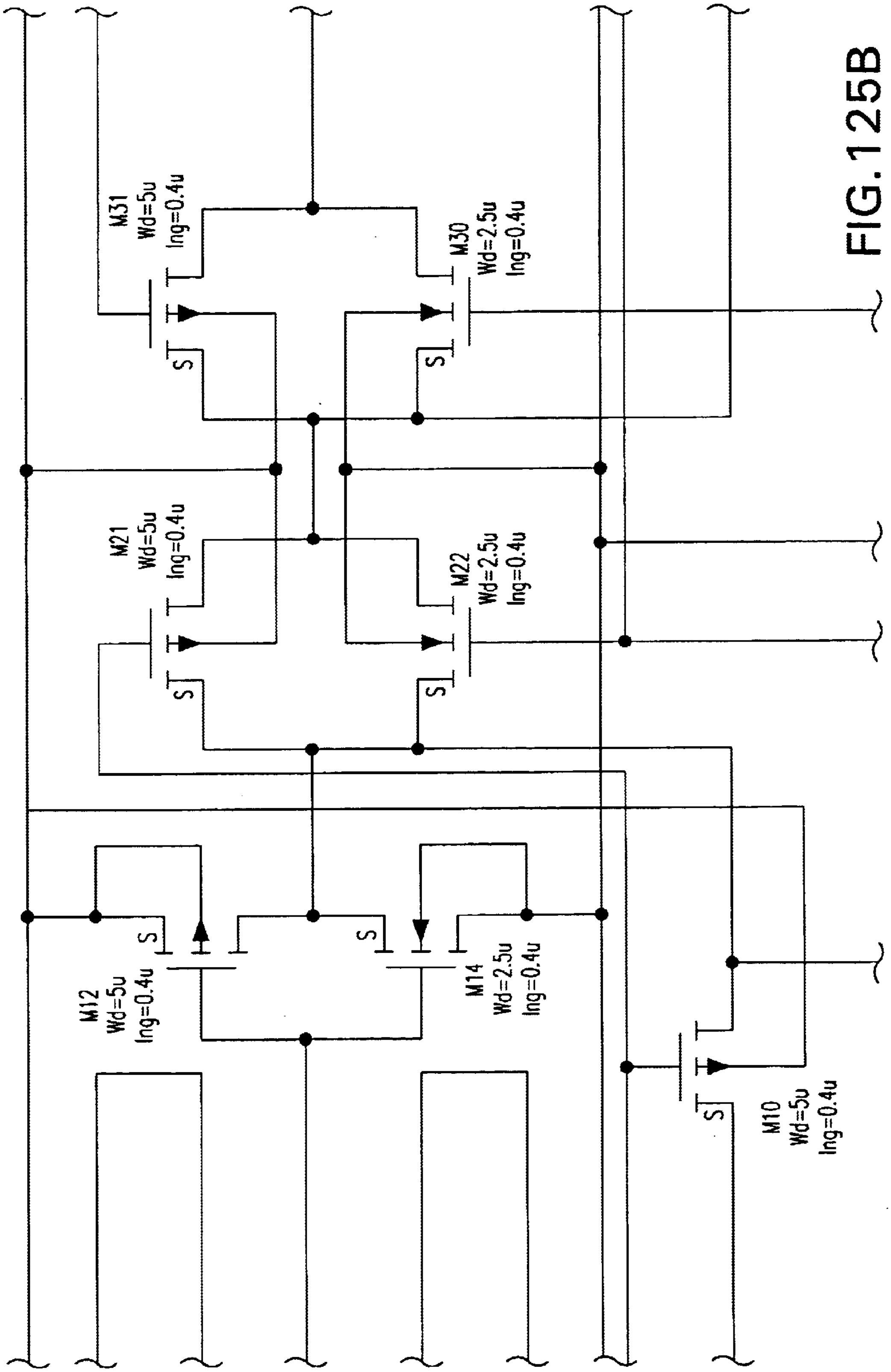
Figure 125C:
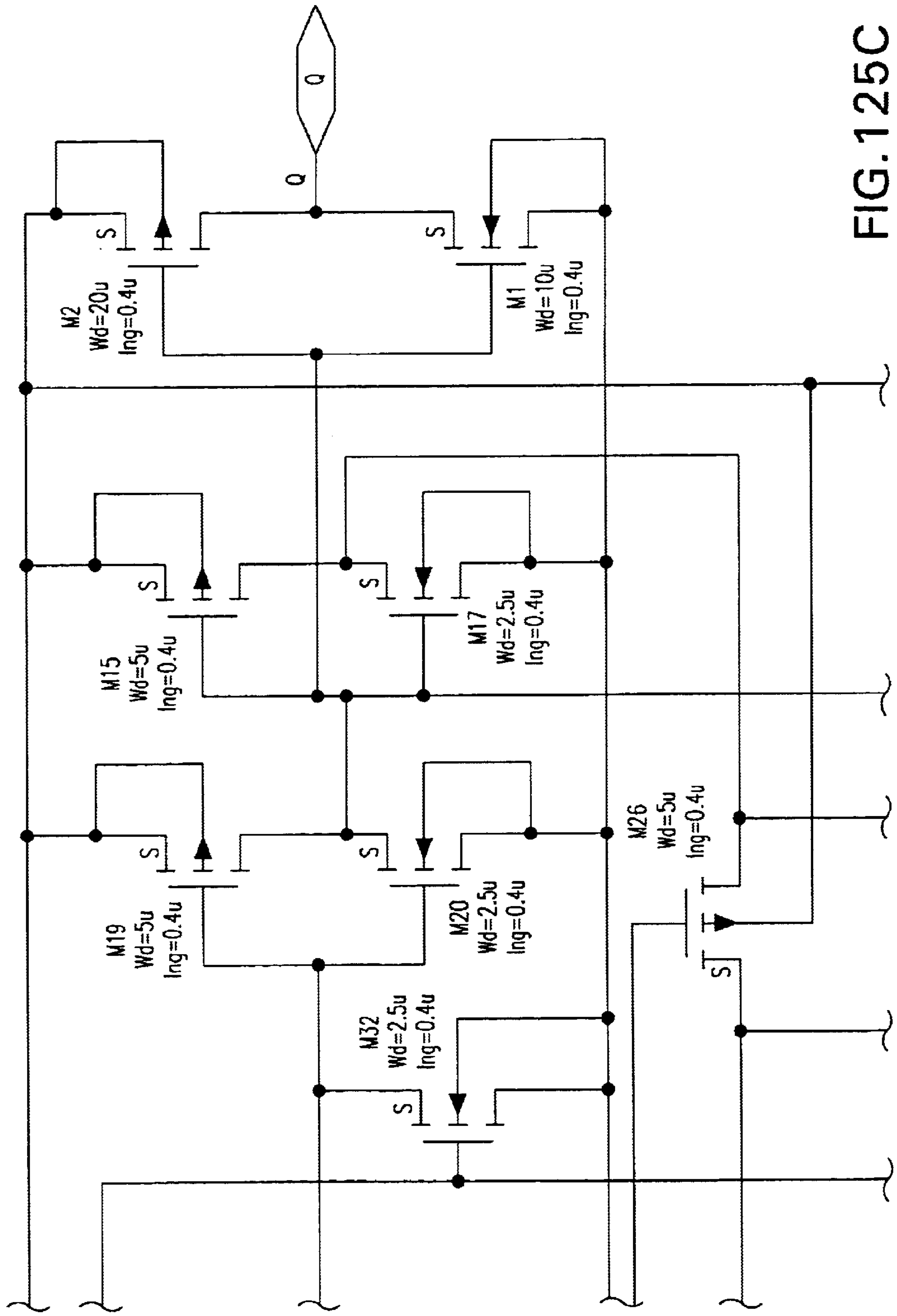
Figure 125D:
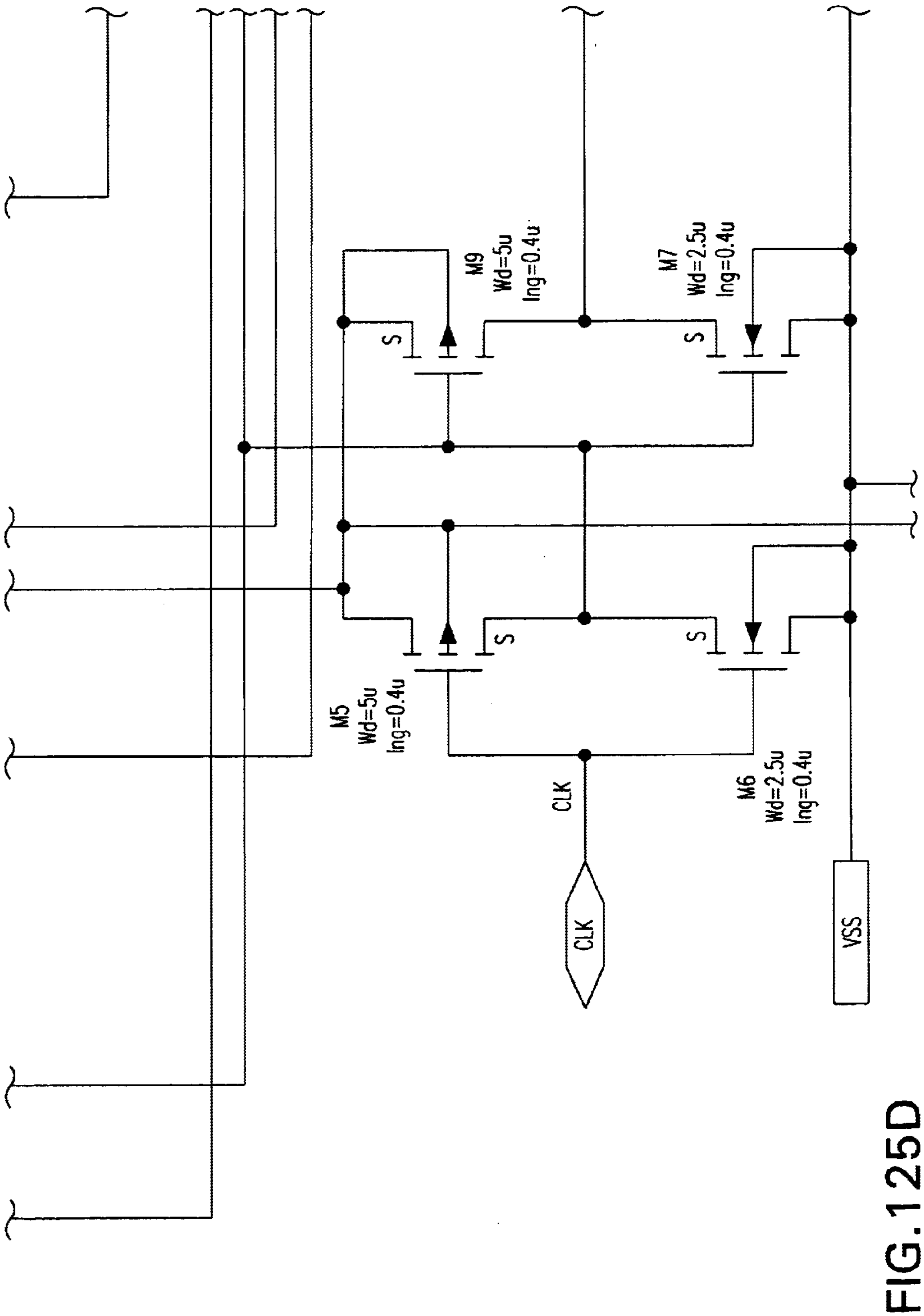
Figure 125E:
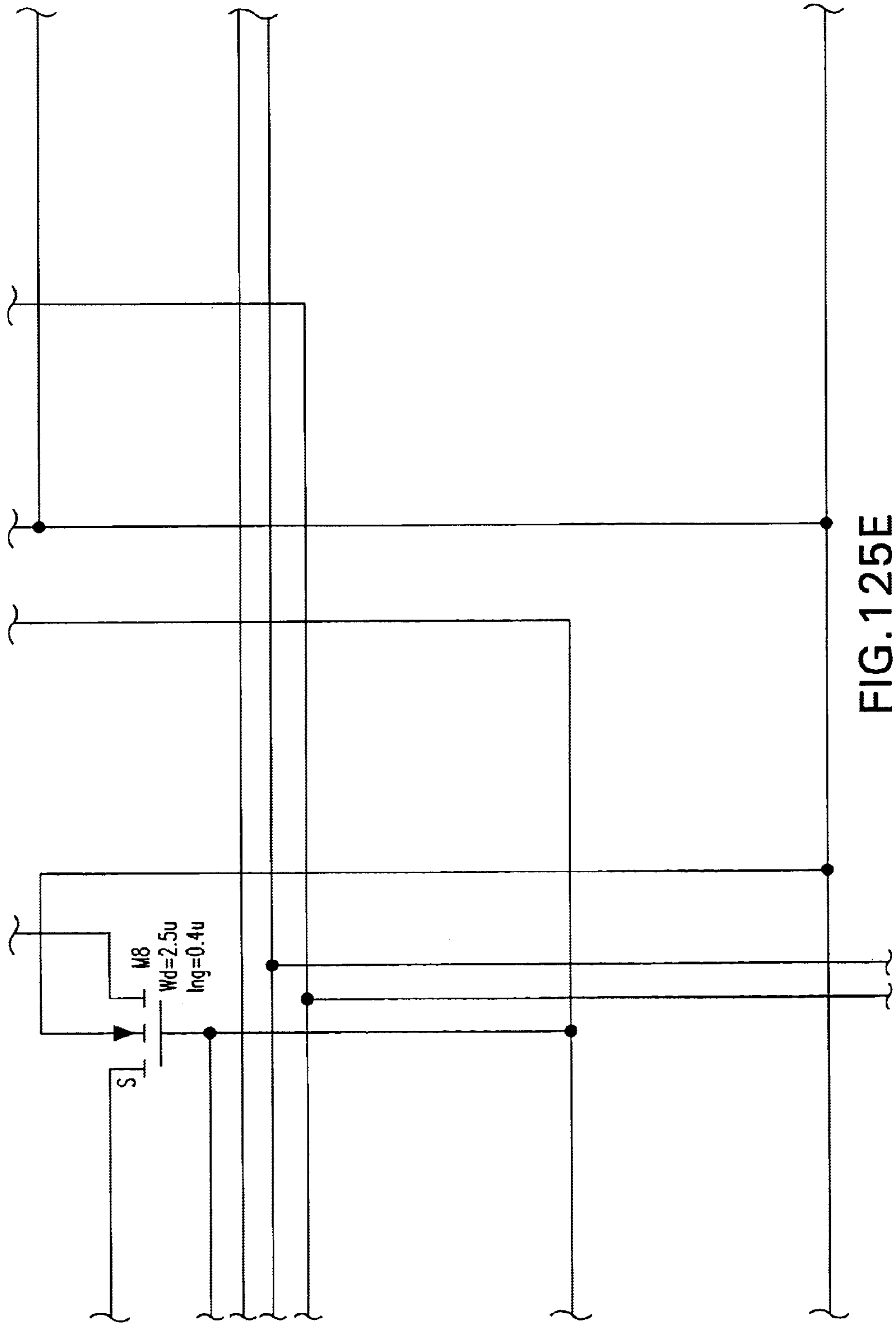
Figure 125F:
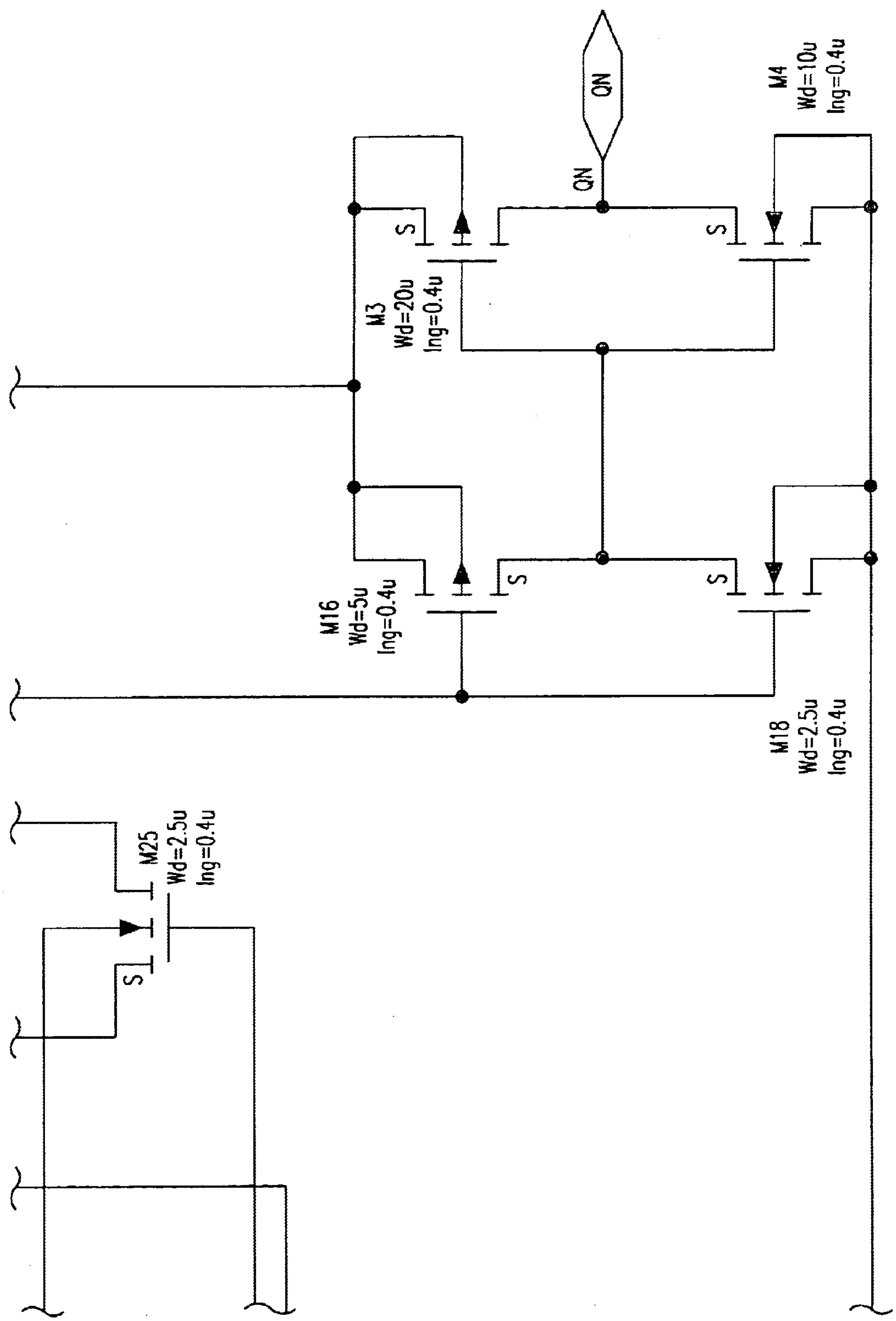
Figure 125G:
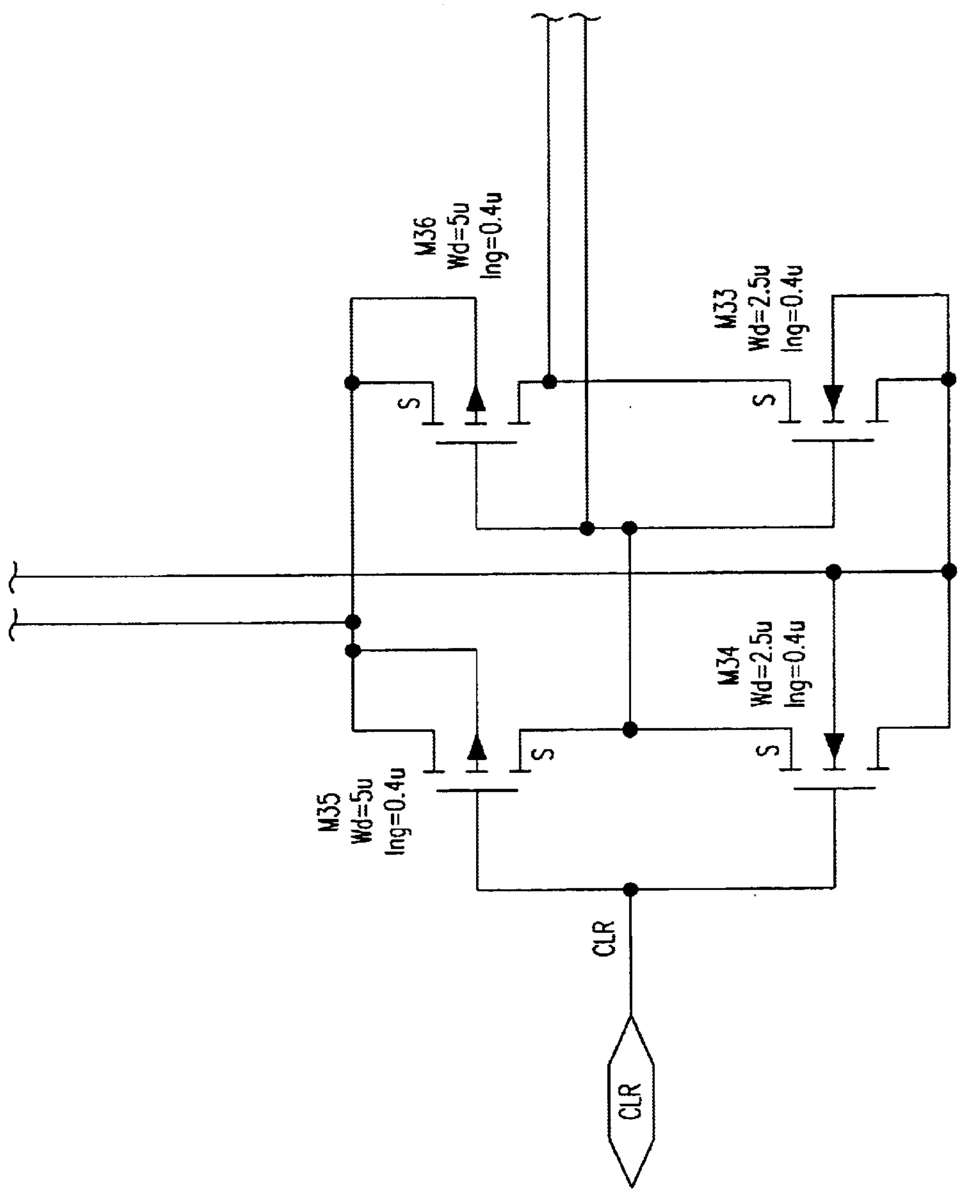
Figure 125H:
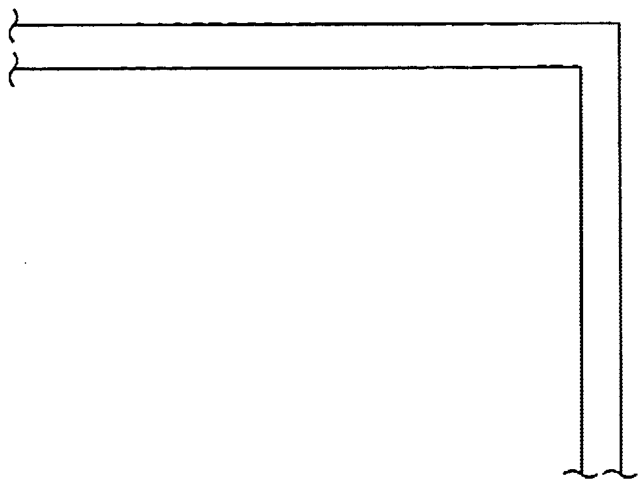
Figure 126A:
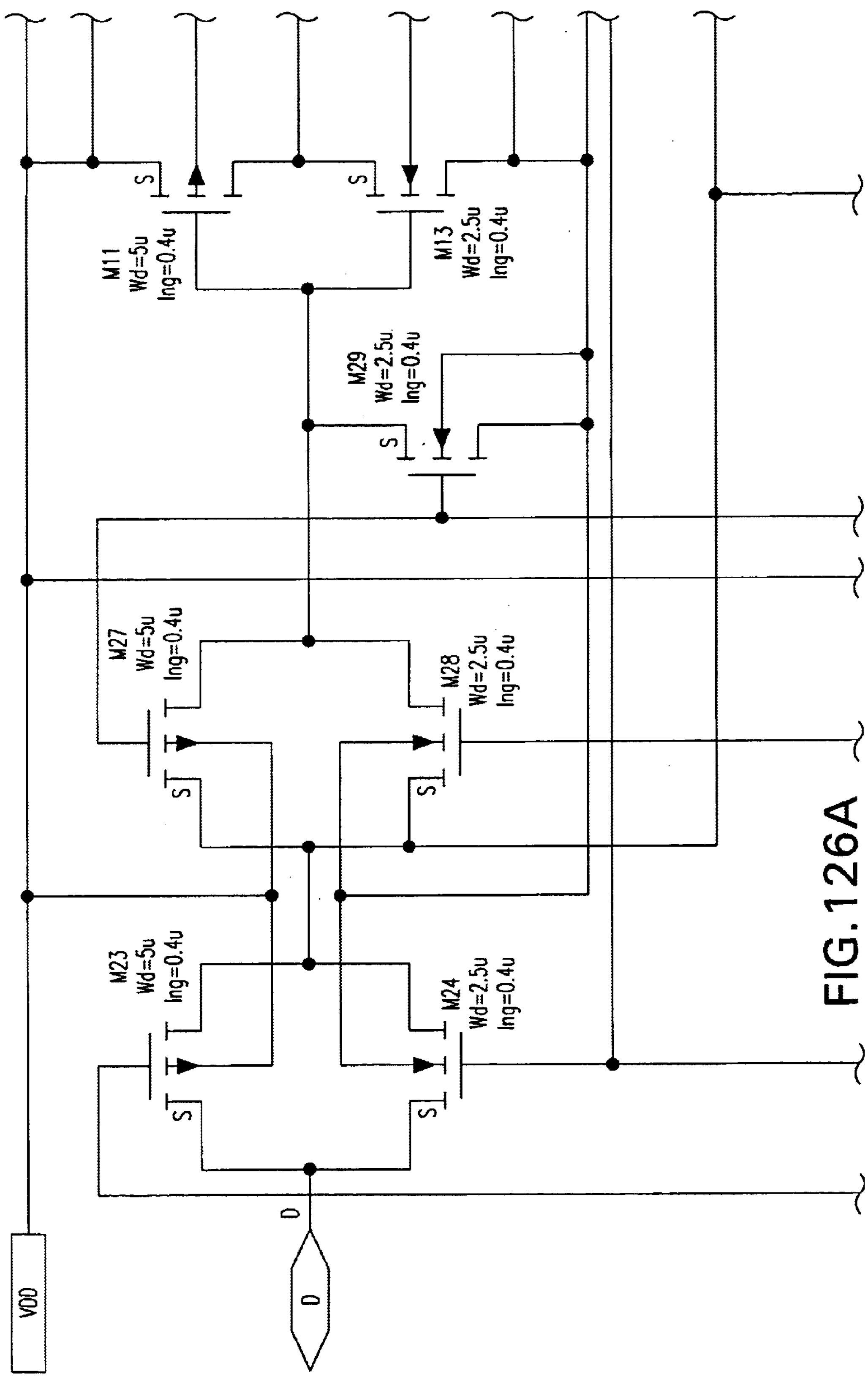
FIG. 126 includes FIGS. 126A–H and should be referred to for all references to FIG. 126 in the specification.
Figure 126B:
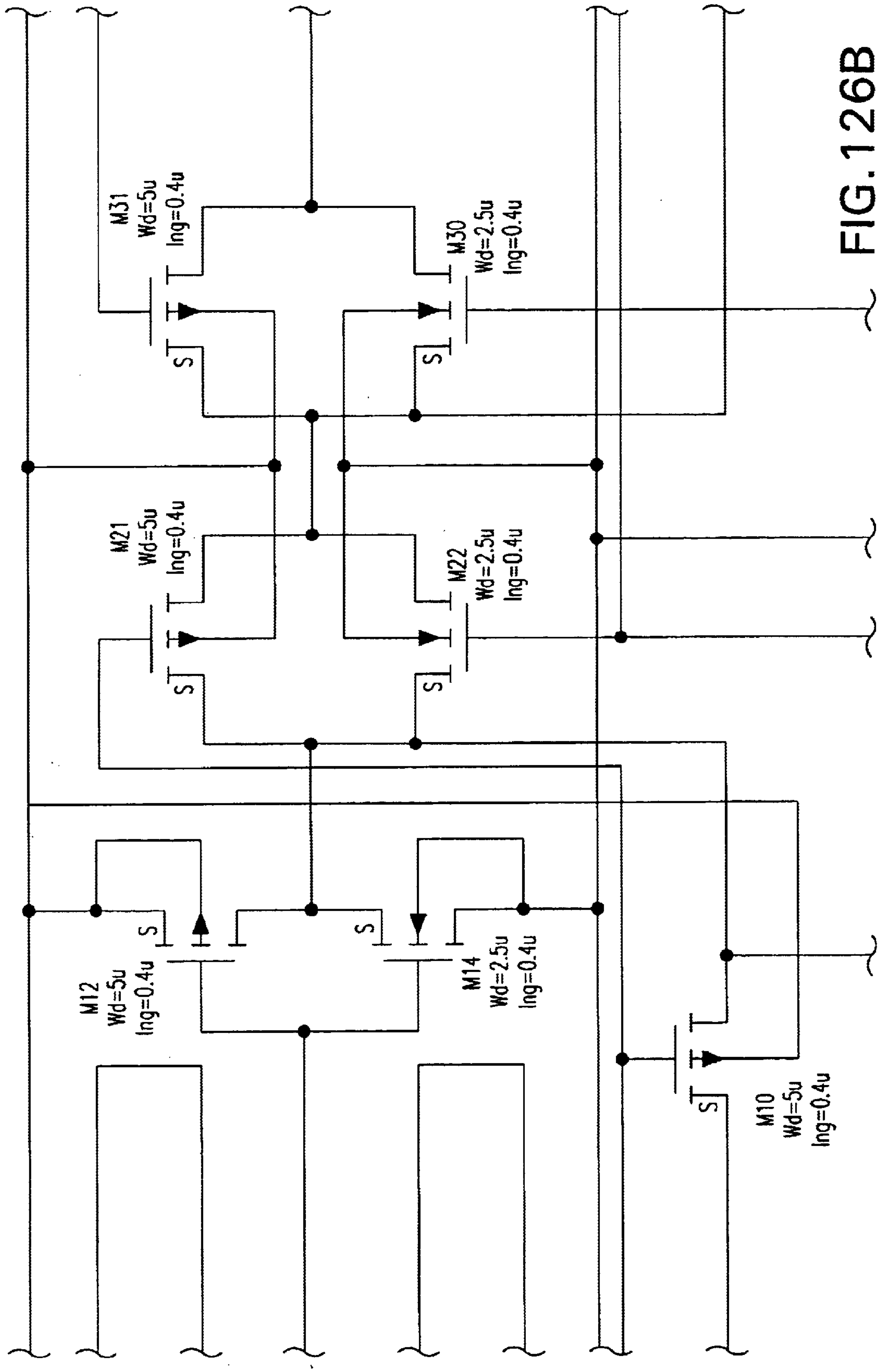
Figure 126C:
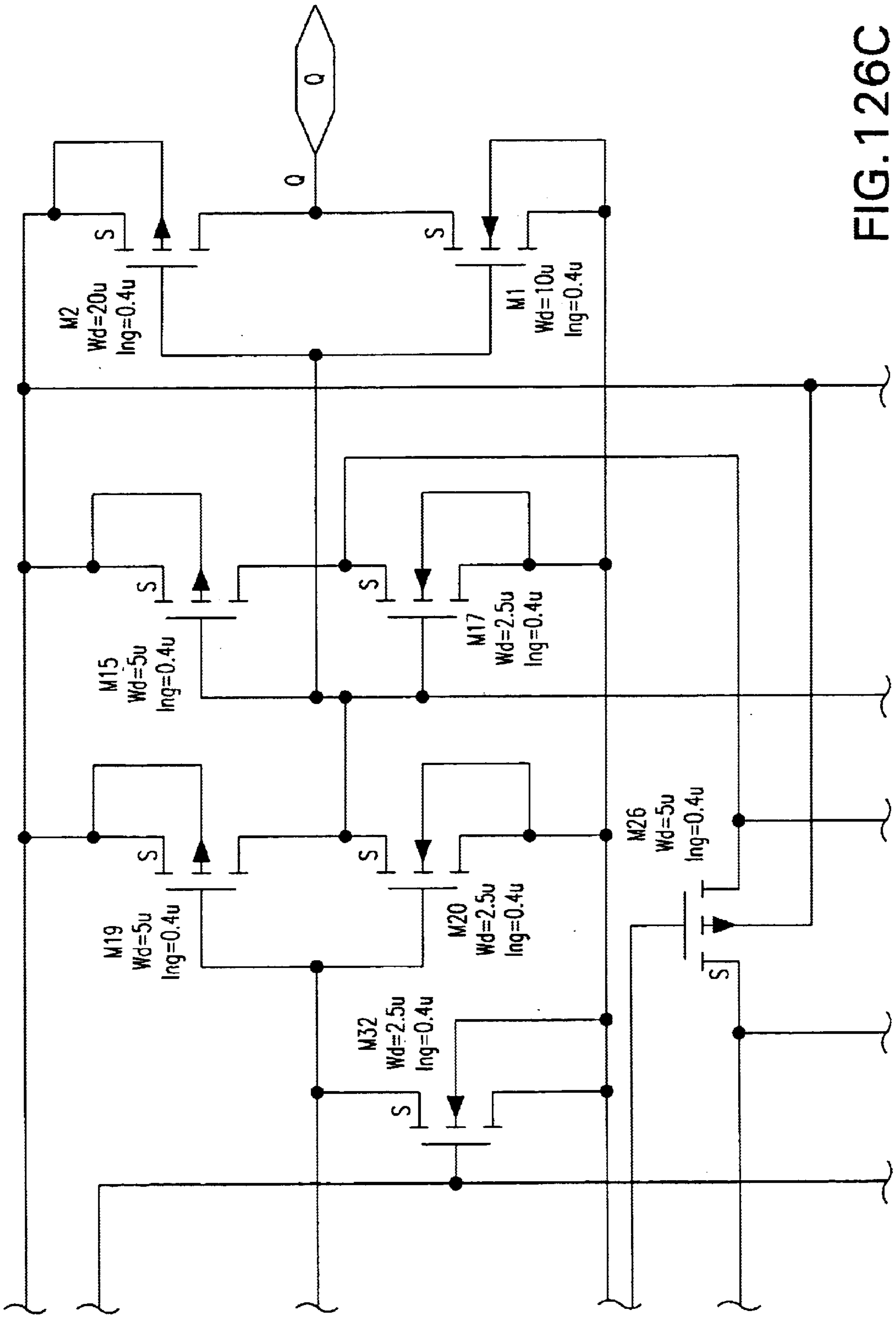
Figure 126D:
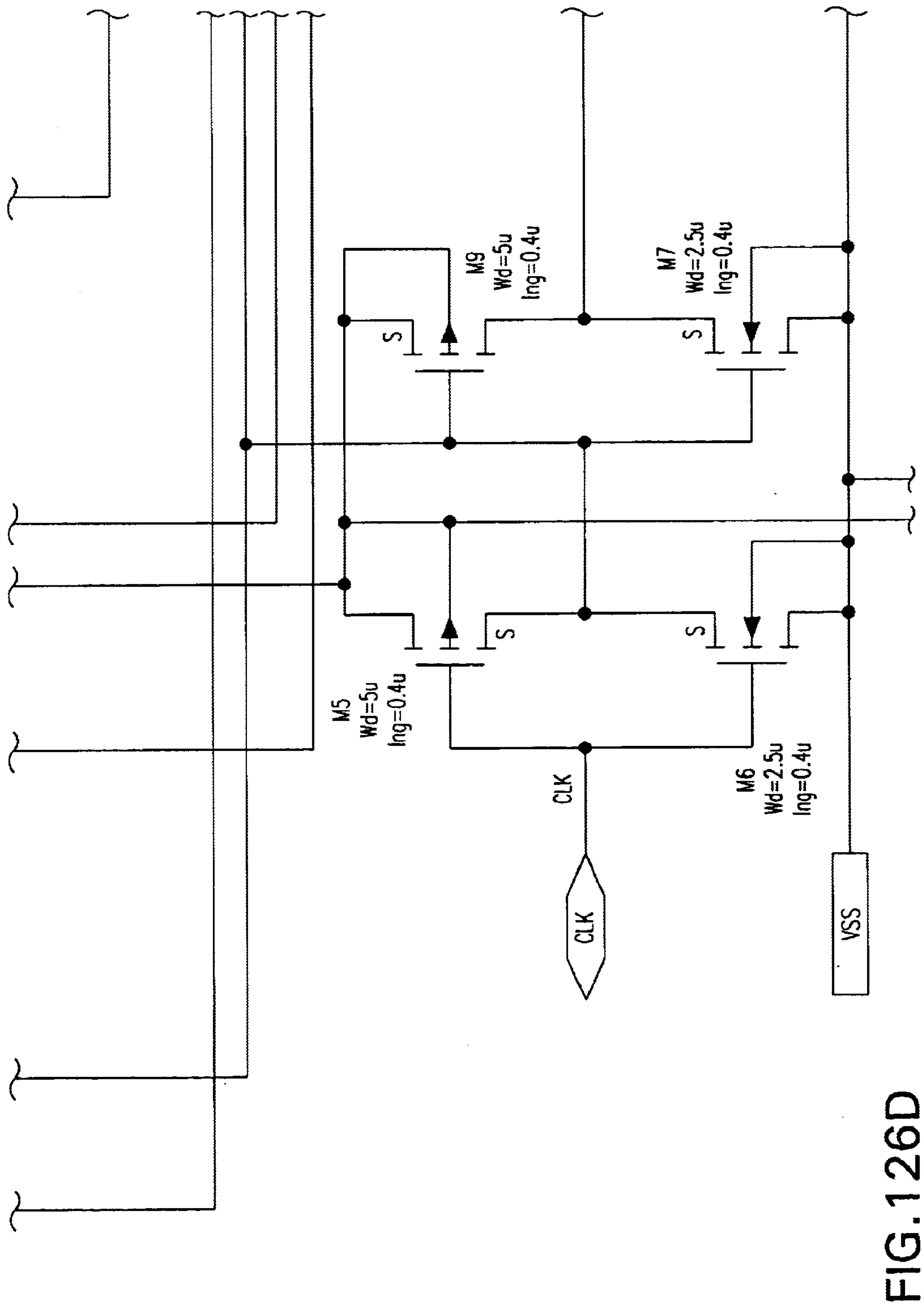
Figure 126E:
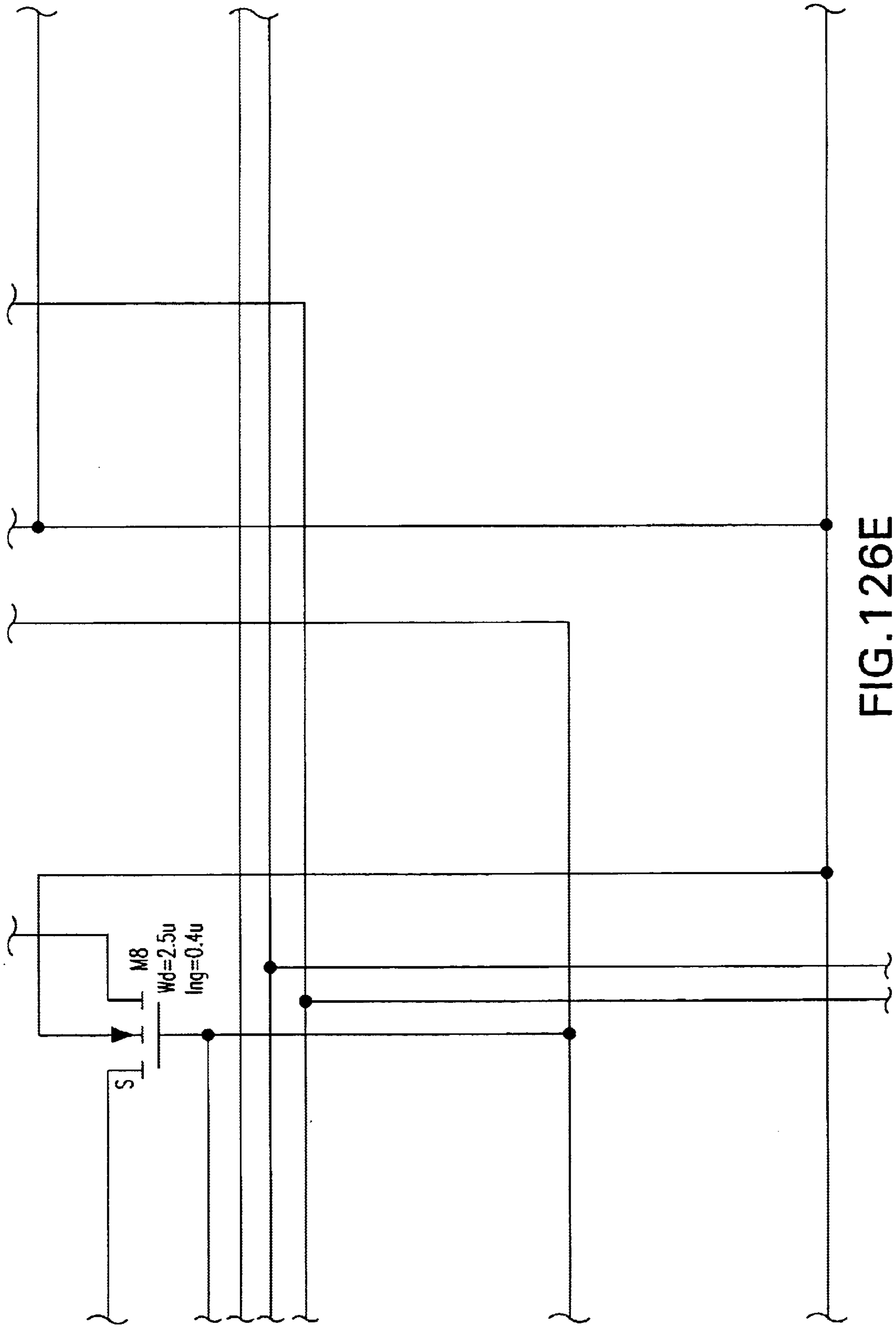
Figure 126F:
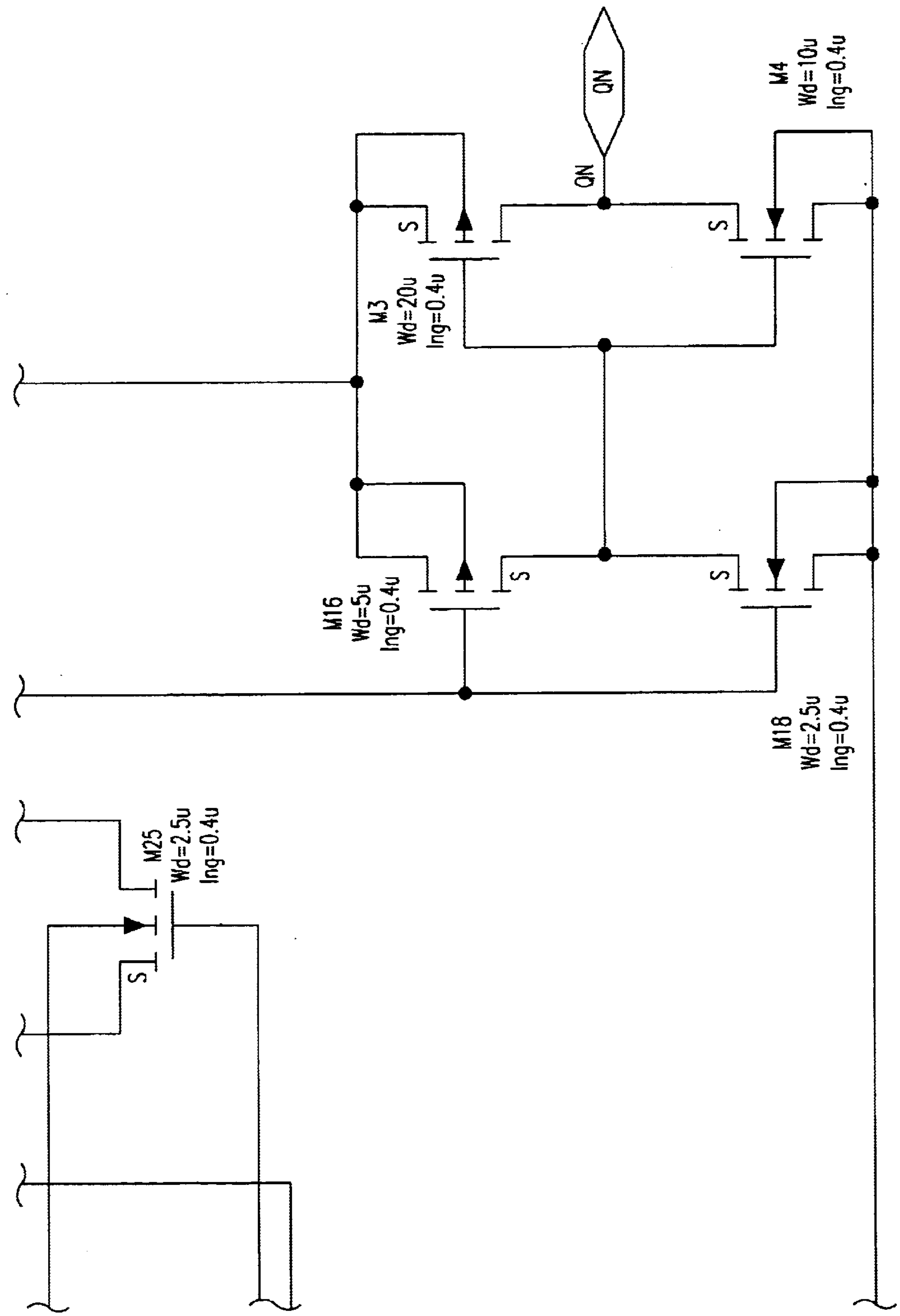
Figure 126G:
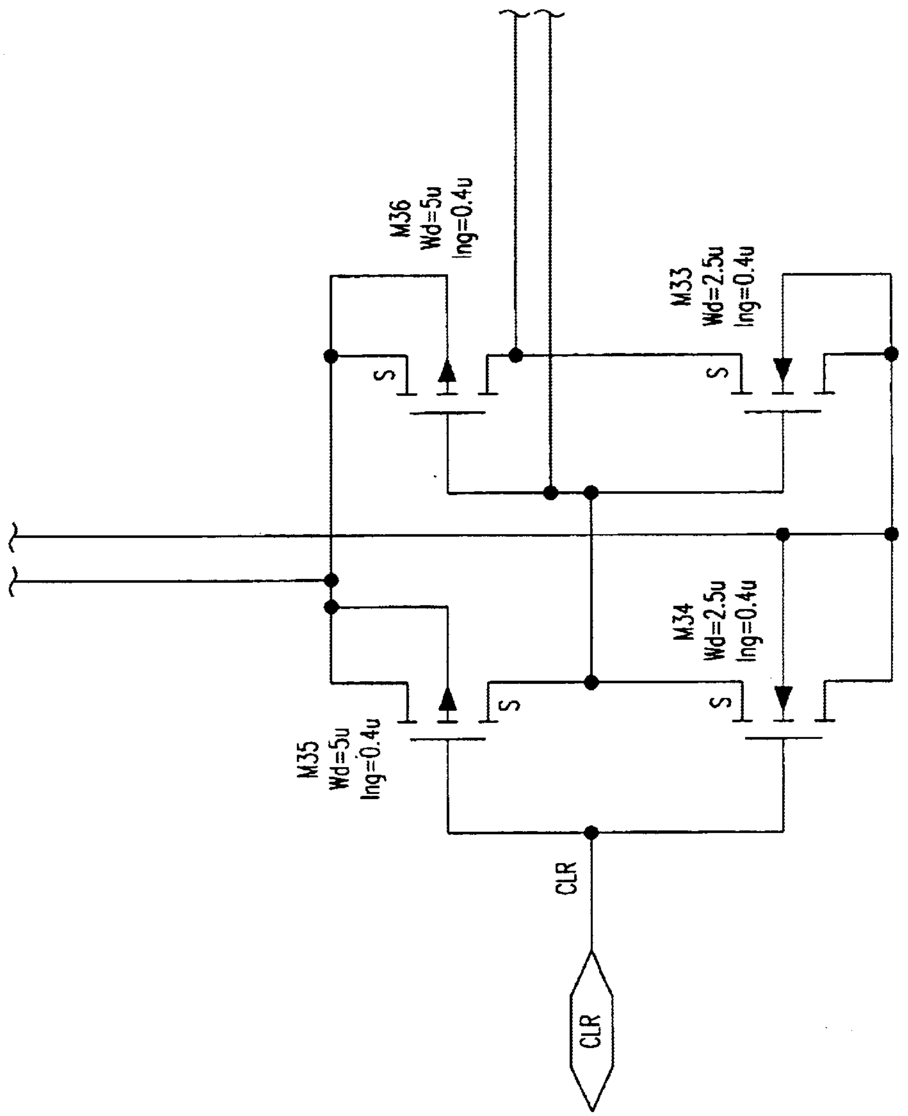
Figure 126H:
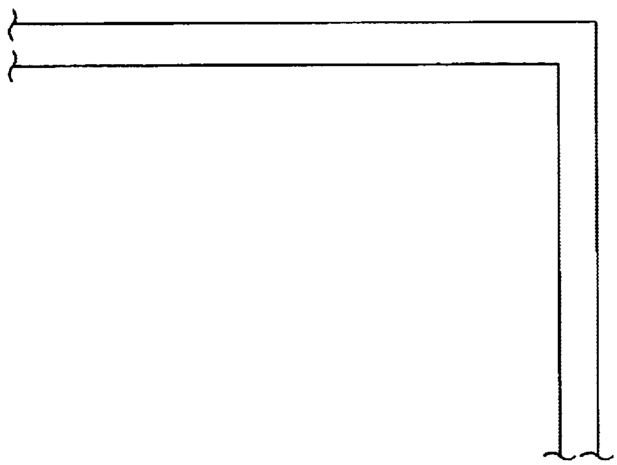
Figure 127A:
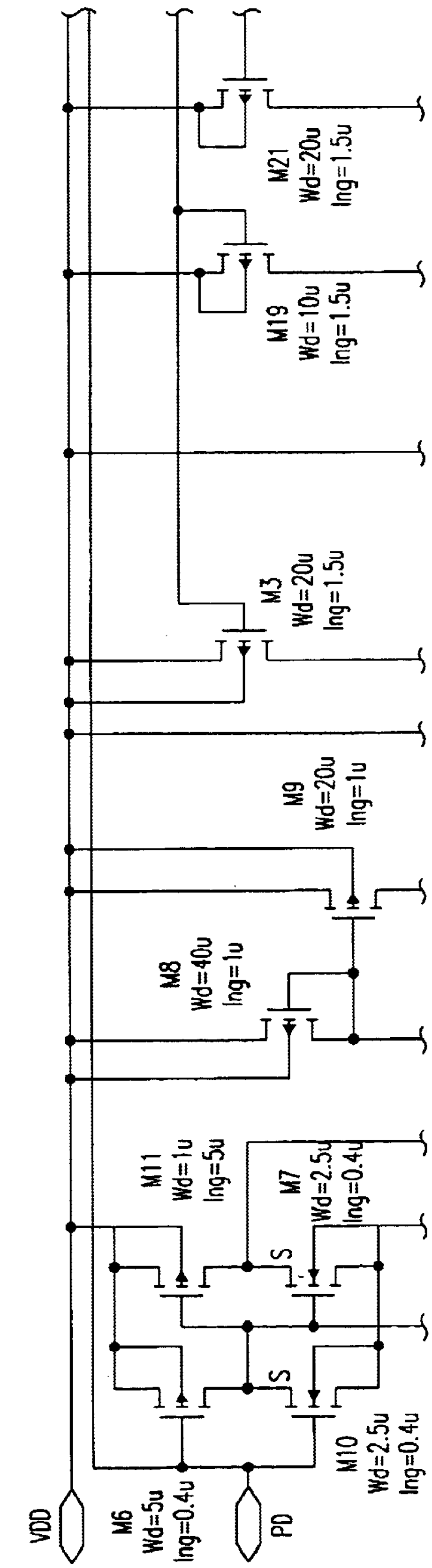
FIG. 127 includes FIGS 127A–D and should be referred to for all references to FIG. 127 in the specification.
Figure 127B:
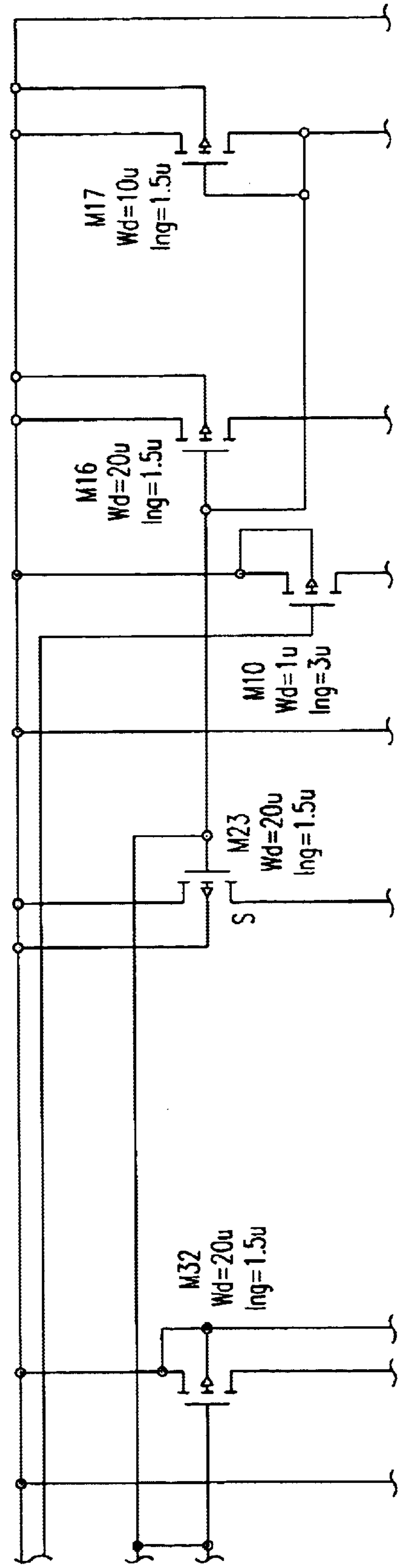
Figure 127C:
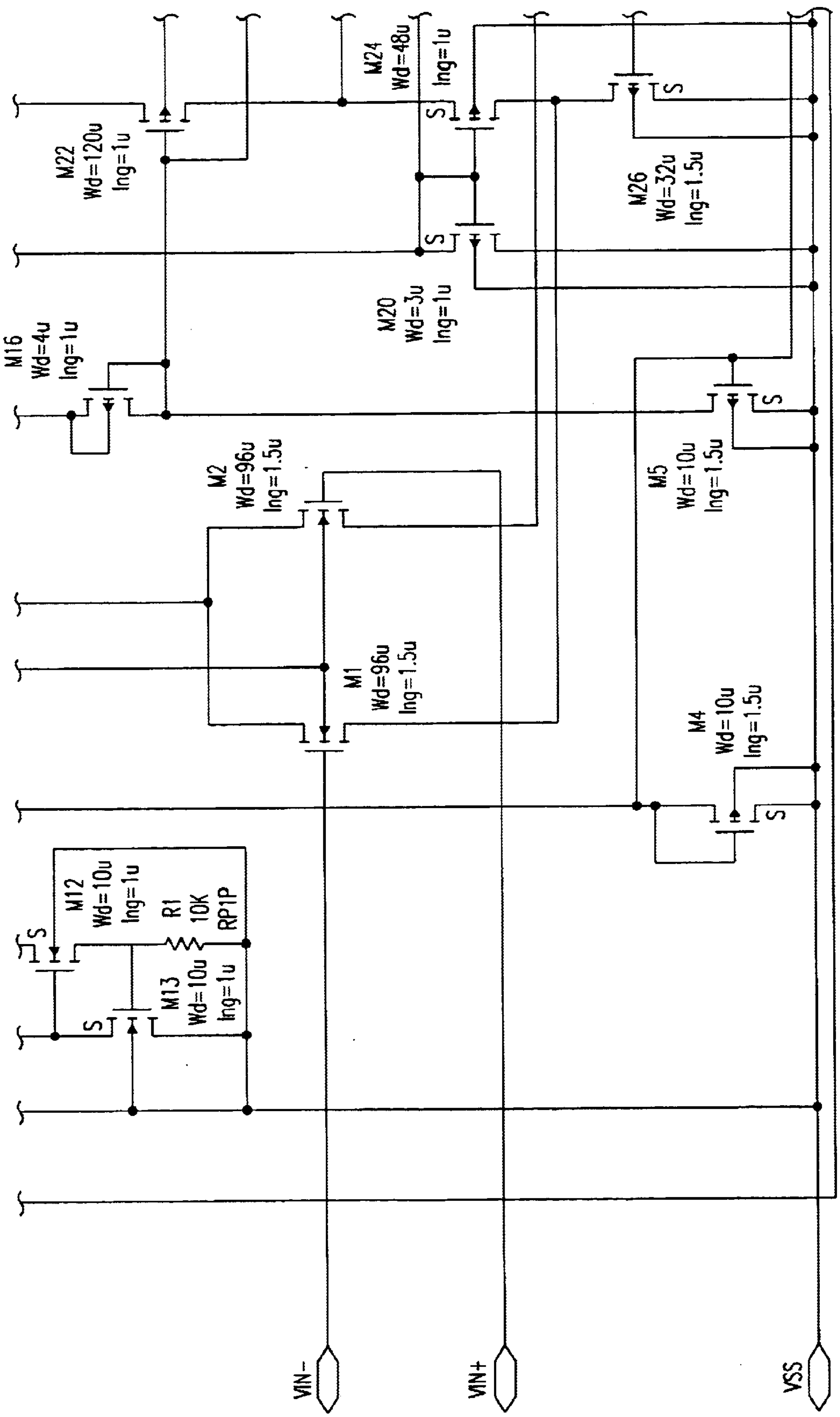
Figure 127D:
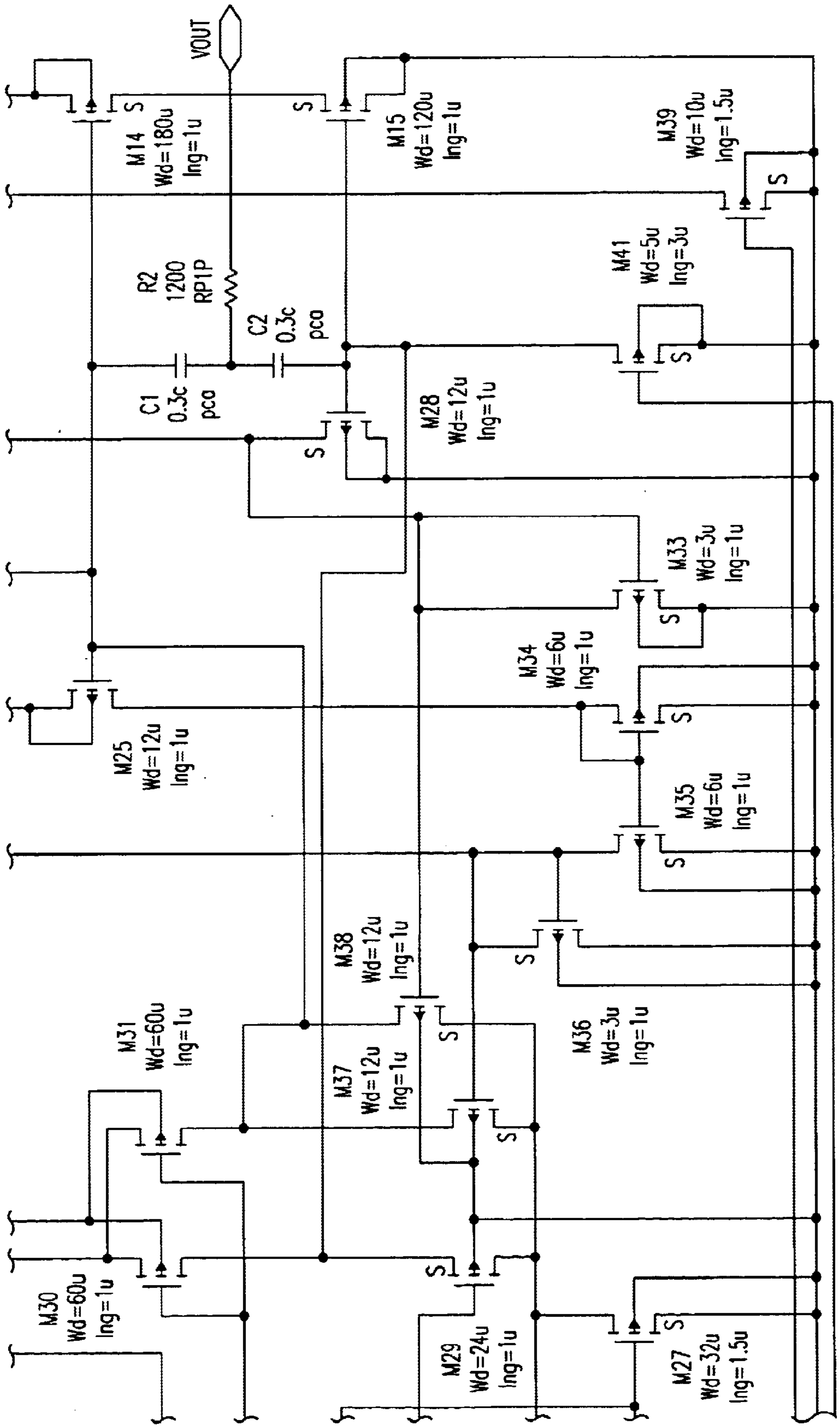
Figure 128:
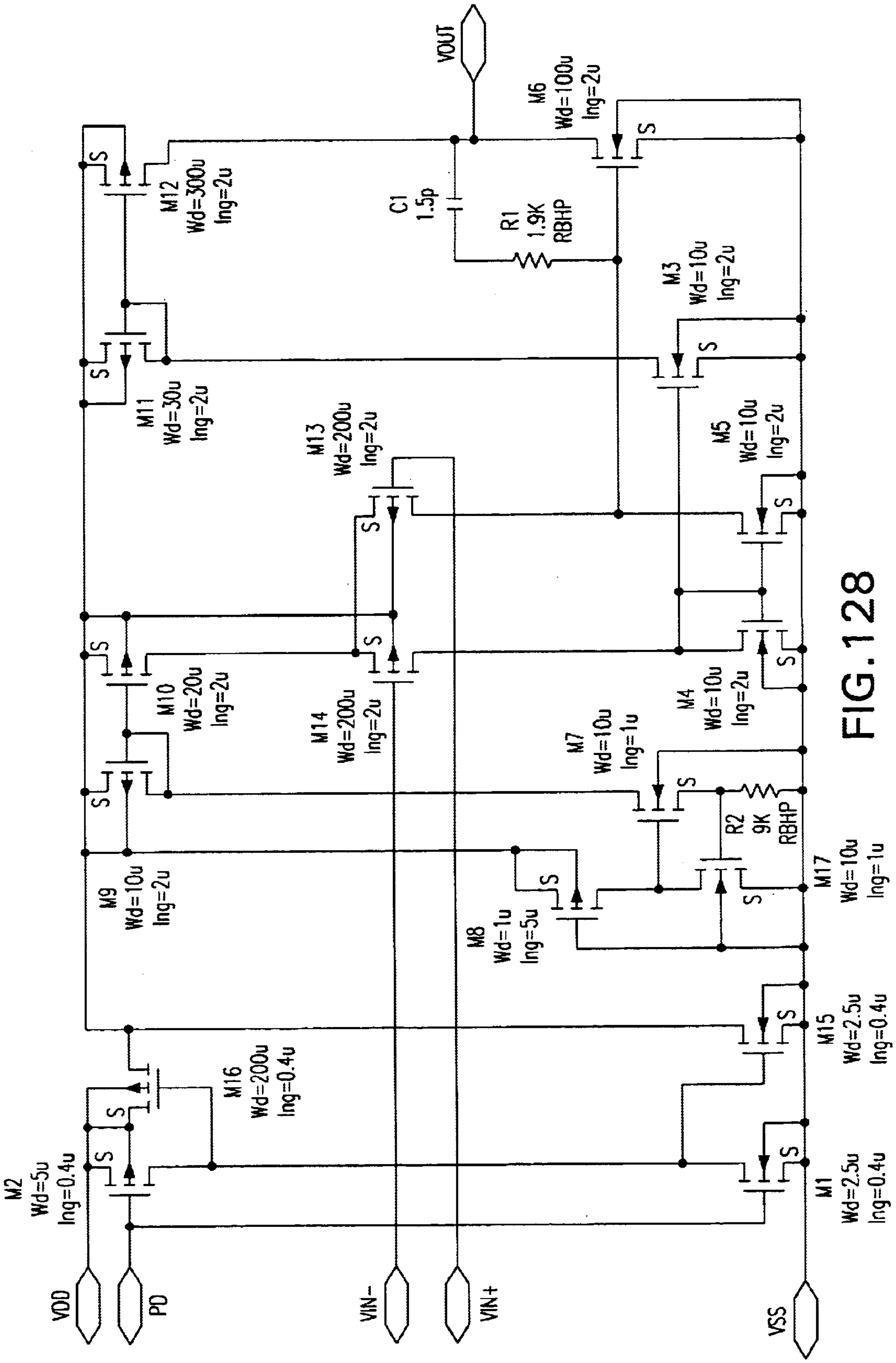
Figure 129:
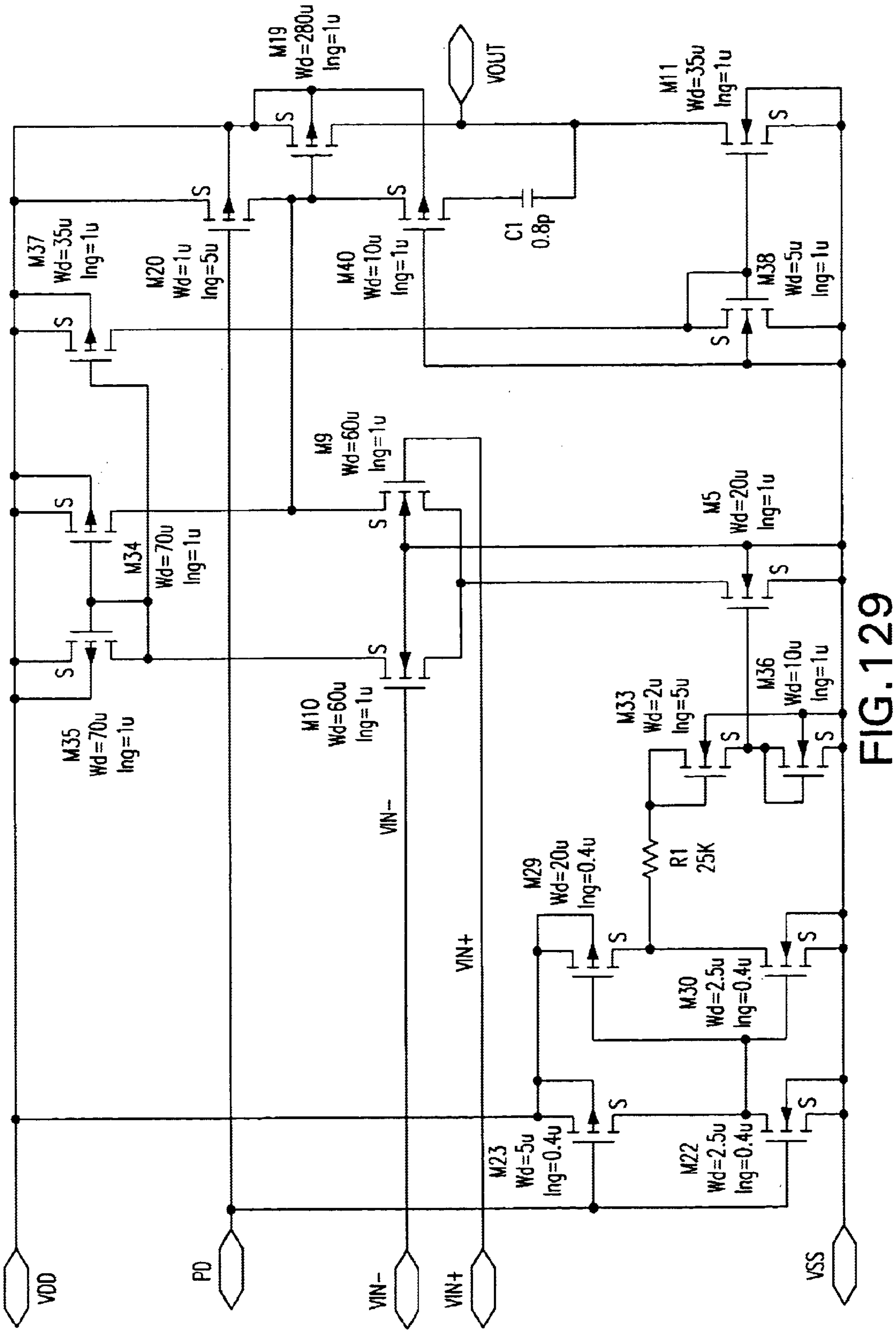
Figure 130:
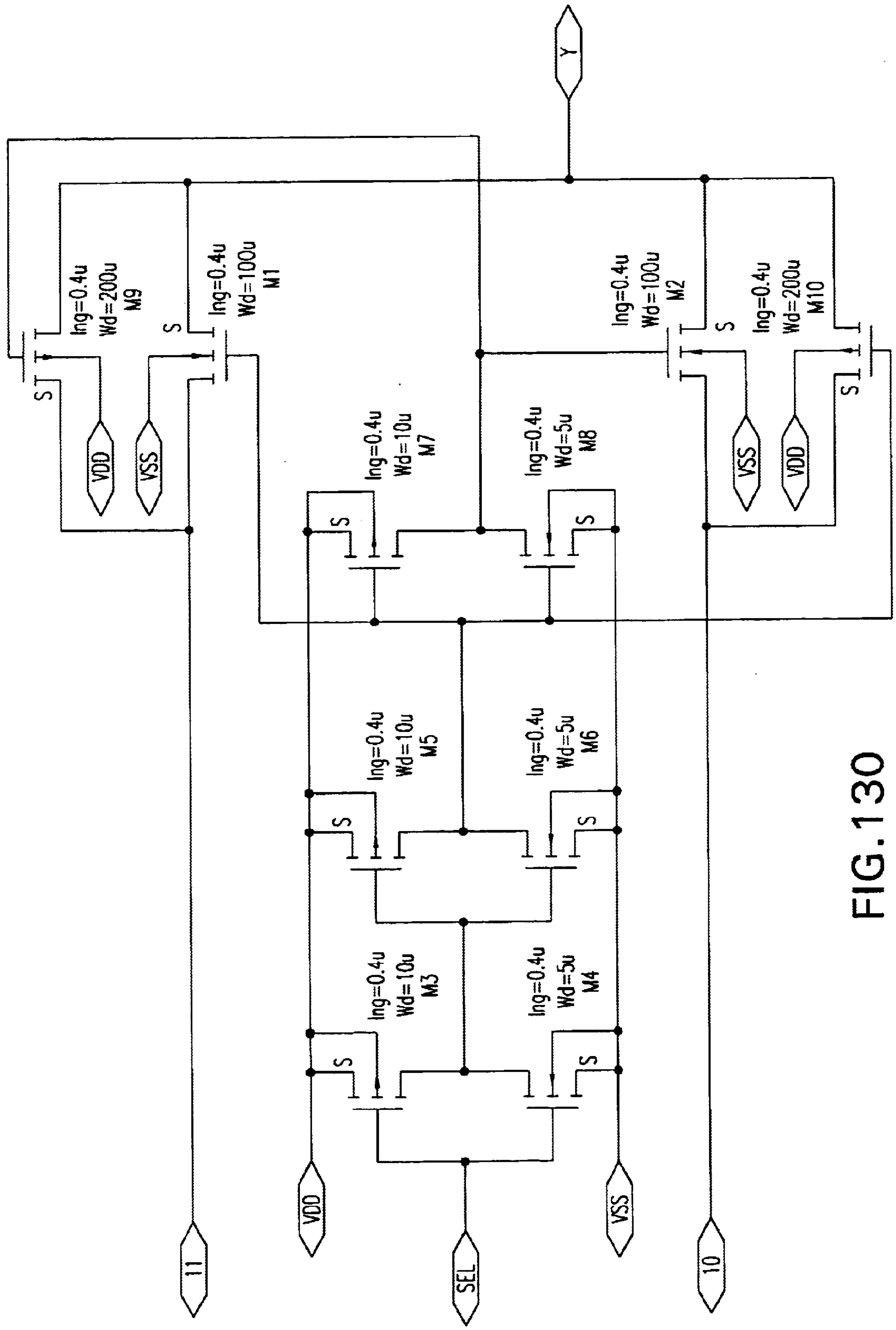
Figure 131:
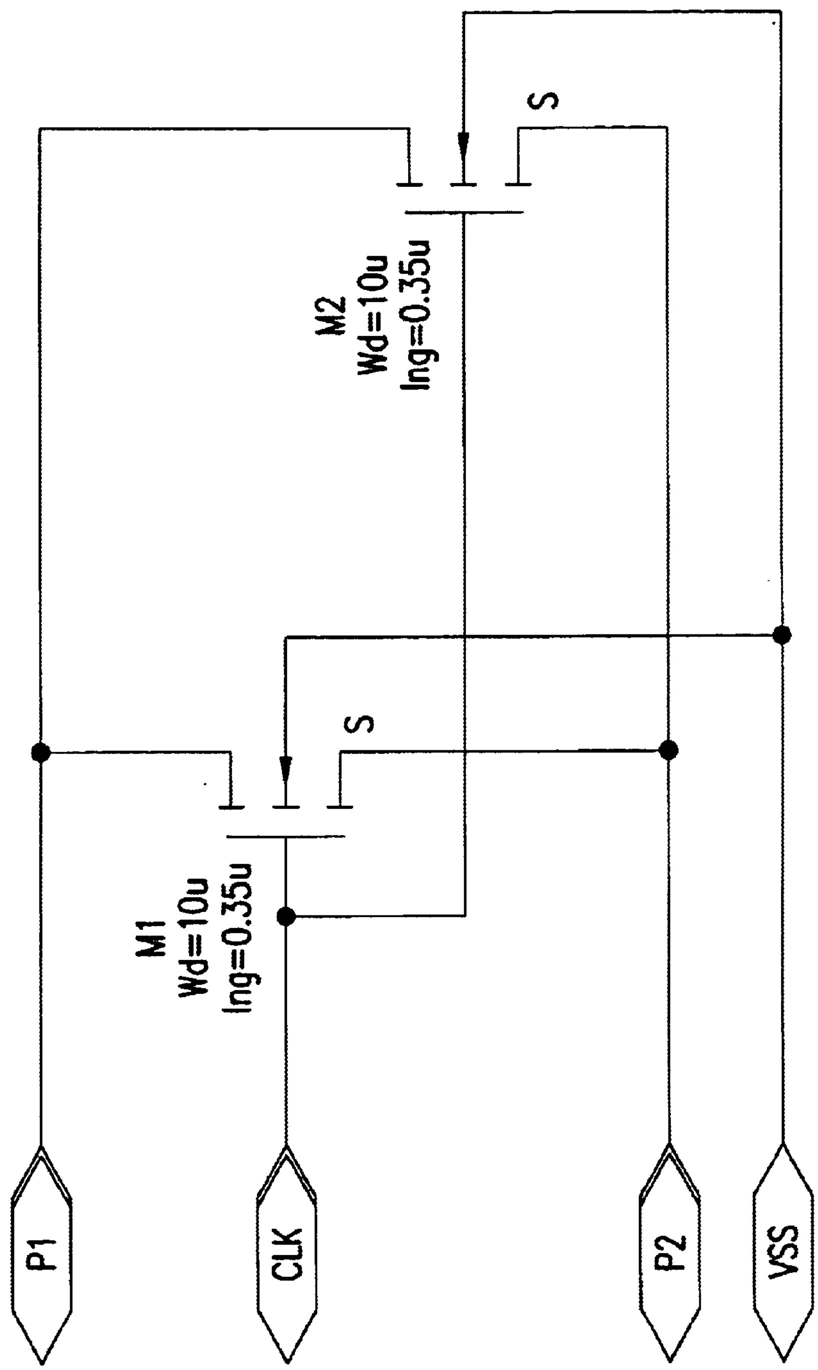
Figure 132:
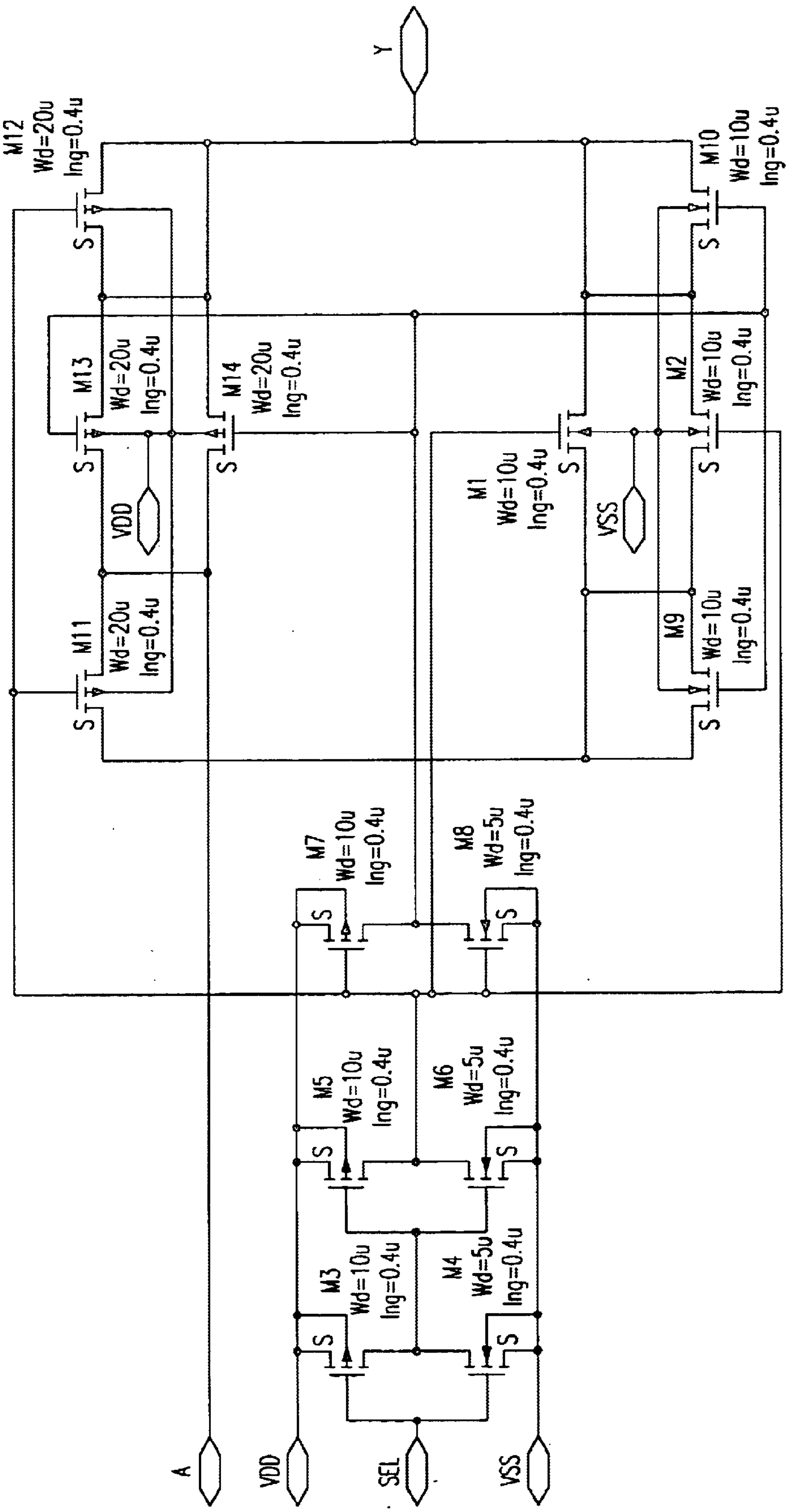
Figure 133:
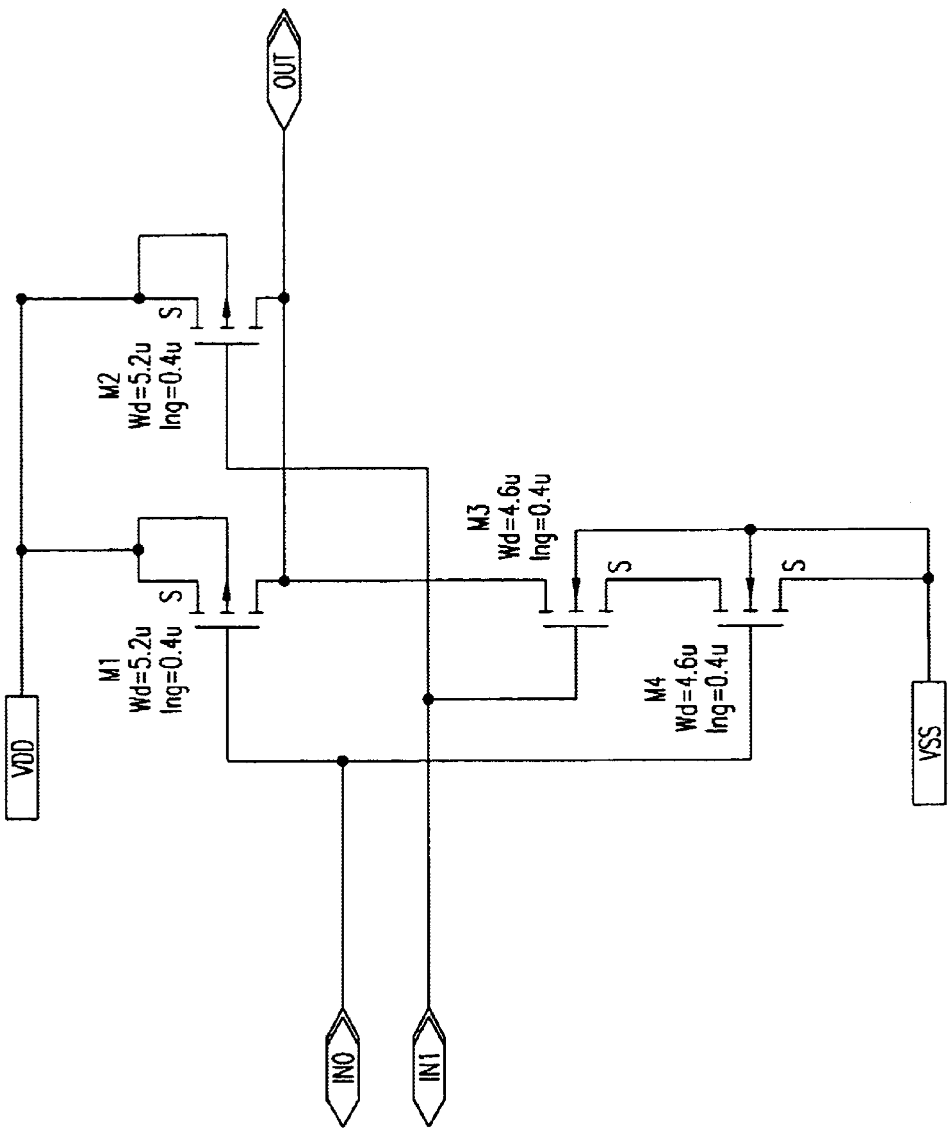
Figure 134:
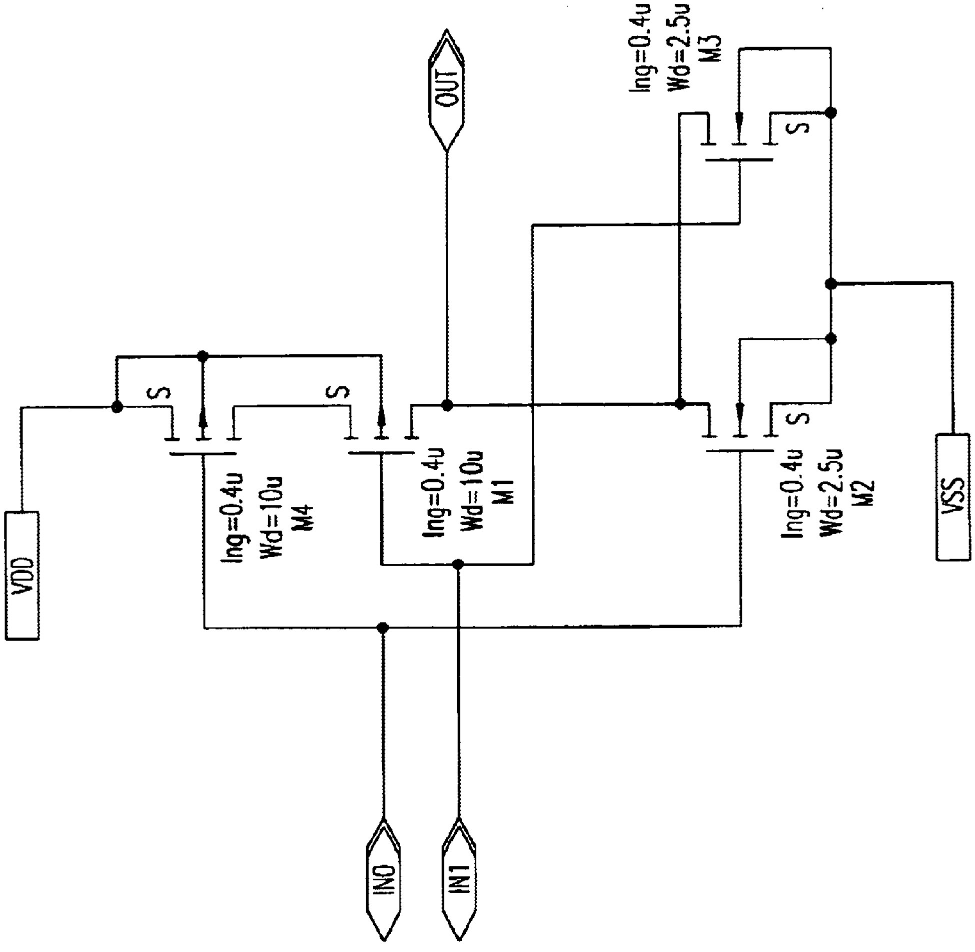
Figure 135:
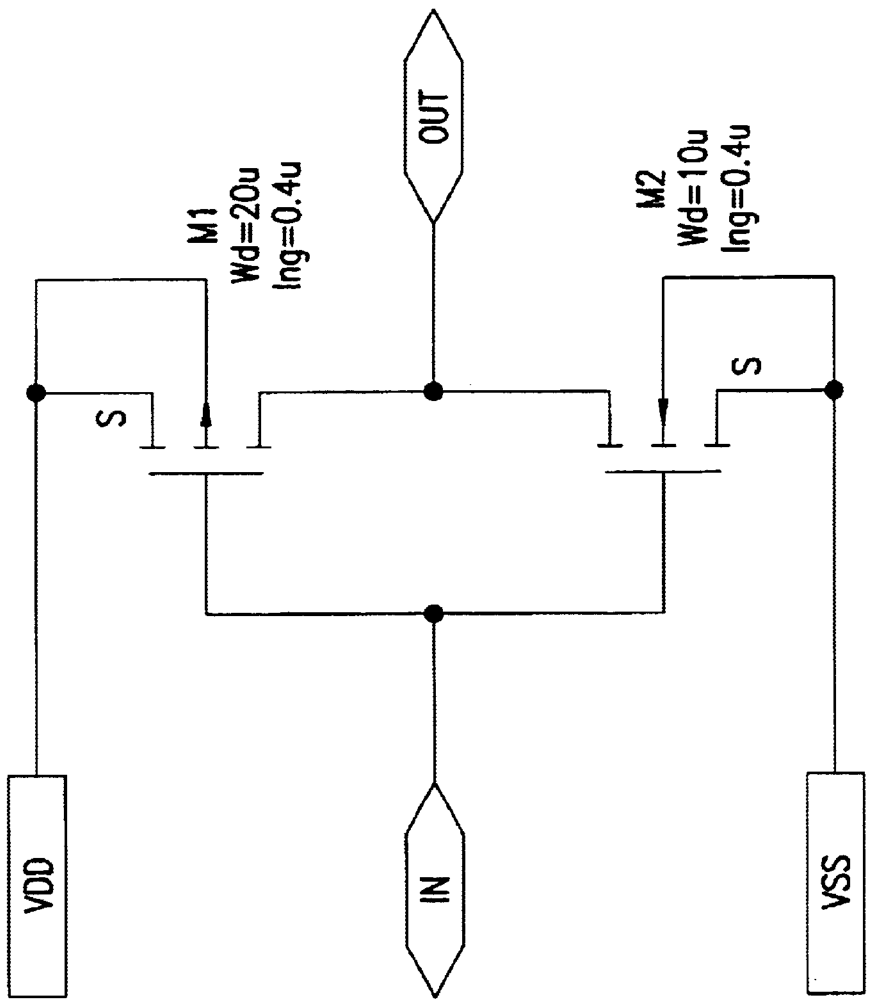
Figure 136:
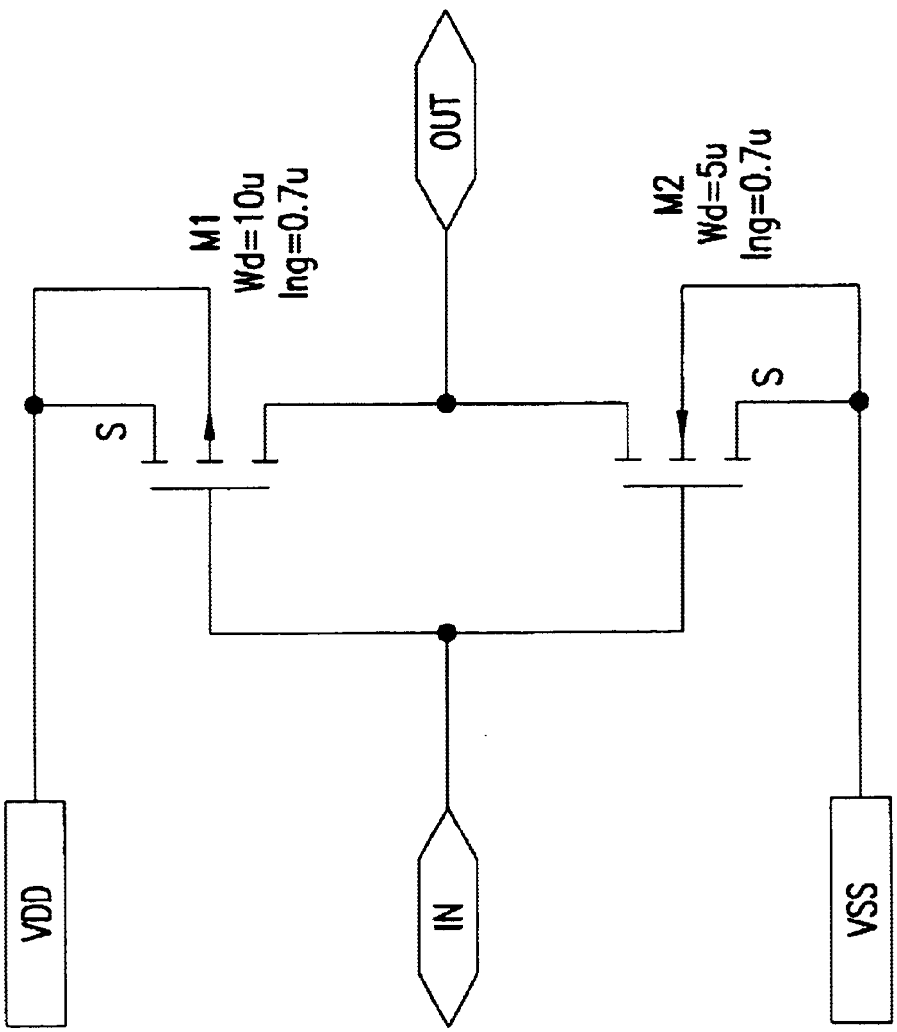
Figure 137:
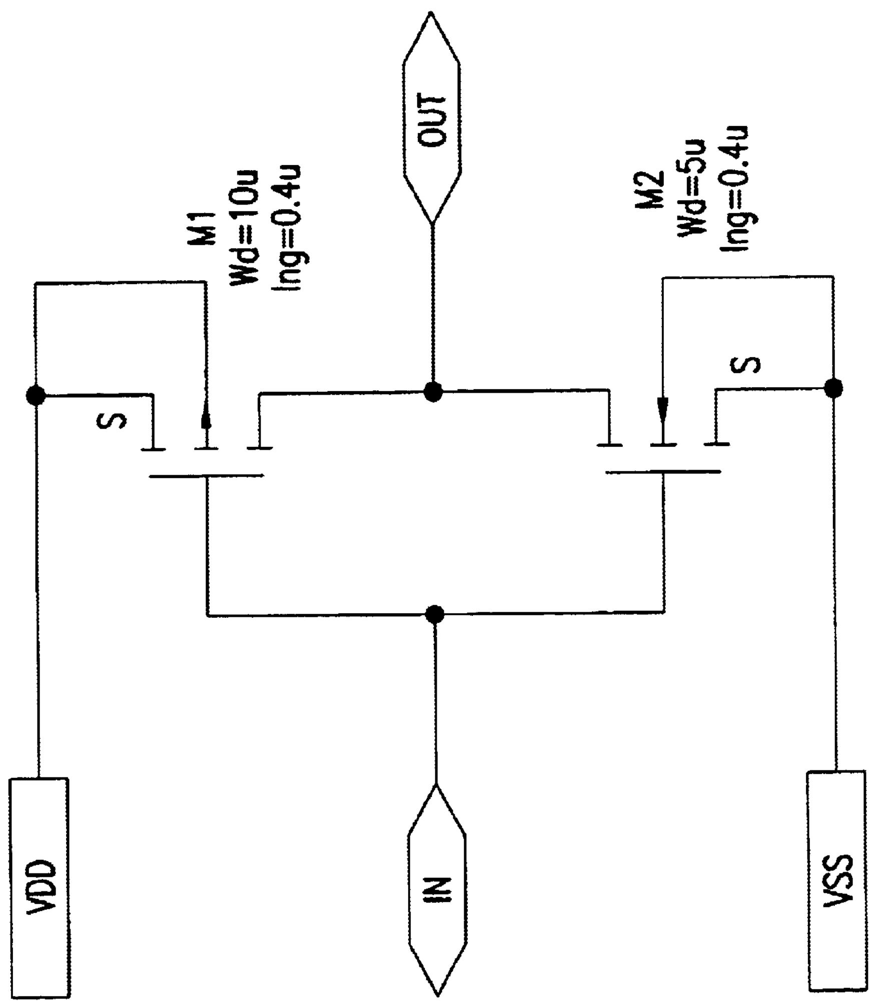
Figure 138:
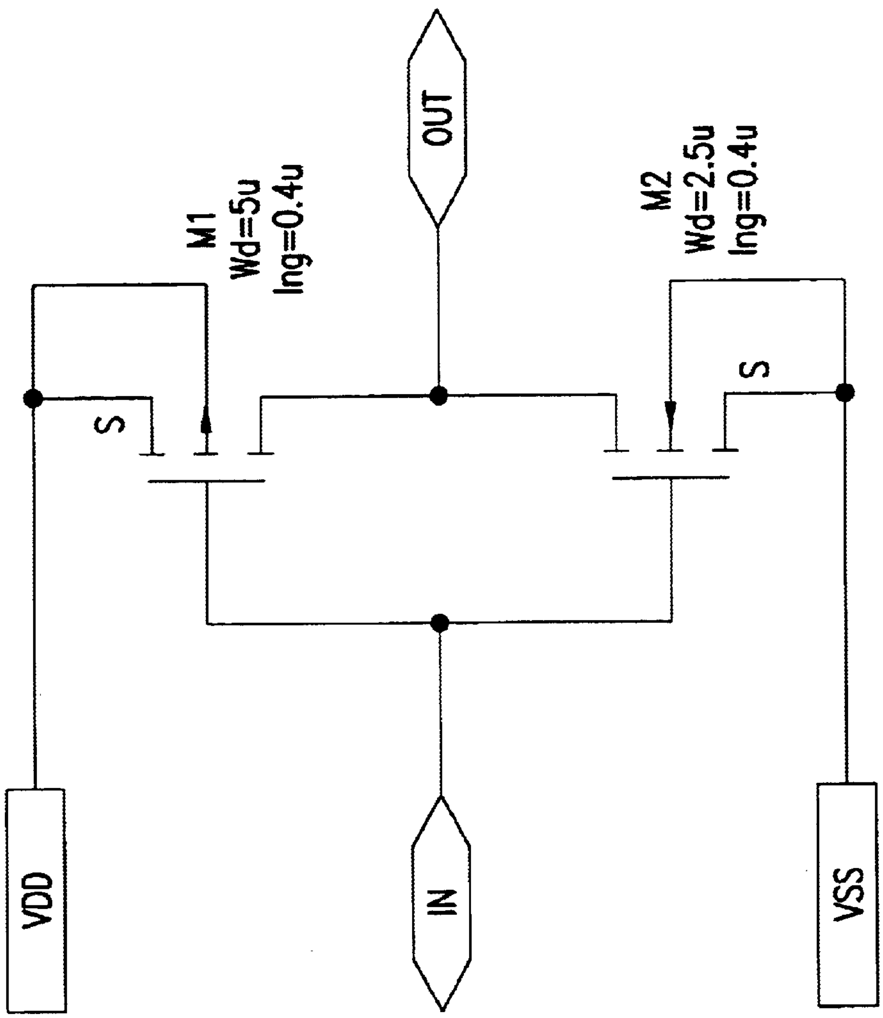
Figure 139:
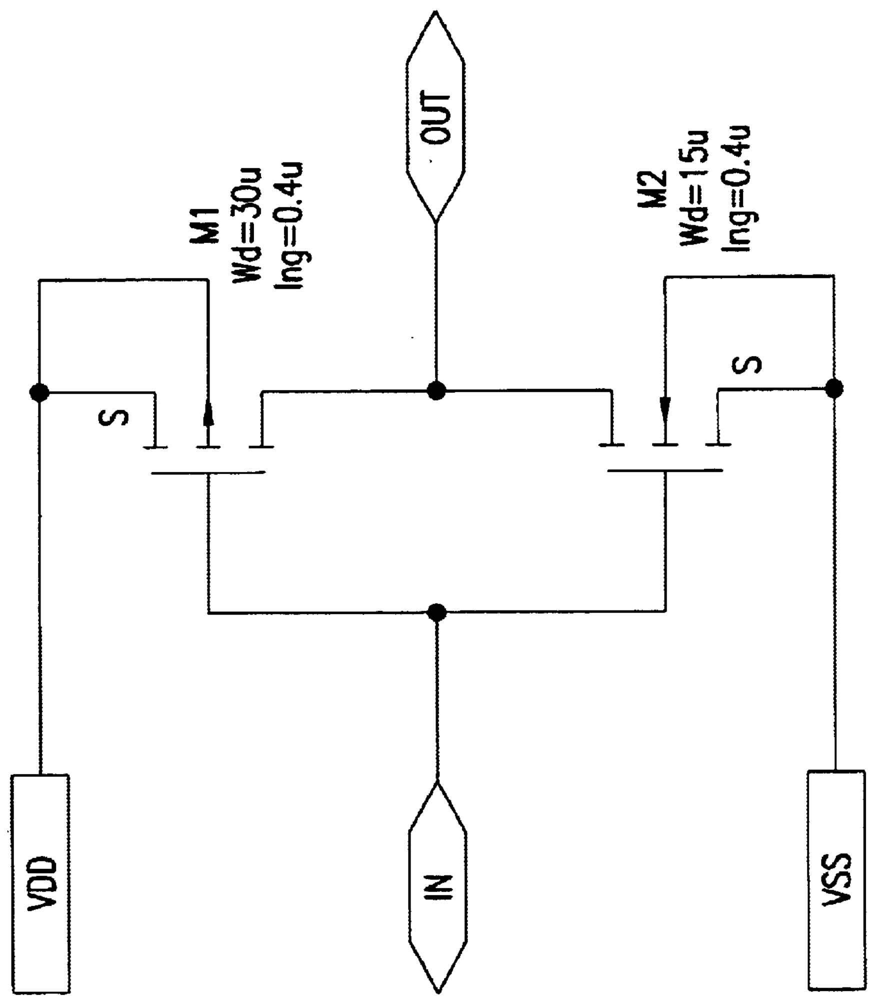
Figure 140:
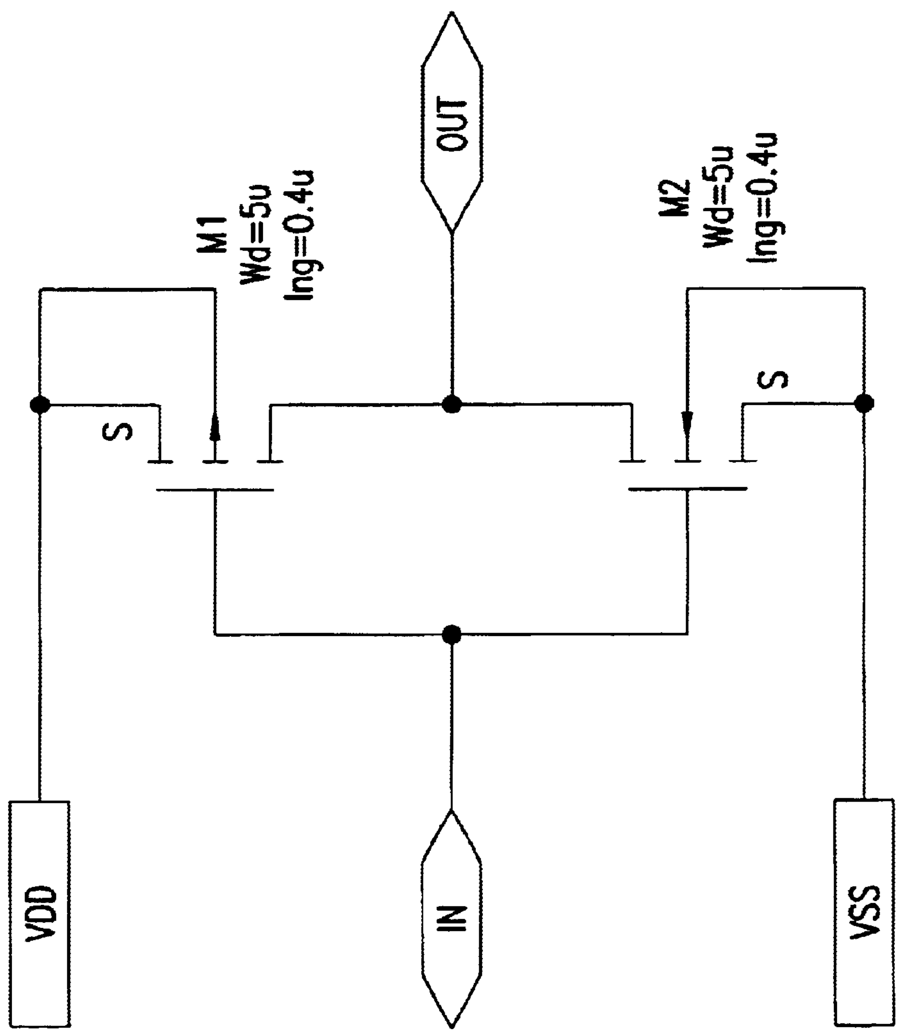
Figure 141:
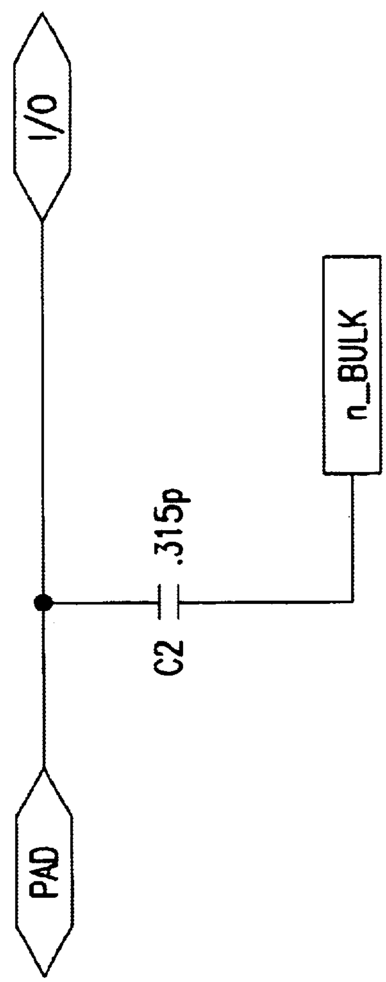
Figure 142:
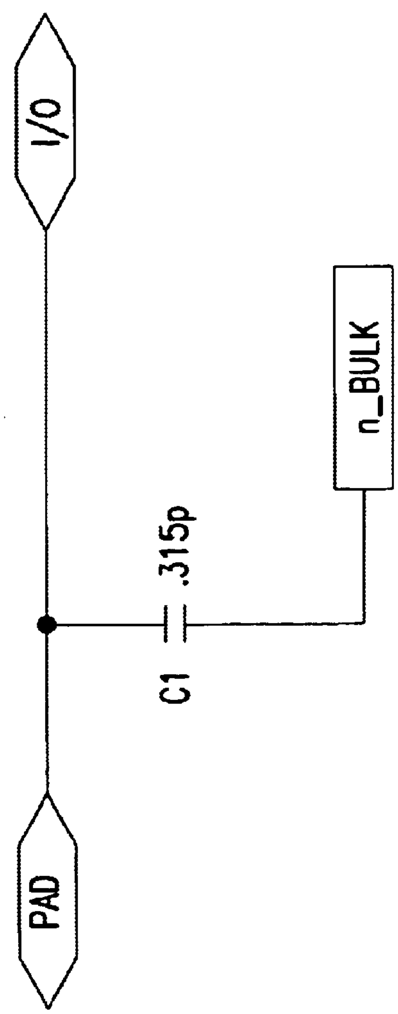
Figure 143:
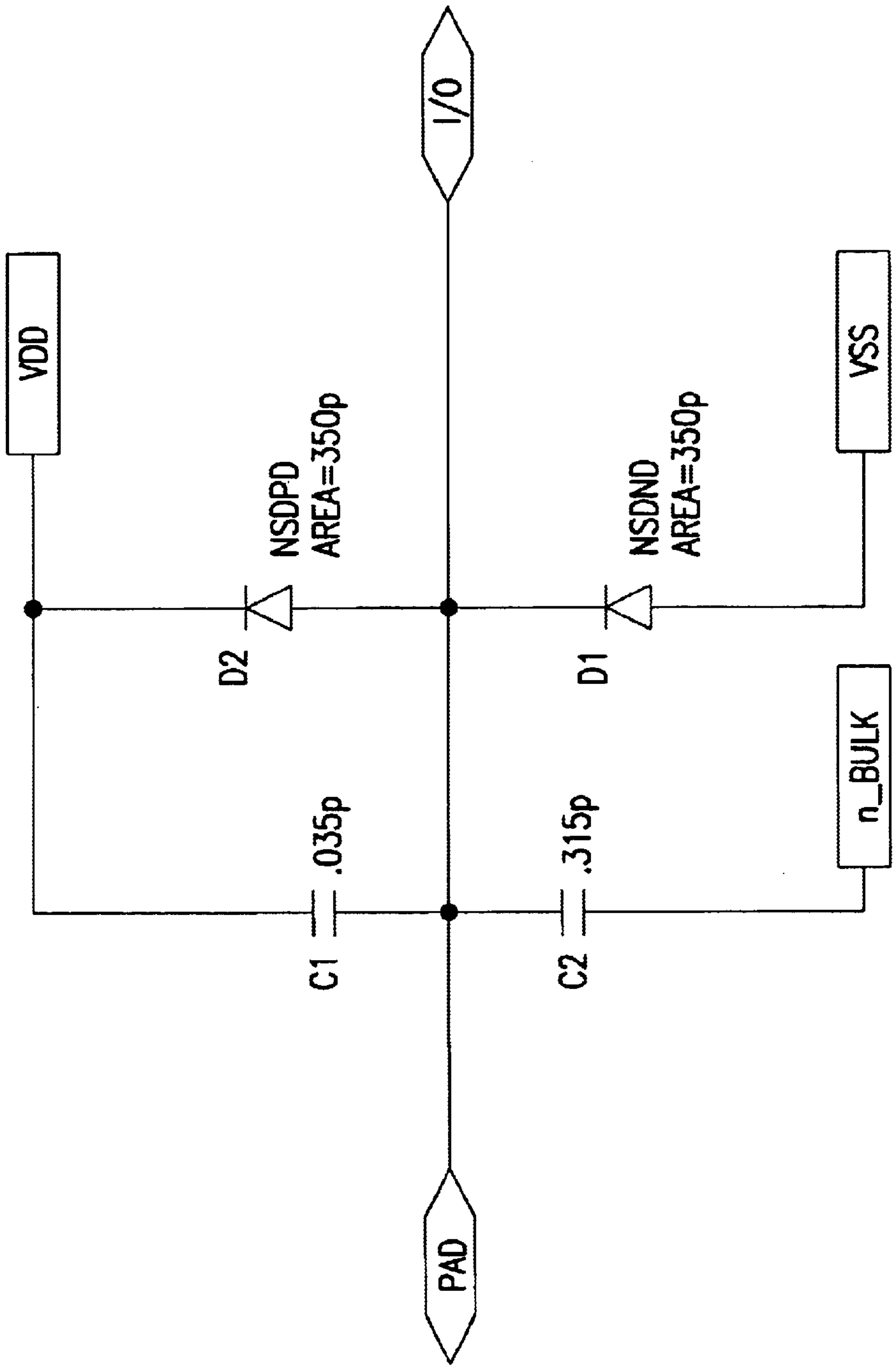
Figure 144:
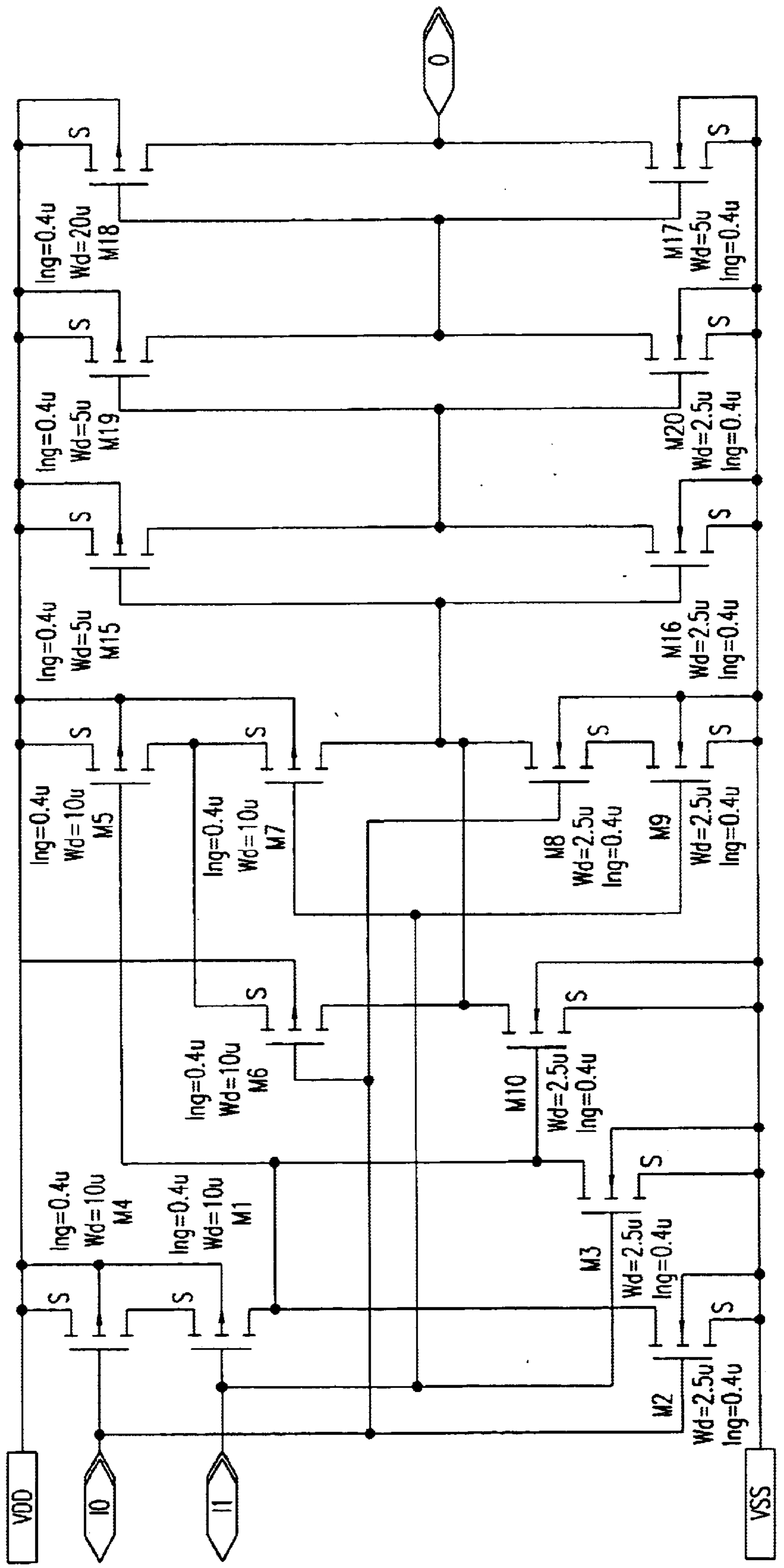
Figure 145:
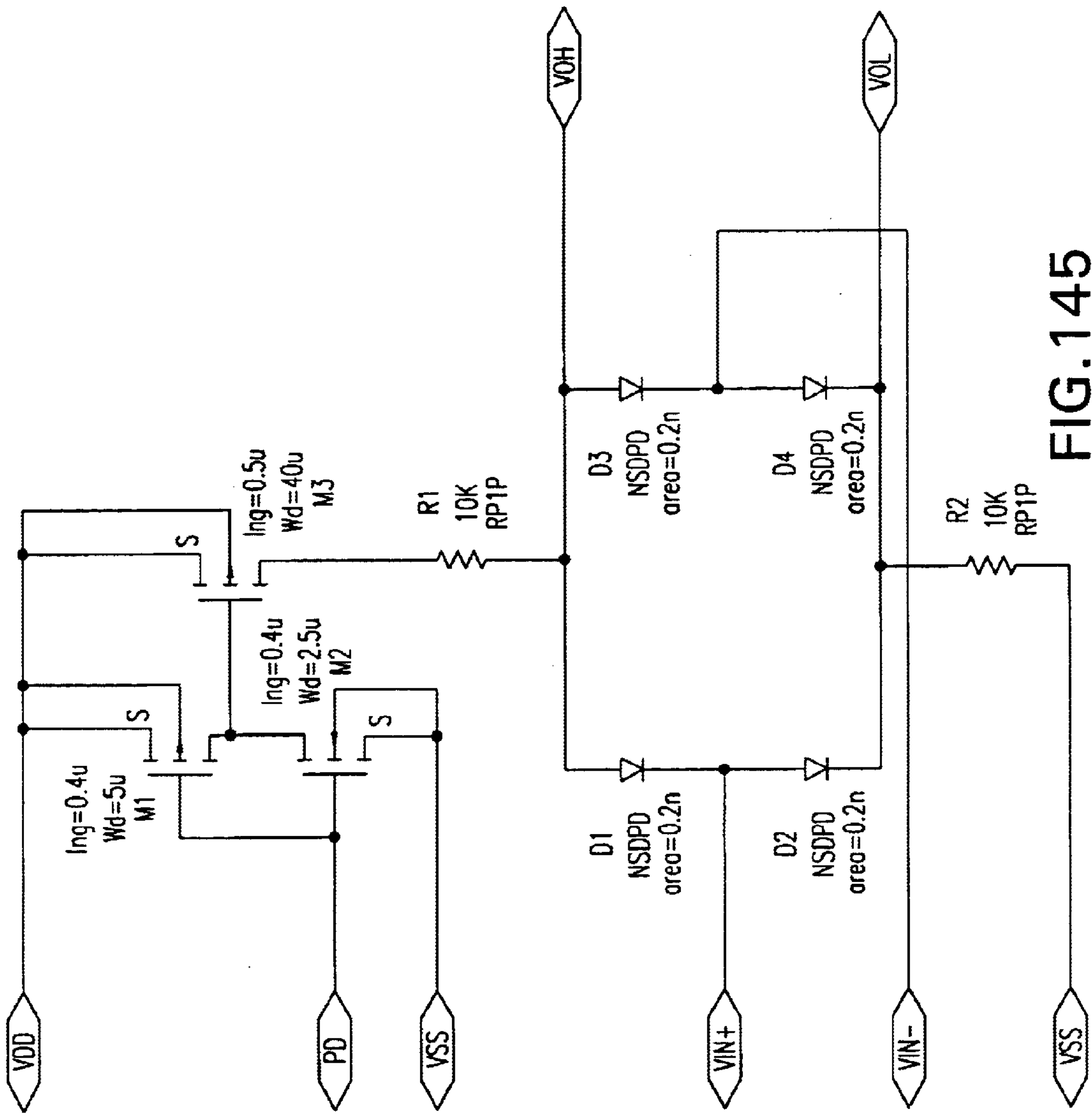
Figure 146:
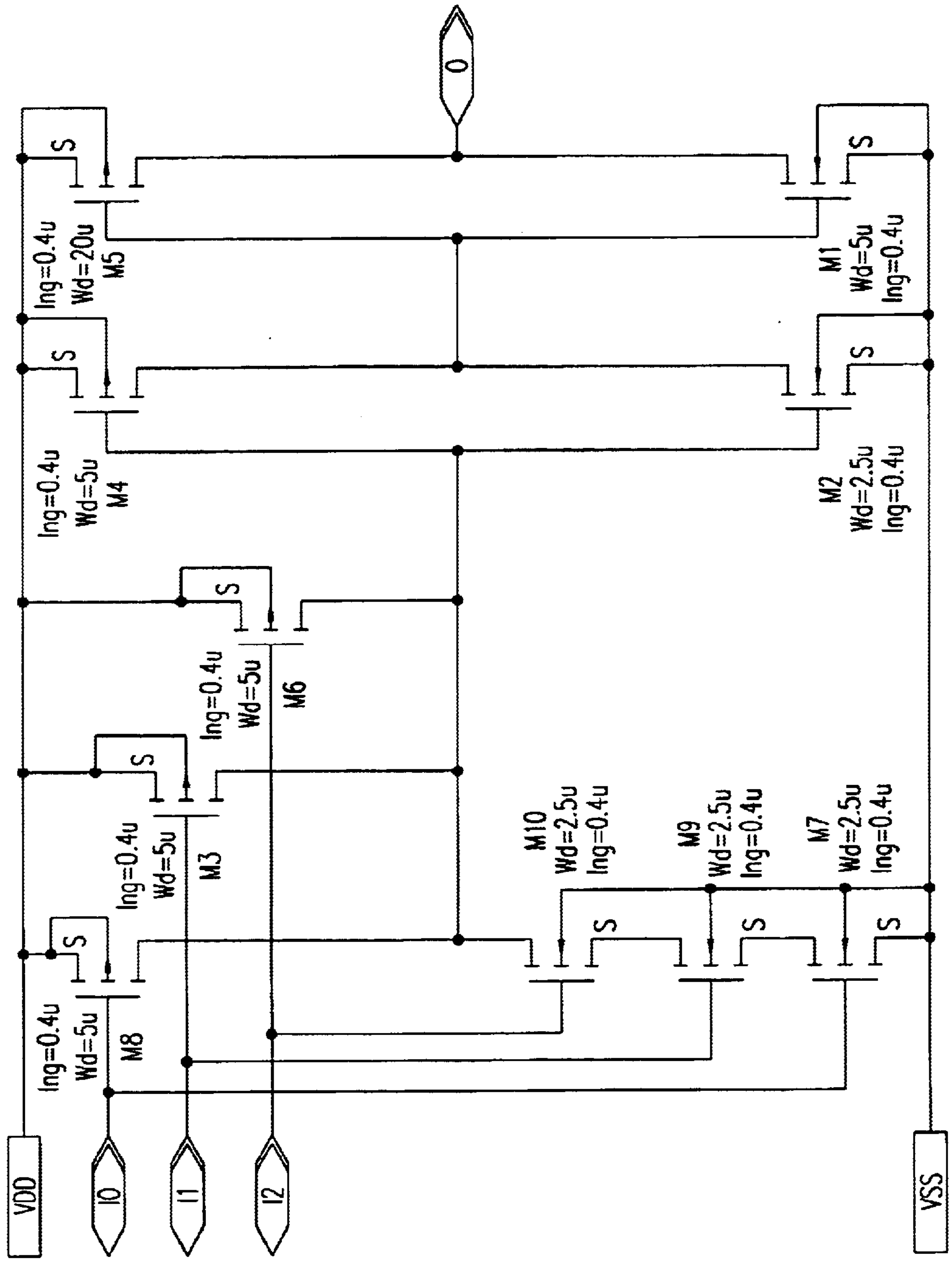
Figure 147:
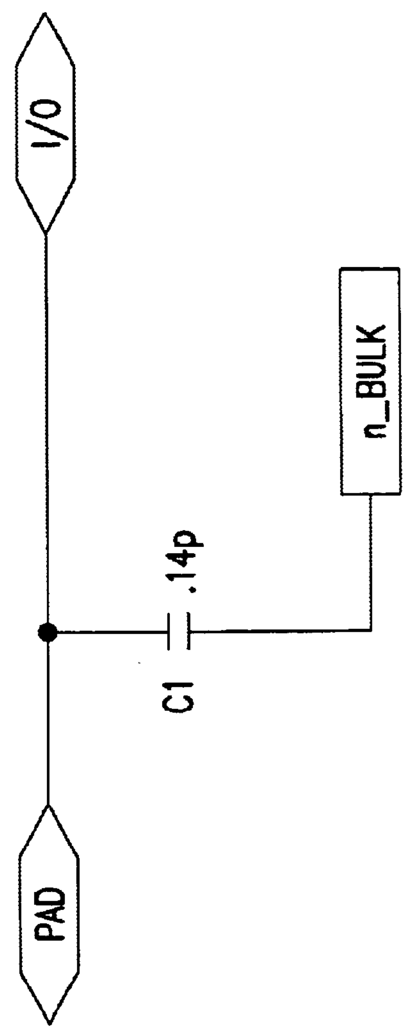
Figure 148:
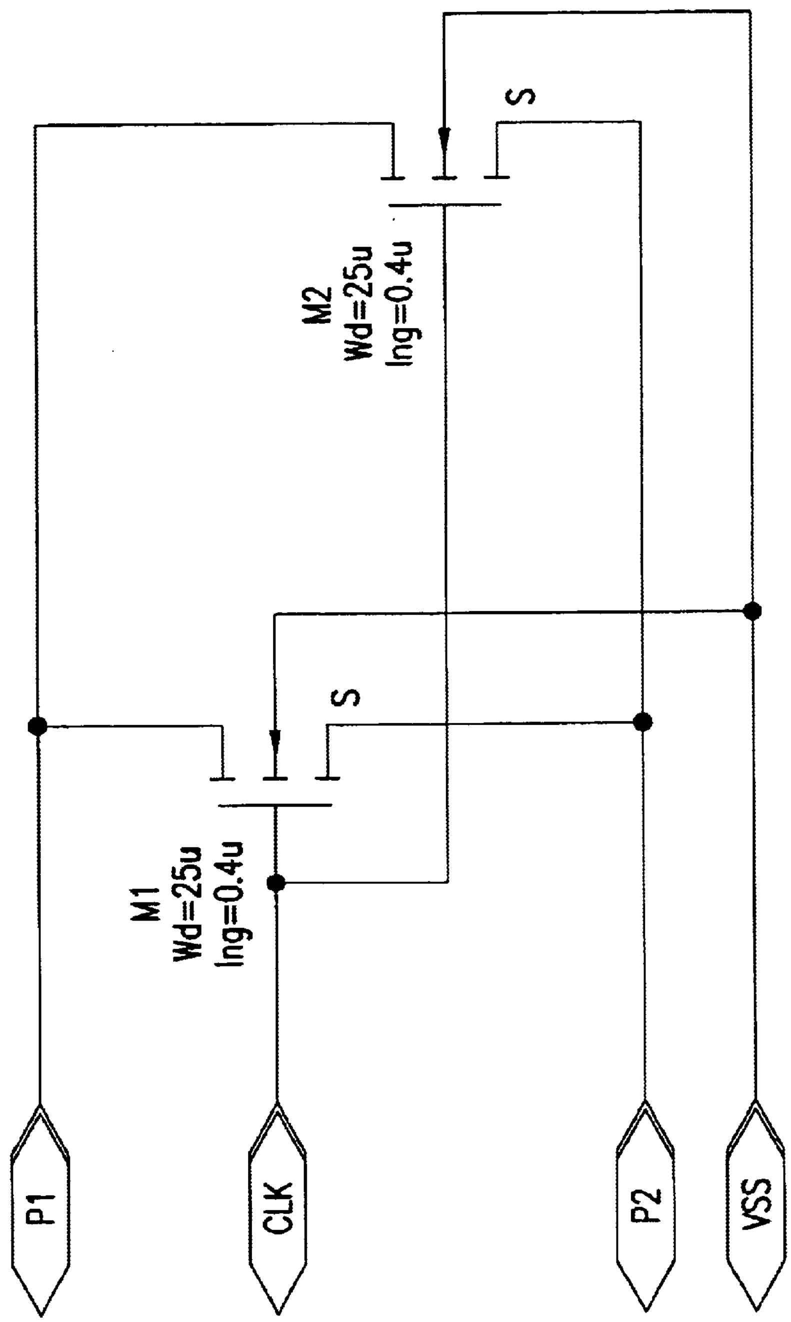
Figure 149:
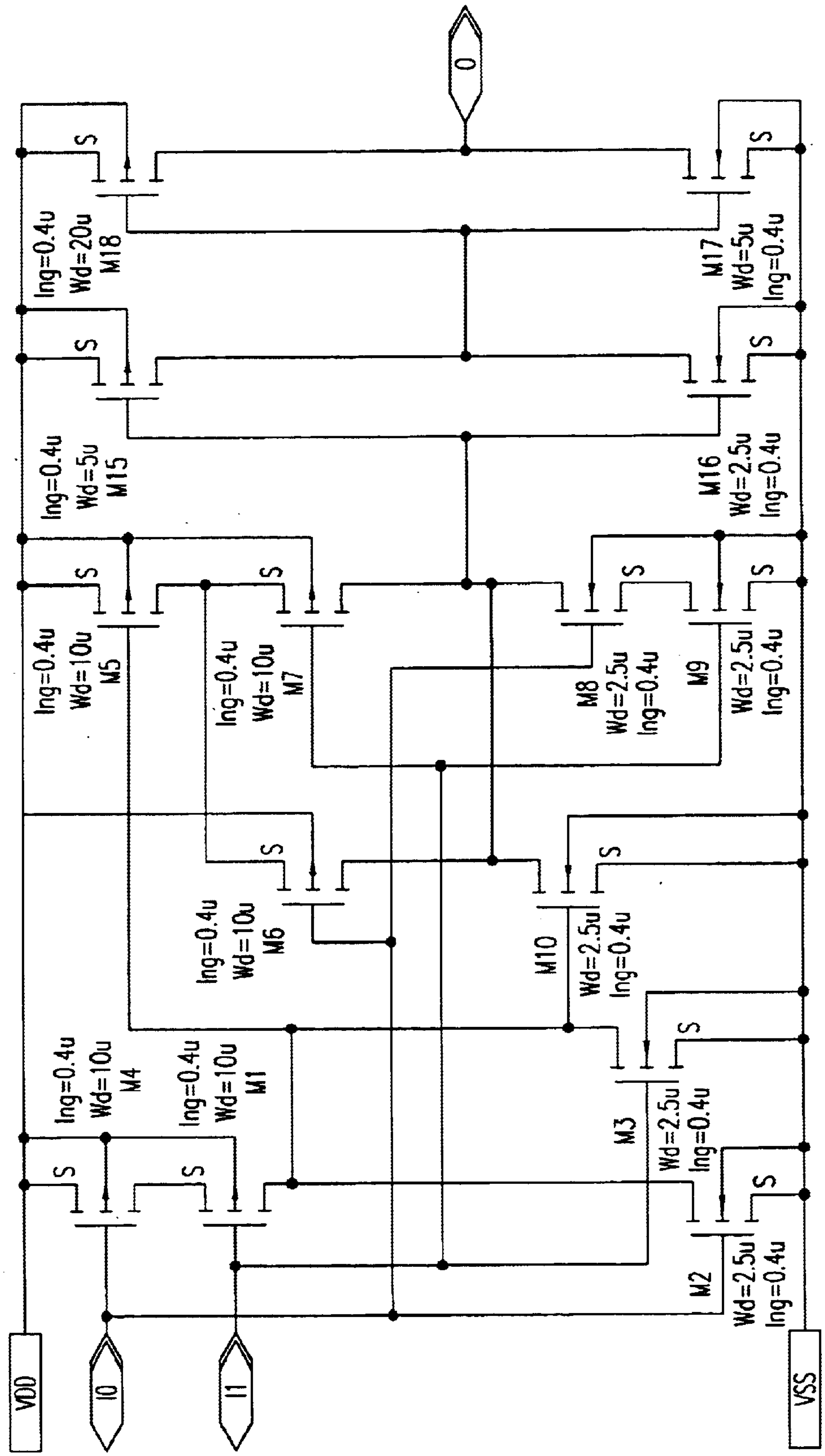
Figure 150A:
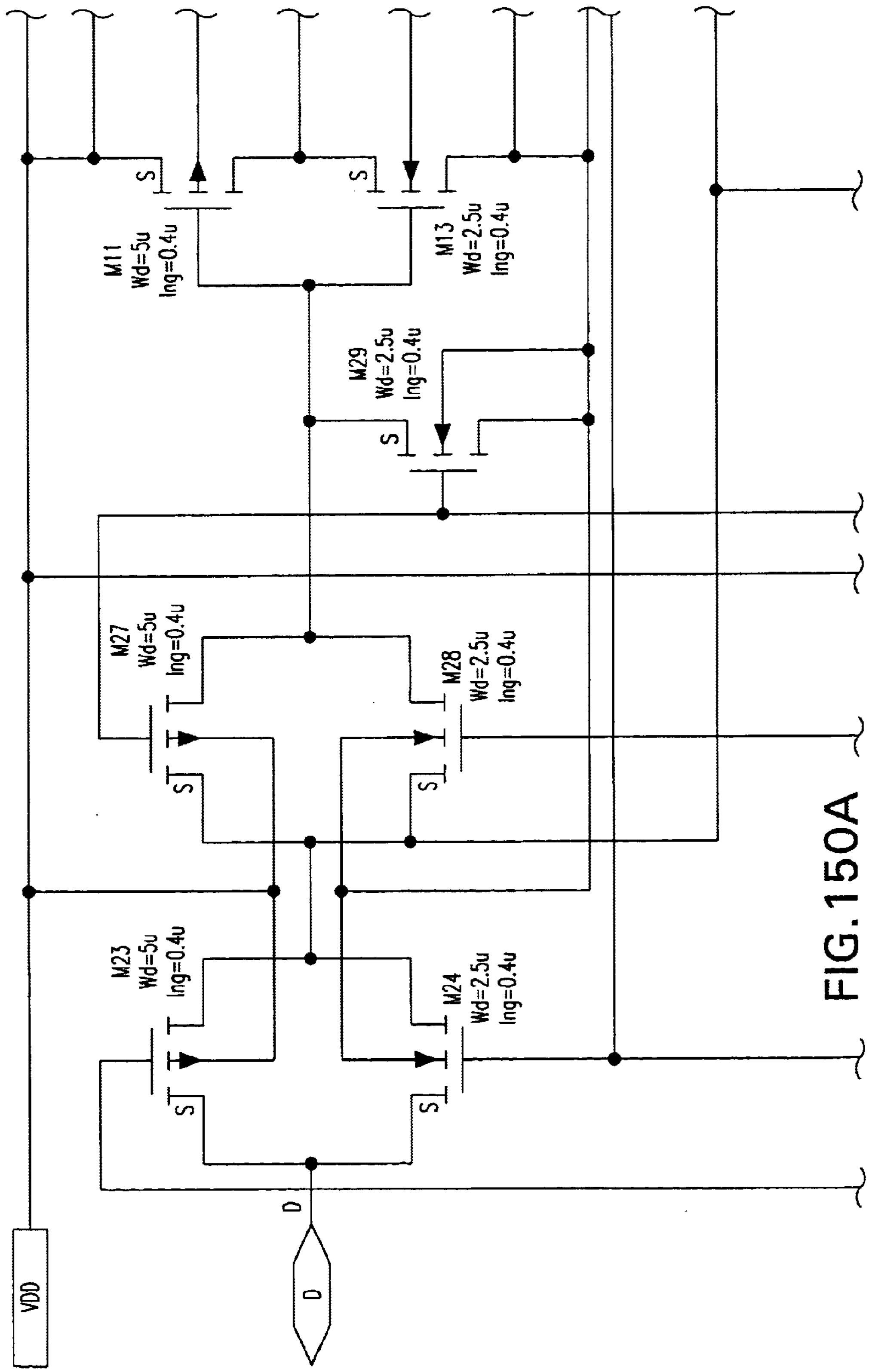
FIG. 150 includes FIGS. 150A–H and should be referred to for all references to FIG. 150 in the specification.
Figure 150B:
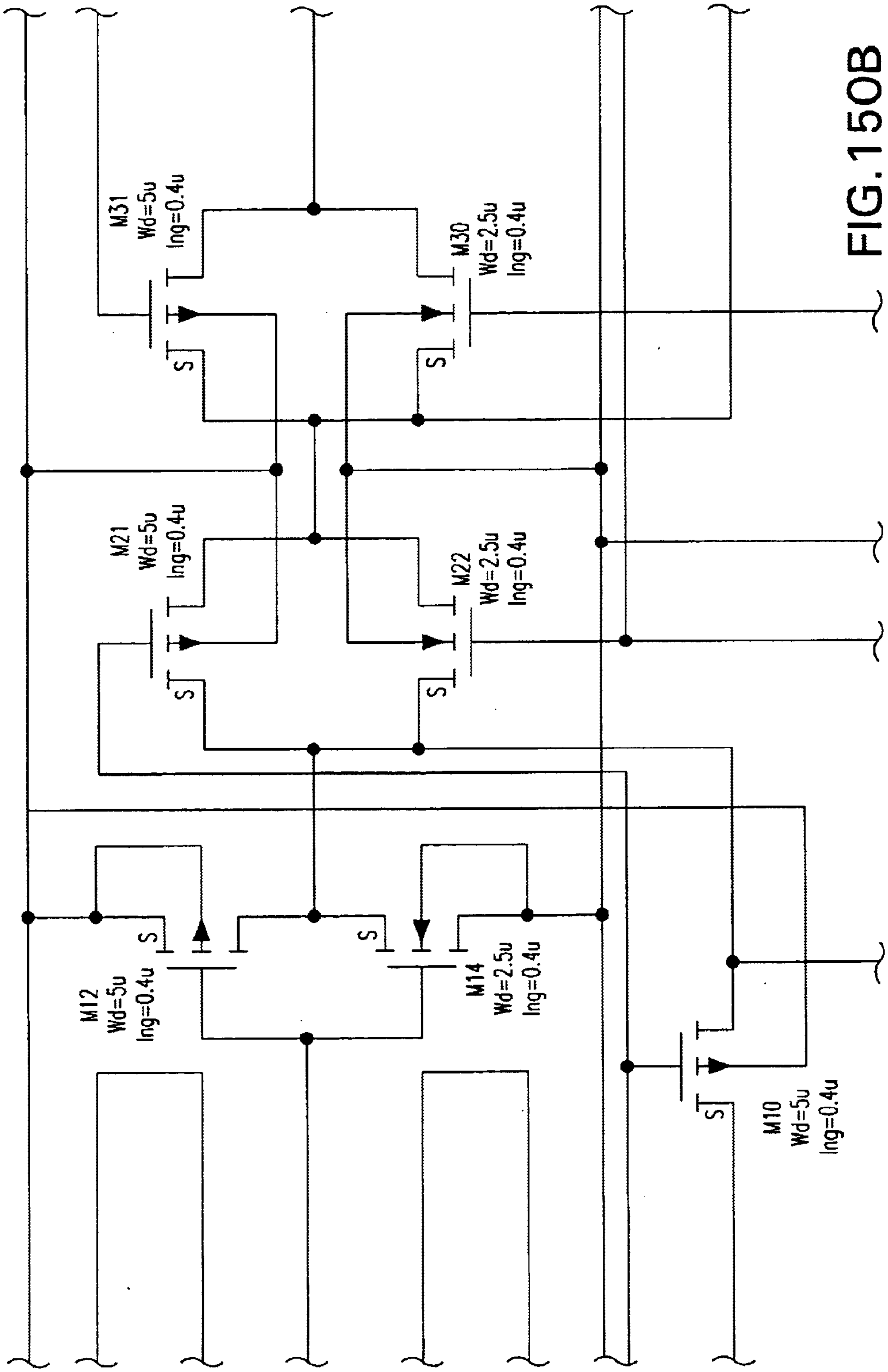
Figure 150C:
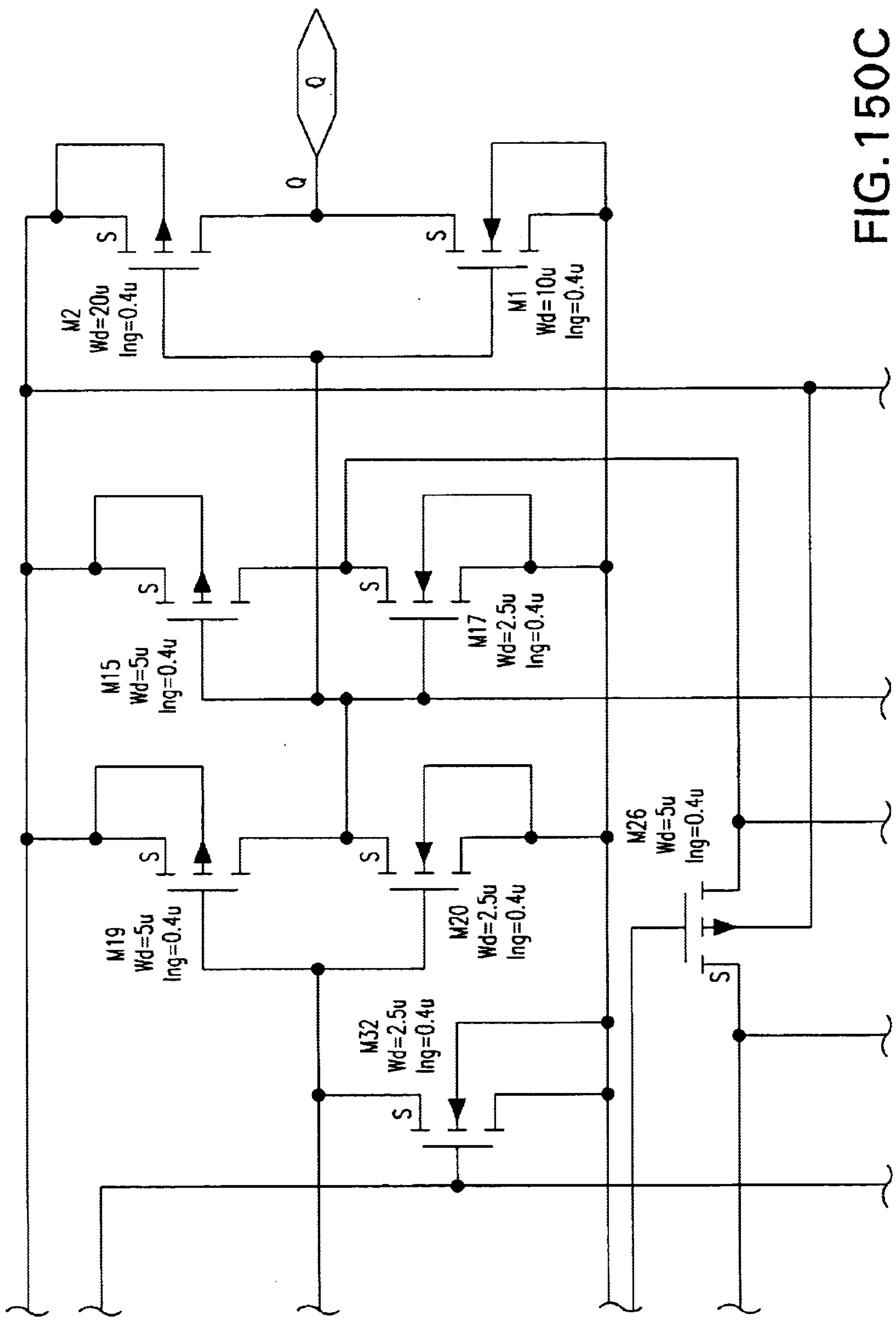
Figure 150D:
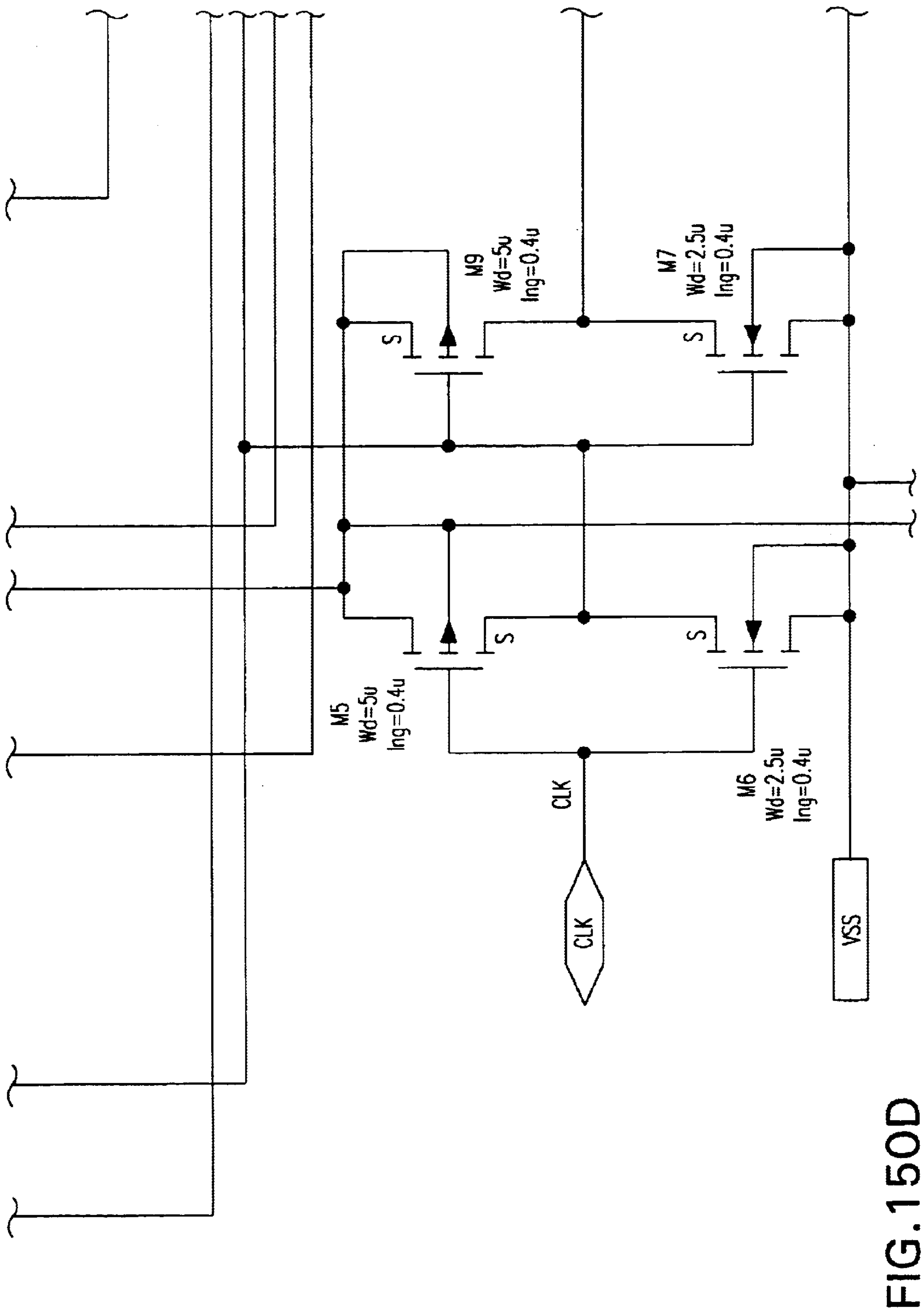
Figure 150E:
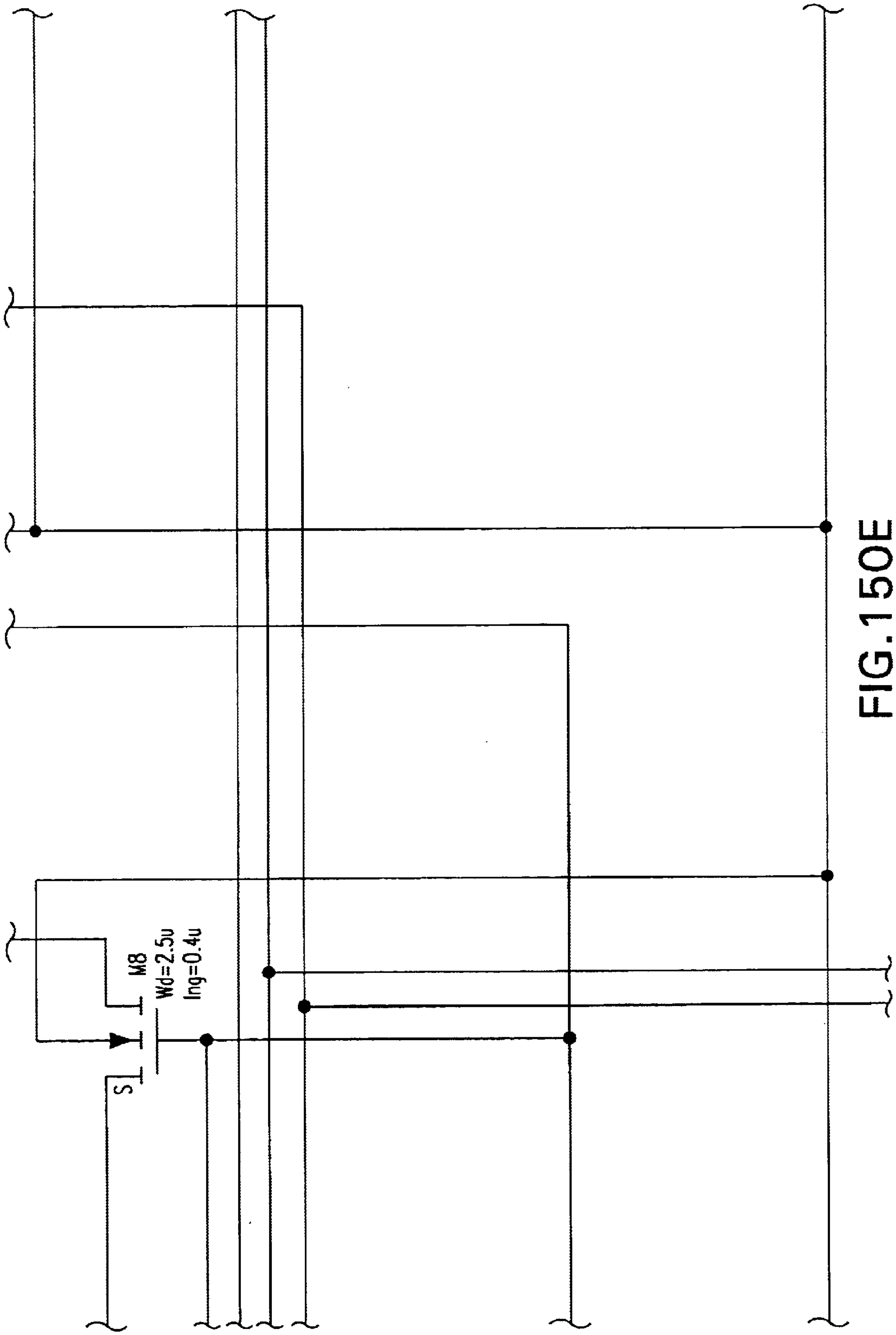
Figure 150F:
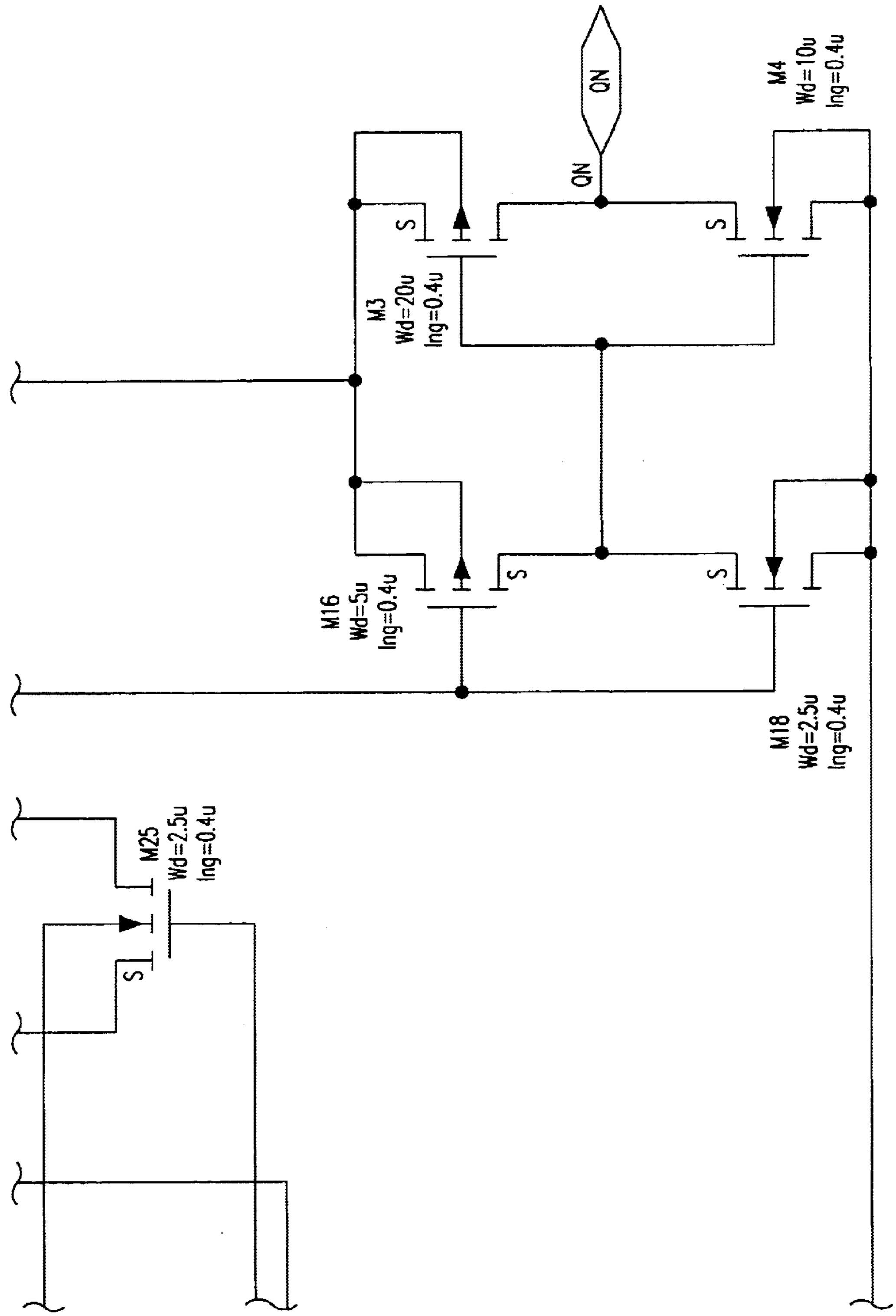
Figure 150G:
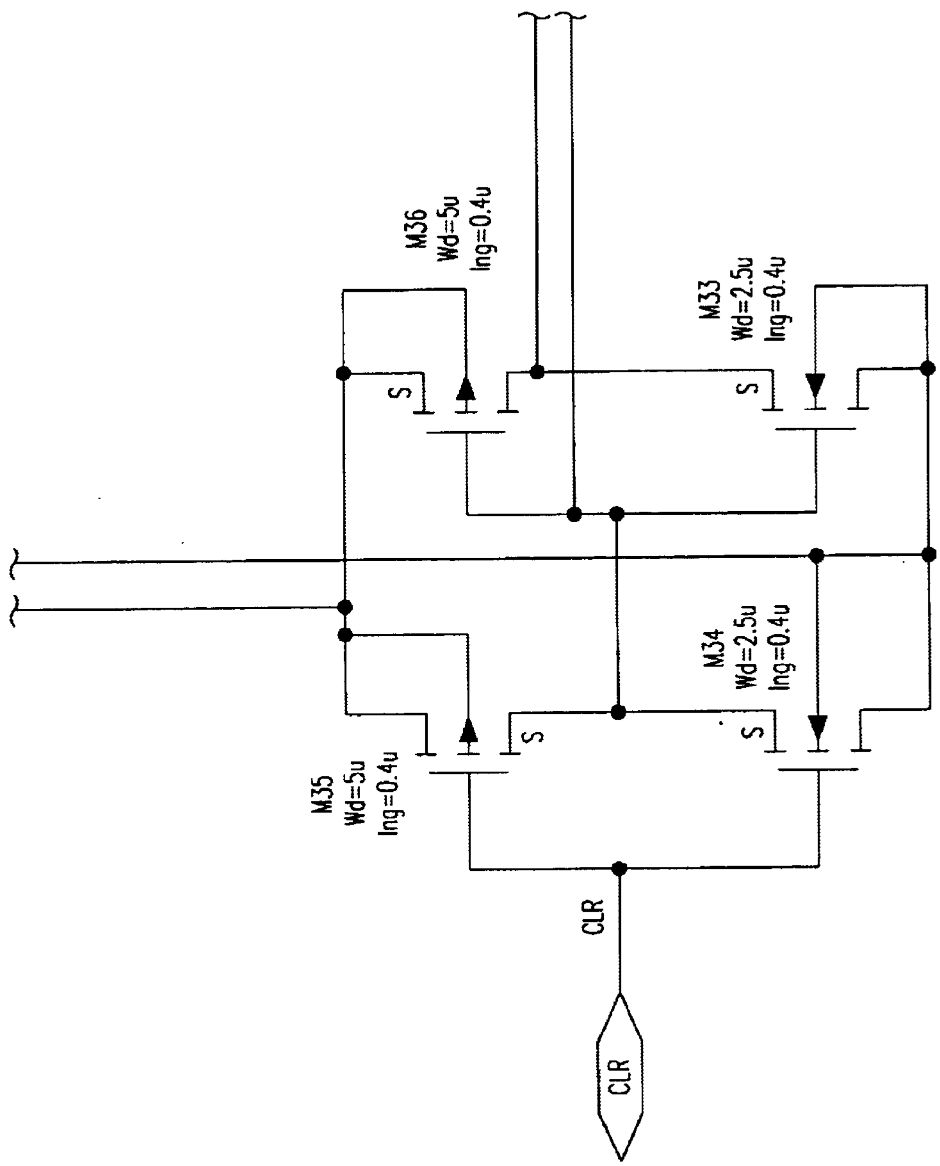
Figure 150H:
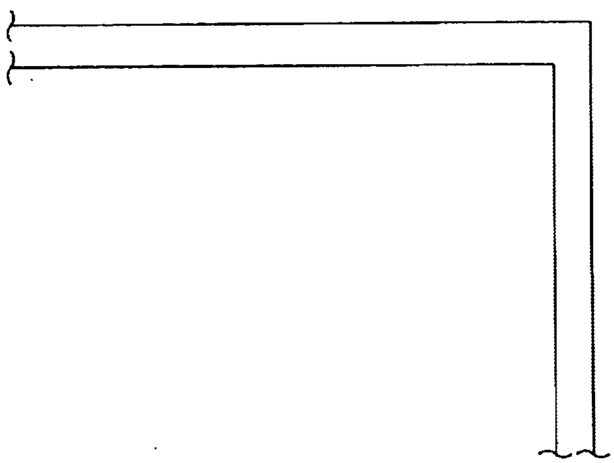
Figure 151:
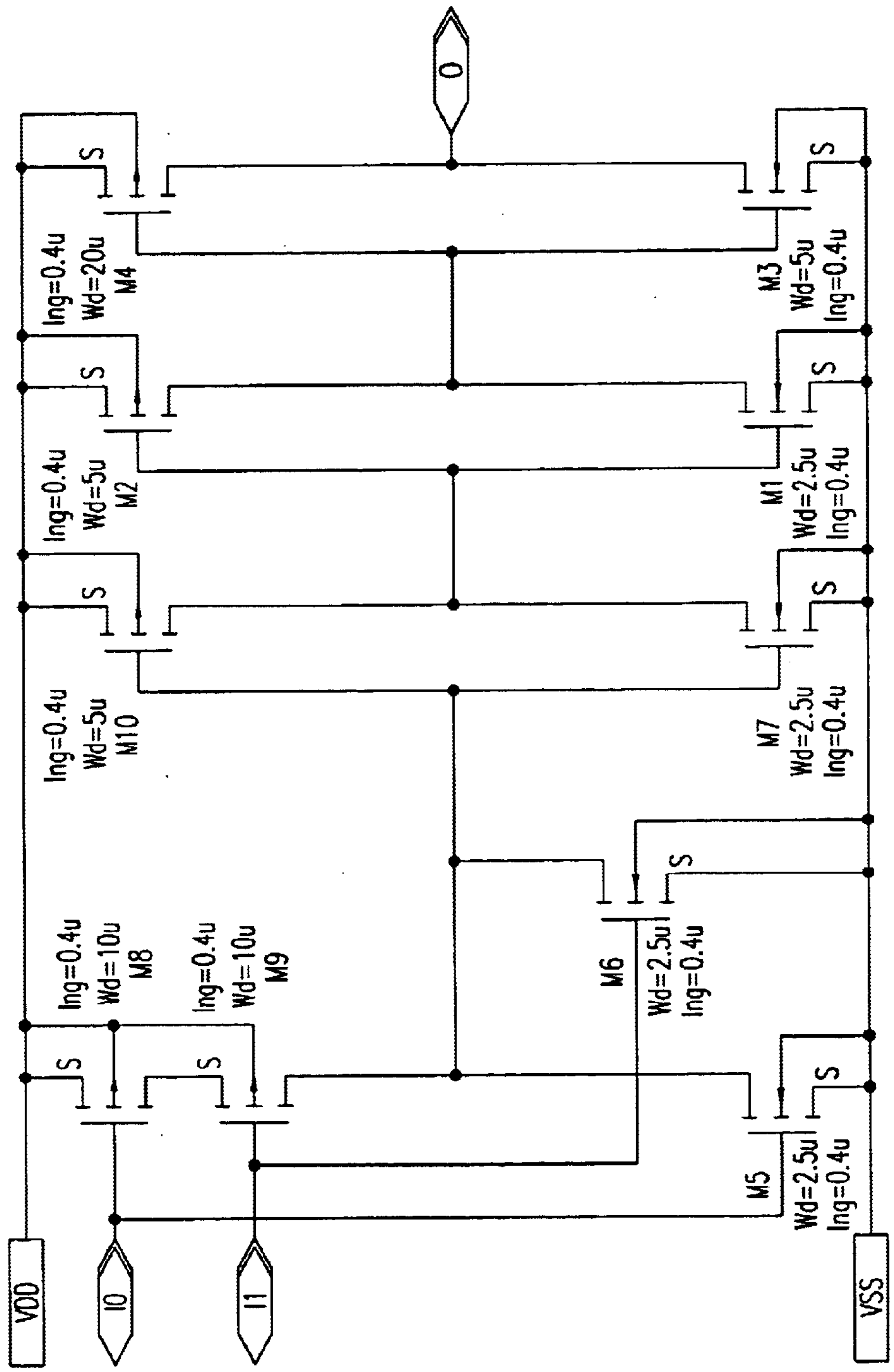
Figure 152:
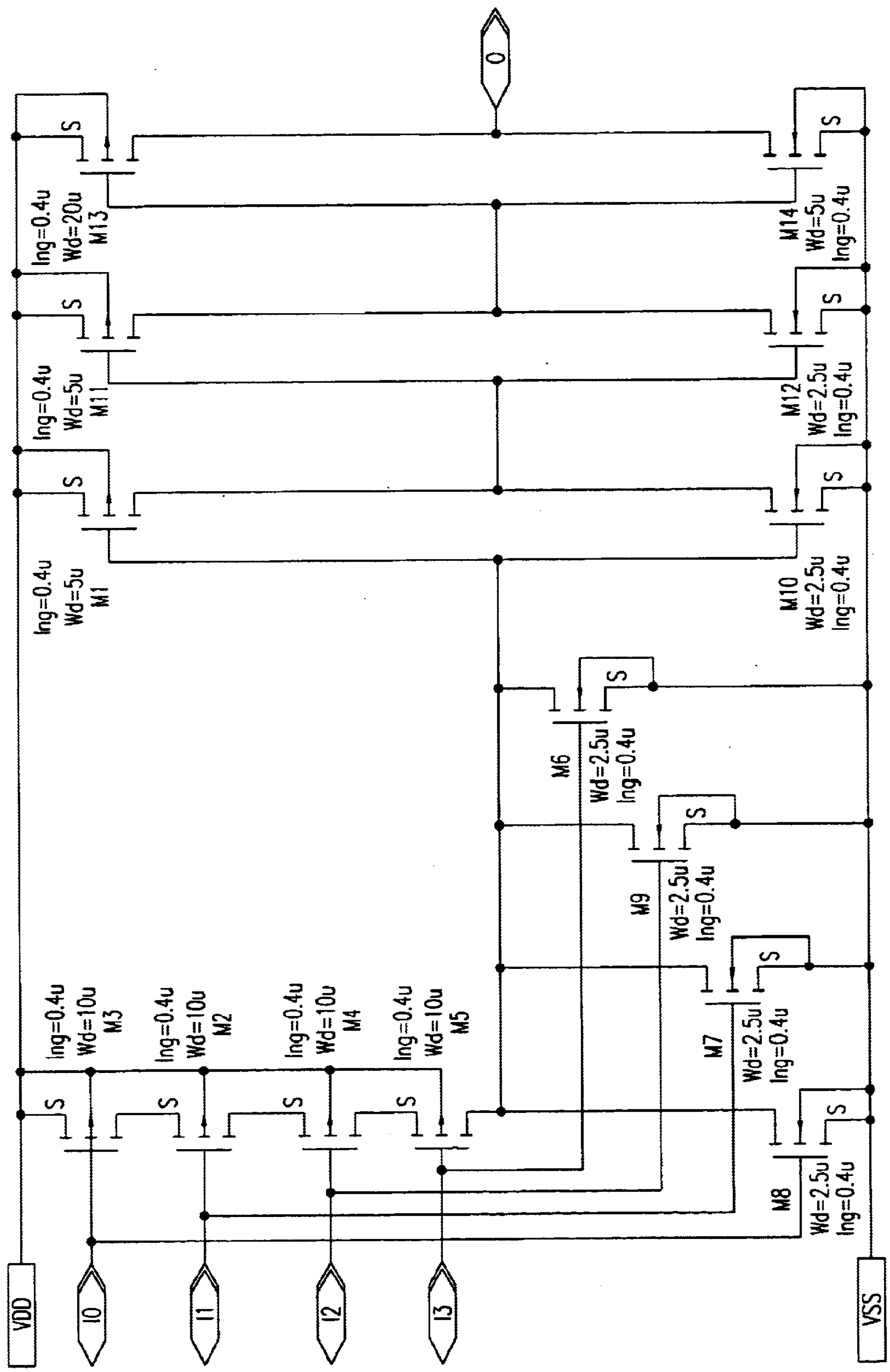
Figure 153:
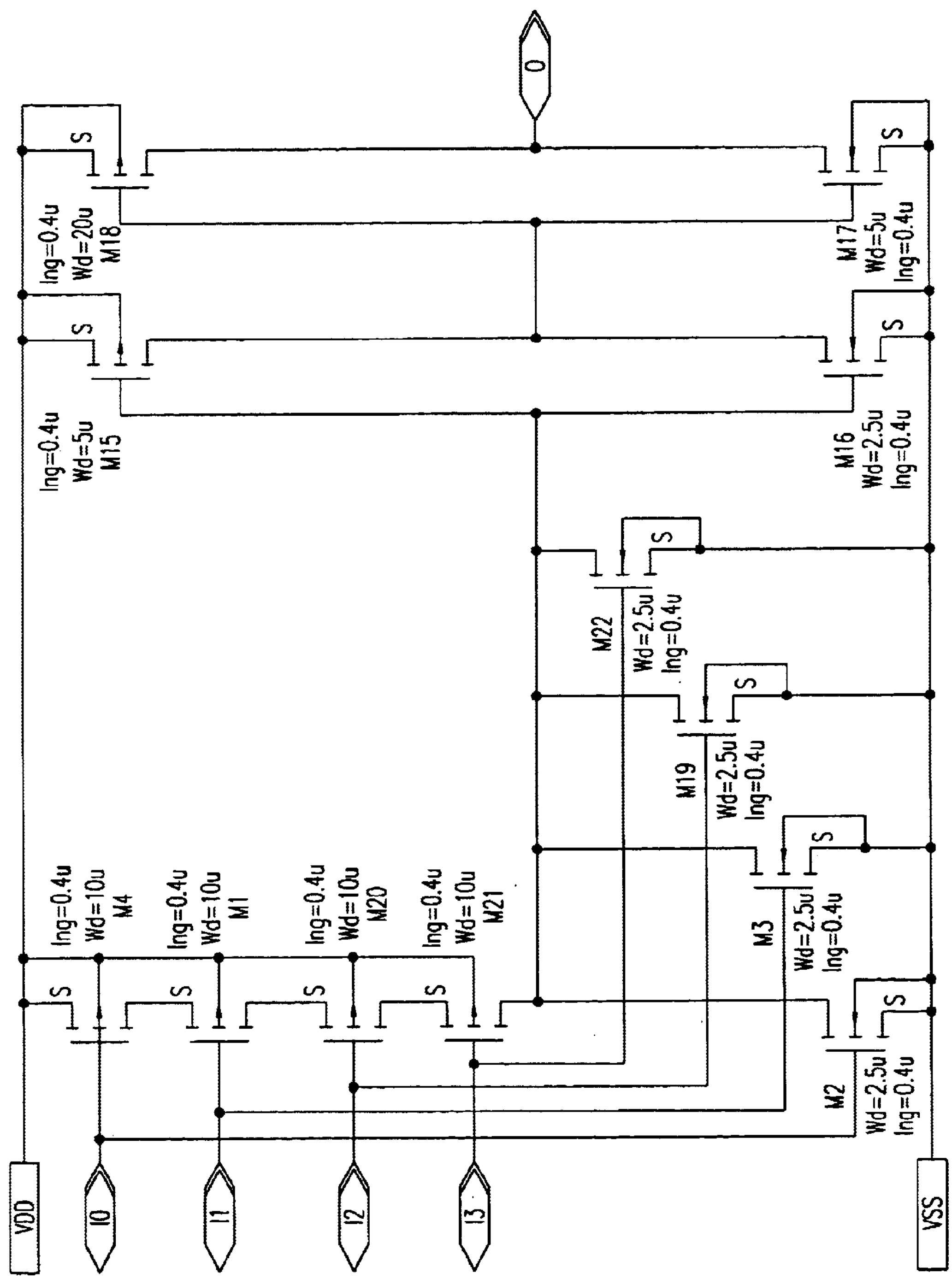
Figure 154:
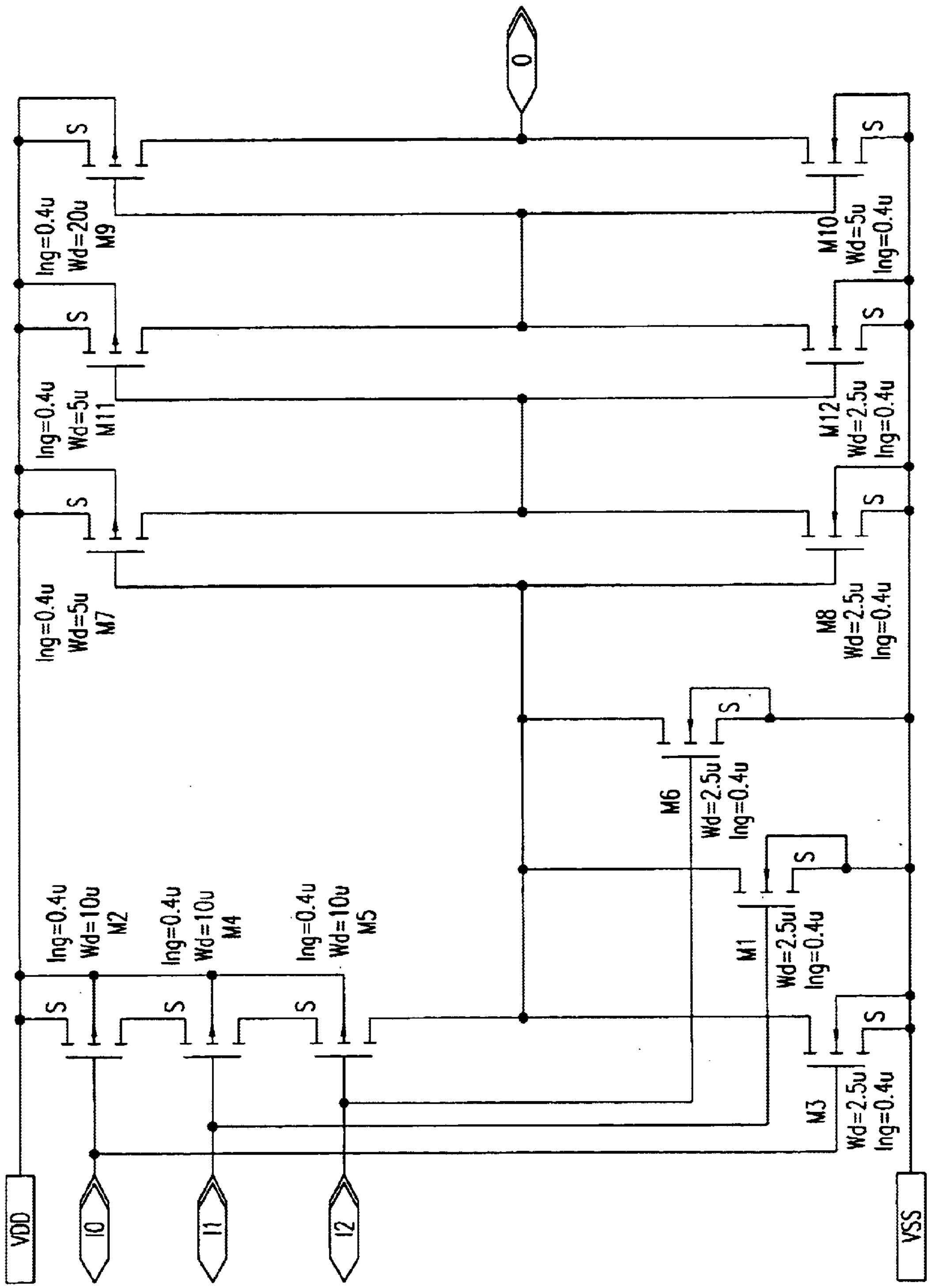
Figure 155:
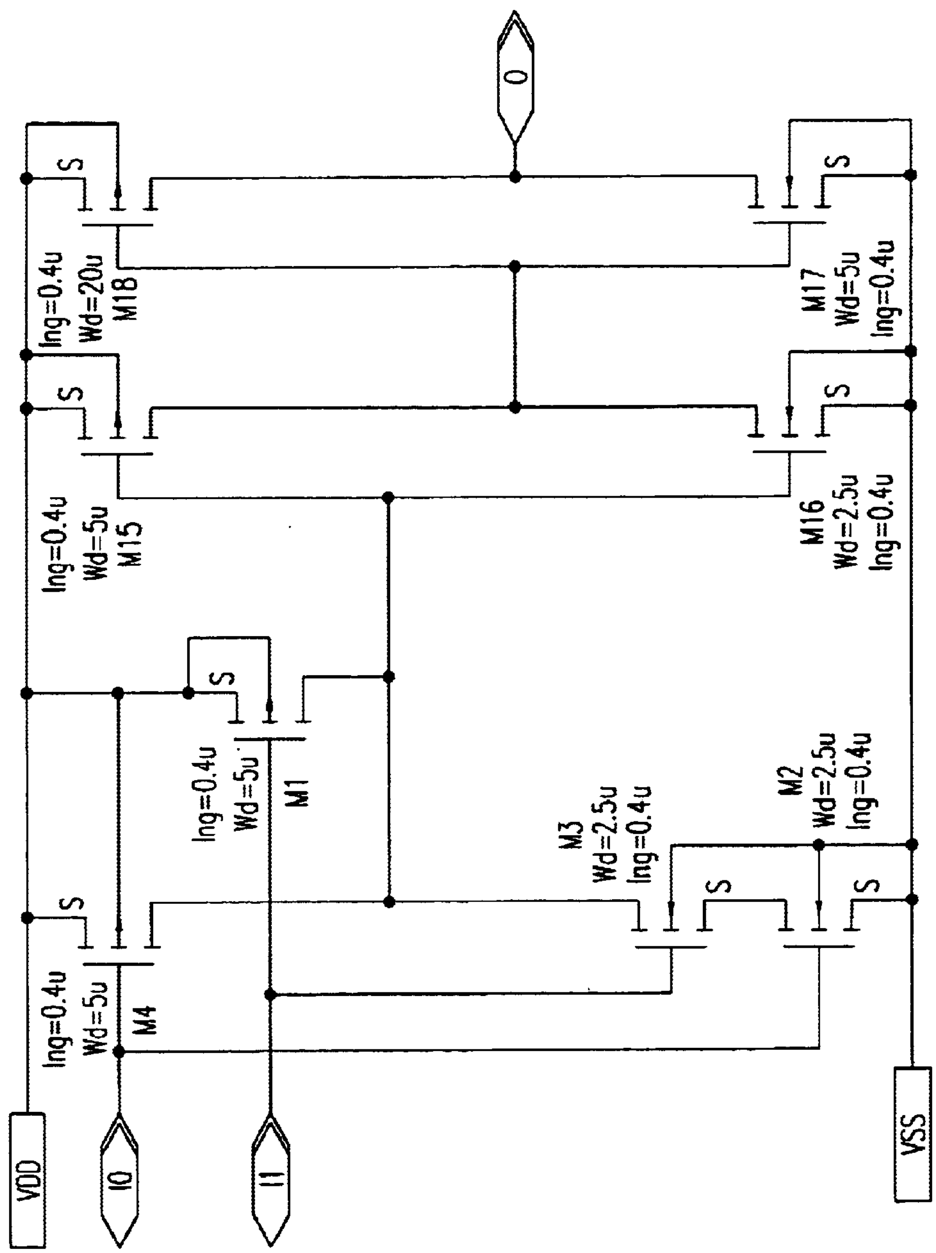
Figure 156:
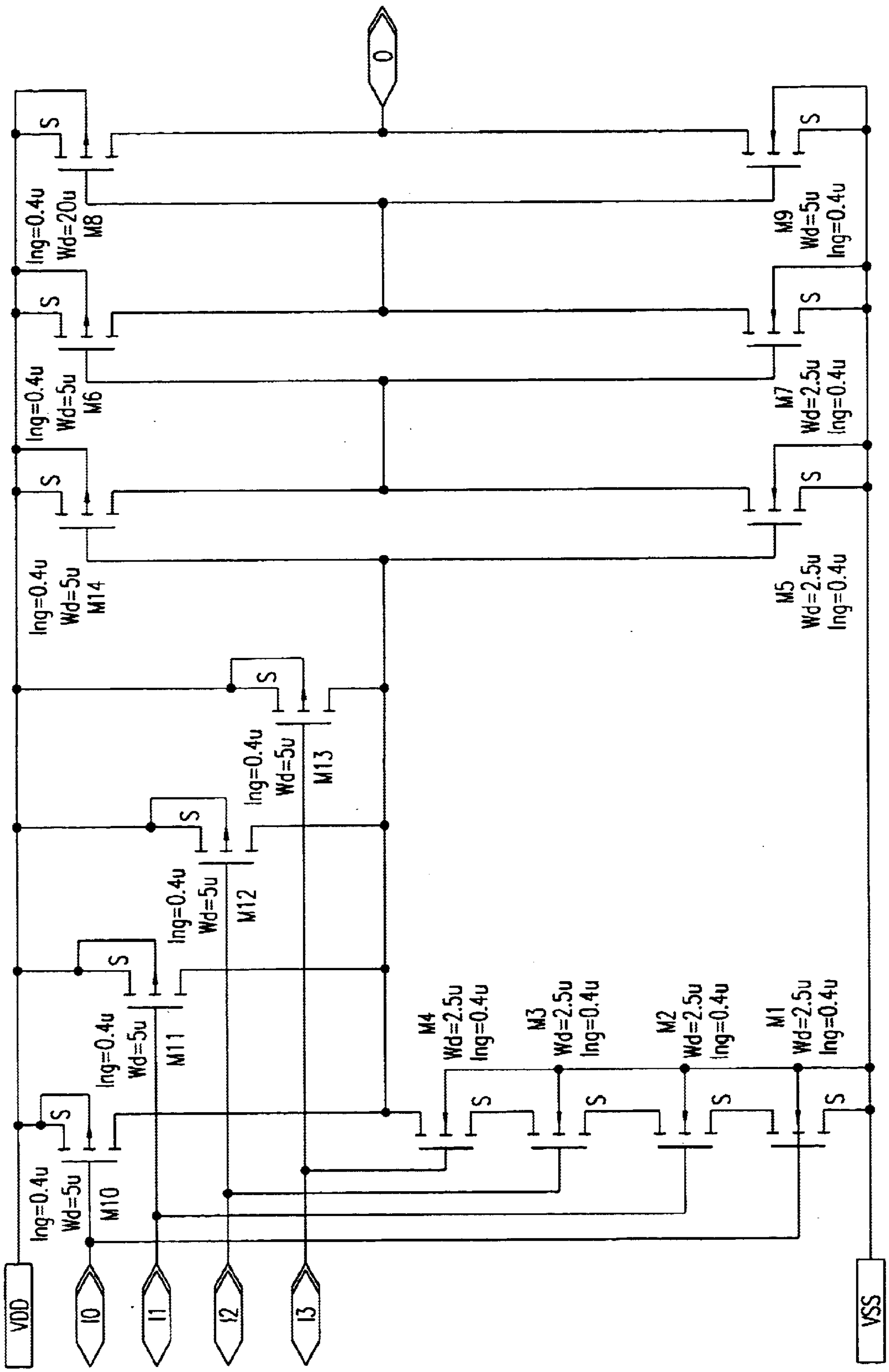
Figure 157:
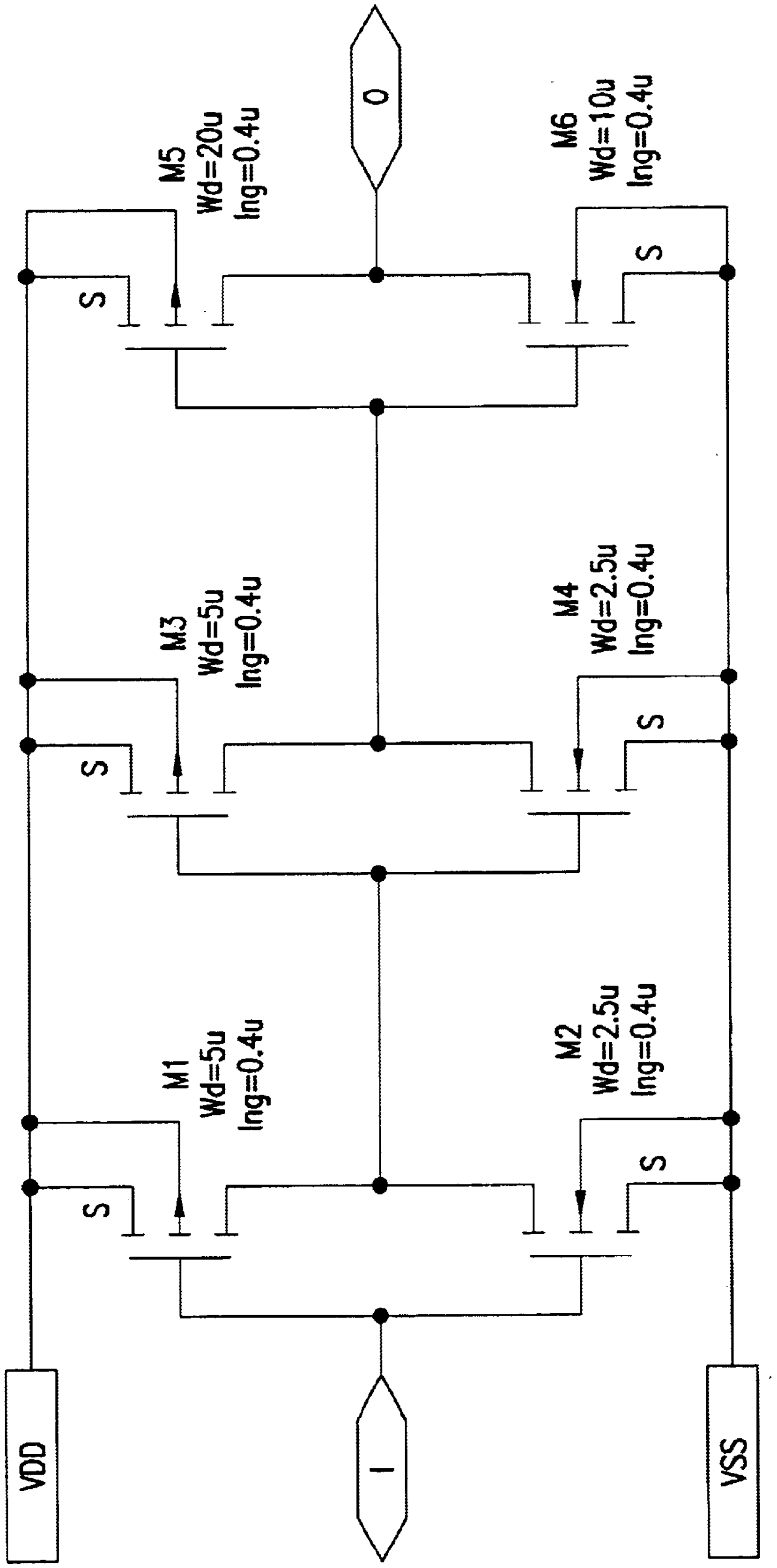
Figure 158:
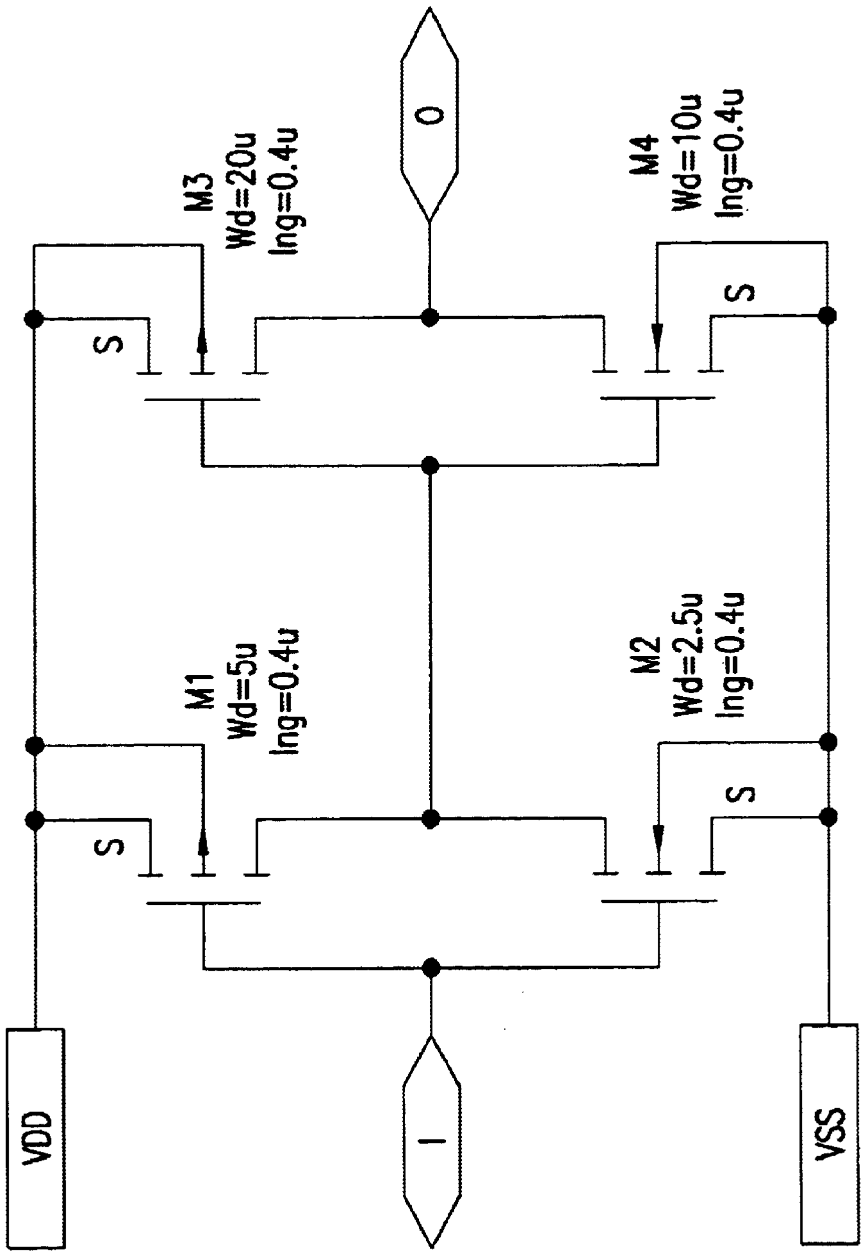
Figure 159A:
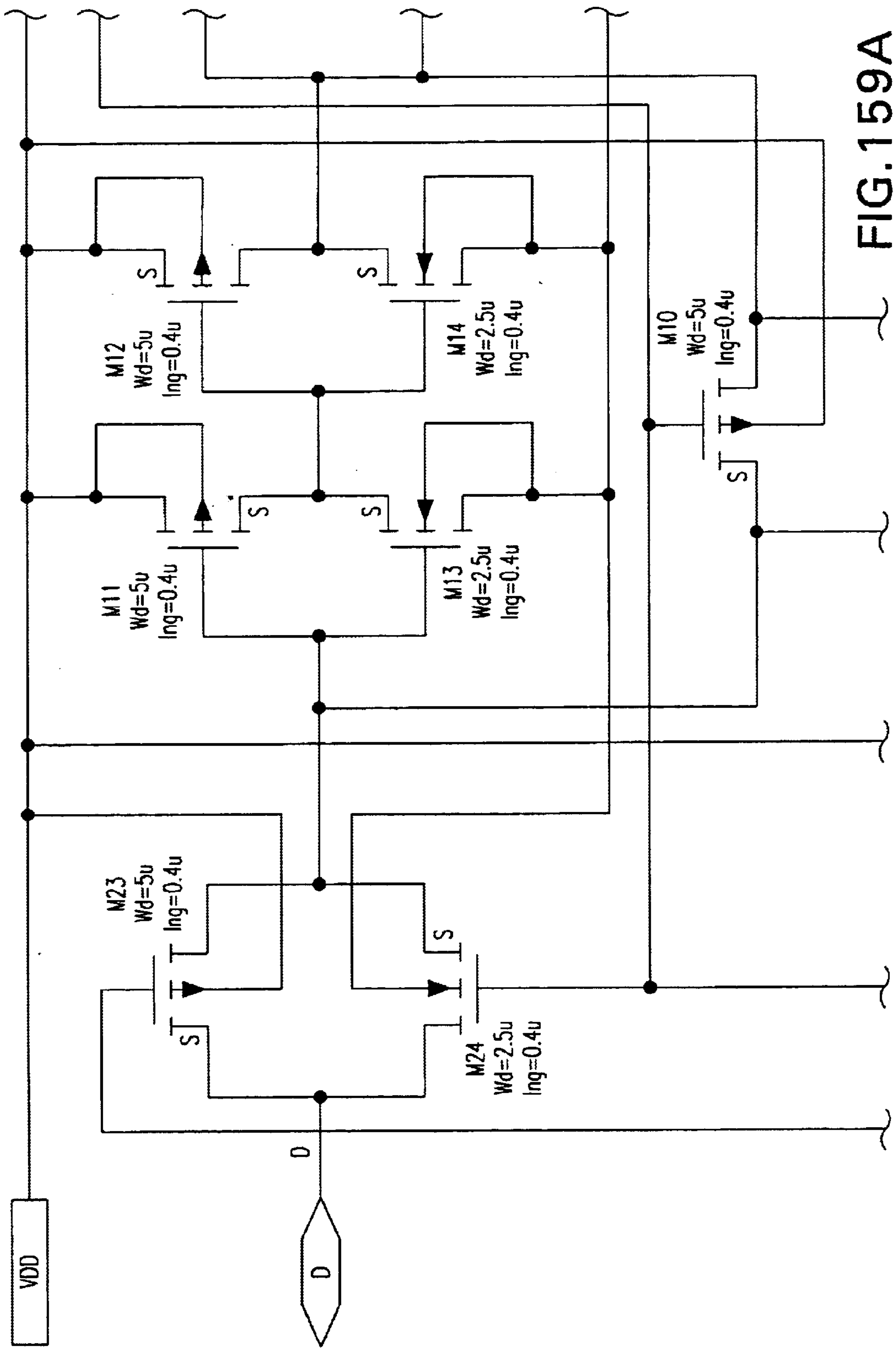
Figure 159B:
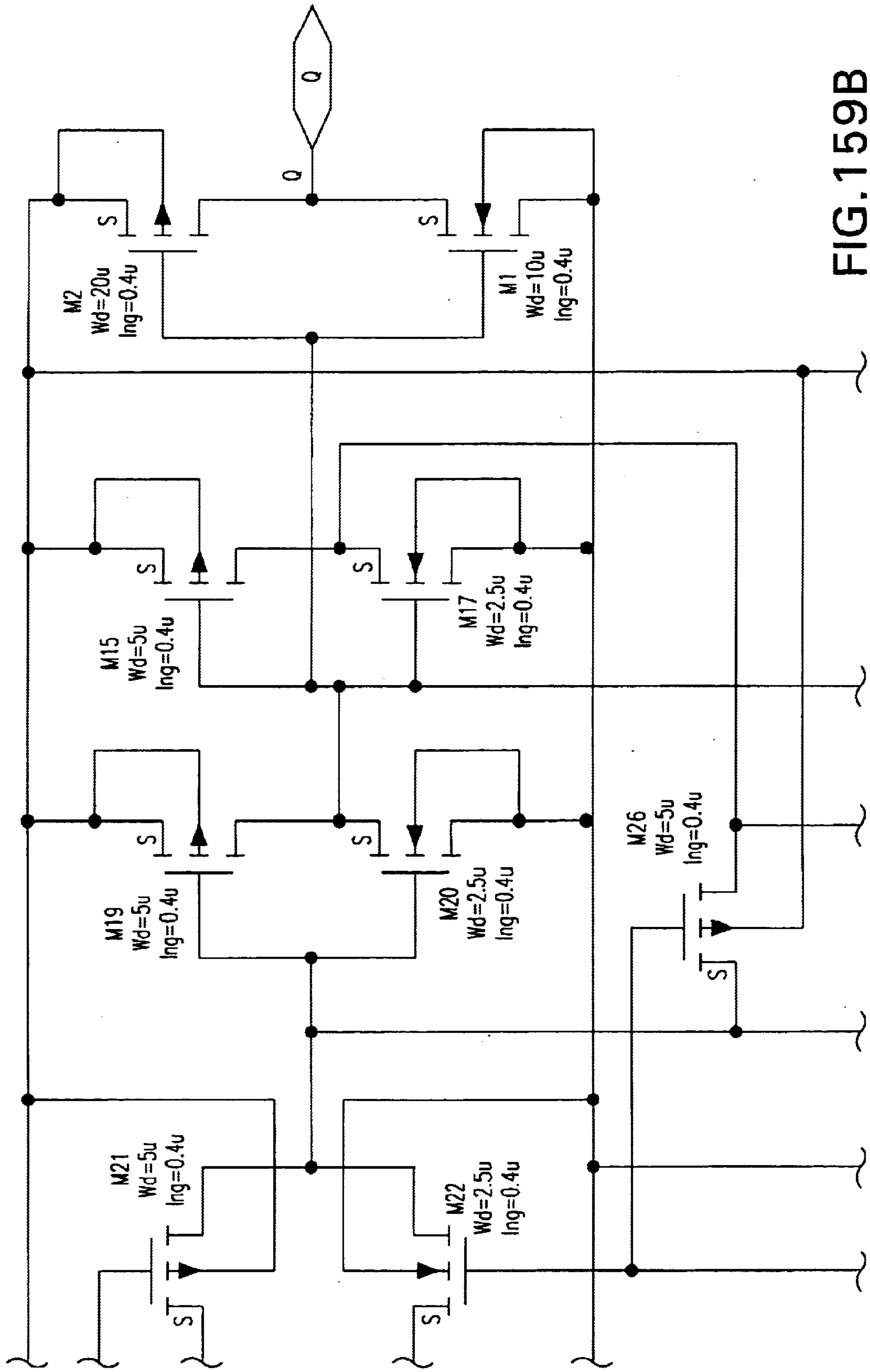
Figure 159C:
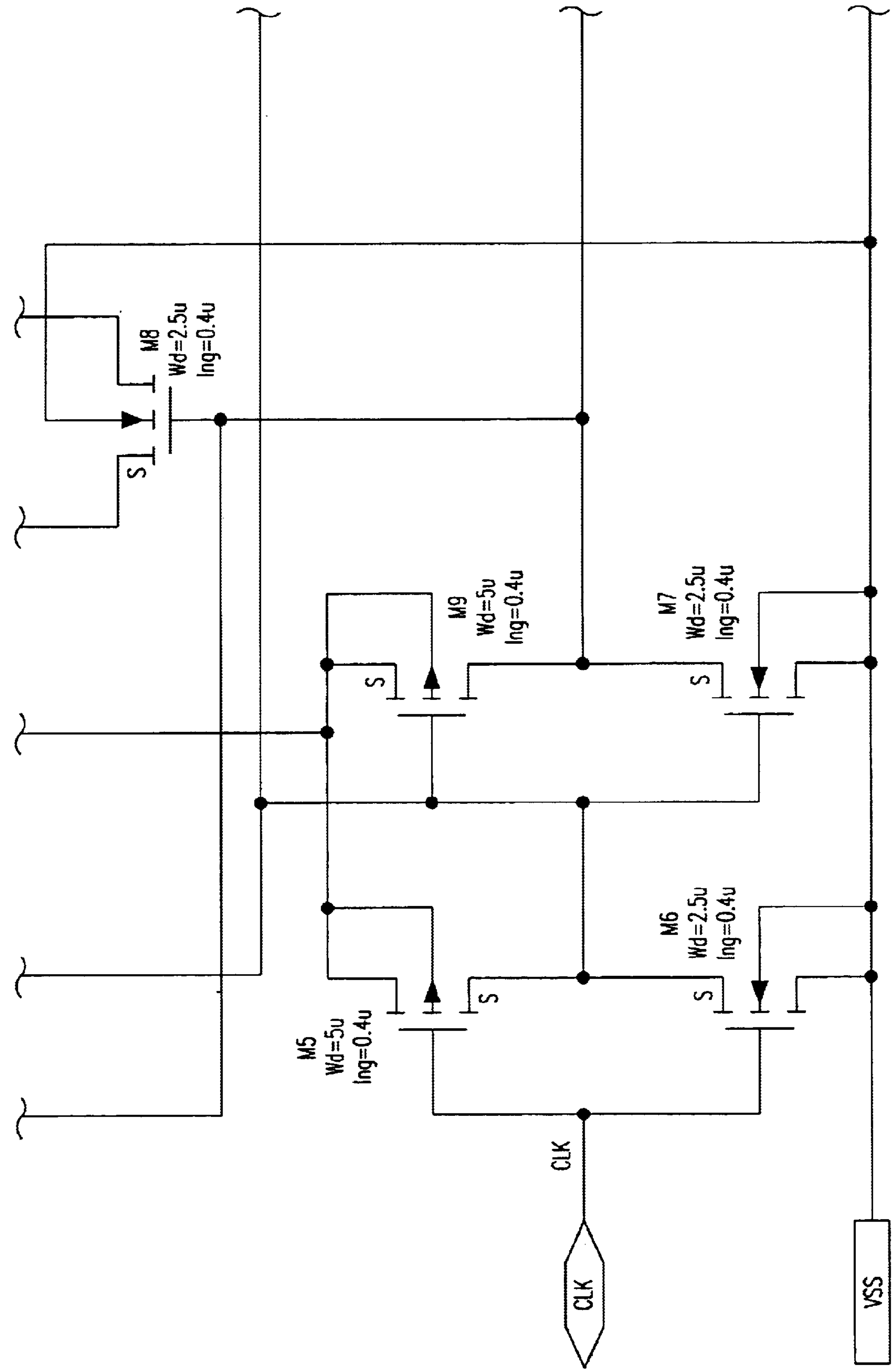
Figure 159D:
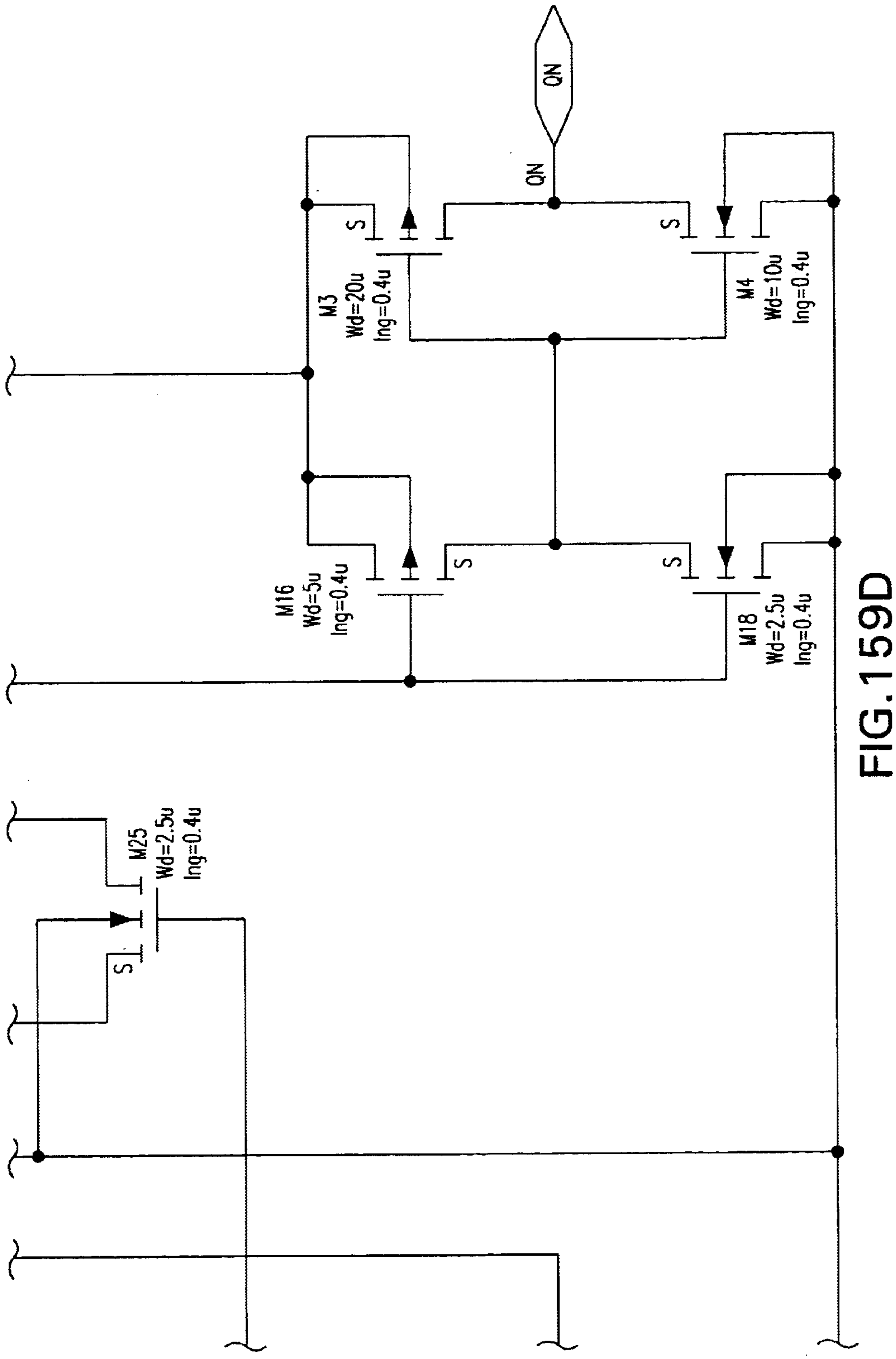
Figure 160A:
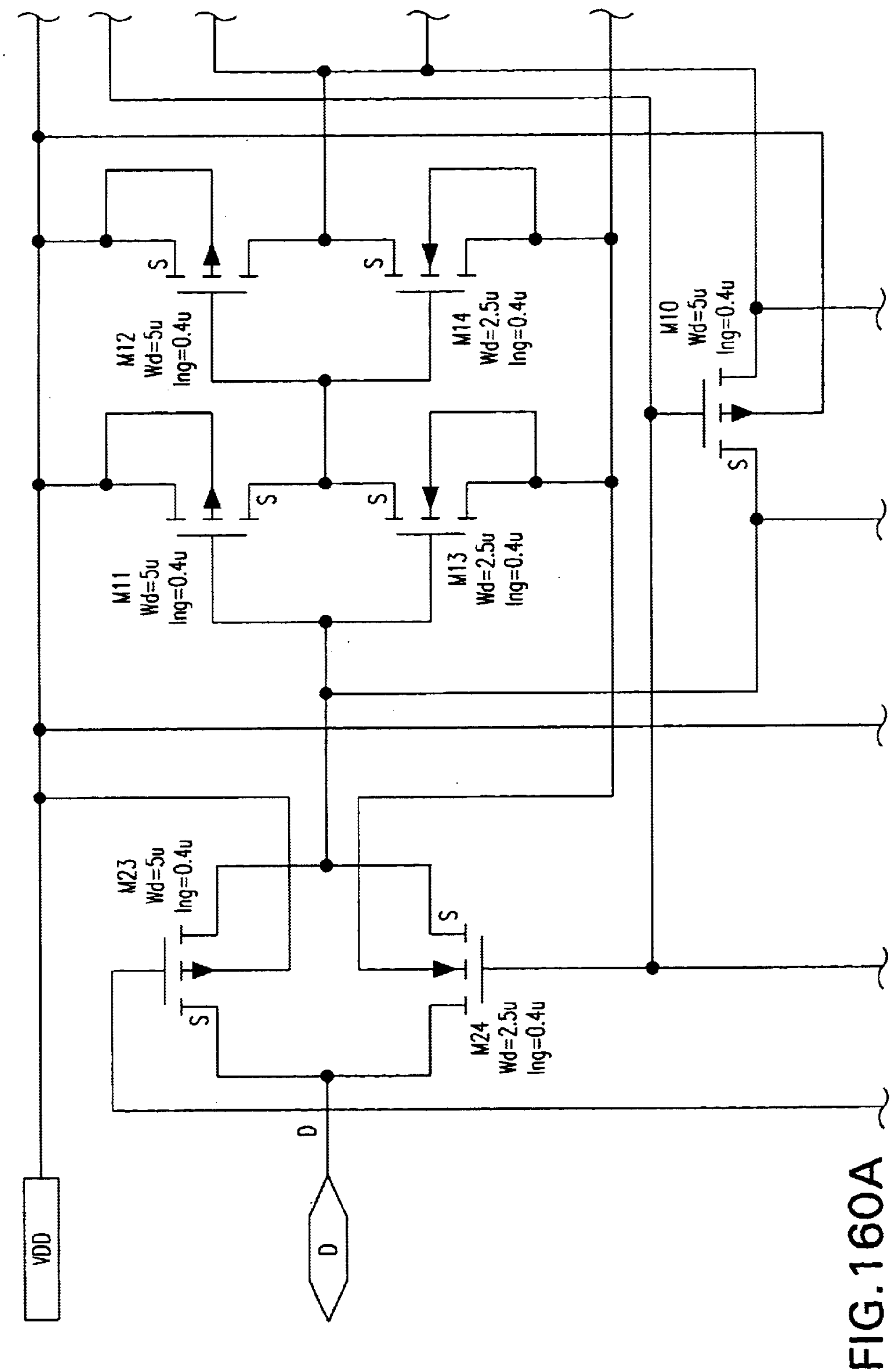
FIG. 160 includes FIGS. 160A–D and should be referred to for all references ti FIG. 160 in the specification.
Figure 160B:
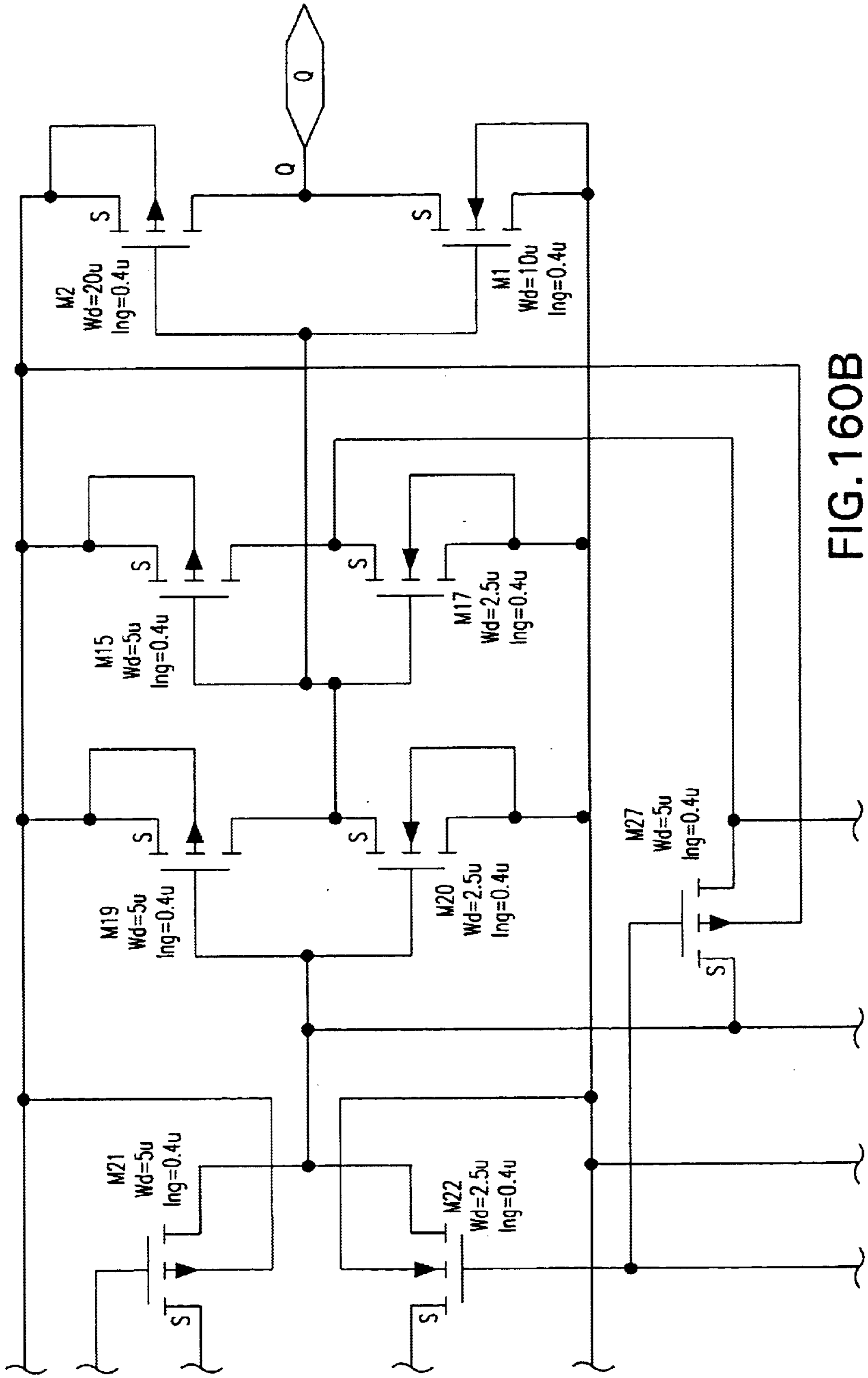
Figure 160C:
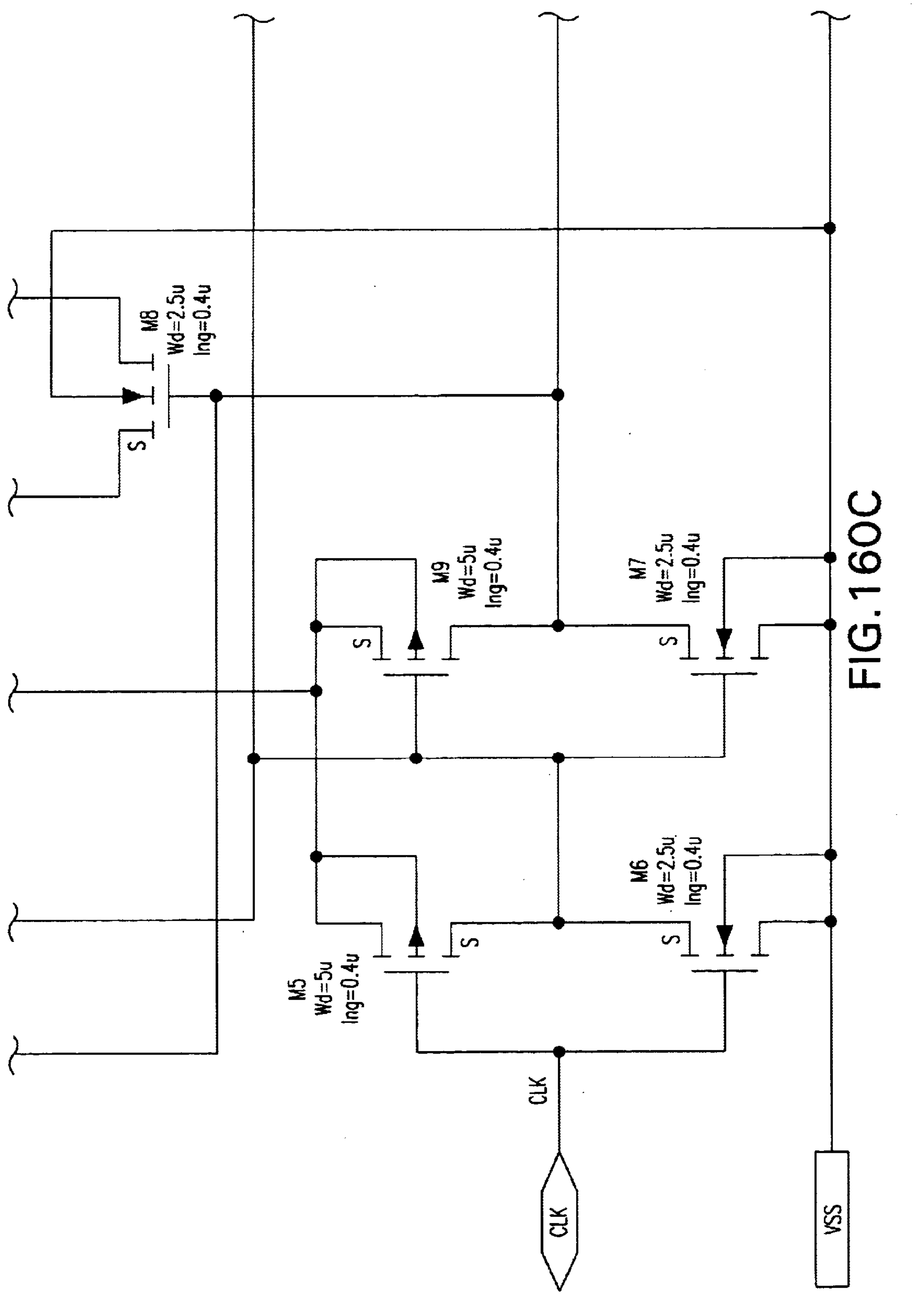
Figure 160D:
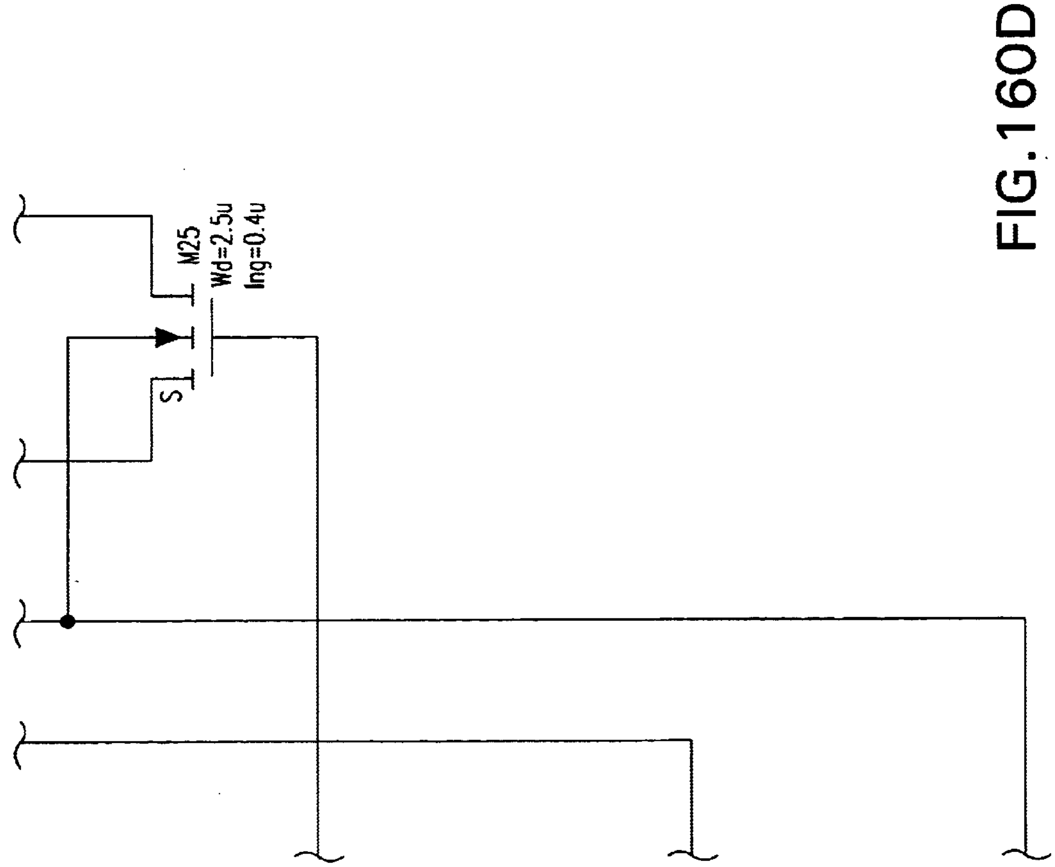

FIG. 102 illustrates an alternate example PCMCIA test bed assembly for a WLAN interface/modem 3902 according to an embodiment of the invention. In this embodiment, the baseband processor 10202 is separate from the MAC interface 3914.

Figure 43A:
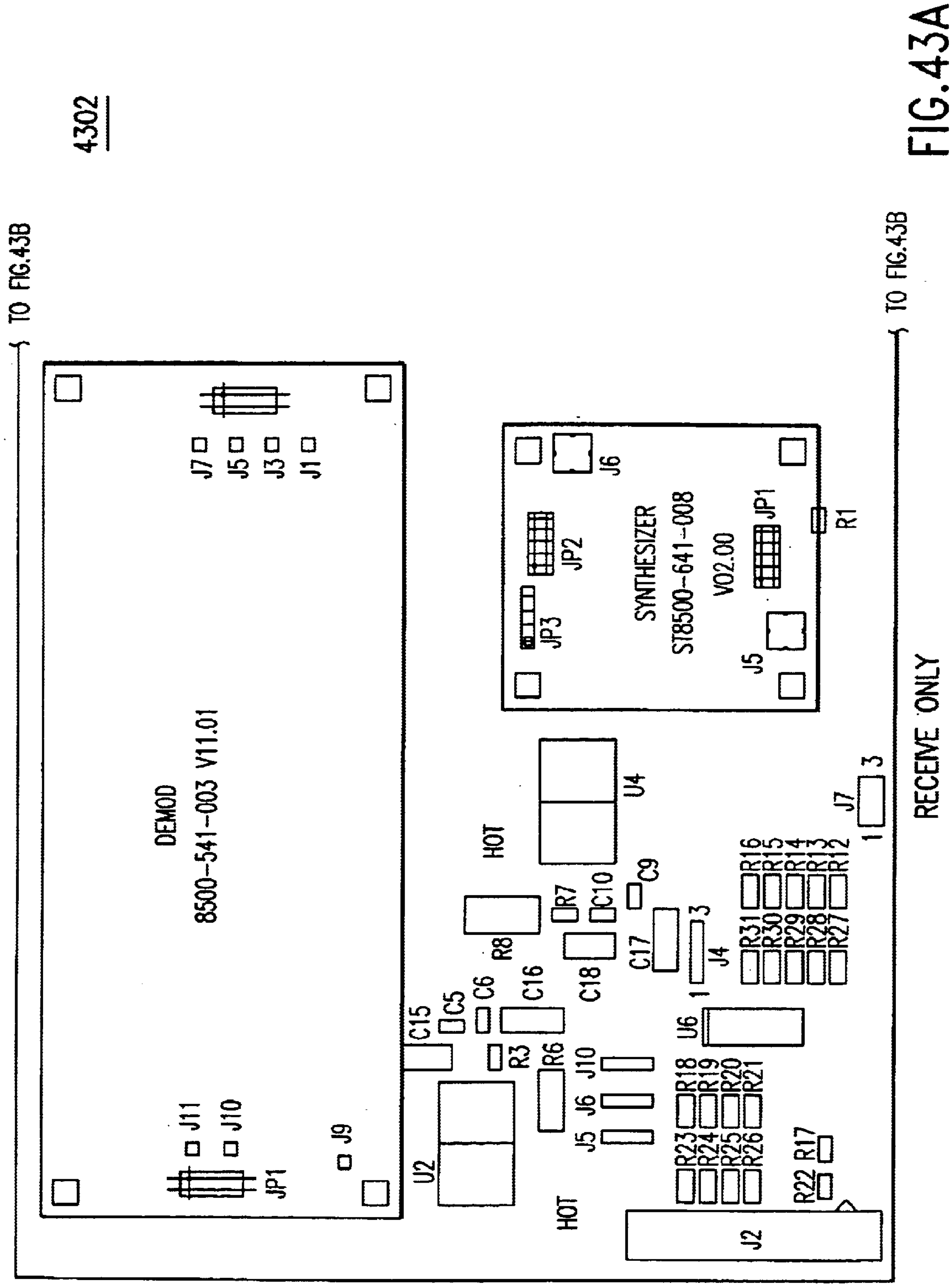
Figure 43B:
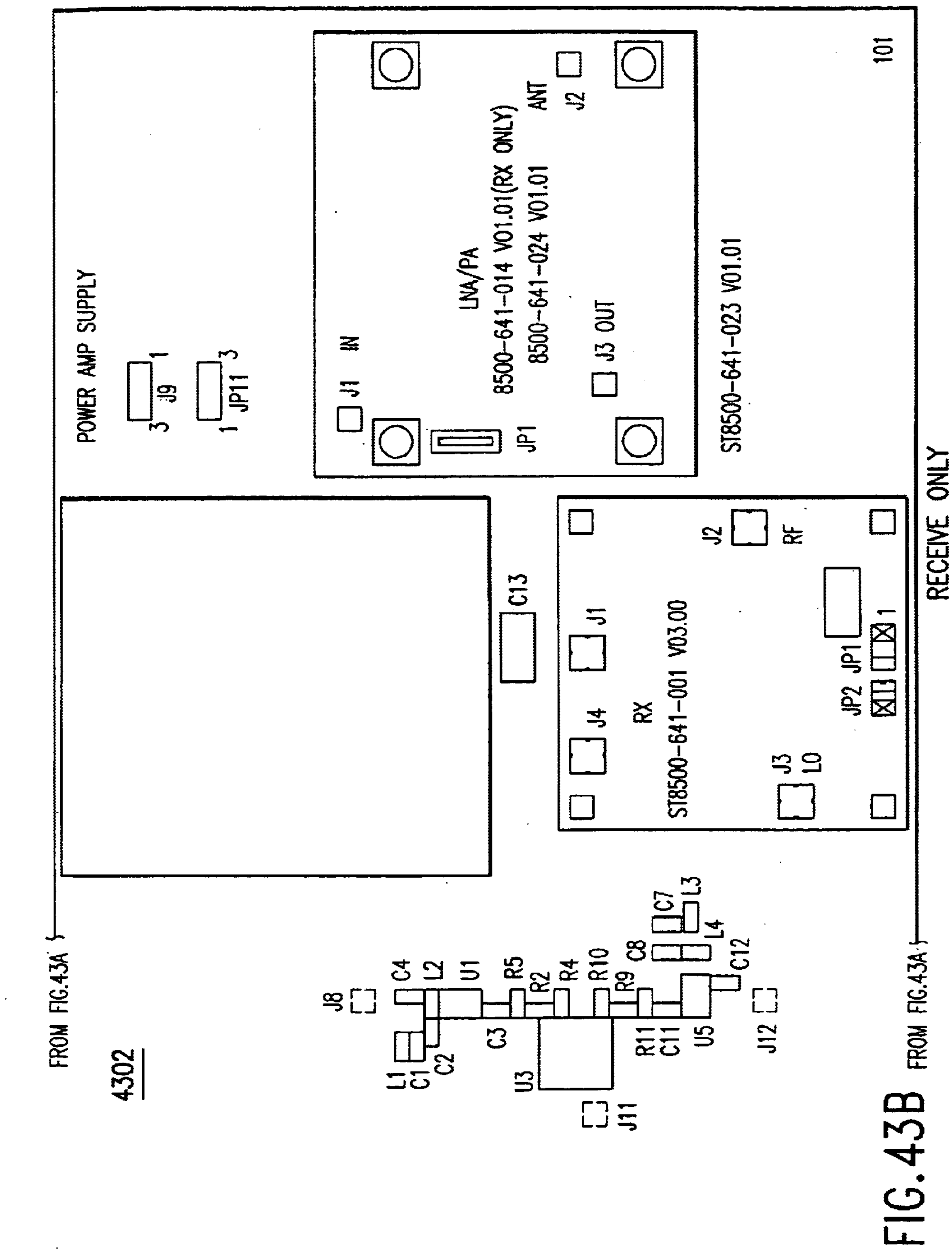
Figure 44A:
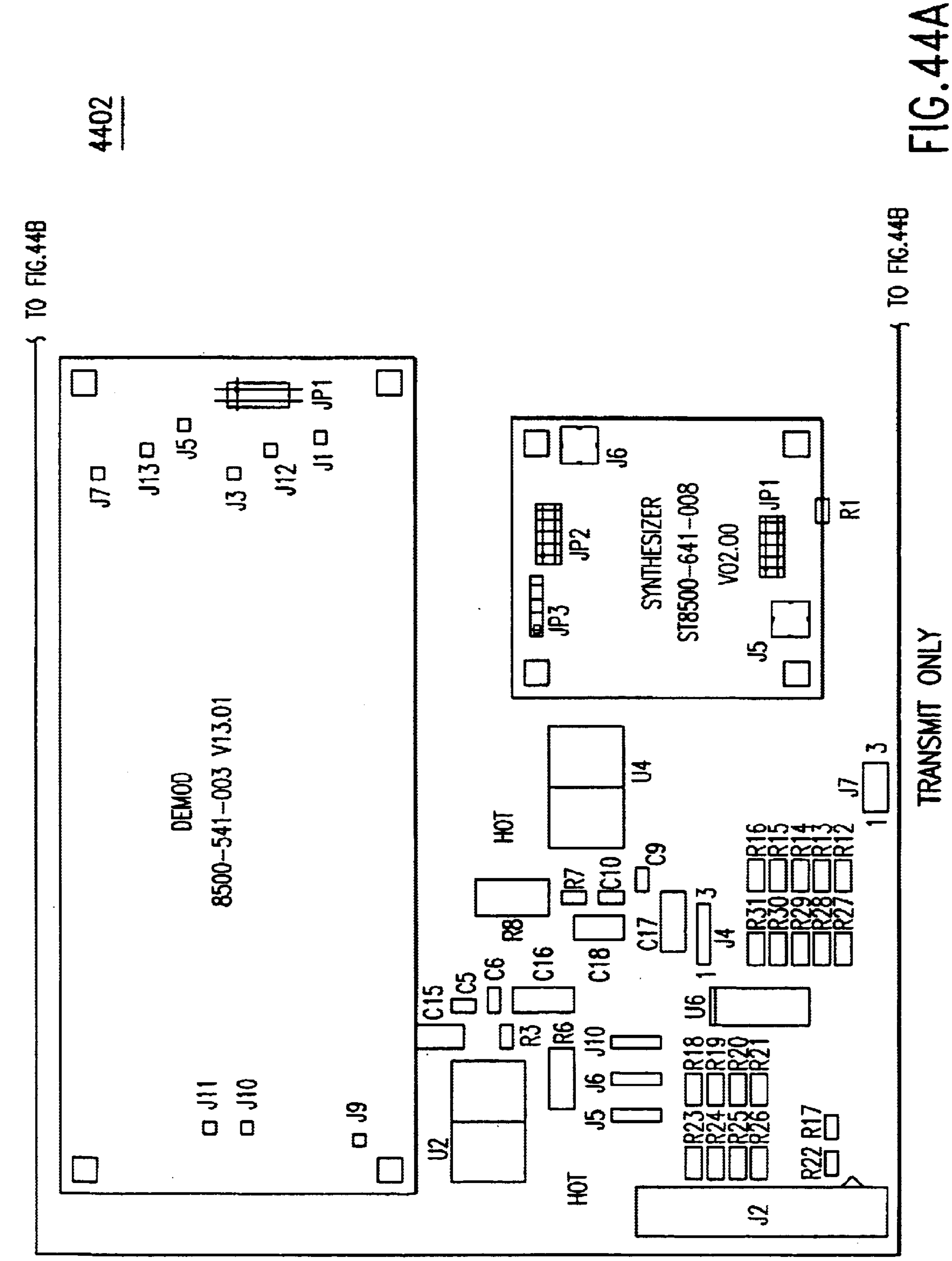
Figure 44B:
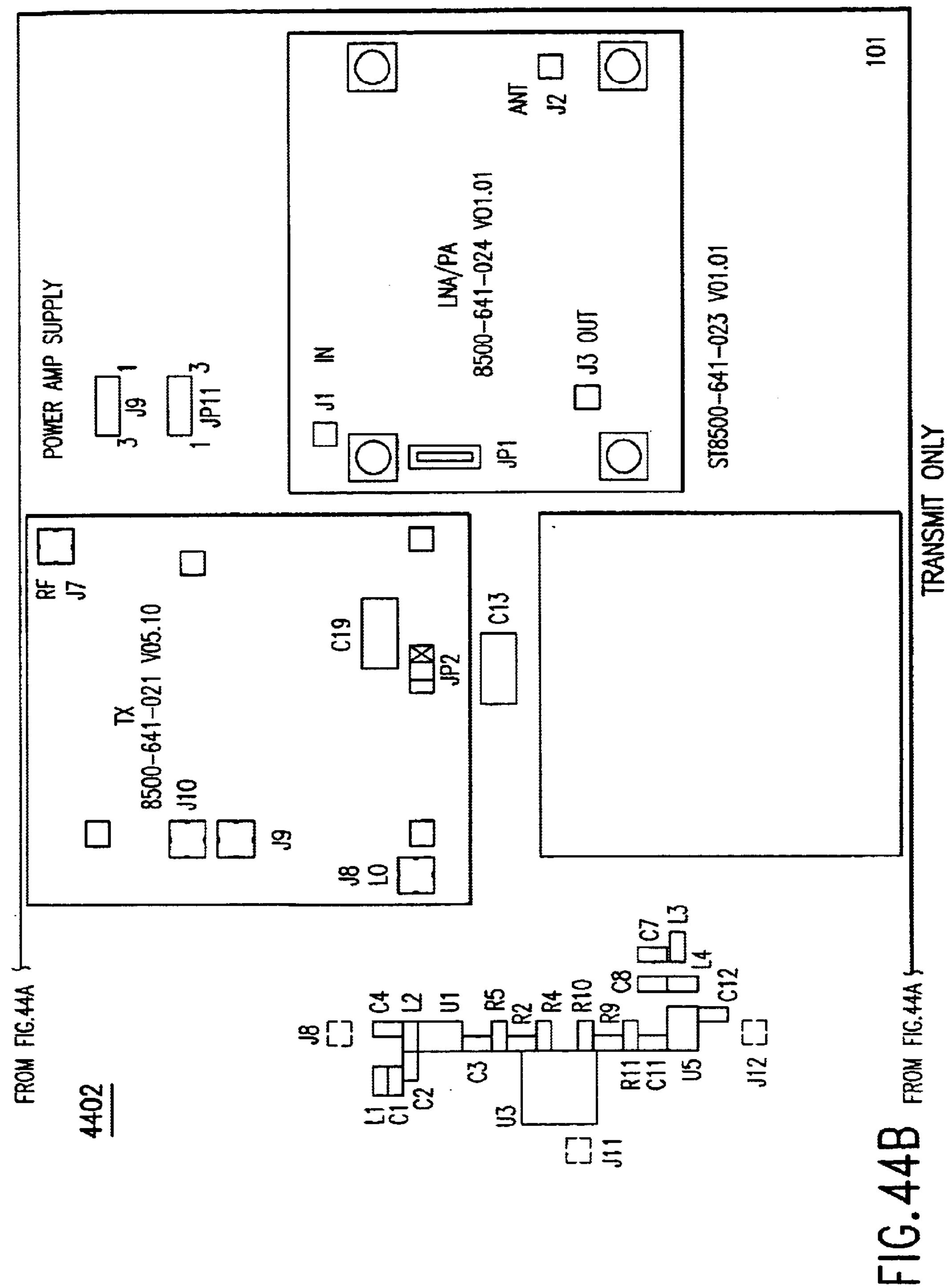

In some applications, it is desired to separate the receive path and the transmit path. FIG. 43 illustrates an example receive implementation, and FIG. 44 illustrates an example transmit implementation.

7.2 Receiver

Example embodiments and implementations of the IQ receiver 3906 will be discussed as follows. The example embodiments and implementations include multi-phase embodiments that are useful for reducing or eliminating unwanted DC offsets and circuit re-radiation. The invention is not limited to these example receiver embodiments. Other receiver embodiments will be understood by those skilled in the relevant arts based on the discussion given herein. These other embodiments are within the scope and spirit of the present invention.

7.2.1 IQ Receiver

Figure 67A:
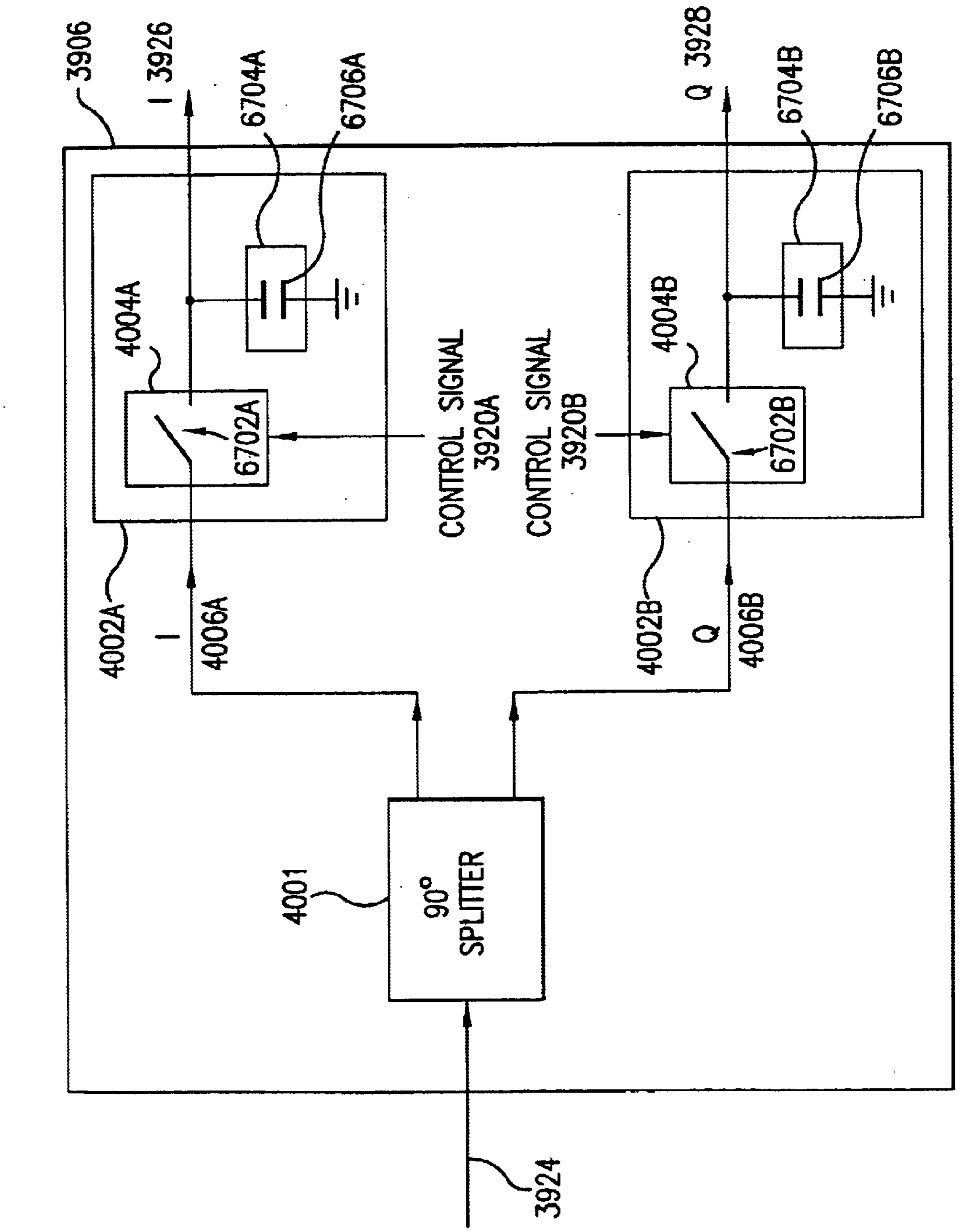
FIGS. 67A–B illustrate IQ receivers having UFT modules in a series and shunt configurations, according to embodiments of the invention.

An example embodiment of the receiver 3906 is shown in FIG. 67A. Referring to FIG. 67A, the UFD module 4002A (FIG. 40) is configured so that the UFT module 4004A is coupled to a storage module 6704A. The UFT module 4004A is a controlled switch 6702A that is controlled by the control signal 3920A. The storage module 6704A is a capacitor 6706A. However, other storage modules could be used including, an inductor, as will be understood by those skilled in the relevant arts. Likewise, the UFD module 4002B (FIG. 40) is configured so that the UFT module 4004B is coupled to a storage module 6704B. The UFT module 4004B is a controlled switch 6702B that is controlled by the control signal 3920B. The storage module 6704B is a capacitor 6706B. However, other storage modules could be used including an inductor, as will be understood by those skilled in the relevant arts. The operation of the receiver 3906 is discussed as follows.

The 90 degree splitter 4001 receives the received signal 3924 from the LNA/PA module 3904. The 90 degree splitter 4001 divides the signal 3924 into an I signal 4006A and a Q signal 4006B.

The UFD module 4002A receives the I signal 4006A and down-converts the I signal 4006A using the control signal 3920A to a lower frequency signal I 3926. More specifically, the controlled switch 6702A samples the I signal 4006A according to the control signal 3920A, transferring charge (or energy) to the storage module 6704A. The charge stored during successive samples of the I signal 4006A, results in the down-converted signal I signal 3926. Likewise, UFD module 4002B receives the Q signal 4006B and down-converts the Q signal 4006B using the control signal 3920B to a lower frequency signal Q 3928. More specifically, the controlled switch 6702B samples the Q signal 4006B according to the control signal 3920B, resulting in charge (or energy) that is stored in the storage module 6704B. The charge stored during successive samples of the I signal 4006A, results in the down-converted signal Q signal 3928.

Down-conversion utilizing a UFD module (also called an aliasing module) is further described in the above referenced applications, such as "Method and System for Down-converting Electromagnetic Signals," Ser. No. 09/176,022, now U.S. Pat. No. 6,061,551. As discussed in the '551 patent, the control signals 3920A, B can be configured as a plurality of pulses that are established to improve energy transfer from the signals 4006A, B to the down-converted signals 3926 and 3928, respectively. In other words, the pulse widths of the control signals 3920 can be adjusted to increase and/or optimize the energy transfer from the signals 4006 to the down-converted output signals 3926 and 3938, respectively. Additionally, matched filter principles can be implemented to shape the sampling pulses of the control signal 3920, and therefore further improve energy transfer to the down-converted output signal 3106. Matched filter principle and energy transfer are further described in the above referenced applications, such as U.S. patent application titled, "Method and System for Down-Converting an Electromagnetic Signal, Transforms For Same, and Aperture Relationships", Ser. No. 09/550,644, filed on Apr. 14, 2000.

The configuration of the UFT based receiver 3906 is flexible. In FIG. 67A, the controlled switches 6702 are in a series configuration relative to the signals 4006. Alternatively, FIG. 67B illustrates the controlled switches 6702 in a shunt configuration so that the switches 6702 shunt the signals 4006 to ground.

Figure 67B:
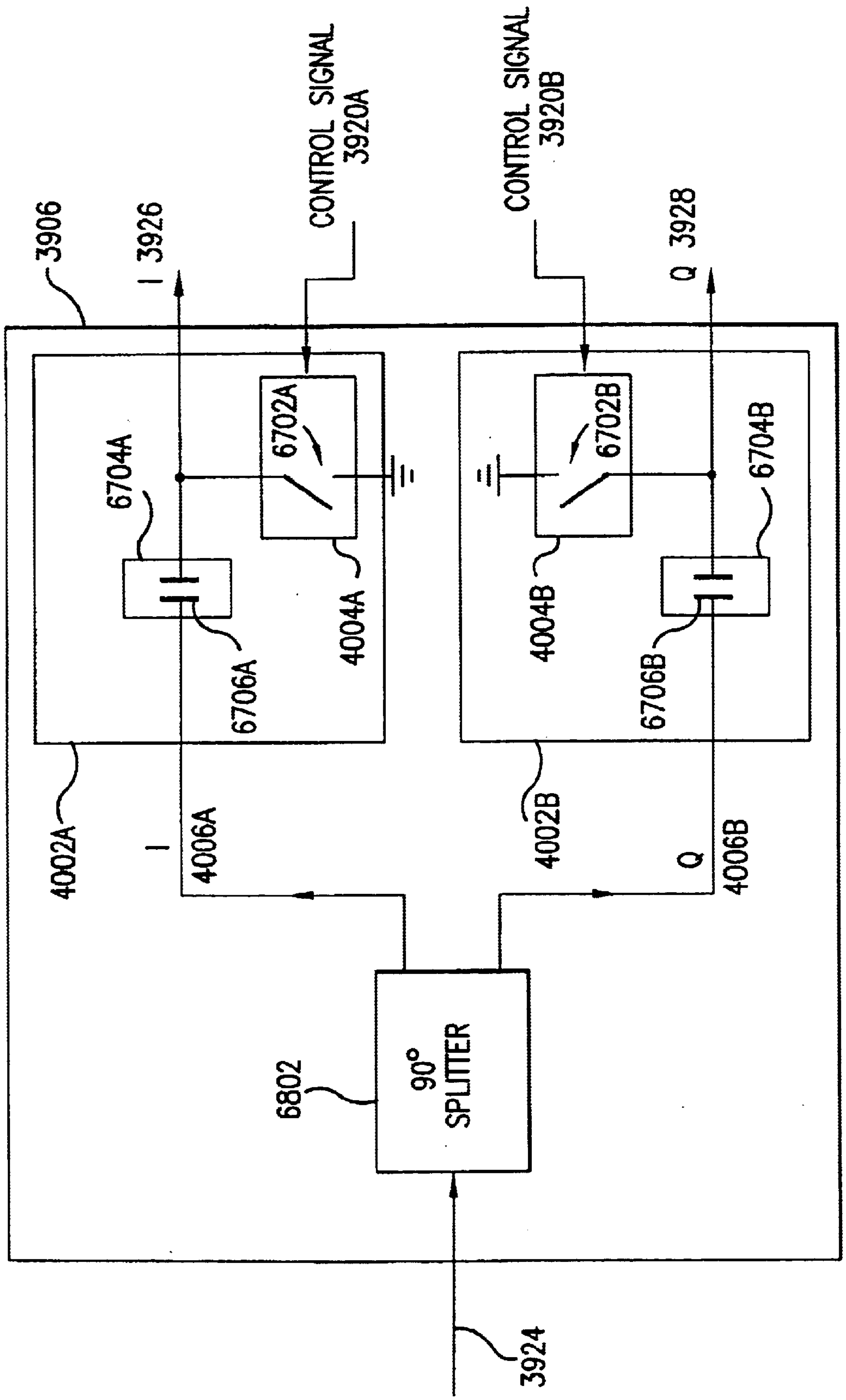
Figure 68A:
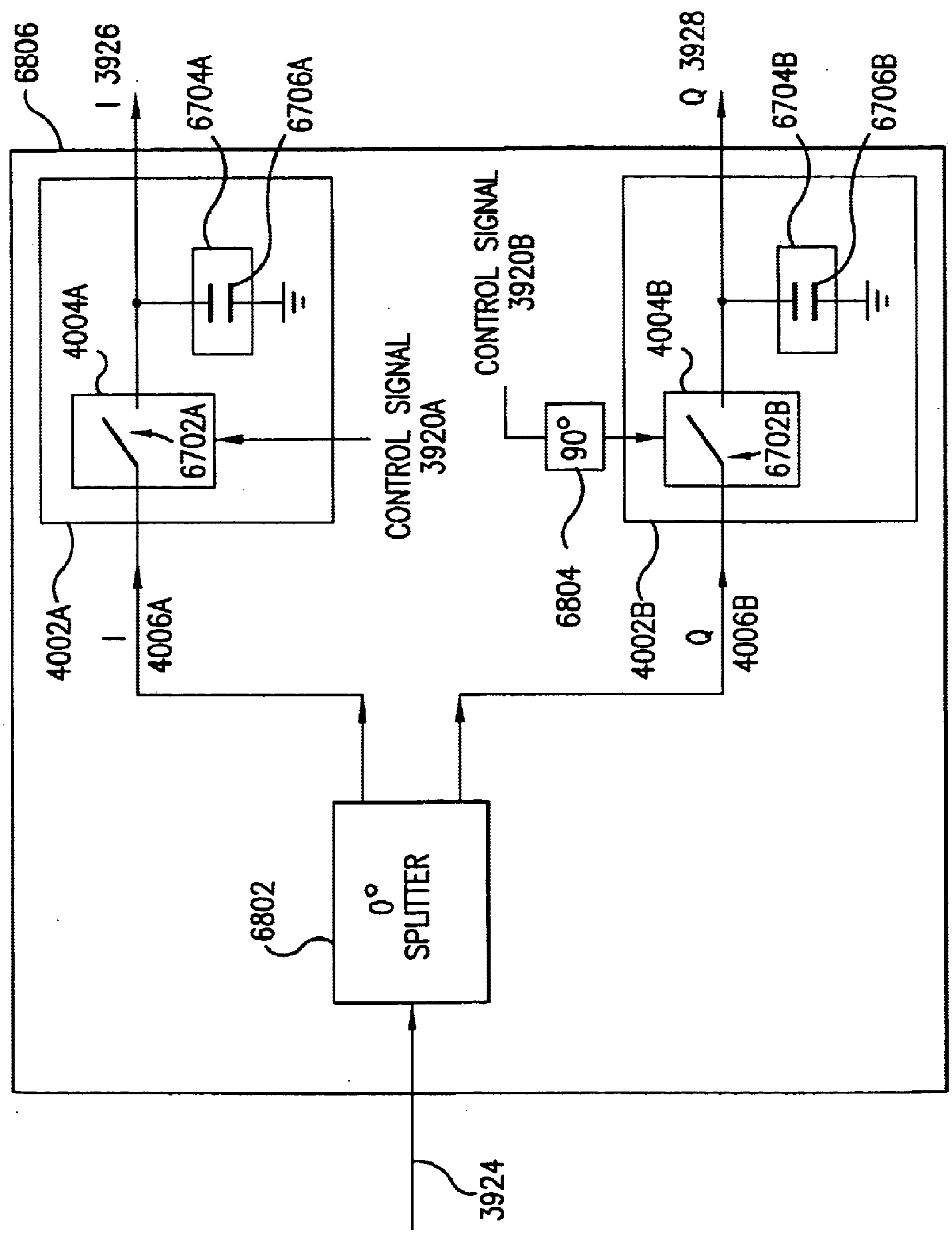
FIGS. 68A–B illustrate IQ receivers having UFT modules with delayed control signals for quadrature implementation, according to embodiments of the present invention.
Figure 68B:
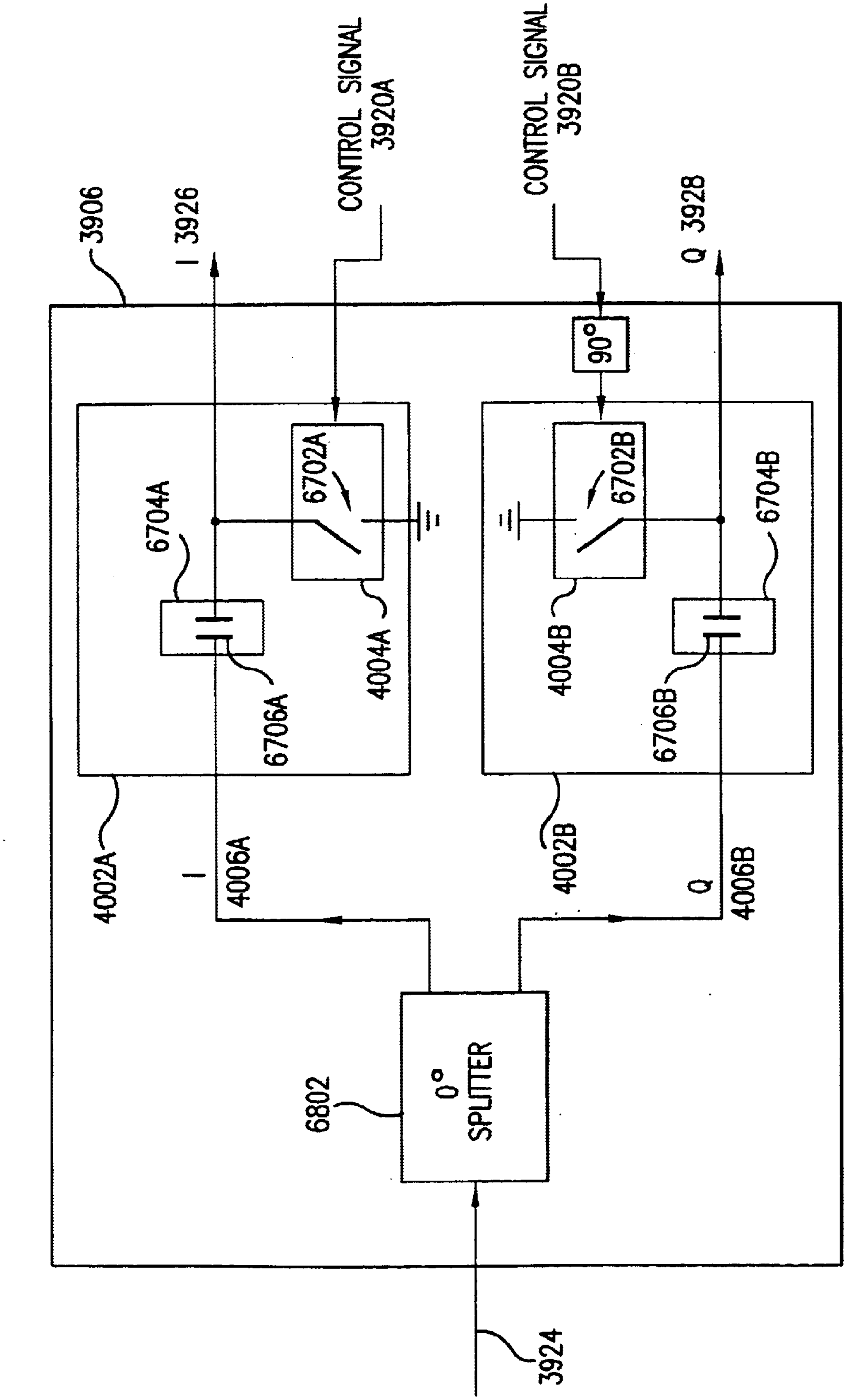

Additionally in FIGS. 67A–B, the 90 degree phase shift between the I and Q channels is realized with the 90 degree splitter 4001. Alternatively, FIG. 68A illustrates a receiver 6806 in series configuration, where the 90 degree phase shift is realized by shifting the control signal 3920B by 90 degrees relative to the control signal 3920A. More specifically, the 90 degree shifter 6804 is added to shift the control signal 3920B by 90 degrees relative to the control signal 3920A. As such, the splitter 6802 is an in-phase (i.e. 0 degree) signal splitter. FIG. 68B illustrates an embodiment of the receiver 3906 of the receiver 3906 in a shunt configuration with 90 degree delays on the control signal.

Figure 69A:
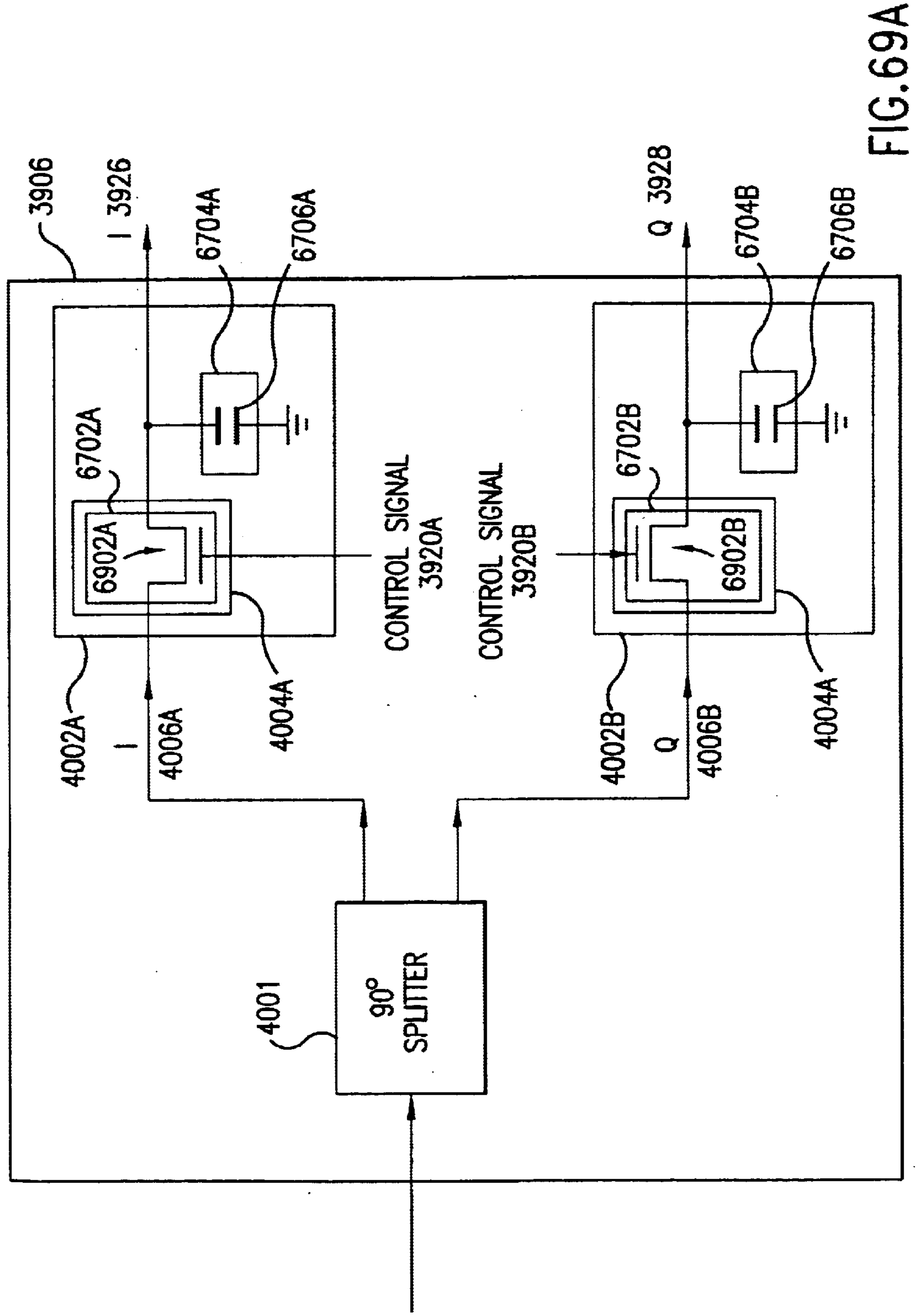
FIGS. 69A–B illustrate IQ receivers having FET implementations, according to embodiments of the invention.
Figure 69B:
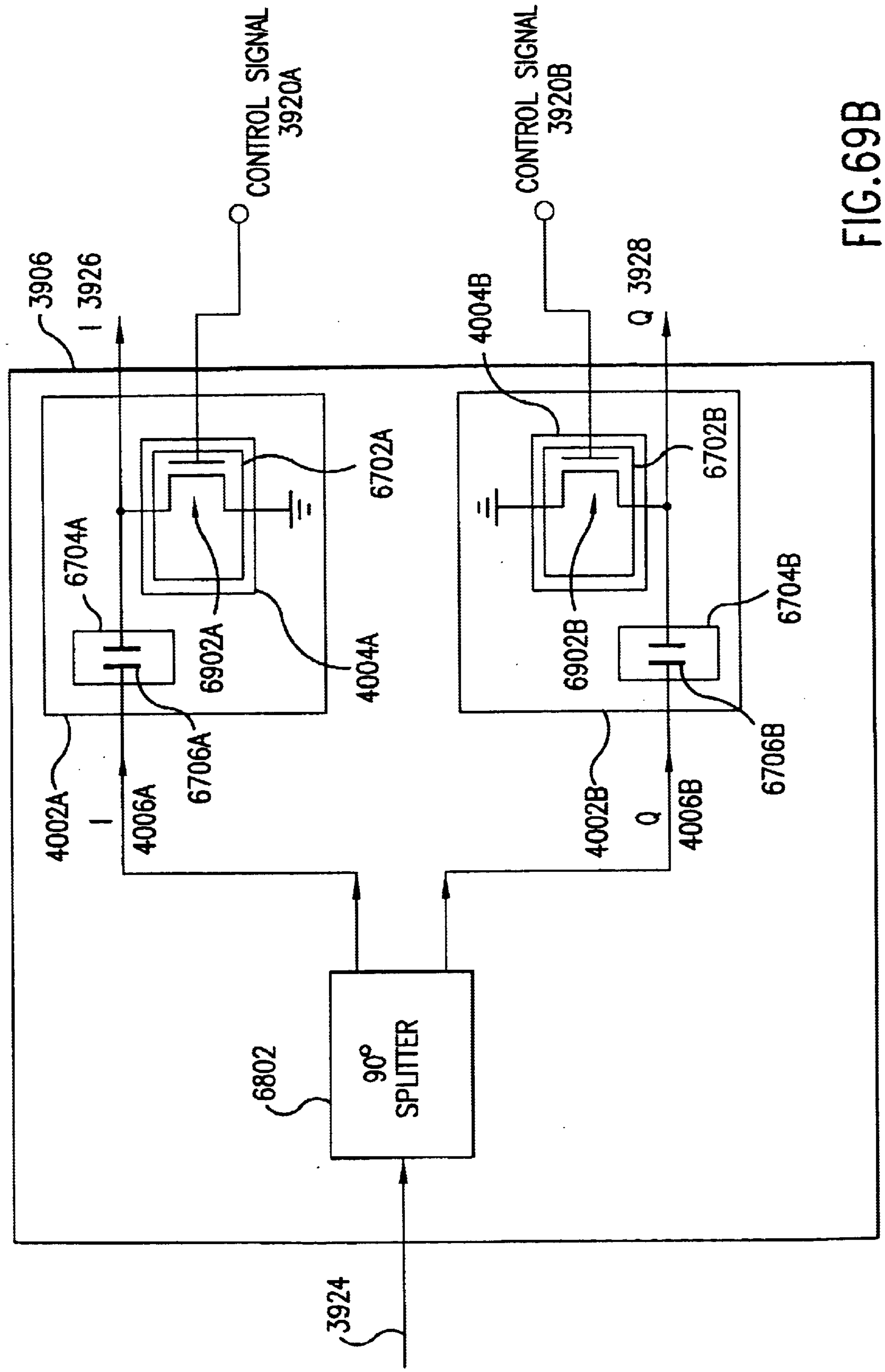

Furthermore, the configuration of the controlled switch 6702 is also flexible. More specifically, the controlled switches 6702 can be implemented in many different ways, including transistor switches. FIG. 69A illustrates the UFT modules 6702 in a series configuration and implemented as FETs 6902, where the gate of each FET 6902 is controlled by the respective control signal 3920. As such, the FET 6902 samples the respective signal 4006, according to the respective control signal 3920. FIG. 69B illustrates the shunt configuration.

7.2.2 Multi-Phase IQ Receiver

Figure 70A:
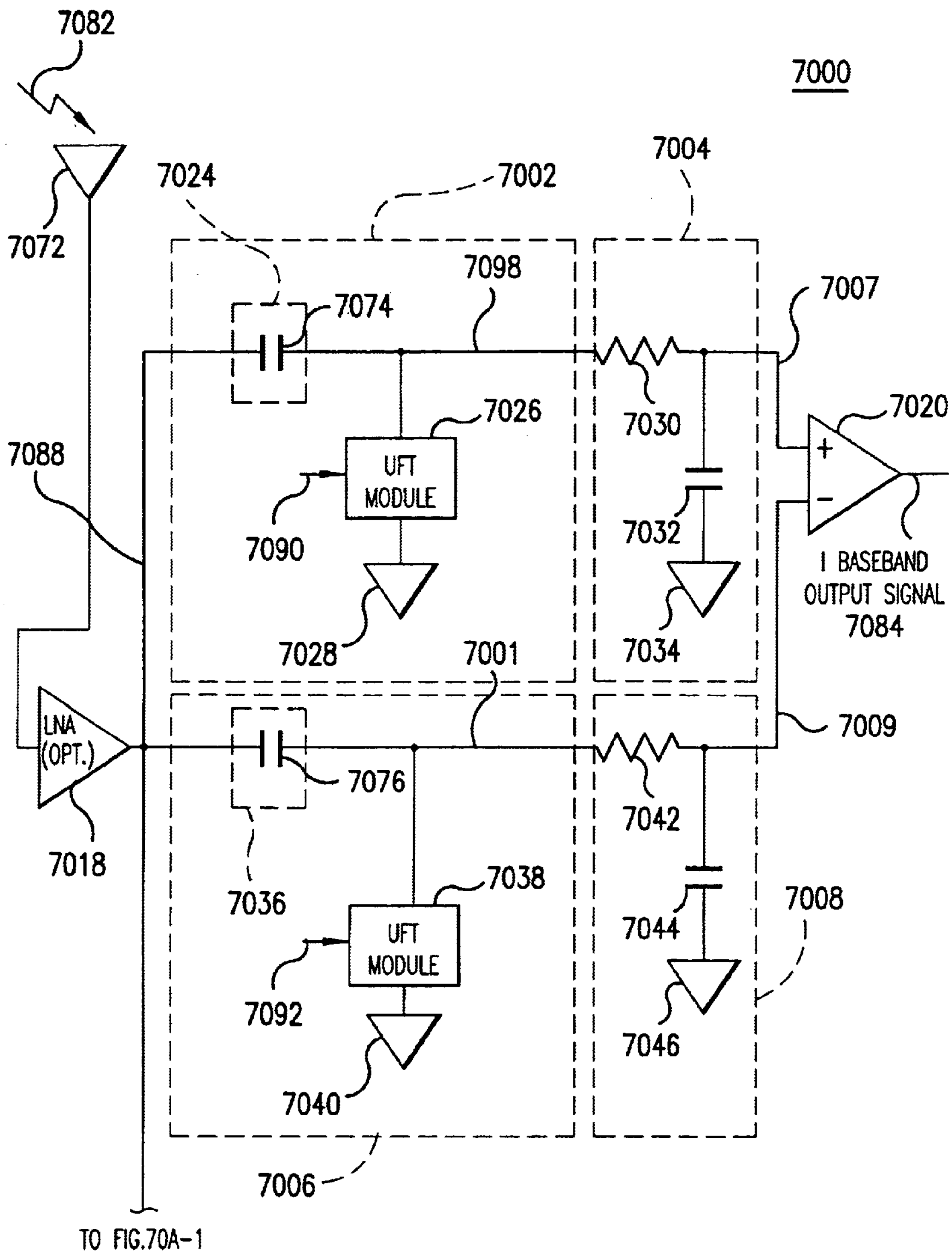
FIG. 70A illustrates an IQ receiver having shunt UFT modules according to embodiments of the invention.
Figures 1, 70A:
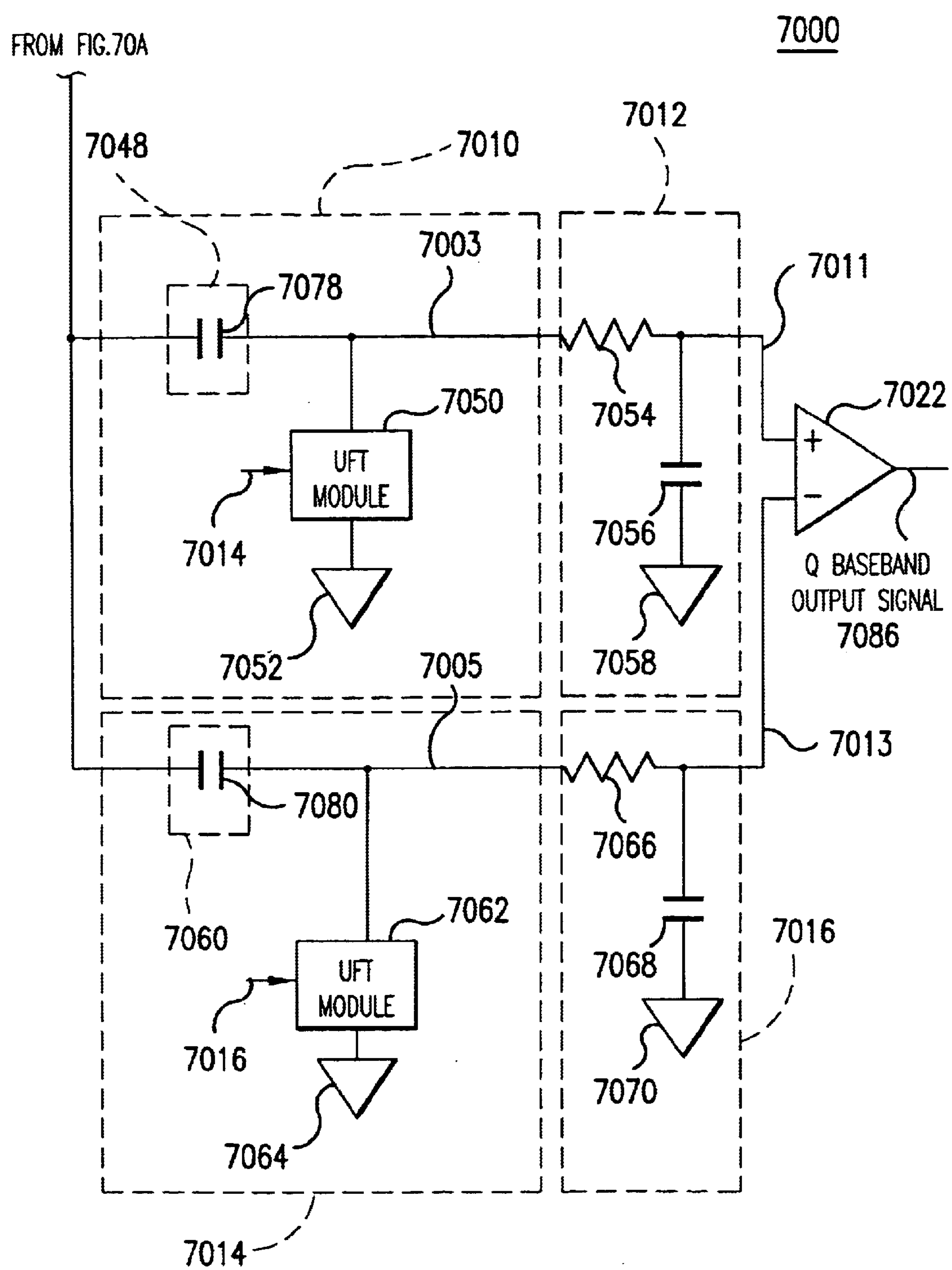

FIG. 70A illustrates an exemplary I/Q modulation receiver 7000, according to an embodiment of the present invention. I/Q modulation receiver 7000 has additional advantages of reducing or eliminating unwanted DC offsets and circuit re-radiation. As will be apparent, the IQ receiver 7000 can be described as a multi-phase receiver to those skilled in the arts.

I/Q modulation receiver 7000 comprises a first UFD module 7002, a first optional filter 7004, a second UFD module 7006, a second optional filter 7008, a third UFD module 7010, a third optional filter 7012, a fourth UFD module 7014, a fourth filter 7016, an optional LNA 7018, a first differential amplifier 7020, a second differential amplifier 7022, and an antenna 7072.

I/Q modulation receiver 7000 receives, down-converts, and demodulates a I/Q modulated RF input signal 7082 to an I baseband output signal 7084, and a Q baseband output signal 7086. I/Q modulated RF input signal 7082 comprises a first information signal and a second information signal that are I/Q modulated onto an RF carrier signal. I baseband output signal 7084 comprises the first baseband information signal. Q baseband output signal 7086 comprises the second baseband information signal.

Antenna 7072 receives I/Q modulated RF input signal 7082. I/Q modulated RF input signal 7082 is output by antenna 7072 and received by optional LNA 7018. When present, LNA 7018 amplifies I/Q modulated RF input signal 7082, and outputs amplified I/Q signal 7088.

First UFD module 7002 receives amplified I/Q signal 7088. First UFD module 7002 down-converts the I-phase signal portion of amplified input I/Q signal 7088 according to an I control signal 7090. First UFD module 7002 outputs an I output signal 7098.

In an embodiment, first UFD module 7002 comprises a first storage module 7024, a first UFT module 7026, and a first voltage reference 7028. In an embodiment, a switch contained within first UFT module 7026 opens and closes as a function of I control signal 7090. As a result of the opening and closing of this switch, which respectively couples and de-couples first storage module 7024 to and from first voltage reference 7028, a down-converted signal, referred to as I output signal 7098, results. First voltage reference 7028 may be any reference voltage, and is preferably ground. I output signal 7098 is stored by first storage module 7024.

In an embodiment, first storage module 7024 comprises a first capacitor 7074. In addition to storing I output signal 7098, first capacitor 7074 reduces or prevents a DC offset voltage resulting from charge injection from appearing on I output signal 7098.

I output signal 7098 is received by optional first filter 7004. When present, first filter 7004 is in some embodiments a high pass filter to at least filter I output signal 7098 to remove any carrier signal "bleed through". In a preferred embodiment, when present, first filter 7004 comprises a first resistor 7030, a first filter capacitor 7032, and a first filter voltage reference 7034. Preferably, first resistor 7030 is coupled between I output signal 7098 and a filtered I output signal 7007, and first filter capacitor 7032 is coupled between filtered I output signal 7007 and first filter voltage reference 7034. Alternately, first filter 7004 may comprise any other applicable filter configuration as would be understood by persons skilled in the relevant art(s). First filter 7004 outputs filtered I output signal 7007.

Second UFD module 7006 receives amplified I/Q signal 7088. Second UFD module 7006 down-converts the inverted I-phase signal portion of amplified input I/Q signal 7088 according to an inverted I control signal 7092. Second UFD module 7006 outputs an inverted I output signal 7001.

In an embodiment, second UFD module 7006 comprises a second storage module 7036, a second UFT module 7038, and a second voltage reference 7040. In an embodiment, a switch contained within second UFT module 7038 opens and closes as a function of inverted I control signal 7092. As a result of the opening and closing of this switch, which respectively couples and de-couples second storage module 7036 to and from second voltage reference 7040, a down-converted signal, referred to as inverted I output signal 7001, results. Second voltage reference 7040 may be any reference voltage, and is preferably ground. Inverted I output signal 7001 is stored by second storage module 7036.

In an embodiment, second storage module 7036 comprises a second capacitor 7076. In addition to storing inverted I output signal 7001, second capacitor 7076 reduces or prevents a DC offset voltage resulting from charge injection from appearing on inverted I output signal 7001.

Inverted I output signal 7001 is received by optional second filter 7008. When present, second filter 7008 is a high pass filter to at least filter inverted I output signal 7001 to remove any carrier signal "bleed through". In a preferred embodiment, when present, second filter 7008 comprises a second resistor 7042, a second filter capacitor 7044, and a second filter voltage reference 7046. Preferably, second resistor 7042 is coupled between inverted I output signal 7001 and a filtered inverted I output signal 7009, and second filter capacitor 7044 is coupled between filtered inverted I output signal 7009 and second filter voltage reference 7046. Alternately, second filter 7008 may comprise any other applicable filter configuration as would be understood by persons skilled in the relevant art(s). Second filter 7008 outputs filtered inverted I output signal 7009.

First differential amplifier 7020 receives filtered I output signal 7007 at its non-inverting input and receives filtered inverted I output signal 7009 at its inverting input. First differential amplifier 7020 subtracts filtered inverted I output signal 7009 from filtered I output signal 7007, amplifies the result, and outputs I baseband output signal 7084. Because filtered inverted I output signal 7009 is substantially equal to an inverted version of filtered I output signal 7007, I baseband output signal 7084 is substantially equal to filtered I output signal 7009, with its amplitude doubled. Furthermore, filtered I output signal 7007 and filtered inverted I output signal 7009 may comprise substantially equal noise and DC offset contributions from prior down-conversion circuitry, including first UFD module 7002 and second UFD module 7006, respectively. When first differential amplifier 7020 subtracts filtered inverted I output signal 7009 from filtered I output signal 7007, these noise and DC offset contributions substantially cancel each other.

Third UFD module 7010 receives amplified I/Q signal 7088. Third UFD module 7010 down-converts the Q-phase signal portion of amplified input I/Q signal 7088 according to an Q control signal 7094. Third UFD module 7010 outputs an Q output signal 7003.

In an embodiment, third UFD module 7010 comprises a third storage module 7048, a third UFT module 7050, and a third voltage reference 7052. In an embodiment, a switch contained within third UFT module 7050 opens and closes as a function of Q control signal 7094. As a result of the opening and closing of this switch, which respectively couples and de-couples third storage module 7048 to and from third voltage reference 7052, a down-converted signal, referred to as Q output signal 7003, results. Third voltage reference 7052 may be any reference voltage, and is preferably ground. Q output signal 7003 is stored by third storage module 7048.

In an embodiment, third storage module 7048 comprises a third capacitor 7078. In addition to storing Q output signal 7003, third capacitor 7078 reduces or prevents a DC offset voltage resulting from charge injection from appearing on Q output signal 7003.

Q output signal 7003 is received by optional third filter 7012. When present, in an embodiment, third filter 7012 is a high pass filter to at least filter Q output signal 7003 to remove any carrier signal "bleed through". In an embodiment, when present, third filter 7012 comprises a third resistor 7054, a third filter capacitor 7056, and a third filter voltage reference 7058. Preferably, third resistor 7054 is coupled between Q output signal 7003 and a filtered Q output signal 7011, and third filter capacitor 7056 is coupled between filtered Q output signal 7011 and third filter voltage reference 7058. Alternately, third filter 7012 may comprise any other applicable filter configuration as would be understood by persons skilled in the relevant art(s). Third filter 7012 outputs filtered Q output signal 7011.

Fourth UFD module 7014 receives amplified I/Q signal 7088. Fourth UFD module 7014 down-converts the inverted Q-phase signal portion of amplified input I/Q signal 7088 according to an inverted Q control signal 7096. Fourth UFD module 7014 outputs an inverted Q output signal 7005.

In an embodiment, fourth UFD module 7014 comprises a fourth storage module 7060, a fourth UFT module 7062, and a fourth voltage reference 7064. In an embodiment, a switch contained within fourth UFT module 7062 opens and closes as a function of inverted Q control signal 7096. As a result of the opening and closing of this switch, which respectively couples and de-couples fourth storage module 7060 to and from fourth voltage reference 7064, a down-converted signal, referred to as inverted Q output signal 7005, results. Fourth voltage reference 7064 may be any reference voltage, and is preferably ground. Inverted Q output signal 7005 is stored by fourth storage module 7060.

In an embodiment, fourth storage module 7060 comprises a fourth capacitor 7080. In addition to storing inverted Q output signal 7005, fourth capacitor 7080 reduces or prevents a DC offset voltage resulting from charge injection from appearing on inverted Q output signal 7005.

Inverted Q output signal 7005 is received by optional fourth filter 7016. When present, fourth filter 7016 is a high pass filter to at least filter inverted Q output signal 7005 to remove any carrier signal "bleed through". In a preferred embodiment, when present, fourth filter 7016 comprises a fourth resistor 7066, a fourth filter capacitor 7068, and a fourth filter voltage reference 7070. Preferably, fourth resistor 7066 is coupled between inverted Q output signal 7005 and a filtered inverted Q output signal 7013, and fourth filter capacitor 7068 is coupled between filtered inverted Q output signal 7013 and fourth filter voltage reference 7070. Alternately, fourth filter 7016 may comprise any other applicable filter configuration as would be understood by persons skilled in the relevant art(s). Fourth filter 7016 outputs filtered inverted Q output signal 7013.

Second differential amplifier 7022 receives filtered Q output signal 7011 at its non-inverting input and receives filtered inverted Q output signal 7013 at its inverting input. Second differential amplifier 7022 subtracts filtered inverted Q output signal 7013 from filtered Q output signal 7011, amplifies the result, and outputs Q baseband output signal 7086. Because filtered inverted Q output signal 7013 is substantially equal to an inverted version of filtered Q output signal 7011, Q baseband output signal 7086 is substantially equal to filtered Q output signal 7013, with its amplitude doubled. Furthermore, filtered Q output signal 7011 and filtered inverted Q output signal 7013 may comprise substantially equal noise and DC offset contributions of the same polarity from prior down-conversion circuitry, including third UFD module 7010 and fourth UFD module 7014, respectively. When second differential amplifier 7022 subtracts filtered inverted Q output signal 7013 from filtered Q output signal 7011, these noise and DC offset contributions substantially cancel each other.

Additional embodiments relating to addressing DC offset and re-radiation concerns, applicable to the present invention, are described in co-pending patent application Ser. No. 09/526,041, entitled "DC Offset, Re-radiation, and I/Q Solutions Using Universal Frequency Translation Technology," which is herein incorporated by reference in its entirety.

7.2.2.1 Example I/Q Modulation Control Signal Generator Embodiments

Figure 70B:
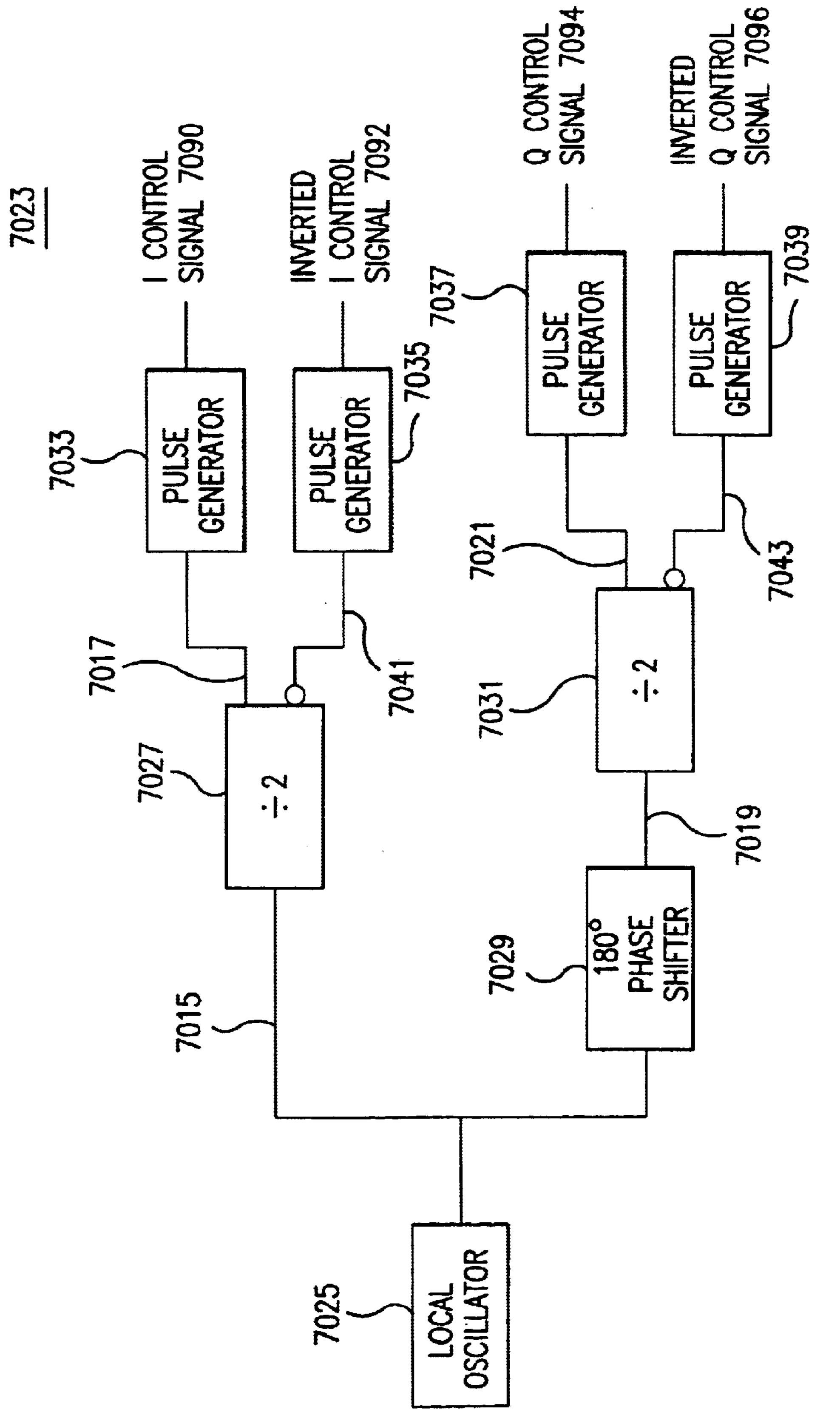
FIG. 70B illustrates control signal generator embodiments for receiver 7000 according to embodiments of the invention.

FIG. 70B illustrates an exemplary block diagram for I/Q modulation control signal generator 7023, according to an embodiment of the present invention. I/Q modulation control signal generator 7023 generates I control signal 7090, inverted I control signal 7092, Q control signal 7094, and inverted Q control signal 7096 used by I/Q modulation receiver 7000 of FIG. 70A. I control signal 7090 and inverted I control signal 7092 operate to down-convert the I-phase portion of an input I/Q modulated RF signal. Q control signal 7094 and inverted Q control signal 7096 act to down-convert the Q-phase portion of the input I/Q modulated RF signal. Furthermore, I/Q modulation control signal generator 7023 has the advantage of generating control signals in a manner such that resulting collective circuit re-radiation is radiated at one or more frequencies outside of the frequency range of interest. For instance, potential circuit re-radiation is radiated at a frequency substantially greater than that of the input RF carrier signal frequency.

I/Q modulation control signal generator 7023 comprises a local oscillator 7025, a first divide-by-two module 7027, a 180 degree phase shifter 7029, a second divide-by-two module 7031, a first pulse generator 7033, a second pulse generator 7035, a third pulse generator 7037, and a fourth pulse generator 7039.

Figure 70C:
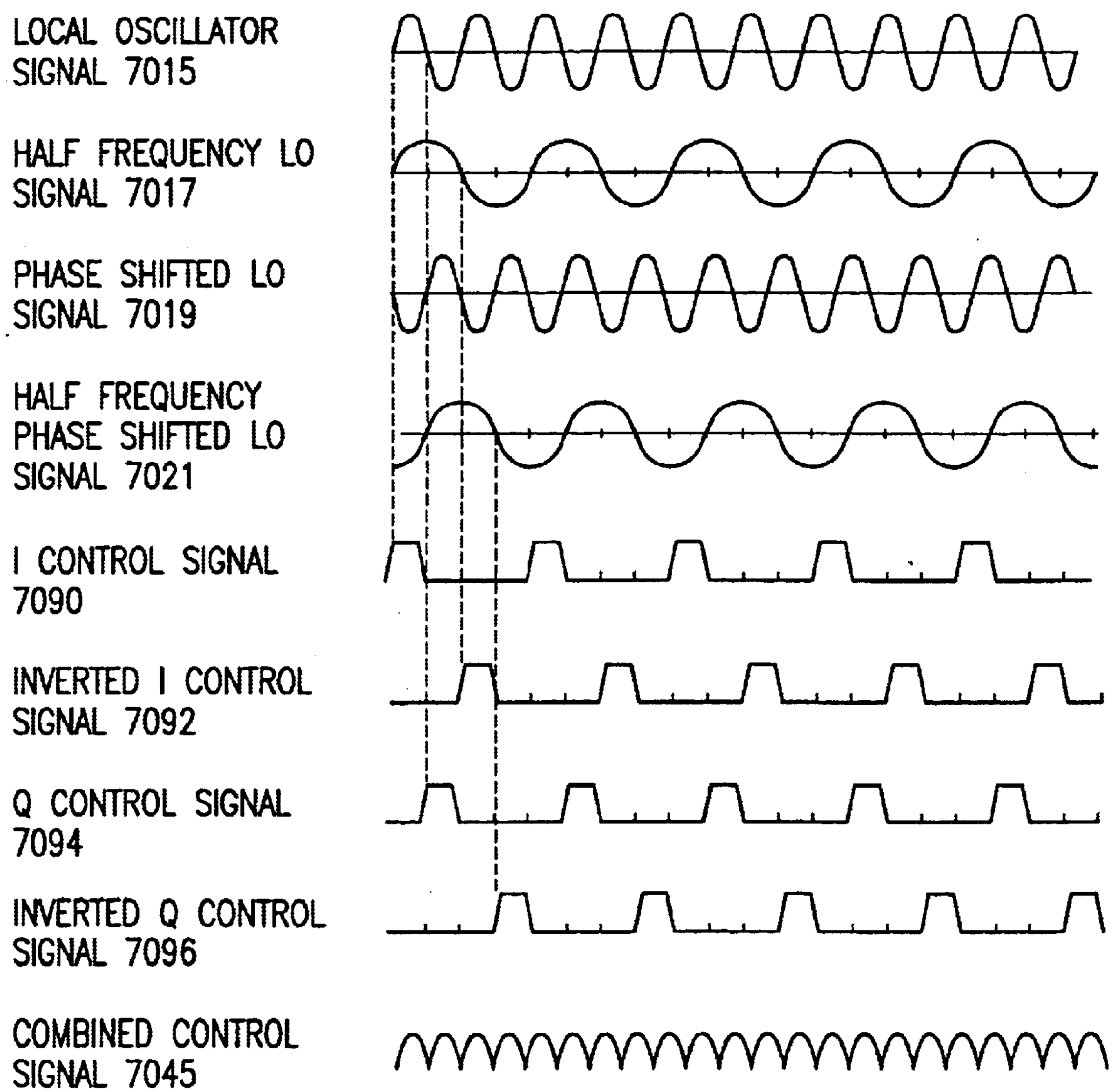
FIGS. 70C–D illustrate various control signal waveforms according to embodiments of the invention.

Local oscillator 7025 outputs an oscillating signal 7015. FIG. 70C shows an exemplary oscillating signal 7015.

First divide-by-two module 7027 receives oscillating signal 7015, divides oscillating signal 7015 by two, and outputs a half frequency LO signal 7017 and a half frequency inverted LO signal 7041. FIG. 70C shows an exemplary half frequency LO signal 7017. Half frequency inverted LO signal 7041 is an inverted version of half frequency LO signal 7017. First divide-by-two module 7027 may be implemented in circuit logic, hardware, software, or any combination thereof, as would be known by persons skilled in the relevant art(s).

180 degree phase shifter 7029 receives oscillating signal 7015, shifts the phase of oscillating signal 7015 by 180 degrees, and outputs phase shifted LO signal 7019. 180 degree phase shifter 7029 may be implemented in circuit logic, hardware, software, or any combination thereof, as would be known by persons skilled in the relevant art(s). In alternative embodiments, other amounts of phase shift may be used.

Second divide-by two module 7031 receives phase shifted LO signal 7019, divides phase shifted LO signal 7019 by two, and outputs a half frequency phase shifted LO signal 7021 and a half frequency inverted phase shifted LO signal 7043. FIG. 70C shows an exemplary half frequency phase shifted LO signal 7021. Half frequency inverted phase shifted LO signal 7043 is an inverted version of half frequency phase shifted LO signal 7021. Second divide-by-two module 7031 may be implemented in circuit logic, hardware, software, or any combination thereof, as would be known by persons skilled in the relevant art(s).

First pulse generator 7033 receives half frequency LO signal 7017, generates an output pulse whenever a rising edge is received on half frequency LO signal 7017, and outputs I control signal 7090. FIG. 70C shows an exemplary I control signal 7090.

Second pulse generator 7035 receives half frequency inverted LO signal 7041, generates an output pulse whenever a rising edge is received on half frequency inverted LO signal 7041, and outputs inverted I control signal 7092. FIG. 70C shows an exemplary inverted I control signal 7092.

Third pulse generator 7037 receives half frequency phase shifted LO signal 7021, generates an output pulse whenever a rising edge is received on half frequency phase shifted LO signal 7021, and outputs Q control signal 7094. FIG. 70C shows an exemplary Q control signal 7094.

Fourth pulse generator 7039 receives half frequency inverted phase shifted LO signal 7043, generates an output pulse whenever a rising edge is received on half frequency inverted phase shifted LO signal 7043, and outputs inverted Q control signal 7096. FIG. 70C shows an exemplary inverted Q control signal 7096.

In an embodiment, control signals 7090, 7021, 7041 and 7043 include pulses having a width equal to one-half of a period of I/Q modulated RF input signal 7082. The invention, however, is not limited to these pulse widths, and control signals 7090, 7021, 7041, and 7043 may comprise pulse widths of any fraction of, or multiple and fraction of, a period of I/Q modulated RF input signal 7082.

First, second, third, and fourth pulse generators 7033, 7035, 7037, and 7039 may be implemented in circuit logic, hardware, software, or any combination thereof, as would be known by persons skilled in the relevant art(s).

As shown in FIG. 70C, in an embodiment, control signals 7090, 7021, 7041, and 7043 comprise pulses that are non-overlapping in other embodiments the pulses may overlap. Furthermore, in this example, pulses appear on these signals in the following order: I control signal 7090, Q control signal 7094, inverted I control signal 7092, and inverted Q control signal 7096. Potential circuit re-radiation from VQ modulation receiver 7000 may comprise frequency components from a combination of these control signals.

Figure 70D:
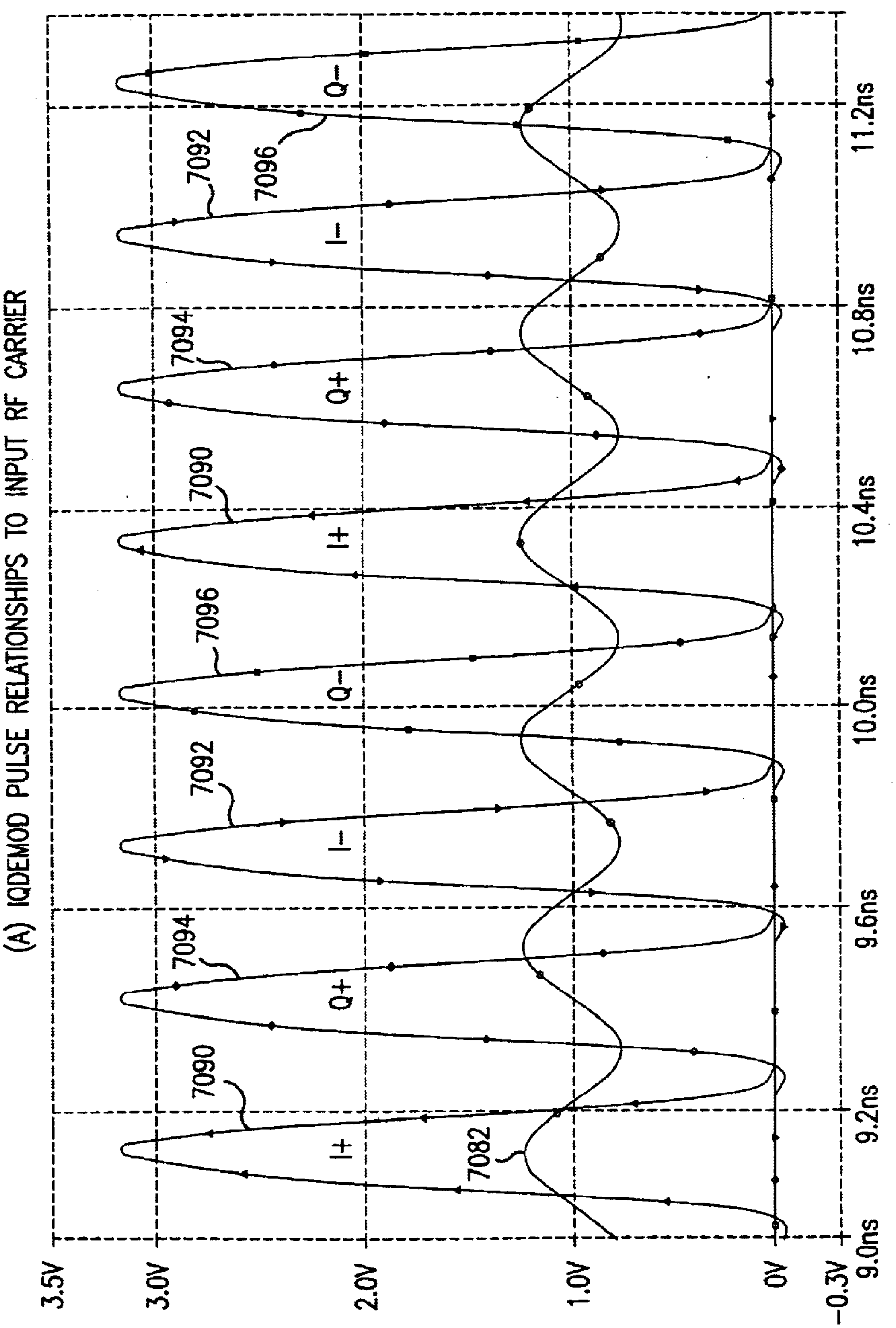

For example, FIG. 70D shows an overlay of pulses from I control signal 7090, Q control signal 7094, inverted I control signal 7092, and inverted Q control signal 7096. When pulses from these control signals leak through first, second, third, and/or fourth UFD modules 7002, 7006, 7010, and 7014 to antenna 7072 (shown in FIG. 70A), they may be radiated from I/Q modulation receiver 7000, with a combined waveform that appears to have a primary frequency equal to four times the frequency of any single one of control signals 7090, 7021, 7041, and 7043. FIG. 70 shows an example combined control signal 7045.

FIG. 70D also shows an example I/Q modulation RF input signal 7082 overlaid upon control signals 7090, 7094, 7092, and 7096. As shown in FIG. 70D, pulses on I control signal 7090 overlay and act to down-convert a positive I-phase portion of I/Q modulation RF input signal 7082. Pulses on inverted I control signal 7092 overlay and act to down-convert a negative I-phase portion of I/Q modulation RF input signal 7082. Pulses on Q control signal 7094 overlay and act to down-convert a rising Q-phase portion of I/Q modulation RF input signal 7082. Pulses on inverted Q control signal 7096 overlay and act to down-convert a falling Q-phase portion of I/Q modulation RF input signal 7082.

As FIG. 70D further shows in this example, the frequency ratio between the combination of control signals 7090, 7021, 7041, and 7043 and I/Q modulation RF input signal 7082 is approximately 4:3. Because the frequency of the potentially re-radiated signal, i.e., combined control signal 7045, is substantially different from that of the signal being down-converted, i.e., I/Q modulation RF input signal 7082, it does not interfere with signal down-conversion as it is out of the frequency band of interest, and hence may be filtered out. In this manner, I/Q modulation receiver 7000 reduces problems due to circuit re-radiation. As will be understood by persons skilled in the relevant art(s) from the teachings herein, frequency ratios other than 4:3 may be implemented to achieve similar reduction of problems of circuit re-radiation.

It should be understood that the above control signal generator circuit example is provided for illustrative purposes only. The invention is not limited to these embodiments. Alternative embodiments (including equivalents, extensions, variations, deviations, etc., of the embodiments described herein) for I/Q modulation control signal generator 7023 will be apparent to persons skilled in the relevant art(s) from the teachings herein, and are within the scope of the present invention.

Figure 70F:
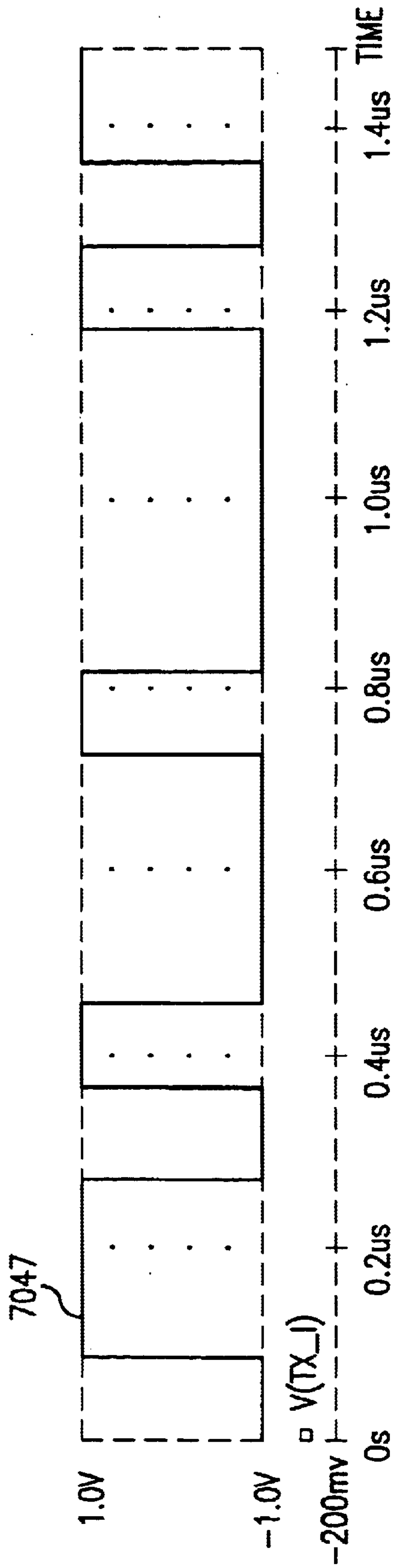
FIGS. 70F–P illustrate example waveforms that are representative of the IQ receiver in FIG. 70E.
Figure 70G:
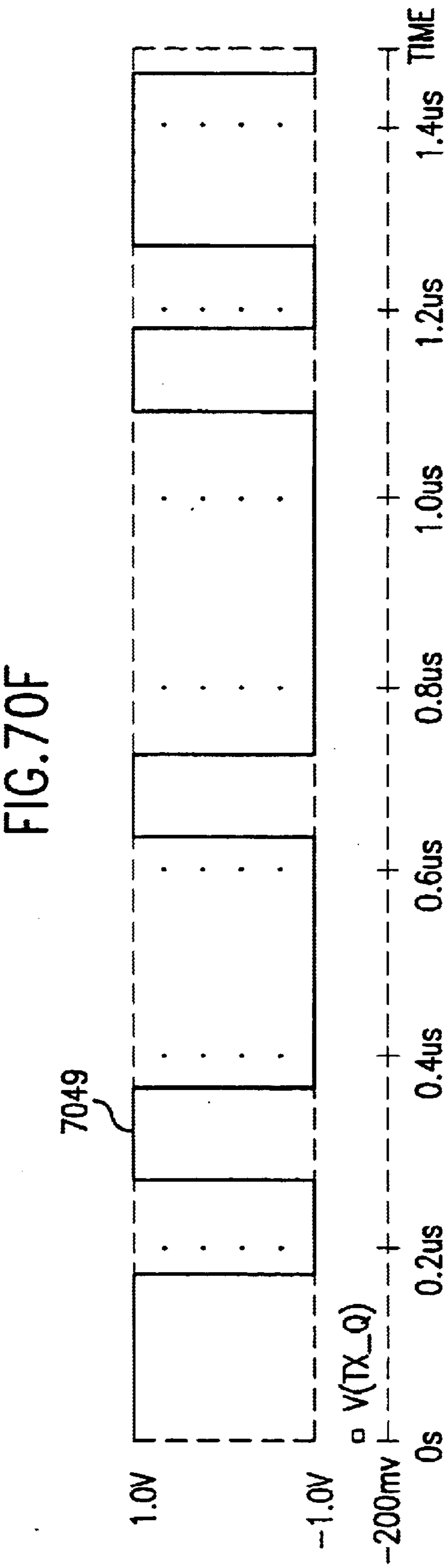
Figures 70H, 70I, 70J, 70K, 70L:
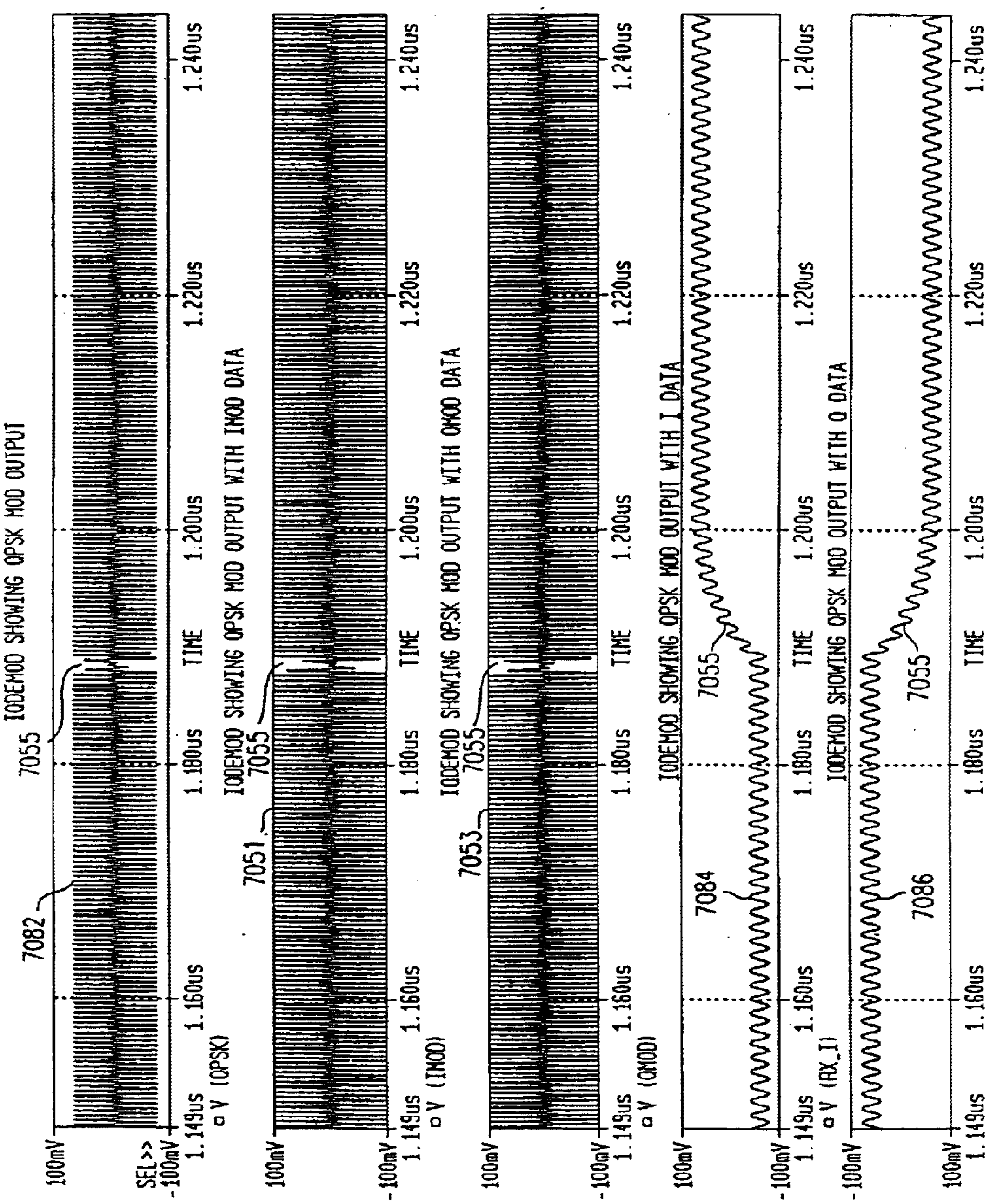
Figure 70M:
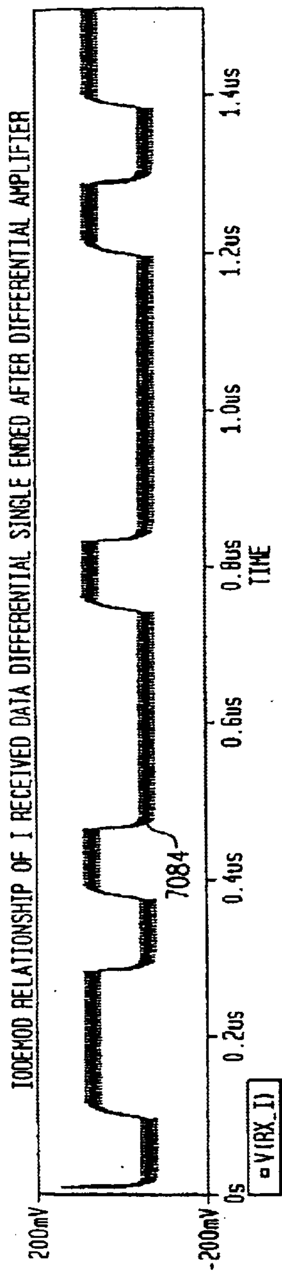
Figure 70N:
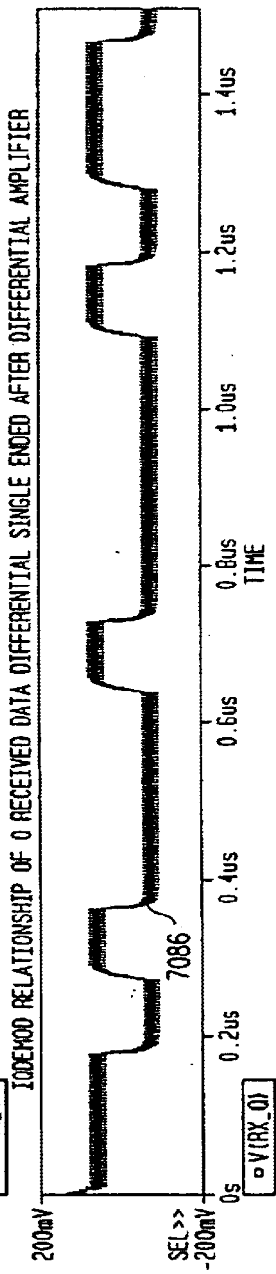
Figure 70O:
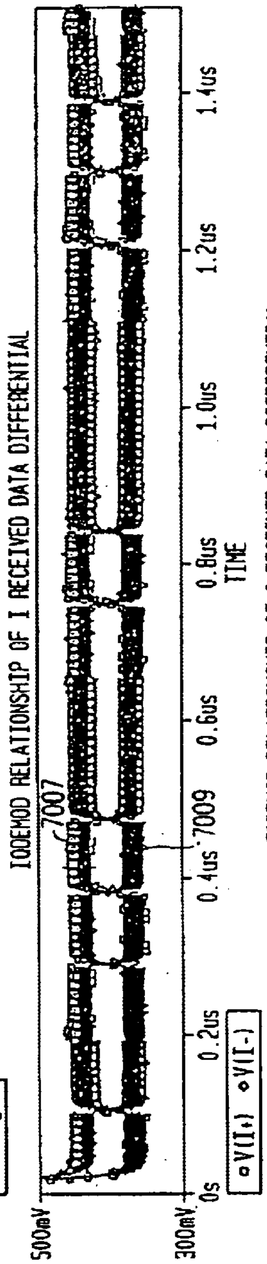
Figure 70P:
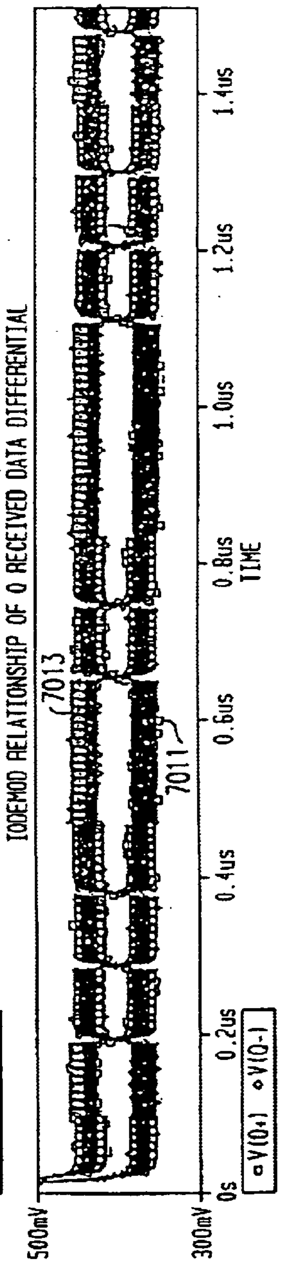
Figure 70Q:
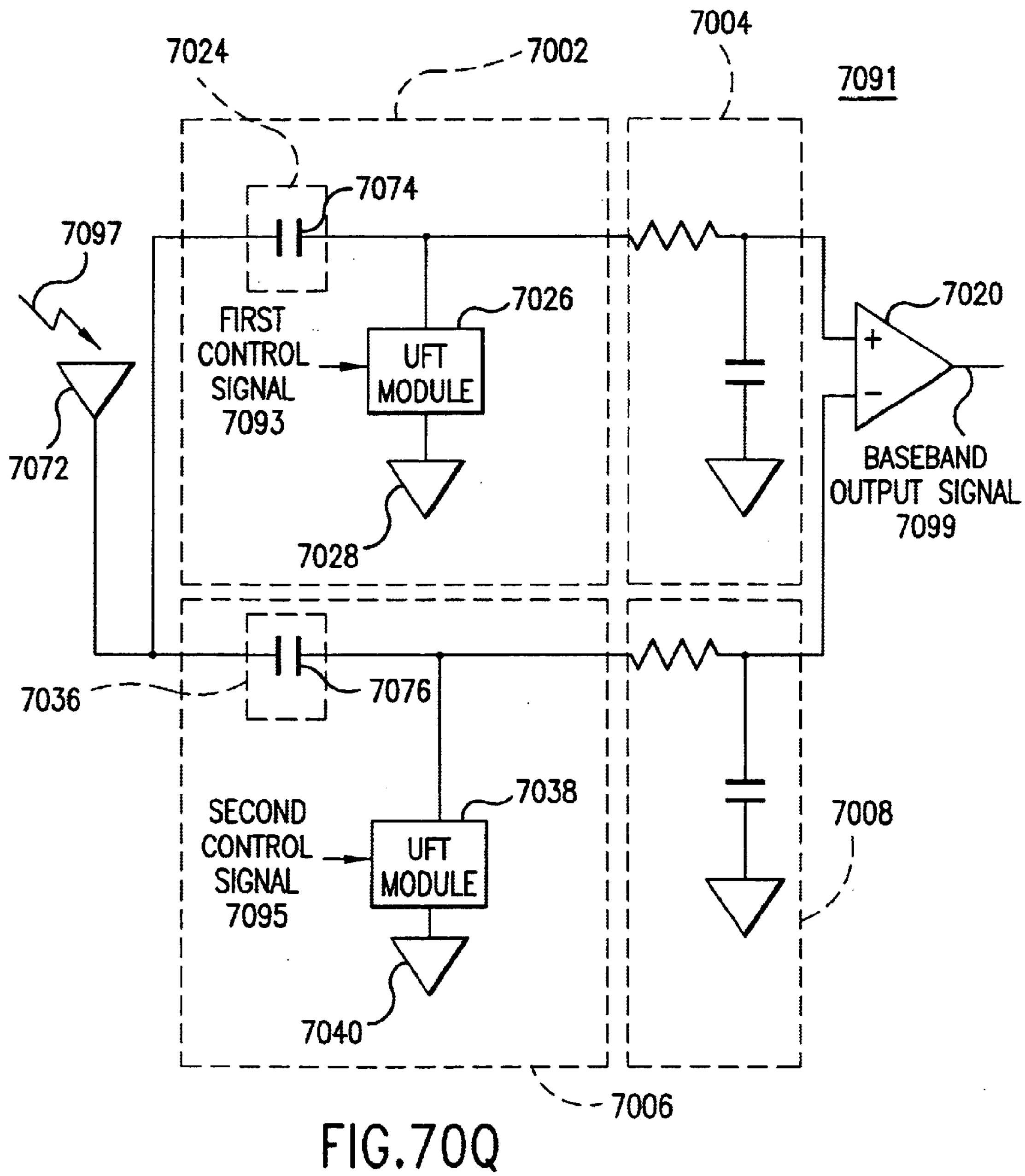
FIGS. 70Q–R illustrate single channel receiver embodiments according to embodiments of the invention.
Figure 70R:
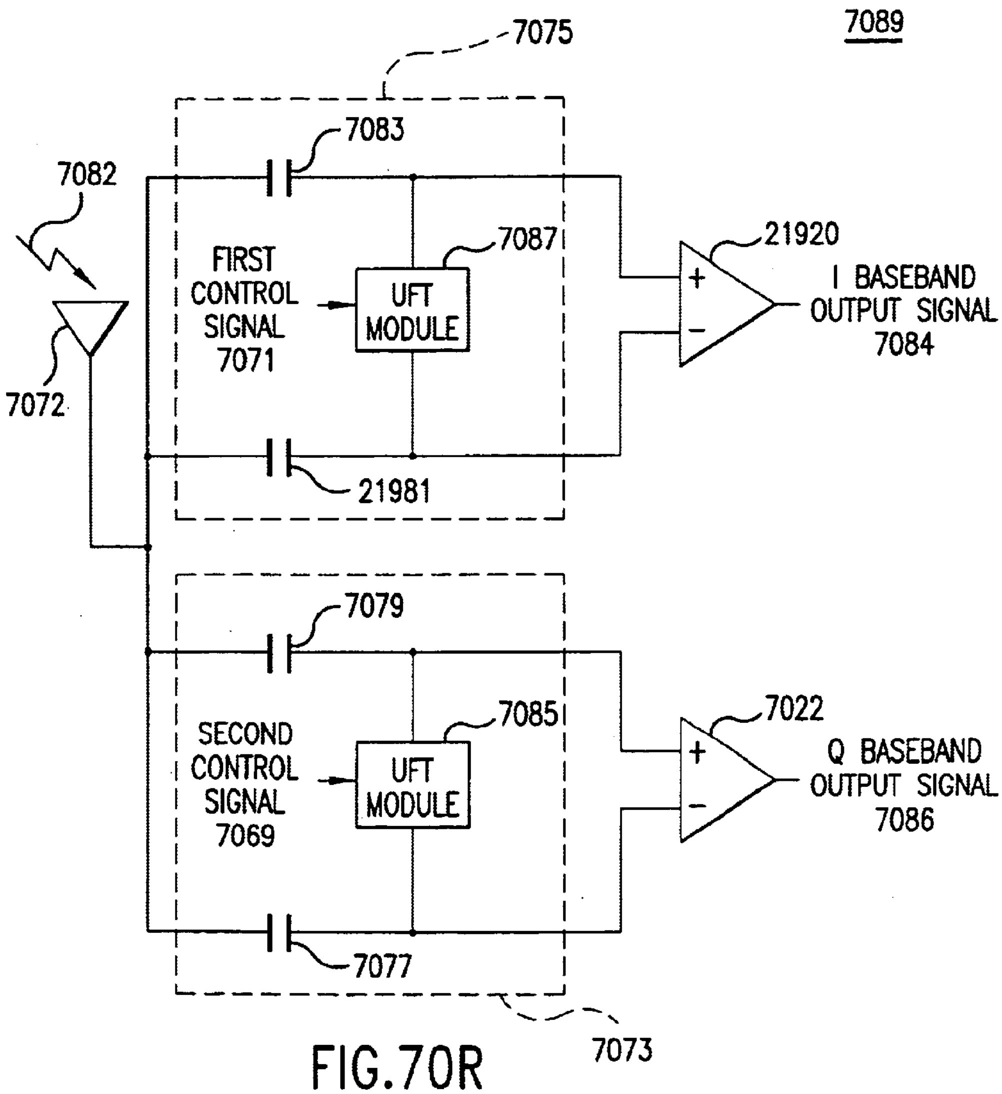
Figure 70S:
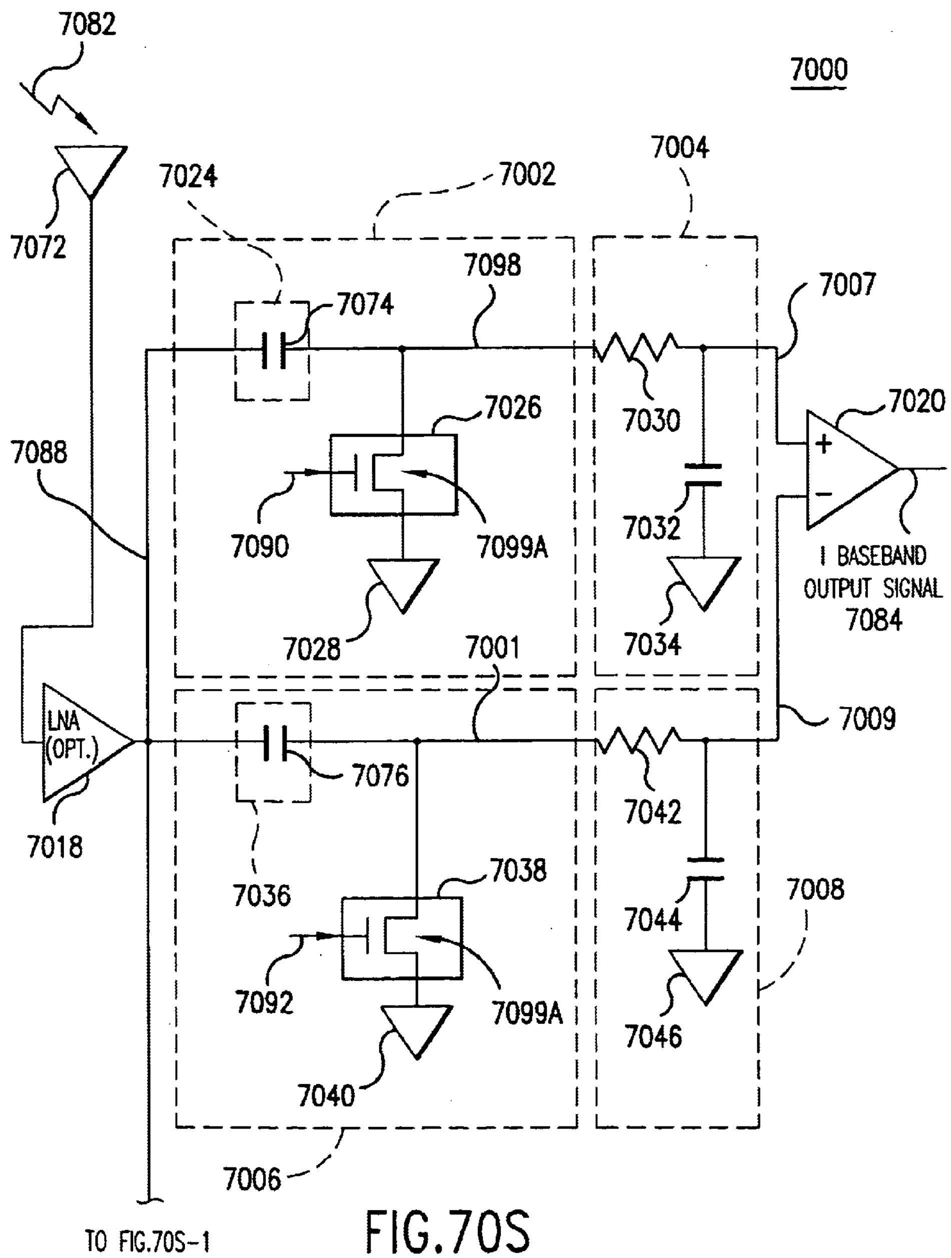
FIG. 70S illustrates a FET configuration of an IQ receiver embodiment according to embodiments of the invention.
Figures 1, 70S:
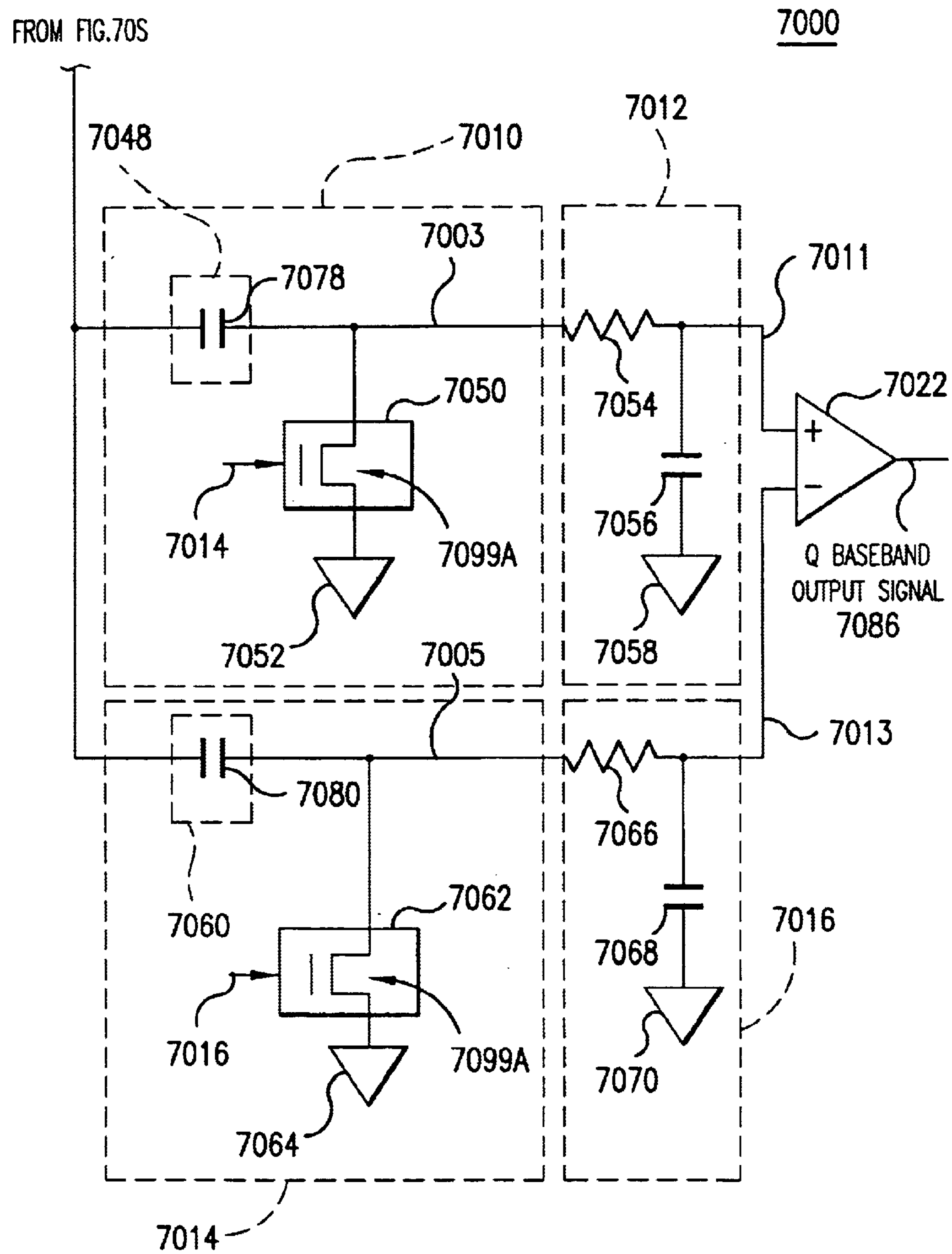

FIG. 70S illustrates the receiver 7000, where the UFT modules 7028, 7038, 7050, and 7062 are configured with FETs 7099*a–d*.

Additional embodiments relating to addressing DC offset and re-radiation concerns, applicable to the present invention, are described in co-pending patent application Ser. No. 09/526,041, entitled "DC Offset, Re-radiation, and I/Q Solutions Using Universal Frequency Translation Technology," which is herein incorporated by reference in its entirety.

7.2.2.2 Implementation of Multi-phase I/Q Modulation Receiver Embodiment with Exemplary Waveforms FIG. 70E illustrates a more detailed example circuit implementation of I/Q modulation receiver 7000, according to an embodiment of the present invention. FIGS. 70F–P show example waveforms related to an example implementation of I/Q modulation receiver 7000 of FIG. 70E.

FIGS. 70F and 70G show first and second input data signals 7047 and 7049 to be I/Q modulated with a RF carrier signal frequency as the I-phase and Q-phase information signals, respectively.

FIGS. 70I and 70J show the signals of FIG. 70F and 70G after modulation with a RF carrier signal frequency, respectively, as I-modulated signal 7051 and Q-modulated signal 7053.

FIG. 70H shows an I/Q modulation RF input signal 7082 formed from I-modulated signal 7051 and Q-modulated signal 7053 of FIGS. 70I and 70J, respectively.

FIG. 70O shows an overlaid view of filtered I output signal 7007 and filtered inverted I output signal 7009.

FIG. 70P shows an overlaid view of filtered Q output signal 7011 and filtered inverted Q output signal 7013.

FIGS. 70K and 70L show I baseband output signal 7084 and Q baseband output signal 7086, respectfully. A data transition 7055 is indicated in both I baseband output signal 7084 and Q baseband output signal 7086. The corresponding data transition 7055 is indicated in I-modulated signal 7051 of FIG. 70I, Q-modulated signal 7053 of FIG. 70J, and I/Q modulation RF input signal 7082 of FIG. 70H.

FIGS. 70M and 70N show I baseband output signal 7084 and Q baseband output signal 7086 over a wider time interval.

7.2.2.3 Example Single Channel Receiver Embodiment

FIG. 70Q illustrates an example single channel receiver 7091, corresponding to either the I or Q channel of I/Q modulation receiver 7000, according to an embodiment of the present invention. Single channel receiver 7091 can down-convert an input RF signal 7097 modulated according to AM, PM, FM, and other modulation schemes. Refer to section 7.2.1 above for further description on the operation of single channel receiver 7091. In other words, the single channel receiver 7091 is a one channel of the IQ receiver 7000 that was discussed in section 7.2.1.

7.2.2.4 Alternative Example I/Q Modulation Receiver Embodiment

FIG. 70R illustrates an exemplary I/Q modulation receiver 7089, according to an embodiment of the present invention. I/Q modulation receiver 7089 receives, down-converts, and demodulates an I/Q modulated RF input signal 7082 to an I baseband output signal 7084, and a Q baseband output signal 7086. I/Q modulation receiver 7089 has additional advantages of reducing or eliminating unwanted DC offsets and circuit re-radiation, in a similar fashion to that of I/Q modulation receiver 7000 described above.

7.3 Transmitter

Example embodiments and implementations of the IQ transmitter 3910 will be discussed as follows. The example embodiments and implementations include multi-phase embodiments that are useful for reducing or eliminating unwanted DC offsets that can result in unwanted carrier insertion.

7.3.1 Universal Transmitter with 2 UFT Modules

Figure 71A:
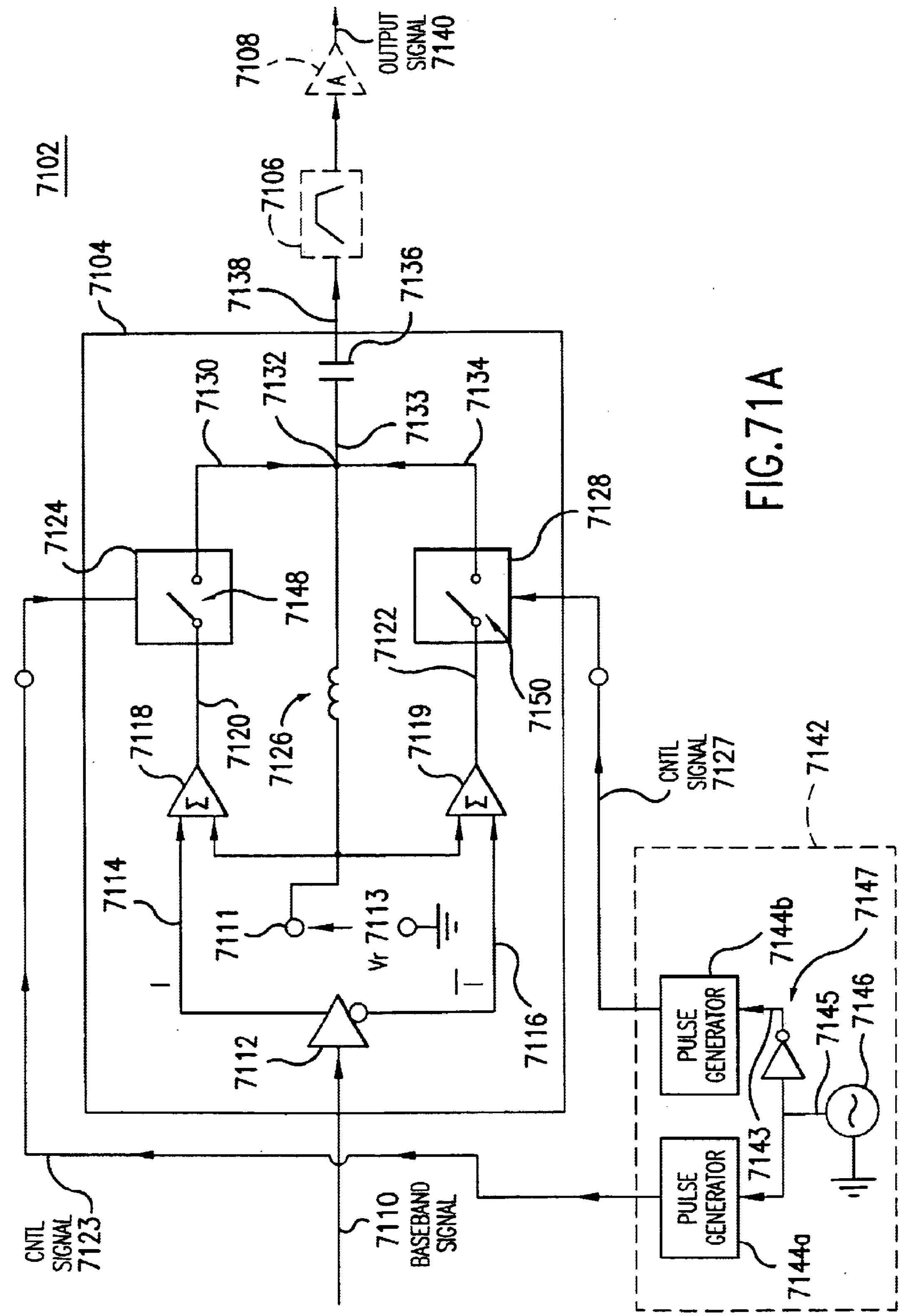
FIG. 71A illustrate a balanced transmitter 7102, according to an embodiment of the present invention.
Figure 84:
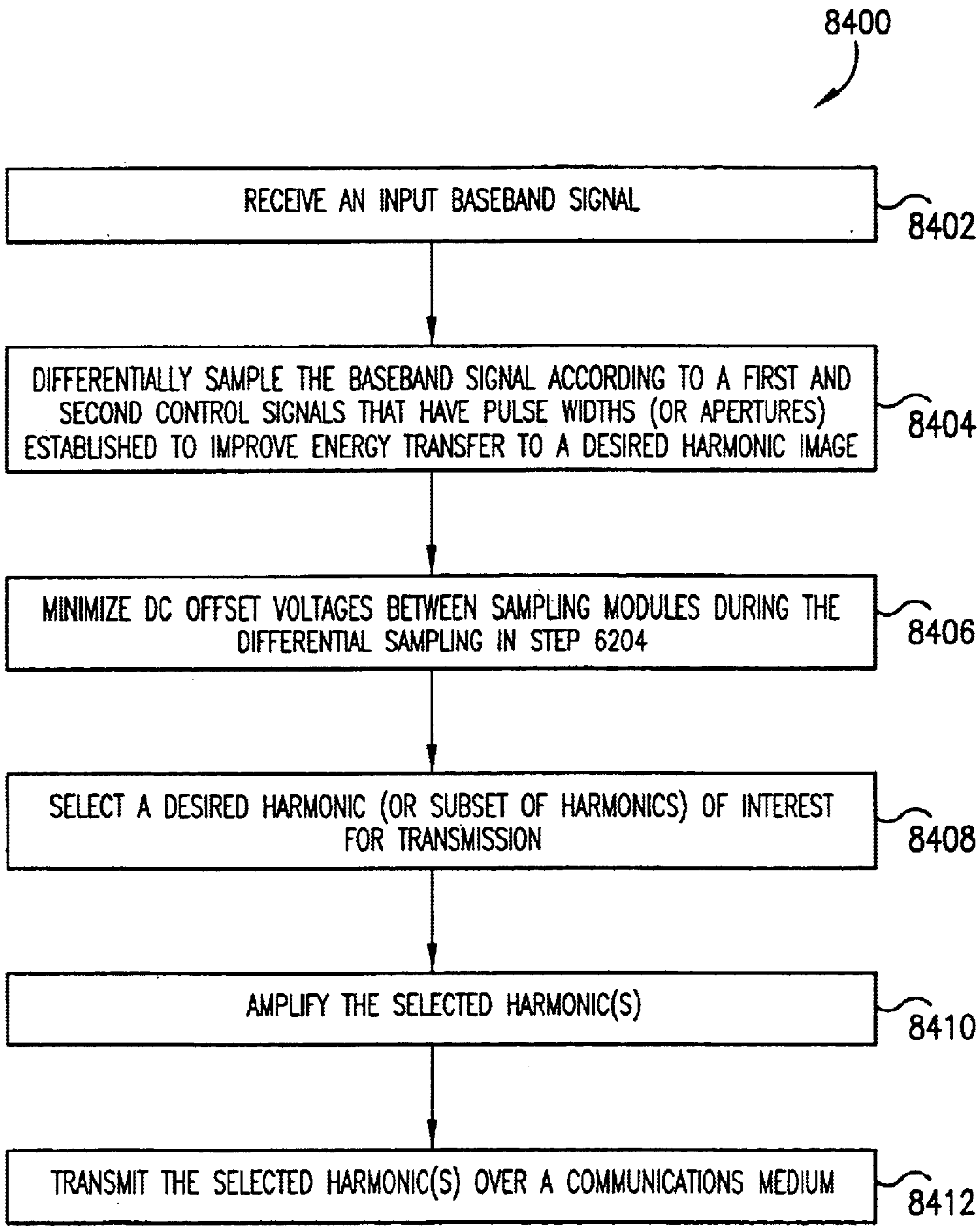
FIG. 84 illustrates a flowchart 8400 that is associated with the transmitter 7102 in the FIG. 71A, according to embodiments of the invention.

FIG. 71A illustrates a transmitter 7102 according to embodiments of the present invention. Transmitter 7102 includes a balanced modulator/up-converter 7104, a control signal generator 7142, an optional filter 7106, and an optional amplifier 7108. Transmitter 7102 up-converts a baseband signal 7110 to produce an output signal 7140 that is conditioned for wireless or wire line transmission. In doing so, the balanced modulator 7104 receives the baseband signal 7110 and samples the baseband signal in a differential and balanced fashion to generate a harmonically rich signal 7138. The harmonically rich signal 7138 includes multiple harmonic images, where each image contains the baseband information in the baseband signal 7110 The optional bandpass filter 7106 may be included to select a harmonic of interest (or a subset of harmonics) in the signal 7138 for transmission. The optional amplifier 7108 may be included to amplify the selected harmonic prior to transmission. The universal transmitter is further described at a high level by the flowchart 8400 that is shown in FIG. 84. A more detailed structural and operational description of the balanced modulator follows thereafter.

Referring to flowchart 8400, in step 8402, the balanced modulator 7104 receives the baseband signal 7110.

In step 8404, the balanced modulator 7104 samples the baseband signal in a differential and balanced fashion according to a first and second control signals that are phase shifted with respect to each other. The resulting harmonically rich signal 7138 includes multiple harmonic images that repeat at harmonics of the sampling frequency, where each image contains the necessary amplitude and frequency information to reconstruct the baseband signal 7110.

In embodiments of the invention, the control signals include pulses having pulse widths (or apertures) that are established to improve energy transfer to a desired harmonic of the harmonically rich signal 7138. In further embodiments of the invention, DC offset voltages are minimized between sampling modules as indicated in step 8406, thereby minimizing carrier insertion in the harmonic images of the harmonically rich signal 7138.

In step 8408, the optional bandpass filter 7106 selects the desired harmonic of interest (or a subset of harmonics) in from the harmonically rich signal 7138 for transmission.

In step 8410, the optional amplifier 7108 amplifies the selected harmonic(s) prior to transmission.

In step 8412, the selected harmonic(s) is transmitted over a communications medium.

7.3.1.1 Balanced Modulator Detailed Description

Figure 85:
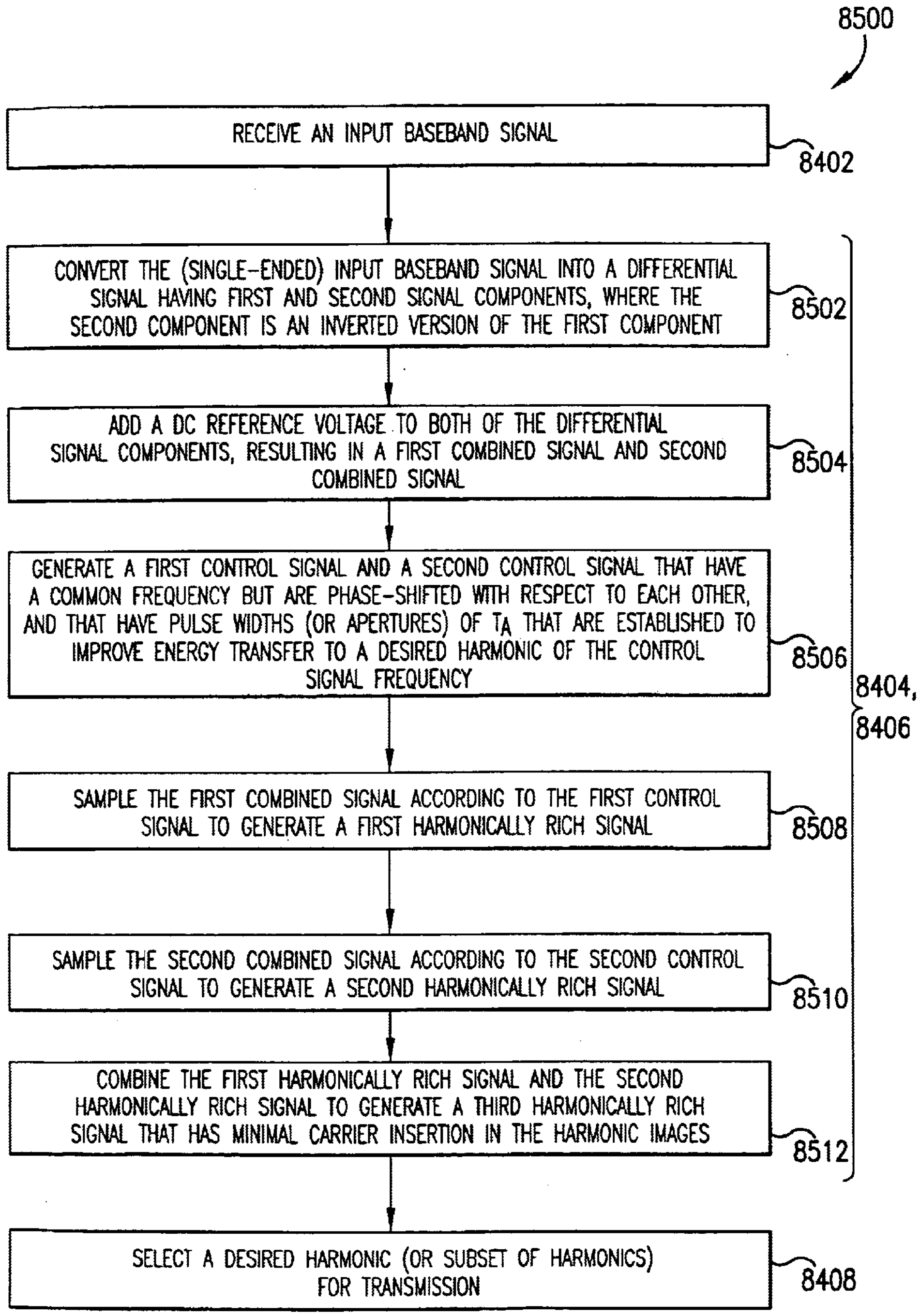
FIG. 85 illustrates a flowchart 8500 that further defines the flowchart 8400 in the FIG. 84, and is associated with the transmitter 7102 according to embodiments of the invention.

Referring to the example embodiment shown in FIG. 71A, the balanced modulator 7104 includes the following components: a buffer/inverter 7112; summer amplifiers 7118, 7119; UFT modules 7124 and 7128 having controlled switches 7148 and 7150, respectively; an inductor 7126; a blocking capacitor 7136; and a DC terminal 7111. As stated above, the balanced modulator 7104 differentially samples the baseband signal 7110 to generate a harmonically rich signal 7138. More specifically, the UFT modules 7124 and 7128 sample the baseband signal in differential fashion according to control signals 7123 and 7127, respectively. A DC reference voltage 7113 is applied to terminal 7111 and is uniformly distributed to the UFT modules 7124 and 7128. The distributed DC voltage 7113 prevents any DC offset voltages from developing between the UFT modules, which can lead to carrier insertion in the harmonically rich signal 7138. The operation of the balanced modulator 7104 is discussed in greater detail with reference to flowchart 8500 (FIG. 85), as follows.

In step 8402, the buffer/inverter 7112 receives the input baseband signal 7110 and generates input signal 7114 and inverted input signal 7116. Input signal 7114 is substantially similar to signal 7110, and inverted signal 7116 is an inverted version of signal 7114. As such, the buffer/inverter 7112 converts the (single-ended) baseband signal 7110 into differential input signals 7114 and 7116 that will be sampled by the UFT modules. Buffer/inverter 7112 can be implemented using known operational amplifier (op amp) circuits, as will be understood by those skilled in the arts, although the invention is not limited to this example.

In step 8504, the summer amplifier 7118 sums the DC reference voltage 7113 applied to terminal 7111 with the input signal 7114, to generate a combined signal 7120. Likewise, the summer amplifier 7119 sums the DC reference voltage 7113 with the inverted input signal 7116 to generate a combined signal 7122. Summer amplifiers 7118 and 7119 can be implemented using known op amp summer circuits, and can be designed to have a specified gain or attenuation, including unity gain, although the invention is not limited to this example. The DC reference voltage 7113 is also distributed to the outputs of both UFT modules 7124 and 7128 through the inductor 7126 as is shown.

Figure 72A:
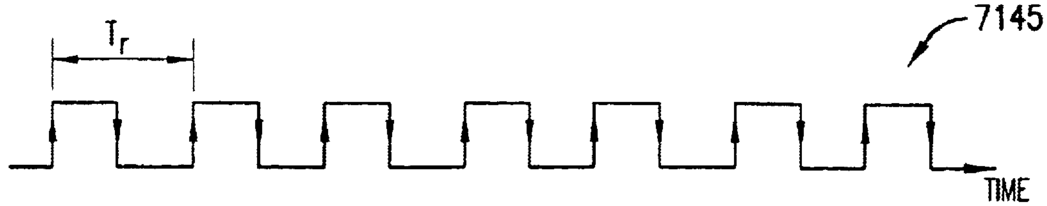
FIGS. 72A–I illustrate various example timing diagrams that are associated with the transmitter 7102, according to embodiments of the present invention.
Figure 72B:
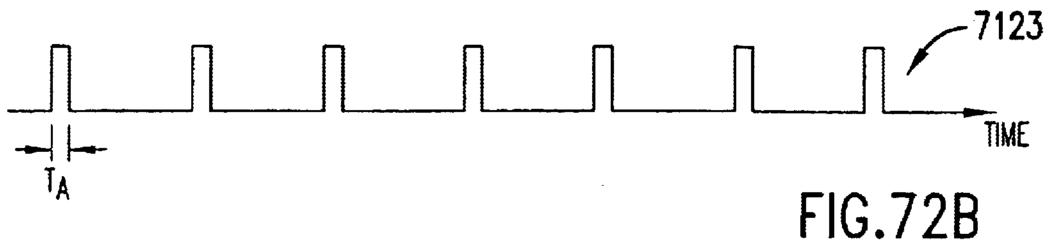
Figure 72C:
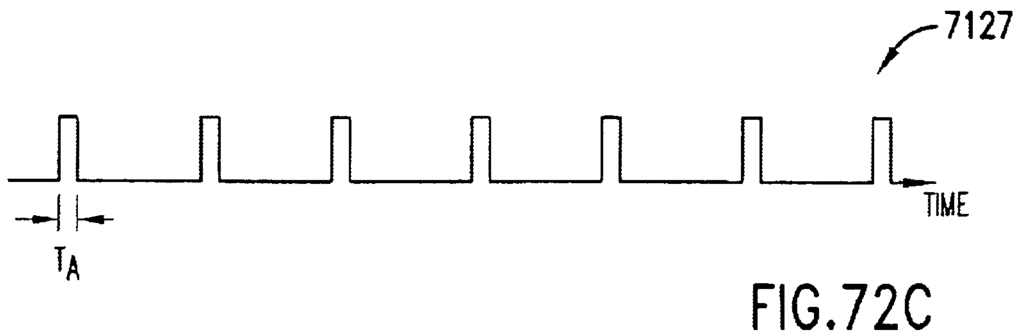

In step 8506, the control signal generator 7142 generates control signals 7123 and 7127 that are shown by way of example in FIG. 72B and FIG. 72C, respectively. As illustrated, both control signals 7123 and 7127 have the same period $T_S$ as a master clock signal 7145 (FIG.72A), but have a pulse width (or aperture) of $T_A$. In the example, control signal 7123 triggers on the rising pulse edge of the master clock signal 7145, and control signal 7127 triggers on the falling pulse edge of the master clock signal 7145. Therefore, control signals 7123 and 7127 are shifted in time by 180 degrees relative to each other. In embodiments of invention, the master clock signal 7145 (and therefore the control signals 7123 and 7127) have a frequency that is a sub-harmonic of the desired output signal 7140. The invention is not limited to the example of FIGS. 72A–72C.

In one embodiment, the control signal generator 7142 includes an oscillator 7146, pulse generators 7144*a* and 7144*b*, and an inverter 7147 as shown. In operation, the oscillator 7146 generates the master clock signal 7145, which is illustrated in FIG. 72A as a periodic square wave having pulses with a period of $T_S$. Other clock signals could be used including but not limited to sinusoidal waves, as will be understood by those skilled in the arts. Pulse generator 7144*a* receives the master clock signal 7145 and triggers on the rising pulse edge, to generate the control signal 7123. Inverter 7147 inverts the clock signal 7145 to generate an inverted clock signal 7143. The pulse generator 7144*b* receives the inverted clock signal 7143 and triggers on the rising pulse edge (which is the falling edge of clock signal 7145), to generate the control signal 7127.

Figure 89A:
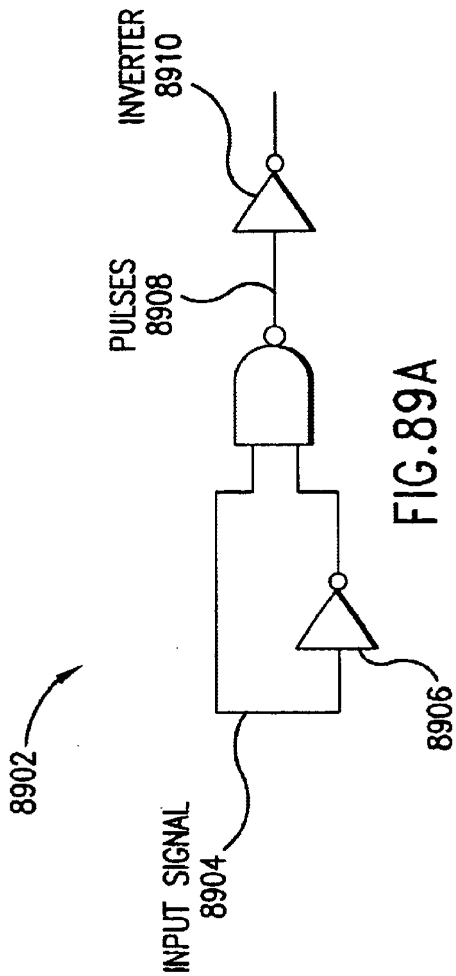
FIG. 89A illustrate a pulse generator according to embodiments of the invention.
Figure 89B:
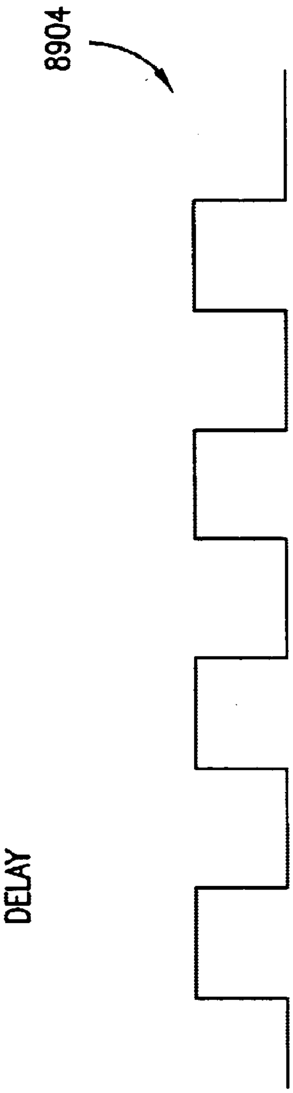
FIGS. 89B–C illustrate various example signal diagrams associated with the pulse generator in FIG. 89A, according to embodiments of the invention.
Figure 89C:
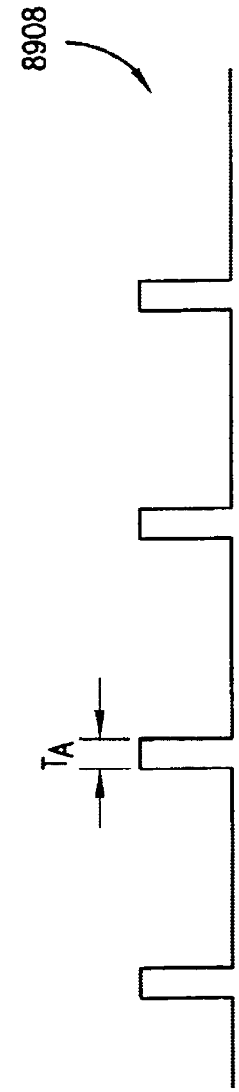
Figure 89D:
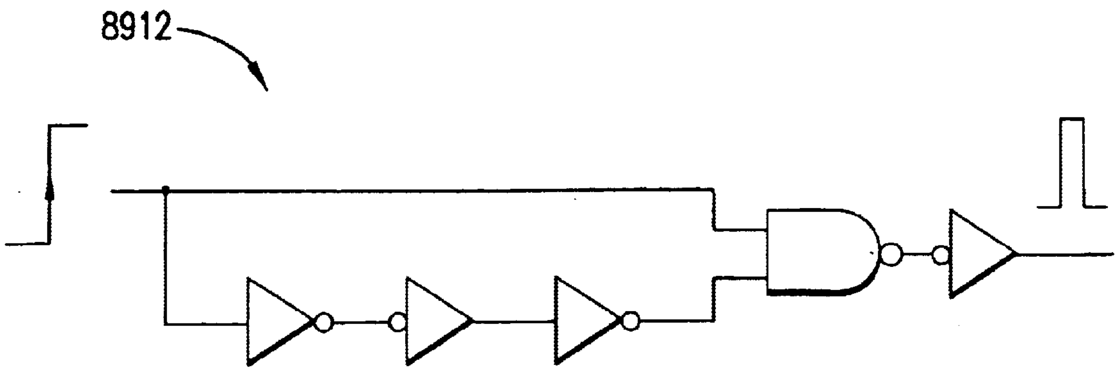
FIGS. 89D–E illustrate various example pulse generators according to embodiments of the present invention.
Figure 89E:
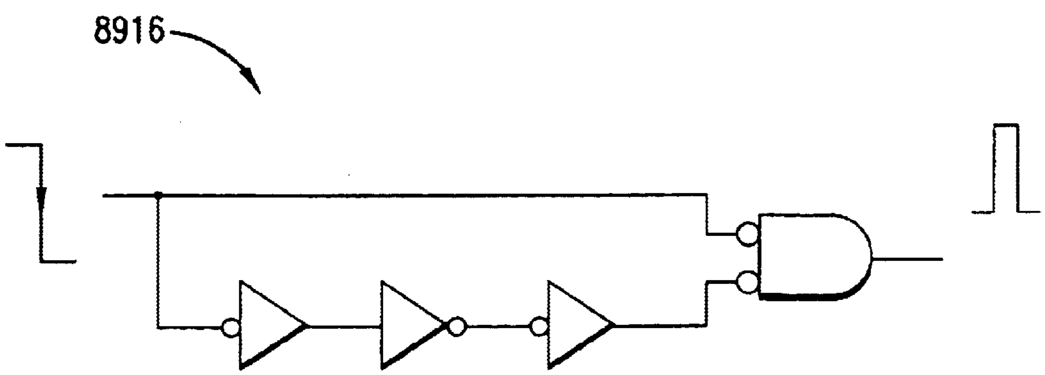

FIG. 89A-E illustrate example embodiments for the pulse generator 7144. FIG. 89A illustrates a pulse generator 8902. The pulse generator 8902 generates pulses 8908 having pulse width $T_A$ from an input signal 8904. Example input signals 8904 and pulses 8908 are depicted in FIGS. 89B and 89C, respectively. The input signal 8904 can be any type of periodic signal, including, but not limited to, a sinusoid, a square wave, a saw-tooth wave etc. The pulse width (or aperture) $T_A$ of the pulses 8908 is determined by delay 8906 of the pulse generator 8902. The pulse generator 8902 also includes an optional inverter 8910, which is optionally added for polarity considerations as understood by those skilled in the arts. The example logic and implementation shown for the pulse generator 8902 is provided for illustrative purposes only, and is not limiting. The actual logic employed can take many forms. Additional examples of pulse generation logic are shown in FIGS. 89D and 89E. FIG. 89D illustrates a rising edge pulse generator 8912 that triggers on the rising edge of input signal 8904. FIG. 89E illustrates a falling edge pulse generator 8916 that triggers on the falling edge of the input signal 8904.

Figure 71B:
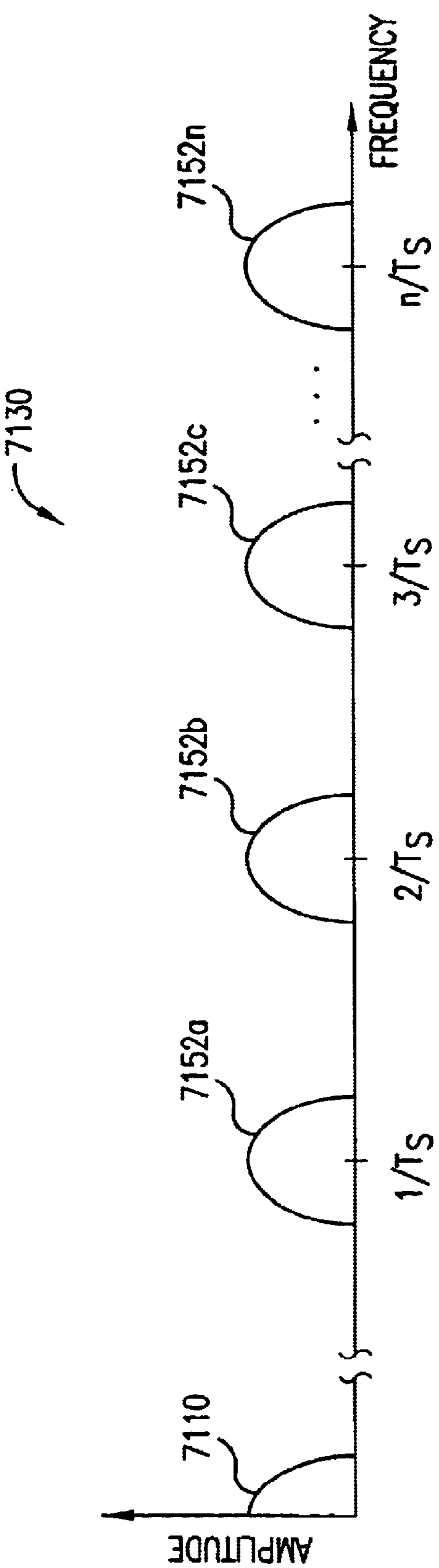
FIGS. 71B–C illustrate example waveforms that are associated with the balanced transmitter 7102, according to an embodiment of the present invention.

In step 8508, the UFT module 7124 samples the combined signal 7120 according to the control signal 7123 to generate harmonically rich signal 7130. More specifically, the switch 7148 closes during the pulse widths $T_A$ of the control signal 7123 to sample the combined signal 7120 resulting in the harmonically rich signal 7130. FIG. 71B illustrates an exemplary frequency spectrum for the harmonically rich signal 7130 having harmonic images 7152*a–n*. The images 7152 repeat at harmonics of the sampling frequency $I/T_S$, at infinitum, where each image 7152 contains the necessary amplitude, frequency, and phase information to reconstruct the baseband signal 7110. As discussed further below, the relative amplitude of the frequency images is generally a function of the harmonic number and the pulse width $T_A$. As such, the relative amplitude of a particular harmonic 7152 can be increased (or decreased) by adjusting the pulse width $T_A$ of the control signal 7123. In general, shorter pulse widths of $T_A$ shift more energy into the higher frequency harmonics, and longer pulse widths of $T_A$ shift energy into the lower frequency harmonics. The generation of harmonically rich signals by sampling an input signal according to a controlled aperture have been described earlier in this application in the section titled, "Frequency Up-conversion Using Universal Frequency Translation", and is illustrated by FIGS. 3–6. A more detailed discussion of frequency up-conversion using a switch with a controlled sampling aperture is discussed in the co-pending patent application titled, "Method and System for Frequency Up-Conversion," Ser. No. 09/176,154, field on Oct. 21, 1998, and incorporated herein by reference.

In step 8510, the UFT module 7128 samples the combined signal 7122 according to the control signal 7127 to generate harmonically rich signal 7134. More specifically, the switch 7150 closes during the pulse widths $T_A$ of the control signal 7127 to sample the combined signal 7122 resulting in the harmonically rich signal 7134. The harmonically rich signal 7134 includes multiple frequency images of baseband signal 7110 that repeat at harmonics of the sampling frequency ($1/T_S$), similar to that for the harmonically rich signal 7130. However, the images in the signal 7134 are phase-shifted compared to those in signal 7130 because of the inversion of signal 7116 compared to signal 7114, and because of the relative phase shift between the control signals 7123 and 7127.

Figure 71C:
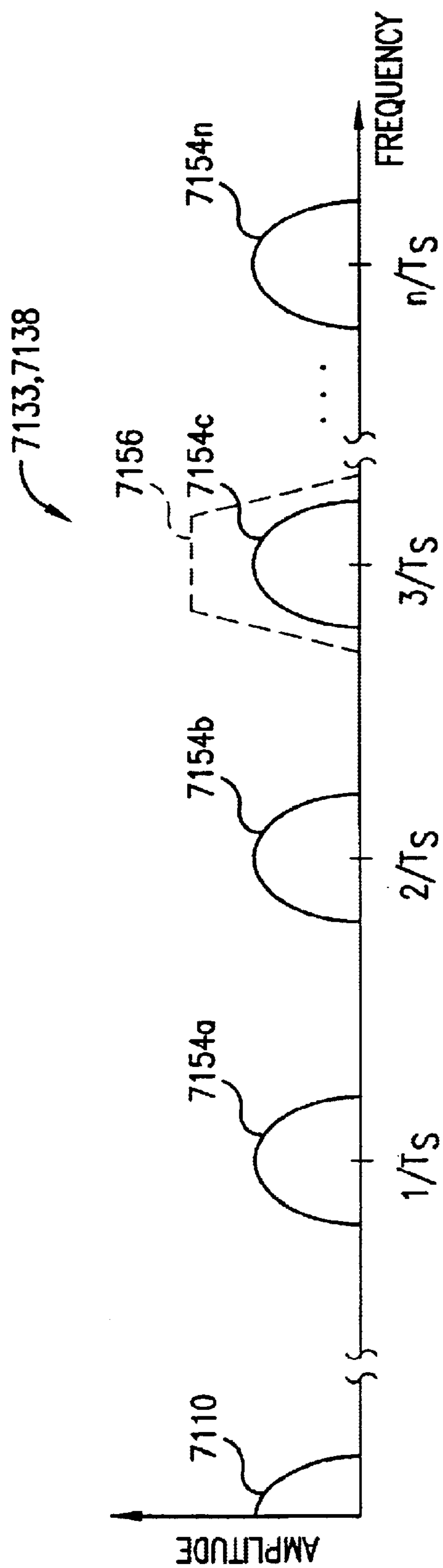

In step 8512, the node 7132 sums the harmonically rich signals 7130 and 7134 to generate harmonically rich signal 7133. FIG. 71C illustrates an exemplary frequency spectrum for the harmonically rich signal 7133 that has multiple images 7154*a–n* that repeat at harmonics of the sampling frequency $1/T_S$. Each image 7154 includes the necessary amplitude, frequency and phase information to reconstruct the baseband signal 7110. The capacitor 7136 operates as a DC blocking capacitor and substantially passes the harmonics in the harmonically rich signal 7133 to generate harmonically rich signal 7138 at the output of the modulator 7104.

In step 8408, the optional filter 7106 can be used to select a desired harmonic image for transmission. This is represented for example by a passband 7156 that selects the harmonic image 7154*c* for transmission in FIG. 71C.

An advantage of the modulator 7104 is that it is fully balanced, which substantially minimizes (or eliminates) any DC voltage offset between the two UFT modules 7124 and 7128. DC offset is minimized because the reference voltage 7113 contributes a consistent DC component to the input signals 7120 and 7122 through the summing amplifiers 7118 and 7119, respectively. Furthermore, the reference voltage 7113 is also directly coupled to the outputs of the UFT modules 7124 and 7128 through the inductor 7126 and the node 7132. The result of controlling the DC offset between the UFT modules is that carrier insertion is minimized in the harmonic images of the harmonically rich signal 7138. As discussed above, carrier insertion is substantially wasted energy because the information for a modulated signal is carried in the sidebands of the modulated signal and not in the carrier. Therefore, it is often desirable to minimize the energy at the carrier frequency by controlling the relative DC offset.

7.3.1.2 Balanced Modulator Example Signal Diagrams and Mathematical Description

Figure 72D:
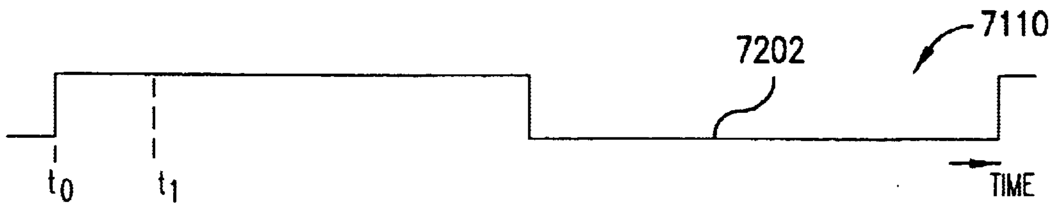
Figure 72E:
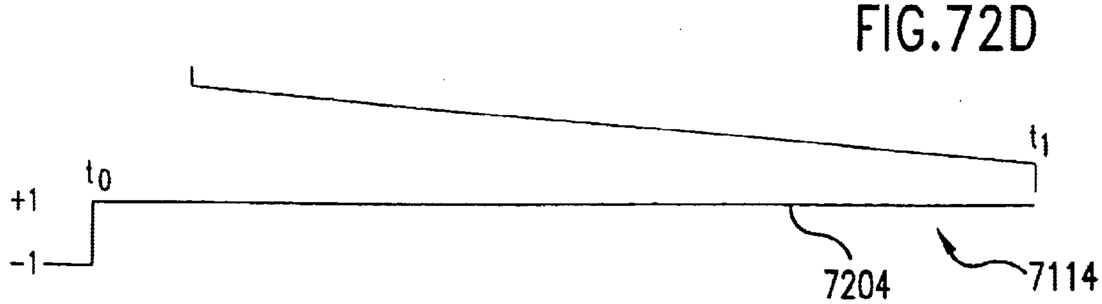
Figure 72F:
Figure 72G:
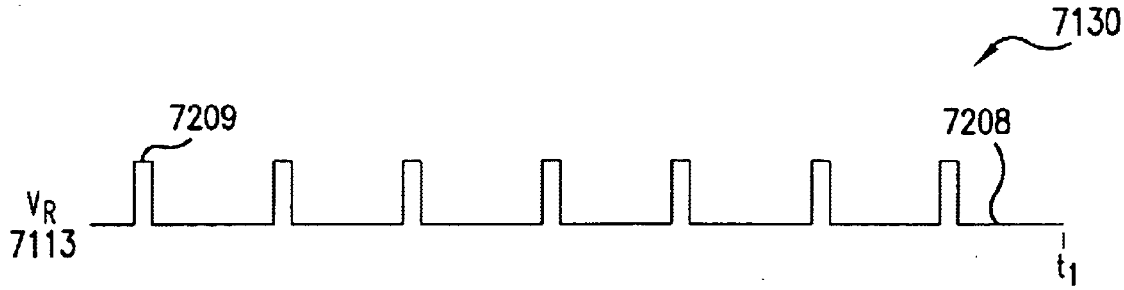

In order to further describe the invention, FIGS. 72D–72I illustrate various example signal diagrams (vs. time) that are representative of the invention. These signal diagrams are meant for example purposes only and are not meant to be limiting. FIG. 72D illustrates a signal 7202 that is representative of the input baseband signal 7110 (FIG. 71A). FIG. 72E illustrates a step function 7204 that is an expanded portion of the signal 7202 from time $t_0$ to $t_1$, and represents signal 7114 at the output of the buffer/inverter 7112. Similarly, FIG. 72F illustrates a signal 7206 that is an inverted version of the signal 7204, and represents the signal 7116 at the inverted output of buffer/inverter 7112. For analysis purposes, a step function is a good approximation for a portion of a single bit of data (for the baseband signal 7110) because the clock rates of the control signals 7123 and 7127 are significantly higher than the data rates of the baseband signal 7110. For example, if the data rate is in the KHz frequency range, then the clock rate will preferably be in MHZ frequency range in order to generate an output signal in the Ghz frequency range.

Figure 72H:
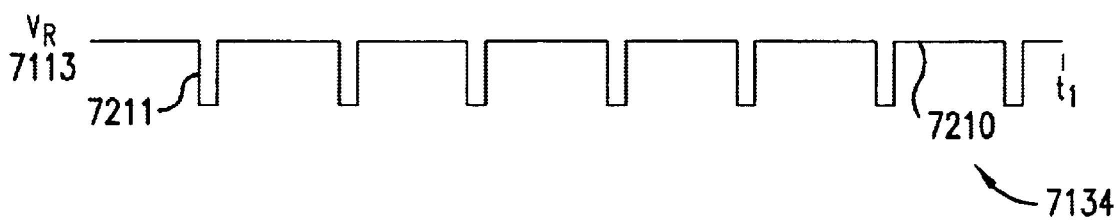

Still referring to FIGS. 72D–I, FIG. 72G illustrates a signal 7208 that an example of the harmonically rich signal 7130 when the step function 7204 is sampled according to the control signal 7123 in FIG. 72B. The signal 7208 includes positive pulses 7209 as referenced to the DC voltage 7113. Likewise, FIG. 72H illustrates a signal 7210 that is an example of the harmonically rich signal 7134 when the step function 7206 is sampled according to the control signal 7127. The signal 7210 includes negative pulses 7211 as referenced to the DC voltage 7113, which are time-shifted relative the positive pulses 7209 in signal 7208.

Figure 72I:
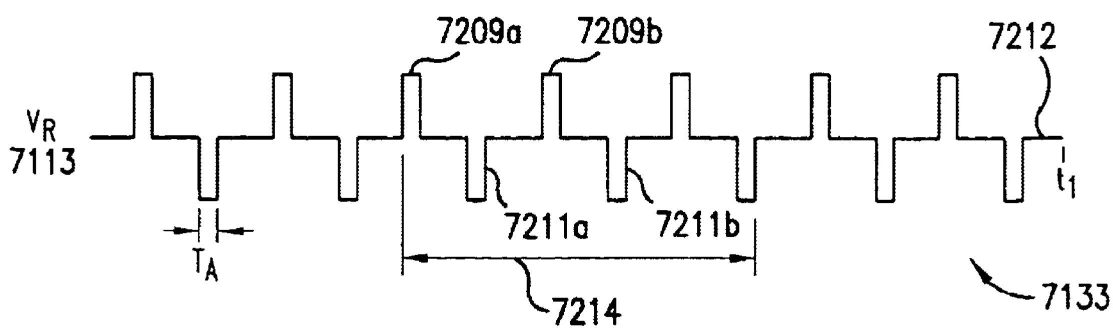

Still referring to FIGS. 72D–I, the FIG. 72I illustrates a signal 7212 that is the combination of signal 7208 (FIG. 72G) and the signal 7210 (FIG. 72H), and is an example of the harmonically rich signal 7133 at the output of the summing node 7132. As illustrated, the signal 7212 spends approximately as much time above the DC reference voltage 7113 as below the DC reference voltage 7113 over a limited time period. For example, over a time period 7214, the energy in the positive pulses 7209*a–b* is canceled out by the energy in the negative pulses 7211*a–b*. This is indicative of minimal (or zero) DC offset between the UFT modules 7124 and 7128, which results in minimal carrier insertion during the sampling process.

Still referring to FIG. 72I, the time axis of the signal 7212 can be phased in such a manner to represent the waveform as an odd function. For such an arrangement, the Fourier series is readily calculated to obtain:

$$I_c(t)=\sum_{n=1}^{\infty}\left(\frac{4\sin\left(\frac{n\pi T_A}{T_S}\right)\cdot\sin\left(\frac{n\pi}{2}\right)}{n\pi}\right)\cdot\sin\left(\frac{2n\pi t}{T_S}\right). \quad \text{Equation 1}$$

where:

$T_S$=period of the master clock 7145

$T_A$=pulse width of the control signals 7123 and 7127 n=harmonic number

As shown by Equation 1, the relative amplitude of the frequency images is generally a function of the harmonic number n, and the ratio of $T_A/T_S$. As indicated, the $T_A/T_S$ ratio represents the ratio of the pulse width of the control signals relative to the period of the sub-harmonic master clock. The $T_A/T_S$ ratio can be optimized in order to maximize the amplitude of the frequency image at a given harmonic. For example, if a passband waveform is desired to be created at 5× the frequency of the sub-harmonic clock, then a baseline power for that harmonic extraction may be calculated for the fifth harmonic (n=5) as:

$$I_c(t)=\left(\frac{4\sin\left(\frac{5\pi T_A}{T_S}\right)}{5\pi}\right)\cdot\sin(5\omega_S t). \quad \text{Equation 2}$$

As shown by Equation 2, $I_C(t)$ for the fifth harmonic is a sinusoidal function having an amplitude that is proportional to the $\sin(5\pi T_A/T_S)$. The signal amplitude can be maximized by setting $T_A=(1/10\cdot T_S)$ so that $\sin(5\pi T_A/T_S)=\sin(\pi/2)=1$. Doing so results in the equation:

$$I_c(t)\big|_{n=5}=\frac{4}{5\pi}(\sin(5\omega_S t)). \quad \text{Equation 3}$$

This component is a frequency at 5× of the sampling frequency of sub-harmonic clock, and can be extracted from the Fourier series via a bandpass filter (such as bandpass filter 7106) that is centered around $5f_S$. The extracted frequency component can then be optionally amplified by the amplifier 7108 prior to transmission on a wireless or wire-line communications channel or channels.

Equation 3 can be extended to reflect the inclusion of a message signal as illustrated by equation 4 below:

$$m(t)\cdot I_c(t)\big|_{\substack{n=5\\ \theta=\theta(t)}}=\frac{4\cdot m(t)}{5\pi}(\sin(5\omega_S t+5\theta(t))). \quad \text{Equation 4}$$

Equation 4 illustrates that a message signal can be carried in harmonically rich signals 7133 such that both amplitude and phase can be modulated. In other words, m(t) is modulated for amplitude and θ(t) is modulated for phase. In such cases, it should be noted that θ(t) is augmented modulo n while the amplitude modulation m(t) is simply scaled. Therefore, complex waveforms may be reconstructed from their Fourier series with multiple aperture UFT combinations.

As discussed above, the signal amplitude for the 5th harmonic was maximized by setting the sampling aperture width $T_A=1/10 T_S$, where $T_S$ is the period of the master clock signal. This can be restated and generalized as setting $T_A=1/2$ the period (or π radians) at the harmonic of interest. In other words, the signal amplitude of any harmonic n can be maximized by sampling the input waveform with a sampling aperture of $T_A=1/2$ the period of the harmonic of interest (n). Based on this discussion, it is apparent that varying the aperture changes the harmonic and amplitude content of the output waveform. For example, if the sub-harmonic clock has a frequency of 200 MHZ, then the fifth harmonic is at 1 Ghz. The amplitude of the fifth harmonic is maximized by setting the aperture width $T_A$=500 picoseconds, which equates to ½ the period (or π radians) at 1 Ghz.

Figure 72J:
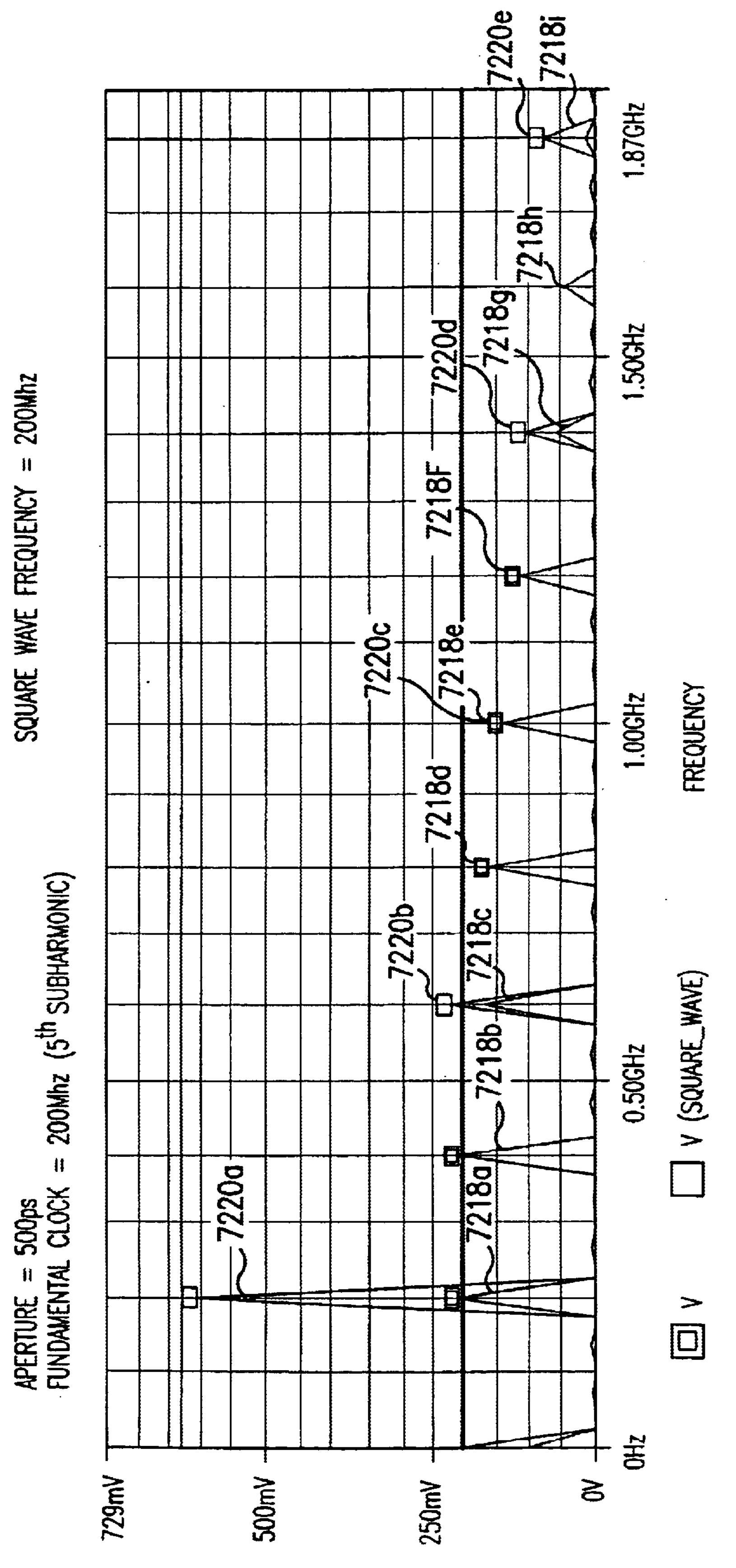
FIG. 72J illustrates an example frequency spectrum that is associated with a modulator 7104, according to embodiments of the present invention.

FIG. 72J depicts a frequency plot 7216 that graphically illustrates the effect of varying the sampling aperture of the control signals on the harmonically rich signal 7133 given a 200 MHZ harmonic clock. The frequency plot 7216 compares two frequency spectrums 7218 and 7220 for different control signal apertures given a 200 MHZ clock. More specifically, the frequency spectrum 7218 is an example spectrum for signal 7133 given the 200 MHZ clock with the aperture $T_A$=500 psec (where 500 psec is π radians at the 5th harmonic of 1 GHz). Similarly, the frequency spectrum 7220 is an example spectrum for signal 7133 given a 200 MHZ clock that is a square wave (so $T_A$=5000 psec). The spectrum 7218 includes multiple harmonics 7218*a*–I, and the frequency spectrum 7220 includes multiple harmonics 7220*a*–*e*. [It is noted that spectrum 7220 includes only the odd harmonics as predicted by Fourier analysis for a square wave.] At 1 Ghz (which is the 5th harmonic), the signal amplitude of the two frequency spectrums 7218*e* and 7220*c* are approximately equal. However, at 200 MHZ, the frequency spectrum 7218*a* has a much lower amplitude than the frequency spectrum 7220*a*, and therefore the frequency spectrum 7218 is more efficient than the frequency spectrum 7220, assuming the desired harmonic is the 5th harmonic. In other words, assuming 1 Ghz is the desired harmonic, the frequency spectrum 7218 wastes less energy at the 200 MHZ fundamental than does the frequency spectrum 7218.

7.3.1.3 Balanced Modulator Having a Shunt Configuration

Figure 79A:
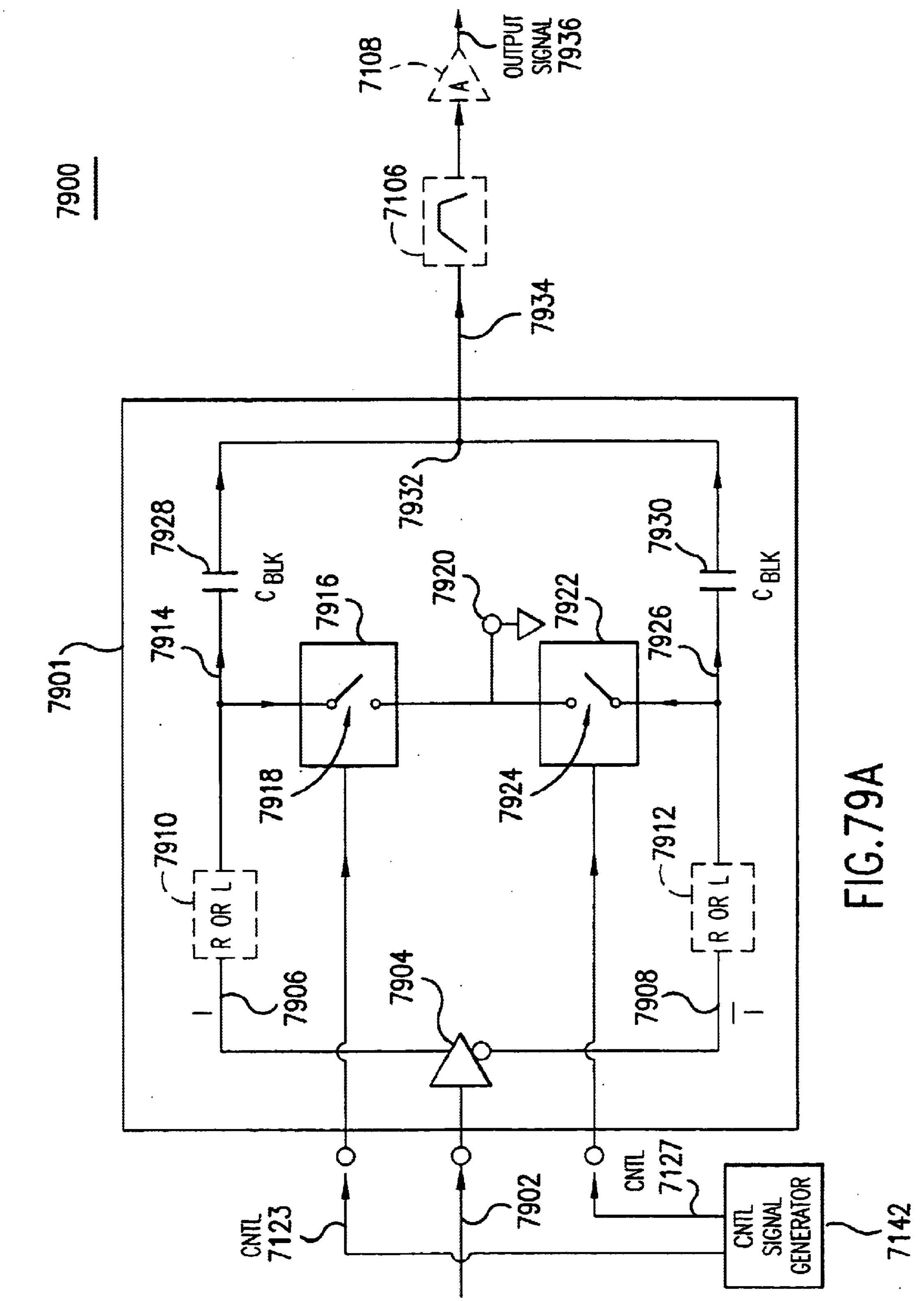
FIG. 79A illustrate a transmitter 7900, according to embodiments of the present invention.

FIG. 79A illustrates a universal transmitter 7900 that is a second embodiment of a universal transmitter having two balanced UFT modules in a shunt configuration. (In contrast, the balanced modulator 7104 can be described as having a series configuration based on the orientation of the UFT modules.) Transmitter 7900 includes a balanced modulator 7901, the control signal generator 7142, the optional bandpass filter 7106, and the optional amplifier 7108. The transmitter 7900 up-converts a baseband signal 7902 to produce an output signal 7936 that is conditioned for wireless or wire line transmission. In doing so, the balanced modulator 7901 receives the baseband signal 7902 and shunts the baseband signal to ground in a differential and balanced fashion to generate a harmonically rich signal 7934. The harmonically rich signal 7934 includes multiple harmonic images, where each image contains the baseband information in the baseband signal 7902. In other words, each harmonic image includes the necessary amplitude, frequency, and phase information to reconstruct the baseband signal 7902. The optional bandpass filter 7106 may be included to select a harmonic of interest (or a subset of harmonics) in the signal 7934 for transmission. The optional amplifier 7108 may be included to amplify the selected harmonic prior to transmission, resulting in the output signal 7936.

Figure 86:
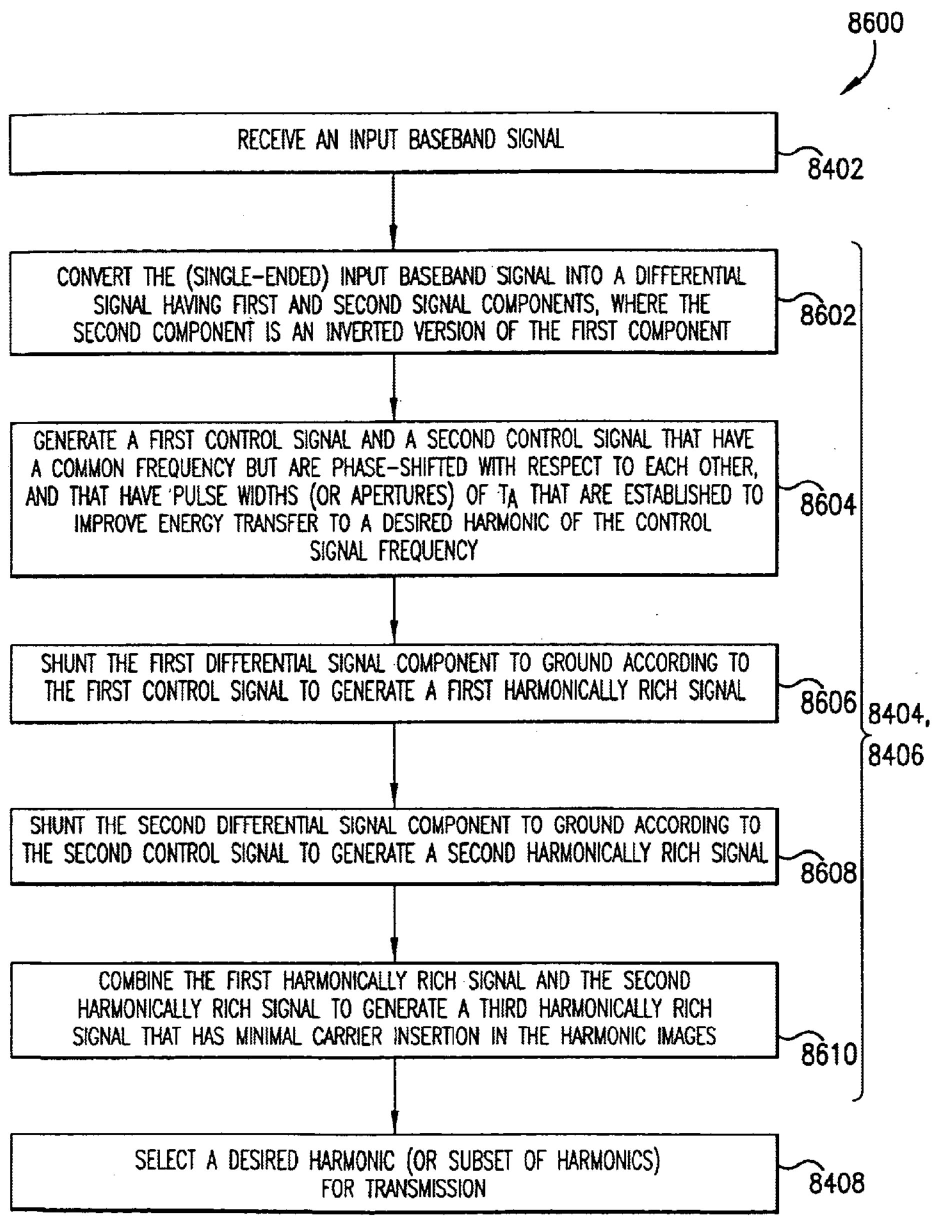
FIG. 86 illustrates a flowchart 8600 that is associated with the transmitter 7900 and further defines the flowchart 8400 in the FIG. 84, according to embodiments of the invention.

The balanced modulator 7901 includes the following components: a buffer/inverter 7904; optional impedances 7910, 7912; UFT modules 7916 and 7922 having controlled switches 7918 and 7924, respectively; blocking capacitors 7928 and 7930; and a terminal 7920 that is tied to ground. As stated above, the balanced modulator 7901 differentially shunts the baseband signal 7902 to ground, resulting in a harmonically rich signal 7934. More specifically, the UFT modules 7916 and 7922 alternately shunts the baseband signal to terminal 7920 according to control signals 7123 and 7127, respectively. Terminal 7920 is tied to ground and prevents any DC offset voltages from developing between the UFT modules 7916 and 7922. As described above, a DC offset voltage can lead to undesired carrier insertion. The operation of the balanced modulator 7901 is described in greater detail according to the flowchart 8600 (FIG. 86) as follows.

In step 8402, the buffer/inverter 7904 receives the input baseband signal 7902 and generates I signal 7906 and inverted I signal 7908. I signal 7906 is substantially similar to the baseband signal 7902, and the inverted I signal 7908 is an inverted version of signal 7902. As such, the buffer/inverter 7904 converts the (single-ended) baseband signal 7902 into differential signals 7906 and 7908 that are sampled by the UFT modules. Buffer/inverter 7904 can be implemented using known operational amplifier (op amp) circuits, as will be understood by those skilled in the arts, although the invention is not limited to this example.

In step 8604, the control signal generator 7142 generates control signals 7123 and 7127 from the master clock signal 7145. Examples of the master clock signal 7145, control signal 7123, and control signal 7127 are shown in FIGS. 72A–C, respectively. As illustrated, both control signals 7123 and 7127 have the same period $T_S$ as a master clock signal 7145, but have a pulse width (or aperture) of $T_A$. Control signal 7123 triggers on the rising pulse edge of the master clock signal 7145, and control signal 7127 triggers on the falling pulse edge of the master clock signal 7145. Therefore, control signals 7123 and 7127 are shifted in time by 180 degrees relative to each other. A specific embodiment of the control signal generator 7142 is illustrated in FIG. 71A, and was discussed in detail above.

Figure 79B:
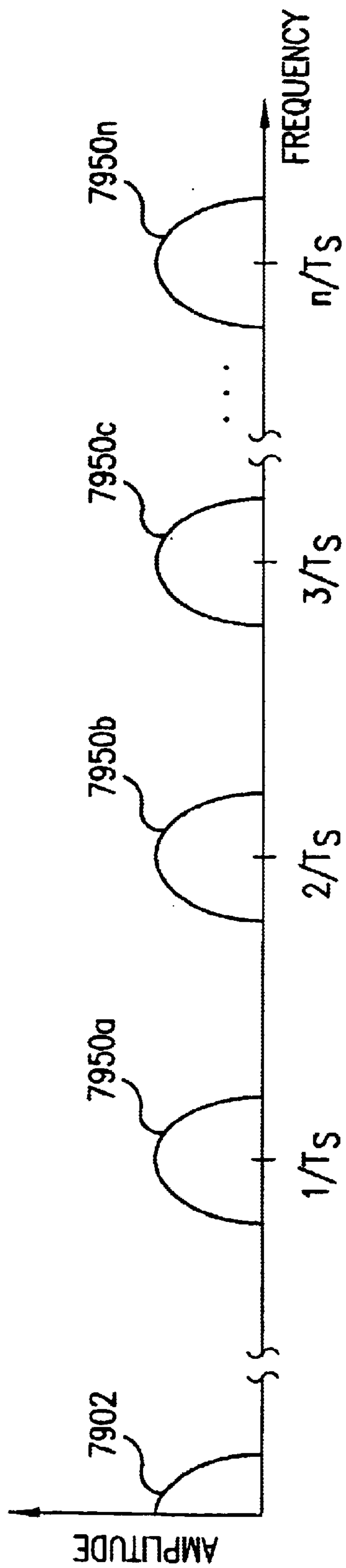
FIGS. 79B–C illustrate various frequency spectrums that are associated with the transmitter 7900.

In step 8606, the UFT module 7916 shunts the signal 7906 to ground according to the control signal 7123, to generate a harmonically rich signal 7914. More specifically, the switch 7918 closes and shorts the signal 7906 to ground (at terminal 7920) during the aperture width $T_A$ of the control signal 7123, to generate the harmonically rich signal 7914. FIG. 79B illustrates an exemplary frequency spectrum for the harmonically rich signal 7918 having harmonic images 7950*a*–*n*. The images 7950 repeat at harmonics of the sampling frequency $I/T_S$, at infinitum, where each image 7950 contains the necessary amplitude, frequency, and phase information to reconstruct the baseband signal 7902. The generation of harmonically rich signals by sampling an input signal according to a controlled aperture have been described earlier in this application in the section titled, "Frequency Up-conversion Using Universal Frequency Translation", and is illustrated by FIGS. 3–6. A more detailed discussion of frequency up-conversion using a switch with a controlled sampling aperture is discussed in the co-pending patent application titled, "Method and System for Frequency Up-Conversion," Ser. No. 09/176,154, field on Oct. 21, 1998, and incorporated herein by reference.

The relative amplitude of the frequency images 7950 are generally a function of the harmonic number and the pulse width $T_A$. As such, the relative amplitude of a particular harmonic 7950 can be increased (or decreased) by adjusting the pulse width $T_A$ of the control signal 7123. In general, shorter pulse widths of $T_A$ shift more energy into the higher frequency harmonics, and longer pulse widths of $T_A$ shift energy into the lower frequency harmonics, as described by equations 1–4 above. Additionally, the relative amplitude of a particular harmonic 7950 can also be adjusted by adding/tuning an optional impedance 7910. Impedance 7910 operates as a filter that emphasizes a particular harmonic in the harmonically rich signal 7914.

In step 8608, the UFT module 7922 shunts the inverted signal 7908 to ground according to the control signal 7127, to generate a harmonically rich signal 7926. More specifically, the switch 7924 closes during the pulse widths $T_A$ and shorts the inverted I signal 7908 to ground (at terminal 7920), to generate the harmonically rich signal 7926. At any given time, only one of input signals 7906 or 7908 is shorted to ground because the pulses in the control signals 7123 and 7127 are phase shifted with respect to each other, as shown in FIGS. 72B and 72C.

The harmonically rich signal 7926 includes multiple frequency images of baseband signal 7902 that repeat at harmonics of the sampling frequency ($1/T_S$), similar to that for the harmonically rich signal 7914. However, the images in the signal 7926 are phase-shifted compared to those in signal 7914 because of the inversion of the signal 7908 compared to the signal 7906, and because of the relative phase shift between the control signals 7123 and 7127. The optional impedance 7912 can be included to emphasis a particular harmonic of interest, and is similar to the impedance 7910 above.

Figure 79C:
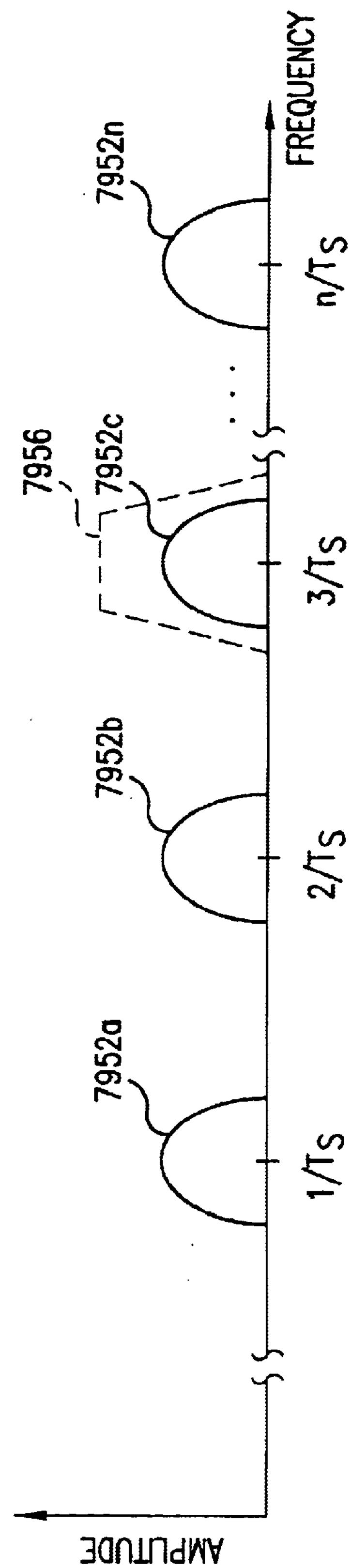

In step 8610, the node 7932 sums the harmonically rich signals 7914 and 7926 to generate the harmonically rich signal 7934. The capacitors 7928 and 7930 operate as blocking capacitors that substantially pass the respective harmonically rich signals 7914 and 7926 to the node 7932. (The capacitor values may be chosen to substantially block baseband frequency components as well.) FIG. 79C illustrates an exemplary frequency spectrum for the harmonically rich signal 7934 that has multiple images 7952*a–n* that repeat at harmonics of the sampling frequency $1/T_S$. Each image 7952 includes the necessary amplitude, frequency, and phase information to reconstruct the baseband signal 7902. The optional filter 7106 can be used to select the harmonic image of interest for transmission. This is represented by a passband 7956 that selects the harmonic image 7932*c* for transmission.

An advantage of the modulator 7901 is that it is fully balanced, which substantially minimizes (or eliminates) any DC voltage offset between the two UFT modules 7912 and 7914. DC offset is minimized because the UFT modules 7916 and 7922 are both connected to ground at terminal 7920. The result of controlling the DC offset between the UFT modules is that carrier insertion is minimized in the harmonic images of the harmonically rich signal 7934. As discussed above, carrier insertion is substantially wasted energy because the information for a modulated signal is carried in the sidebands of the modulated signal and not in the carrier. Therefore, it is often desirable to minimize the energy at the carrier frequency by controlling the relative DC offset.

7.3.1.4 Balanced Modulator FET Configuration

Figure 71D:
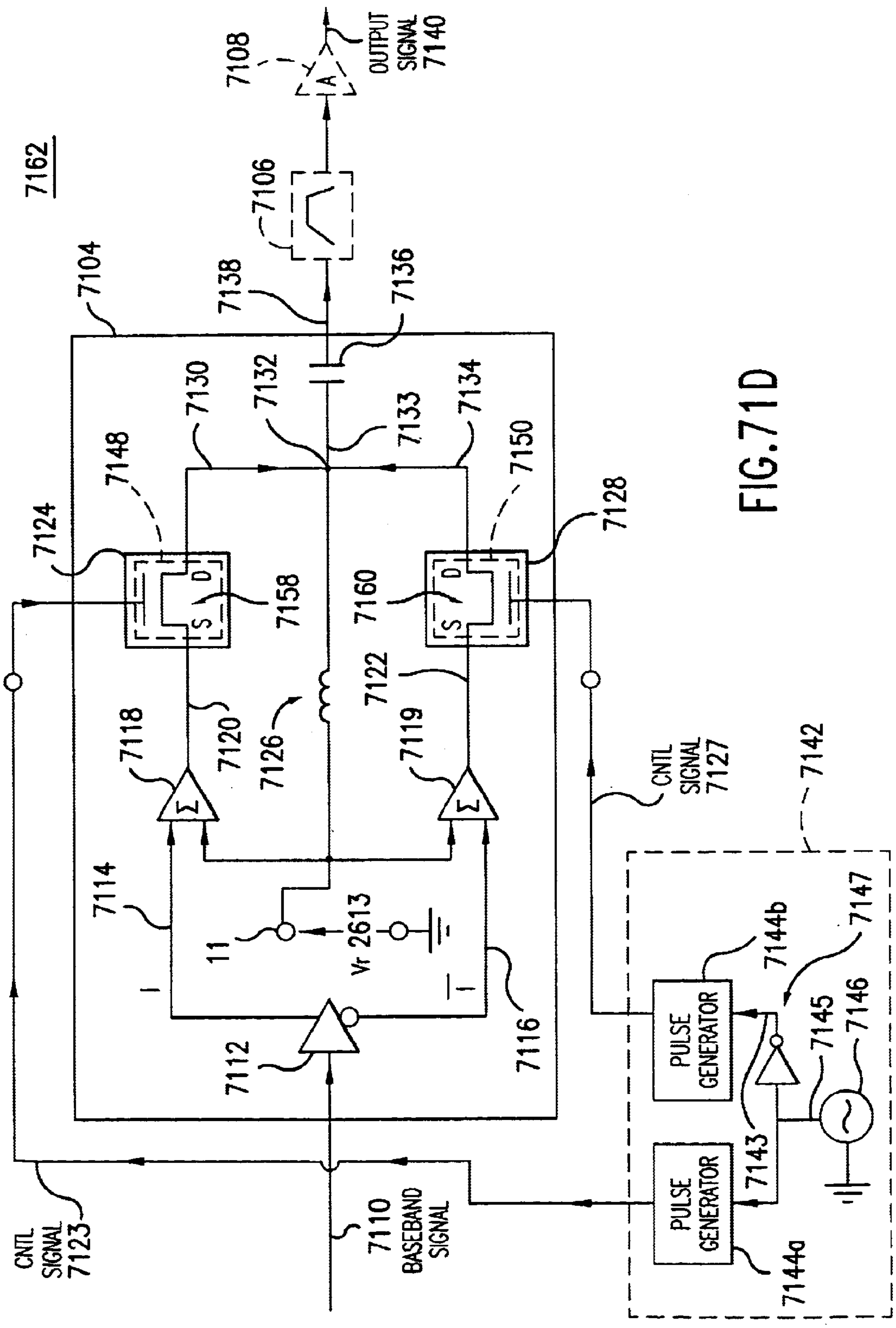
FIG. 71D illustrates example FET configurations of the balanced transmitter 7102, according to embodiments of the present invention.
Figure 79D:
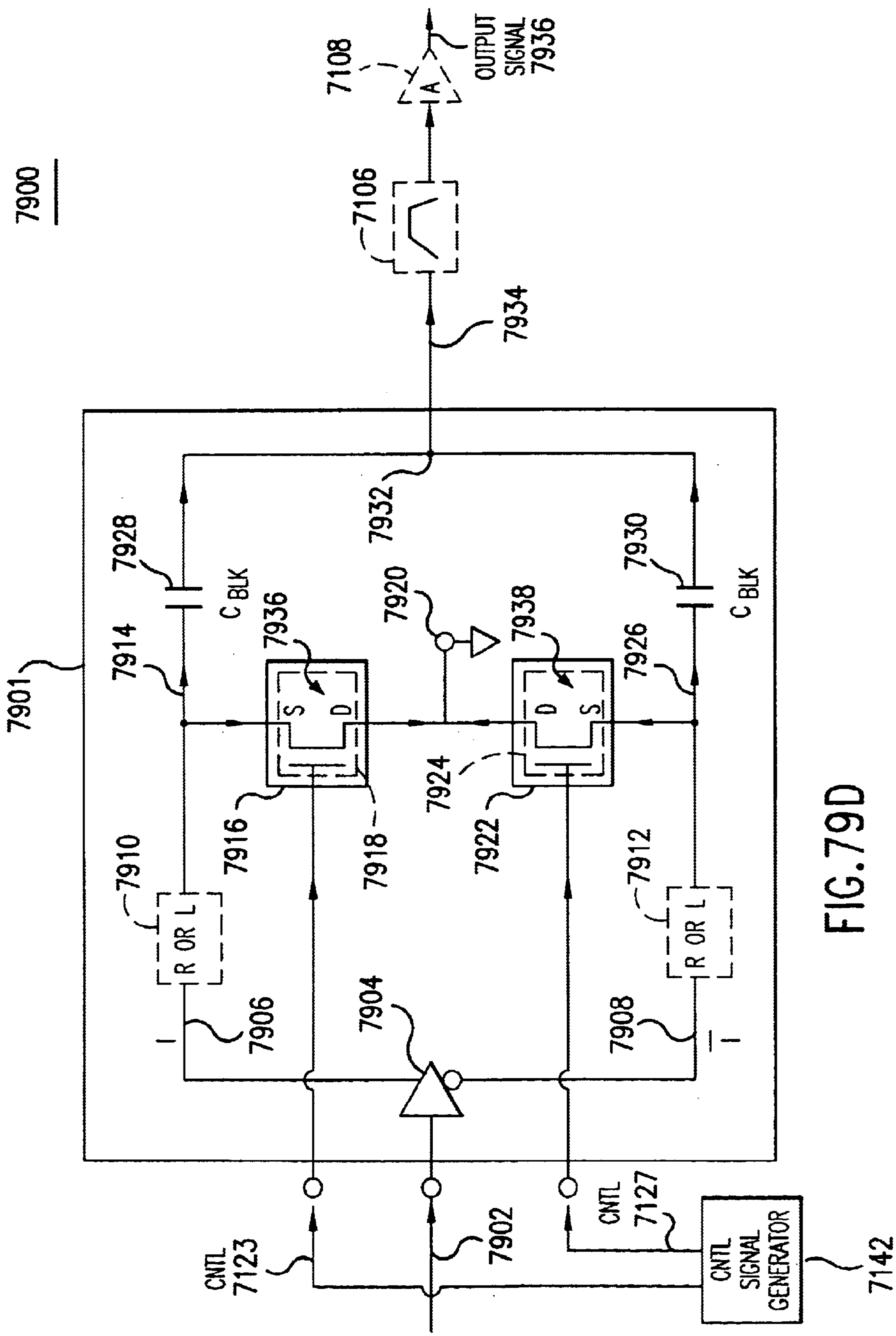
FIG. 79D illustrates a FET configuration for the transmitter 7900, according to embodiments of the present invention.

As described above, the balanced modulators 7104 and 7901 utilize two balanced UFT modules to sample the input baseband signals to generate harmonically rich signals that contain the up-converted baseband information. More specifically, the UFT modules include controlled switches that sample the baseband signal in a balanced and differential fashion. FIGS. 71D and 79D illustrate embodiments of the controlled switch in the UFT module.

FIG. 71D illustrates an example embodiment of the modulator 7104 (FIG. 71B) where the controlled switches in the UFT modules are field effect transistors (FET). More specifically, the controlled switches 7148 and 7128 are embodied as FET 7158 and FET 7160, respectively. The FET 7158 and 7160 are oriented so that their gates are controlled by the control signals 7123 and 7127, so that the control signals control the FET conductance. For the FET 7158, the combined baseband signal 7120 is received at the source of the FET 7158 and is sampled according to the control signal 7123 to produce the harmonically rich signal 7130 at the drain of the FET 7158. Likewise, the combined baseband signal 7122 is received at the source of the FET 7160 and is sampled according to the control signal 7127 to produce the harmonically rich signal 7134 at the drain of FET 7160. The source and drain orientation that is illustrated is not limiting, as the source and drains can be switched for most FETs. In other words, the combined baseband signal can be received at the drain of the FETs, and the harmonically rich signals can be taken from the source of the FETs, as will be understood by those skilled in the relevant arts.

FIG. 79D illustrates an embodiment of the modulator 7900 (FIG. 79A) where the controlled switches in the UFT modules are field effect transistors (FET). More specifically, the controlled switches 7918 and 7924 are embodied as FET 7936 and FET 7938, respectively. The FETs 7936 and 7938 are oriented so that their gates are controlled by the control signals 7123 and 7127, respectively, so that the control signals determine FET conductance. For the FET 7936, the baseband signal 7906 is received at the source of the FET 7936 and shunted to ground according to the control signal 7123, to produce the harmonically rich signal 7914. Likewise, the baseband signal 7908 is received at the source of the FET 7938 and is shunted to grounding according to the control signal 7127, to produce the harmonically rich signal 7926. The source and drain orientation that is illustrated is not limiting, as the source and drains can be switched for most FETs, as will be understood by those skilled in the relevant arts.

7.3.1.5 Universal Transmitter Configured for Carrier Insertion

As discussed above, the transmitters 7102 and 7900 have a balanced configuration that substantially eliminates any DC offset and results in minimal carrier insertion in the output signal 7140. Minimal carrier insertion is generally desired for most applications because the carrier signal carries no information and reduces the overall transmitter efficiency. However, some applications require the received signal to have sufficient carrier energy for the receiver to extract the carrier for coherent demodulation. In support thereof, the present invention can be configured to provide the necessary carrier insertion by implementing a DC offset between the two sampling UFT modules.

Figure 73A:
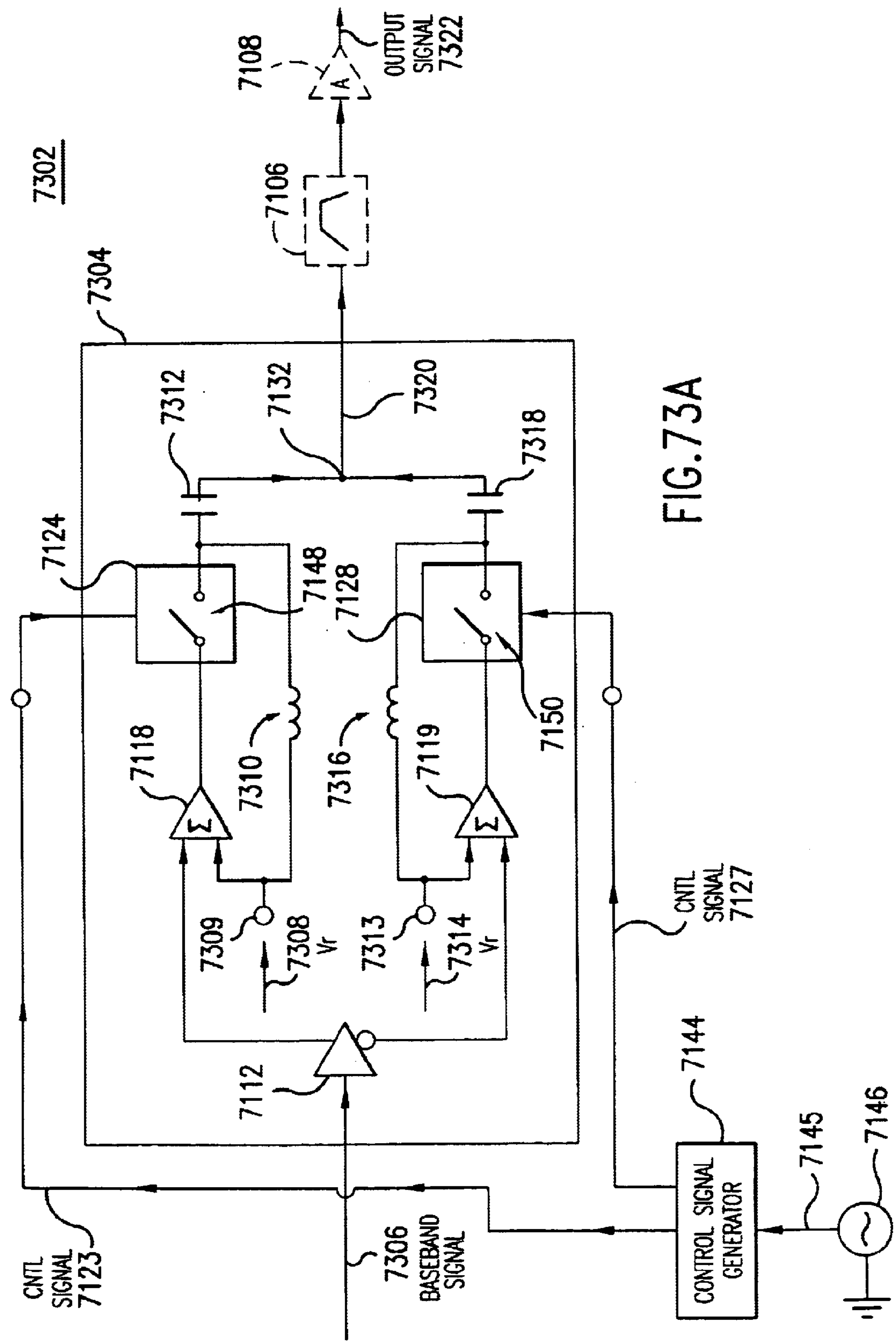
FIG. 73A illustrate a transmitter 7302 that is configured for carrier insertion, according to embodiments of the present invention.

FIG. 73A illustrates a transmitter 7302 that up-converts a baseband signal 7306 to an output signal 7322 having carrier insertion. As is shown, the transmitter 7302 is similar to the transmitter 7102 (FIG. 71A) with the exception that the up-converter/modulator 7304 is configured to accept two DC references voltages. In contrast, modulator 7104 was configured to accept only one DC reference voltage. More specifically, the modulator 7304 includes a terminal 7309 to accept a DC reference voltage 7308, and a terminal 7313 to accept a DC reference voltage 7314. Vr 7308 appears at the UFT module 7124 though summer amplifier 7118 and the inductor 7310. Vr 7314 appears at UFT module 7128 through the summer amplifier 7119 and the inductor 7316. Capacitors 7312 and 7318 operate as blocking capacitors. If Vr 7308 is different from Vr 7314 then a DC offset voltage will be exist between UFT module 7124 and UFT module 7128, which will be up-converted at the carrier frequency in the harmonically rich signal 7320. More specifically, each harmonic image in the harmonically rich signal 7320 will include a carrier signal as depicted in FIG. 73B.

Figure 73B:
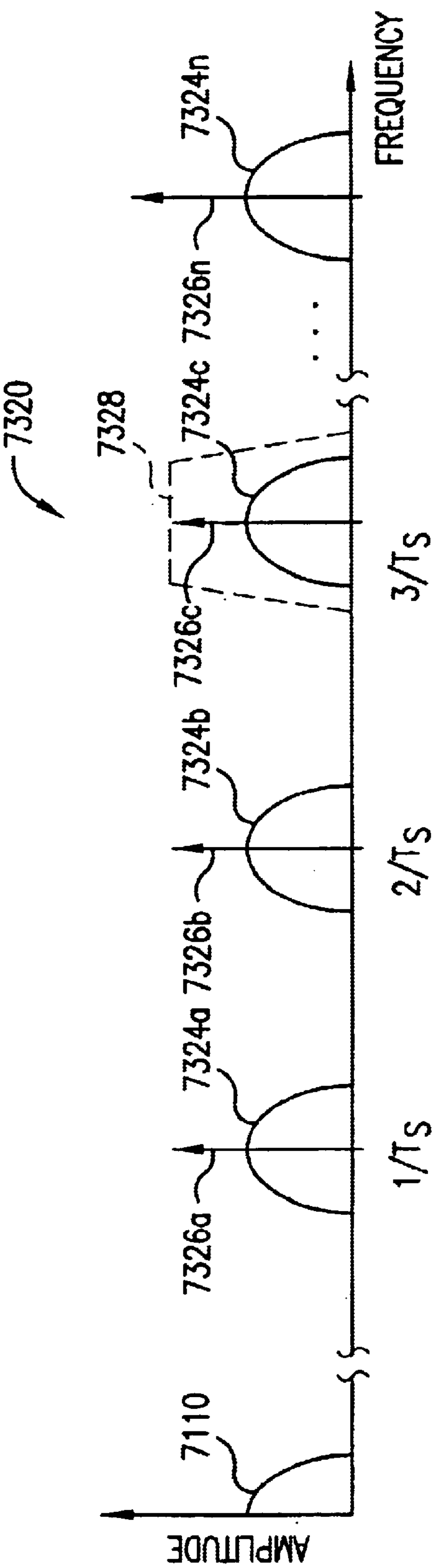
FIG. 73B illustrates example signals associated with the transmitter 7302, according to embodiments of the invention.

FIG. 73B illustrates an exemplary frequency spectrum for the harmonically rich signal 7320 that has multiple harmonic images 7324*a–n*. In addition to carrying the baseband information in the sidebands, each harmonic image 7324 also includes a carrier signal 7326 that exists at respective harmonic of the sampling frequency $1/T_S$. The amplitude of the carrier signal increases with increasing DC offset voltage. Therefore, as the difference between Vr 7308 and Vr 7314 widens, the amplitude of each carrier signal 7326 increases. Likewise, as the difference between Vr 7308 and Vr 7314 shrinks, the amplitude of each carrier signal 7326 shrinks. As with transmitter 7302, the optional bandpass filter 7106 can be included to select a desired harmonic image for transmission. This is represented by passband 7328 in FIG. 73B.

7.3.2 Universal Transmitter In I Q Configuration

As described above, the balanced modulators 7104 and 7901 up-convert a baseband signal to a harmonically rich signal having multiple harmonic images of the baseband information. By combining two balanced modulators, IQ configurations can be formed for up-converting I and Q baseband signals. In doing so, either the (series type) balanced modulator 7104 or the (shunt type) balanced modulator 7901 can be utilized. IQ modulators having both series and shunt configurations are described below.

7.3.2.1 IQ Transmitter Using Series-Type Balanced Modulator

Figure 74:
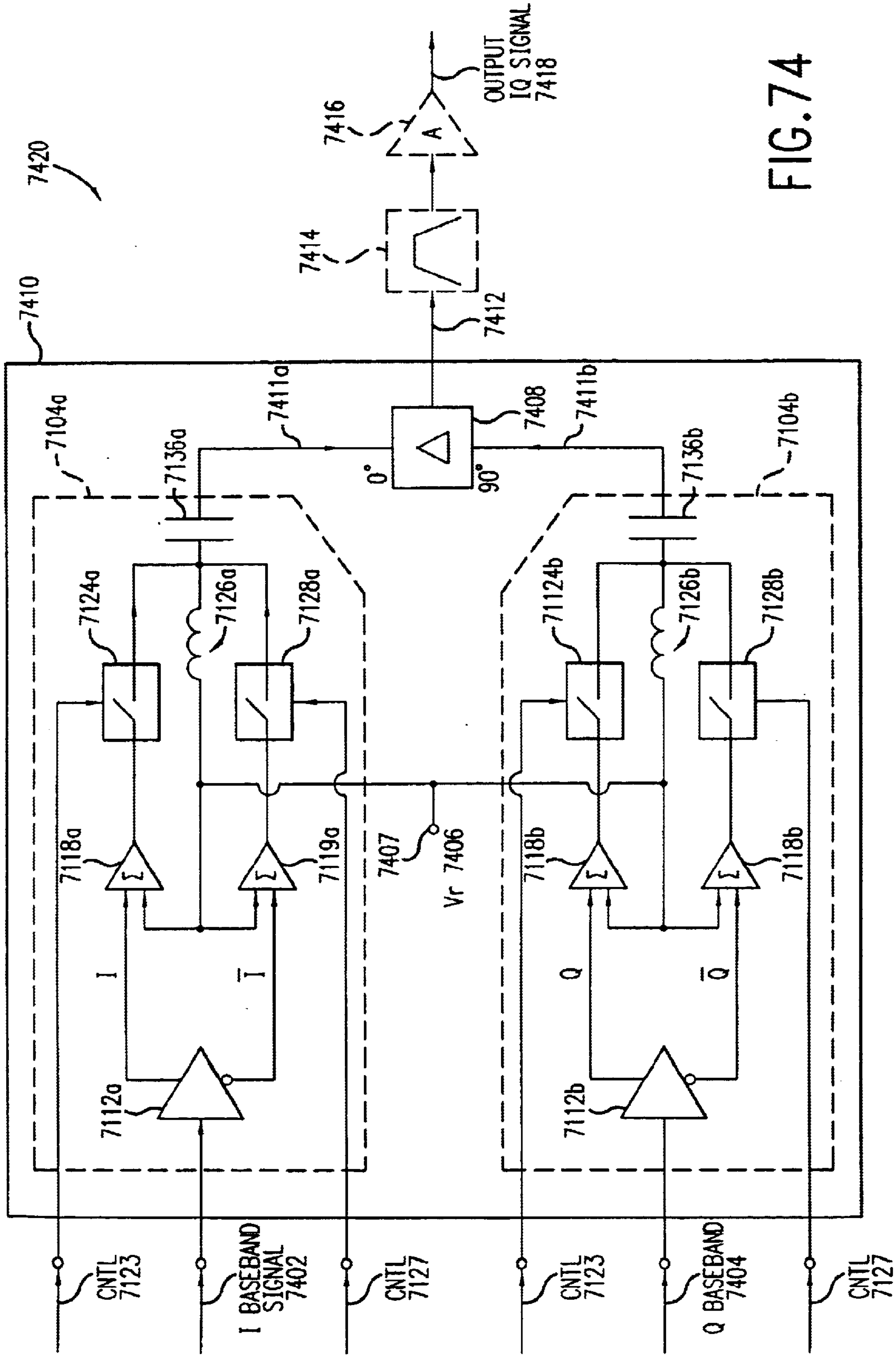
FIG. 74 illustrates an IQ balanced transmitter 7420, according to embodiments of the present invention.

FIG. 74 illustrates an IQ transmitter 7420 with an in-phase (I) and quadrature (Q) configuration according to embodiments of the invention. The transmitter 7420 includes an IQ balanced modulator 7410, an optional filter 7414, and an optional amplifier 7416. The transmitter 7420 is useful for transmitting complex I Q waveforms and does so in a balanced manner to control DC offset and carrier insertion. In doing so, the modulator 7410 receives an I baseband signal 7402 and a Q baseband signal 7404 and up-converts these signals to generate a combined harmonically rich signal 7412. The harmonically rich signal 7412 includes multiple harmonics images, where each image contains the baseband information in the I signal 7402 and the Q signal 7404. The optional bandpass filter 7414 may be included to select a harmonic of interest (or subset of harmonics) from the signal 7412 for transmission. The optional amplifier 7416 may be included to amplify the selected harmonic prior to transmission, to generate the IQ output signal 7418.

Figure 87:
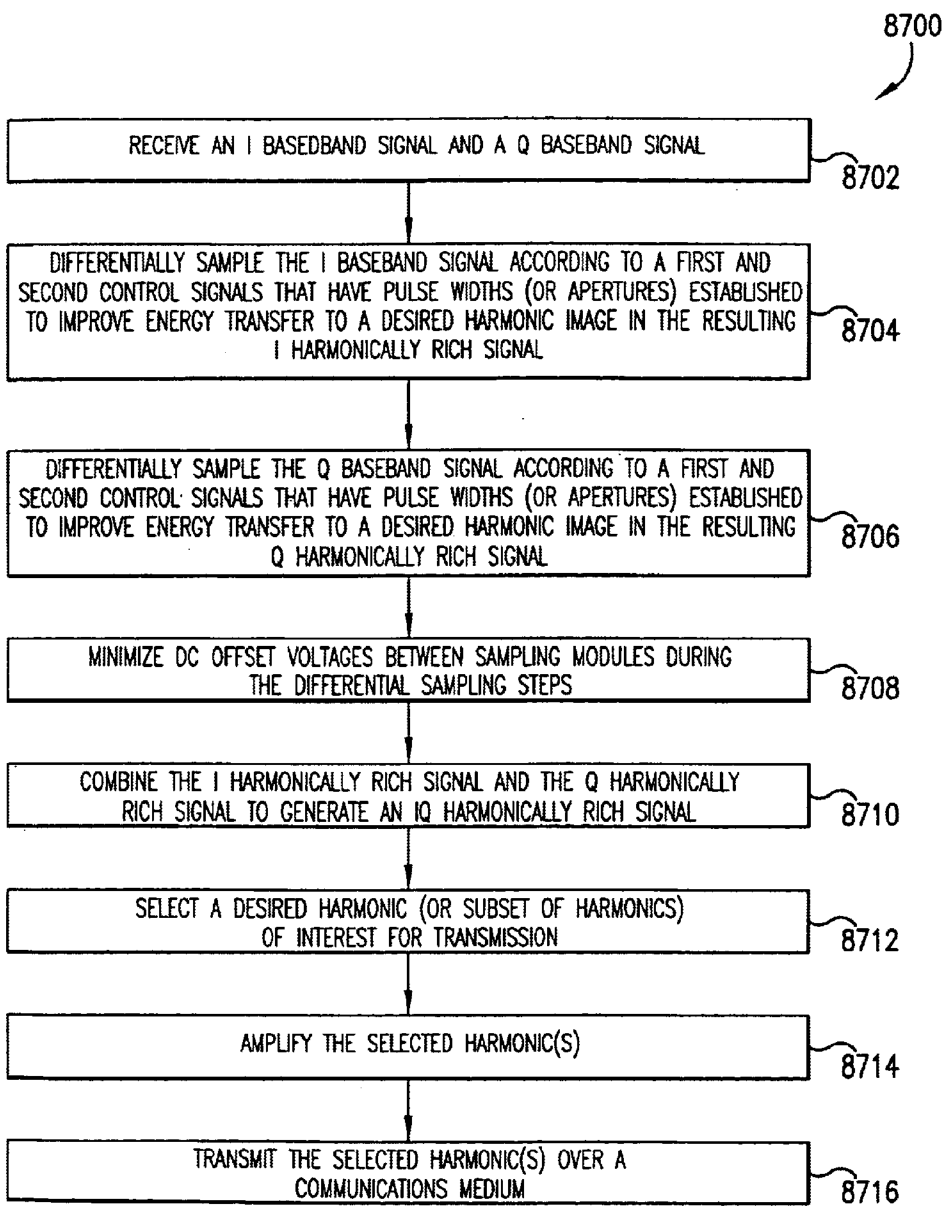
FIG. 87 illustrates a flowchart 8700, that is associated with the transmitter 7420 in the FIG. 74, according to embodiments of the invention.

As stated above, the balanced IQ modulator 7410 up-converts the I baseband signal 7402 and the Q baseband signal 7404 in a balanced manner to generate the combined harmonically rich signal 7412 that carriers the I and Q baseband information. To do so, the modulator 7410 utilizes two balanced modulators 7104 from FIG. 71A, a signal combiner 7408, and a DC terminal 7407. The operation of the balanced modulator 7410 and other circuits in the transmitter is described according to the flowchart 8700 in FIG. 87, as follows.

In step 8702, the IQ modulator 7410 receives the I baseband signal 7402 and the Q baseband signal 7404.

In step 8704, the I balanced modulator 7104*a* samples the I baseband signal 7402 in a differential fashion using the control signals 7123 and 7127 to generate a harmonically rich signal 7411*a*. The harmonically rich signal 7411 a contains multiple harmonic images of the I baseband information, similar to the harmonically rich signal 7130 in FIG. 71B.

In step 8706, the balanced modulator 7104*b* samples the Q baseband signal 7404 in a differential fashion using control signals 7123 and 7127 to generate harmonically rich signal 7411*b,* where the harmonically rich signal 7411*b* contains multiple harmonic images of the Q baseband signal 7404. The operation of the balanced modulator 7104 and the generation of harmonically rich signals was fully described above and illustrated in FIGS. 71A–C, to which the reader is referred for further details.

In step 8708, the DC terminal 7407 receives a DC voltage 7406 that is distributed to both modulators 7104*a* and 7104*b*. The DC voltage 7406 is distributed to both the input and output of both UFT modules 7124 and 7128 in each modulator 7104. This minimizes (or prevents) DC offset voltages from developing between the four UFT modules, and thereby minimizes or prevents any carrier insertion during the sampling steps 8704 and 8706.

Figures 75A, 75B, 75C:
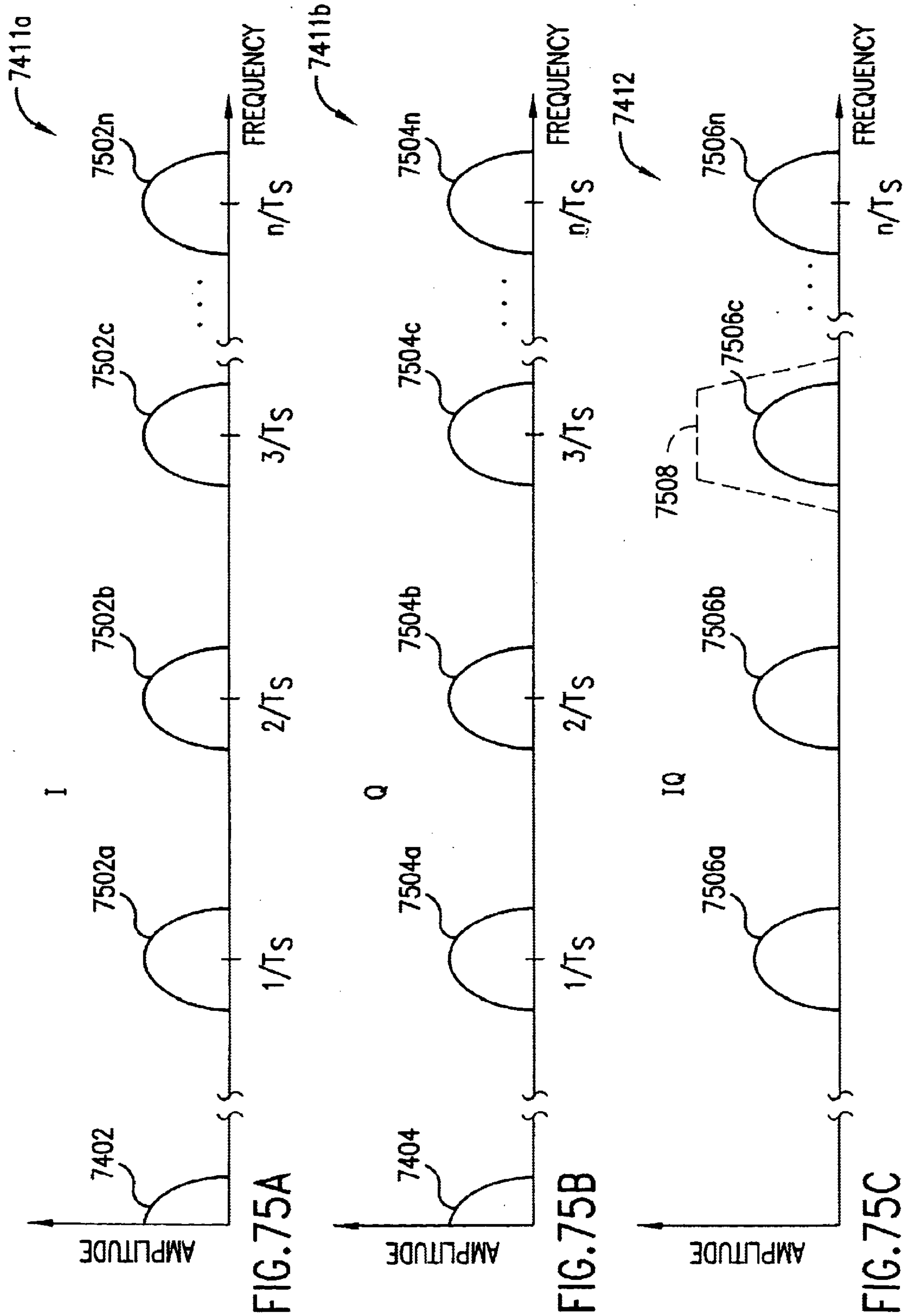
FIGS. 75A–C illustrate various example signal diagrams associated with the balanced transmitter 7420 in FIG. 74.

In step 8710, the 90 degree signal combiner 7408 combines the harmonically rich signals 7411*a* and 7411*b* to generate IQ harmonically rich signal 7412. This is further illustrated in FIGS. 75A–C. FIG. 75A depicts an exemplary frequency spectrum for the harmonically rich signal 7411 a having harmonic images 7502*a–n*. The images 7502 repeat at harmonics of the sampling frequency $1/T_S$, where each image 7502 contains the necessary amplitude and frequency information to reconstruct the I baseband signal 7402. Likewise, FIG. 75B depicts an exemplary frequency spectrum for the harmonically rich signal 7411*b* having harmonic images 7504*a–n*. The harmonic images 7504*a–n* also repeat at harmonics of the sampling frequency $1/T_S$, where each image 7504 contains the necessary amplitude, frequency, and phase information to reconstruct the Q baseband signal 7404. FIG. 75C illustrates an exemplary frequency spectrum for the combined harmonically rich signal 7412 having images 7506. Each image 7506 carries the I baseband information and the Q baseband information from the corresponding images 7502 and 7504, respectively, without substantially increasing the frequency bandwidth occupied by each harmonic 7506. This can occur because the signal combiner 7408 phase shifts the Q signal 7411 b by 90 degrees relative to the I signal 7411*a*. The result is that the images 7502*a–n* and 7504*a–n* effectively share the signal bandwidth do to their orthogonal relationship. For example, the images 7502*a* and 7504*a* effectively share the frequency spectrum that is represented by the image 7506*a*.

In step 8712, the optional filter 7414 can be included to select a harmonic of interest, as represented by the passband 7508 selecting the image 7506*c* in FIG. 75*c*.

In step 8714, the optional amplifier 7416 can be included to amplify the harmonic (or harmonics) of interest prior to transmission.

In step 8716, the selected harmonic (or harmonics) is transmitted over a communications medium.

Figure 76A:
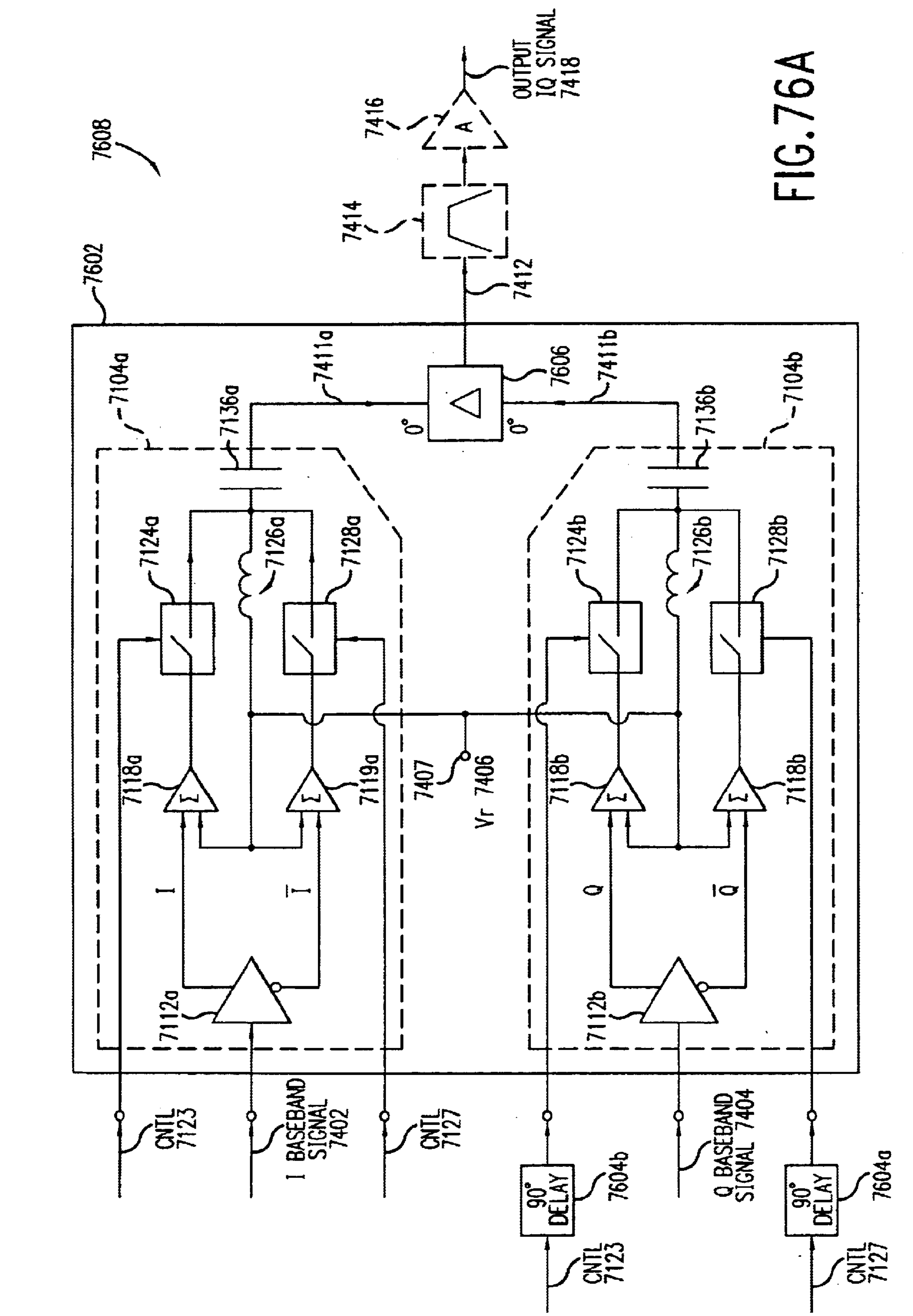
FIG. 76A illustrates an IQ balanced transmitter 7608 according to embodiments of the invention.

FIG. 76A illustrates a transmitter 7608 that is a second embodiment for an I Q transmitter having a balanced configuration. Transmitter 7608 is similar to the transmitter 7420 except that the 90 degree phase shift between the I and Q channels is achieved by phase shifting the control signals instead of using a 90 degree signal combiner to combine the harmonically rich signals. More specifically, delays 7604*a* and 7604*b* delay the control signals 7123 and 7127 for the Q channel modulator 7104*b* by 90 degrees relative the control signals for the I channel modulator 7104*a*. As a result, the Q modulator 7104*b* samples the Q baseband signal 7404 with 90 degree delay relative to the sampling of the I baseband signal 7402 by the I channel modulator 7104*a*. Therefore, the Q harmonically rich signal 7411*b* is phase shifted by 90 degrees relative to the I harmonically rich signal. Since the phase shift is achieved using the control signals, an in-phase signal combiner 7606 combines the harmonically rich signals 7411*a* and 7411*b,* to generate the harmonically rich signal 7412.

Figure 76B:
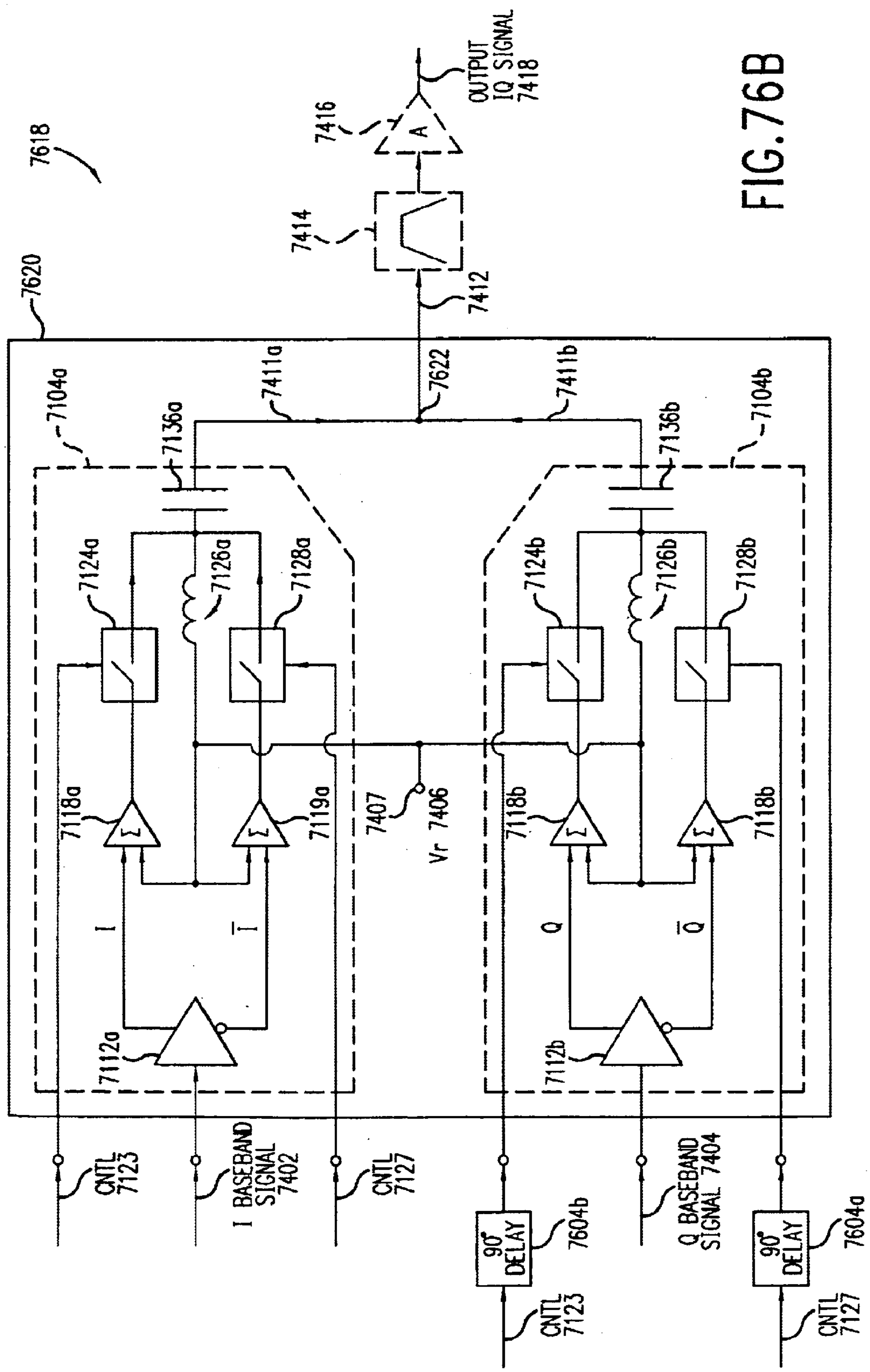
FIG. 76B illustrates an IQ balanced modulator 7618 according to embodiments of the invention.

FIG. 76B illustrates a transmitter 7618 that is similar to transmitter 7608 in FIG. 76A. The difference being that the transmitter 7618 has a modulator 7620 that utilizes a summing node 7622 to sum the signals 7411*a* and 7411*b* instead of the in-phase signal combiner 7606 that is used in modulator 7602 of transmitter 7608.

FIG. 90A–90D illustrate various detailed circuit implementations of the transmitter 7420 in FIG. 74. These circuit implementations are meant for example purposes only, and are not meant to be limiting.

Figure 90A:
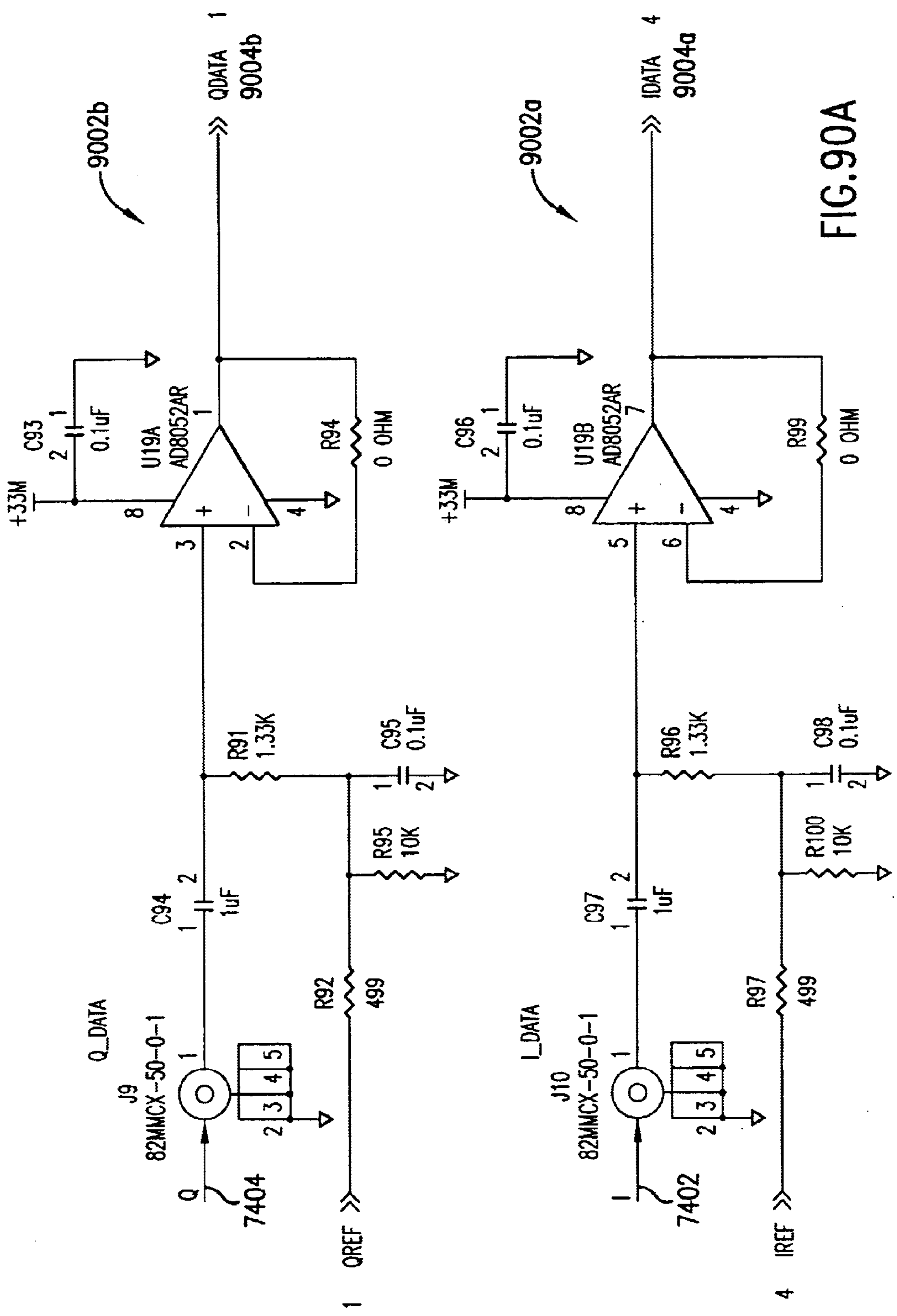
FIGS. 90A–D illustrate various implementation circuits for the modulator 7410, according to embodiments of the present invention.

FIG. 90A illustrates I input circuitry 9002*a* and Q input circuitry 9002*b* that receive the I and Q input signals 7402 and 7404, respectively.

Figure 90B:
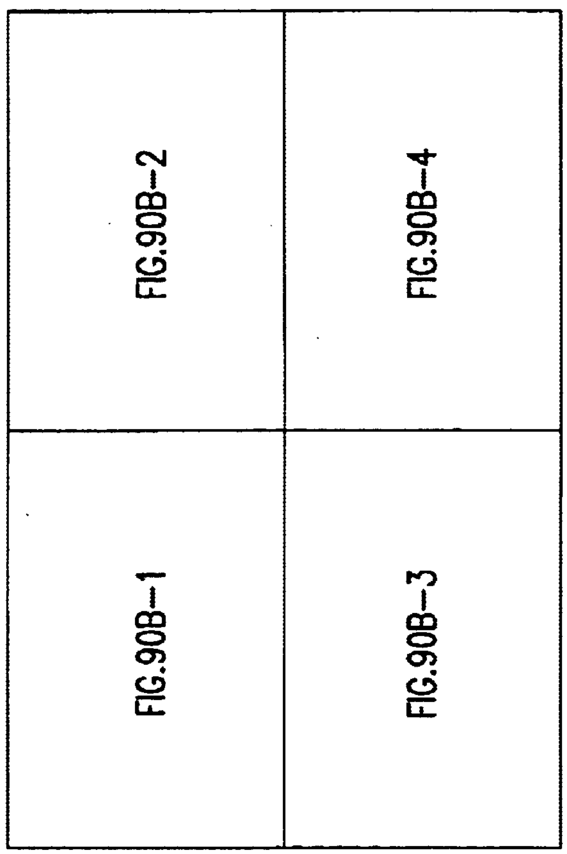
Figures 1, 90B:
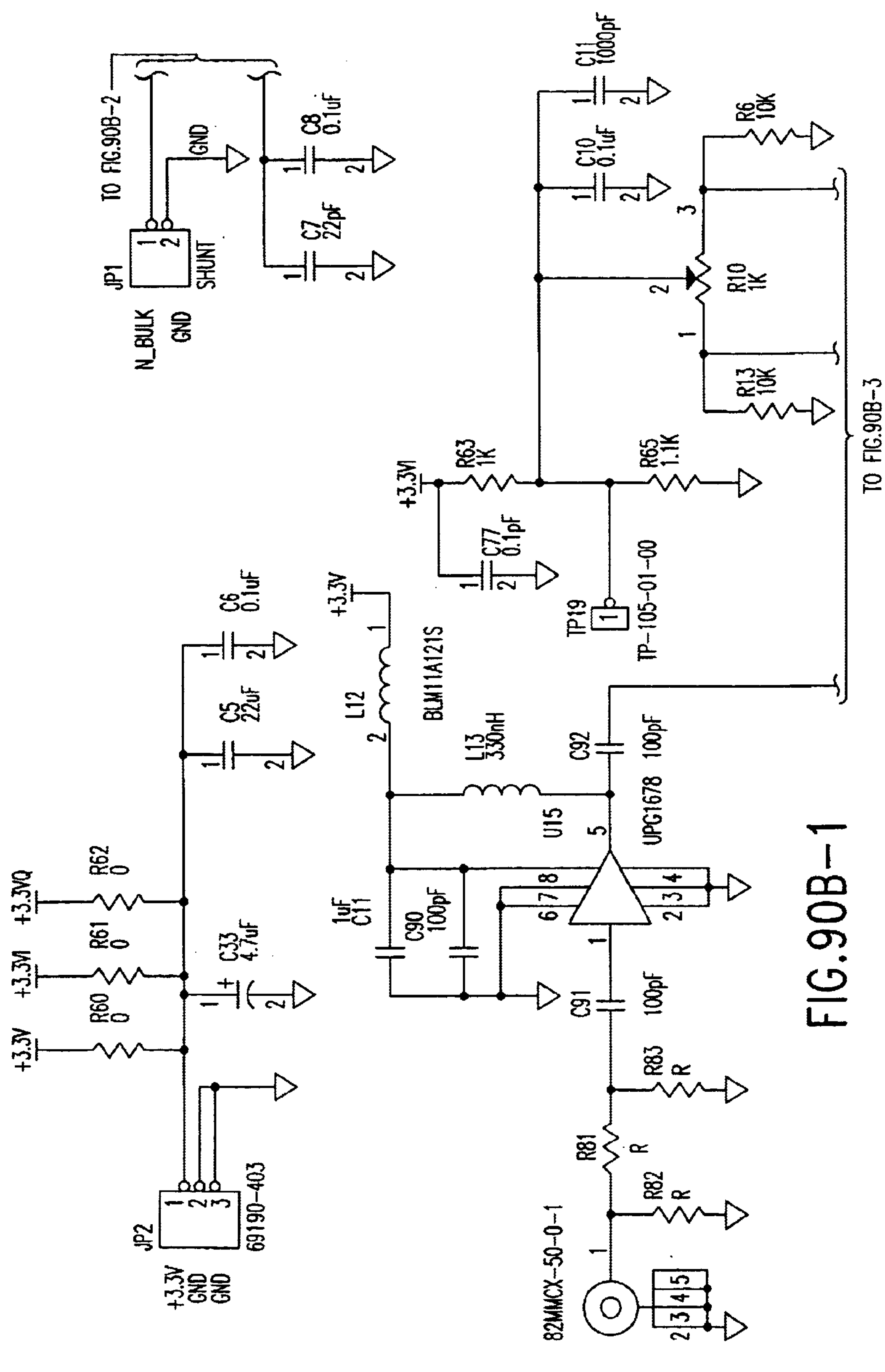
Figures 2, 90B:
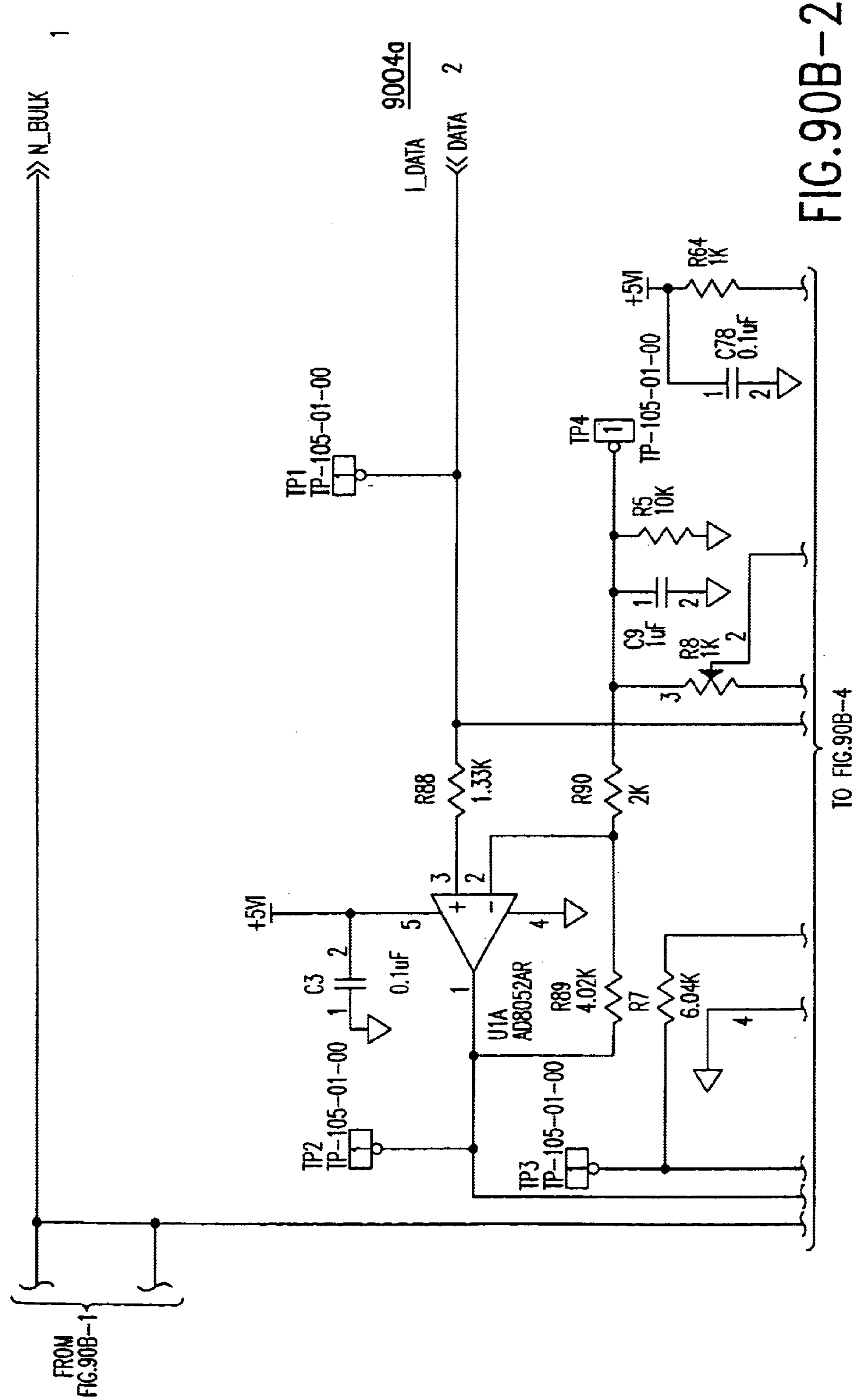
Figures 3, 90B:
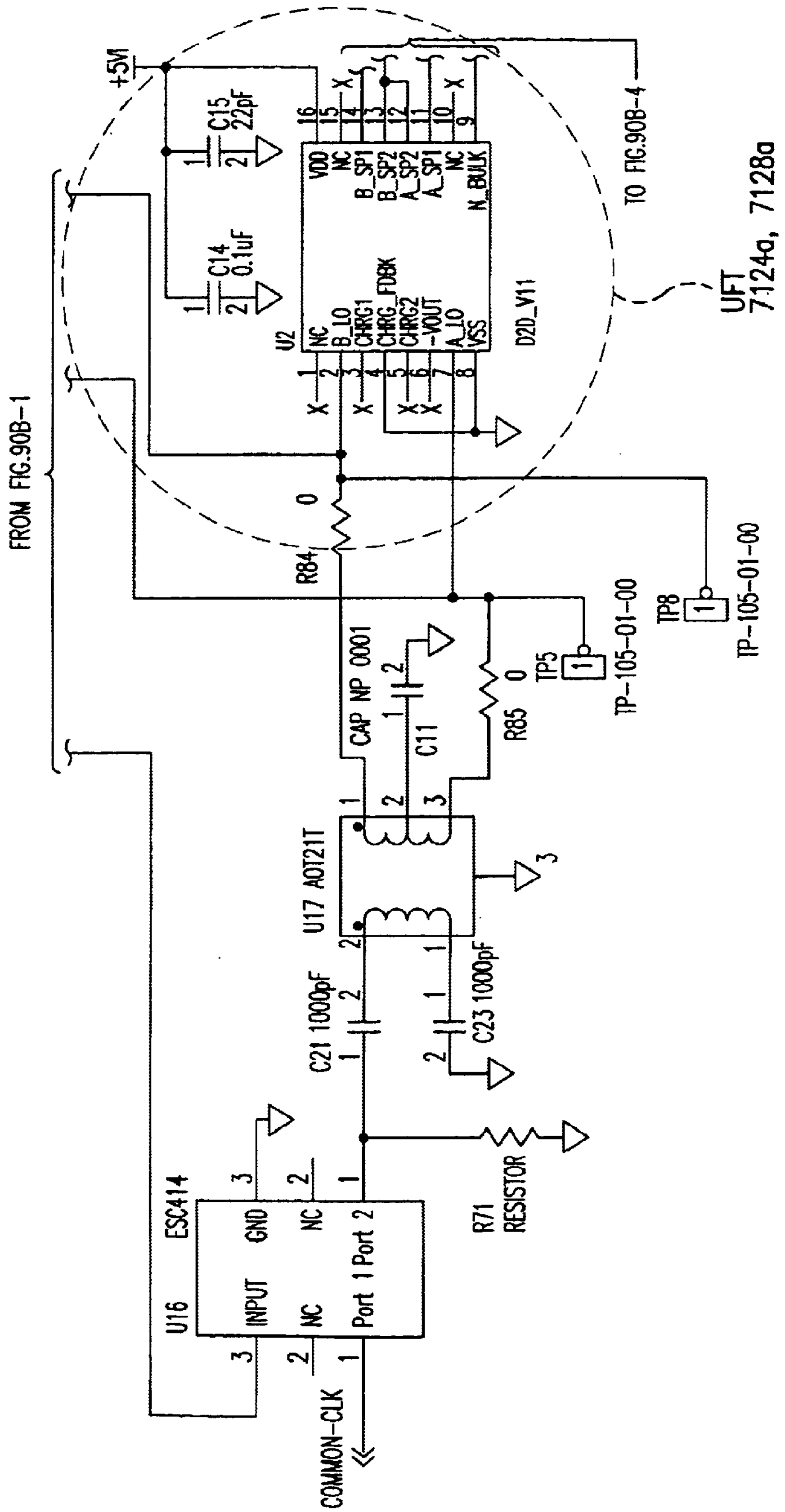
Figures 4, 90B:
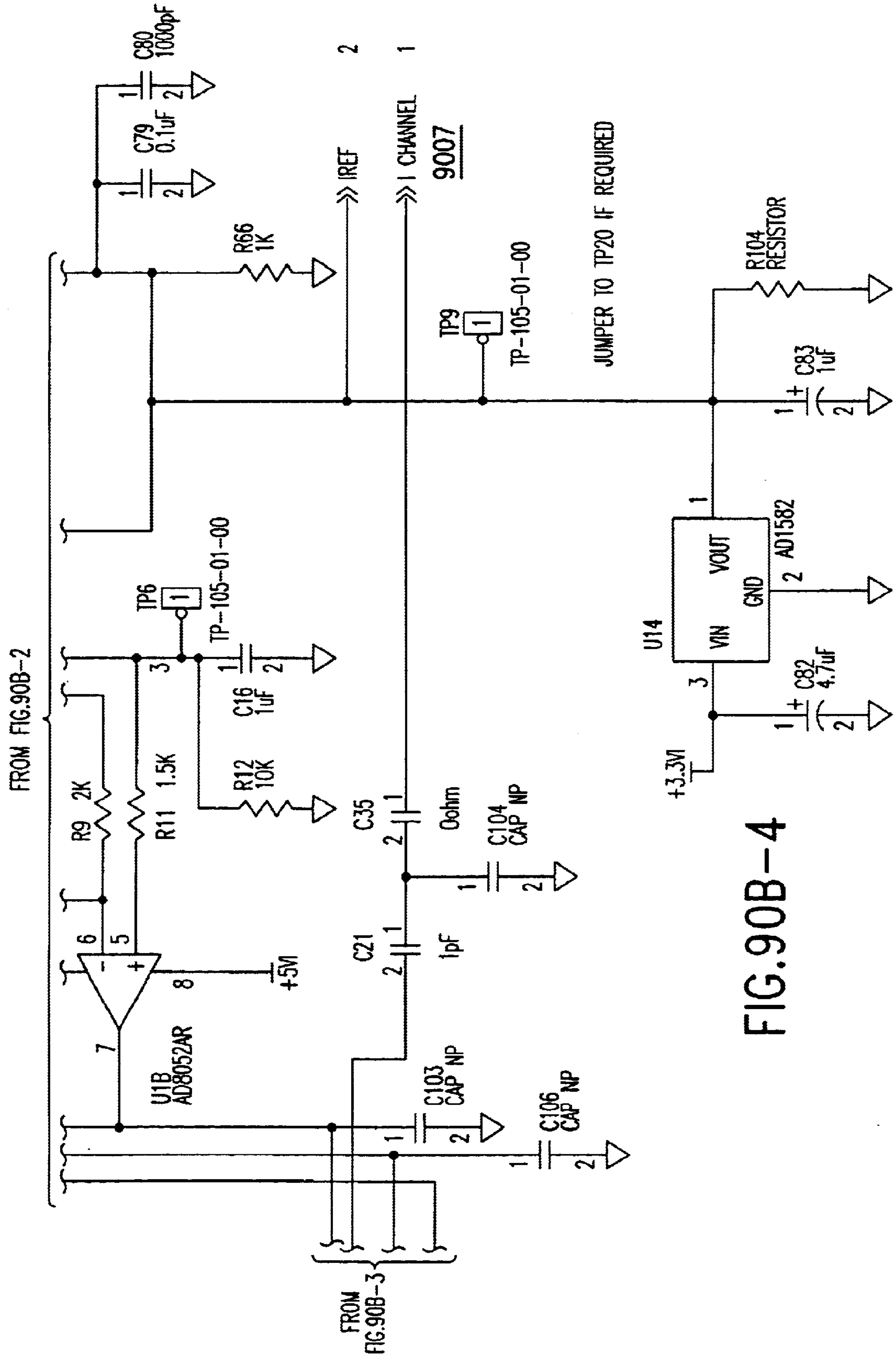

FIG. 90B illustrates the I channel circuitry 9006 that processes an I data 9004*a* from the I input circuit 9002*a*.

Figure 90C:
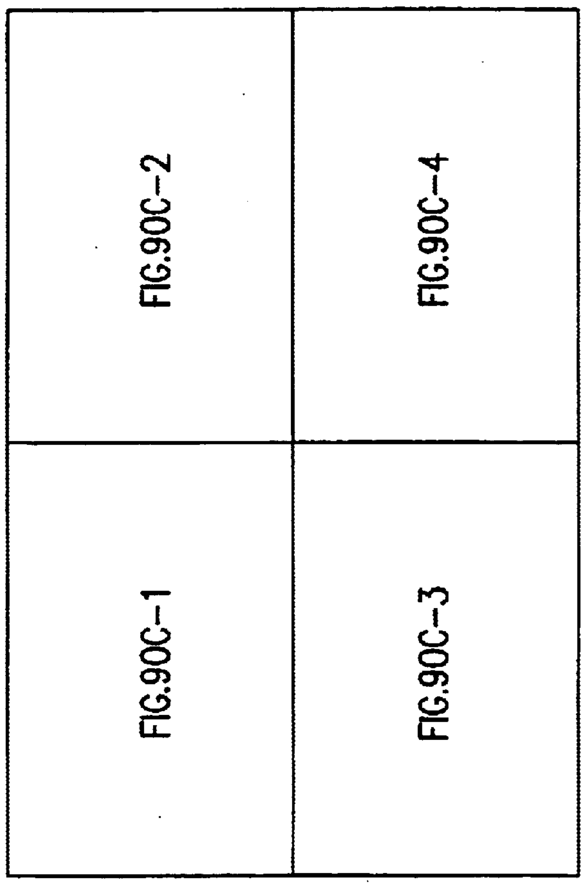
Figures 1, 90C:
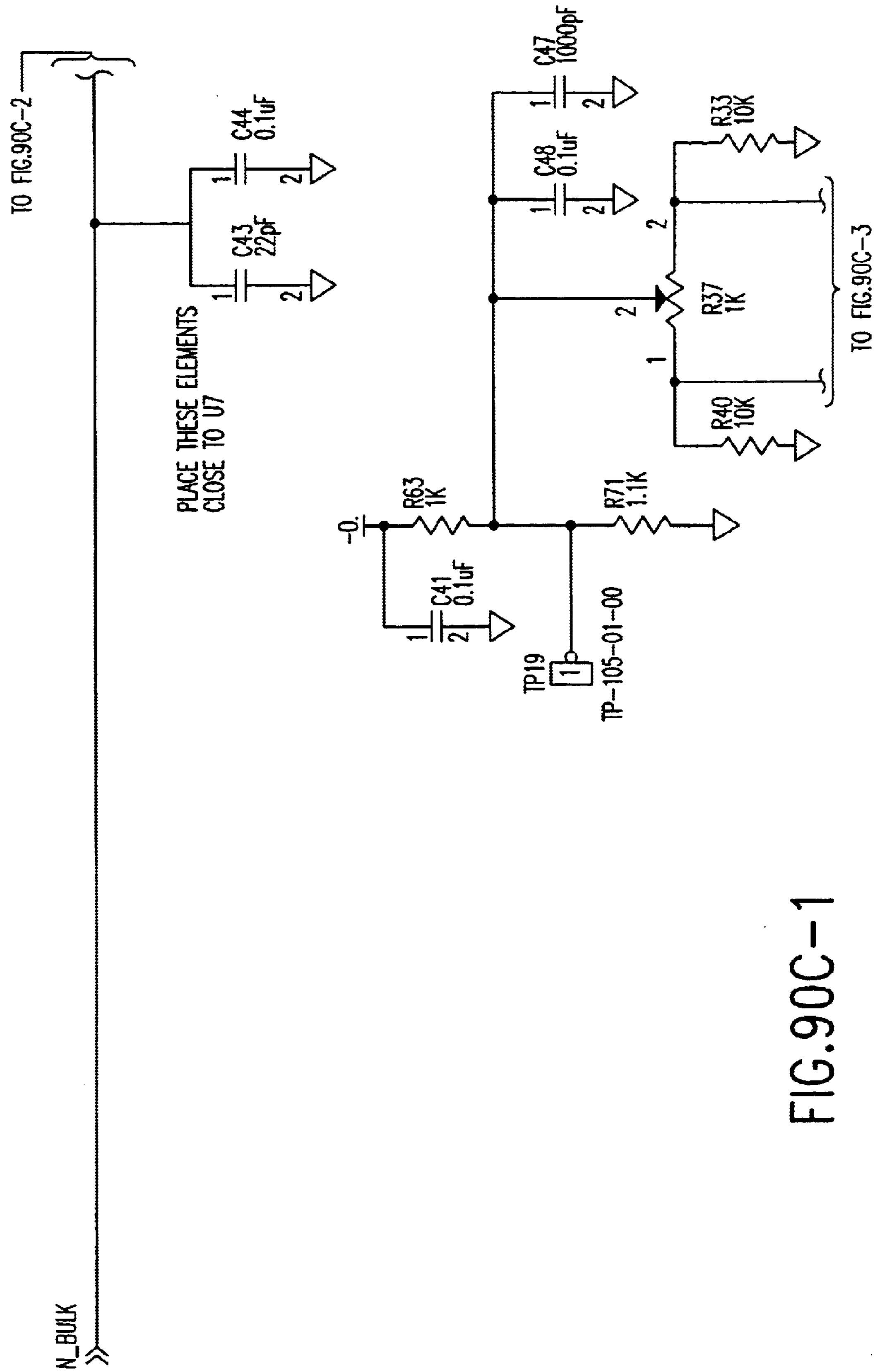
Figures 2, 90C:
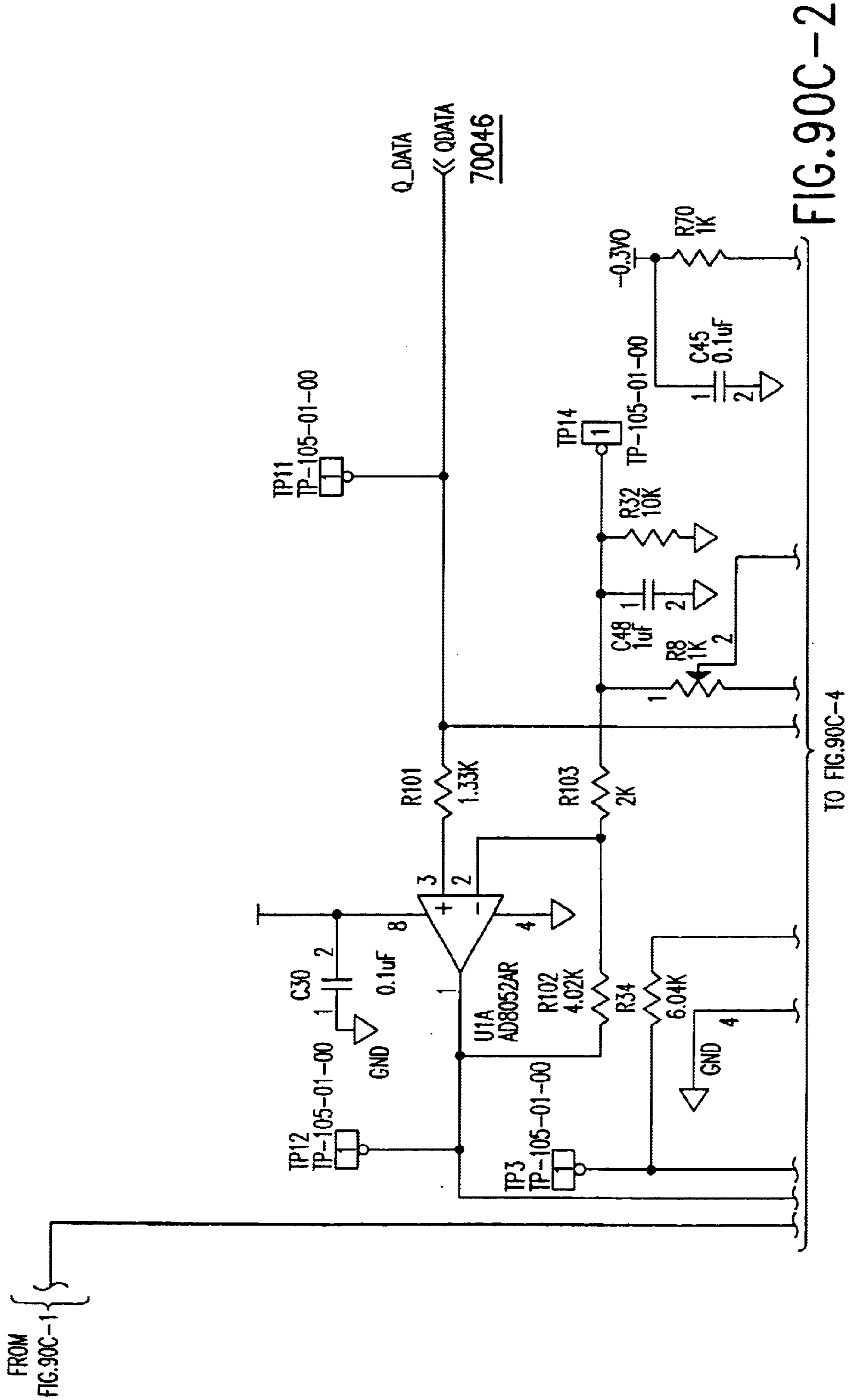
Figures 3, 90C:
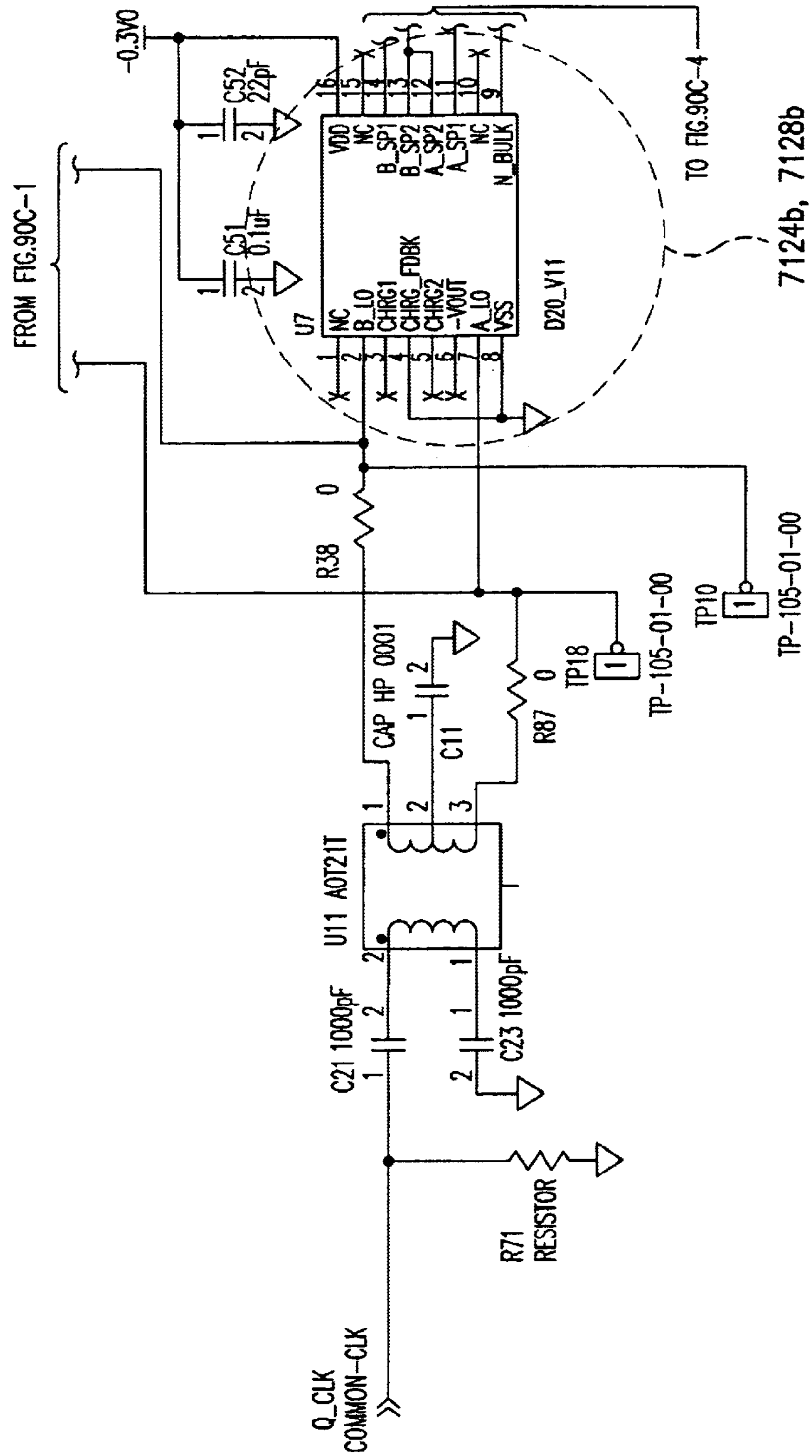
Figures 4, 90C:
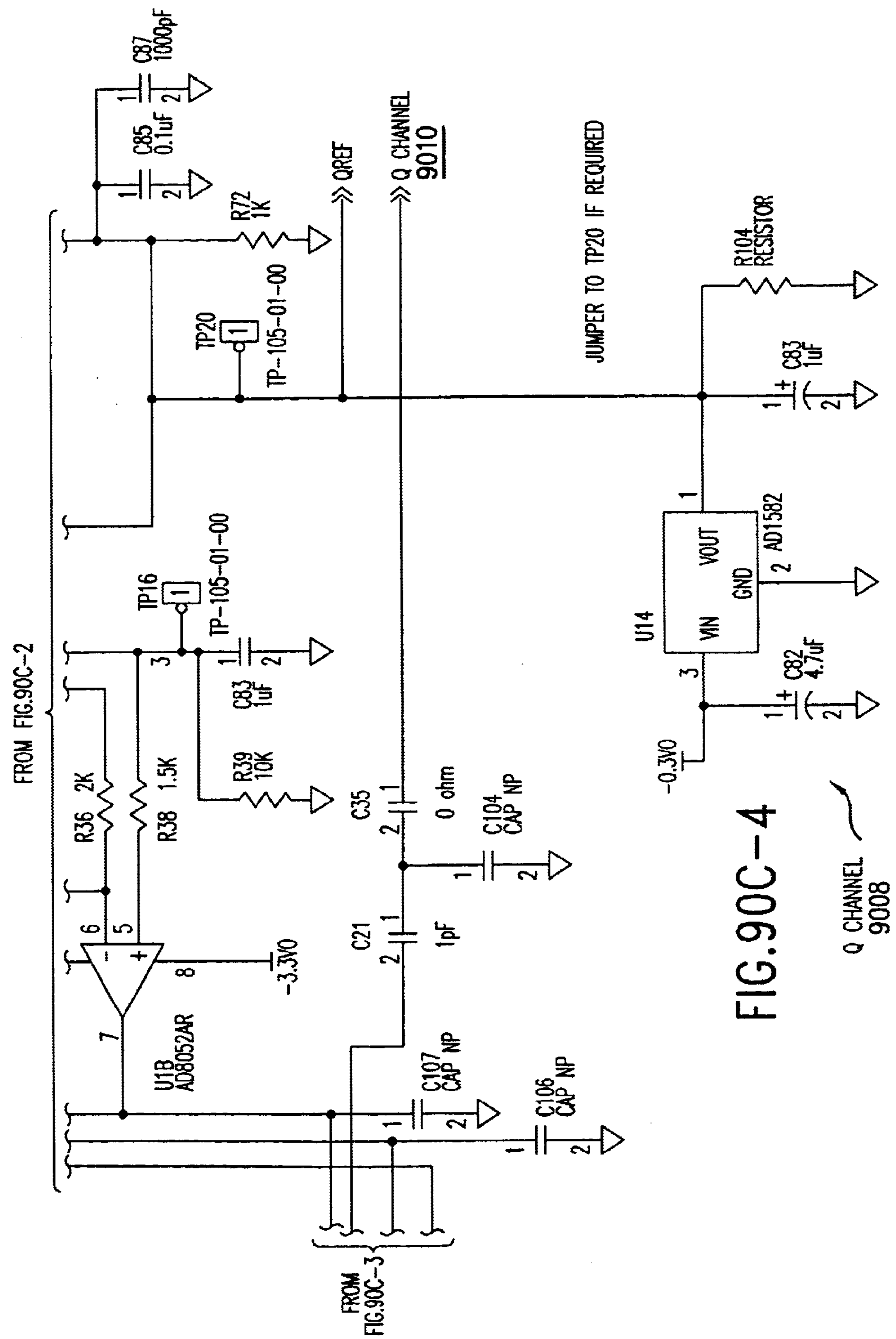

FIG. 90C illustrates the Q channel circuitry 9008 that processes the Q data 9004*b* from the Q input circuit 9002*b*.

Figure 90D:
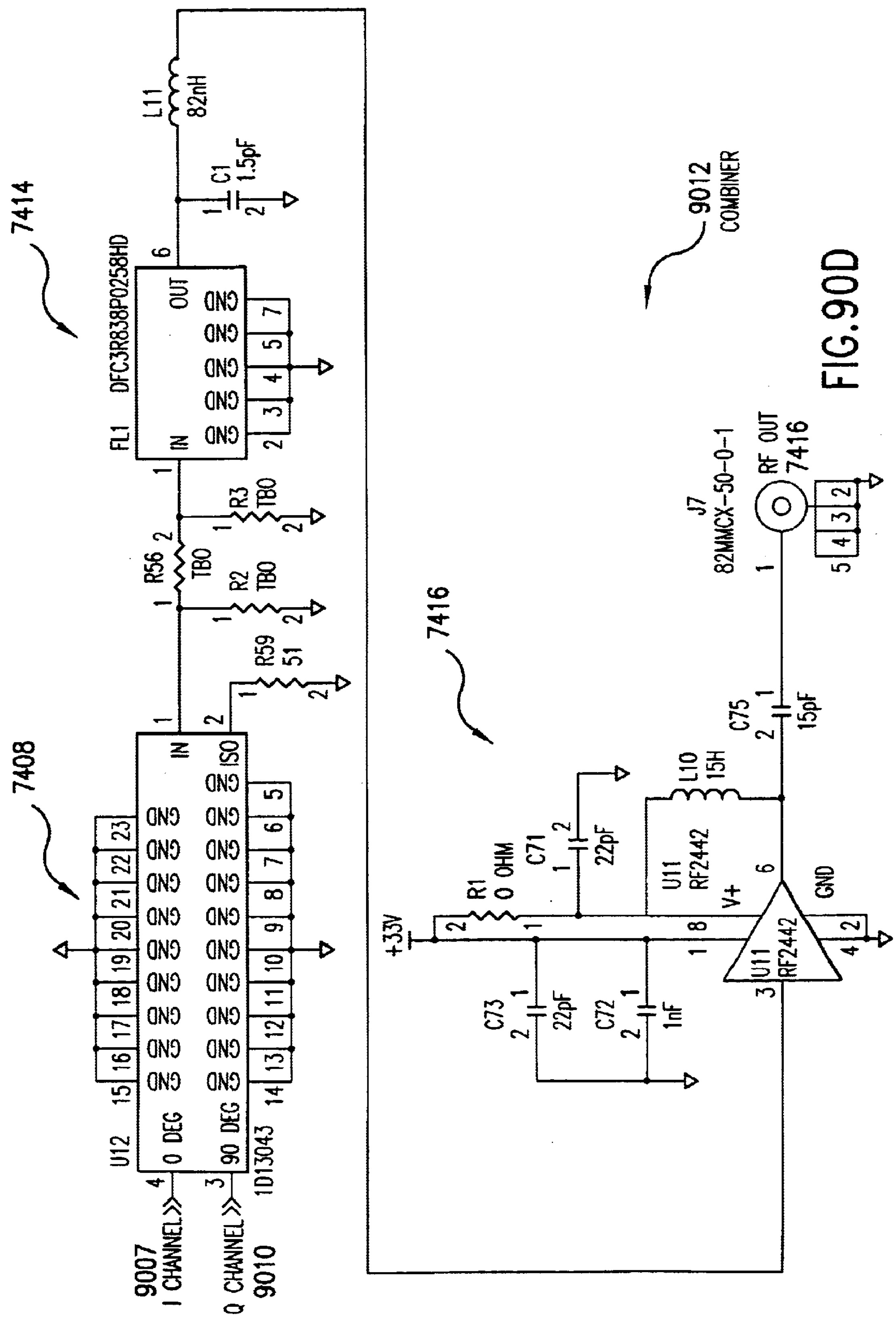

FIG. 90D illustrates the output combiner circuit 9012 that combines the I channel data 9007 and the Q channel data 9010 to generate the output signal 7418.

7.3.2.2 IQ Transmitter Using Shunt-Type Balanced Modulator

Figure 80:
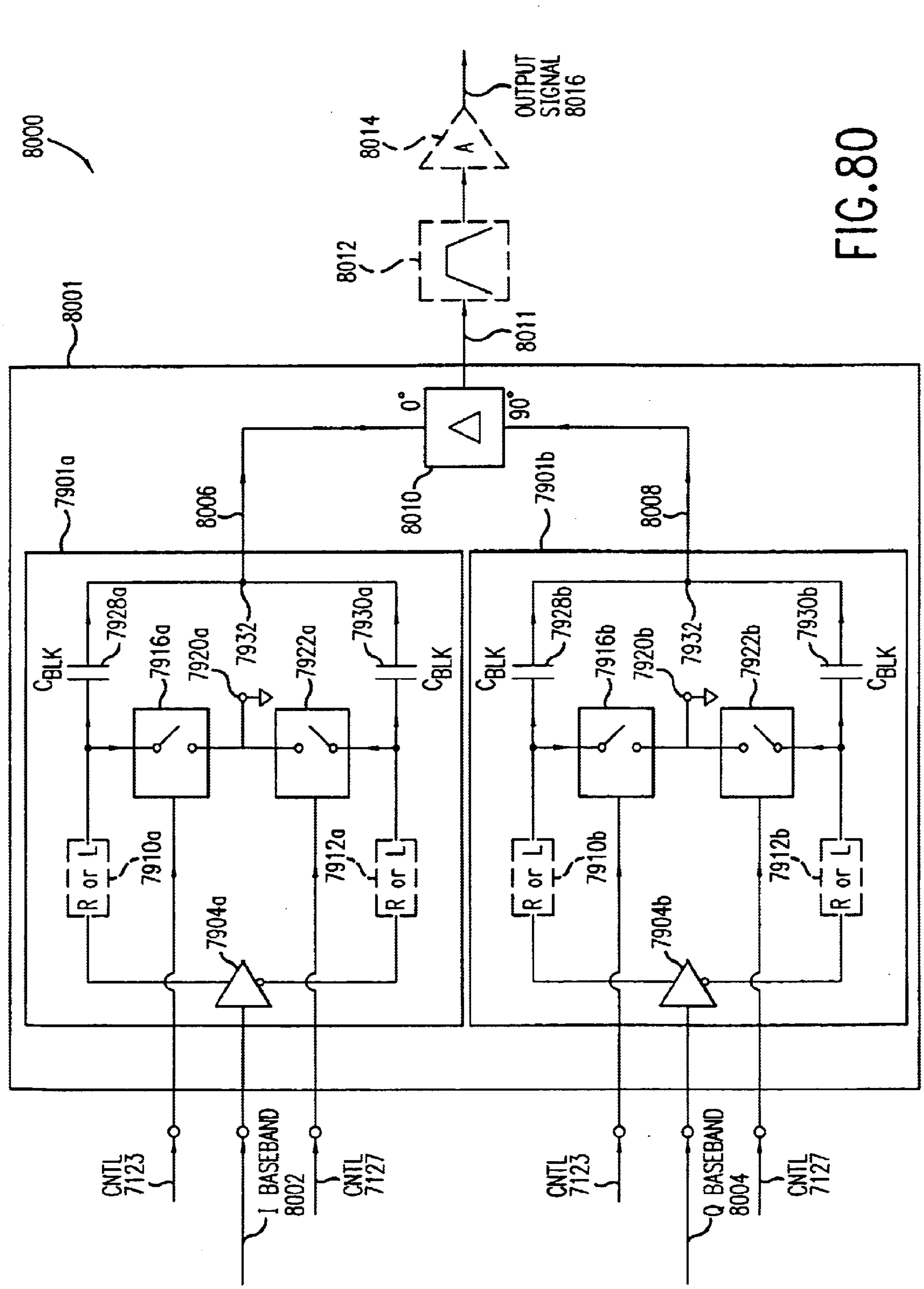
FIG. 80 illustrates an IQ transmitter 8000, according to embodiments of the present invention.

FIG. 80 illustrates an IQ transmitter 8000 that is another IQ transmitter embodiment according to the present invention. The transmitter 8000 includes an IQ balanced modulator 8001, an optional filter 8012, and an optional amplifier 8014. During operation, the modulator 8001 up-converts an I baseband signal 8002 and a Q baseband signal 8004 to generate a combined harmonically rich signal 8011. The harmonically rich signal 8011 includes multiple harmonics images, where each image contains the baseband information in the I signal 8002 and the Q signal 8004. The optional bandpass filter 8012 may be included to select a harmonic of interest (or subset of harmonics) from the harmonically rich signal 8011 for transmission. The optional amplifier 8014 may be included to amplify the selected harmonic prior to transmission, to generate the IQ output signal 8016.

Figure 88:
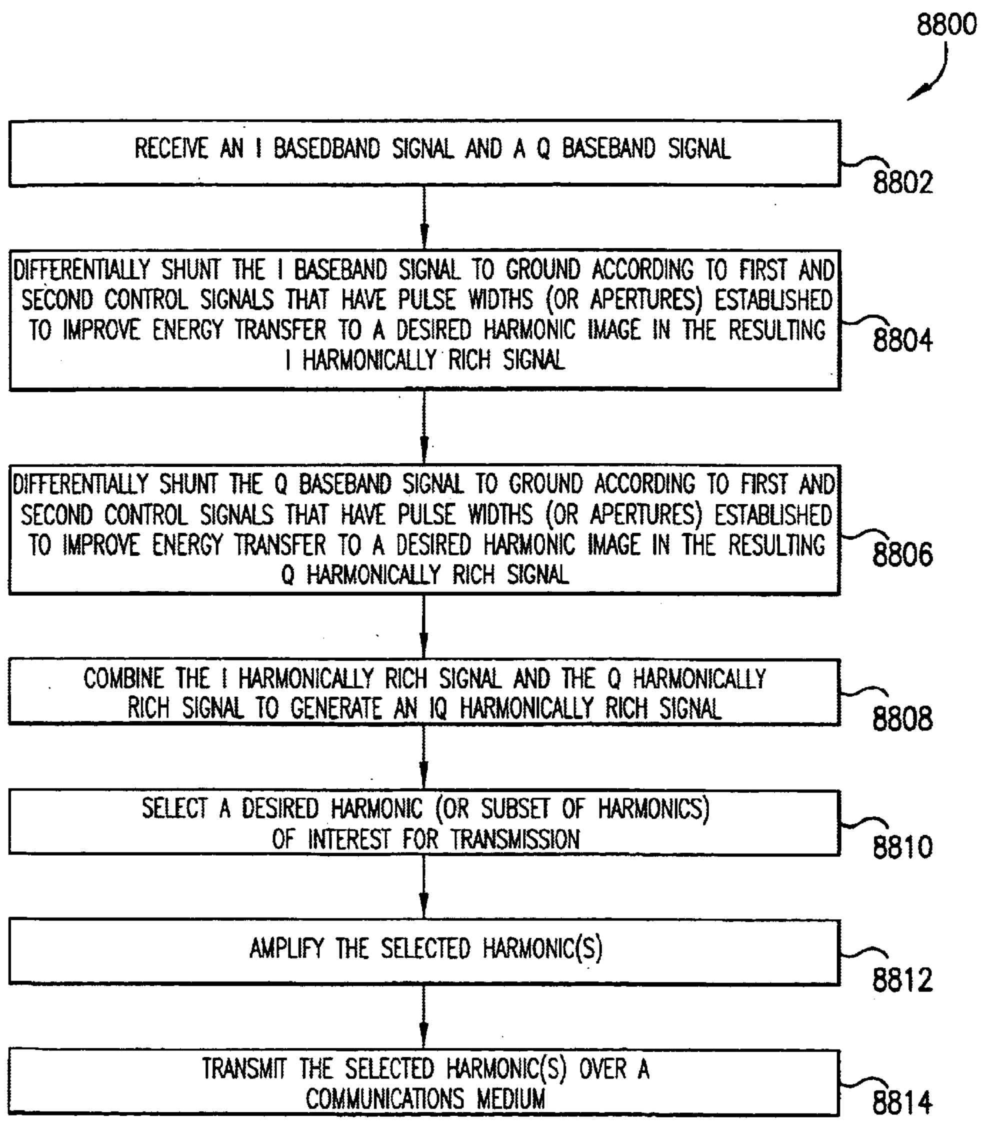
FIG. 88 illustrates a flowchart 8800 that is associated with the transmitter 8000, according to embodiments of the invention.

The IQ modulator 8001 includes two shunt balanced modulators 7901 from FIG. 79A, and a 90 degree signal combiner 8010 as shown. The operation of the IQ modulator 8001 is described in reference to the flowchart 8800 (FIG. 88), as follows. The order of the steps in flowchart 8800 is not limiting.

In step 8802, the balanced modulator 8001 receives the I baseband signal 8002 and the Q baseband signal 8004.

In step 8804, the balanced modulator 7901*a* differentially shunts the I baseband signal 8002 to ground according the control signals 7123 and 7127, to generate a harmonically rich signal 8006. More specifically, the UFT modules 7916*a* and 7922*a* alternately shunt the I baseband signal 8002 and an inverted version of the I baseband signal 8002 to ground according to the control signals 7123 and 7127, respectively. The operation of the balanced modulator 7901 and the generation of harmonically rich signals was fully described above and is illustrated in FIGS. 79A–C, to which the reader is referred for further details. As such, the harmonically rich signal 8006 contains multiple harmonic images of the I baseband information as described above.

In step 8806, the balanced modulator 7901*b* differentially shunts the Q baseband signal 8004 to ground according to control signals 7123 and 7127, to generate harmonically rich signal 8008. More specifically, the UFT modules 7916*b* and 7922*b* alternately shunt the Q baseband signal 8004 and an inverted version of the Q baseband signal 8004 to ground, according to the control signals 7123 and 7127, respectively. As such, the harmonically rich signal 8008 contains multiple harmonic images that contain the Q baseband information.

Figures 81A, 81B, 81C:
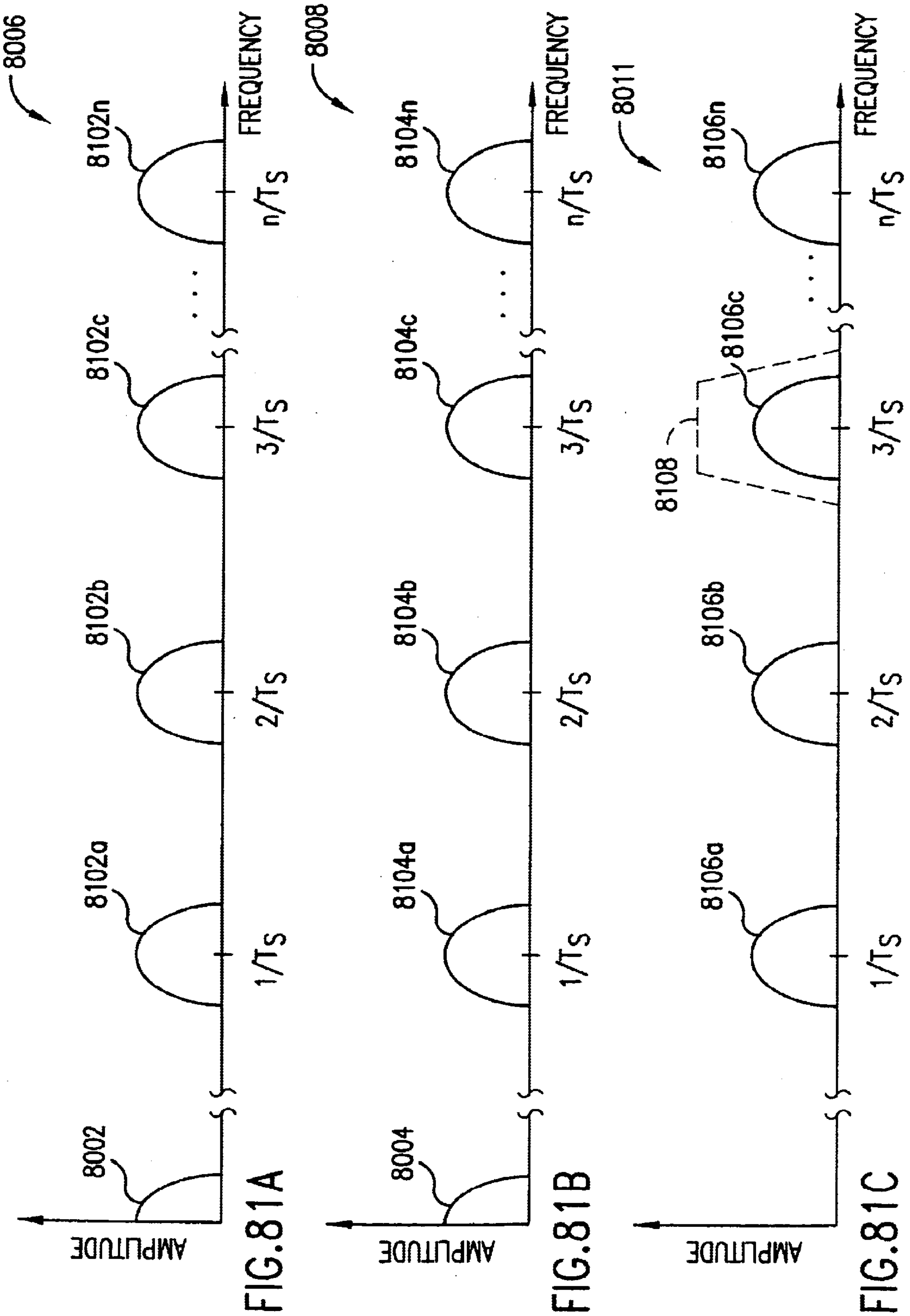
FIGS. 81A–C illustrate various frequency spectrums that are associated with the IQ transmitter 8000, according to embodiments of the present invention.

In step 8808, the 90 degree signal combiner 8010 combines the harmonically rich signals 8006 and 8008 to generate IQ harmonically rich signal 8011. This is further illustrated in FIGS. 81A–C. FIG. 81A depicts an exemplary frequency spectrum for the harmonically rich signal 8006 having harmonic images 8102*a–n*. The harmonic images 8102 repeat at harmonics of the sampling frequency $1/T_S$, where each image 8102 contains the necessary amplitude, frequency, and phase information to reconstruct the I baseband signal 8002. Likewise, FIG. 81B depicts an exemplary frequency spectrum for the harmonically rich signal 8008 having harmonic images 8104*a–n*. The harmonic images 8104*a–n* also repeat at harmonics of the sampling frequency $1/T_S$, where each image 8104 contains the necessary amplitude, frequency, and phase information to reconstruct the Q baseband signal 8004. FIG. 81C illustrates an exemplary frequency spectrum for the IQ harmonically rich signal 8011 having images 8106*a–n*. Each image 8106 carries the I baseband information and the Q baseband information from the corresponding images 8102 and 8104, respectively, without substantially increasing the frequency bandwidth occupied by each image 8106. This can occur because the signal combiner 8010 phase shifts the Q signal 8008 by 90 degrees relative to the I signal 8006.

In step 8810, the optional filter 8012 may be included to select a harmonic of interest, as represented by the passband 8108 selecting the image 8106*c* in FIG. 81C.

In step 8812, the optional amplifier 8014 can be included to amplify the selected harmonic image 8106 prior to transmission.

In step 8814, the selected harmonic (or harmonics) is transmitted over a communications medium.

Figure 82:
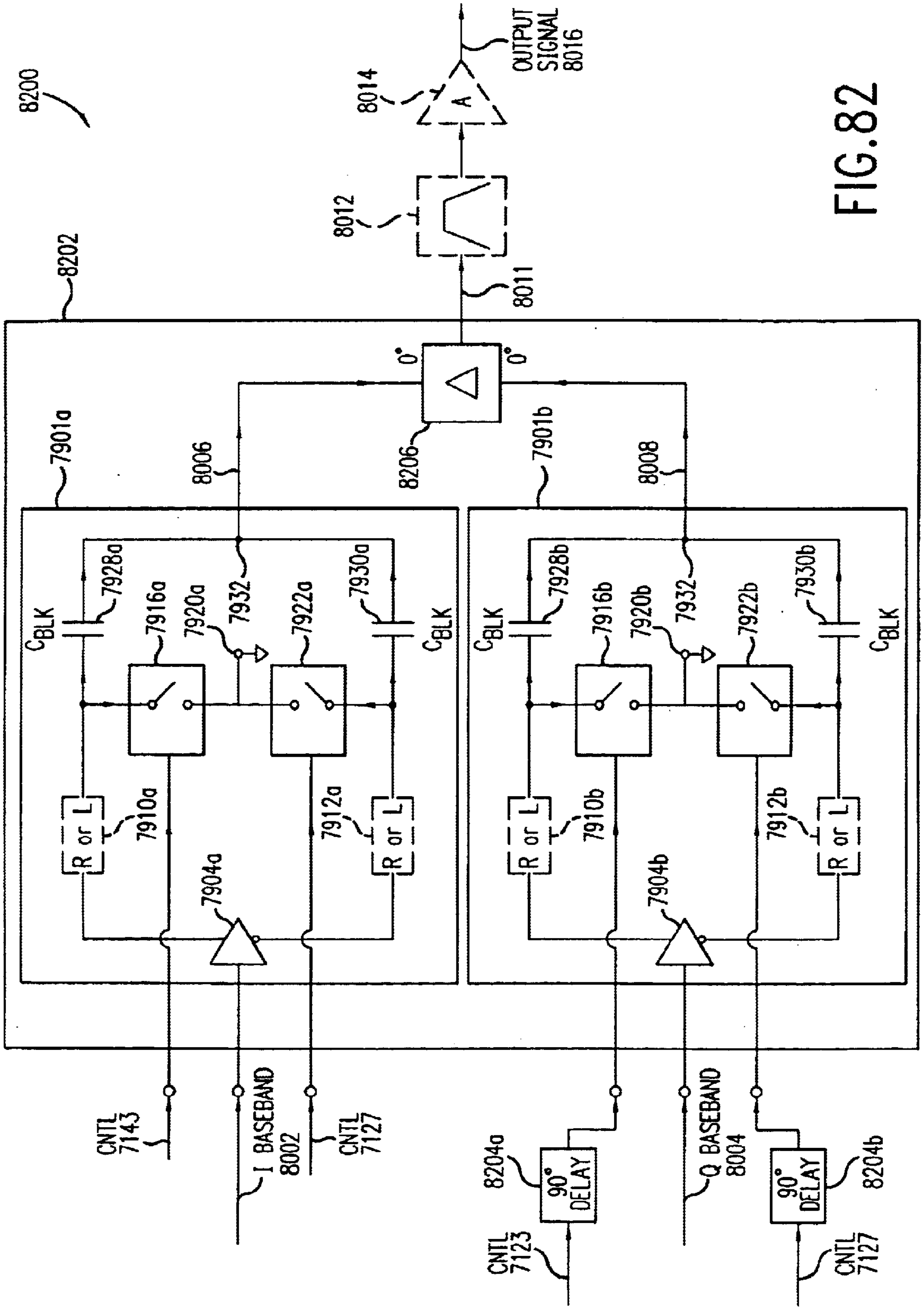
FIG. 82 illustrates an IQ transmitter 8200, according to embodiments of the present invention.

FIG. 82 illustrates a transmitter 8200 that is another embodiment for an IQ transmitter having a balanced configuration. Transmitter 8200 is similar to the transmitter 8000 except that the 90 degree phase shift between the I and Q channels is achieved by phase shifting the control signals instead of using a 90 degree signal combiner to combine the harmonically rich signals. More specifically, delays 8204*a* and 8204*b* delay the control signals 7123 and 7127 for the Q channel modulator 7901*b* by 90 degrees relative the control signals for the I channel modulator 7901*a*. As a result, the Q modulator 7901*b* samples the Q baseband signal 8004 with a 90 degree delay relative to the sampling of the I baseband signal 8002 by the I channel modulator 7901*a*. Therefore, the Q harmonically rich signal 8008 is phase shifted by 90 degrees relative to the I harmonically rich signal 8006. Since the phase shift is achieved using the control signals, an in-phase signal combiner 8206 combines the harmonically rich signals 8006 and 8008, to generate the harmonically rich signal 8011.

Figure 83:
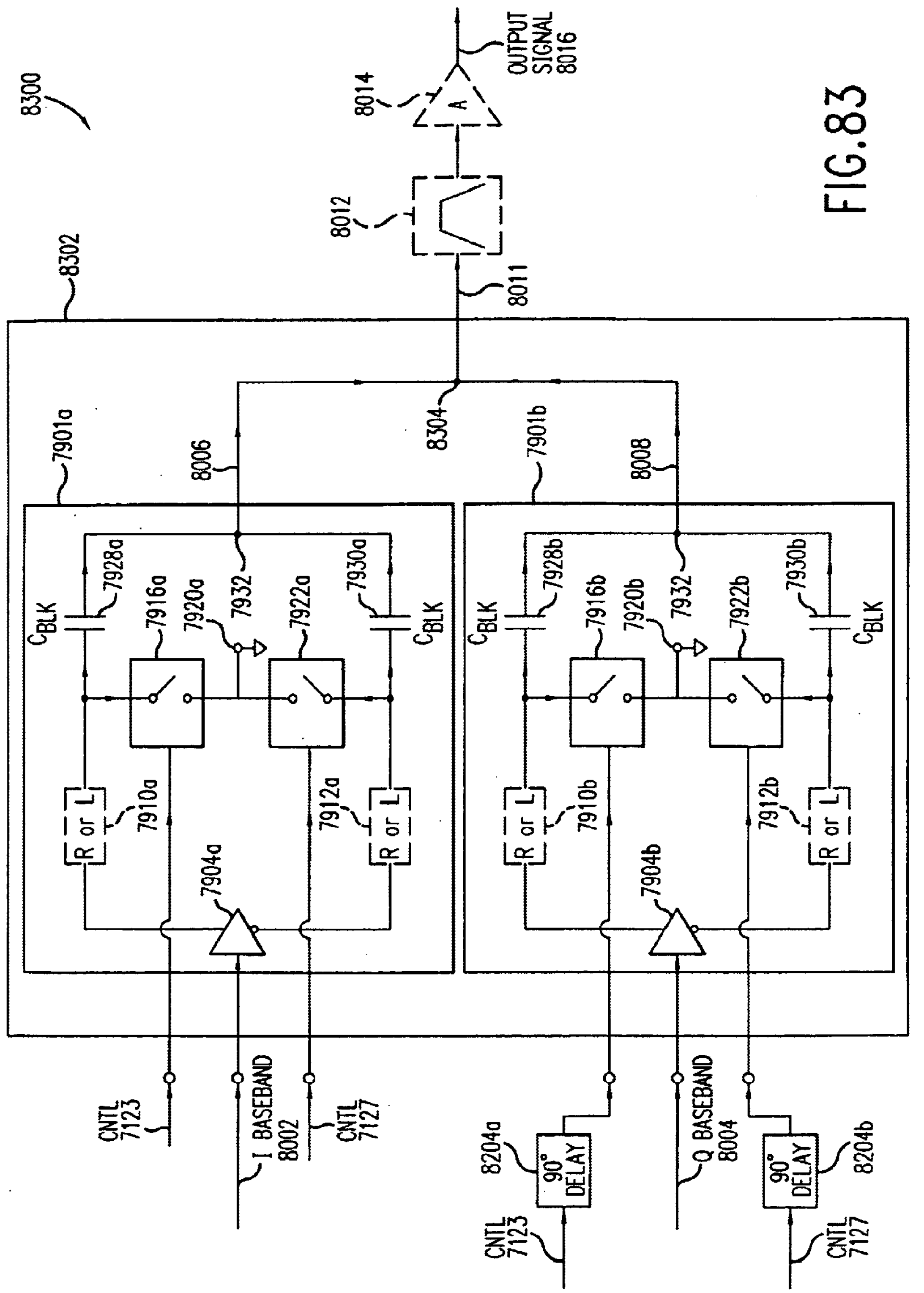
FIG. 83 illustrates an IQ transmitter 8300, according to embodiments of the invention.

FIG. 83 illustrates a transmitter 8300 that is similar to transmitter 8200 in FIG. 82. The difference being that the transmitter 8300 has a balanced modulator 8302 that utilizes a summing node 8304 to sum the I harmonically rich signal 8006 and the Q harmonically rich signal 8008 instead of the in-phase signal combiner 8206 that is used in the modulator 8202 of transmitter 8200. The 90 degree phase shift between the I and Q channels is implemented by delaying the Q clock signals using 90 degree delays 8204, as shown.

7.3.2.3 IQ Transmitters Configured for Carrier Insertion

Figure 77:
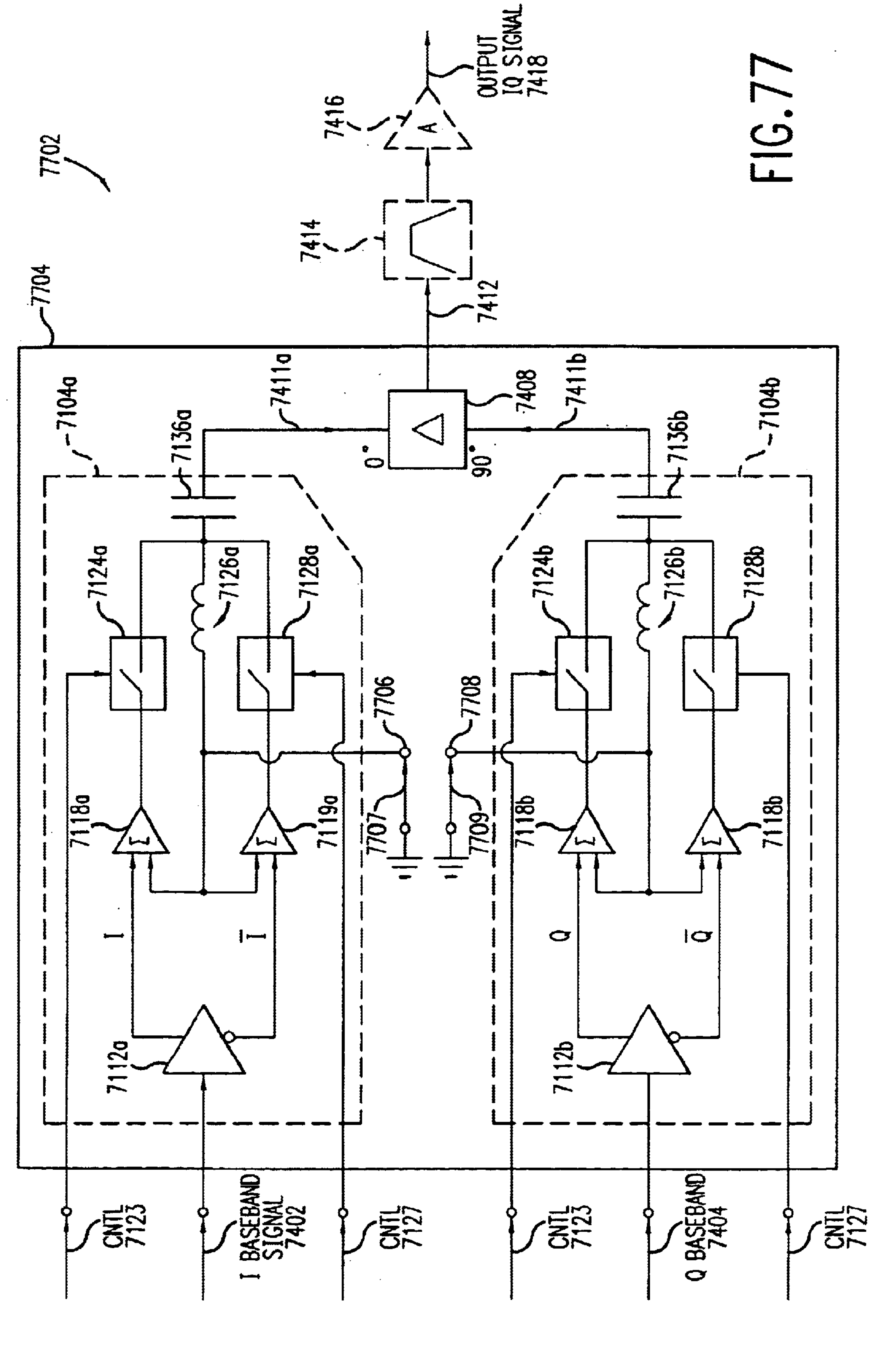
FIG. 77 illustrates an IQ balanced modulator 7702 configured for carrier insertion according to embodiments of the invention.

The transmitters 7420 (FIG. 74) and 7608 (FIG. 76A) have a balanced configuration that substantially eliminates any DC offset and results in minimal carrier insertion in the IQ output signal 7418. Minimal carrier insertion is generally desired for most applications because the carrier signal carries no information and reduces the overall transmitter efficiency. However, some applications require the received signal to have sufficient carrier energy for the receiver to extract the carrier for coherent demodulation. In support thereof, FIG. 77 illustrates a transmitter 7702 to provide any necessary carrier insertion by implementing a DC offset between the two sets of sampling UFT modules.

Transmitter 7702 is similar to the transmitter 7420 with the exception that a modulator 7704 in transmitter 7702 is configured to accept two DC reference voltages so that the I channel modulator 7104*a* can be biased separately from the Q channel modulator 7104*b*. More specifically, modulator 7704 includes a terminal 7706 to accept a DC voltage reference 7707, and a terminal 7708 to accept a DC voltage reference 7709. Voltage 7707 biases the UFT modules 7124*a* and 7128*a* in the I channel modulator 7104*a*. Likewise, voltage 7709 biases the UFT modules 7124*b* and 7128*b* in the Q channel modulator 7104*b*. When voltage 7707 is different from voltage 7709, then a DC offset will appear between the I channel modulator 7104*a* and the Q channel modulator 7104*b*, which results in carrier insertion in the IQ harmonically rich signal 7412. The relative amplitude of the carrier frequency energy increases in proportion to the amount of DC offset.

Figure 78:
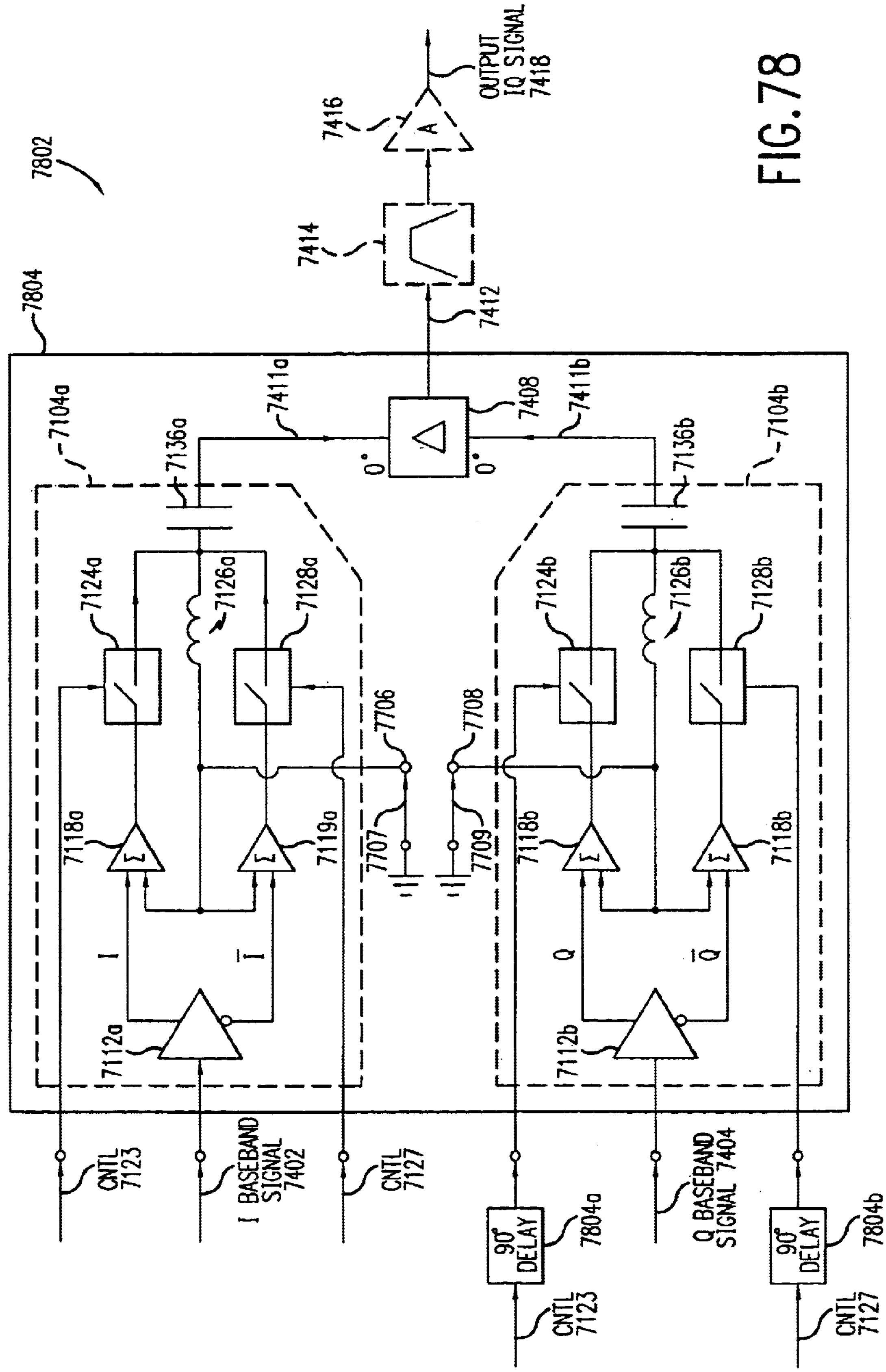
FIG. 78 illustrates an IQ balanced modulator 7802 configured for carrier insertion according to embodiments of the invention.

FIG. 78 illustrates a transmitter 7802 that is a second embodiment of an IQ transmitter having two DC terminals to cause DC offset, and therefore carrier insertion. Transmitter 7802 is similar to transmitter 7702 except that the 90 degree phase shift between the I and Q channels is achieved by phase shifting the control signals, similar to that done in transmitter 7608. More specifically, delays 7804*a* and 7804*b* phase shift the control signals 7123 and 7127 for the Q channel modulator 7104*b* relative to those of the I channel modulator 7104*a*. As a result, the Q modulator 7104*b* samples the Q baseband signal 7404 with 90 degree delay relative to the sampling of the I baseband signal 7402 by the I channel modulator 7104*a*. Therefore, the Q harmonically rich signal 7411*b* is phase shifted by 90 degrees relative to the I harmonically rich signal 7411*a*, which are combined by the in-phase combiner 7806.

7.4 Transceiver Embodiments

Figure 91:
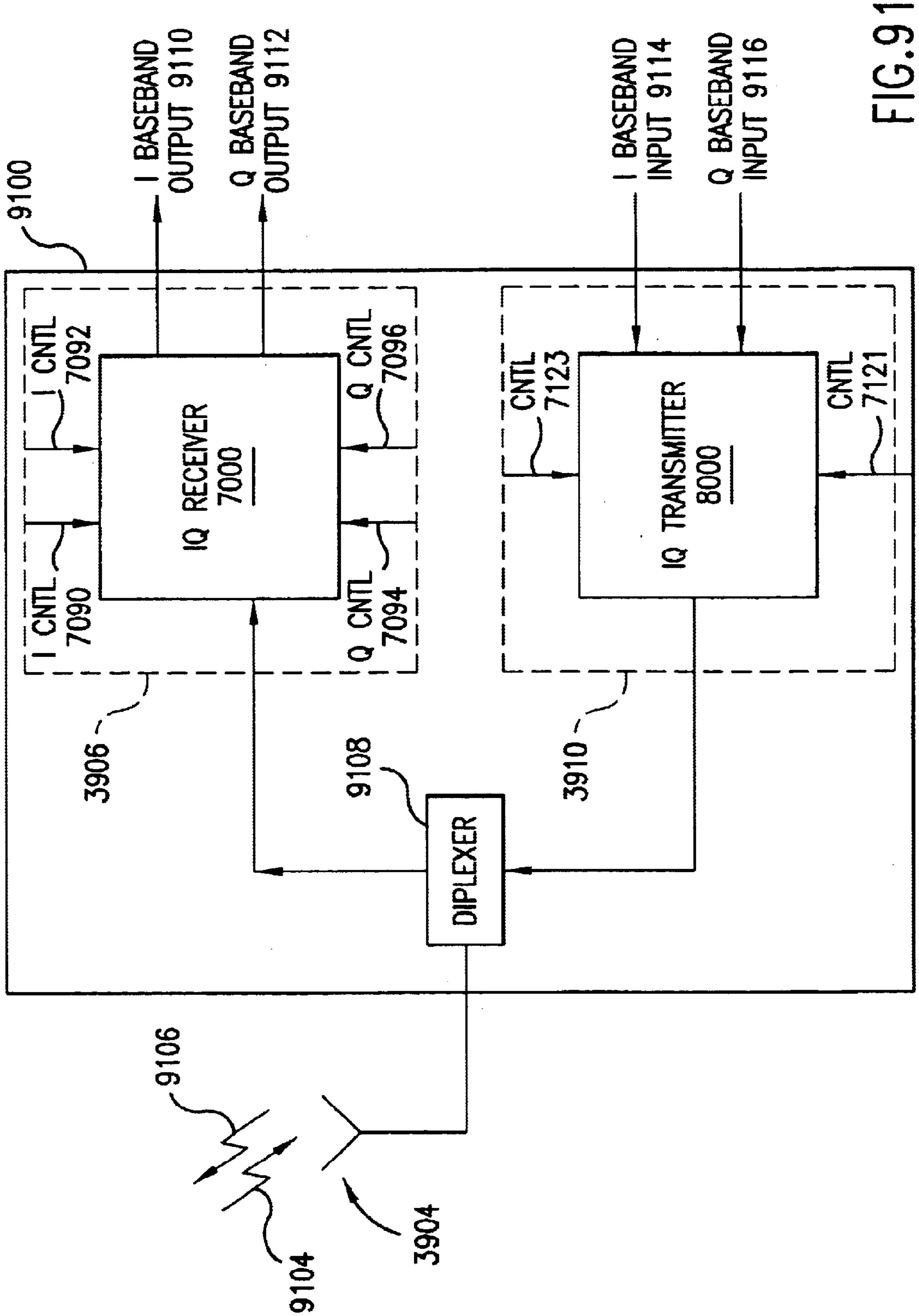
FIG. 91 illustrates an IQ transceiver 9100 according to embodiments of the present invention.

Referring to FIG. 39, in embodiments the receiver 3906, transmitter 3910, and LNA/PA 3904 are configured as a transceiver, such as but not limited to transceiver 9100, that is shown in FIG. 91.

Referring to FIG. 91, the transceiver 9100 includes a diplexer 9108, the IQ receiver 7000, and the IQ transmitter 8000. Transceiver 9100 up-converts an I baseband signal 9114 and a Q baseband signal 9116 using the IQ transmitter 8000 (FIG. 80) to generate an IQ RF output signal 9106. A detailed description of the IQ transmitter 8000 is included for example in section 7.3.2.2, to which the reader is referred for further details. Additionally, the transceiver 9100 also down-converts a received RF signal 9104 using the IQ Receiver 7000, resulting in I baseband output signal 9110 and a Q baseband output signal 9112. A detailed description of the IQ receiver 7000 is included in section 7.2.2, to which the reader is referred for further details.

7.5 Demodulator/Modulator Facilitation Module

Figure 47:
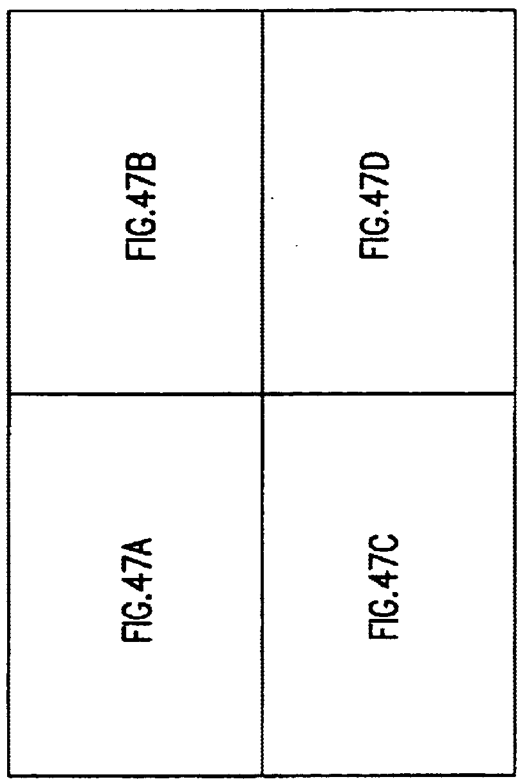
Figure 47A:
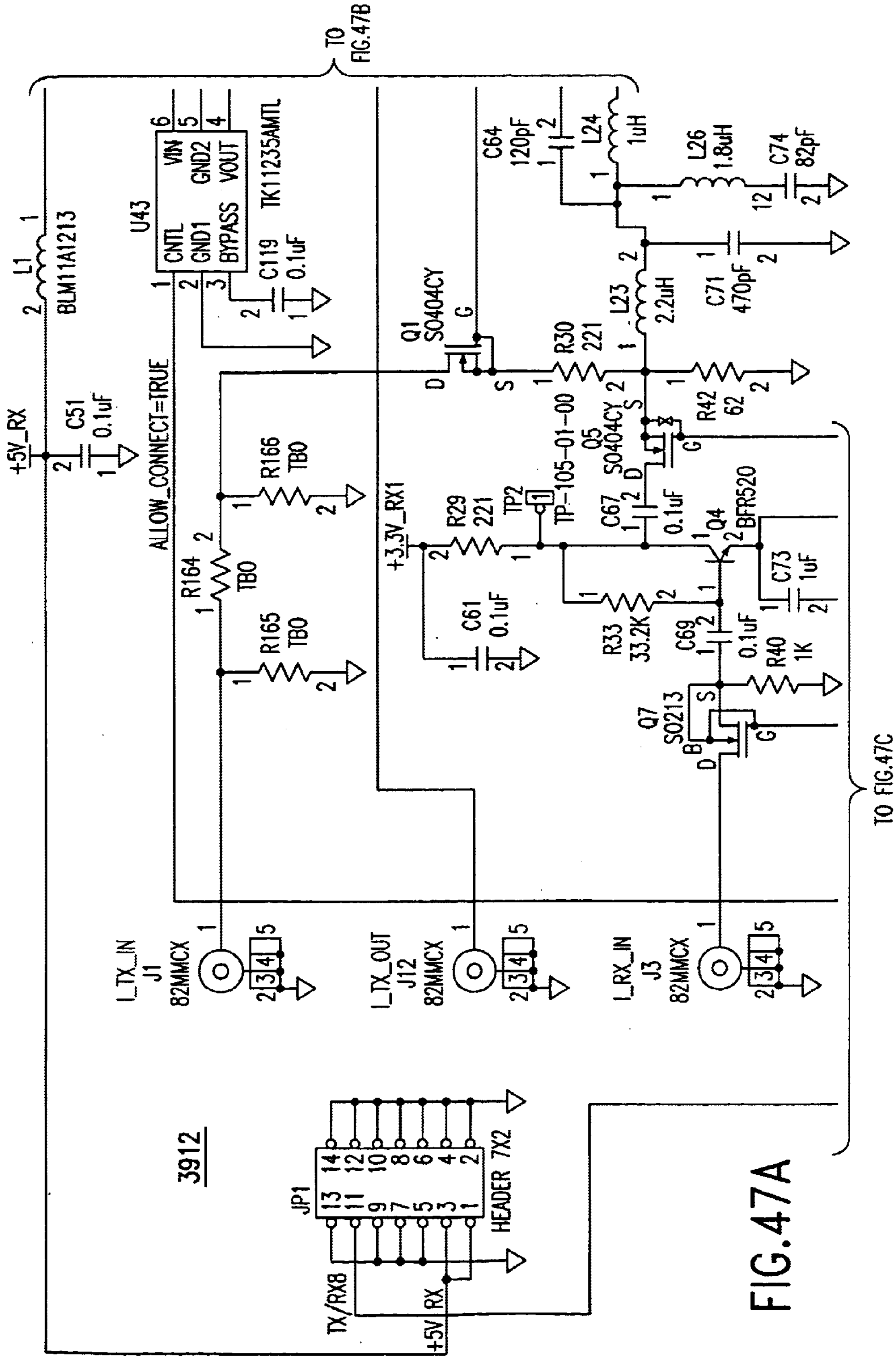
Figure 47B:
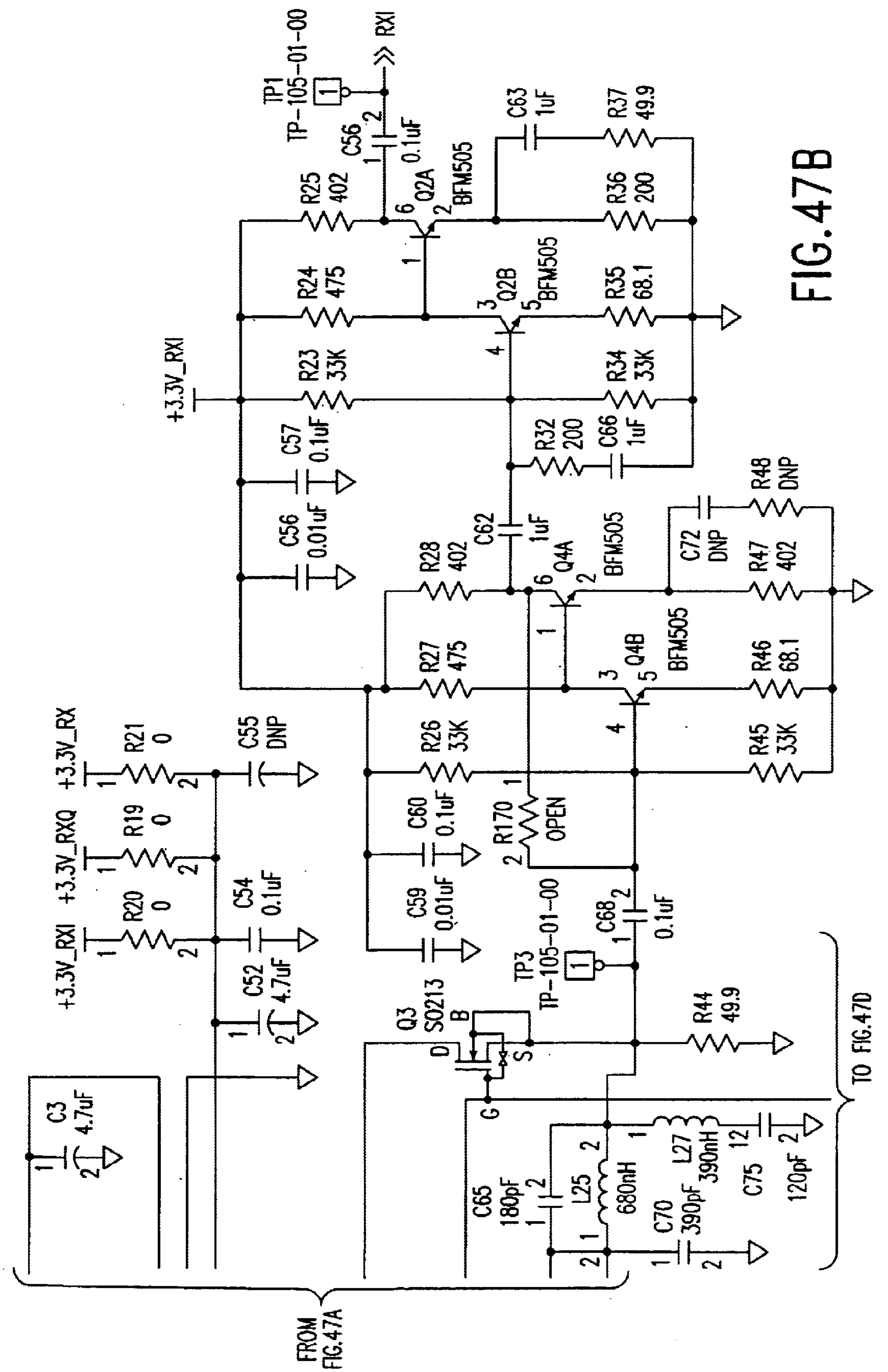
Figure 47C:
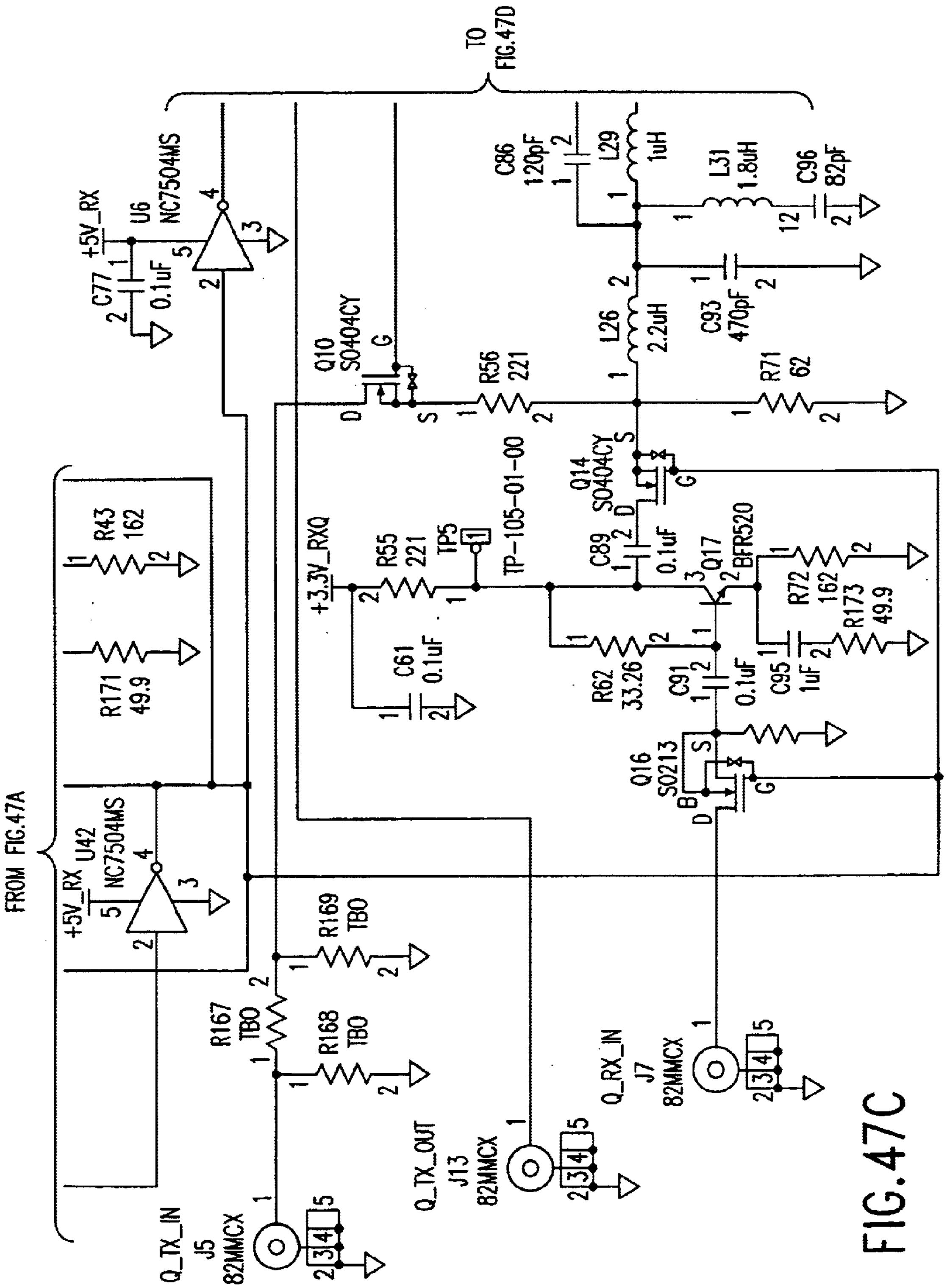
Figure 47D:
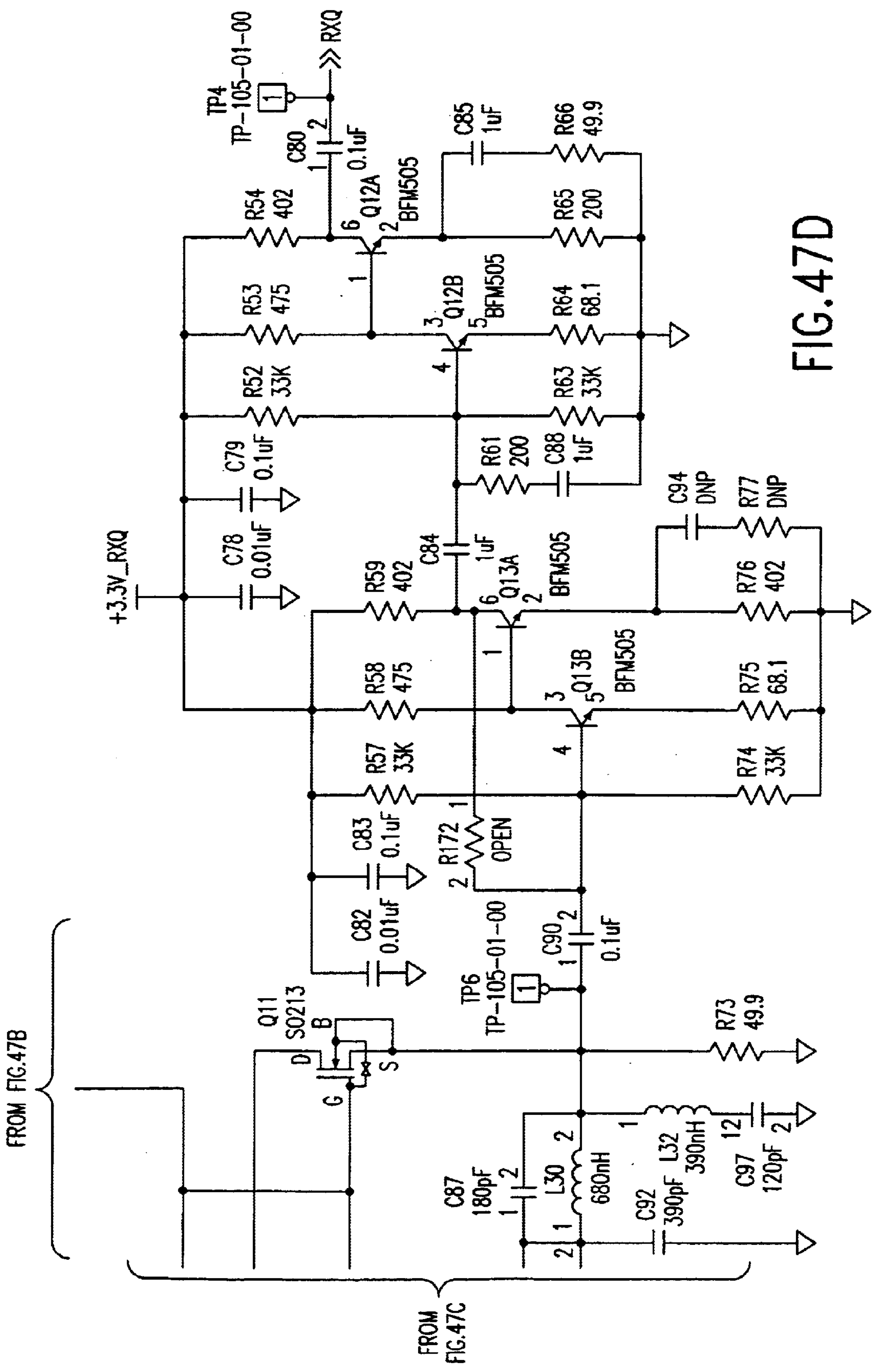
Figure 48A:
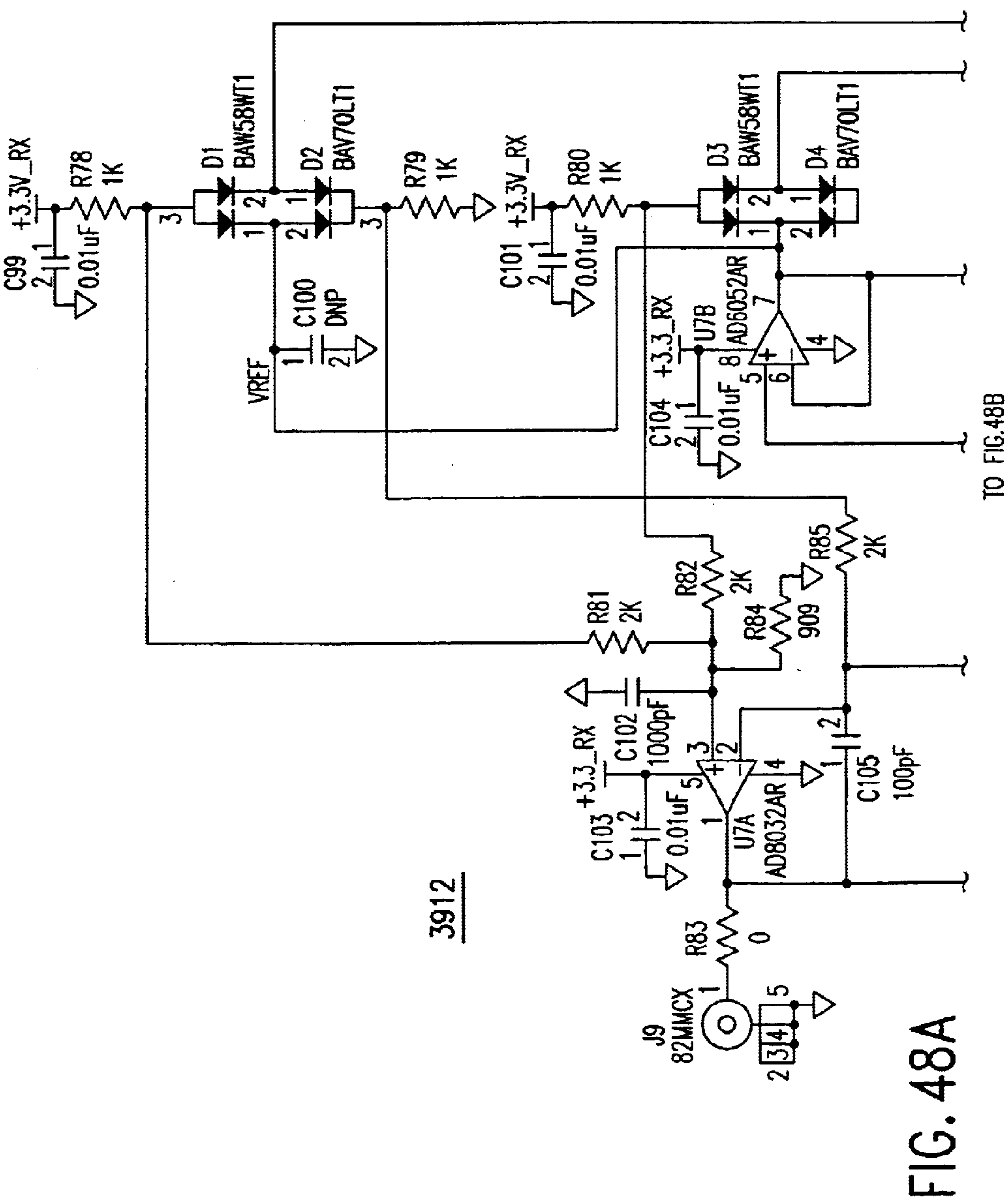
Figure 48B:
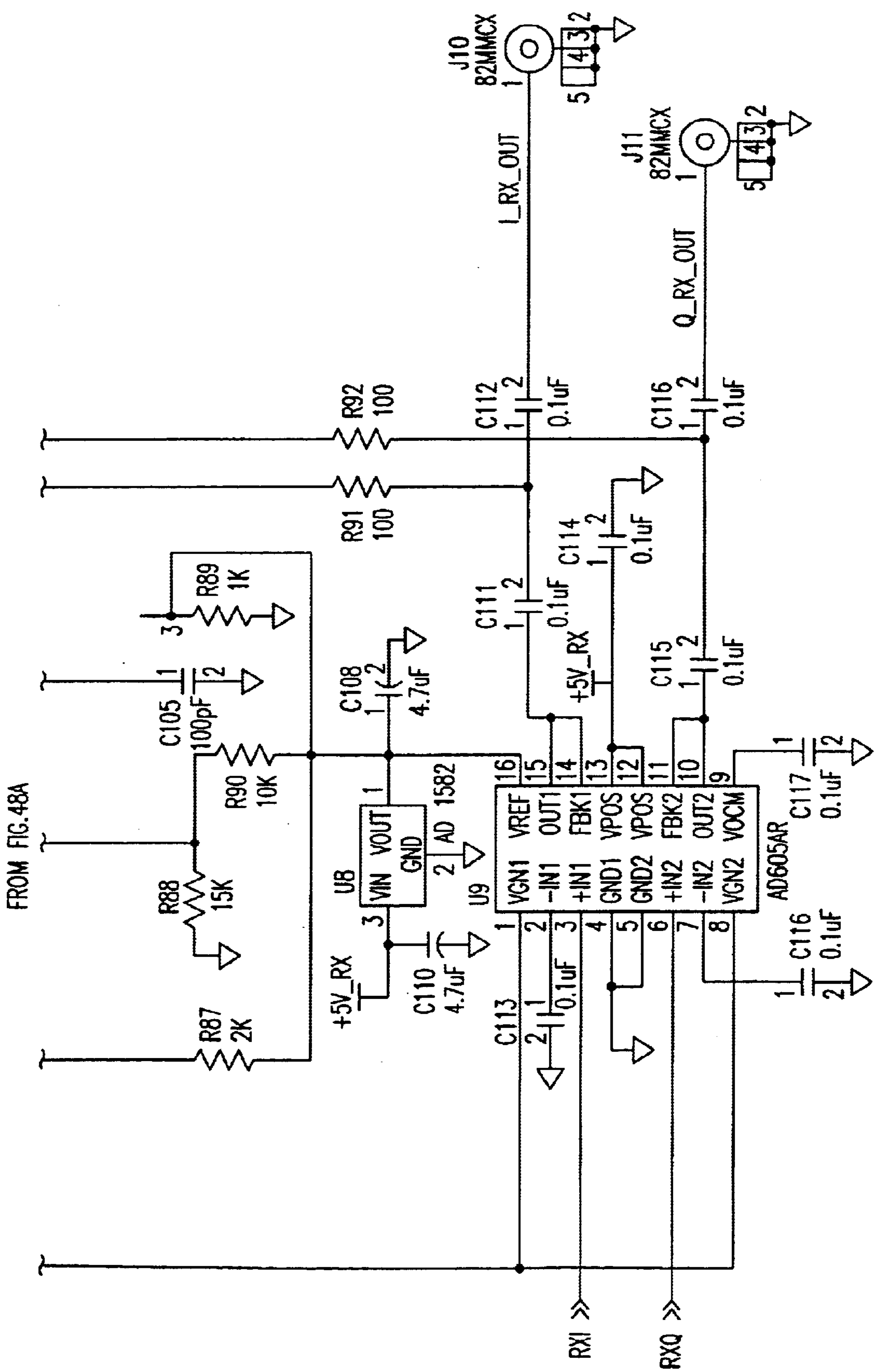

An example demodulator/modulator facilitation module 3912 is shown in FIGS. 47 and 48. A corresponding BOM list is shown in FIGS. 49A and 49B.

Figure 50:
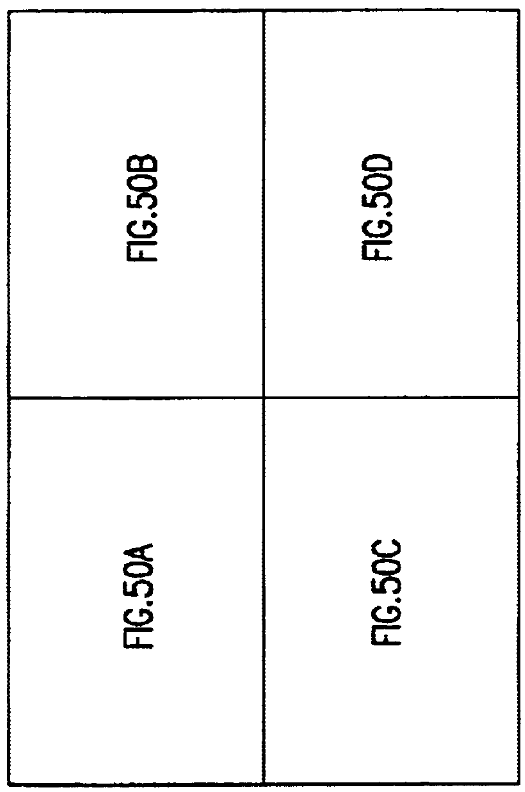
Figure 50A:
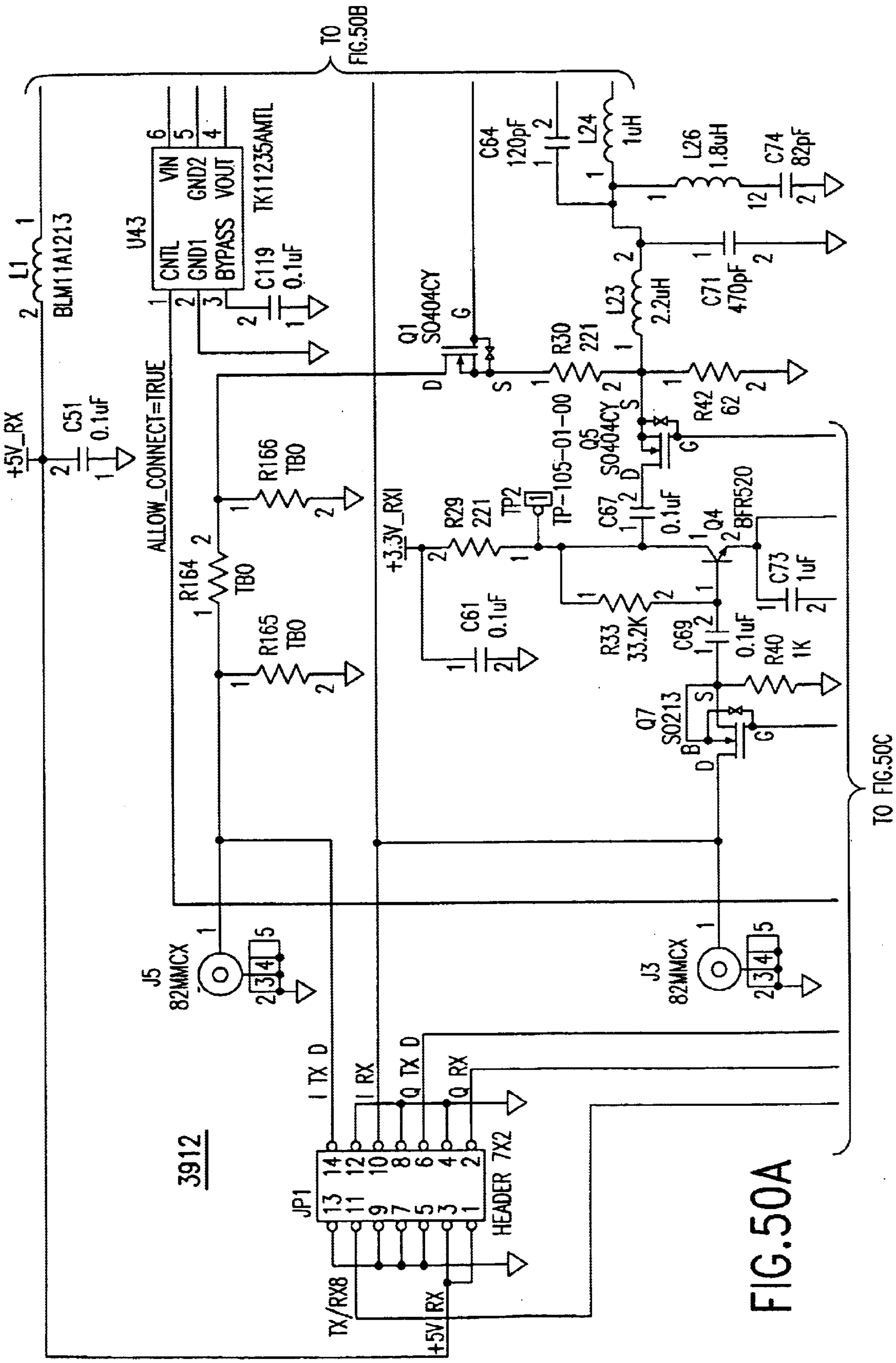
Figure 50B:
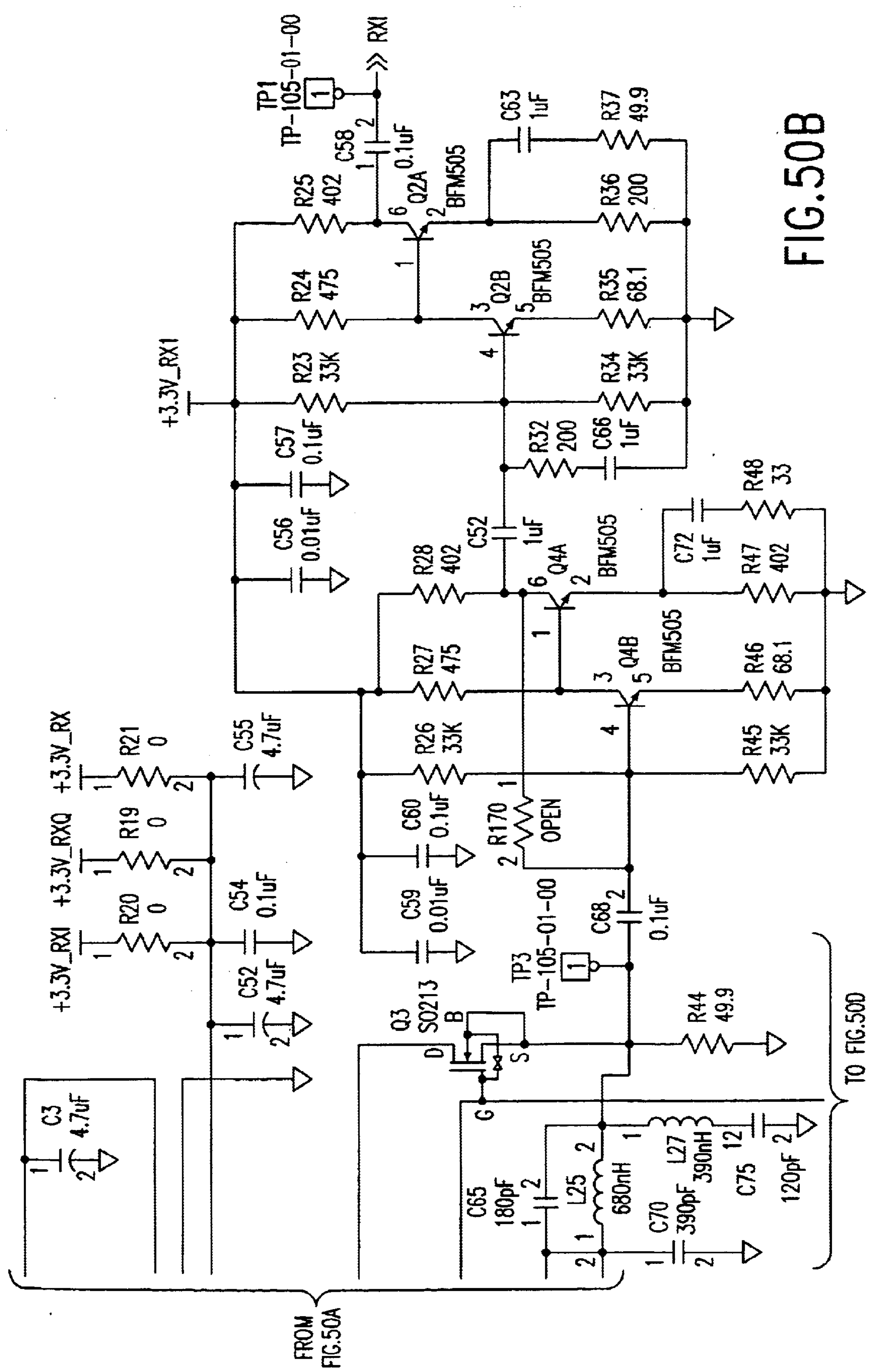
Figure 50C:
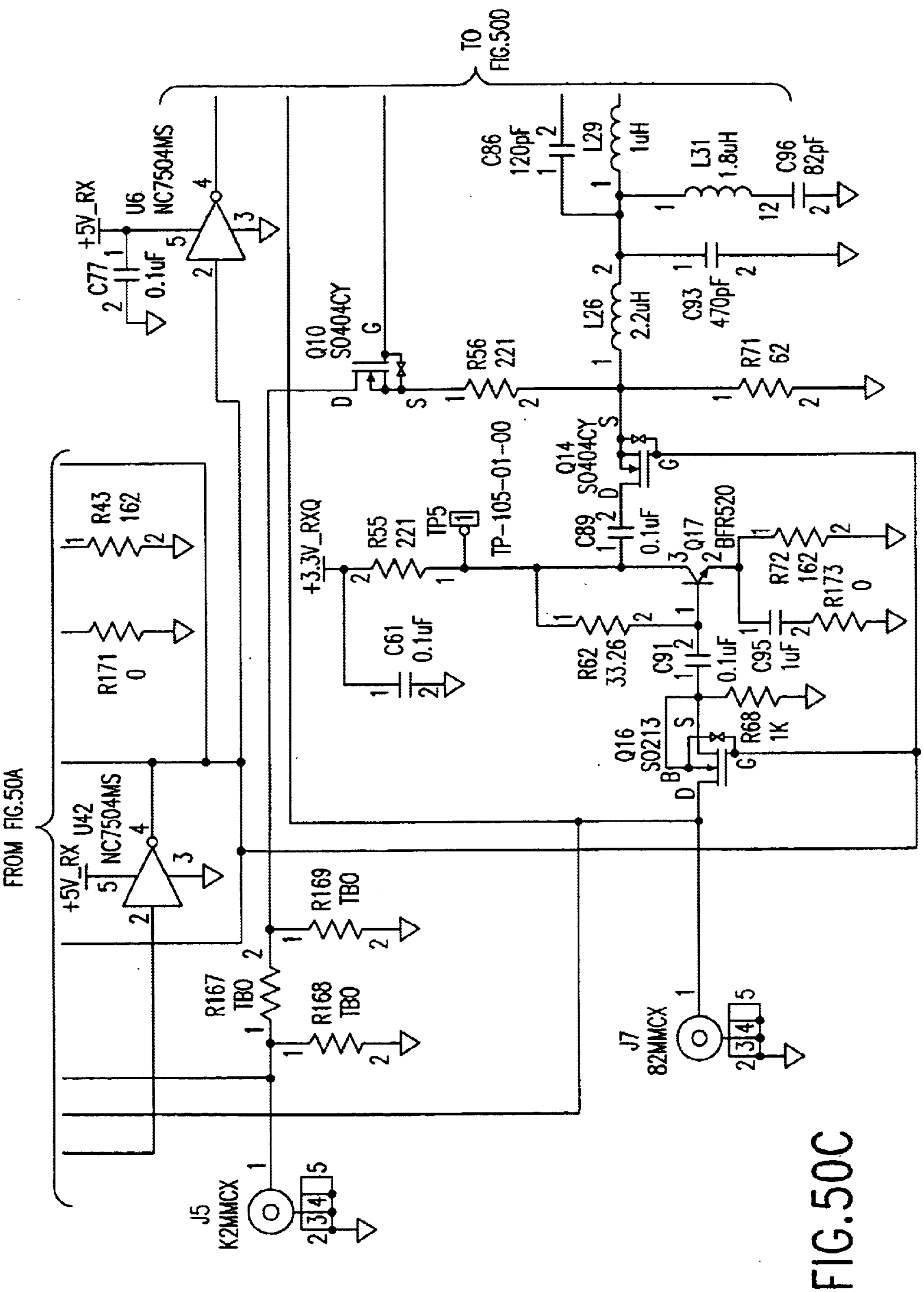
Figure 50D:
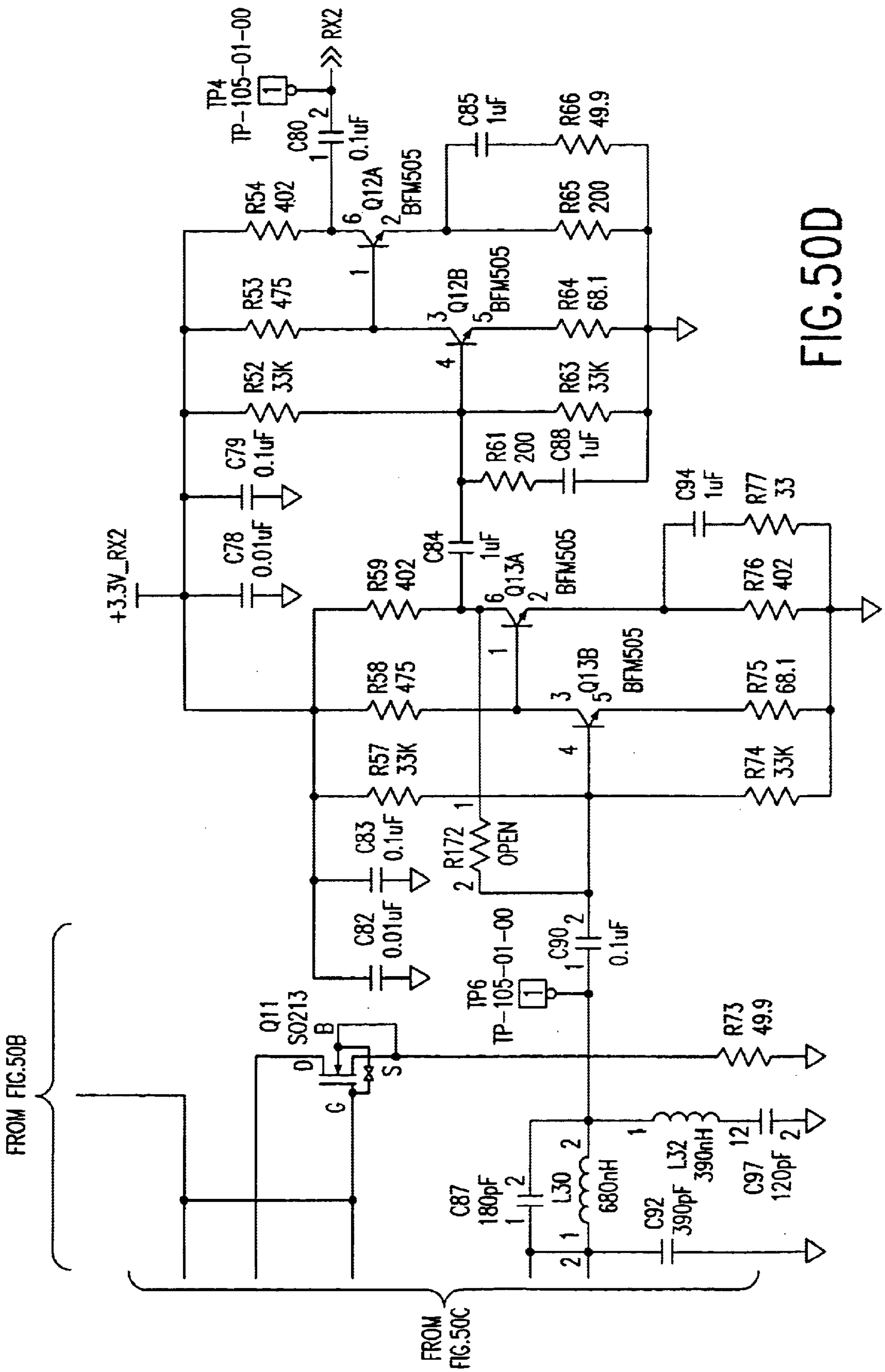
Figure 51A:
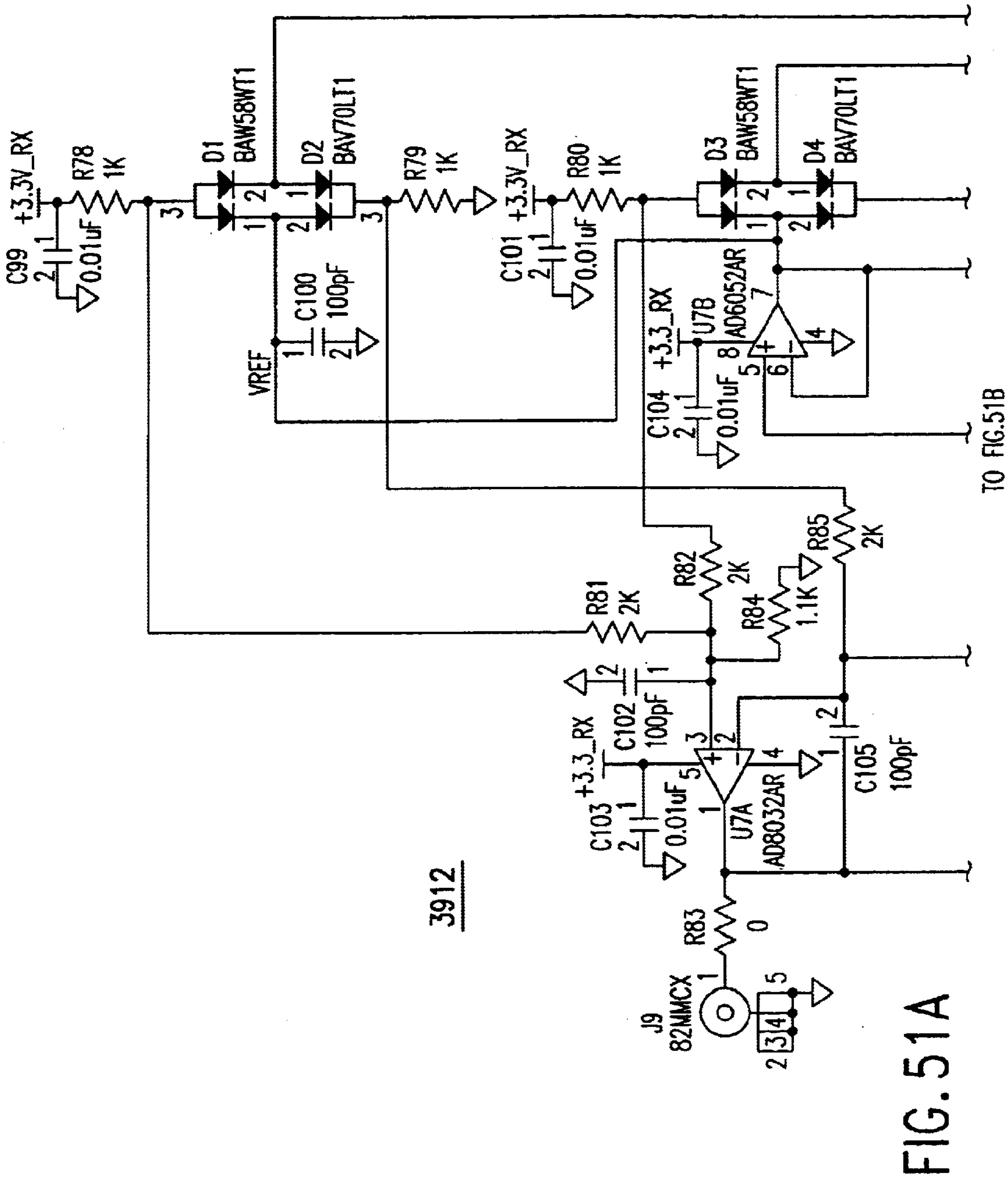
Figure 51B:
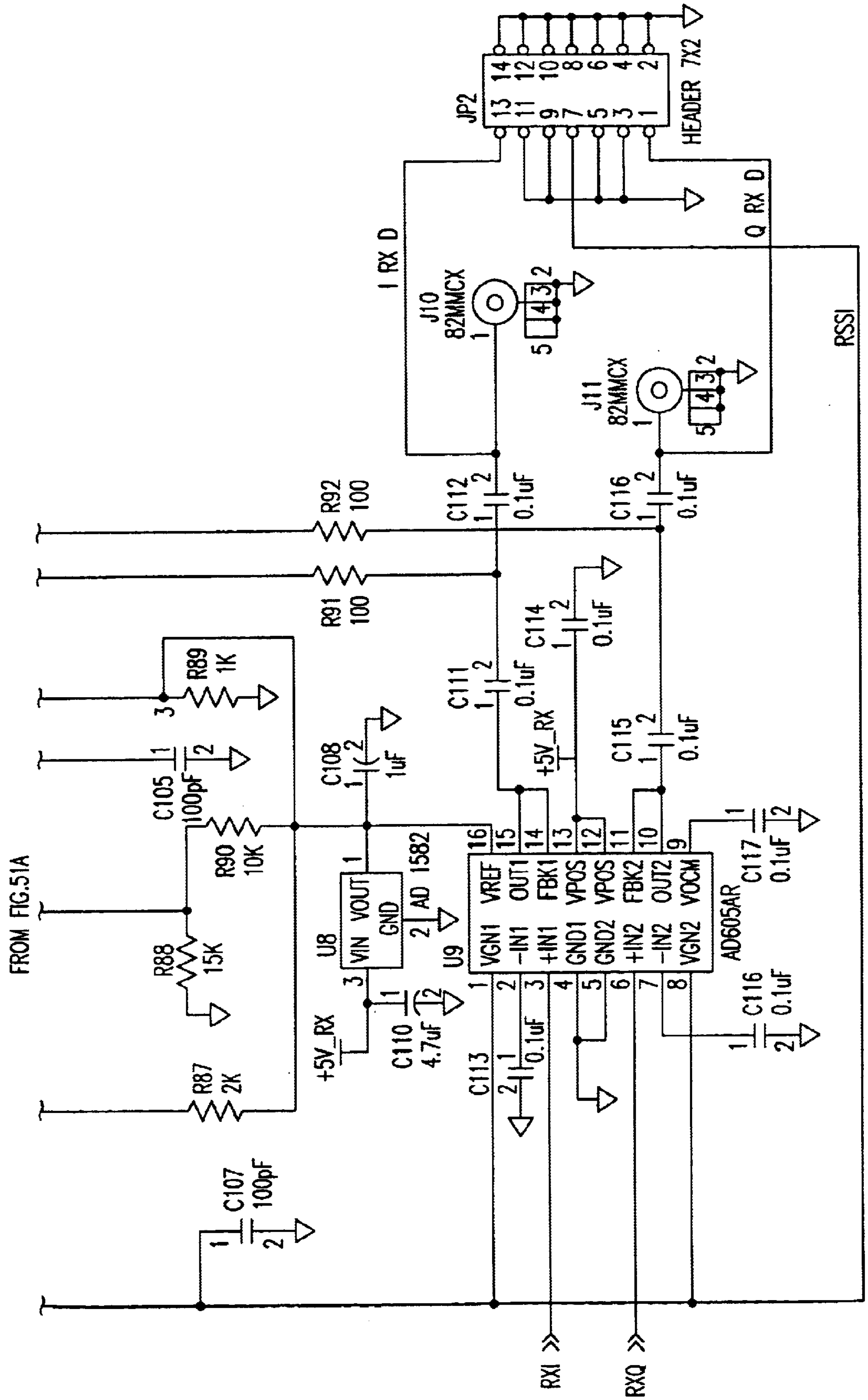

An alternate example demodulator/modulator facilitation module 3912 is shown in FIGS. 50 and 51. A corresponding BOM list is shown in FIGS. 52A and 52B.

Figure 52C:
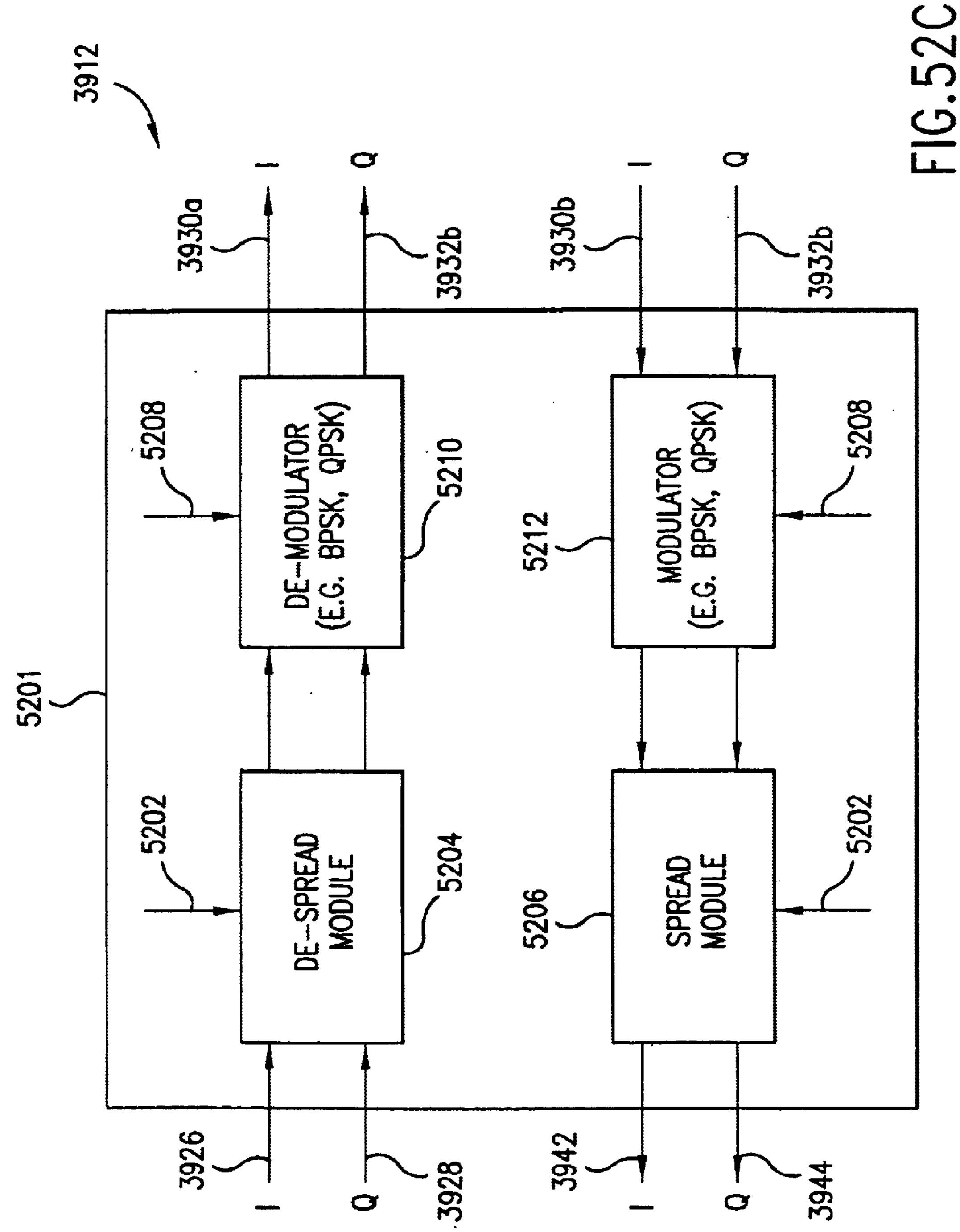

FIG. 52C illustrates an exemplary demodulator/modulator facilitation module 5201. Facilitation module 5201 includes the following: de-spread module 5204, spread module 5206, de-modulator 5210, and modulator 5212.

For receive, the de-spread module 5204 de-spreads received spread signals 3926 and 3928 using a spreading code 5202. Separate spreading codes can be used for the I and Q channels as will be understood by those skilled in the arts. The demodulator 5210 uses a signal 5208 to demodulate the de-spread received signals from the de-spread module 5204, to generate the I baseband signal 3930*a* and the Q baseband signal 3932*a*.

For transmit, the modulator 5212 modulates the I baseband signal 3930*b* and the Q baseband signal 3932*b* using a modulation signal 5208. The resulting modulated signals are then spread by the spread module 5206, to generate I spread signal 3942 and Q spread signal 3944.

In embodiments, the modulation scheme that is utilized is differential binary phase shift keying (DBPSK) or differential quadrature phase shift keying (DQPSK), and is compliant with the various versions of IEEE 802.11. Other modulation schemes could be utilized besides DBPSK or DQPSK, as will understood by those skilled in arts based on the discussion herein.

In embodiments, the spreading code 5202 is a Barker spreading code, and is compliant with the various versions of IEEE 802.11. More specifically, in embodiments, an 11-bit Barker word is utilized for spreading/de-spreading. Other spreading codes could be utilized as will be understood by those skilled in the arts based on the discussion herein.

7.6 MAC Interface

Figure 45:
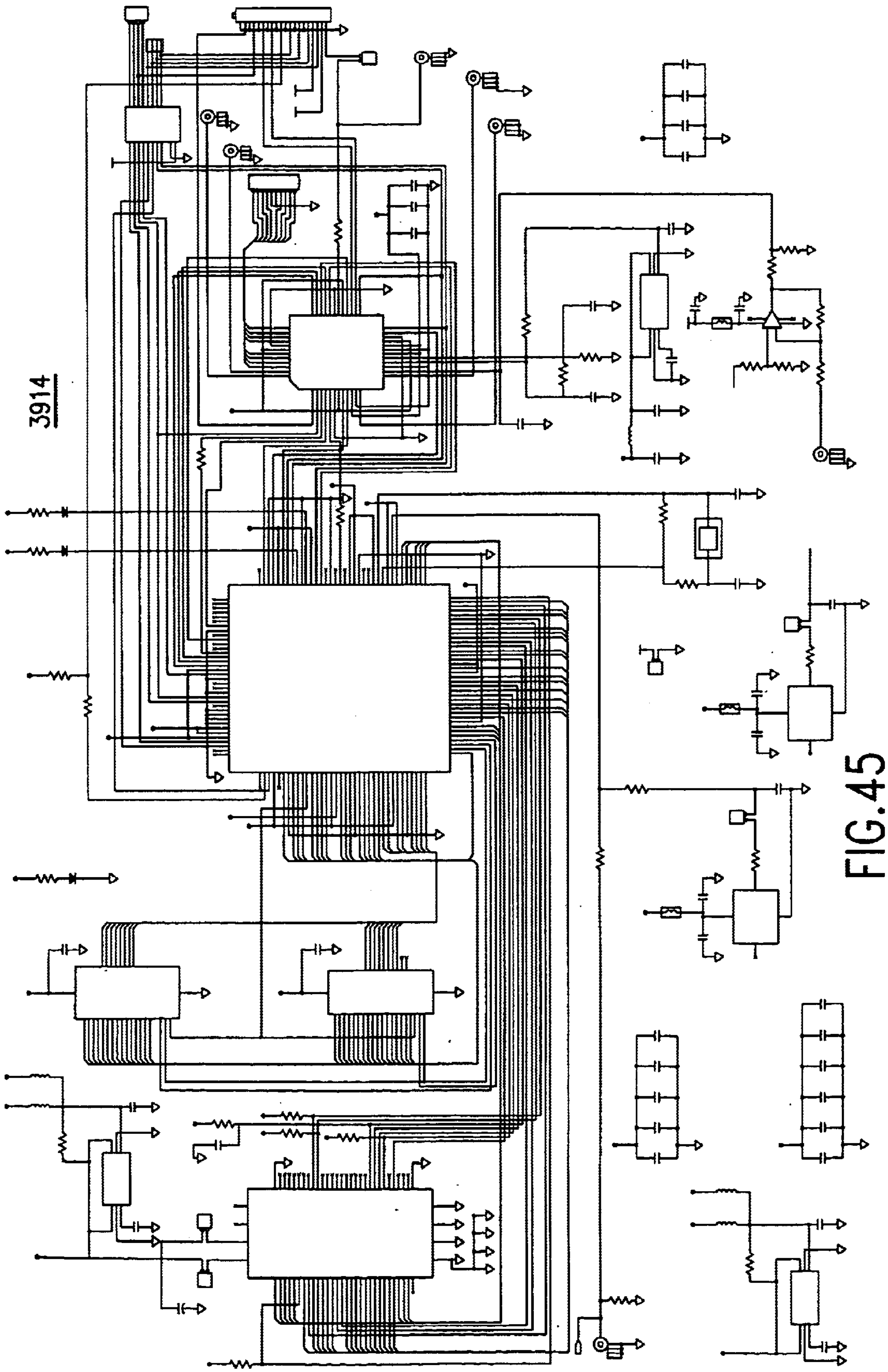

An example MAC interface 3914 is shown in FIG. 45. A corresponding BOM list is shown in FIGS. 46A and 46B.

In embodiments, the MAC 3918 and MAC interface 3914 supply the functionality required to provide a reliable delivery mechanism for user data over noisy, and unreliable wireless media. This is done this while also providing advanced LAN services, equal to or beyond those of existing wired LANs.

The first functionality of the MAC is to provide a reliable data delivery service to users of the MAC. Through a frame exchange protocol at the MAC level, the MAC significantly improves on the reliability of data delivery services over wireless media, as compared to earlier WLANs. More specifically, the MAC implements a frame exchange protocol to allow the source of a frame to determine when the frame has been successfully received at the destination. This frame exchange protocol adds some overhead beyond that of other MAC protocols, like IEEE 802.3, because it is not sufficient to simply transmit a frame and expect that the destination has received it correctly on the wireless media. In addition, it cannot be expected that every station in the WLAN is able to communicate with every other station in the WLAN. If the source does not receive this acknowledgment, then the source will attempt to transmit the frame again. This retransmission of frame by the source effectively reduces the effective error rate of the medium at the cost of additional bandwidth consumption.

The minimal MAC frame exchange protocol consists of two frames, a frame sent from the source to the destination and an acknowledgment from the destination that the frame was received correctly. The frame and its acknowledgment are an atomic unit of the MAC protocol. As such, they cannot be interrupted by the transmission from any other station. Additionally, a second set of frames may be added to the minimal MAC frame exchange. The two added frames are a request to send frame and a clear to send frame. The source sends a request to send to the destination. The destination returns a clear to send to the source. Each of these frames contains information that allows other stations receiving them to be notified of the upcoming frame transmission, and therefore to delay any transmission their own. The request to send and clear frames serve to announce to all stations in the neighborhood of both the source and the destination about the pending transmission from the source to the destination. When the source receives the clear to send from the destination, the real frame that the source wants delivered to the destination is sent. If the frame is correctly received at the destination, then the destination will return an acknowledgment completing the frame exchange protocol. While this four way frame exchange protocol is a required function of the MAC, it may be disabled by an attribute in the management information base.

The second functionality of the MAC is to fairly control access to the shared wireless medium. It performs this function through two different access mechanisms: the basic access mechanism, call the distribution coordination system function, and a centrally controlled access mechanism, called the point coordination function.

The basic access mechanism is a carrier sense multiple access with collision avoidance (CSMA/CA) with binary exponential backoff. This access mechanism is similar to that used for IEEE 802.3, with some variations. CSMA/CA is a "listen before talk" (LBT) access mechanism. In this type of access mechanism, a station will listen to the medium before beginning a transmission. If the medium is already carrying a transmission, then the station that listening will not begin its own transmission. More specifically, if a listening station detects an existing transmission in progress, the listening station enters a transmit deferral period determined by the binary exponential backoff algorithm. The binary exponential backoff mechanism chooses a random number which represents the amount of time that must elapse while there are not any transmission. In other words, the medium is idle before the listening station may attempt to begin its transmission again. The MAC may also implement a network allocation vector (NAV). The NAV is the value that indicates to a station that amount of time that remains before a medium becomes available. The NAV is kept current through duration values that are transmitted in all frames. By examining the NAV, a station may avoid transmitting, even when the medium does not appear to be carrying a transmission in the physical sense.

The centrally controlled access mechanism uses a poll and response protocol to eliminate the possibility of contention for the medium. This access mechanism is called the point coordination function (PCF). A point coordinator (PC) controls the PCF. The PC is always located in an AP. Generally, the PCF operates by stations requesting that the PC register them on a polling list, and the PC then regularly polls the stations for traffic while also delivering traffic to the stations. With proper planning, the PCF is able to deliver near isochronous service to the stations on the polling list.

The third function of the MAC is to protect the data that it delivers. Because it is difficult to contain wireless WLAN signals to a particular physical area, the MAC provides a privacy service, called Wired Equivalent Privacy (WEP), which encrypts the data sent over the wireless medium. The level of encryption chosen approximates the level of protection data might have on a wireless LAN in a building with controlled access that prevents physically connecting to the LAN without authorization.

7.7 Control Signal Generator—Synthesizer

Figure 55:
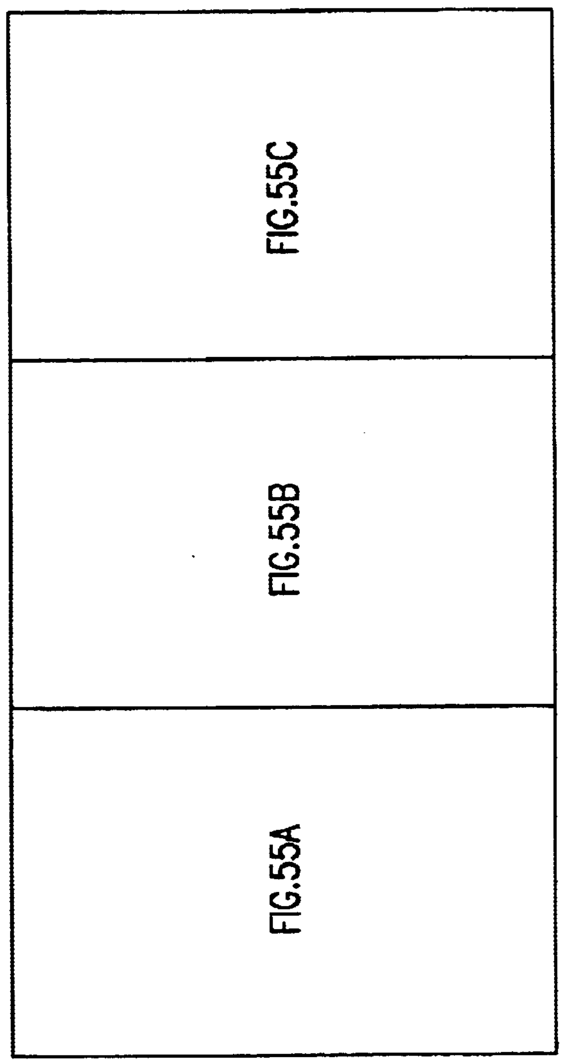
Figure 55A:
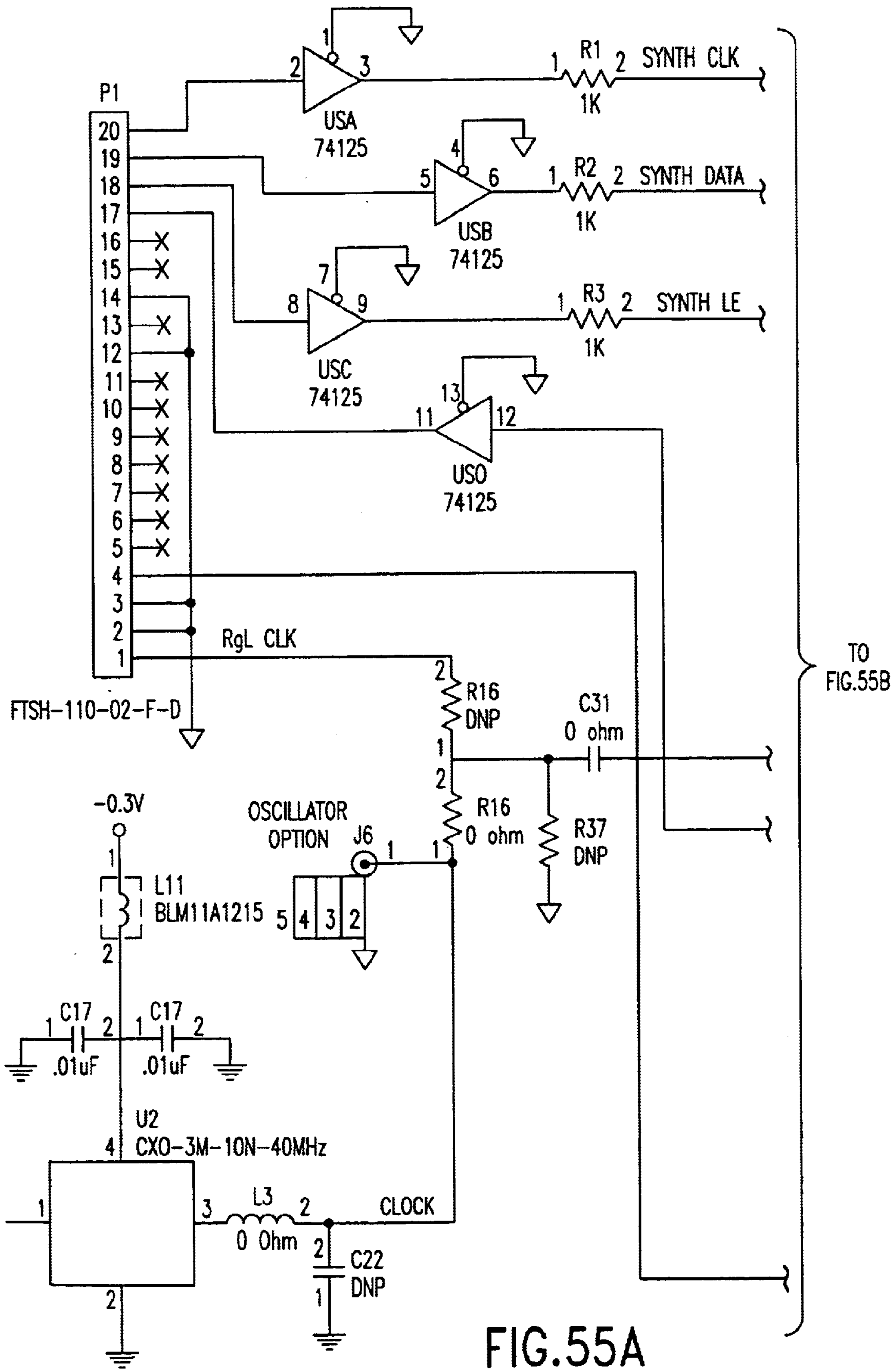
Figure 55B:
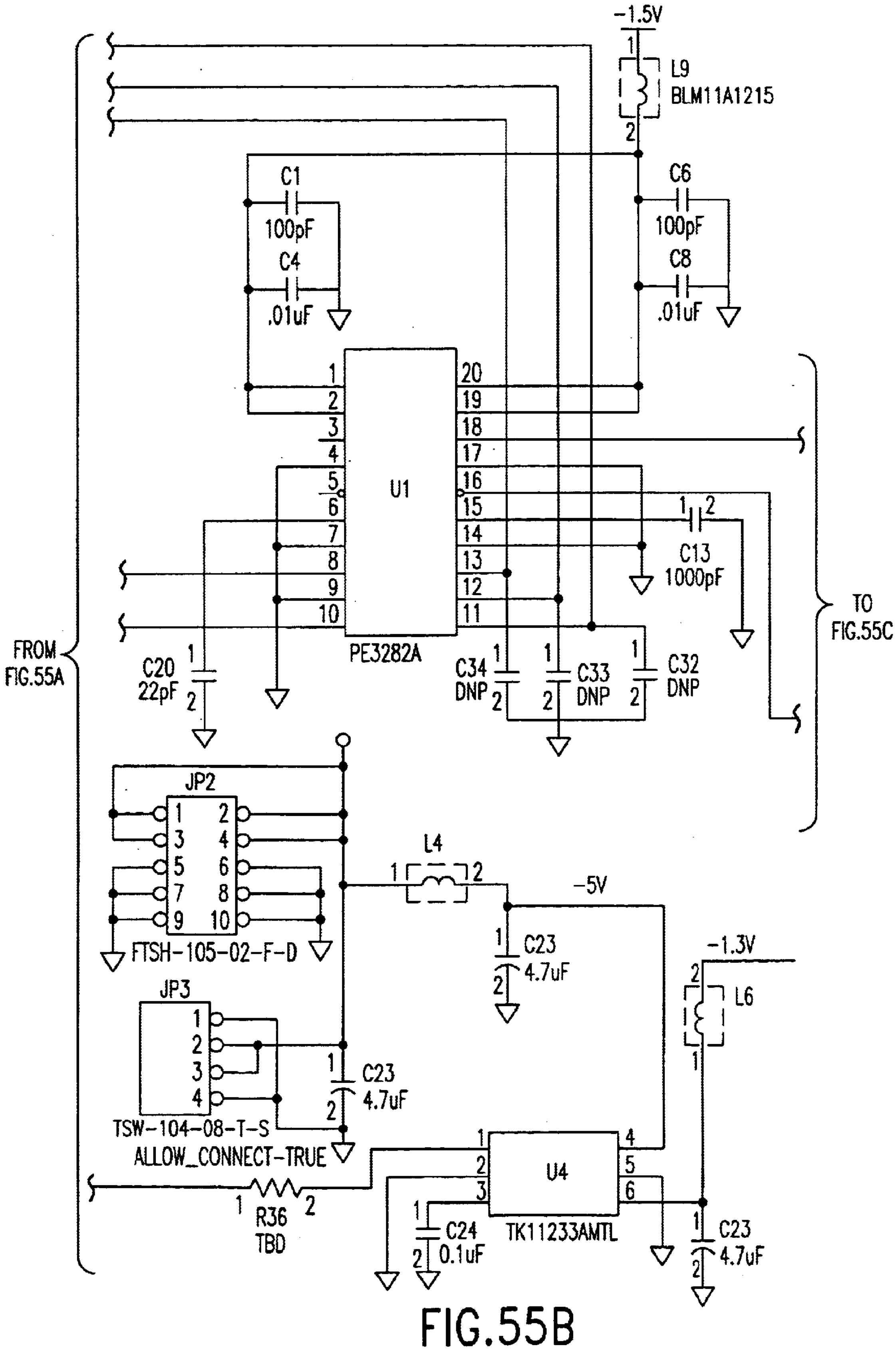
Figure 55C:
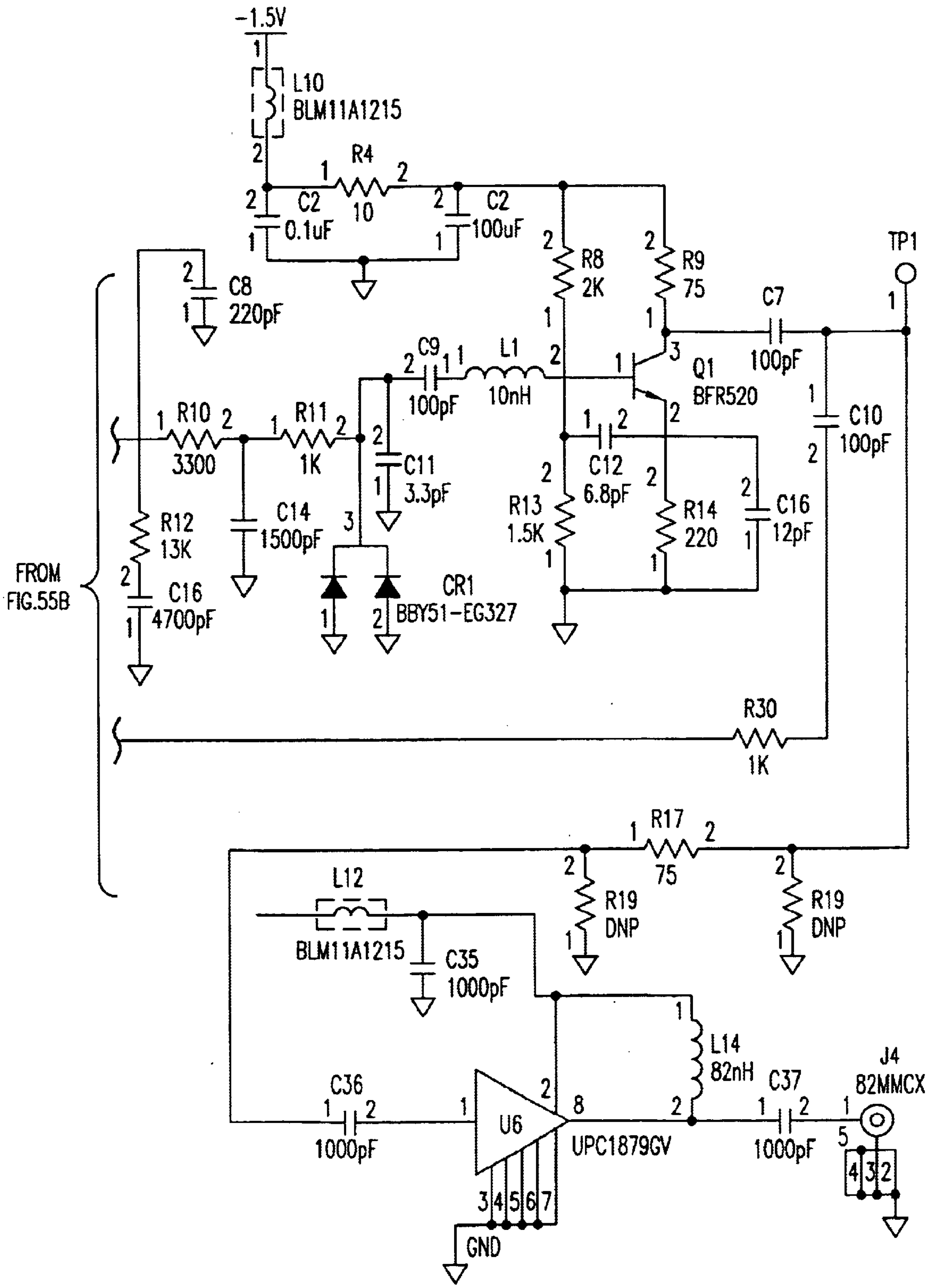
Figure 57:
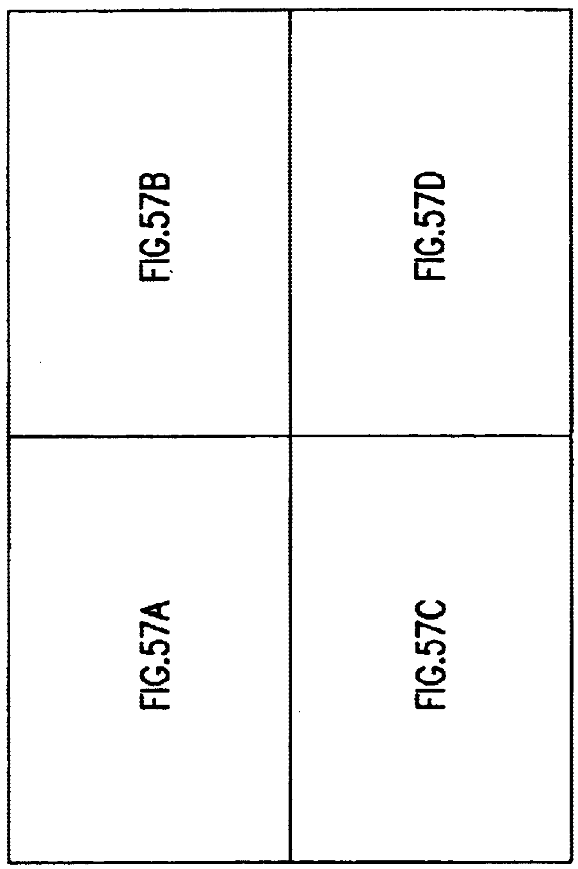
Figure 57A:
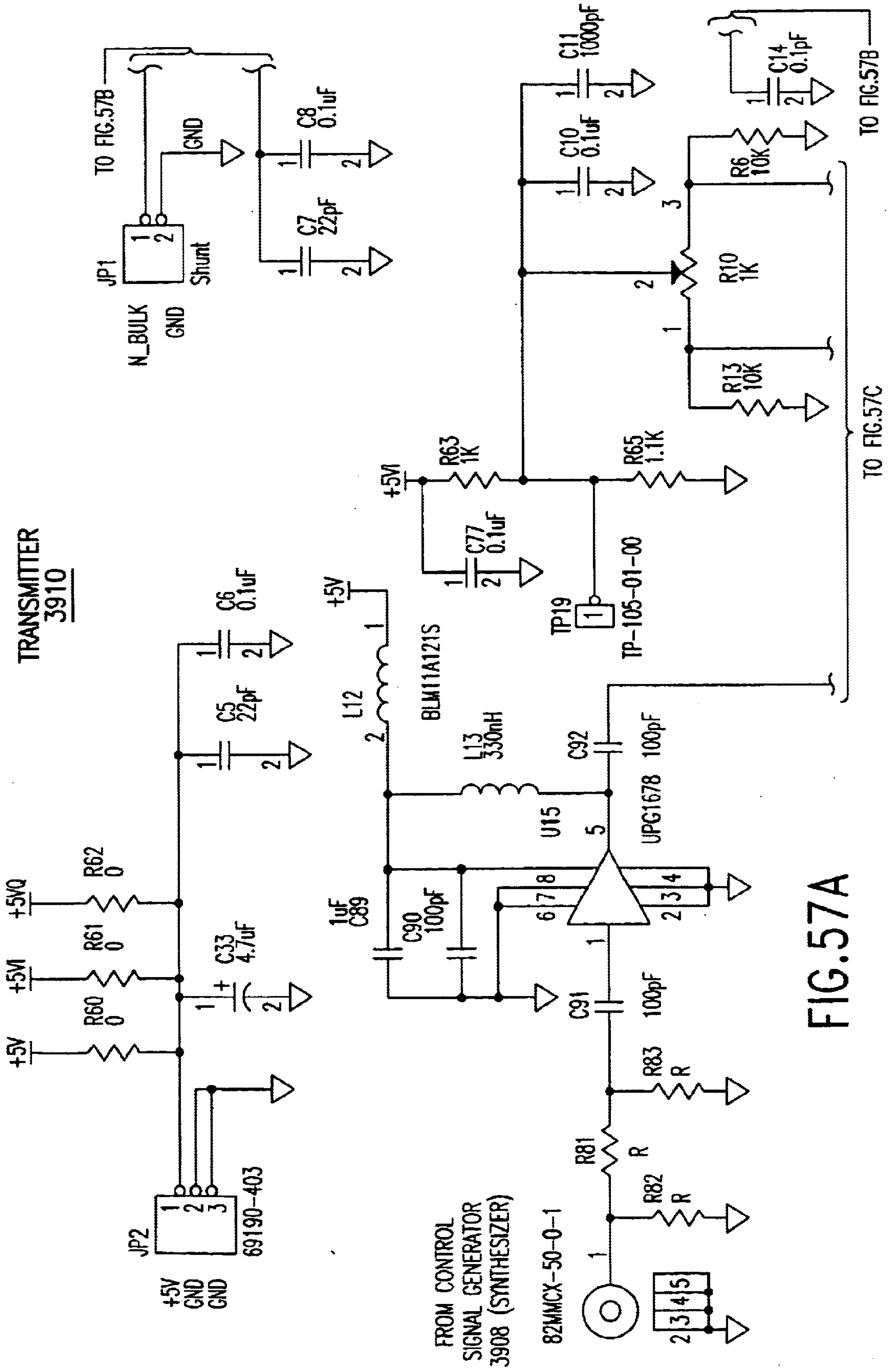
Figure 57B:
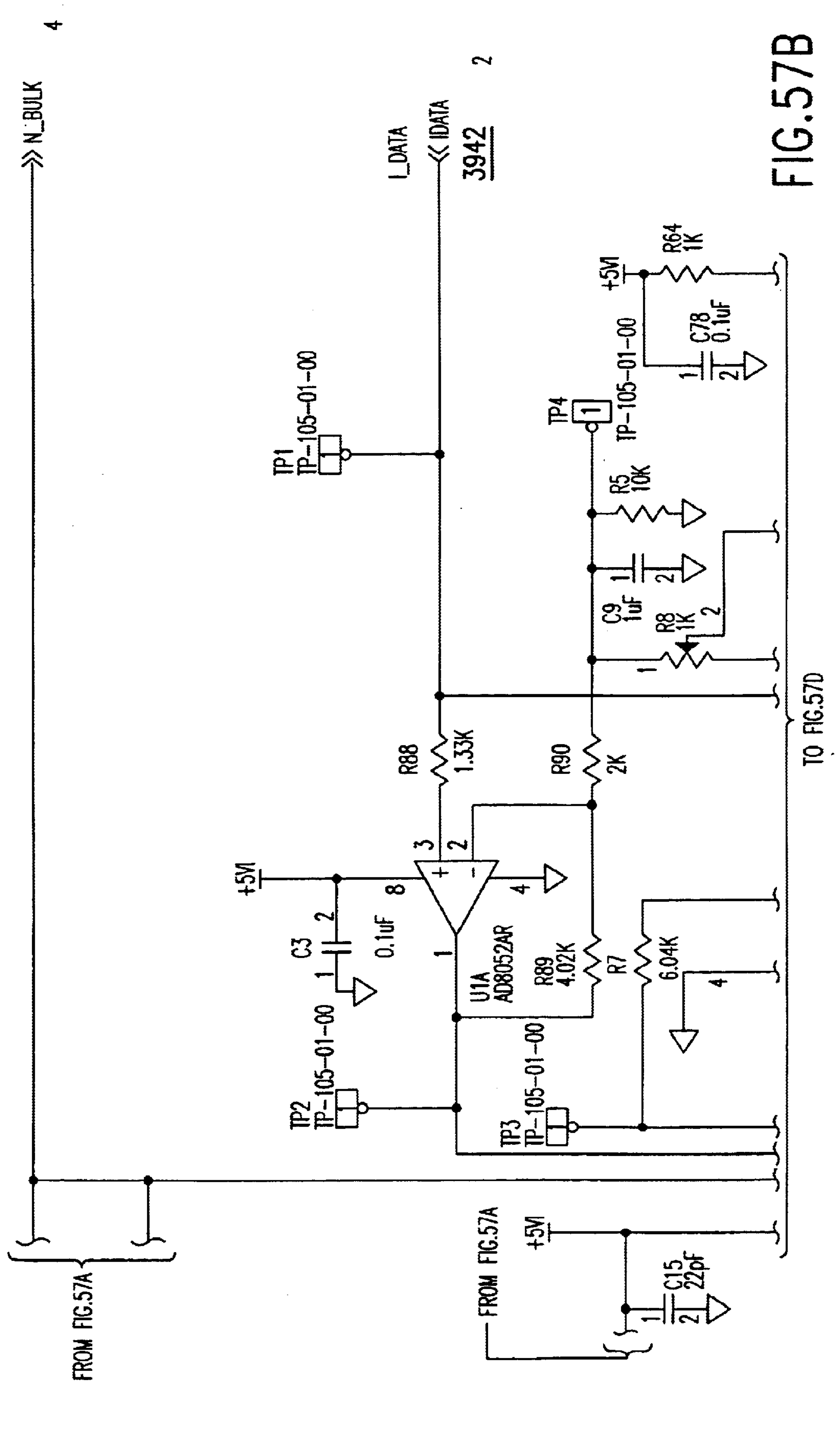
Figure 57C:
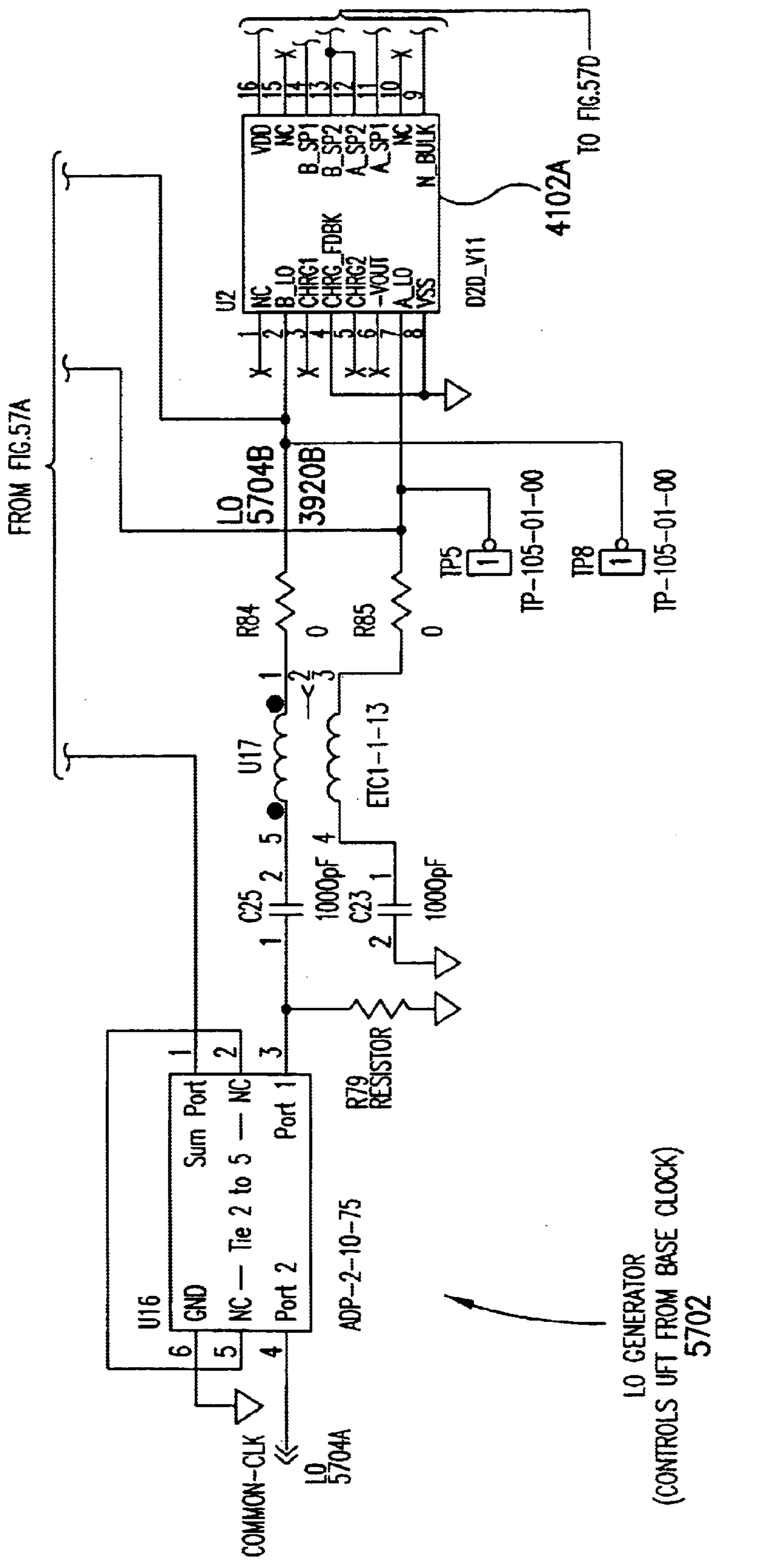
Figure 57D:
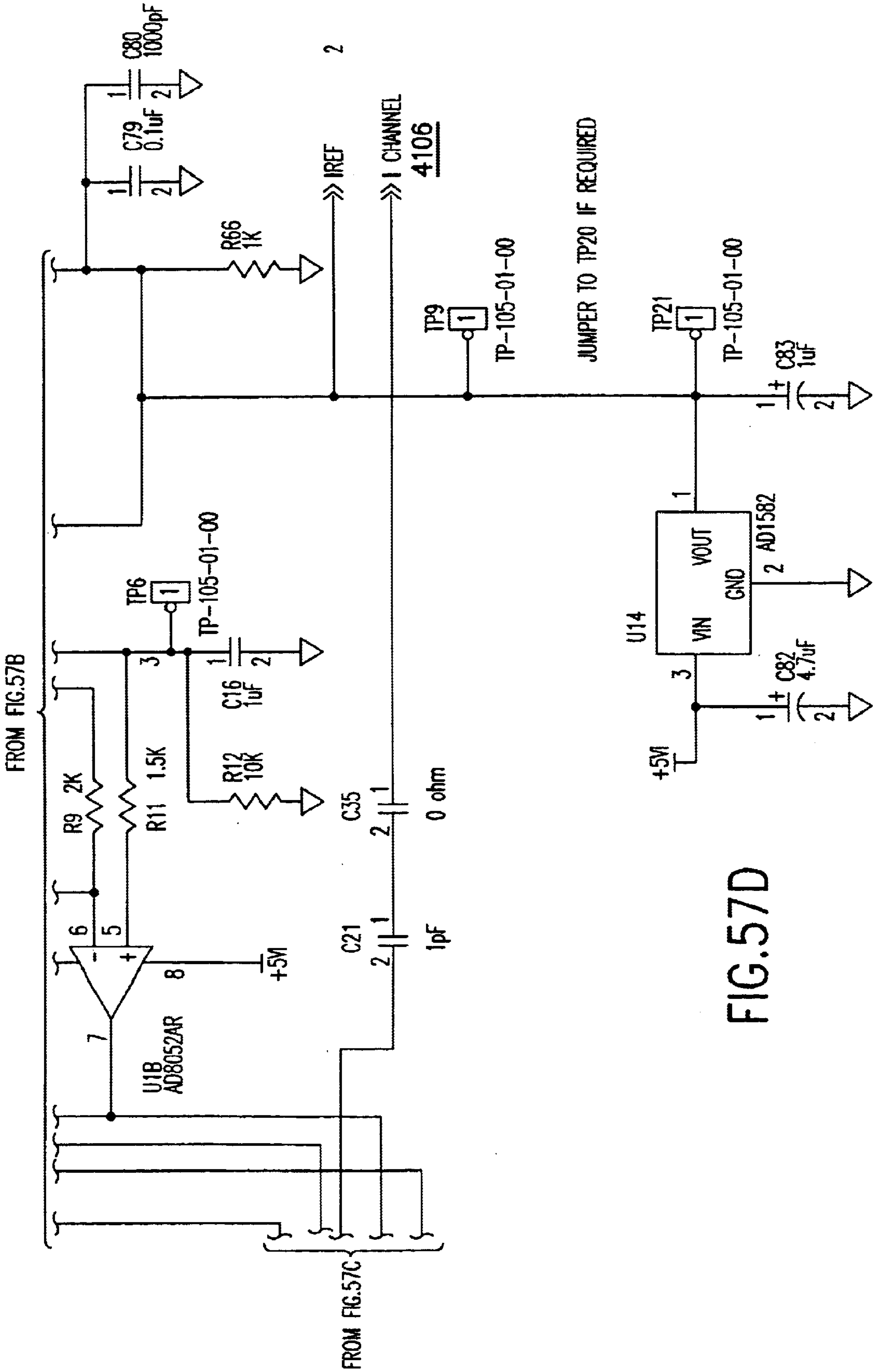
Figure 58:
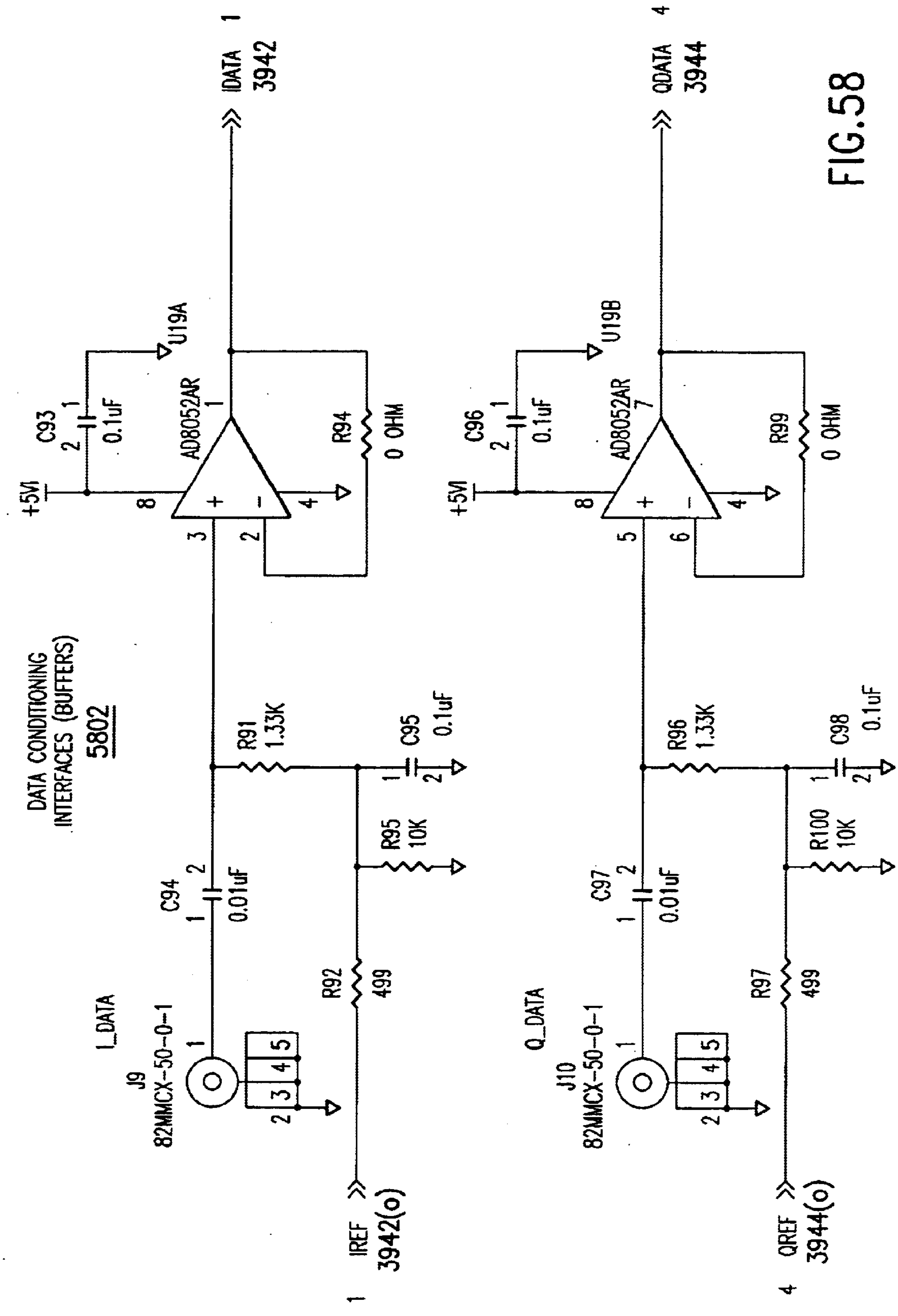
Figure 59:
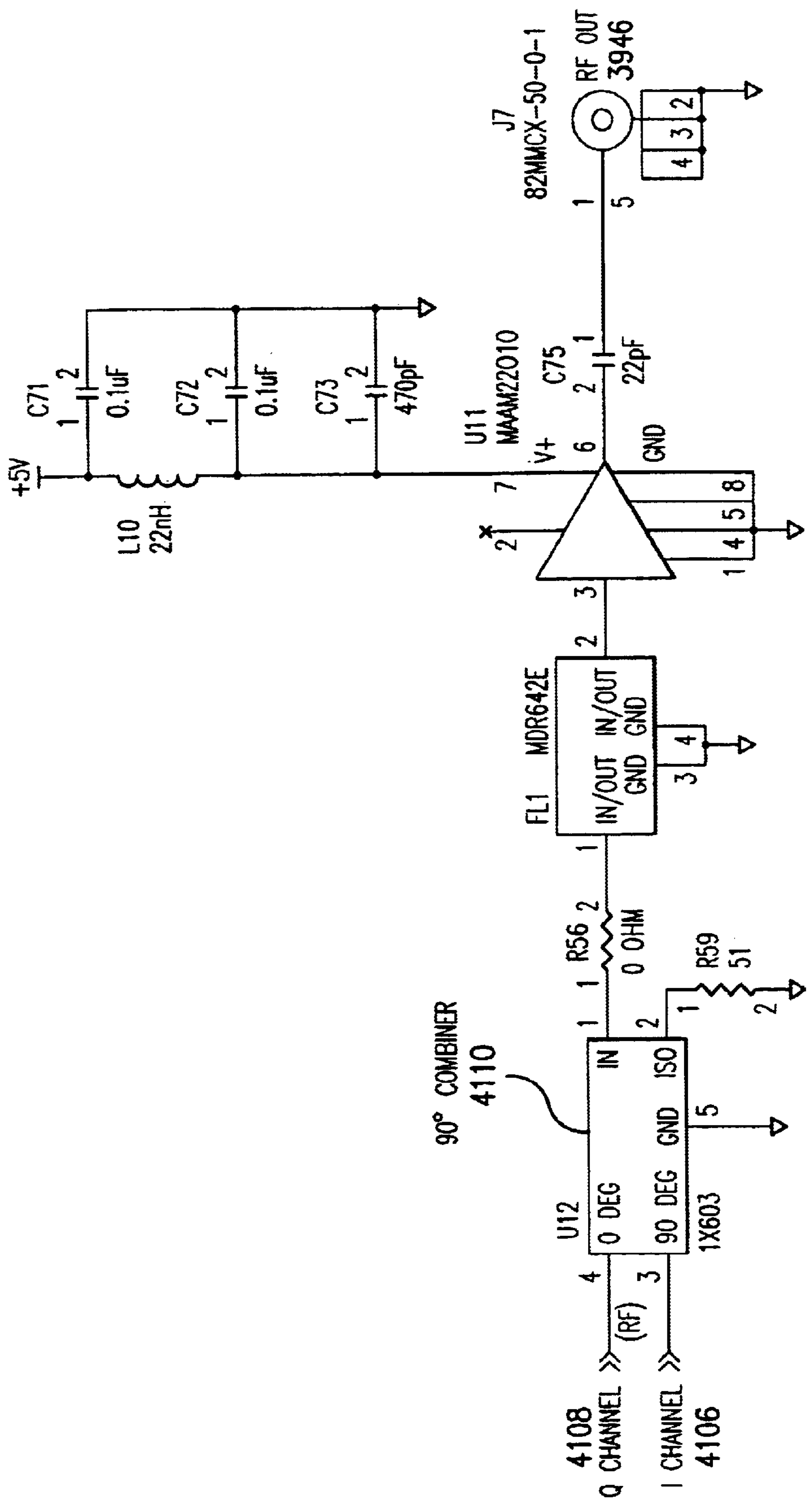
Figure 60:
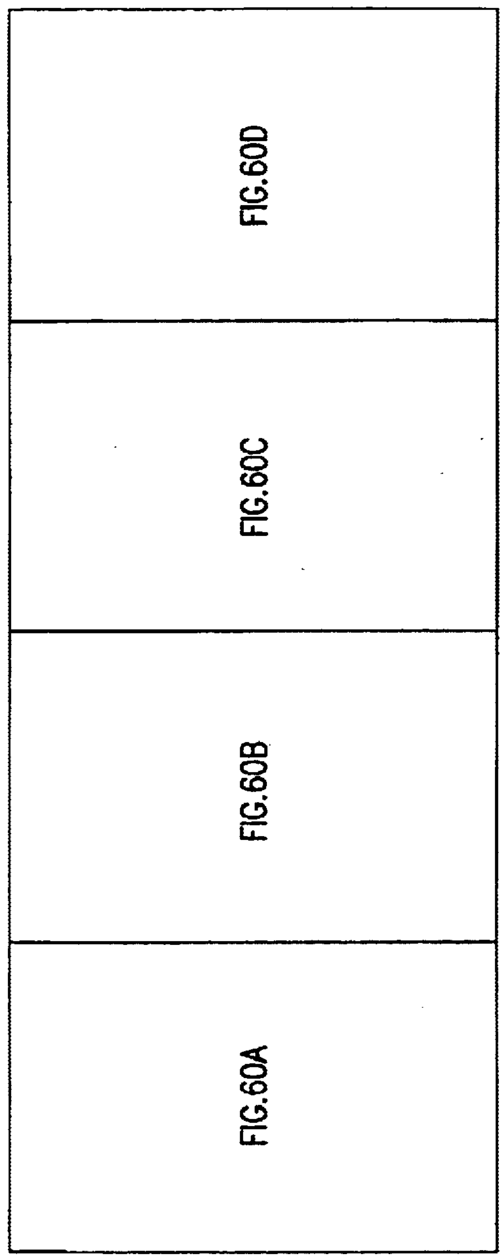
Figure 60A:
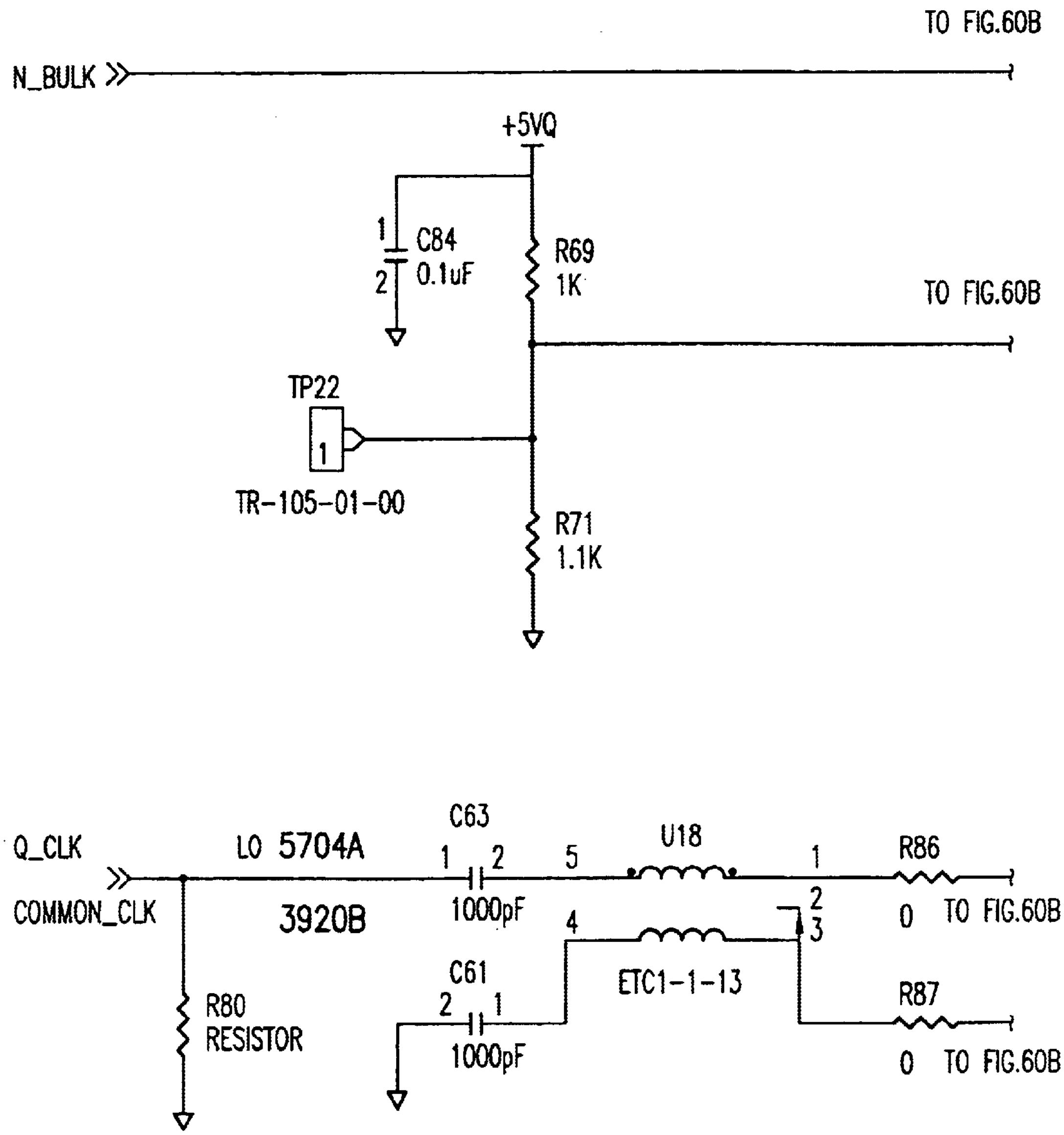
Figure 60B:
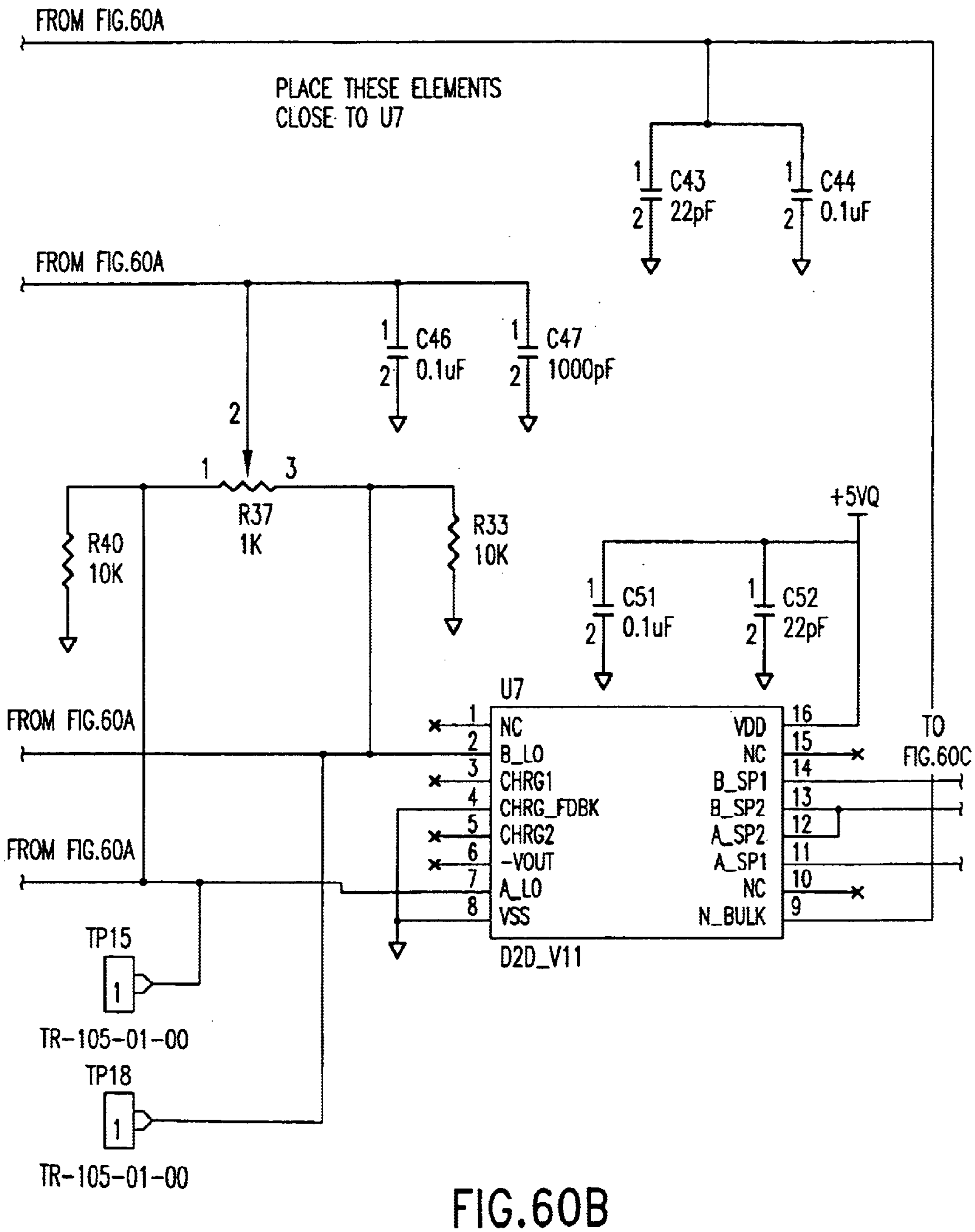
Figure 60C:
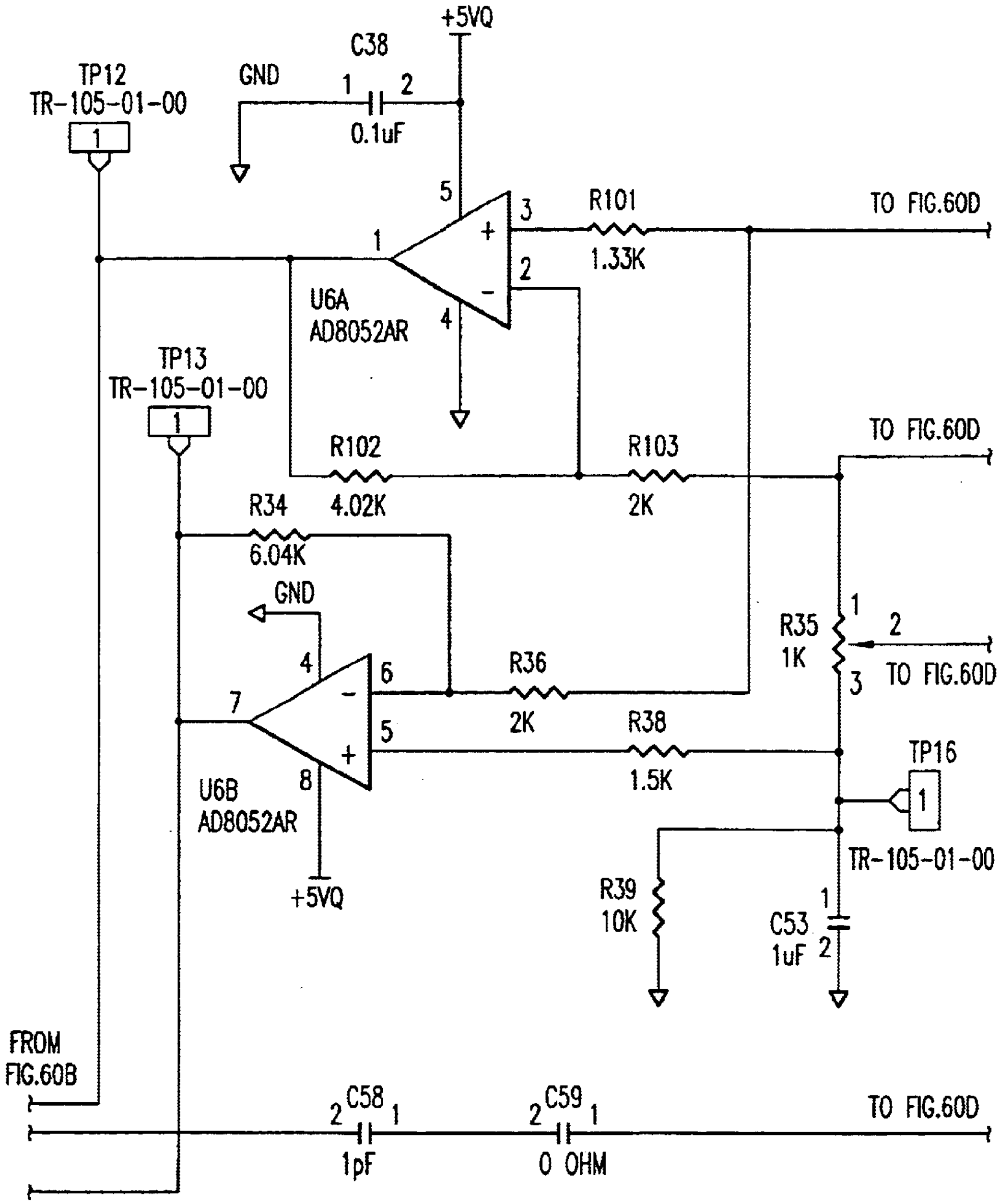
Figure 60D:
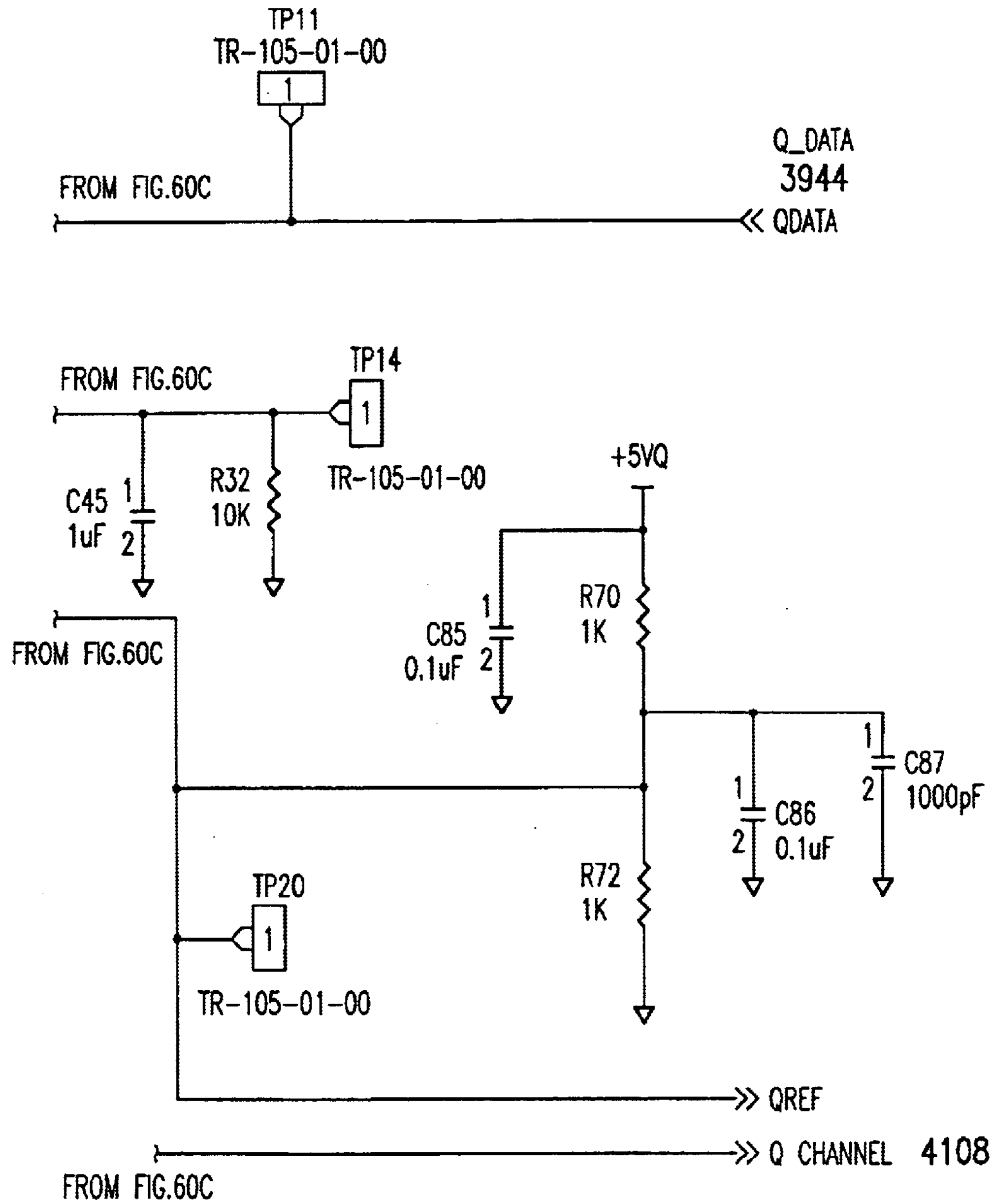

In an embodiment, the control signal generator 3908 is preferably implemented using a synthesizer. An example synthesizer is shown in FIG. 55. A corresponding BOM list is shown in FIGS. 56A and 56B.

7.8 LNA/PA

Figure 64:
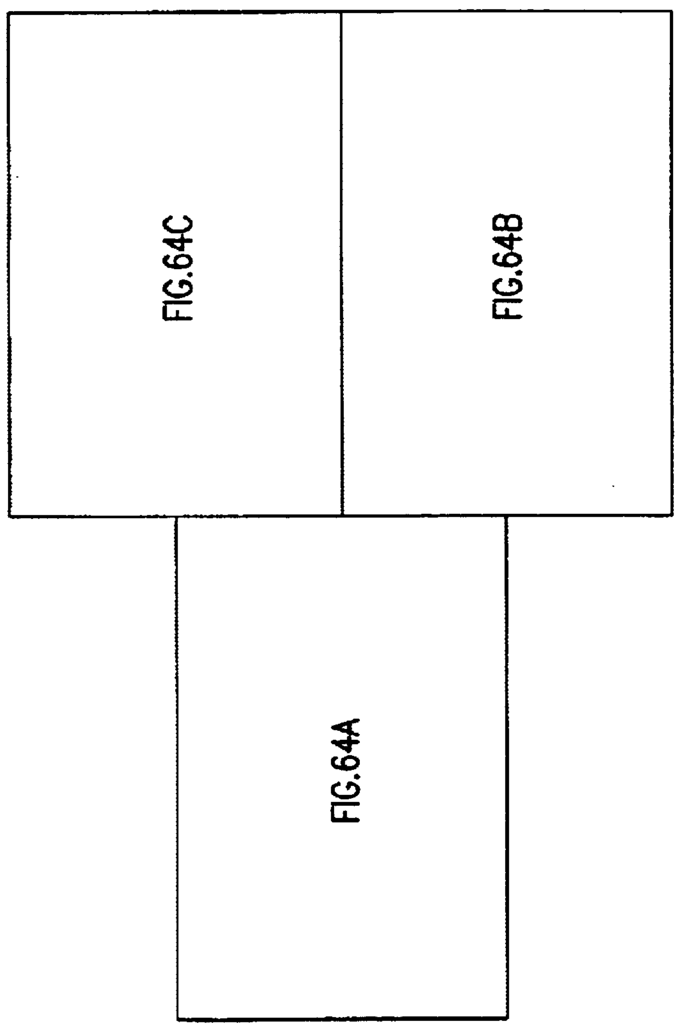
Figure 64A:
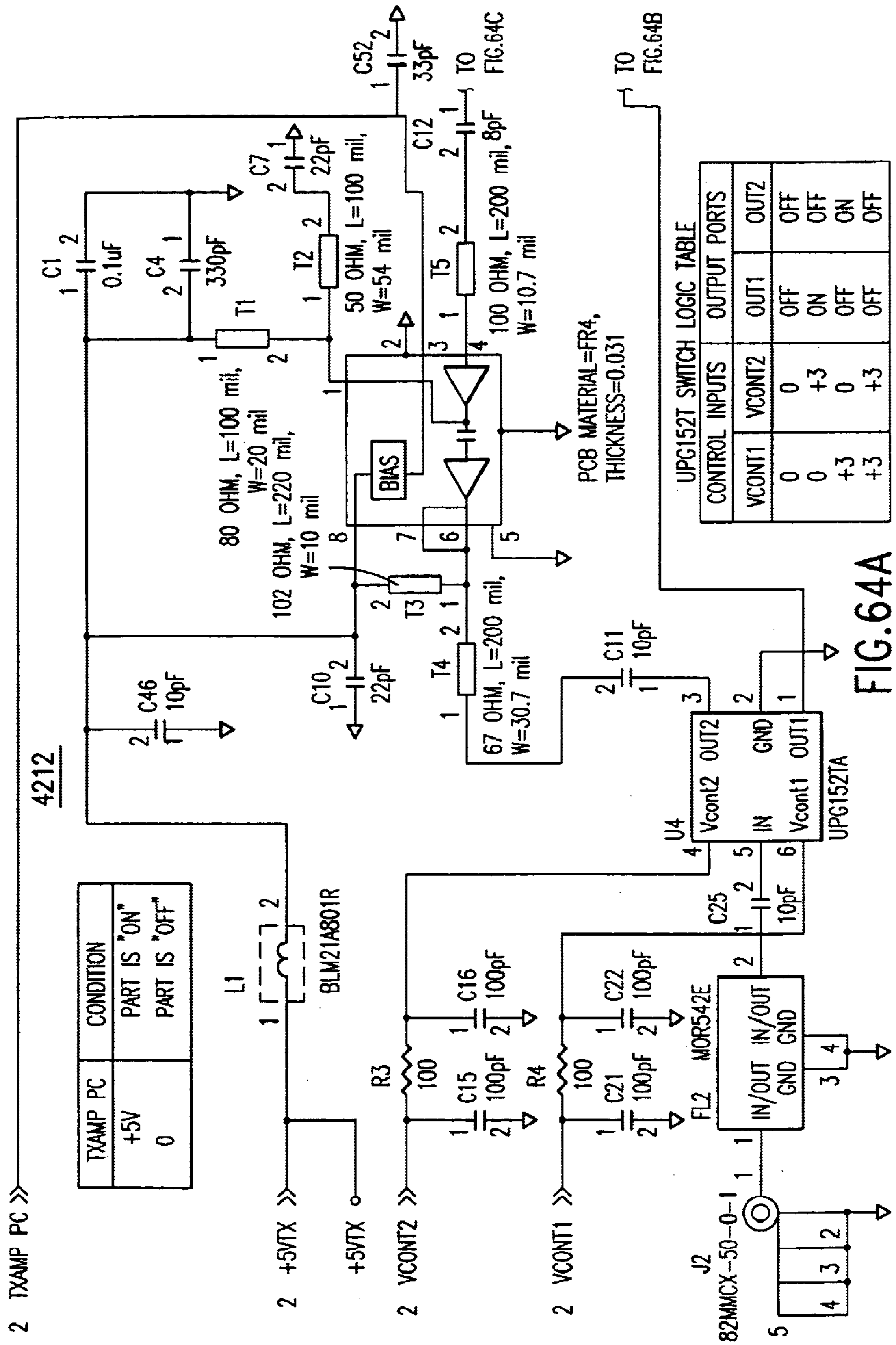
Figure 64B:
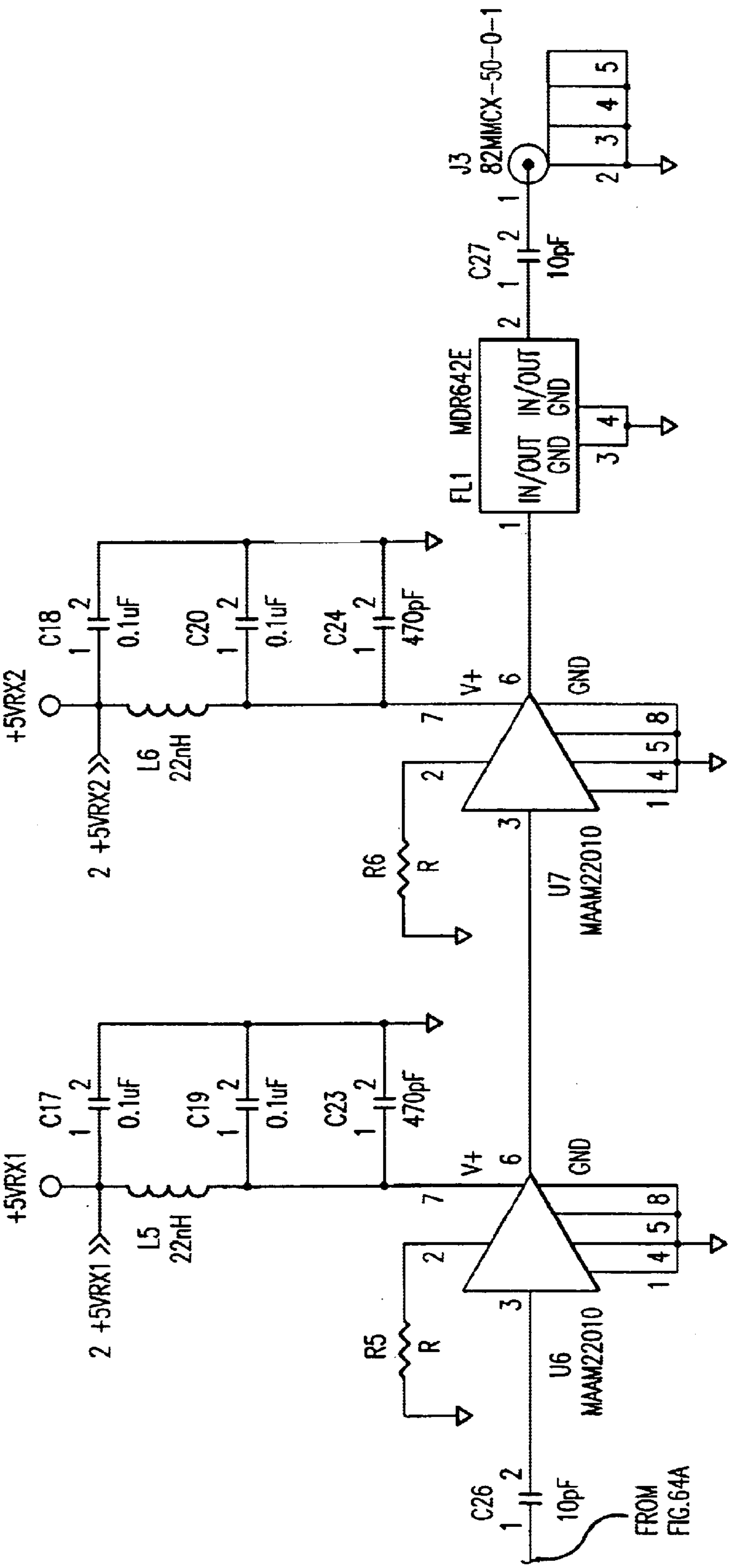
Figure 64C:
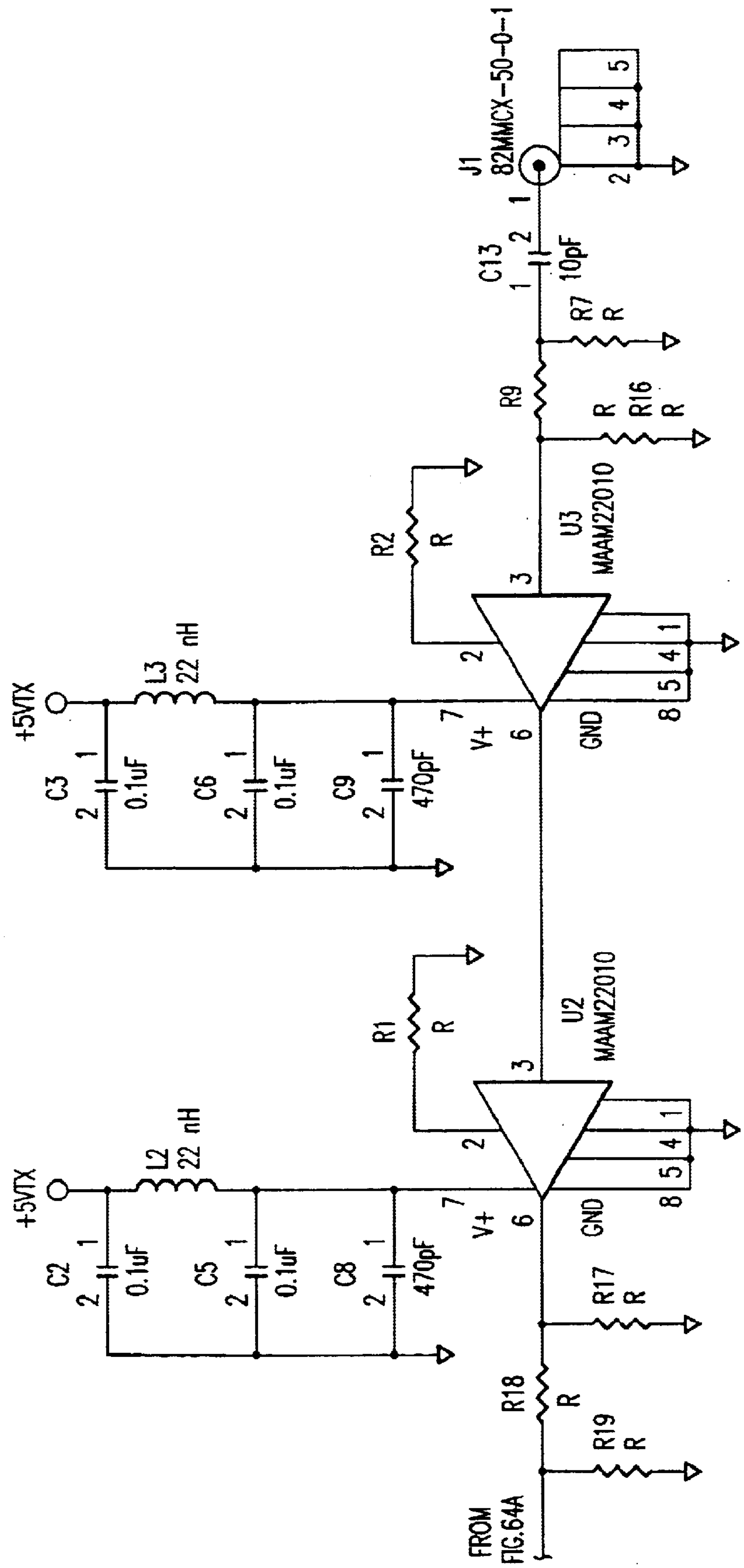
Figure 65:
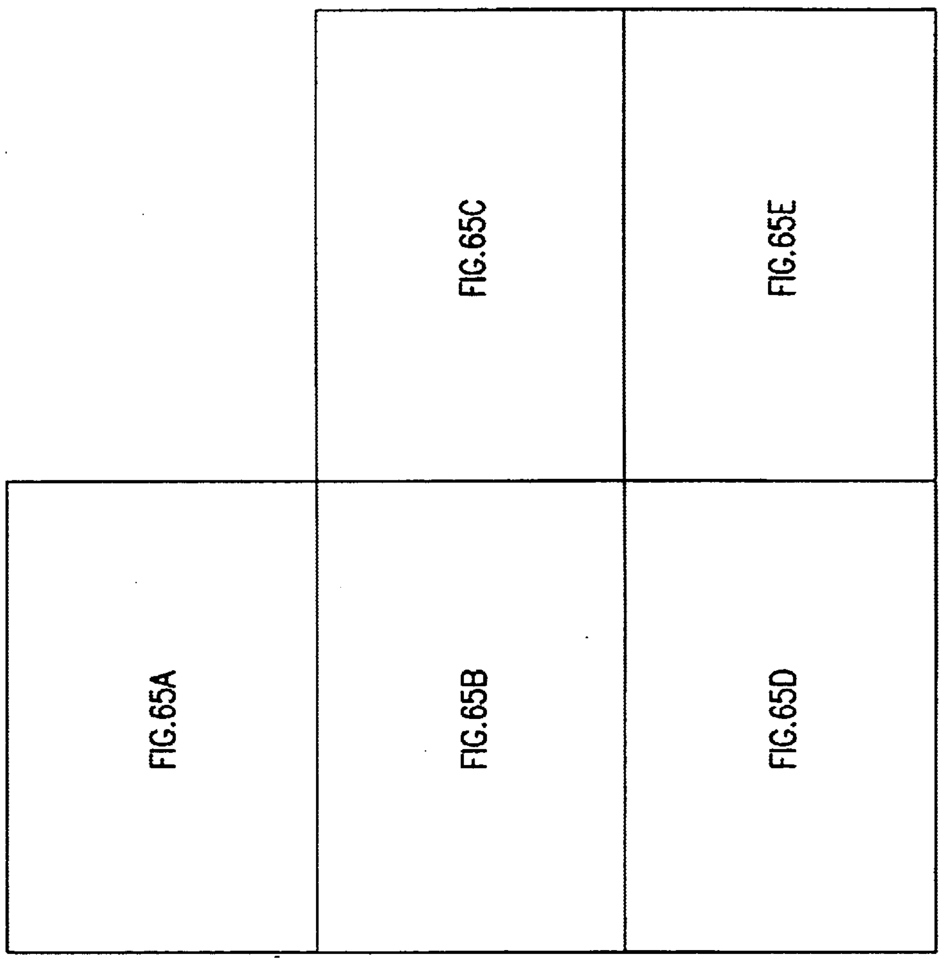
Figure 65A:
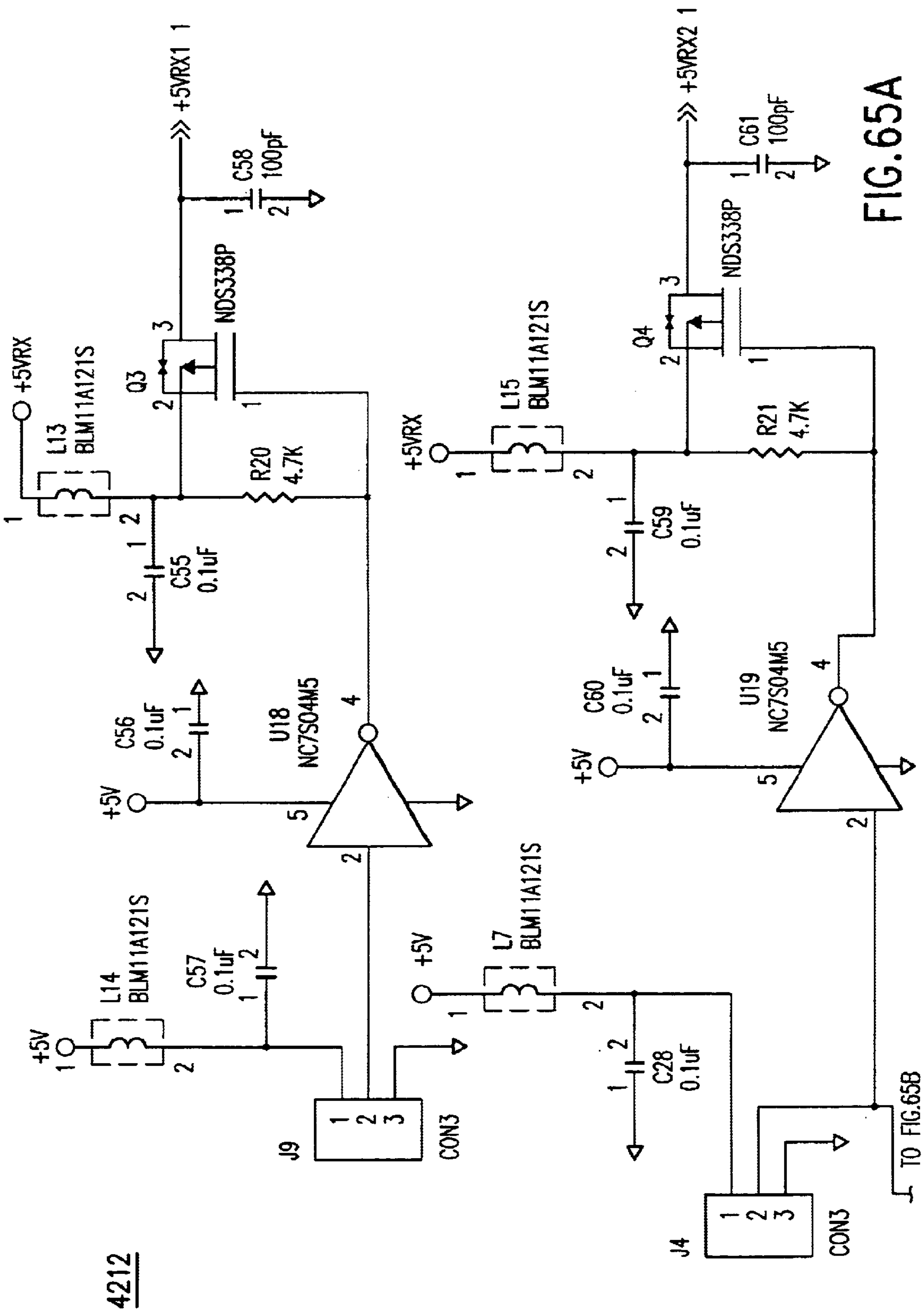
Figure 65B:
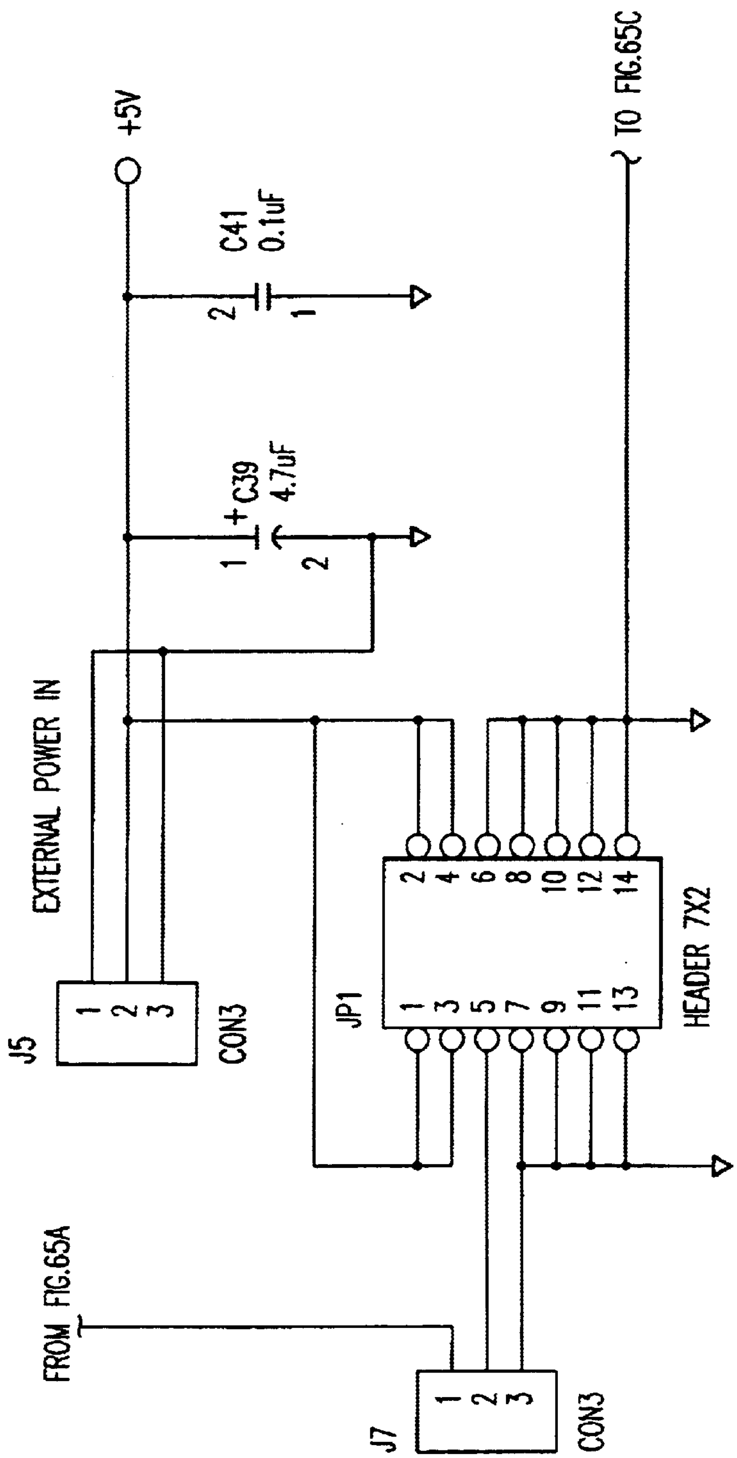
Figure 65C:
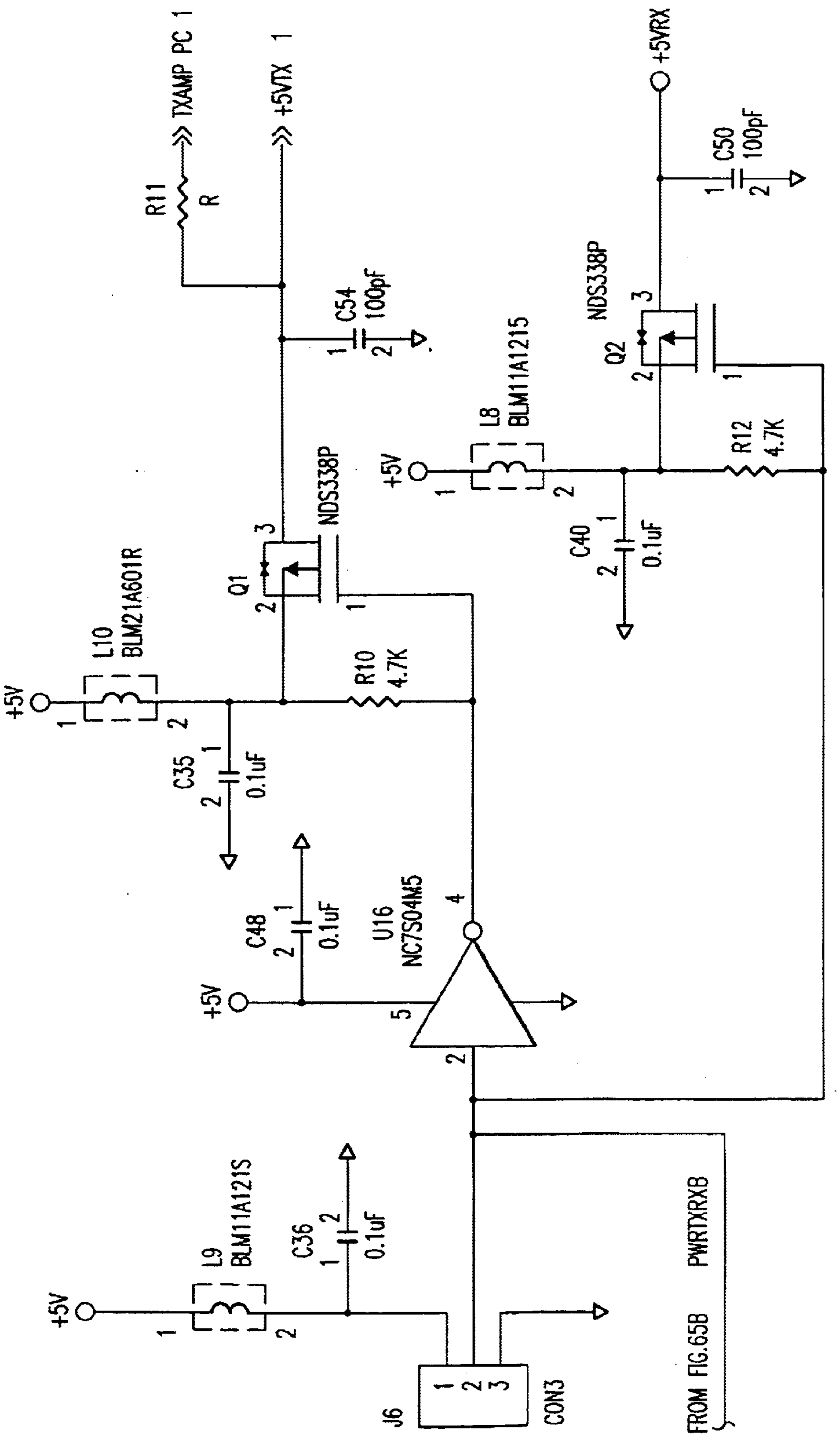
Figure 65D:
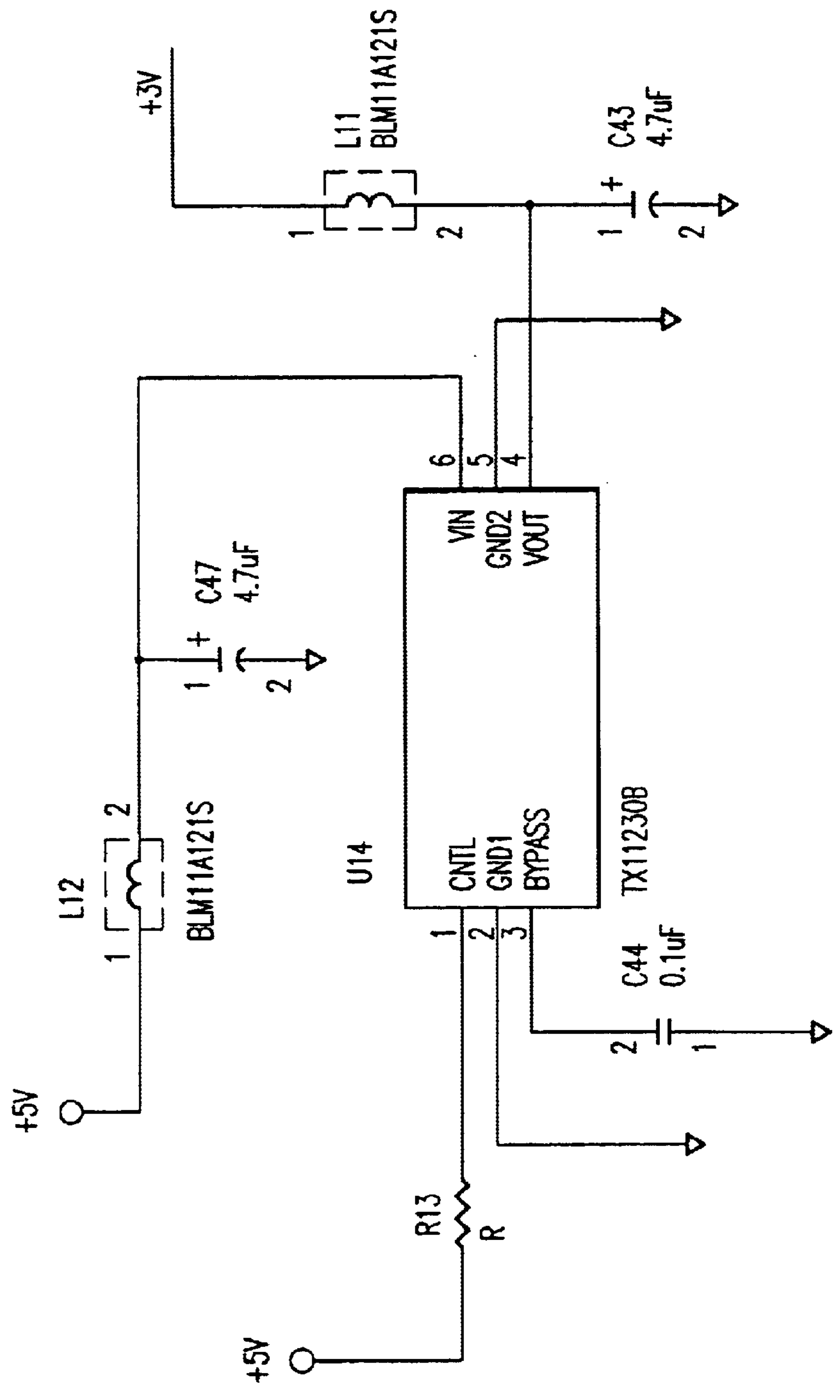
Figure 65E:
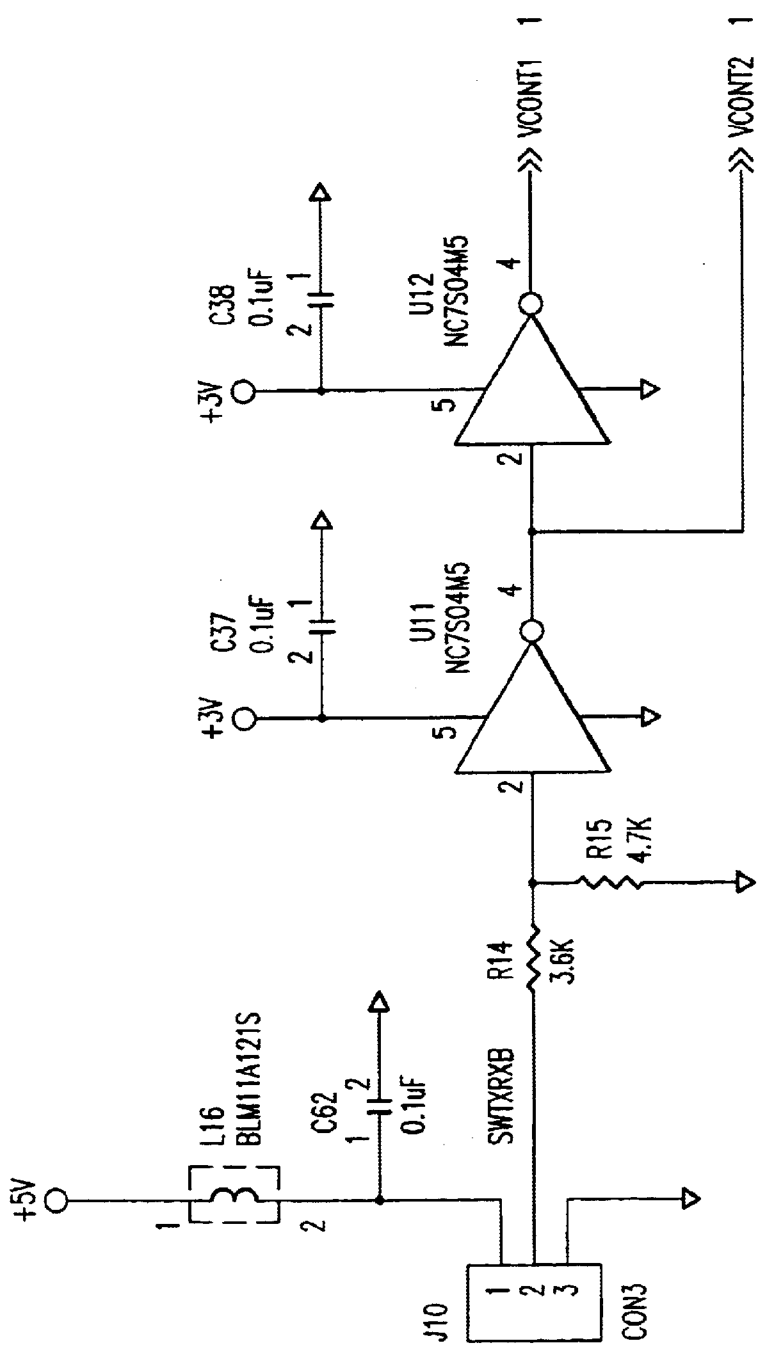

An example LNA/PA 3904 is shown in FIGS. 64 and 65. A corresponding BOM list is shown in FIG. 66.

Figure 93:
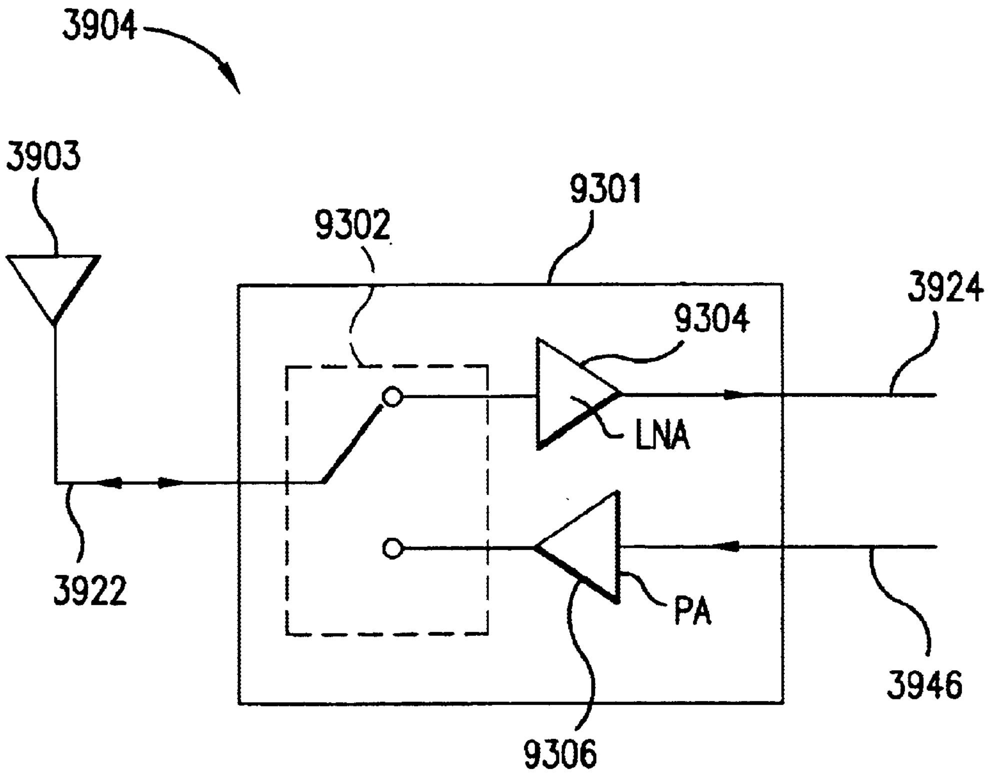
FIG. 93 illustrates the LNA/PA module 3904 according to embodiments of the present invention.

Additionally, FIG. 93 illustrates a LNA/PA module 9301 that is another embodiment of the LNA/PA 3904. LNA/PA module 9301 includes a switch 9302, a LNA 9304, and a PA 9306. The switch 9302 connects either the LNA 9304 or the PA 9306 to the antenna 3903, as shown. The switch 9302 can be controlled by an on-board processor that is not shown.

8.0 802.11 Physical Layer Configurations

The 802.11 WLAN standard specifies two RF physical layers: frequency hopped spread spectrum (FHSS) and direct sequence spread spectrum (DSSS). The invention is not limited to these specific examples. Both DSSS and FHSS support 1 Mbps and 2 Mbps data rates and operate in the 2.400–2.835 GHz band for wireless communications in accordance to FCC part 15 and ESTI-300 rules. Additionally, 802.11 has added an 11 Mbps standard that operates at 5 GHz and utilizes OFDM modulation.

The DSSS configuration supports the 1 MBPS data rate utilizing differential binary phase shift keying (DBPSK) modulation, and supports 2 MBPS utilizing differential quadrature phase shift keying modulation. In embodiments, an 11-bit Barker word is used as the spreading sequence that is utilized by the stations in the 802.11 network. A Barker word has a relatively short sequence, and is known to have very good correlation properties, and includes the following sequence: +1, −1, +1, +1, −1, +1, +1, +1, −1, −1, −1. The Barker word used for 802.11 is not to be confused with the spreading codes used for code division multiple access (CDMA) and global positioning system (GPS). CDMA and GPS use orthogonal spreading codes, which allow multiple users to operate on the same channel frequency. Generally, CDMA codes have longer sequences and have richer correlation properties.

Figure 92:
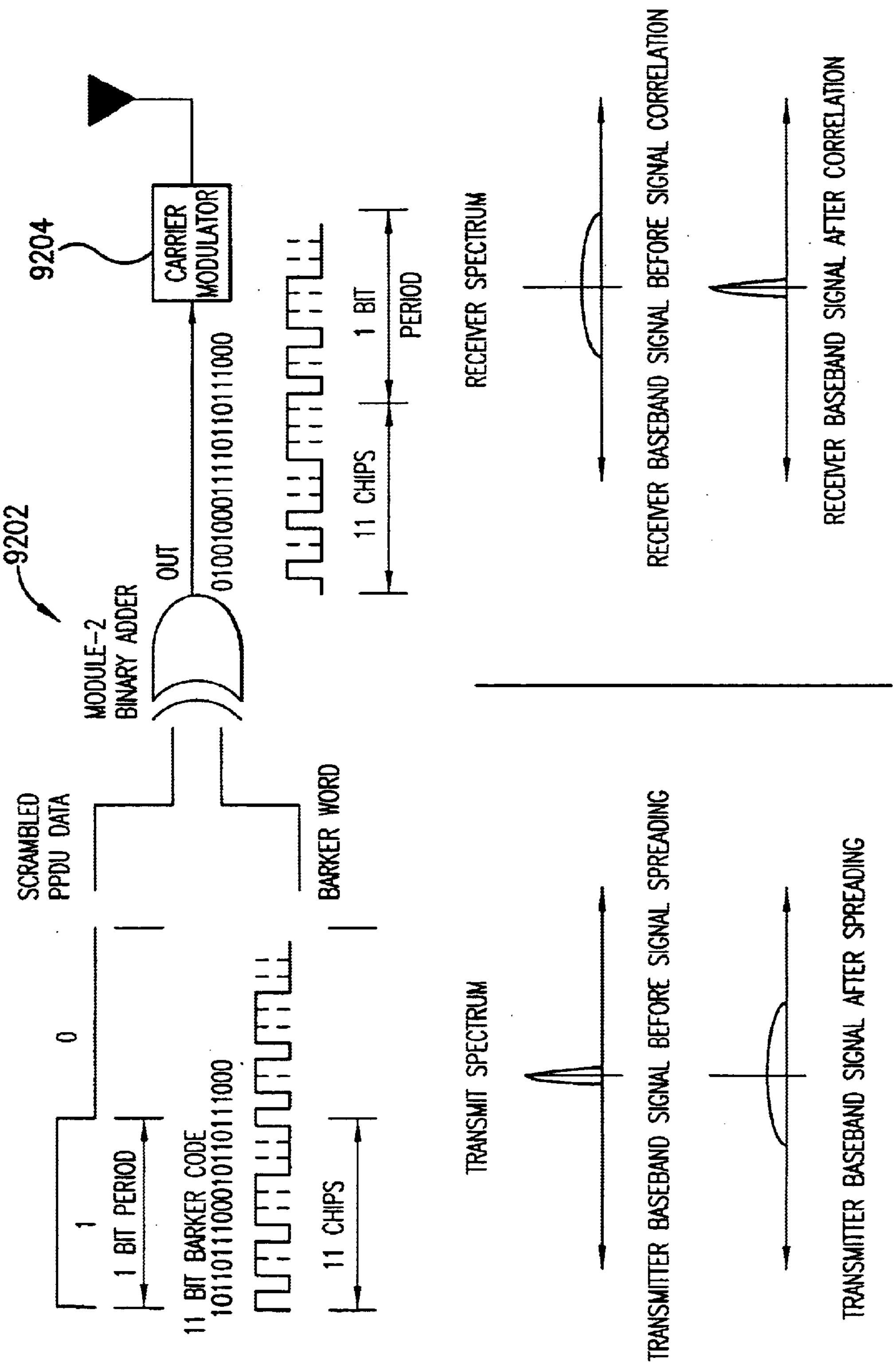
FIG. 92 illustrates direct sequence spread spectrum according to embodiments of the present invention.

During transmission, the 11-bit barker word is exclusive-ored (EX-OR) with each of the information bits using a modulo-2 adder, as illustrated by modulo-2 adder 9202 in FIG. 92. Referring to FIG. 92, the11-bit (at 11 MBPS) Barker word is applied to a modulo-2 adder together with each one (at 1 MBPS) of the information bits (in the PPDU data). The Ex-OR function combines both signals by performing a modulo-2 addition of each information bit with each Barker bit (or chip). The output of the modulo-2 adder results in a signal with a data rate that is 10× higher than the information rate. The result in the frequency domain signal is a signal that is spread over a wider bandwidth at a reduced RF power level. At the receiver, the DSSS signal is convolved with an 11-bit Barker word and correlated. As shown in FIG. 92, the correlation recovers the information bits at the transmitted information rate, and the undesired interfering in-band signals are spread out-of-band. The spreading and despreading of narrowband to wideband signal is commonly referred to as processing gain and is measured in decibels (dB). Processing gain is the ratio of DSSS signal rate information rate. In embodiments, the minimum requirement for processing gain is 10 dB.

The second RF physical layer that is specified by the IEEE 802.11 standard is frequency hopping spread spectrum (FHSS). A set of hop sequences is defined in IEEE 802.11 for use in the 2.4 GHz frequency band. The channels are evenly spaced across the band over a span of 83.5 MHz. During the development of IEEE 802.11, the hop sequences listed in the standard were pre-approved for operation in North America, Europe, and Japan. In North America and Europe (excluding Spain and France), the required number of hop channels is 79. The number of hopped channels for Spain and France is 23 and 35, respectively. In Japan, the required number of hopped channels is 23. The hopped center channels are spaced uniformly across the 2.4 GHz frequency band occupying a bandwidth of 1 MHz. In North America and Europe (excluding Spain and France), the hopped channels operate from 2.402 GHz to 2.480 GHz. In Japan, the hopped channels operate from 2.447 GHz to 2.473 GHz. The modulation scheme called out for FHSS by 802.11 is 2-level Gaussian Phase Shift Keying (GFSK) for the 1 MBps data rate, and 4-level GFSK for the 2 MBps data rate.

In addition to DSSS and FHSS RF layer standards, the IEEE 802.11 Executive Committee approved two projects for higher rate physical layer extensions. The first extension, IEEE 802.11a defines requirements for a physical layer operating in the 5.0 GHz frequency band, and data rates ranging from 6 MBps to 54 MBps. This 802.11a draft standard is based on Orthogonal Frequency Division Multiplexing (OFDM) and uses 48 carriers as a phase reference (so coherent), with 20 MHZ spacing between the channels. The second extension, IEEE 802.11b, defines a set of physical layer specifications operating in the 2.4 GHz ISM frequency band. This 802.11b utilizes complementary code keying (CCK), and extends the data rate up to 5.5 Mbps and 11 Mbps.

The transmitter and receiver circuits described herein can be operated in all of the WLAN physical layer embodiments described herein, including the DSSS and FHSS embodiments described herein. However, the present invention is not limited to being operated in WLAN physical layer embodiments that were described herein, as the invention could be configured in other physical layer embodiments.

Figure 94:
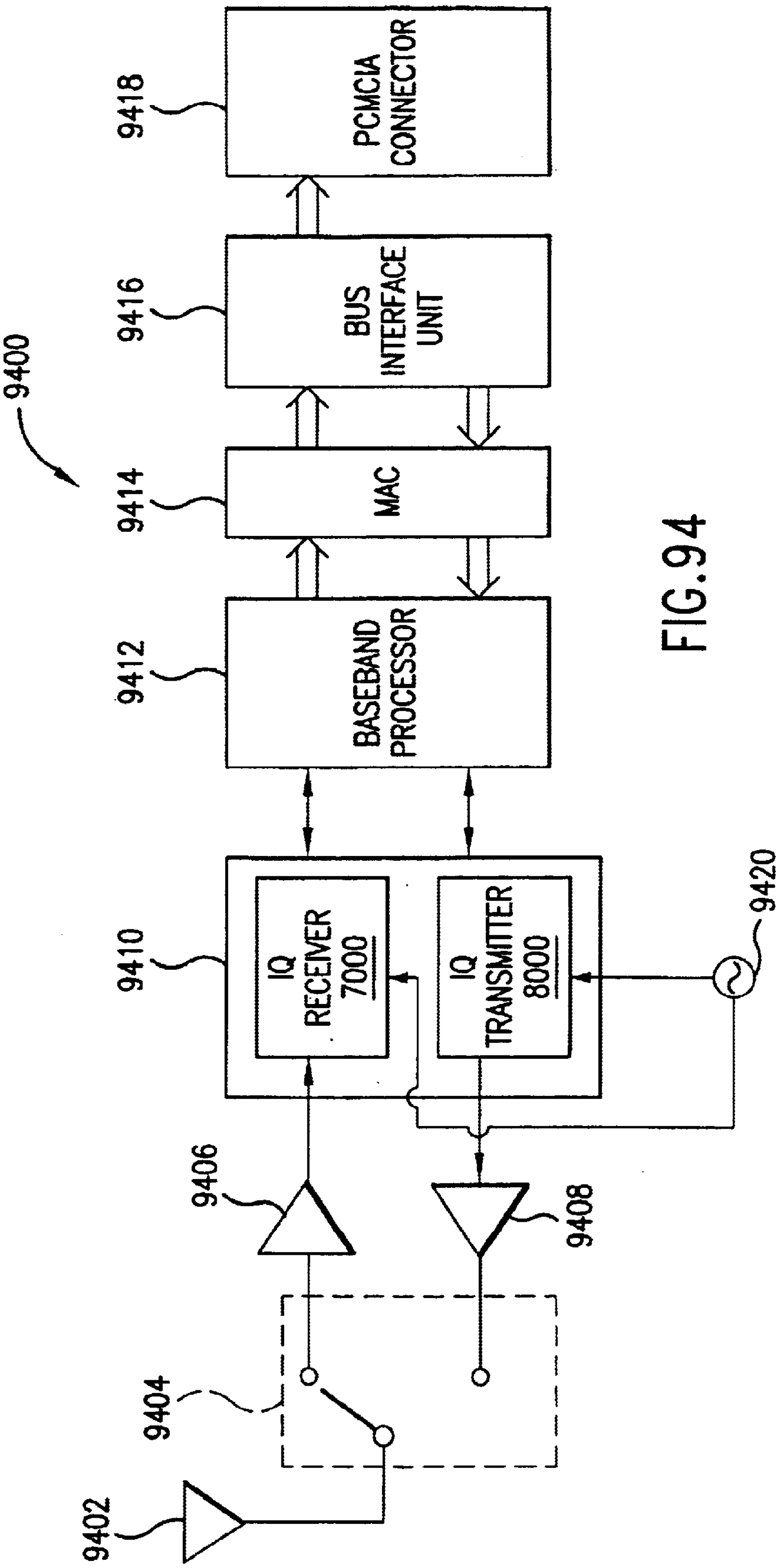
FIG. 94 illustrates a WLAN device 9400, according to embodiments of the invention of the present invention.

FIG. 94 illustrates a block diagram of an IEEE 802.11 DSSS radio transceiver 9400 using UFT Zero IF technology. DSSS transceiver 9400 includes: antenna 9402, switch 9404, amplifiers 9406 and 9408, transceivers 9410, baseband processor 9412, MAC 9414, bus interface unit 9416, and PCMCIA connector 9418. The DSSS transceiver 9400 includes an IQ receiver 7000 and an IQ transmitter 8000, which are described herein. UFT technology interfaces directly to the baseband processor 9412 of the physical layer. In the receive path, the IQ receiver 7000 transforms a 2.4 GHz RF signal-of-interest into I/Q analog baseband signals in a single step and passes the signals to the baseband processor 9412, where the baseband processor is then responsible for de-spreading and demodulating the signal. In embodiments, the IQ receiver 7000 includes all of the circuitry necessary for accommodating AGC, baseband filtering and baseband amplification. In the transmit path, the transmitter 8000 transforms the I/Q analog baseband signals to a 2.4 GHz RF carrier directly in a single step. The signal conversion clock is derived from a single synthesized local oscillator (LO) 9420. The selection of the clock frequency is determined by choosing a sub-harmonic of the carrier frequency. For example, a 5th harmonic of 490 MHZ was used, which corresponds to a RF channel frequency of 2.450 GHz. Using UFT technology simplifies the requirements and complexity of the synthesizer design.

9. Appendix

Figure 95A:
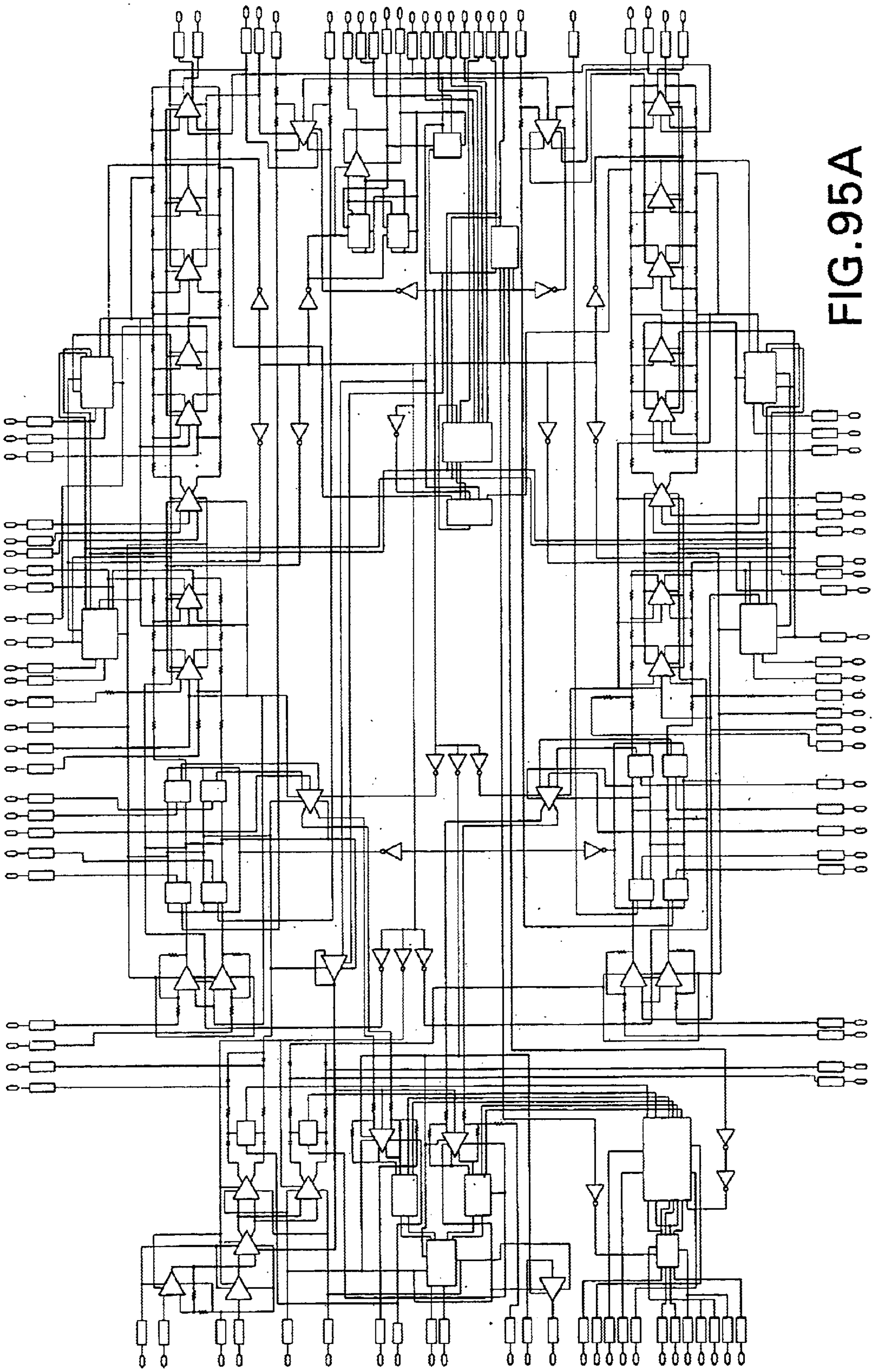
FIGS. 95A–C, and FIGS. 96–161 illustrate schematics for an integrated circuit implementation example of the present invention.
Figure 95B:
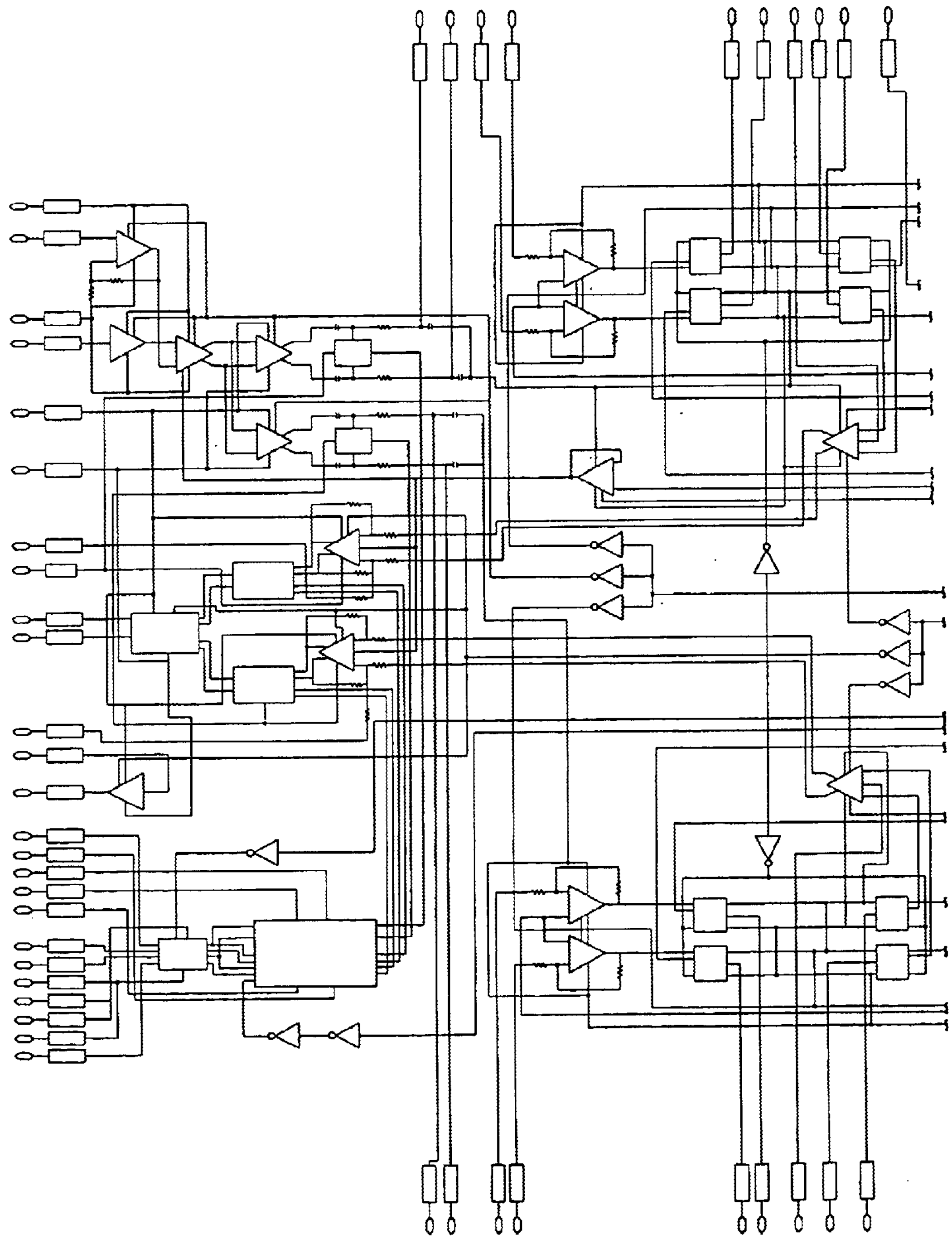
Figure 95C:
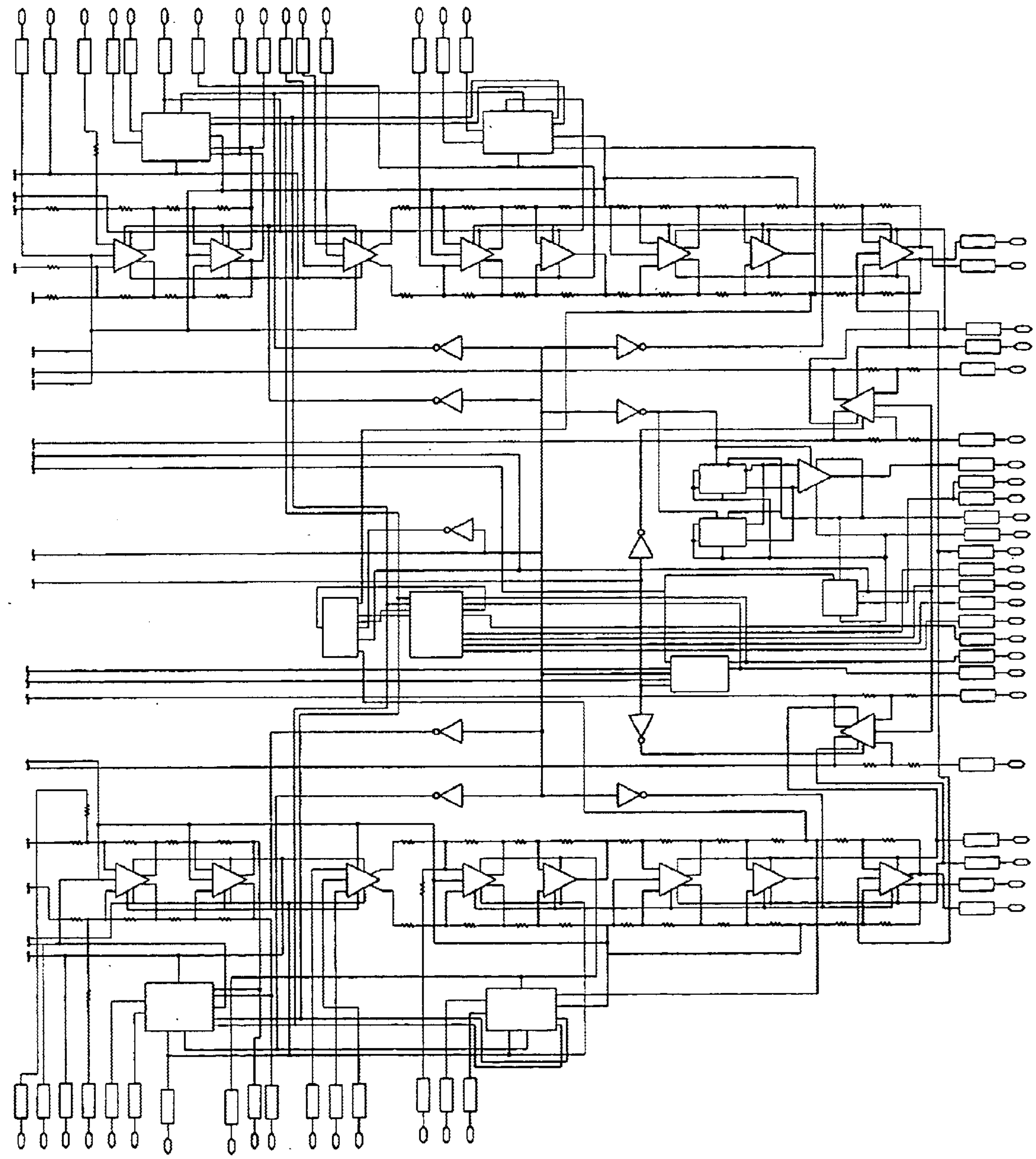
Figure 96:
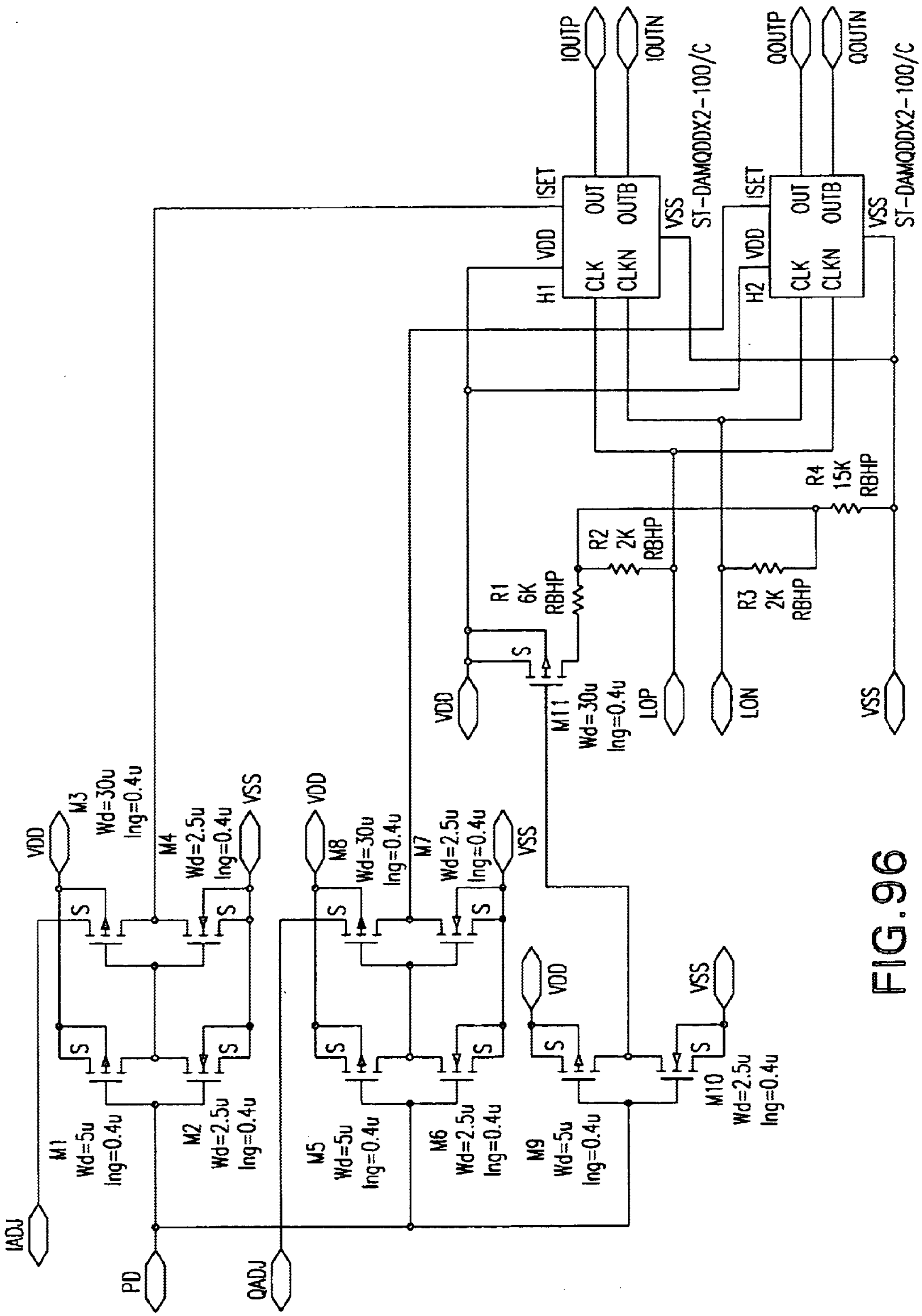
Figure 97A:
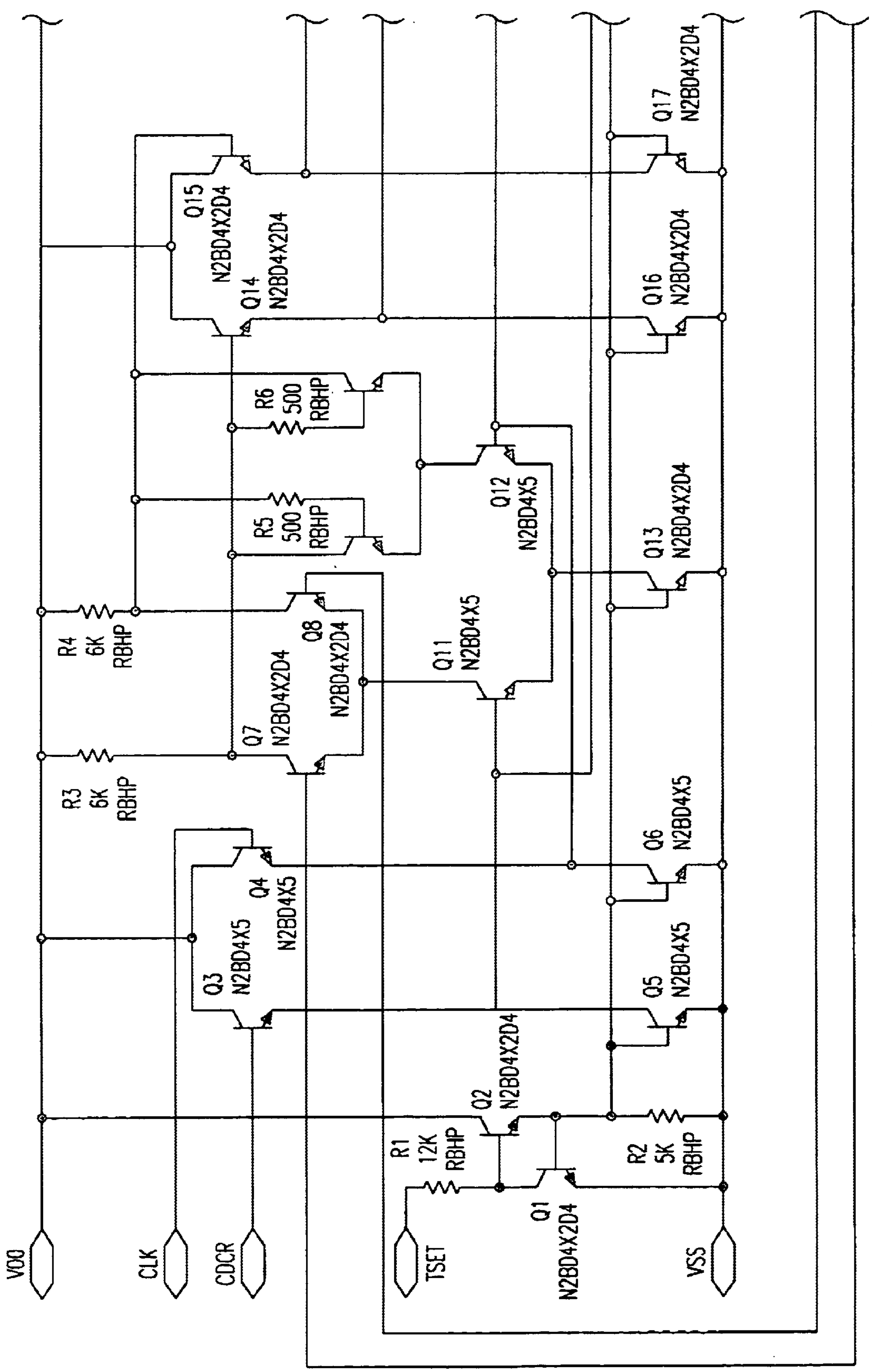
FIG. 97 includes FIGS. 97A–D and should be referred to for all references to FIG. 97 in the specification.
Figure 97B:
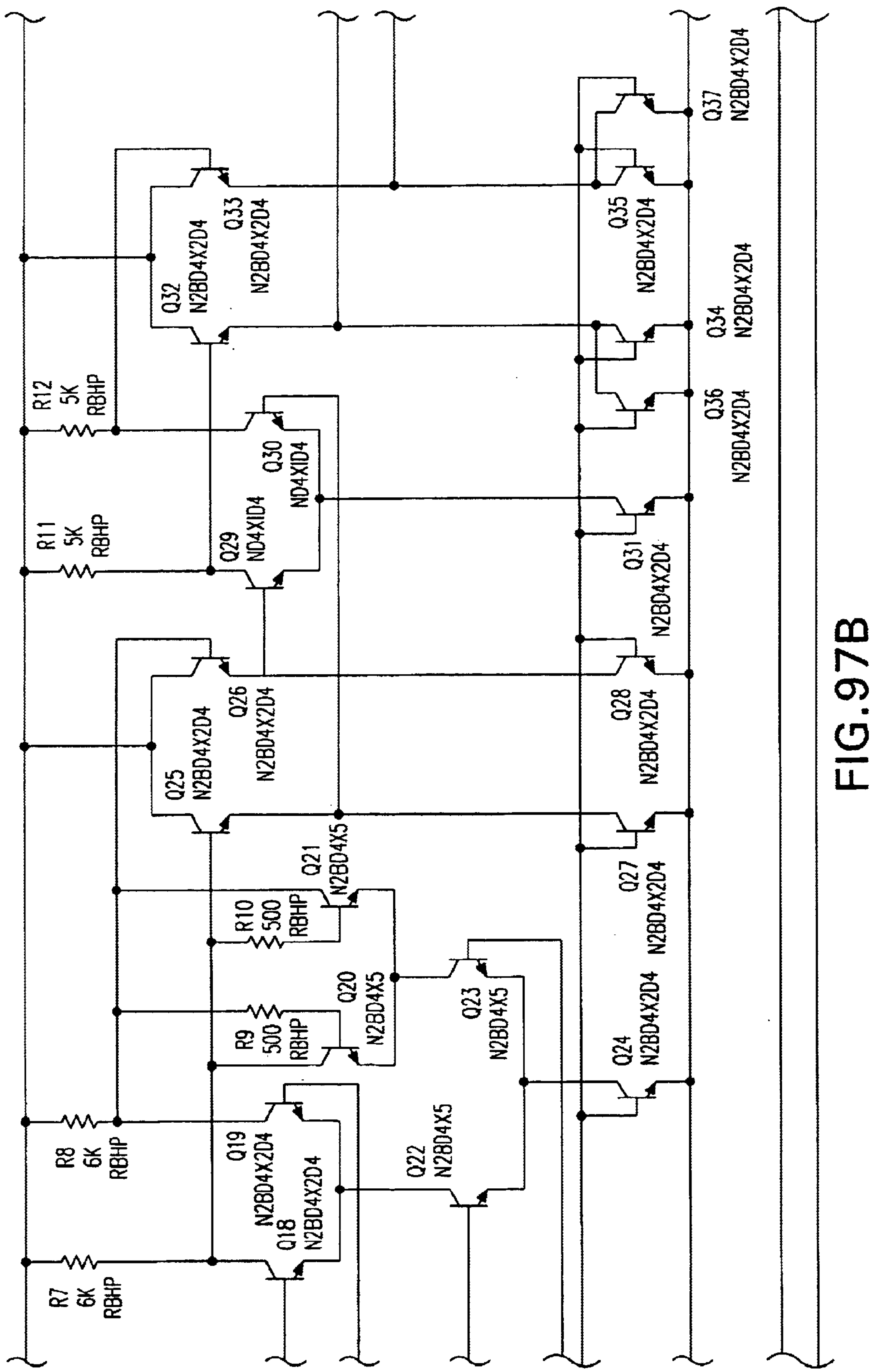
Figure 97C:
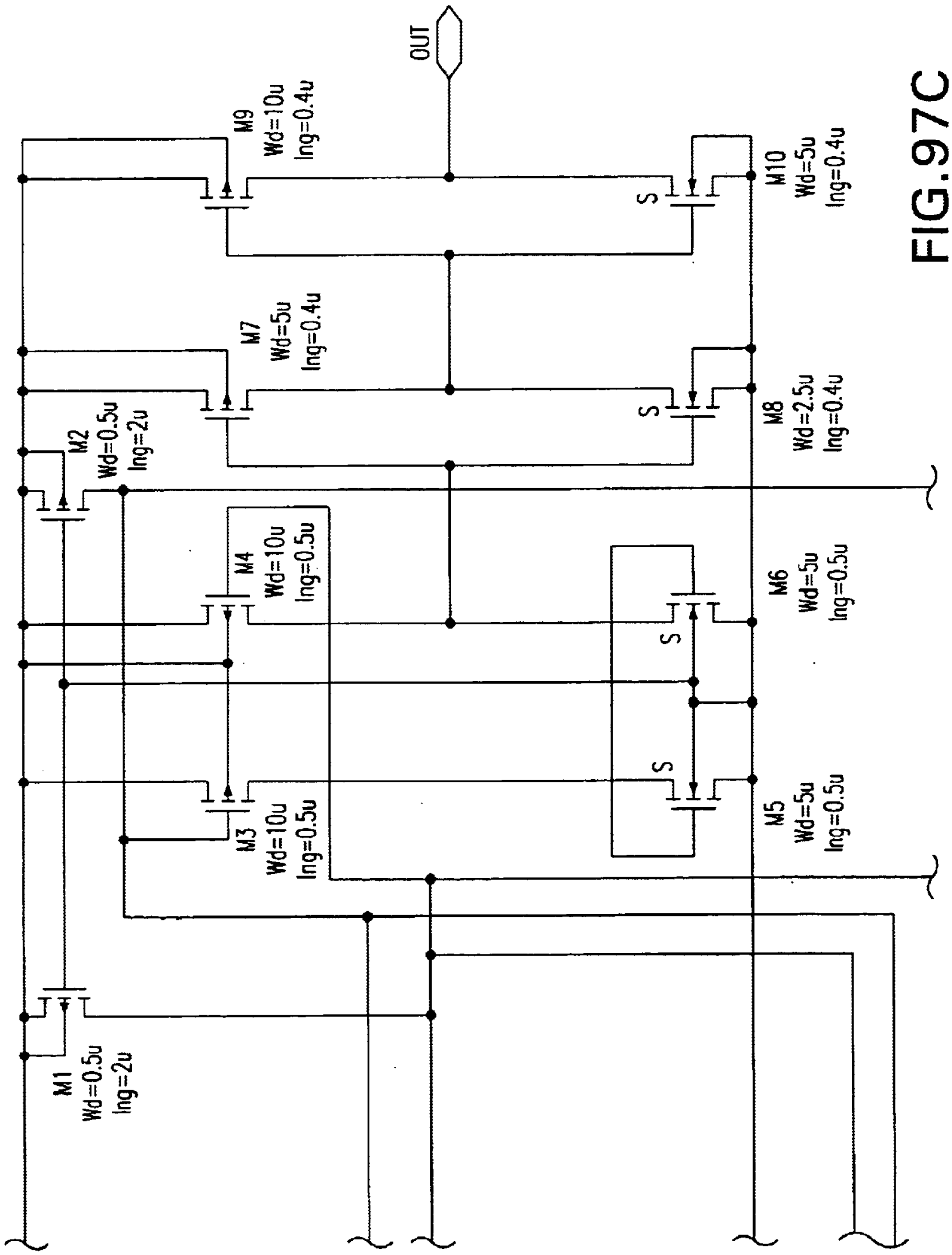
Figure 97D:
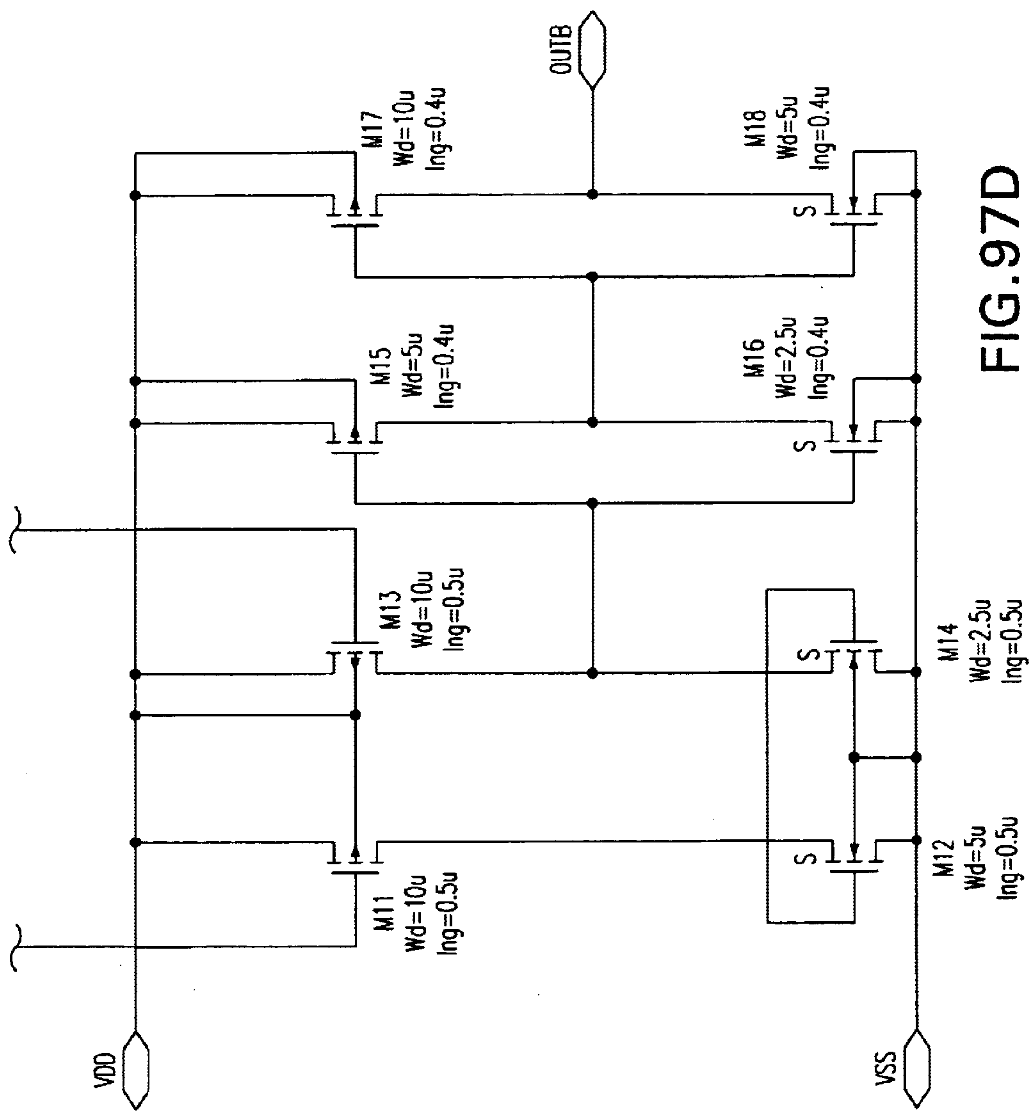
Figure 98:
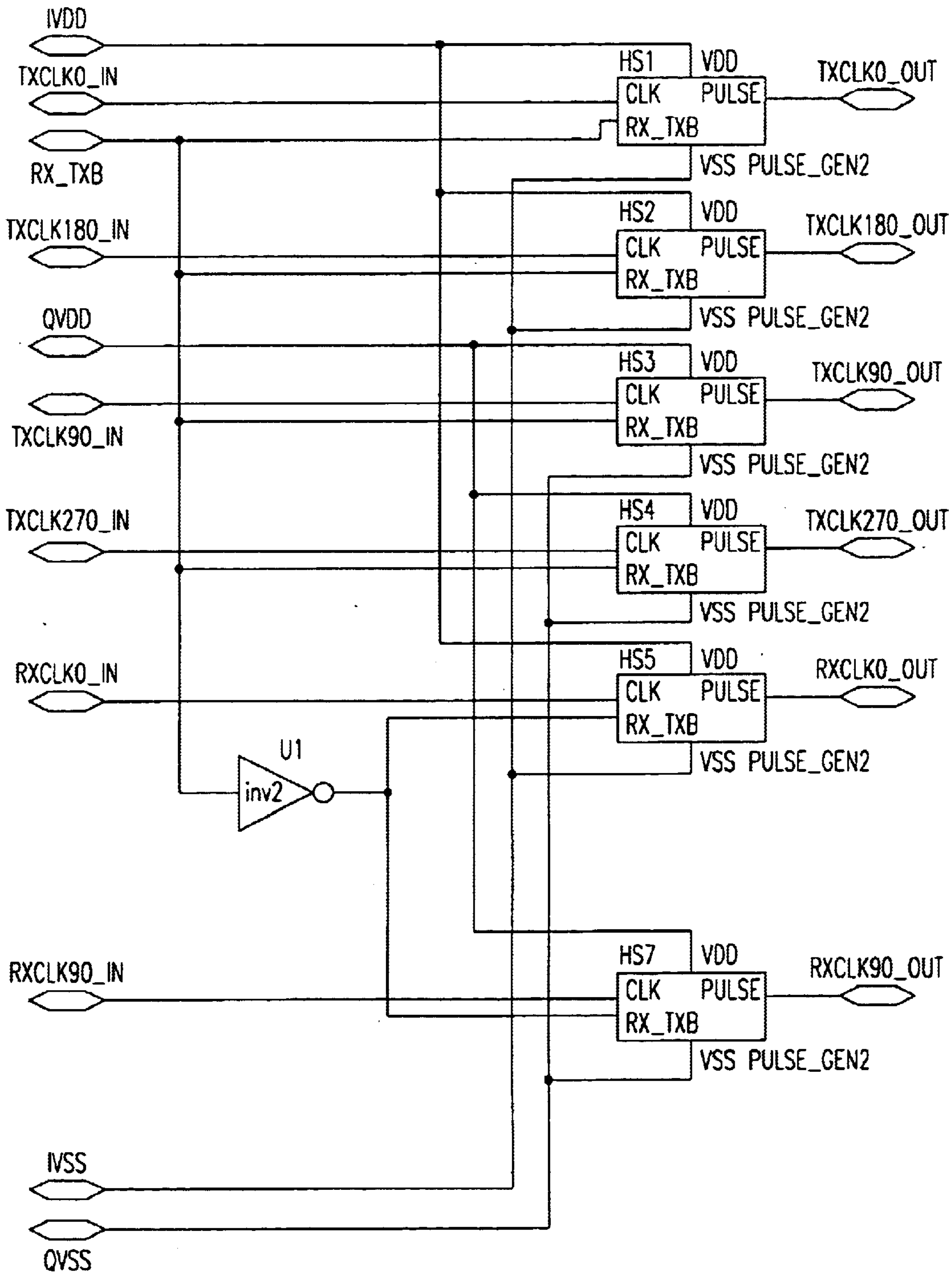
Figure 99:
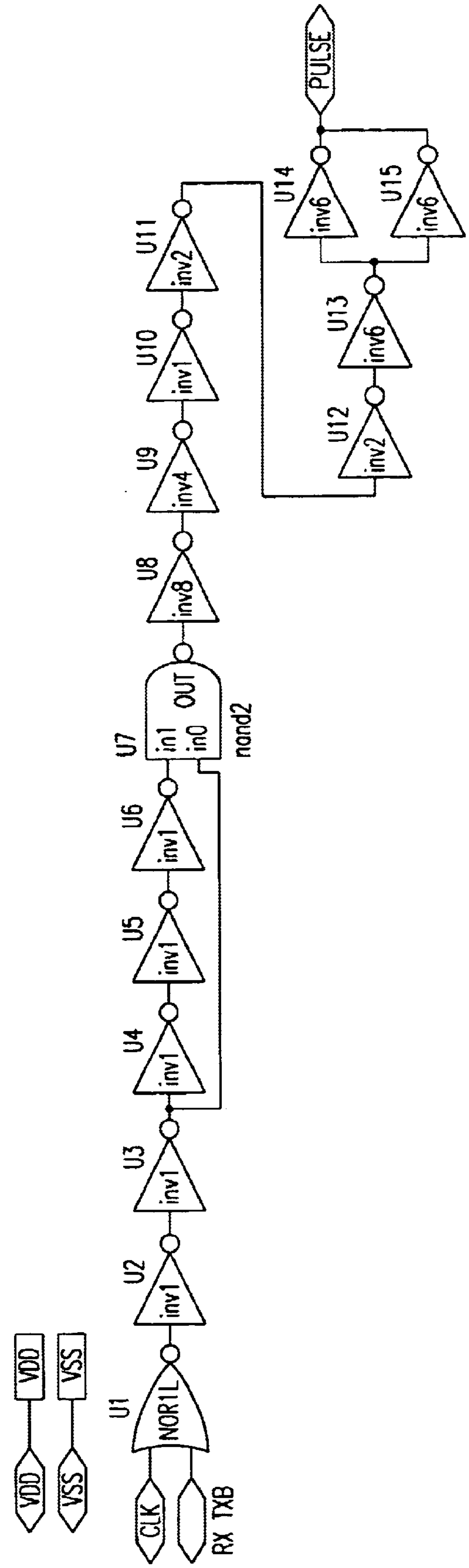
Figure 100:
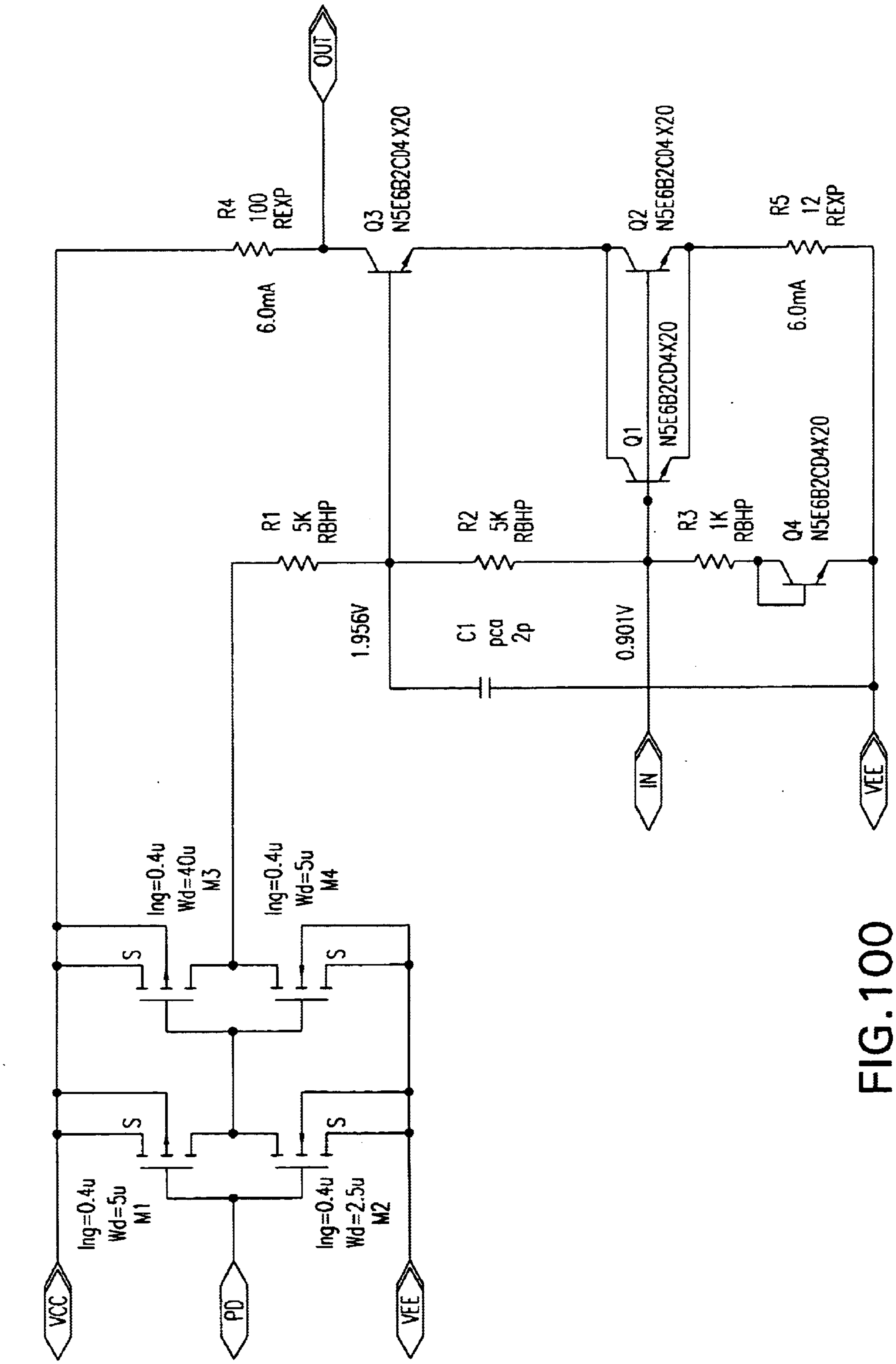
Figure 101:
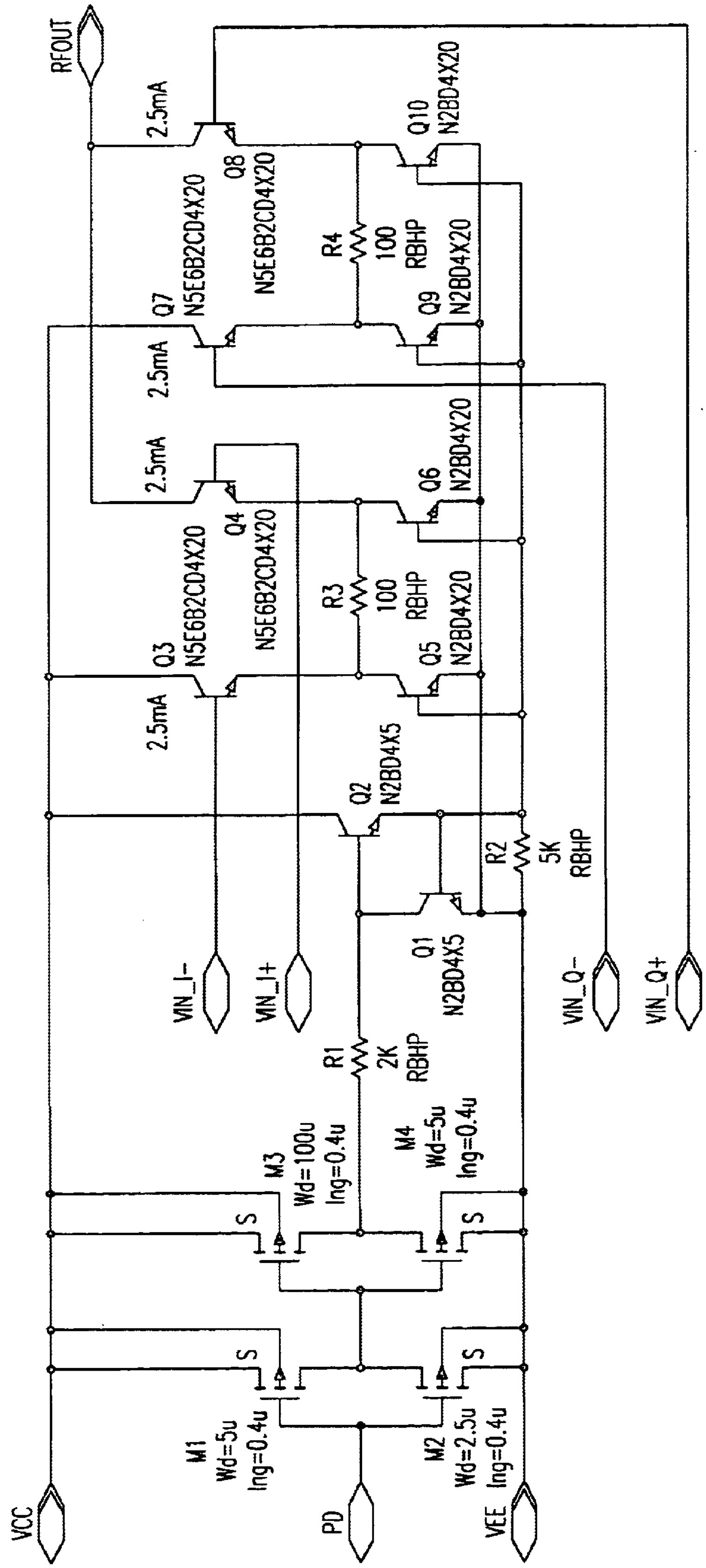
Figure 161:
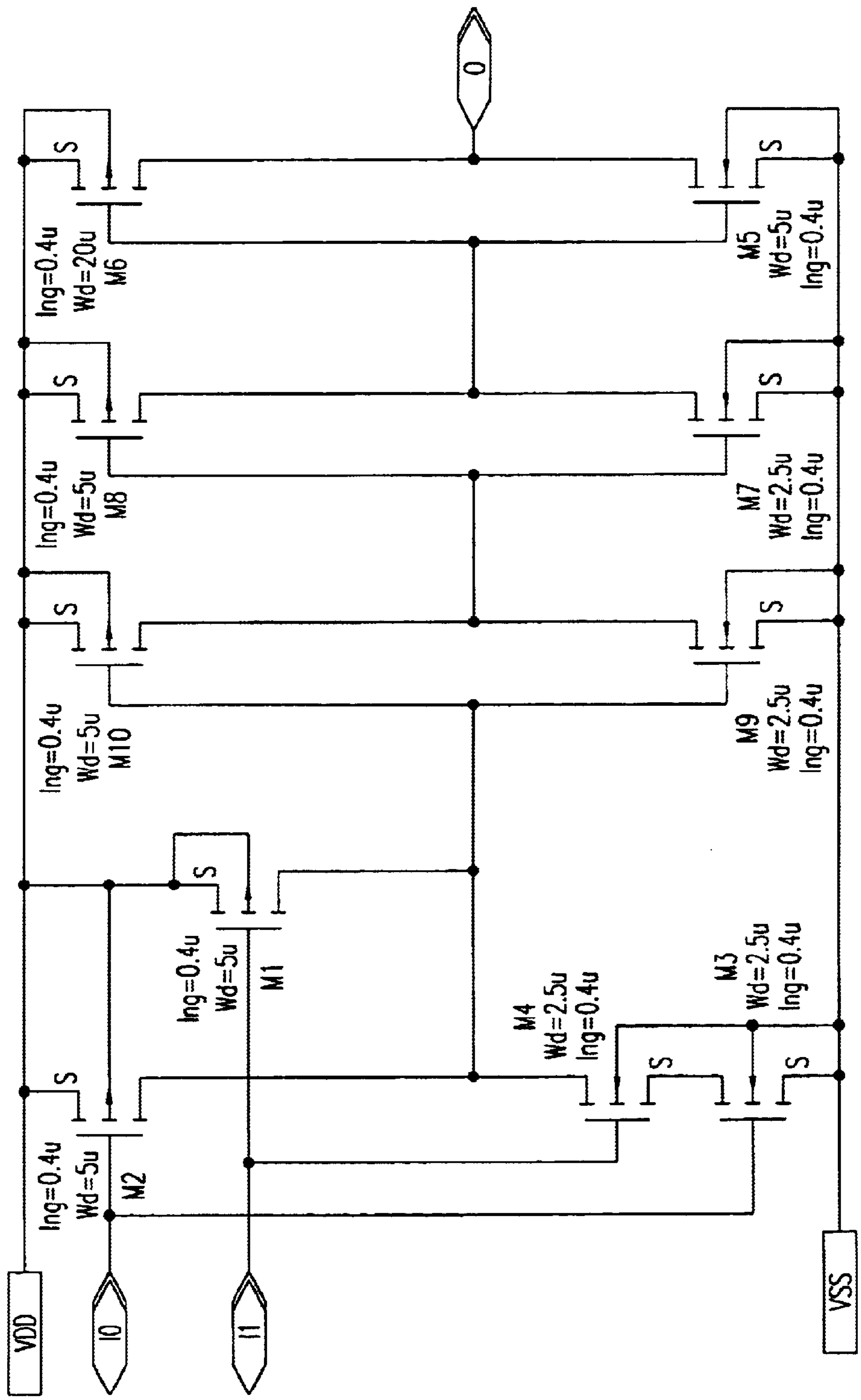

The attached Appendix contained in FIGS. 95A–C, 96–161, which forms part of this patent application, includes schematics of an integrated circuit (IC) implementation example of the present invention. This example embodiment is provided solely for illustrative purposes, and is not limiting. Other embodiments will be apparent to persons skilled in the relevant art(s) based on the teachings herein. FIG. 95A illustrates a schematic for a WLAN modulator/demodulator IC according to embodiments of the invention. FIGS. 95B and 95C illustrate an expanded view of the circuit in FIG. 95A. FIGS. 96–161 further illustrate detailed circuit schematics of the WLAN modulator/demodulator integrated circuit.

10. Conclusions

Example implementations of the systems and components of the invention have been described herein. As noted elsewhere, these example implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A wireless modem apparatus, comprising:

a receiver for frequency down-converting an input signal including, a first frequency down-conversion module to down-convert the input signal, wherein said first frequency down-conversion module down-converts said input signal according to a first control signal and outputs a first down-converted signal;

a second frequency down-conversion module to down-convert said input signal, wherein said second frequency down-conversion module down-converts said input signal according to a second control signal and outputs a second down-converted signal; and a subtractor module that subtracts said second down-converted signal from said first down-converted signal and outputs a down-converted signal;

wherein said second control signal is delayed relative to said first control signal by (0.5+n) cycles of said input signal, wherein n is an integer greater than or equal to 1.

2. A wireless modem apparatus, comprising:

a receiver for frequency down-converting an input signal including, a first frequency down-conversion module to down-convert the input signal, wherein said first frequency down-conversion module down-converts said input signal according to a first control signal and outputs a first down-converted signal;

a second frequency down-conversion module to down-convert said input signal, wherein said second frequency down-conversion module down-converts said input signal according to a second control signal and outputs a second down-converted signal; and a subtractor module that subtracts said second down-converted signal from said first down-converted signal and outputs a down-converted signal;

wherein said first frequency down-conversion module under-samples said input signal according to said first control signal, and said second frequency down-conversion module under-samples said input signal according to said second control signal.

3. A wireless modem apparatus, comprising:

a receiver for frequency down-converting an input signal including, a first frequency down-conversion module to down-convert the input signal, wherein said first frequency down-conversion module down-converts said input signal according to a first control signal and outputs a first down-converted signal;

a second frequency down-conversion module to down-convert said input signal, wherein said second frequency down-conversion module down-converts said input signal according to a second control signal and outputs a second down-converted signal; and a subtractor module that subtracts said second down-converted signal from said first down-converted signal and outputs a down-converted signal;

wherein said first and said second frequency down-conversion modules each comprise a switch and a storage element.

4. The apparatus of claim 3, wherein said storage elements comprises a capacitor that reduces a DC offset voltage in said first down-converted signal and said second down-converted signal.

5. The apparatus of claim 1, wherein said subtractor module comprises a differential amplifier.

6. A wireless modem apparatus, comprising:

a receiver for frequency down-converting an input signal including, a first frequency down-conversion module to down-convert the input signal, wherein said first frequency down-conversion module down-converts said input signal according to a first control signal and outputs a first down-converted signal;

a second frequency down-conversion module to down-convert said input signal, wherein said second frequency down-conversion module down-converts said input signal according to a second control signal and outputs a second down-converted signal;

a subtractor module that subtracts said second down-converted signal from said first down-converted signal and outputs a down-converted signal;

a transmitter for up-converting a baseband signal and coupled to said receiver, including, an inverter, to receive said baseband signal and generate an inverted baseband signal;

a first controlled switch, coupled to a non-inverting output of said inverter, said first controlled switch to sample said baseband signal according to a third control signal, resulting in a first harmonically rich signal;

a second controlled switch, coupled to an inverting output of said inverter, said second controlled switch to sample said inverted baseband signal according to a fourth control signal, resulting in a second harmonically rich signal; and a combiner, coupled to an output of said first controlled switch and an output of said second controlled switch, said combiner to combine said first harmonically rich signal and said second harmonically rich signal, resulting in a third harmonically rich signal.

7. The apparatus of claim 6, wherein said fourth control signal is phase shifted with respect to said third control signal.

8. The apparatus of claim 6, wherein said fourth control signal is phase shifted by 180 degrees with respect to said third control signal.

9. The apparatus of claim 6, further comprising a filter coupled to an output of said combiner, wherein said filter outputs a desired harmonic from said third harmonically rich signal.

10. The apparatus of claim 6, wherein said apparatus is an infrastructure device.

11. The apparatus of claim 6, wherein said apparatus is a client device.

12. The apparatus of claim 6, wherein said first controlled switch shunts said baseband signal to a reference potential according to said third control signal, and wherein said second controlled switch shunts said inverted baseband signal to said reference potential according to said fourth control signal.

13. The apparatus of claim 6, further comprising an antenna coupled to said transmitter and said receiver.

14. The apparatus of claim 13, further comprising a switch, said switch selectively connecting said transmitter or said receiver to said antenna.

15. The apparatus of claim 6, further comprising a baseband processor coupled to said transmitter and said receiver.

16. The apparatus of claim 6, further comprising a media access controller (MAC) coupled to said transmitter and said receiver.

17. The apparatus of claim 16, wherein said MAC comprises a means for controlling accessing to a WLAN medium.

18. The apparatus of claim 17, wherein said means for controlling includes carrier sense multiple access with collision avoidance (CSMA/CA).

19. The apparatus of claim 6, further comprising a demodulator/modulator facilitation module coupled to said transmitter and receiver.

20. The apparatus of claim 19, wherein said demodulator/modulator facilitation module comprises a means for modulating said baseband signal using differential binary phase shift keying (DBPSK).

21. The apparatus of claim 19, wherein said demodulator/modulator facilitation module comprises a means for de-modulating said down-converted signal using differential binary phase shift keying (DBPSK).

22. The apparatus of claim 19, wherein said demodulator/modulator facilitation module comprises a means for spreading said baseband signal.

23. The apparatus of claim 22, wherein said means for spreading comprises a means for spreading said baseband signal using a Barker code.

24. The apparatus of claim 19, wherein said demodulator/modulator facilitation module comprises a means for de-spreading said down-converted signal.

25. The apparatus of claim 24, wherein said means for de-spreading comprises a means for de-spreading said down-converted signal using a Barker code.

26. The apparatus of claim 19, wherein said demodulator/modulator facilitation module comprises a means for modulating said baseband signal using Gaussian phase shift keying (GPSK).

27. The apparatus of claim 19, wherein said demodulator/modulator facilitation module comprises a means for de-modulating said down converted signal using Gaussian phase shift keying (GPSK).

28. The apparatus of claim 19, wherein said demodulator/modulator facilitation module comprises a means for modulating said baseband signal using Orthogonal Frequency Division Multiplexing (OFDM).

29. The apparatus of claim 19, wherein said demodulator/modulator facilitation module comprises a means for de-modulating said down converted signal using Orthogonal Frequency Division Multiplexing (OFDM).

30. The apparatus of claim 19, wherein said demodulator/modulator facilitation module comprises a means for modulating said baseband signal using Complimentary Code Keying (CCK).

31. The apparatus of claim 19, wherein said demodulator/modulator facilitation module comprises a means for de-modulating said down converted signal using Complimentary Code Keying (CCK).

32. In a wireless LAN device, a method of down-converting a received RF signal, comprising:

down-converting said received RF signal according to a first control signal and a second control signal, resulting in a down-converted signal, wherein said second control signal is delayed relative to said first control signal by (0.5+n) cycles of said received RF signal, wherein n is an integer greater than or equal to 1;

de-spreading said down-converted signal using a spreading code, resulting in a de-spread signal; and de-modulating said de-spread signal, resulting in a de-modulated signal.

* * * * *

UNITED STATES PATENT AND TRADEMARK OFFICE

CERTIFICATE OF CORRECTION

PATENT NO. : 7,110,444 B1
APPLICATION NO. : 09/632856
DATED : September 19, 2006
INVENTOR(S) : Sorrells et al.

It is certified that error appears in the above-identified patent and that said Letters Patent is hereby corrected as shown below:

ON TITLE PAGE

Item (56)
Under "U.S. Patent Documents", please insert the following citations:

| | | |
|---|---|---|
| 4,870,659 | 09/1989 | Oishi et al. |
| 4,871,987 | 10/1989 | Kawase |
| 4,885,587 | 12/1989 | Wiegand et al. |
| 4,885,756 | 12/1989 | Fontanes et al. |
| 4,888,557 | 12/1989 | Puckette, IV et al. |
| 4,890,302 | 12/1989 | Muilwijk |
| 4,893,316 | 01/1990 | Janc et al. |
| 4,893,341 | 01/1990 | Gehring |
| 4,894,766 | 01/1990 | De Agro |
| 4,896,152 | 01/1990 | Tiemann |
| 4,902,979 | 02/1990 | Puckette, IV |
| 4,908,579 | 03/1990 | Tawfik et al. |
| 4,910,752 | 03/1990 | Yester, Jr. et al. |
| 4,914,405 | 04/1990 | Wells |
| 4,920,510 | 04/1990 | Senderowicz et al. |
| 4,922,452 | 05/1990 | Larsen et al. |
| 4,931,921 | 06/1990 | Anderson |
| 4,944,025 | 07/1990 | Gehring et al. |
| 4,955,079 | 09/1990 | Connerney et al. |
| 4,965,467 | 10/1990 | Bilterijst |
| 4,967,160 | 10/1990 | Quievy et al. |
| 4,970,703 | 11/1990 | Hariharan et al. |
| 4,982,353 | 01/1991 | Jacob et al. |
| 4,984,077 | 01/1991 | Uchida |
| 4,995,055 | 02/1991 | Weinberger et al. |
| 5,003,621 | 03/1991 | Gailus |
| 5,005,169 | 04/1991 | Bronder et al. |
| 5,006,810 | 04/1991 | Popescu |
| 5,010,585 | 04/1991 | Garcia |
| 5,014,304 | 05/1991 | Nicollini et al. |
| 5,015,963 | 05/1991 | Sutton |
| 5,017,924 | 05/1991 | Guiberteau et al. |
| 5,020,149 | 05/1991 | Hemmie |
| 5,020,154 | 05/1991 | Zierhut |
| 5,052,050 | 09/1991 | Collier et al. |
| 5,065,409 | 11/1991 | Hughes et al. |

UNITED STATES PATENT AND TRADEMARK OFFICE

CERTIFICATE OF CORRECTION

PATENT NO. : 7,110,444 B1
APPLICATION NO. : 09/632856
DATED : September 19, 2006
INVENTOR(S) : Sorrells et al.

It is certified that error appears in the above-identified patent and that said Letters Patent is hereby corrected as shown below:

Item (56)

Under "Foreign Patent Documents", please insert the following citations:

| | |
|---|---|
| JP 6-237276 | 08/1994 |
| JP 8-23359 | 01/1996 |
| JP 47-2314 | 02/1972 |
| JP 58-7903 | 01/1983 |
| JP 58-133004 | 08/1983 |
| JP 60-58705 | 04/1985 |
| JP 4-123614 | 04/1992 |
| JP 4-127601 | 04/1992 |
| JP 5-175730 | 07/1993 |
| JP 5-175734 | 07/1993 |
| JP 7-154344 | 06/1995 |
| JP 7-307620 | 11/1995 |
| JP 55-66057 | 05/1980 |
| JP 63-65587 | 03/1988 |
| JP 63-153691 | 06/1988 |
| EP 0 276 130 A2&A3 | 07/1988 |

Under "Other Publications", please insert the following citations:

Karasawa, Y. *et al.*, "A New Prediction Method for Tropospheric Scintillation on Earth-Space Paths," *IEEE Transactions on Antennas and Propagation*, IEEE Antennas and Propagation Society, Vol. 36, No. 11, pp. 1608-1614 (November 1988).

Kirsten, J. and Fleming, J., "Undersampling reduces data-acquisition costs for select applications," *EDN*, Cahners Publishing, Vol. 35, No. 13, pp. 217-222, 224, 226-228 (June 21, 1990).

Lam, W.K. *et al.*, "Measurement of the Phase Noise Characteristics of an Unlocked Communications Channel Identifier," *Proceedings Of the 1993 IEEE International Frequency Control Symposium*, IEEE, pp. 283-288 (June 2-4, 1993).

Lam, W.K. *et al.*, "Wideband sounding of 11.6 Ghz transhorizon channel," *Electronics Letters*, IEE, Vol. 30, No. 9, pp. 738-739 (April 28, 1994).

Larkin, K.G, "Efficient demodulator for bandpass sampled AM signals," *Electronics Letters*, IEE, Vol. 32, No. 2, pp. 101-102 (January 18, 1996).

Lau, W.H. *et al.*, "Analysis of the Time Variant Structure of Microwave Line-of-sight Multipath Phenomena," *IEEE Global Telecommunications Conference & Exhibition*, IEEE, pp. 1707-1711 (November 28 - December 1, 1988).

Lau, W.H. *et al.*, "Improved Prony Algorithm to Identify Multipath Components," *Electronics Letters*, IEE, Vol. 23, No. 20, pp. 1059-1060 (September 24, 1987).

CERTIFICATE OF CORRECTION

PATENT NO. : 7,110,444 B1
APPLICATION NO. : 09/632856
DATED : September 19, 2006
INVENTOR(S) : Sorrells et al.

It is certified that error appears in the above-identified patent and that said Letters Patent is hereby corrected as shown below:

Item (56)

Under "Other Publications", please insert the following citations (cont'd):

Lesage, P. and Audoin, C., "Effect of Dead-Time on the Estimation of the Two-Sample Variance," *IEEE Transactions on Instrumentation and Measurement*, IEEE Instrumentation and Measurement Society, Vol. IM-28, No. 1, pp. 6-10 (March 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, Vol. MTT-23, No. 6, pp. 461-469 (June 1975).

Linnenbrink, T.E. et al., "A One Gigasample Per Second Transient Recorder," *IEEE Transactions on Nuclear Science*, IEEE Nuclear and Plasma Sciences Society, Vol. NS-26, No, 4, pp. 4443-4449 (August 1979).

Liou, M.L., "A Tutorial on Computer-Aided Analysis of Switched-Capacitor Circuits," *Proceedings of the IEEE*, IEEE, Vol. 71, No. 8, pp. 987-1005 (August 1983).

Lo, P. *et al.*, "Coherent Automatic Gain Control," *IEE Colloquium on Phase Locked Techniques*, IEE, pp. 2/1-2/6 (March 26, 1980).

Lo, P. *et al.*, "Computation of Rain Induced Scintillations on Satellite Down-Links at Microwave Frequencies," *Third International Conference on Antennas and Propagation* (*ICAP 83*), pp. 127-131 (April 12-15, 1983).

Lo, P.S.L.O. *et al.*, "Observations of Amplitude Scintillations on a Low-Elevation Earth-Space Path," *Electronics Letters*, IEE, Vol. 20, No. 7, pp. 307-308 (March 29, 1984).

Madani, K. and Aithison, C.S., "A 20 Ghz Microwave Sampler," *IEEE Transactions on Microwave Theory and Techniques*, IEEE Microwave Theory and Techniques Society, Vol. 40, No. 10, pp. 1960-1963 (October 1992).

Marsland, R.A. *et al.*, "130 Ghz GaAs monolithic integrated circuit sampling head," *Appl. Phys. Lett.*, American Institute of Physics, Vol. 55, No. 6, pp. 592-594 (August 7, 1989).

Martin, K. and Sedra, A.S., "Switched-Capacitor Building Blocks for Adaptive Systems," *IEEE Transactions on Circuits and Systems*, IEEE Circuits and Systems Society, Vol. CAS-28, No. 6, pp. 576-584 (June 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, Vol. 46, No. 10, pp. 1506-1518 (October 1998).

Matricciani, E., "Prediction of fade durations due to rain in satellite communication systems," *Radio Science*, American Geophysical Union, Vol. 32, No. 3, pp. 935-941 (May-June 1997).

UNITED STATES PATENT AND TRADEMARK OFFICE

CERTIFICATE OF CORRECTION

PATENT NO. : 7,110,444 B1 
APPLICATION NO. : 09/632856
DATED : September 19, 2006
INVENTOR(S) : Sorrells et al.

It is certified that error appears in the above-identified patent and that said Letters Patent is hereby corrected as shown below:

Section (56)
Under "Other Publications", please insert the following citations (cont'd):
McQueen, J.G., "The Monitoring of High-Speed Waveforms," *Electronic Engineering*, Morgan Brothers Limited, Vol. XXIV, No. 296, pp. 436-441 (October 1952).

Signed and Sealed this

Seventh Day of August, 2007

JON W. DUDAS
*Director of the United States Patent and Trademark Office*

UNITED STATES PATENT AND TRADEMARK OFFICE

CERTIFICATE OF CORRECTION

PATENT NO. : 7,110,444 B1
APPLICATION NO. : 09/632856
DATED : September 19, 2006
INVENTOR(S) : Sorrells et al.

It is certified that error appears in the above-identified patent and that said Letters Patent is hereby corrected as shown below:

ON TITLE PAGE

Item (56)
Under "U.S. Patent Documents", please insert the following citations:

| | | |
|---|---|---|
| 4,870,659 | 09/1989 | Oishi et al. |
| 4,871,987 | 10/1989 | Kawase |
| 4,885,587 | 12/1989 | Wiegand et al. |
| 4,885,756 | 12/1989 | Fontanes et al. |
| 4,888,557 | 12/1989 | Puckette, IV et al. |
| 4,890,302 | 12/1989 | Muilwijk |
| 4,893,316 | 01/1990 | Janc et al. |
| 4,893,341 | 01/1990 | Gehring |
| 4,894,766 | 01/1990 | De Agro |
| 4,896,152 | 01/1990 | Tiemann |
| 4,902,979 | 02/1990 | Puckette, IV |
| 4,908,579 | 03/1990 | Tawfik et al. |
| 4,910,752 | 03/1990 | Yester, Jr. et al. |
| 4,914,405 | 04/1990 | Wells |
| 4,920,510 | 04/1990 | Senderowicz et al. |
| 4,922,452 | 05/1990 | Larsen et al. |
| 4,931,921 | 06/1990 | Anderson |
| 4,944,025 | 07/1990 | Gehring et al. |
| 4,955,079 | 09/1990 | Connerney et al. |
| 4,965,467 | 10/1990 | Bilterijst |
| 4,967,160 | 10/1990 | Quievy et al. |
| 4,970,703 | 11/1990 | Hariharan et al. |
| 4,982,353 | 01/1991 | Jacob et al. |
| 4,984,077 | 01/1991 | Uchida |
| 4,995,055 | 02/1991 | Weinberger et al. |
| 5,003,621 | 03/1991 | Gailus |
| 5,005,169 | 04/1991 | Bronder et al. |
| 5,006,810 | 04/1991 | Popescu |
| 5,010,585 | 04/1991 | Garcia |
| 5,014,304 | 05/1991 | Nicollini et al. |
| 5,015,963 | 05/1991 | Sutton |
| 5,017,924 | 05/1991 | Guiberteau et al. |
| 5,020,149 | 05/1991 | Hemmie |
| 5,020,154 | 05/1991 | Zierhut |
| 5,052,050 | 09/1991 | Collier et al. |
| 5,065,409 | 11/1991 | Hughes et al. |

UNITED STATES PATENT AND TRADEMARK OFFICE
CERTIFICATE OF CORRECTION

PATENT NO. : 7,110,444 B1 
APPLICATION NO. : 09/632856
DATED : September 19, 2006
INVENTOR(S) : Sorrells et al.

It is certified that error appears in the above-identified patent and that said Letters Patent is hereby corrected as shown below:

Item (56)

Under "Foreign Patent Documents", please insert the following citations:

| | |
|---|---|
| JP 6-237276 | 08/1994 |
| JP 8-23359 | 01/1996 |
| JP 47-2314 | 02/1972 |
| JP 58-7903 | 01/1983 |
| JP 58-133004 | 08/1983 |
| JP 60-58705 | 04/1985 |
| JP 4-123614 | 04/1992 |
| JP 4-127601 | 04/1992 |
| JP 5-175730 | 07/1993 |
| JP 5-175734 | 07/1993 |
| JP 7-154344 | 06/1995 |
| JP 7-307620 | 11/1995 |
| JP 55-66057 | 05/1980 |
| JP 63-65587 | 03/1988 |
| JP 63-153691 | 06/1988 |
| EP 0 276 130 A2&A3 | 07/1988 |

Under "Other Publications", please insert the following citations:

Karasawa, Y. *et al.*, "A New Prediction Method for Tropospheric Scintillation on Earth-Space Paths," *IEEE Transactions on Antennas and Propagation*, IEEE Antennas and Propagation Society, Vol. 36, No. 11, pp. 1608-1614 (November 1988).

Kirsten, J. and Fleming, J., "Undersampling reduces data-acquisition costs for select applications," *EDN*, Cahners Publishing, Vol. 35, No. 13, pp. 217-222, 224, 226-228 (June 21, 1990).

Lam, W.K. *et al.*, "Measurement of the Phase Noise Characteristics of an Unlocked Communications Channel Identifier," *Proceedings Of the 1993 IEEE International Frequency Control Symposium*, IEEE, pp. 283-288 (June 2-4, 1993).

Lam, W.K. *et al.*, "Wideband sounding of 11.6 Ghz transhorizon channel," *Electronics Letters*, IEE, Vol. 30, No. 9, pp. 738-739 (April 28, 1994).

Larkin, K.G, "Efficient demodulator for bandpass sampled AM signals," *Electronics Letters*, IEE, Vol. 32, No. 2, pp. 101-102 (January 18, 1996).

Lau, W.H. *et al.*, "Analysis of the Time Variant Structure of Microwave Line-of-sight Multipath Phenomena," *IEEE Global Telecommunications Conference & Exhibition*, IEEE, pp. 1707-1711 (November 28 - December 1, 1988).

Lau, W.H. *et al.*, "Improved Prony Algorithm to Identify Multipath Components," *Electronics Letters*, IEE, Vol. 23, No. 20, pp. 1059-1060 (September 24, 1987).

UNITED STATES PATENT AND TRADEMARK OFFICE

CERTIFICATE OF CORRECTION

PATENT NO. : 7,110,444 B1
APPLICATION NO. : 09/632856
DATED : September 19, 2006
INVENTOR(S) : Sorrells et al.

It is certified that error appears in the above-identified patent and that said Letters Patent is hereby corrected as shown below:

Item (56)

Under "Other Publications", please insert the following citations (cont'd):

Lesage, P. and Audoin, C., "Effect of Dead-Time on the Estimation of the Two-Sample Variance," *IEEE Transactions on Instrumentation and Measurement*, IEEE Instrumentation and Measurement Society, Vol. IM-28, No. 1, pp. 6-10 (March 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, Vol. MTT-23, No. 6, pp. 461-469 (June 1975).

Linnenbrink, T.E. et al., "A One Gigasample Per Second Transient Recorder," *IEEE Transactions on Nuclear Science*, IEEE Nuclear and Plasma Sciences Society, Vol. NS-26, No, 4, pp. 4443-4449 (August 1979).

Liou, M.L., "A Tutorial on Computer-Aided Analysis of Switched-Capacitor Circuits," *Proceedings of the IEEE*, IEEE, Vol. 71, No. 8, pp. 987-1005 (August 1983).

Lo, P. *et al*., "Coherent Automatic Gain Control," *IEE Colloquium on Phase Locked Techniques*, IEE, pp. 2/1-2/6 (March 26, 1980).

Lo, P. *et al*., "Computation of Rain Induced Scintillations on Satellite Down-Links at Microwave Frequencies," *Third International Conference on Antennas and Propagation* (*ICAP 83*), pp. 127-131 (April 12-15, 1983).

Lo, P.S.L.O. *et al*., "Observations of Amplitude Scintillations on a Low-Elevation Earth-Space Path," *Electronics Letters*, IEE, Vol. 20, No. 7, pp. 307-308 (March 29, 1984).

Madani, K. and Aithison, C.S., "A 20 Ghz Microwave Sampler," *IEEE Transactions on Microwave Theory and Techniques*, IEEE Microwave Theory and Techniques Society, Vol. 40, No. 10, pp. 1960-1963 (October 1992).

Marsland, R.A. *et al*., "130 Ghz GaAs monolithic integrated circuit sampling head," *Appl. Phys. Lett*., American Institute of Physics, Vol. 55, No. 6, pp. 592-594 (August 7, 1989).

Martin, K. and Sedra, A.S., "Switched-Capacitor Building Blocks for Adaptive Systems," *IEEE Transactions on Circuits and Systems*, IEEE Circuits and Systems Society, Vol. CAS-28, No. 6, pp. 576-584 (June 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, Vol. 46, No. 10, pp. 1506-1518 (October 1998).

Matricciani, E., "Prediction of fade durations due to rain in satellite communication systems," *Radio Science*, American Geophysical Union, Vol. 32, No. 3, pp. 935-941 (May-June 1997).

UNITED STATES PATENT AND TRADEMARK OFFICE

CERTIFICATE OF CORRECTION

PATENT NO. : 7,110,444 B1 — Page 4 of 4
APPLICATION NO. : 09/632856
DATED : September 19, 2006
INVENTOR(S) : Sorrells et al.

It is certified that error appears in the above-identified patent and that said Letters Patent is hereby corrected as shown below:

<u>Section (56)</u>

Under “Other Publications”, please insert the following citations (cont’d):

McQueen, J.G., “The Monitoring of High-Speed Waveforms,” *Electronic Engineering*, Morgan Brothers Limited, Vol. XXIV, No. 296, pp. 436-441 (October 1952).

This certificate supersedes Certificate of Correction issued August 7, 2007.

Signed and Sealed this

Twenty-eighth Day of August, 2007

JON W. DUDAS
*Director of the United States Patent and Trademark Office*